United States Patent [19]
Holdaway

[11] 4,253,152
[45] Feb. 24, 1981

[54] SPECTRUM ANALYZER WITH PARAMETER UPDATING FROM A DISPLAY MARKER

[75] Inventor: Steven N. Holdaway, Santa Rosa, Calif.

[73] Assignee: Hewlett-Packard Company, Palo Alto, Calif.

[21] Appl. No.: 932,694

[22] Filed: Aug. 10, 1978

[51] Int. Cl.$^3$ .............................................. G01R 23/00
[52] U.S. Cl. .................................. 364/485; 324/77 B; 340/709; 340/711; 364/487; 364/518
[58] Field of Search ............... 364/485, 487, 518, 521; 324/77 B, 77 D; 340/709, 711; 328/138, 140, 141, 151

[56] References Cited

U.S. PATENT DOCUMENTS

| | | | |
|---|---|---|---|
| 3,427,536 | 2/1969 | Wainwright | 324/77 B |
| 3,786,351 | 1/1974 | Priebe, Jr. | 324/77 B |
| 3,881,097 | 4/1975 | Lehmann et al. | 364/485 |
| 3,974,493 | 8/1976 | DeCavaignac et al. | 340/709 |
| 4,063,223 | 12/1977 | Schlig et al. | 340/709 |

OTHER PUBLICATIONS

"A 5 MHz Digitally Controlled Spectrum Analyzer", *Tekscope*(USA), vol. 7, No. 3, 1975, pp. 3-7.

*Primary Examiner*—Errol A. Krass
*Attorney, Agent, or Firm*—David A. Boone

[57] ABSTRACT

An input signal is mixed with sampling signals from oscillators which vary the frequency of the sampling signal from a first frequency to a second frequency. The resulting Intermediate Frequency (IF) signal is processed and digital values are stored in a memory in response thereto. Waveforms are then displayed which correspond to these frequency and amplitude values. Various input and display circuits facilitate the display and interpretation of these waveforms.

5 Claims, 177 Drawing Figures

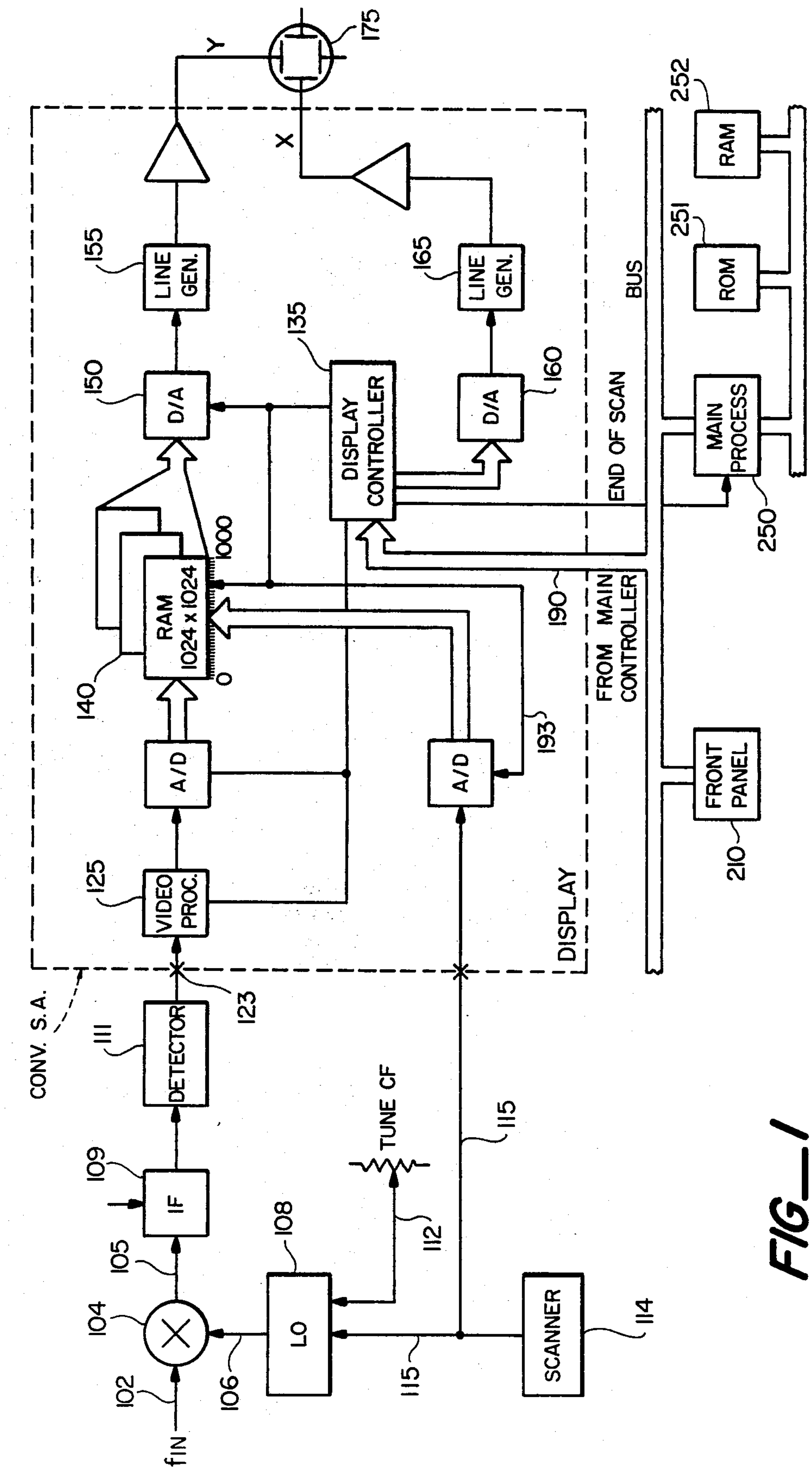
FIG_1

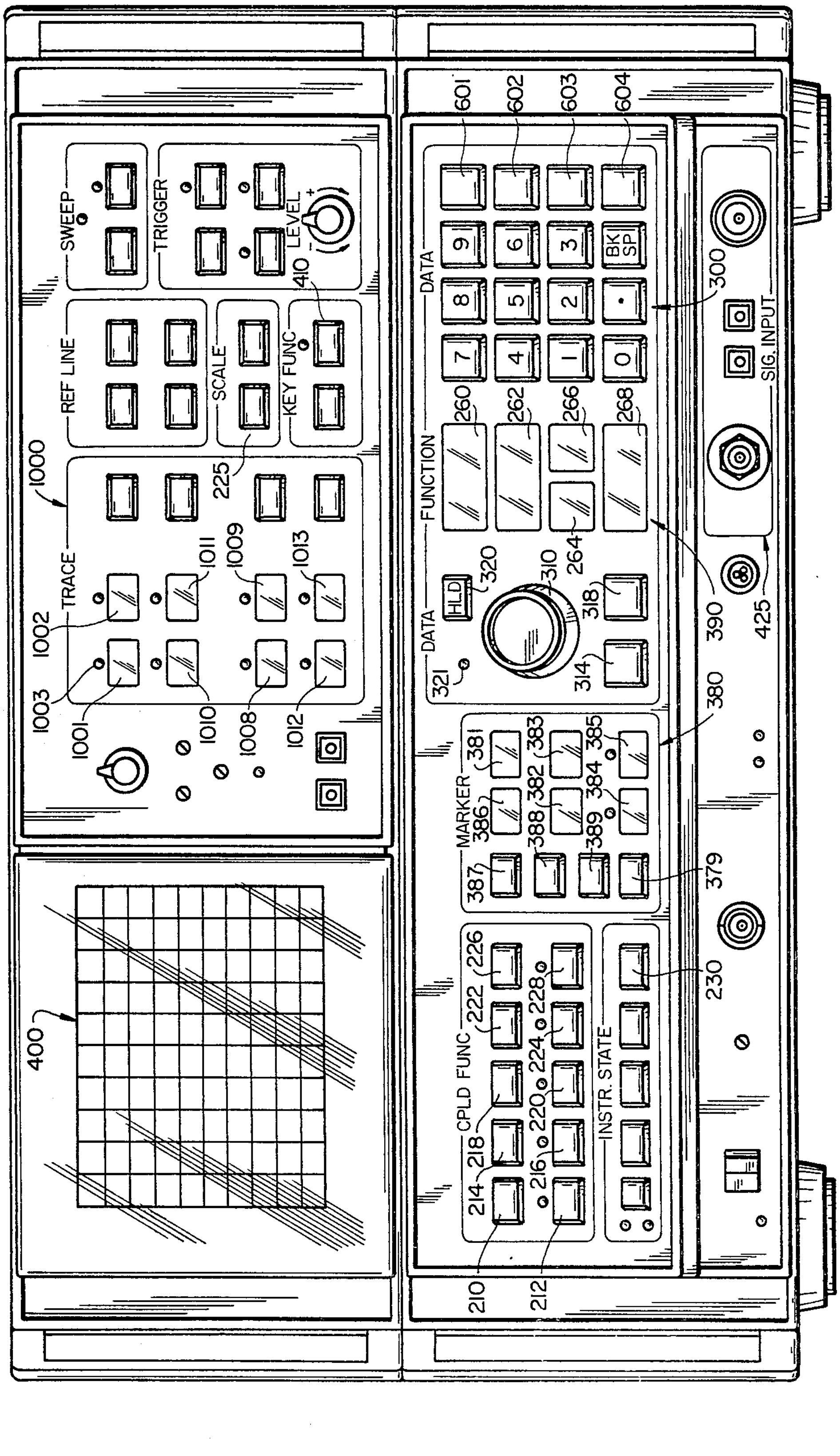
FIG_2

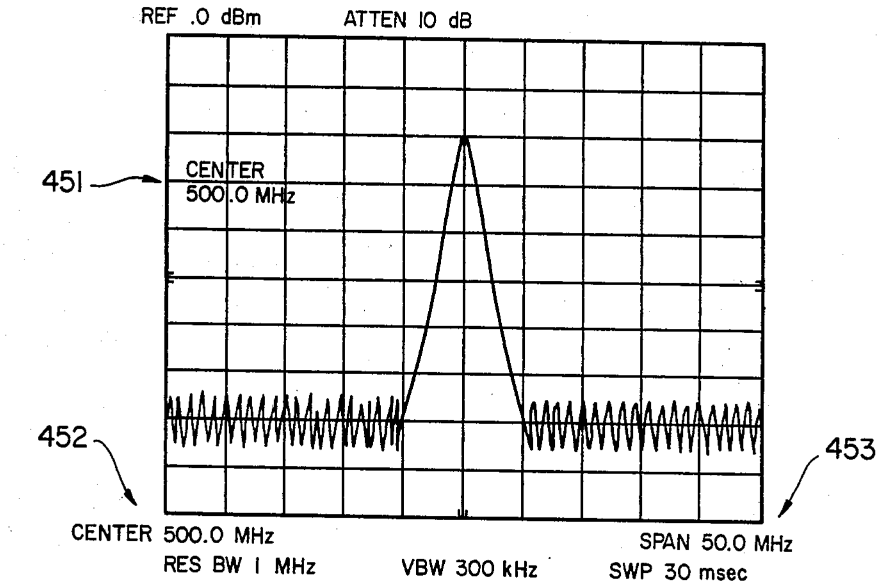
FIG_3
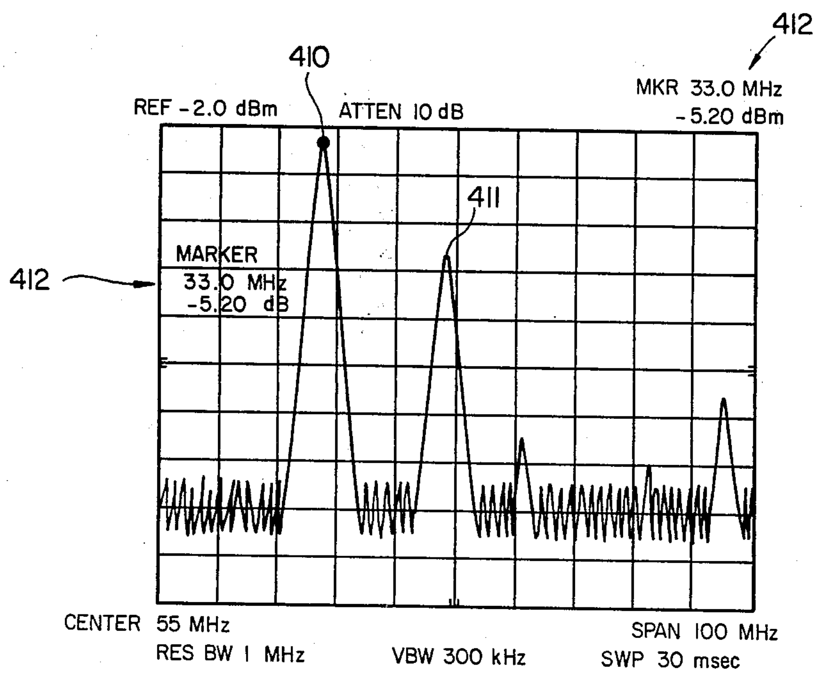
FIG_4

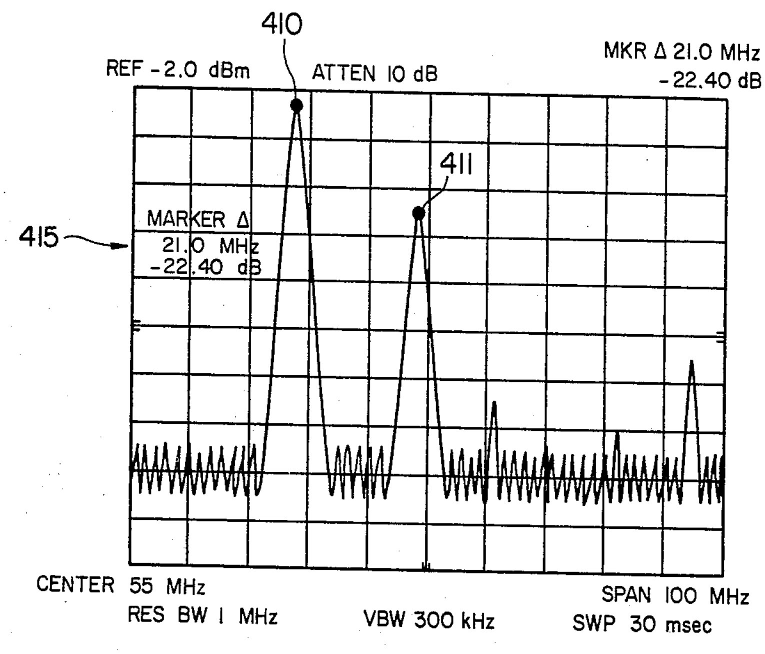
FIG_5
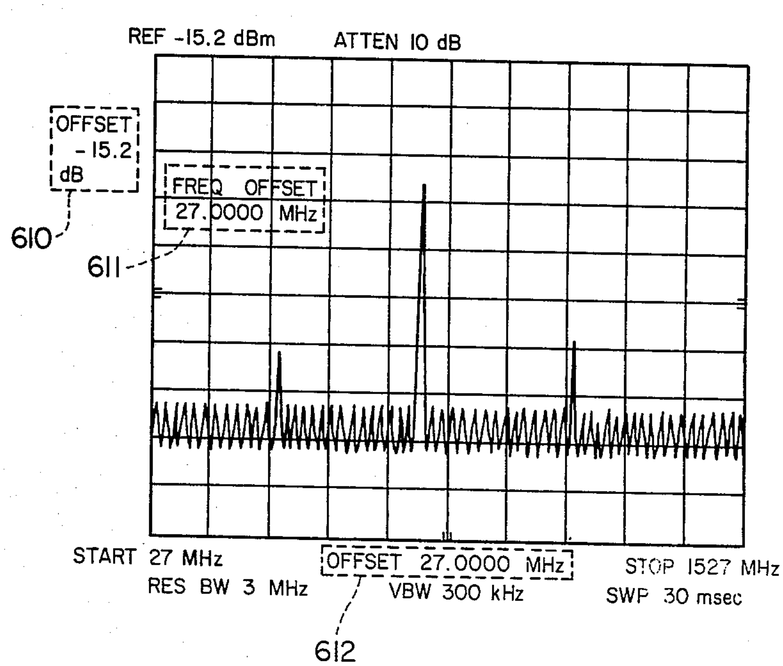
FIG_6

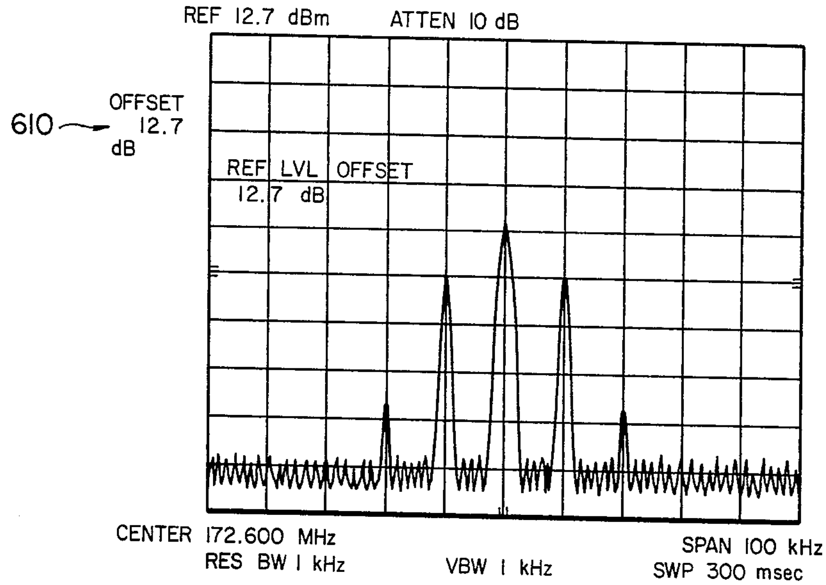
FIG_7
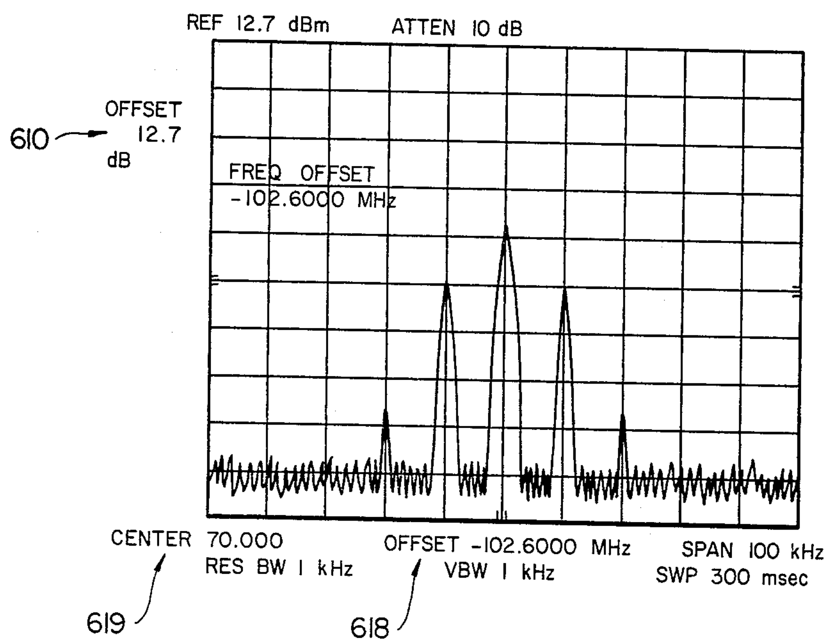
FIG_8

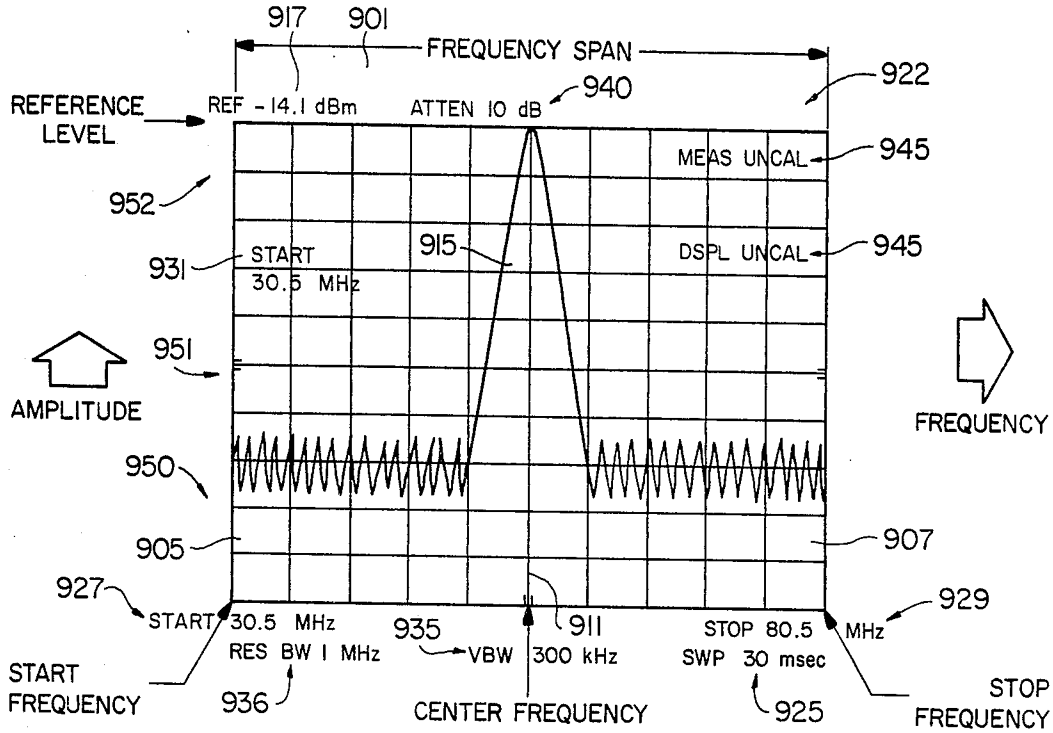
FIG_9
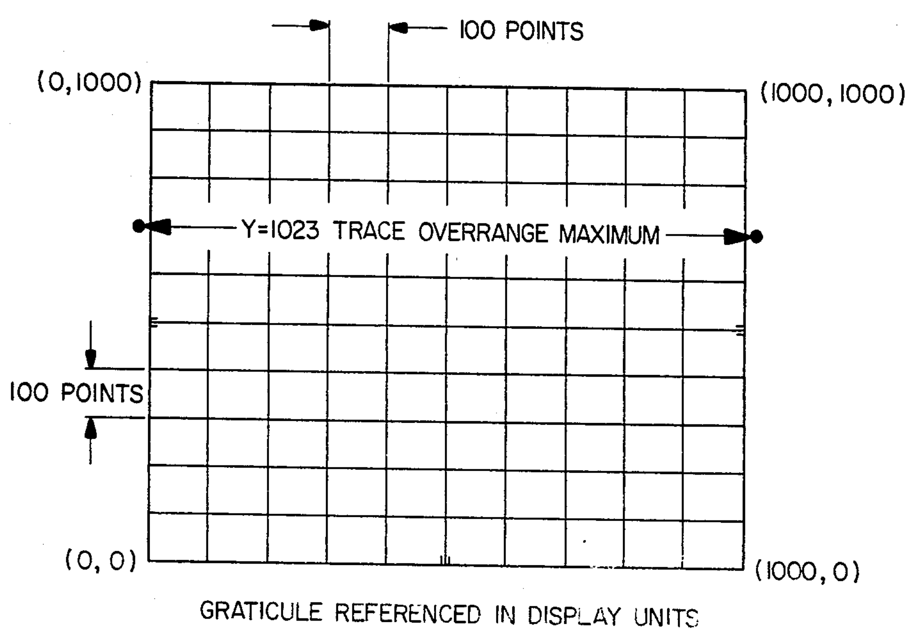
FIG_10

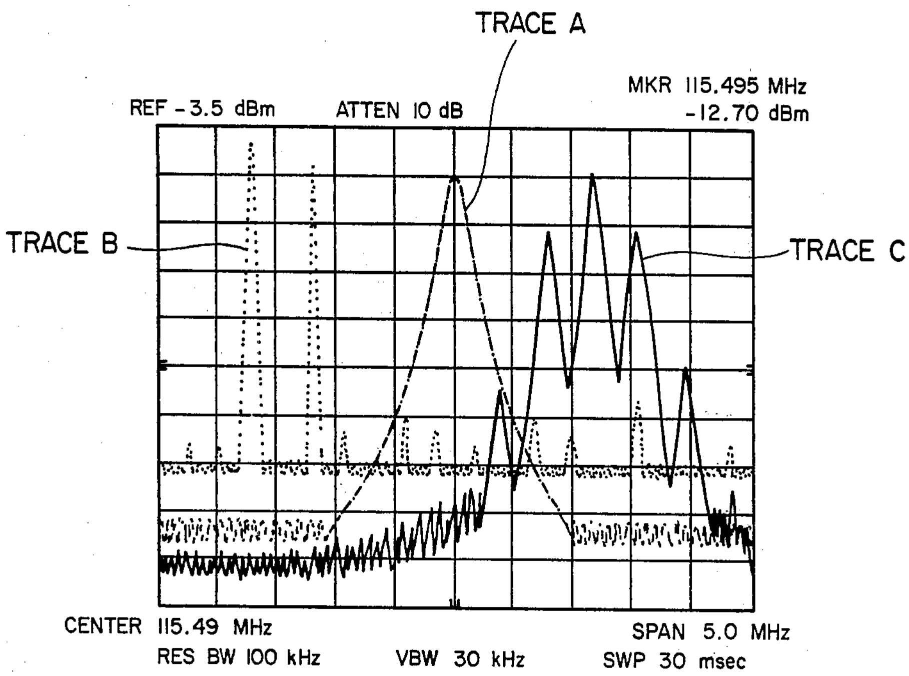
FIG_11
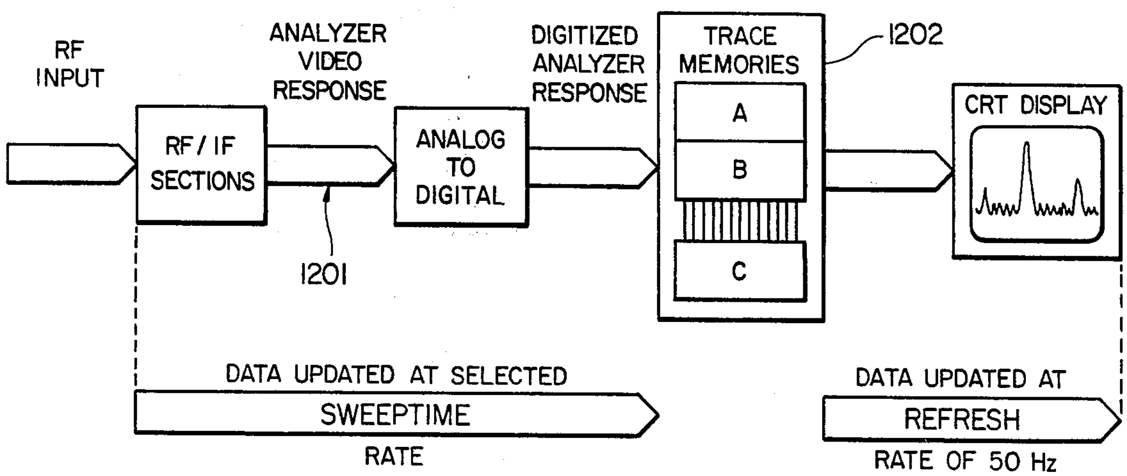
FIG_12

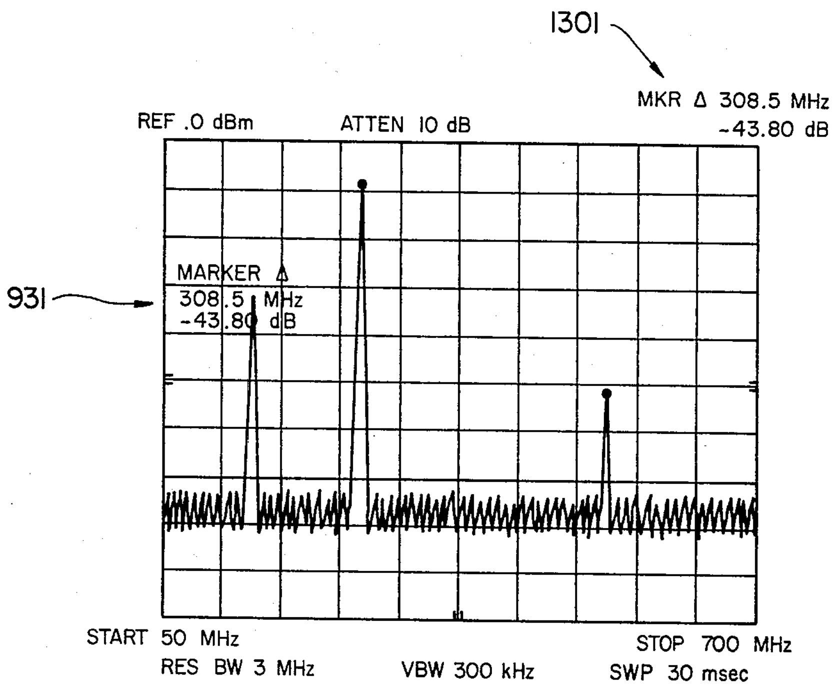
MARKER READOUT LOCATIONS
FIG_13

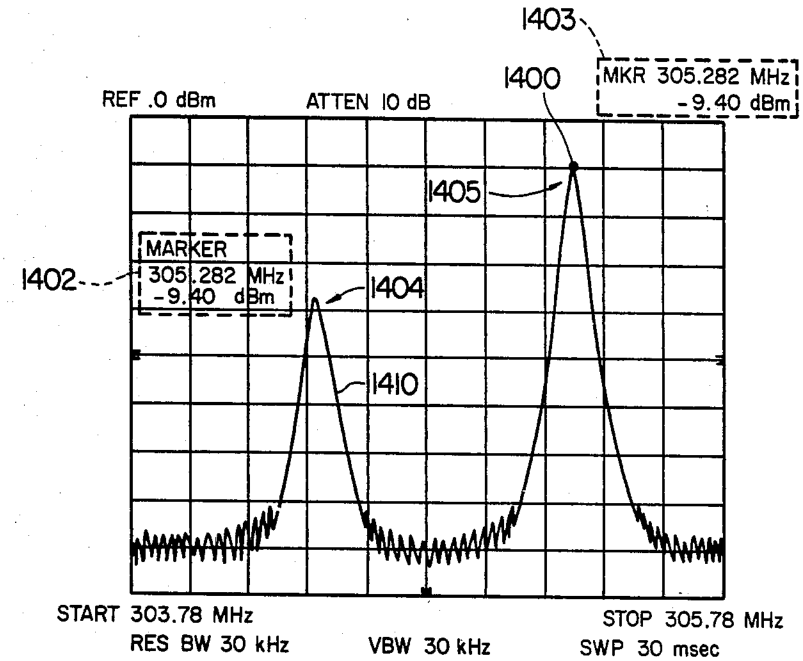
FIG_14A
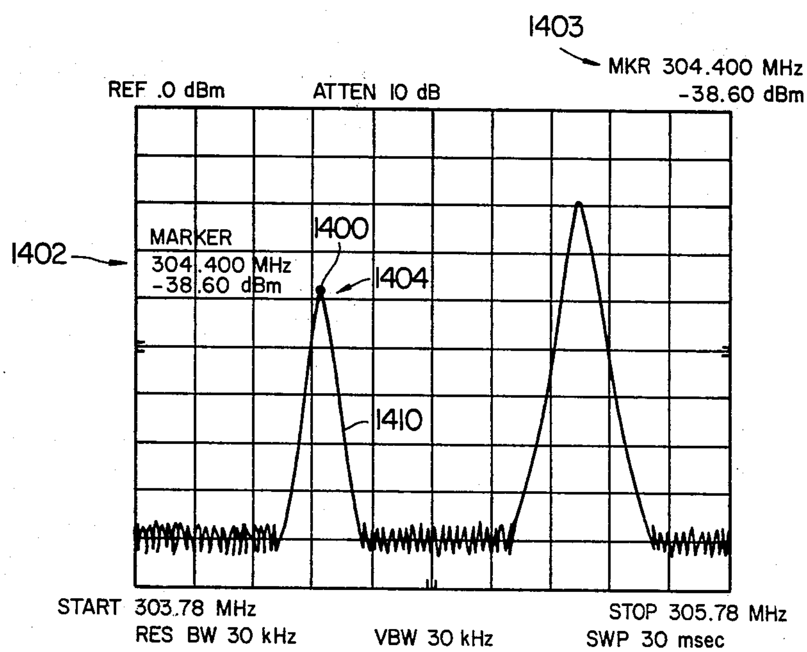
FIG_14B

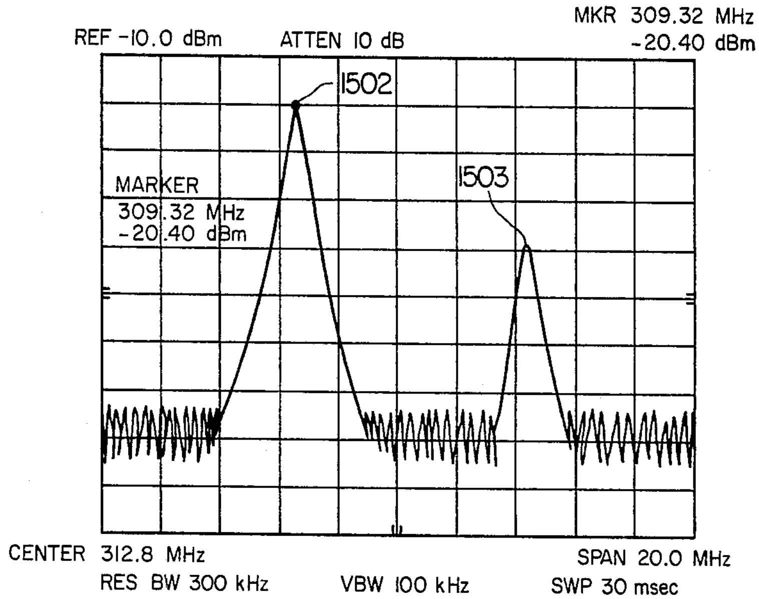
FIG_15A
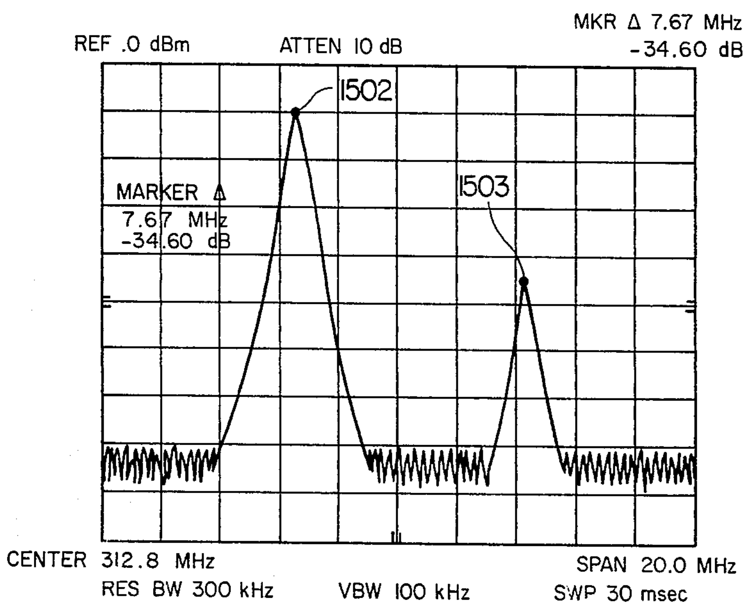
FIG_15B

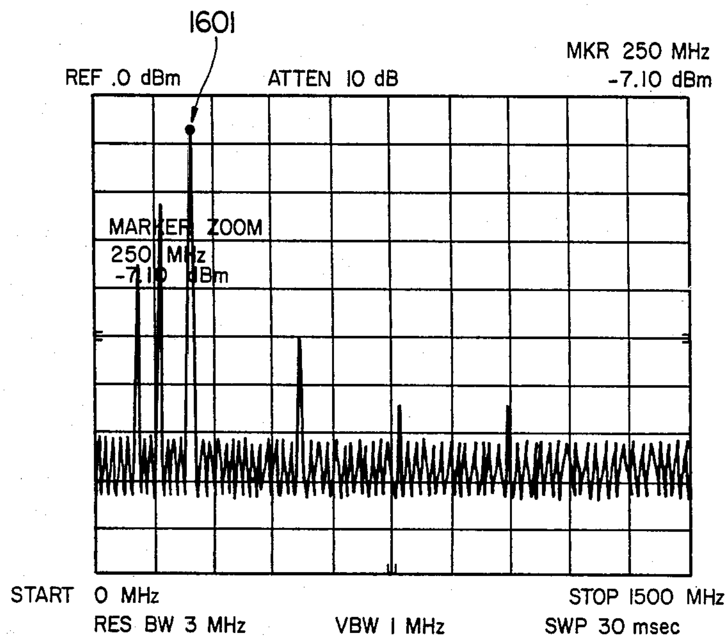
FIG_16A
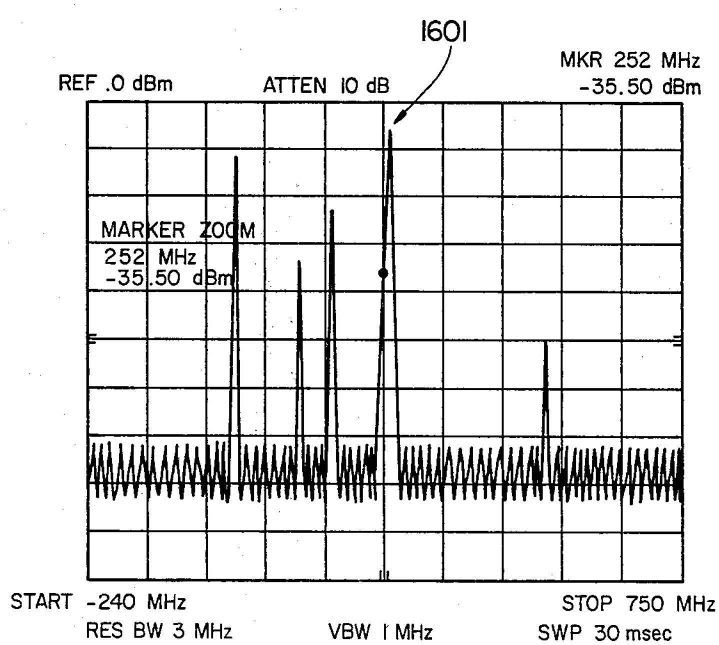
FIG_16B

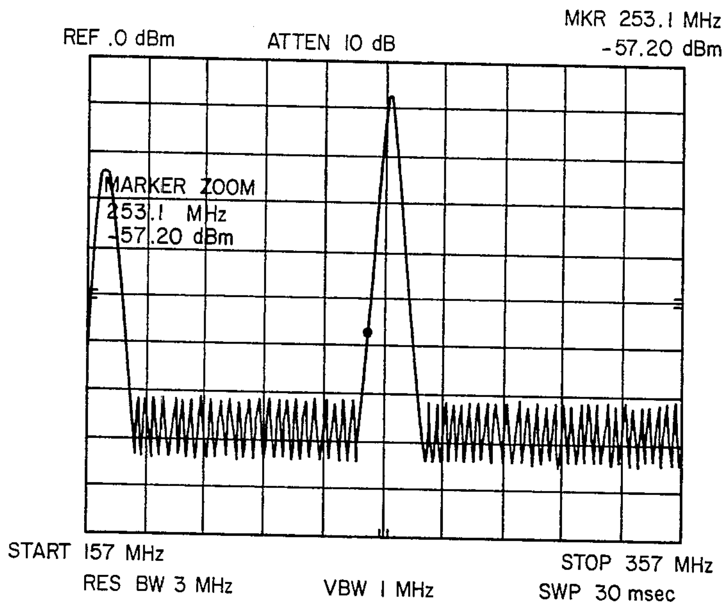
FIG_16C
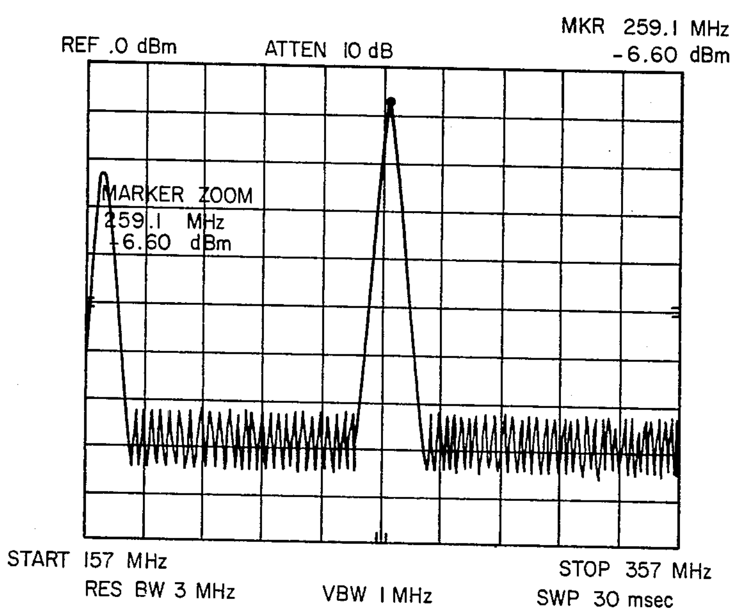
FIG_16D

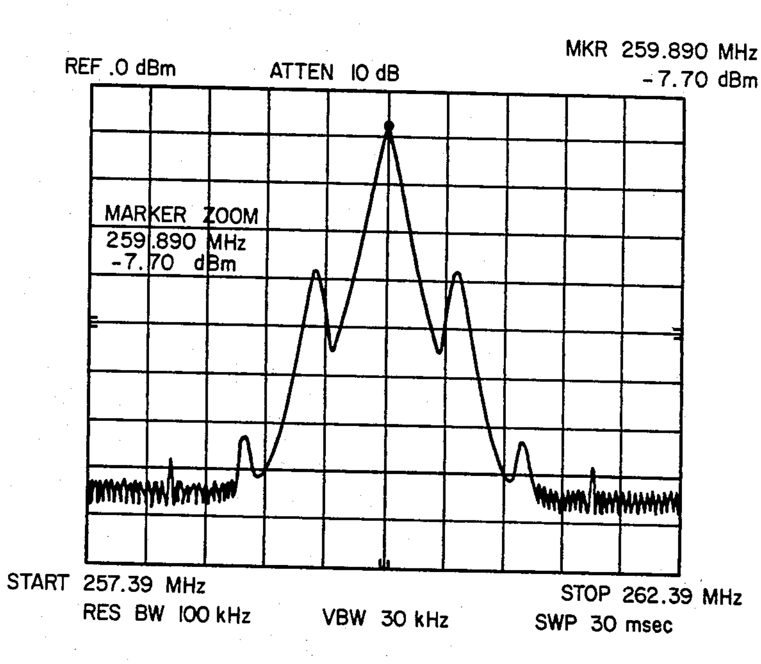
FIG_16E

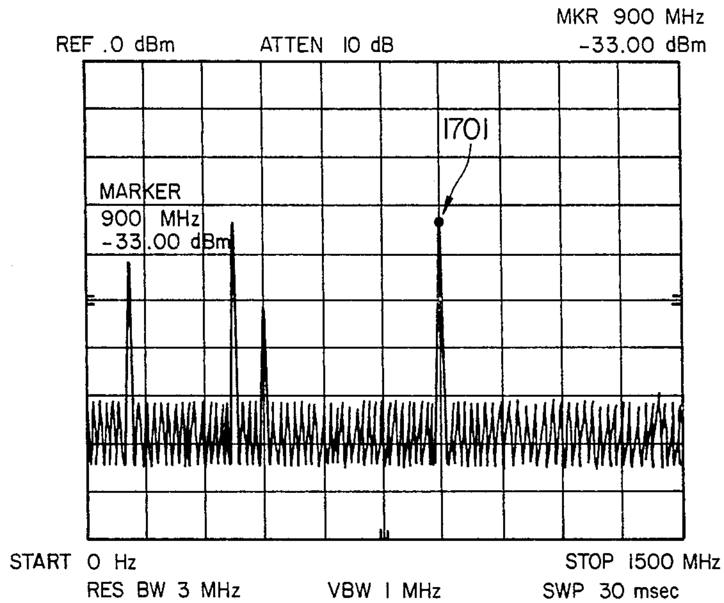
FIG_17A
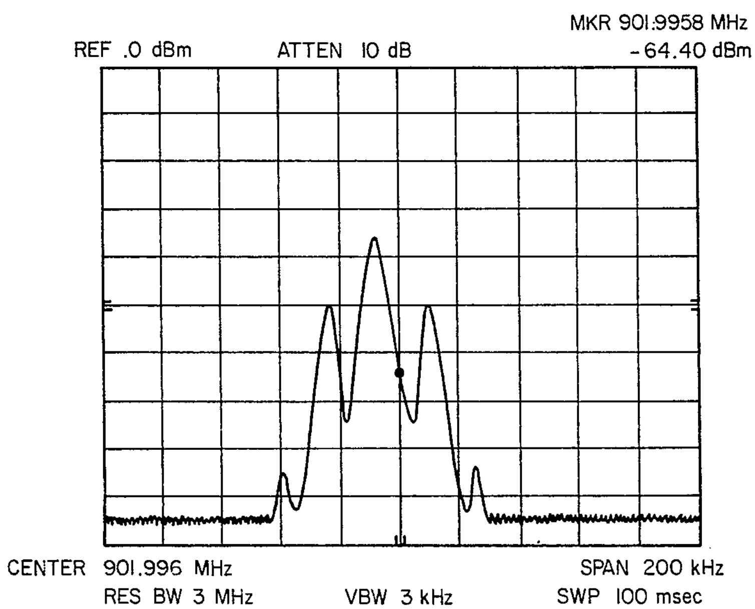
FIG_17B

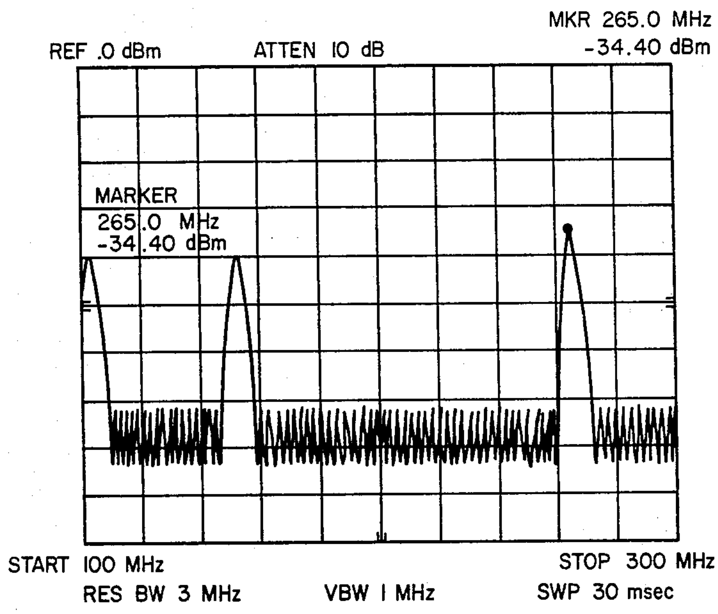
FIG_18A
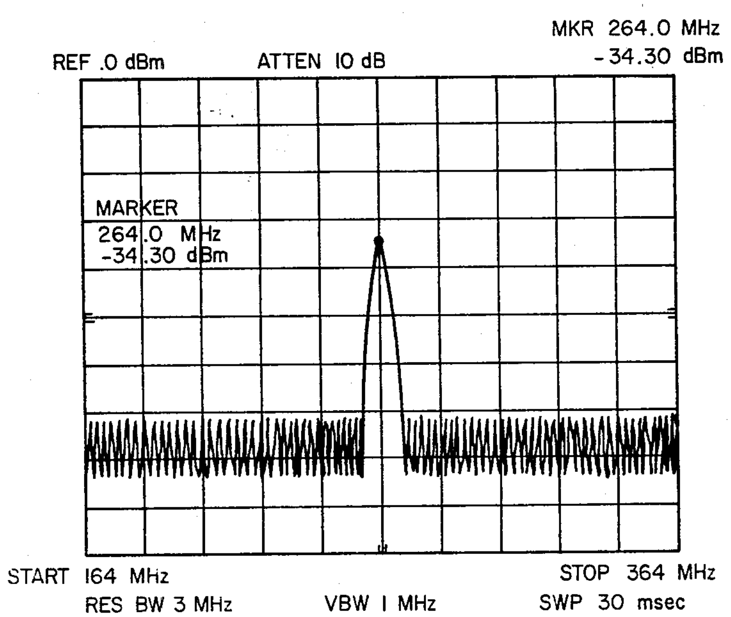
FIG_18B

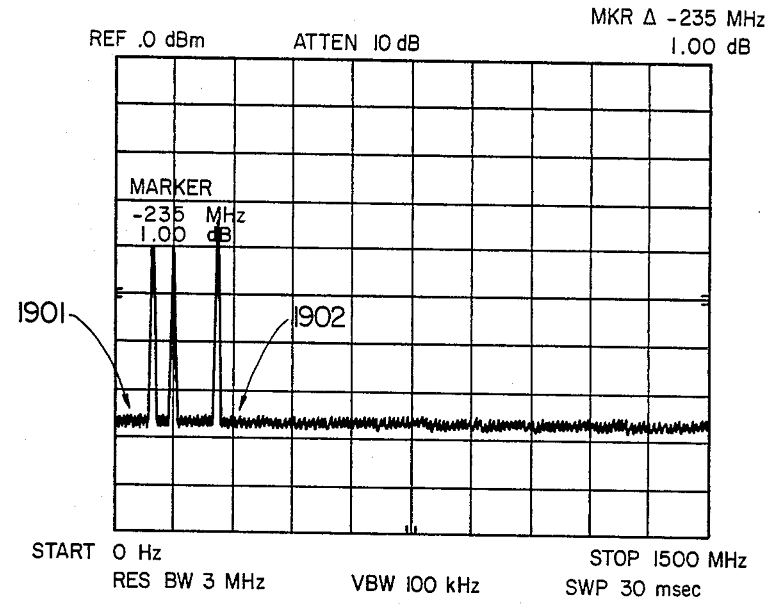
FIG_19A
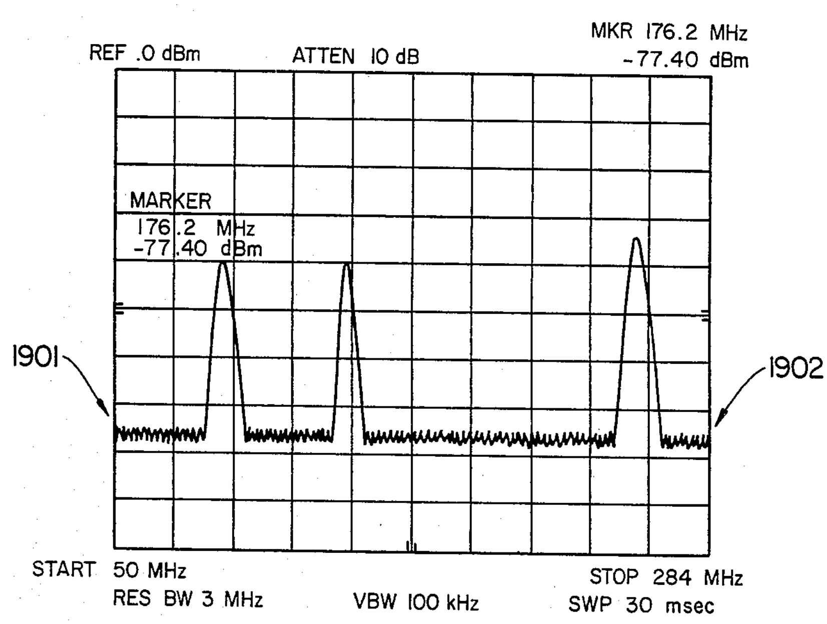
FIG_19B

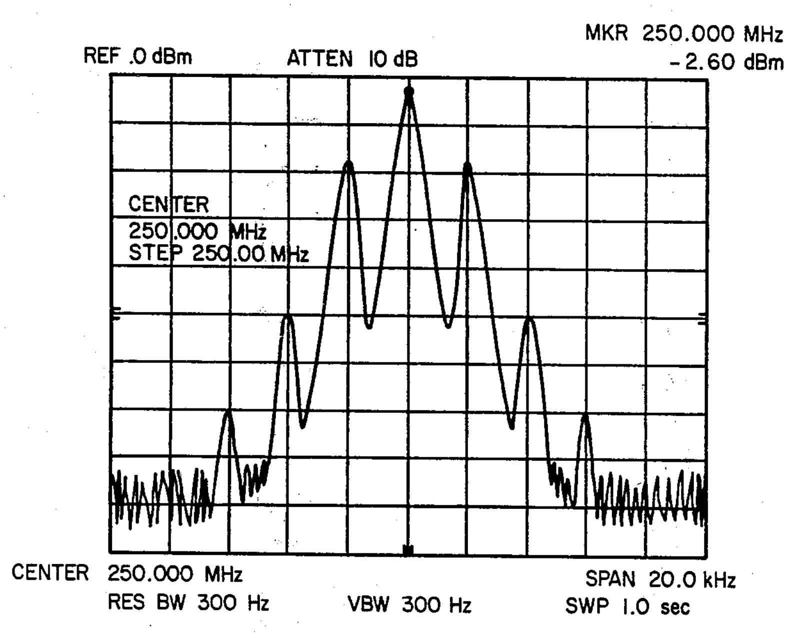
FIG_19C

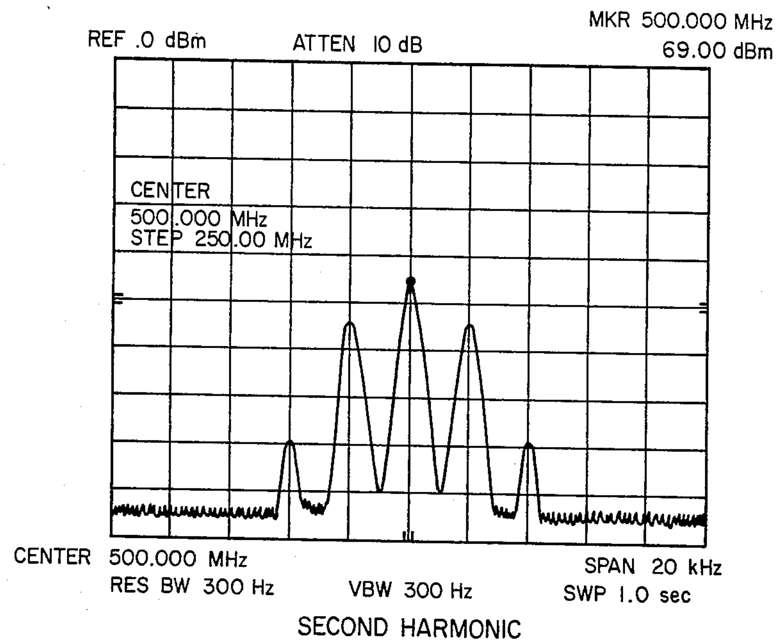
FIG_19D
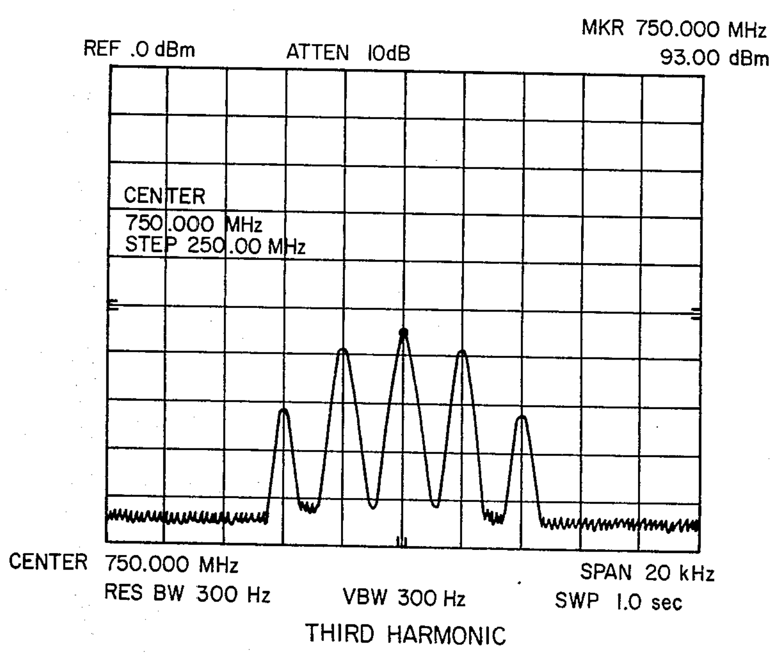
FIG_19E

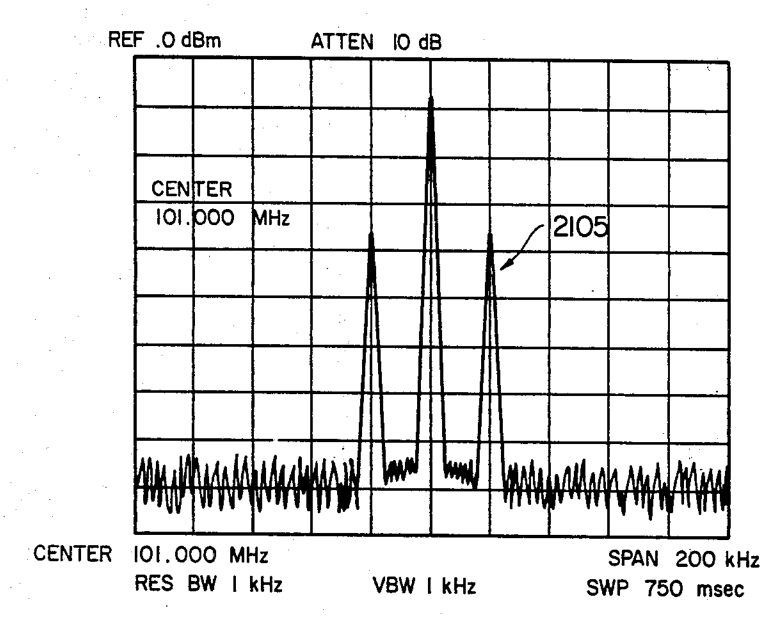
FIG_19F
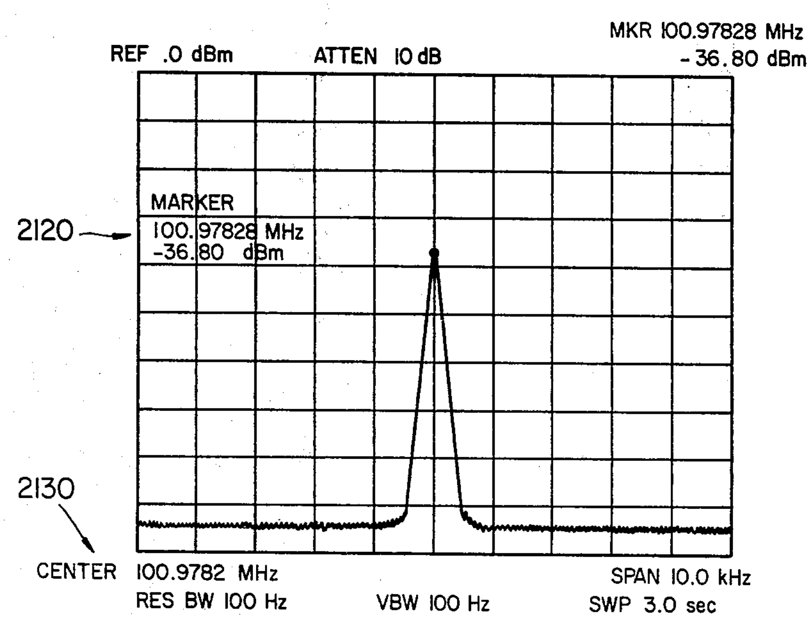
FIG_19G

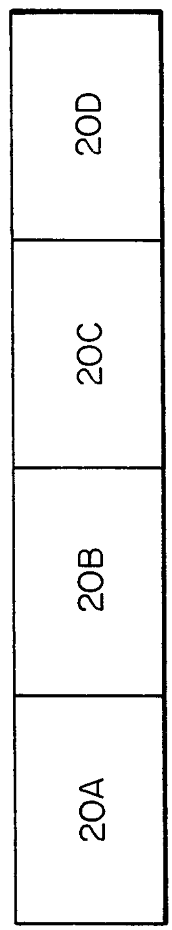
FIG_20

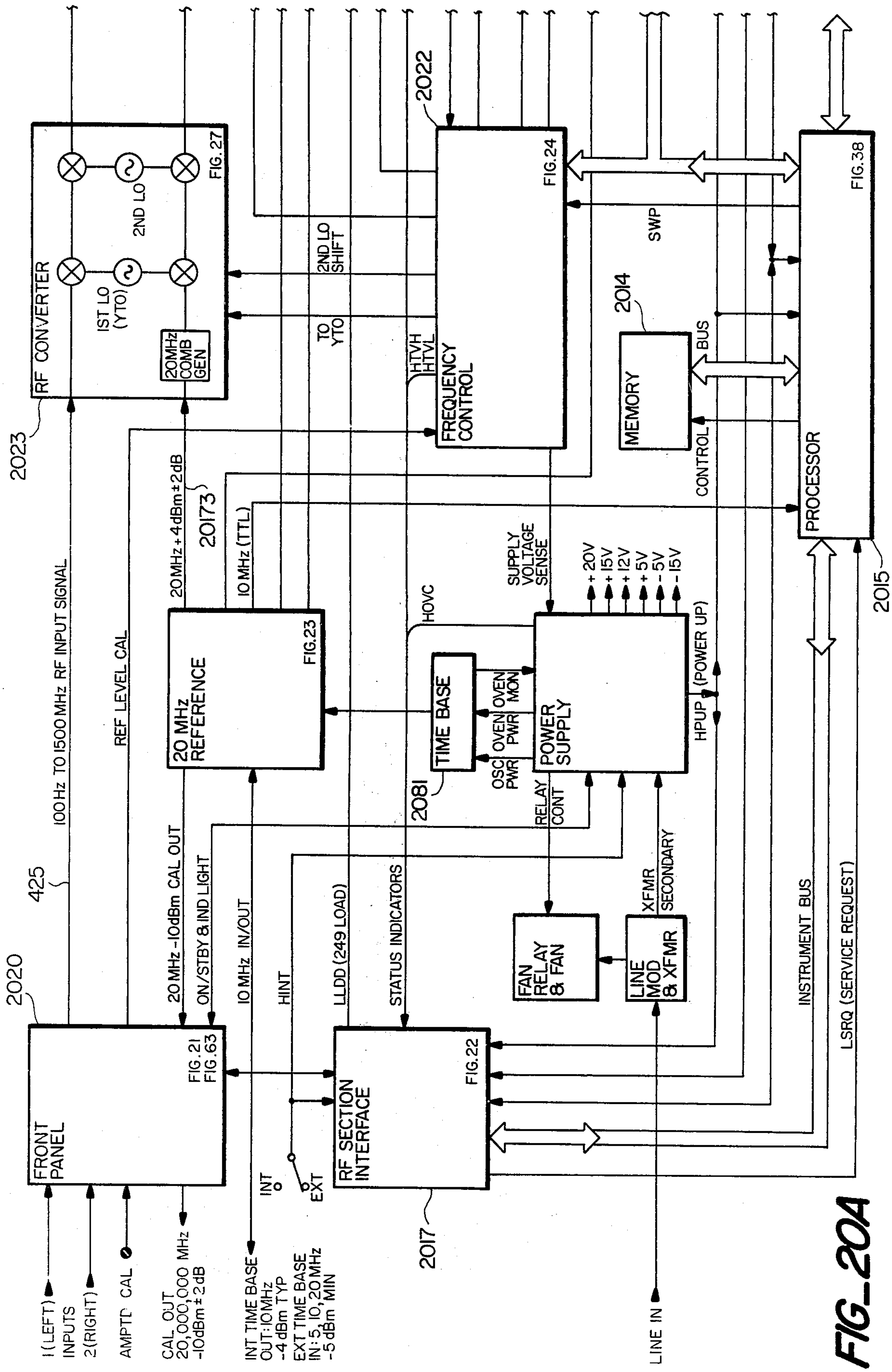
FIG_20A

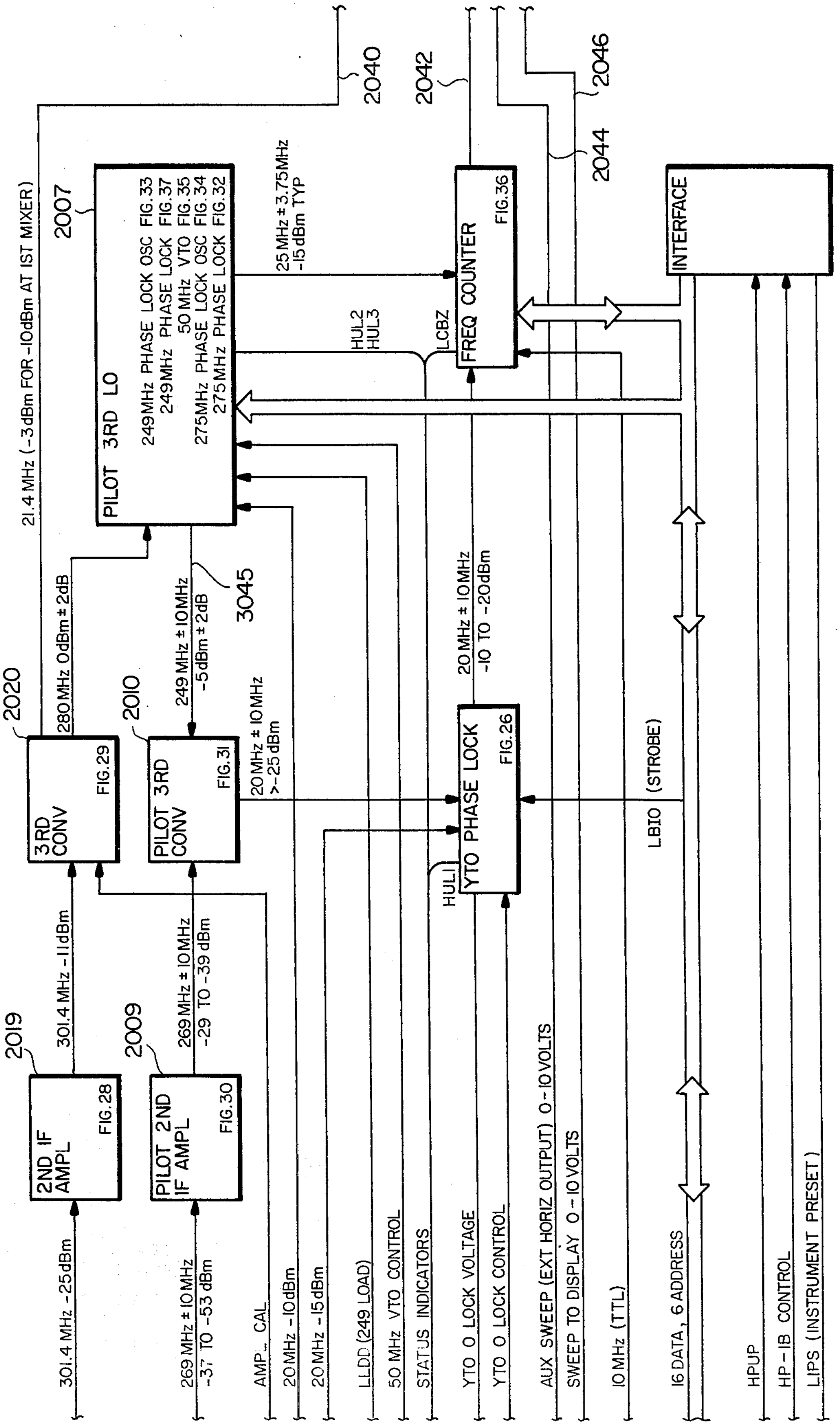
FIG_20B

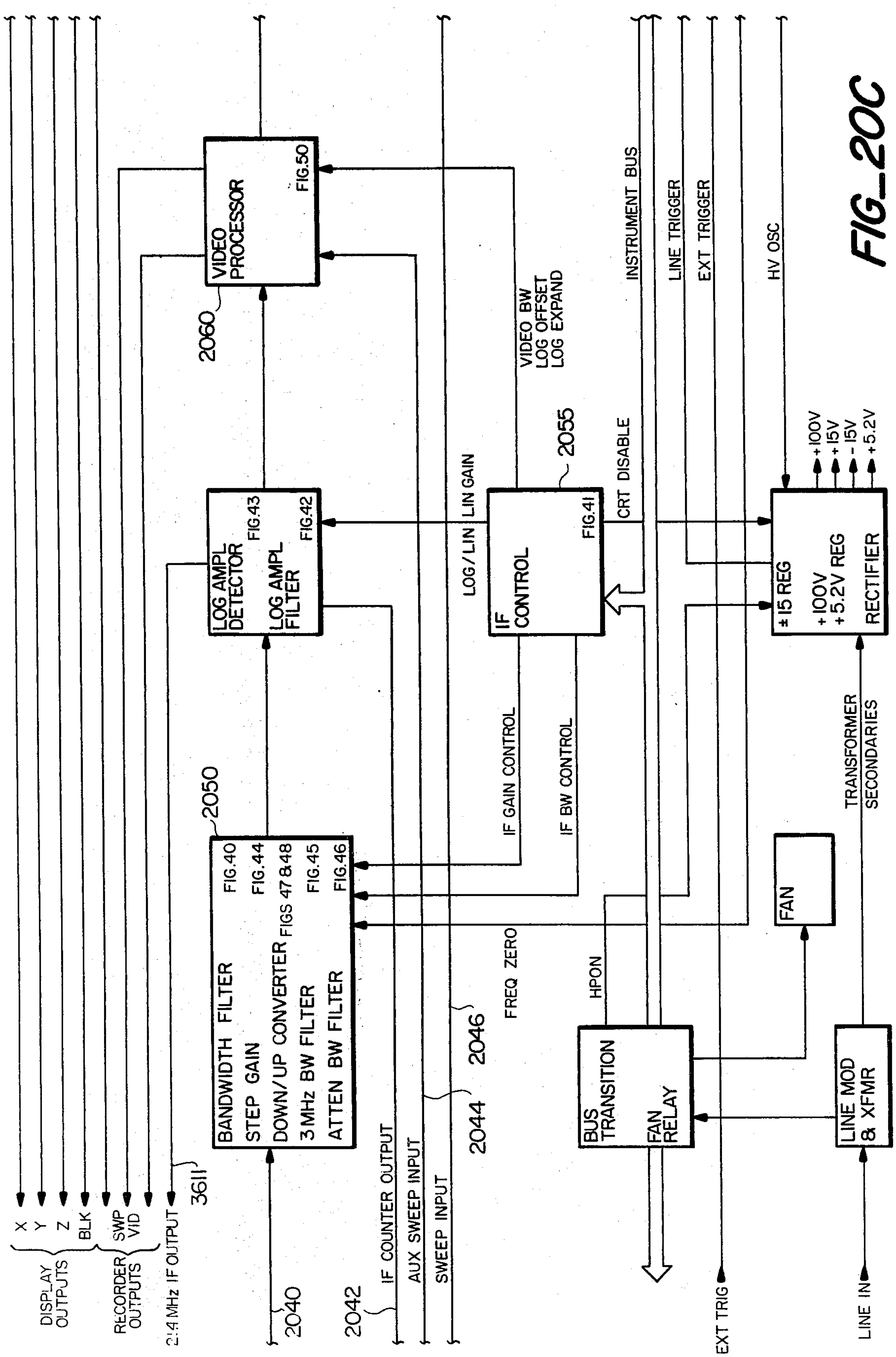
FIG_20C

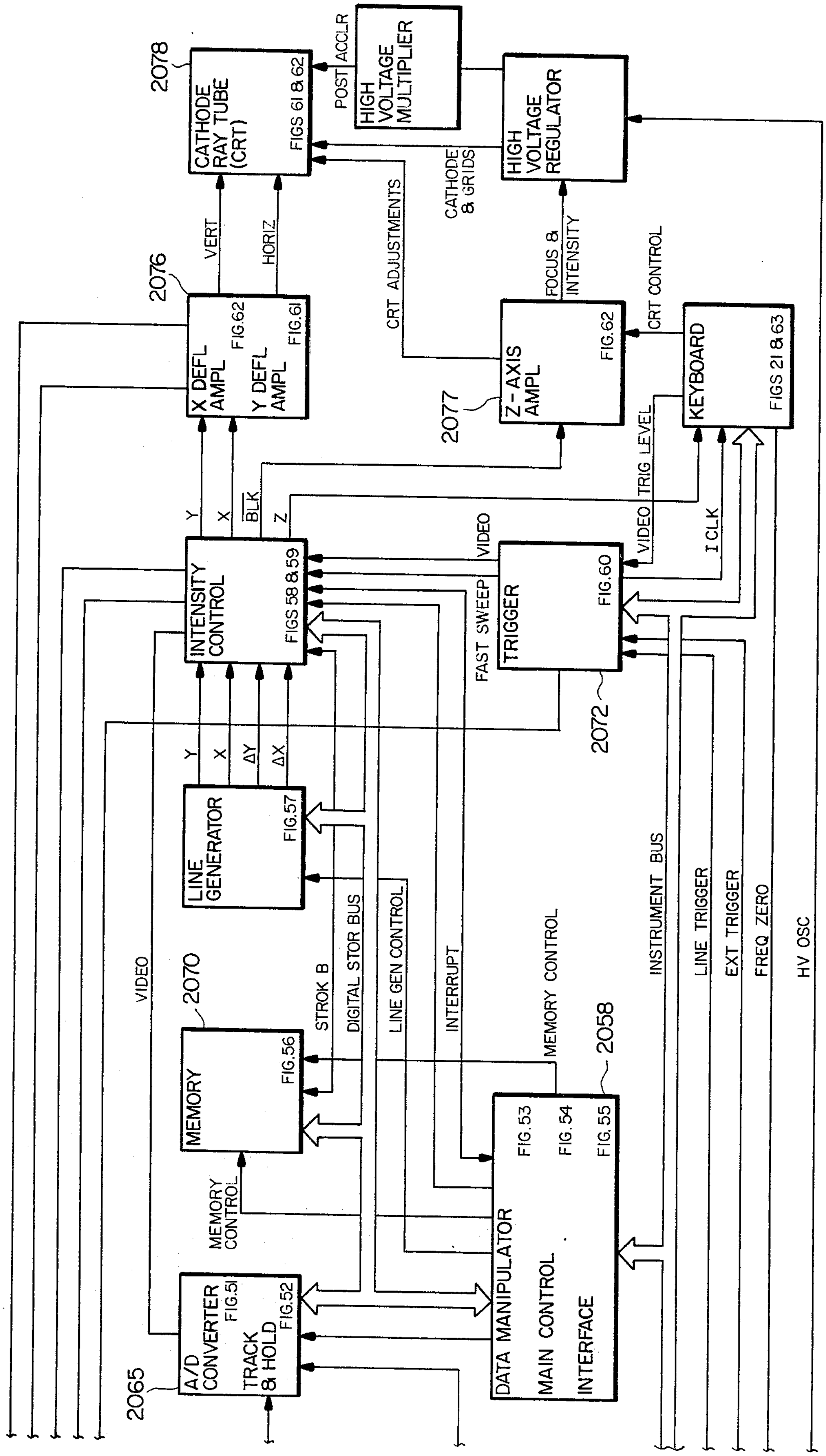
FIG_20D

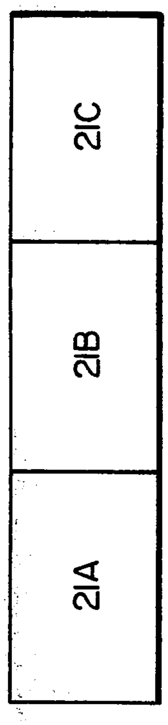
FIG._21

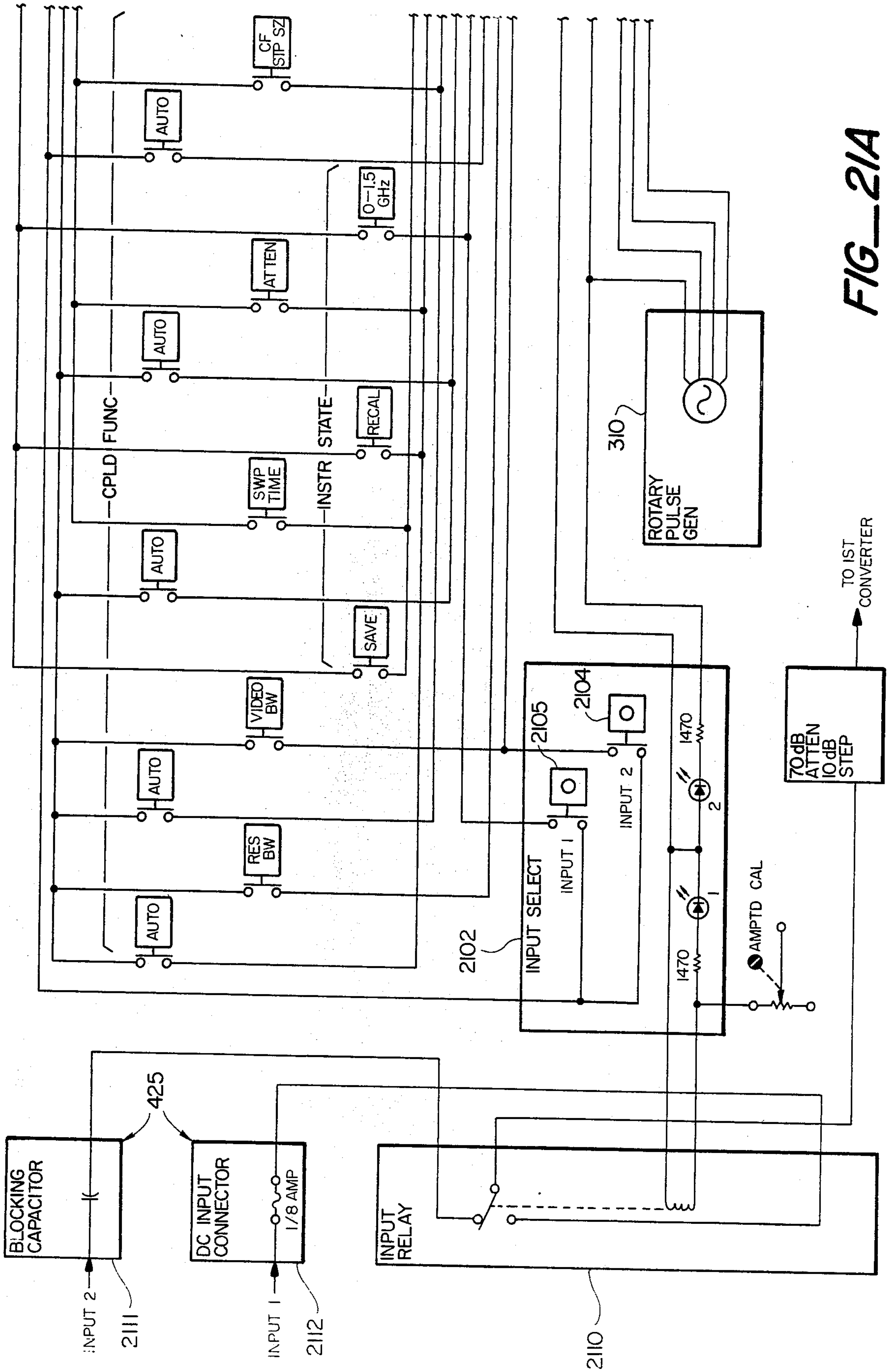
FIG_21A

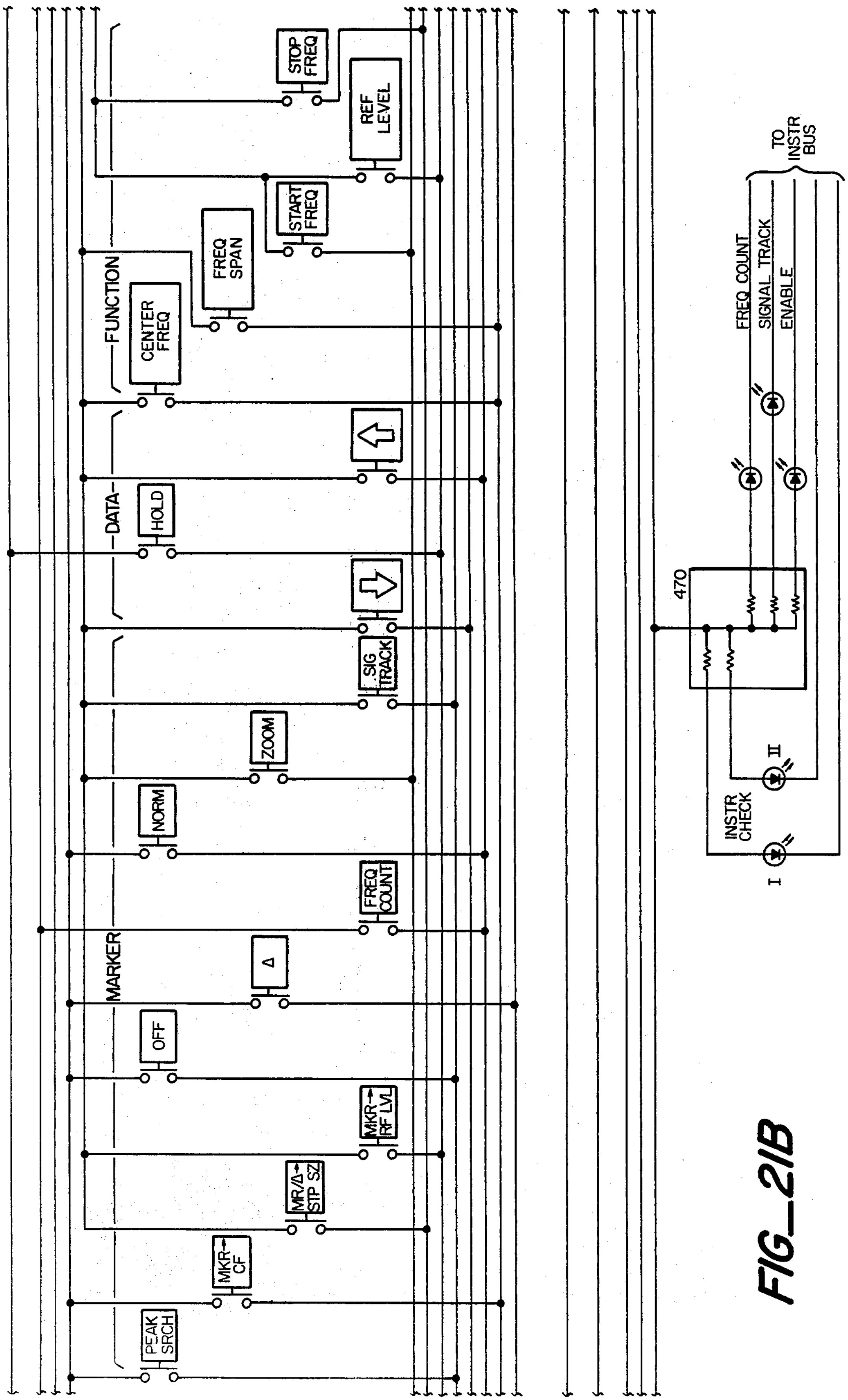
FIG_21B

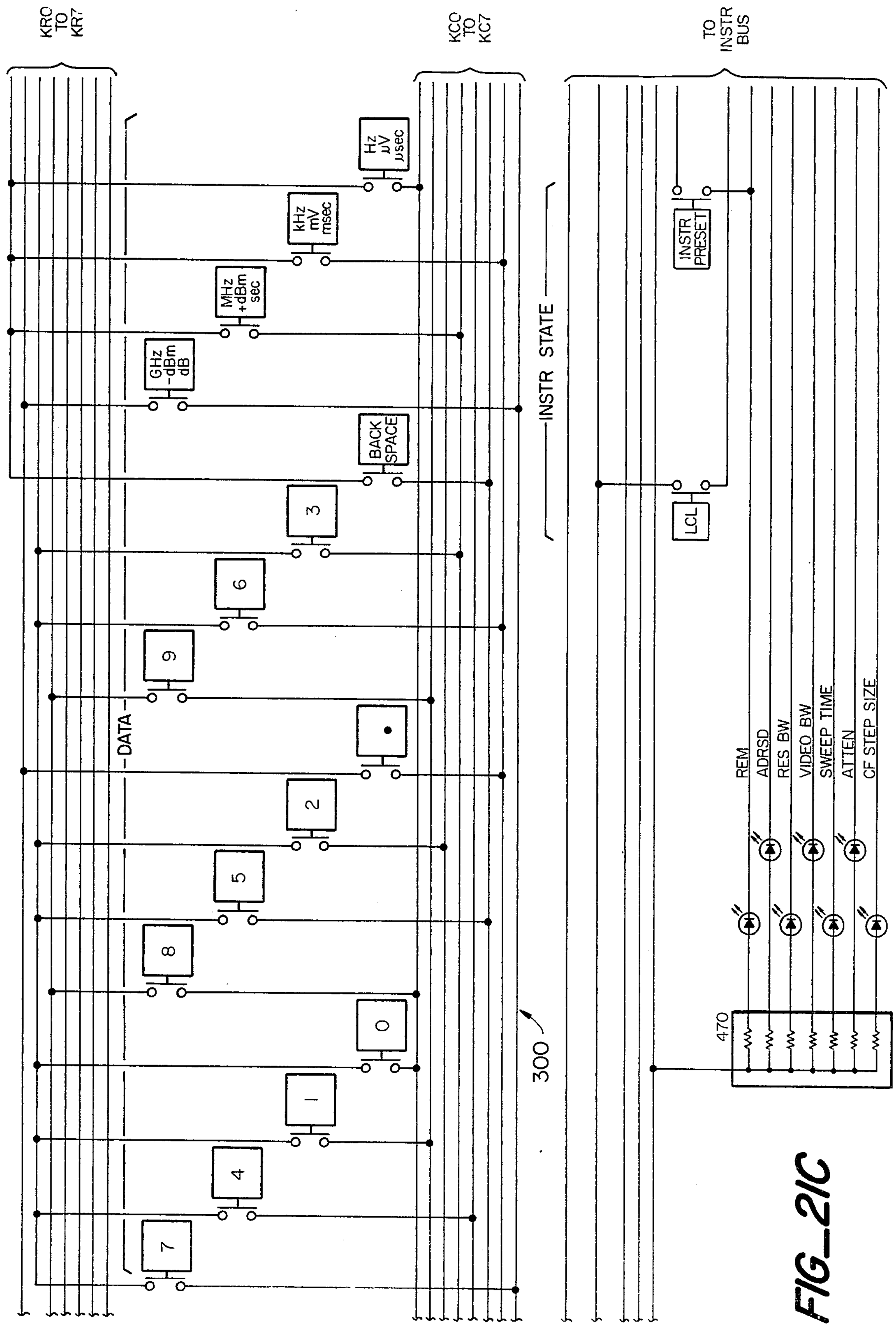
FIG_21C

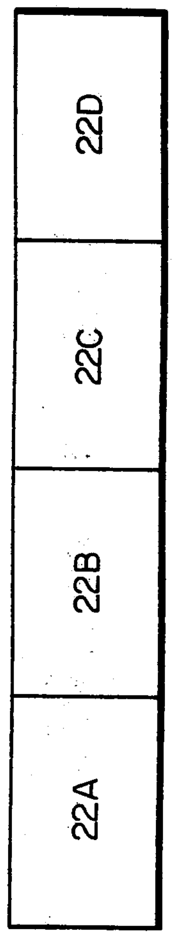
FIG_22

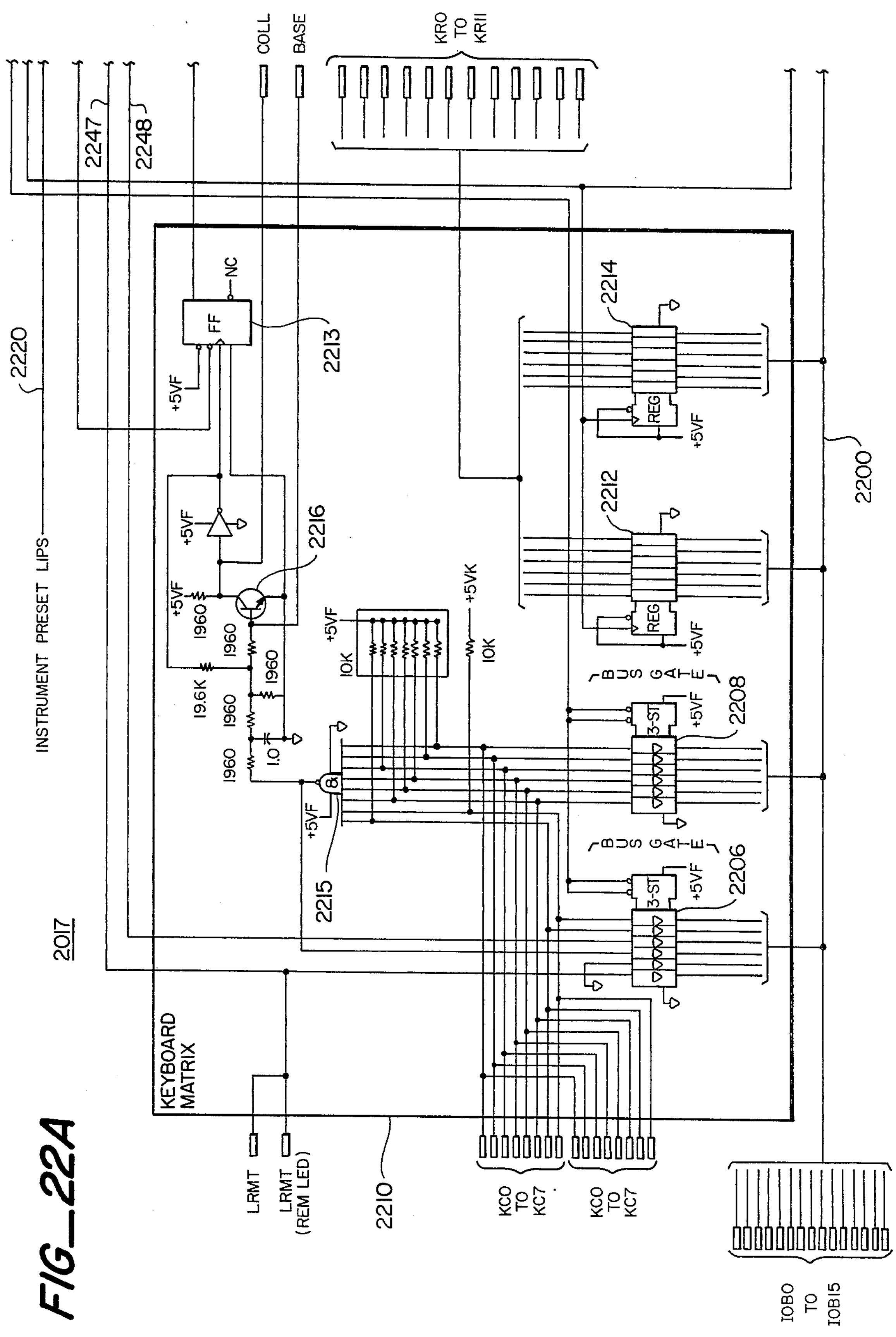
FIG_22A

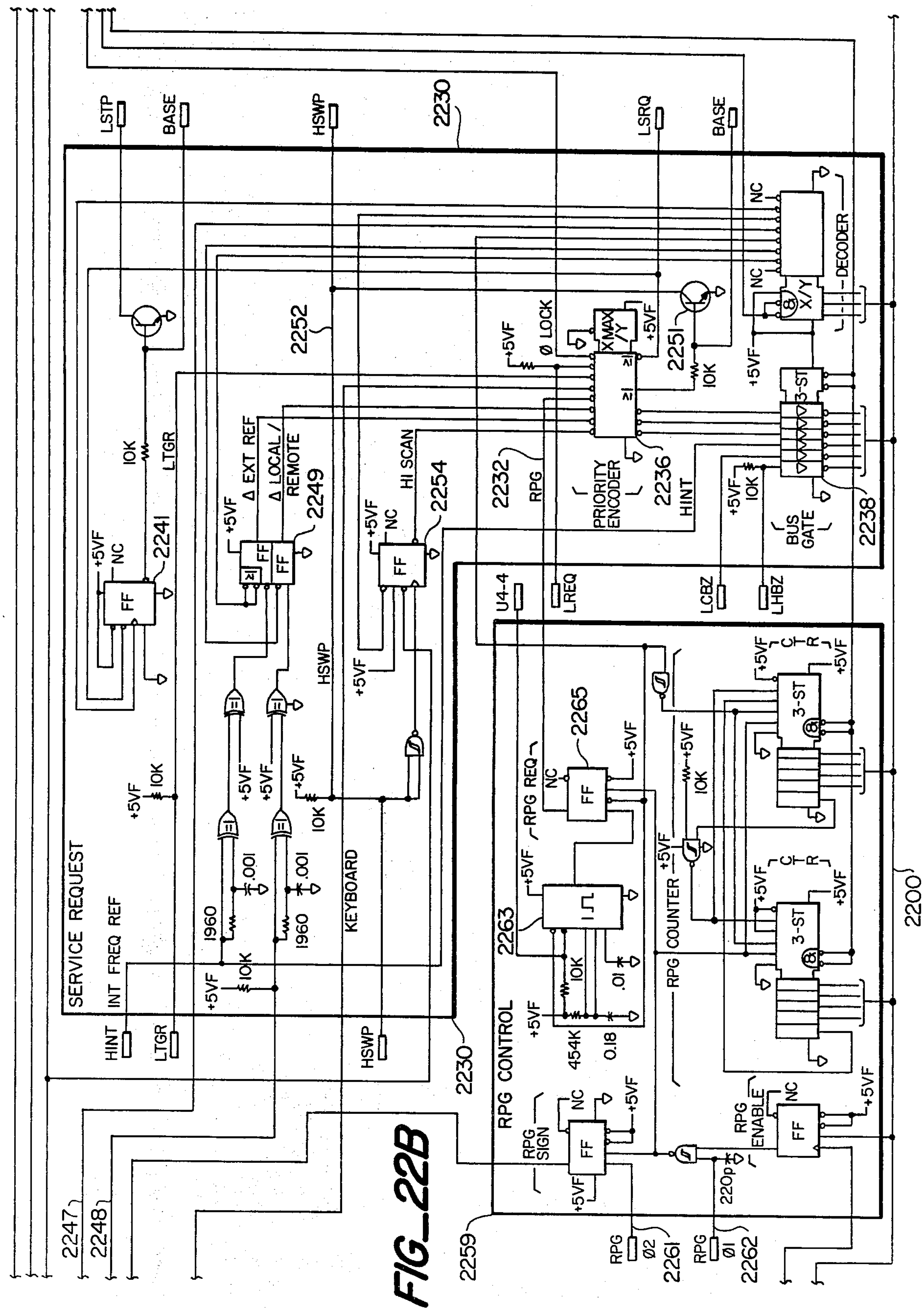
FIG_22B

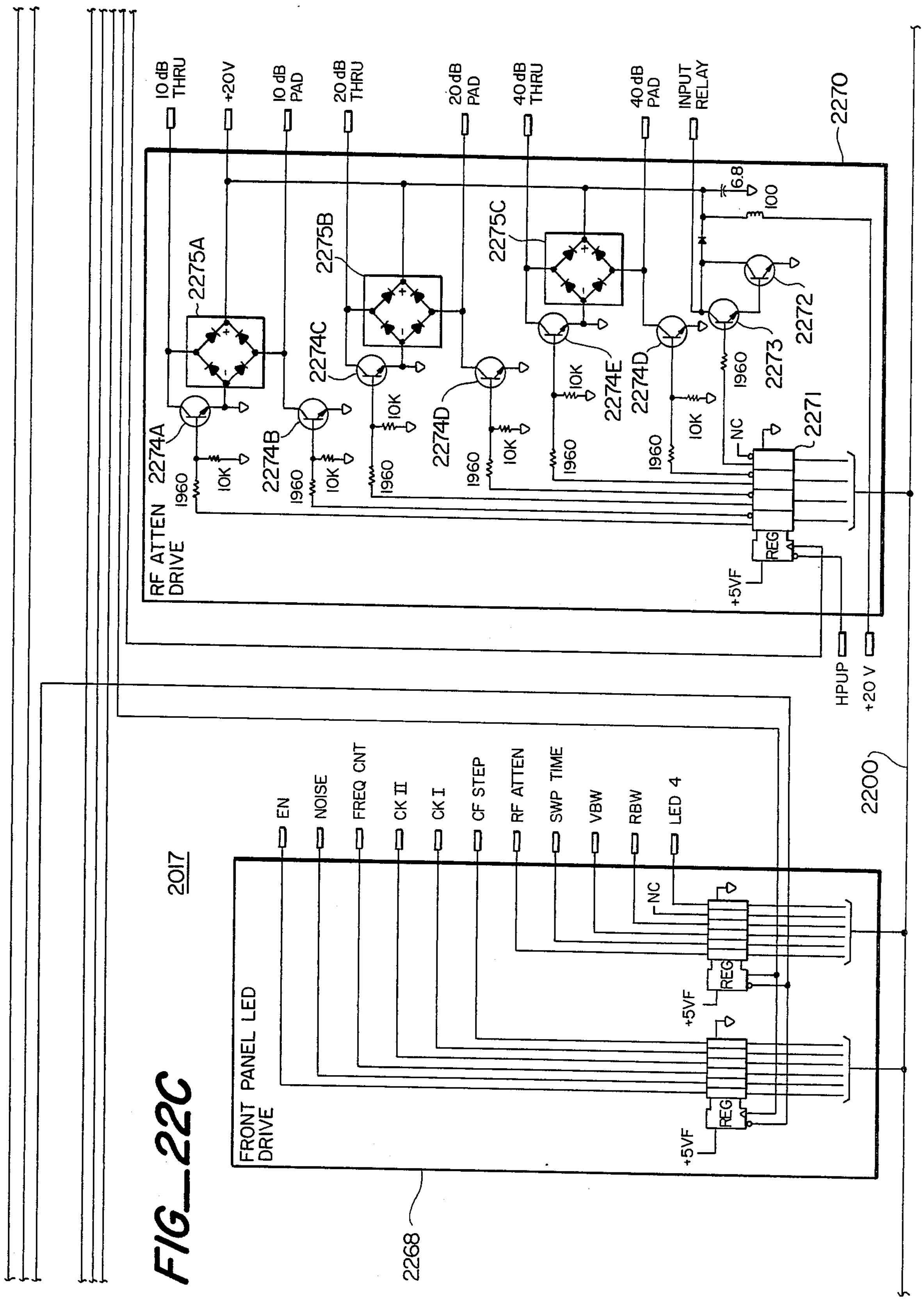
FIG_22C

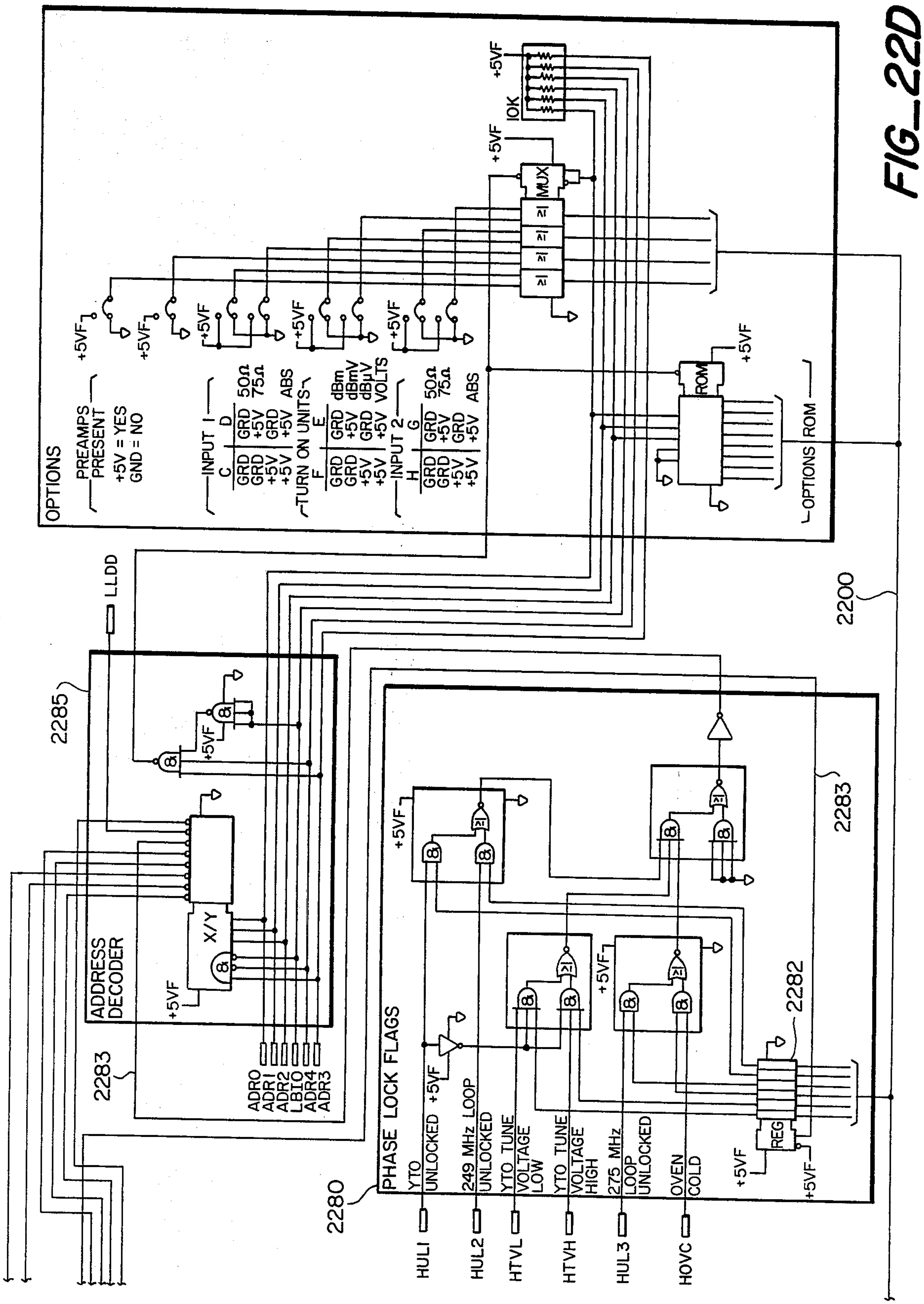
FIG_22D

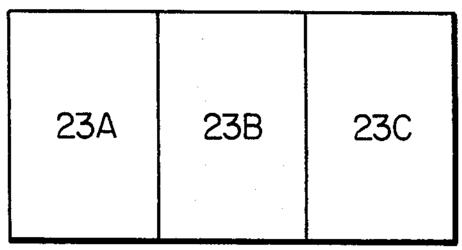
FIG_23

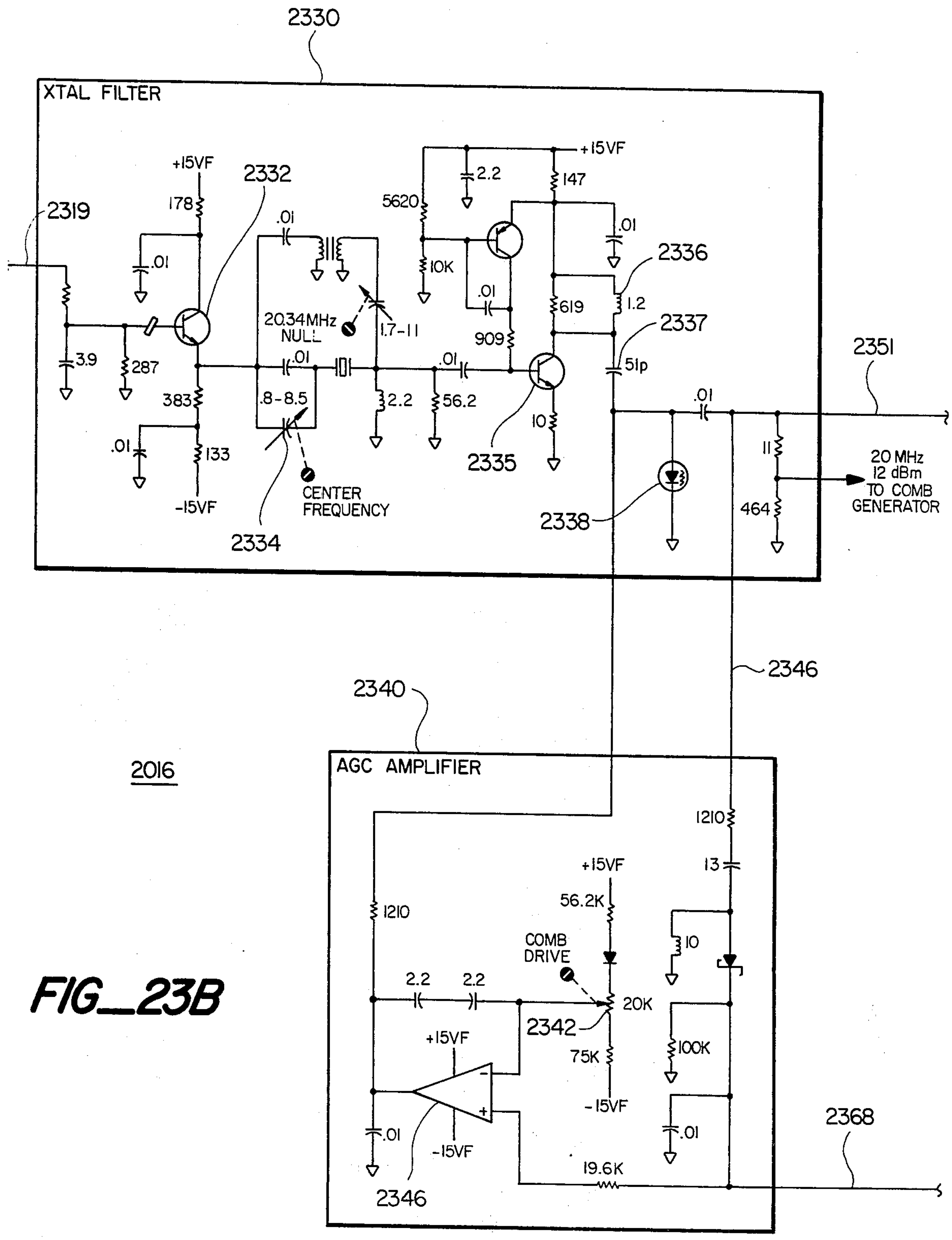
FIG_23B

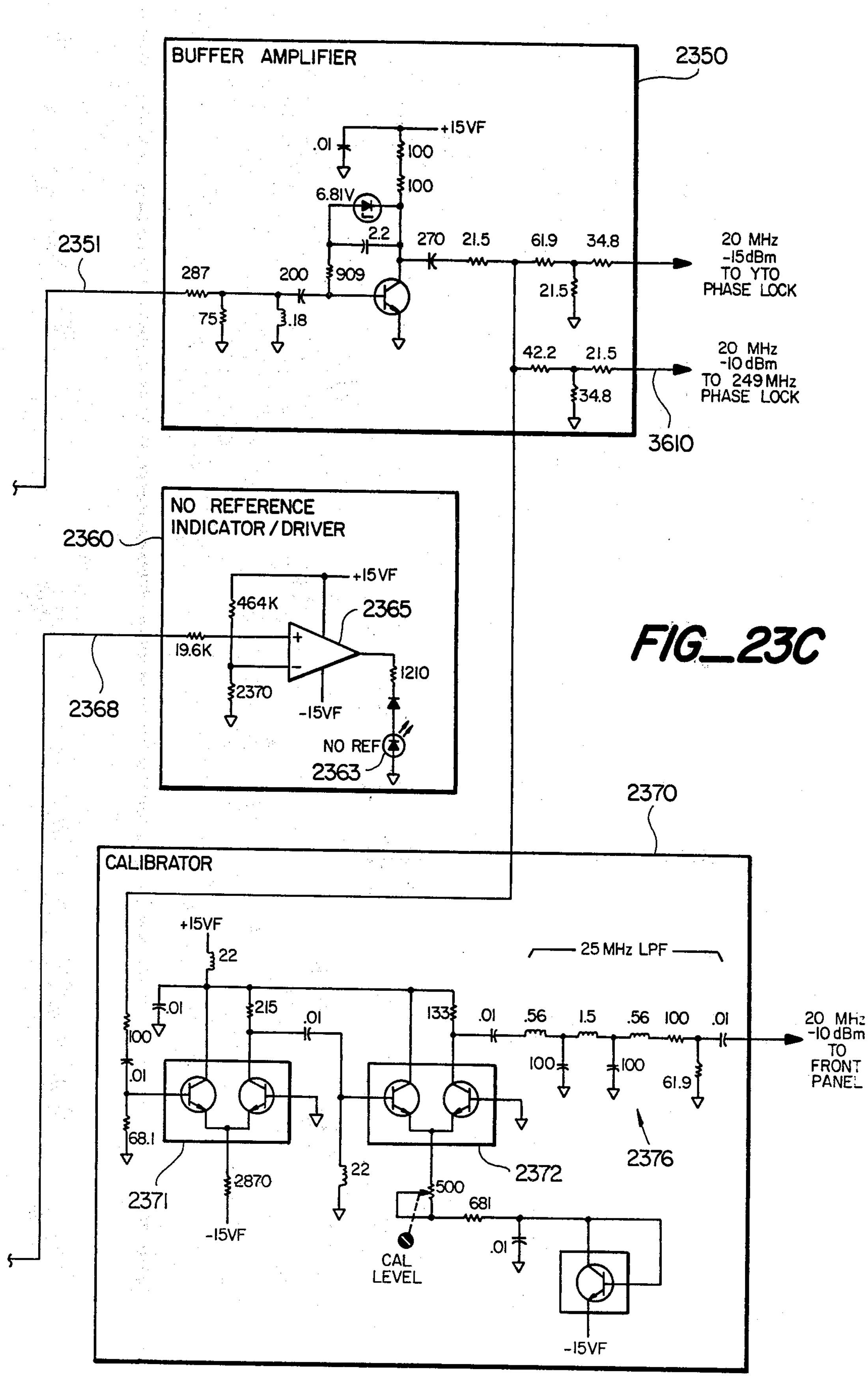
FIG_23C

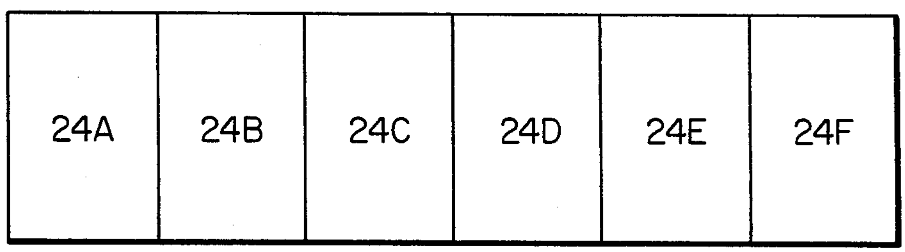
FIG_24

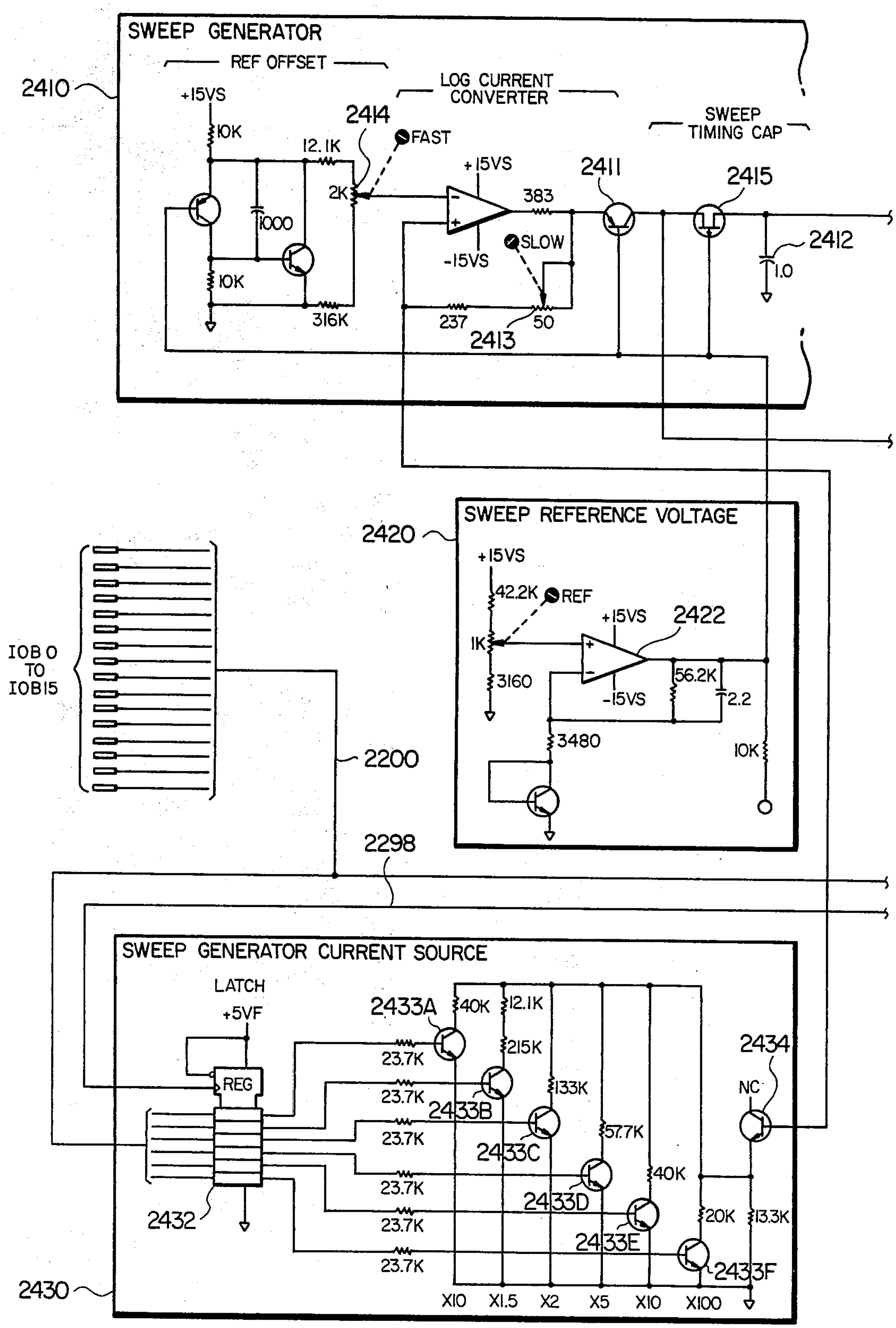
FIG_24A

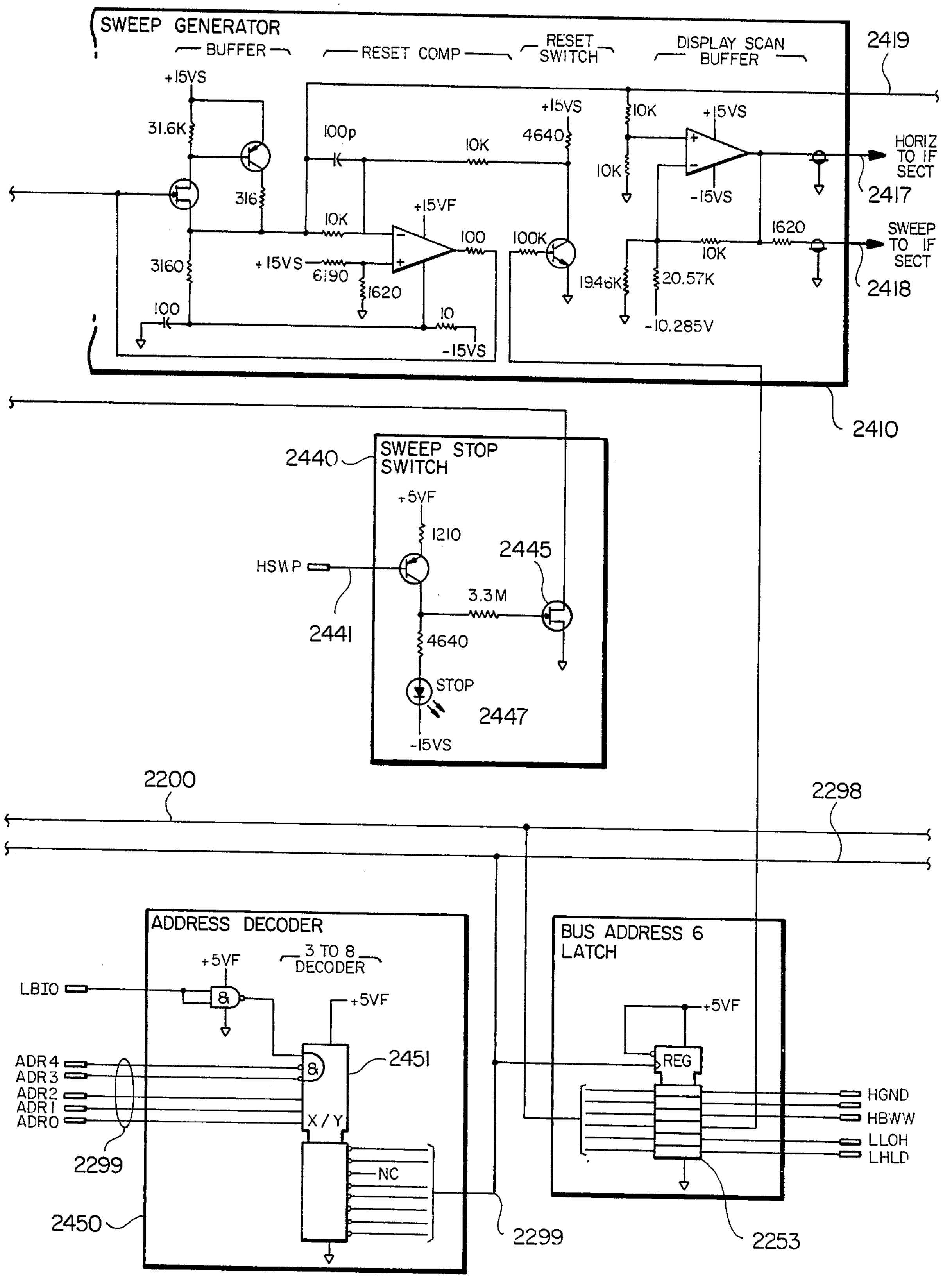
FIG_24B

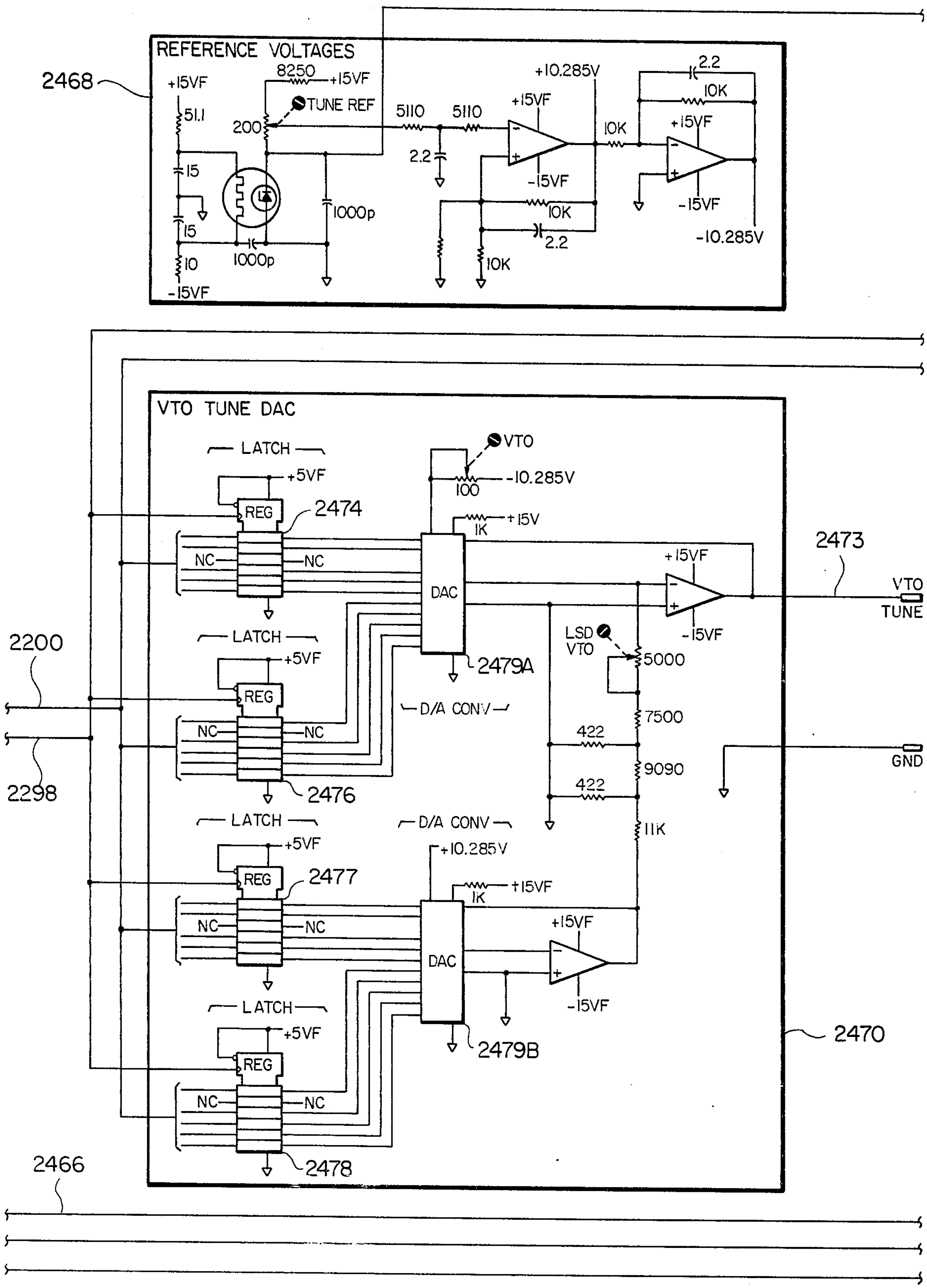
FIG_24D

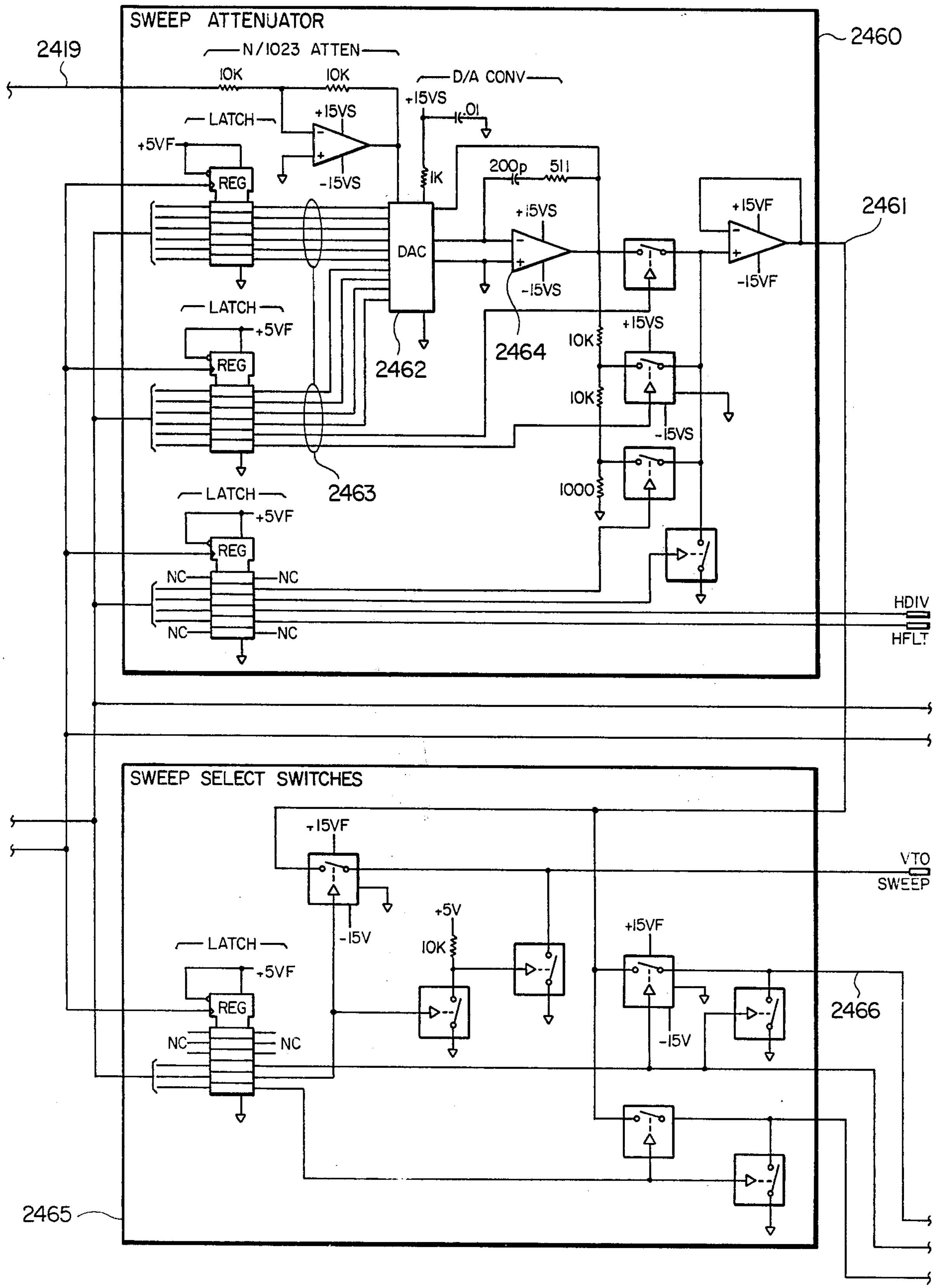
FIG_24C

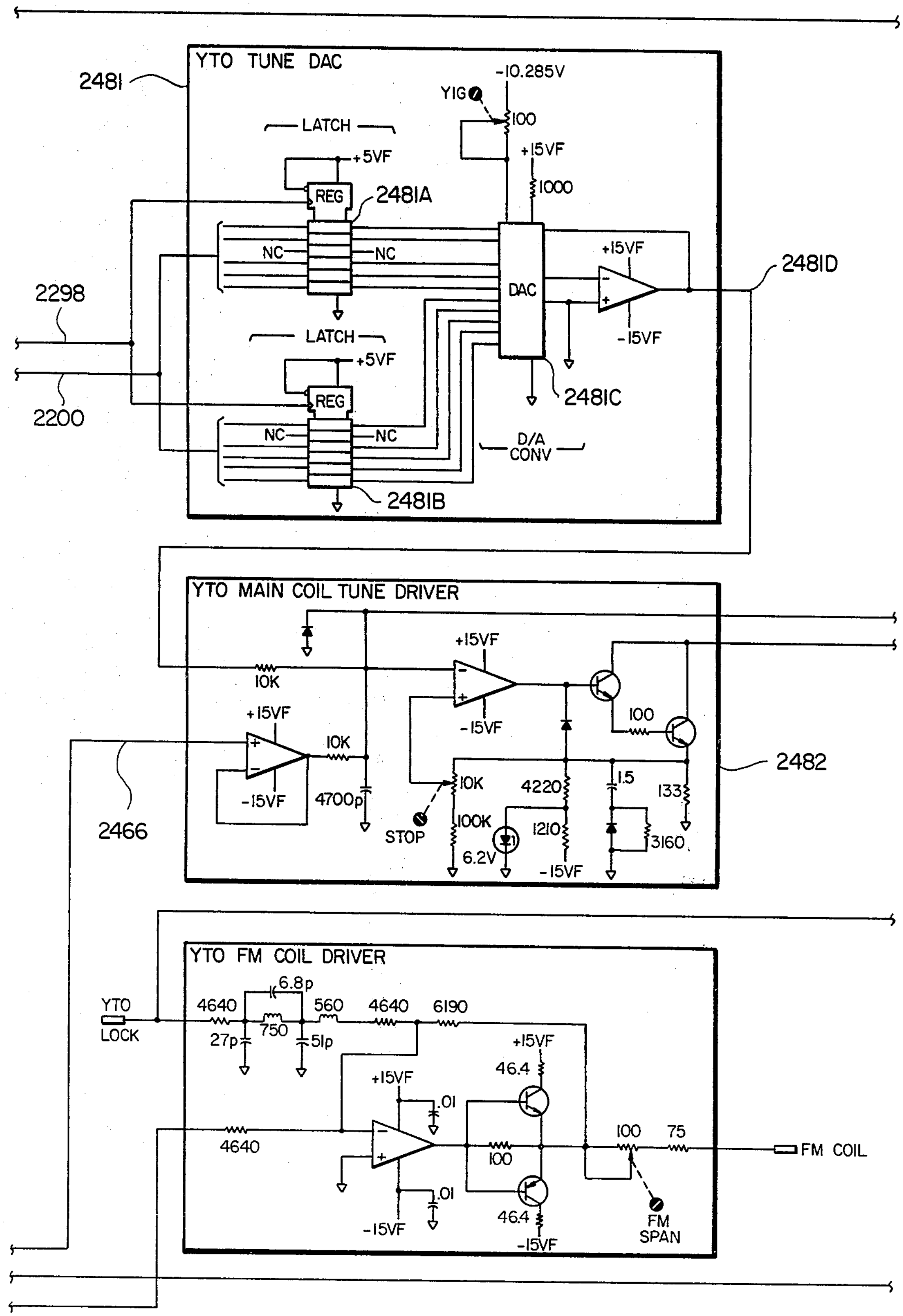
FIG_24E

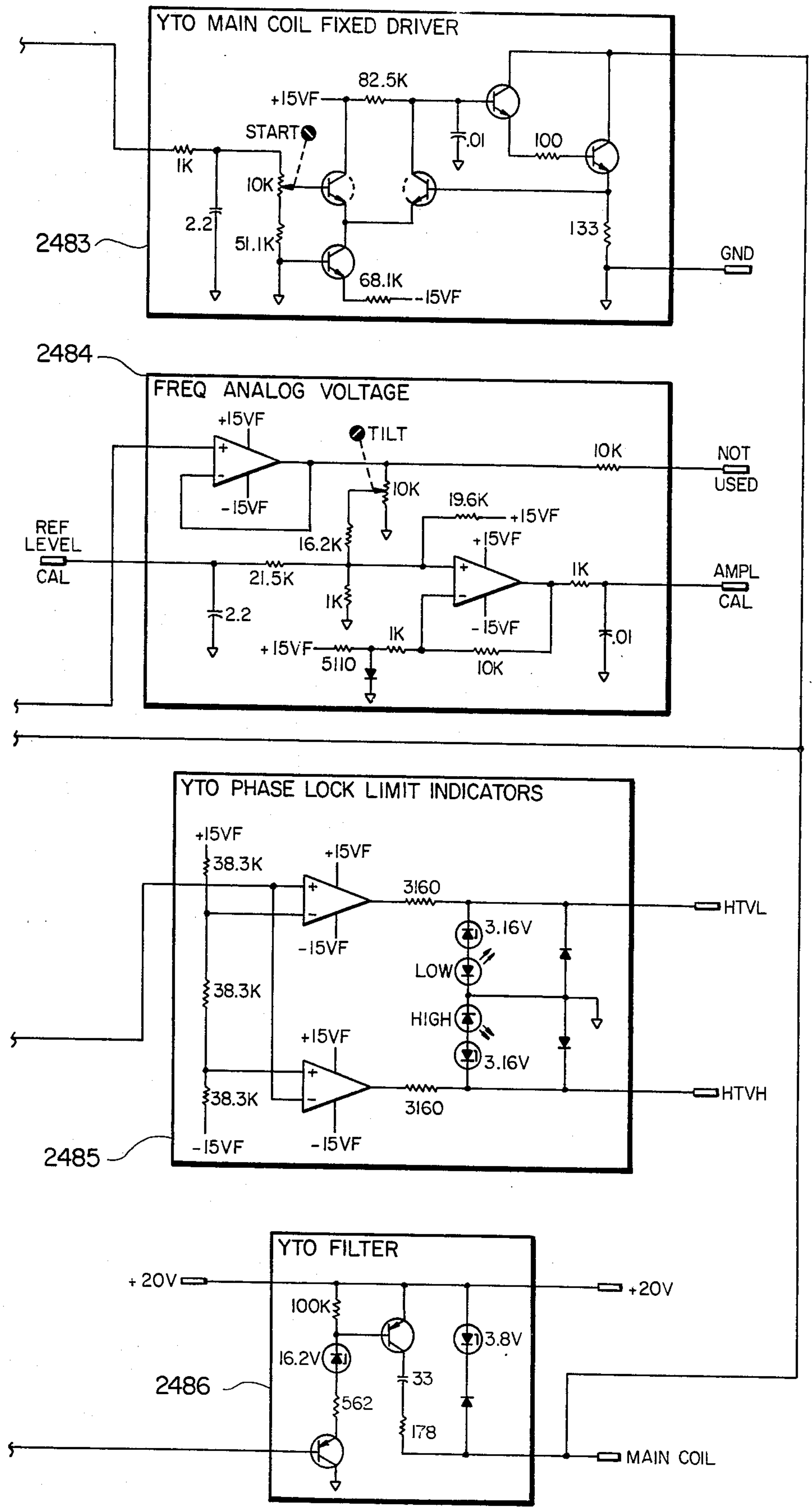
FIG_24F

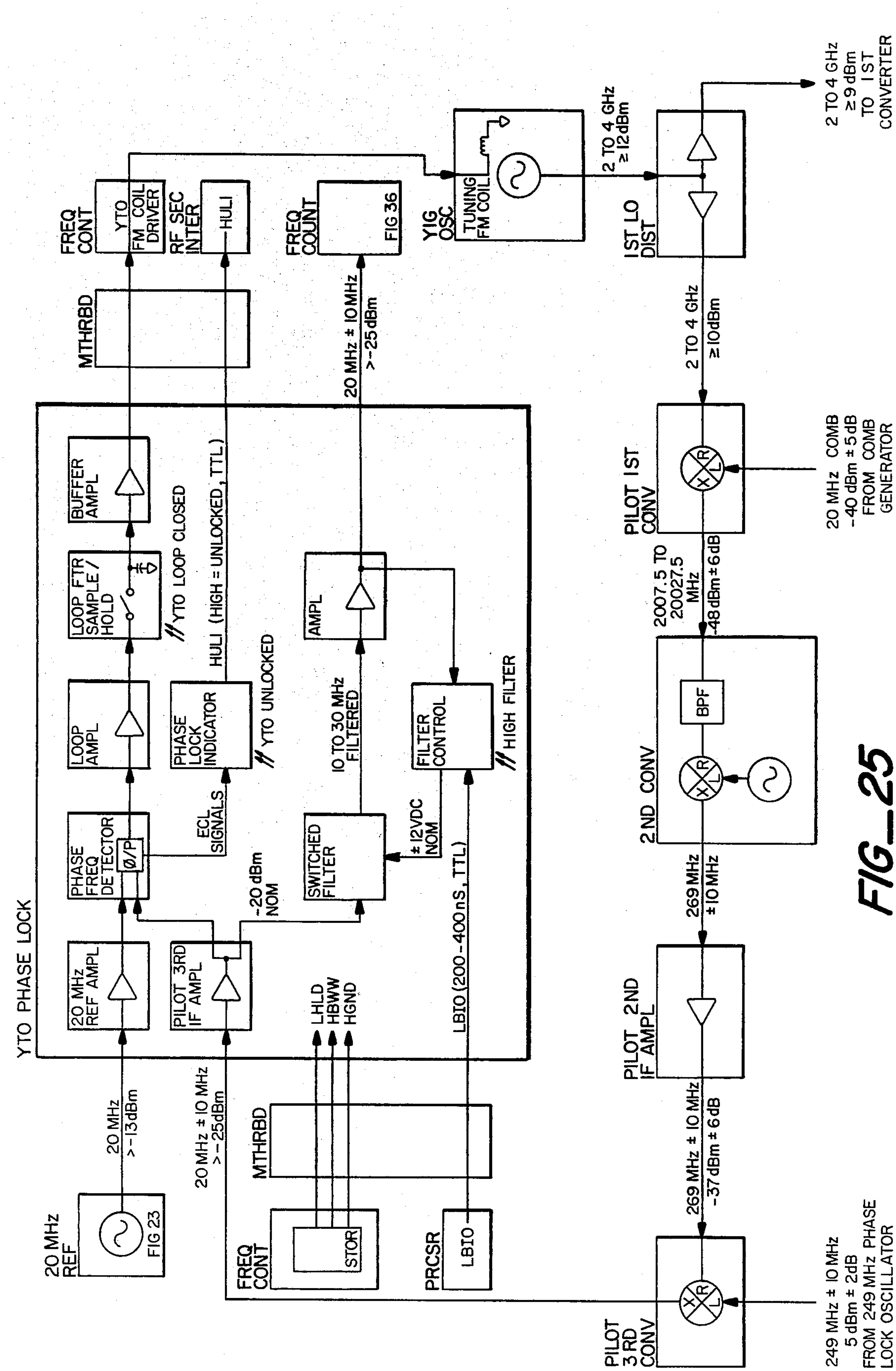
FIG_25

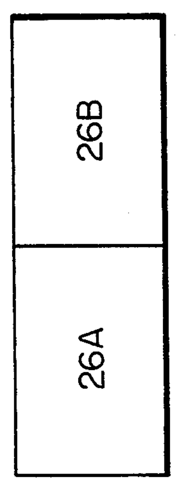
FIG_26

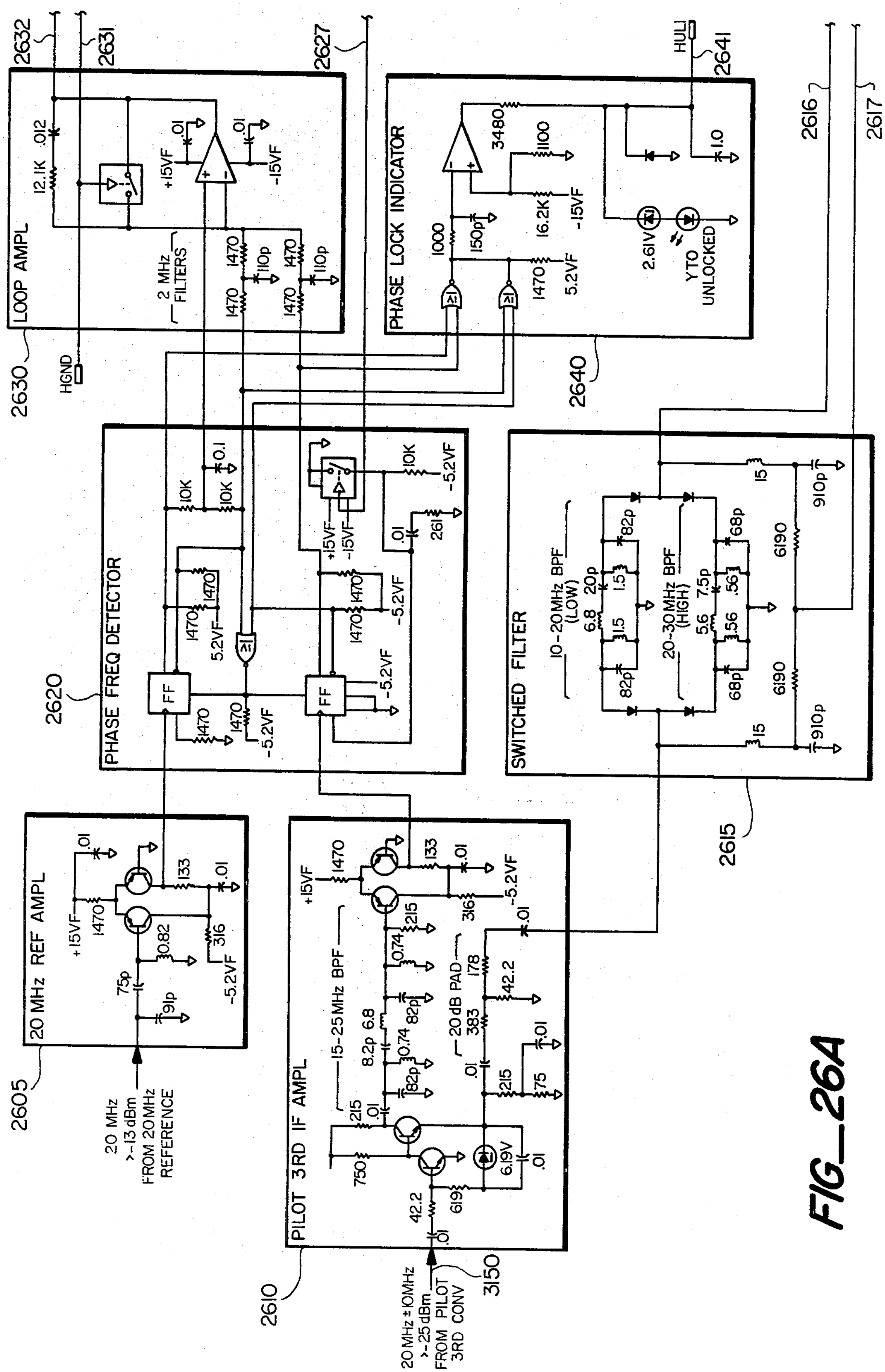
FIG_26A

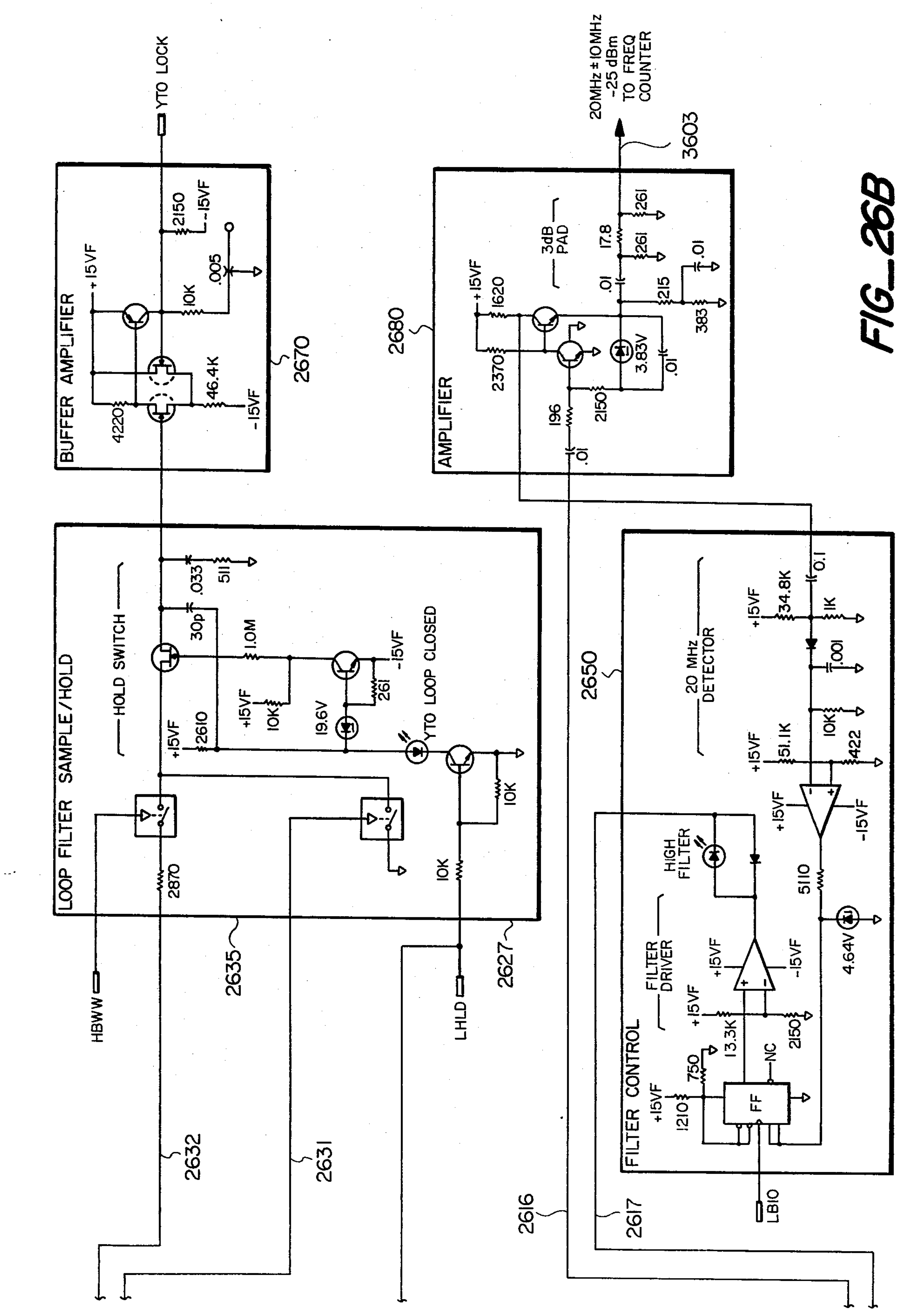
FIG_26B

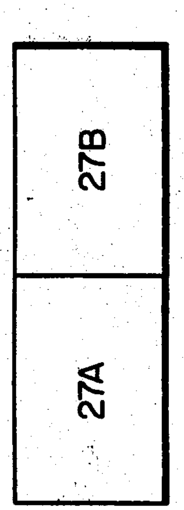
FIG_27

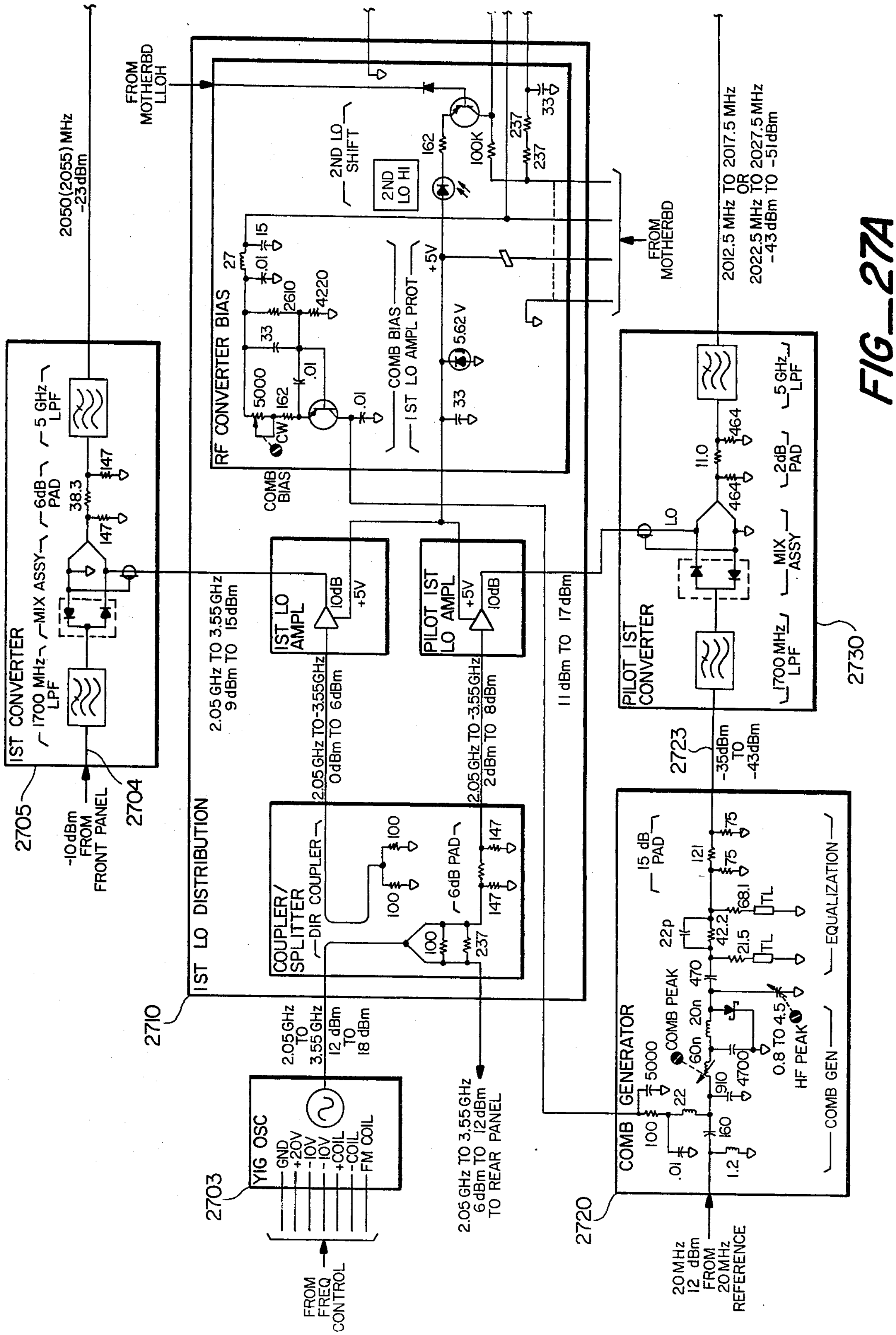
FIG_27A

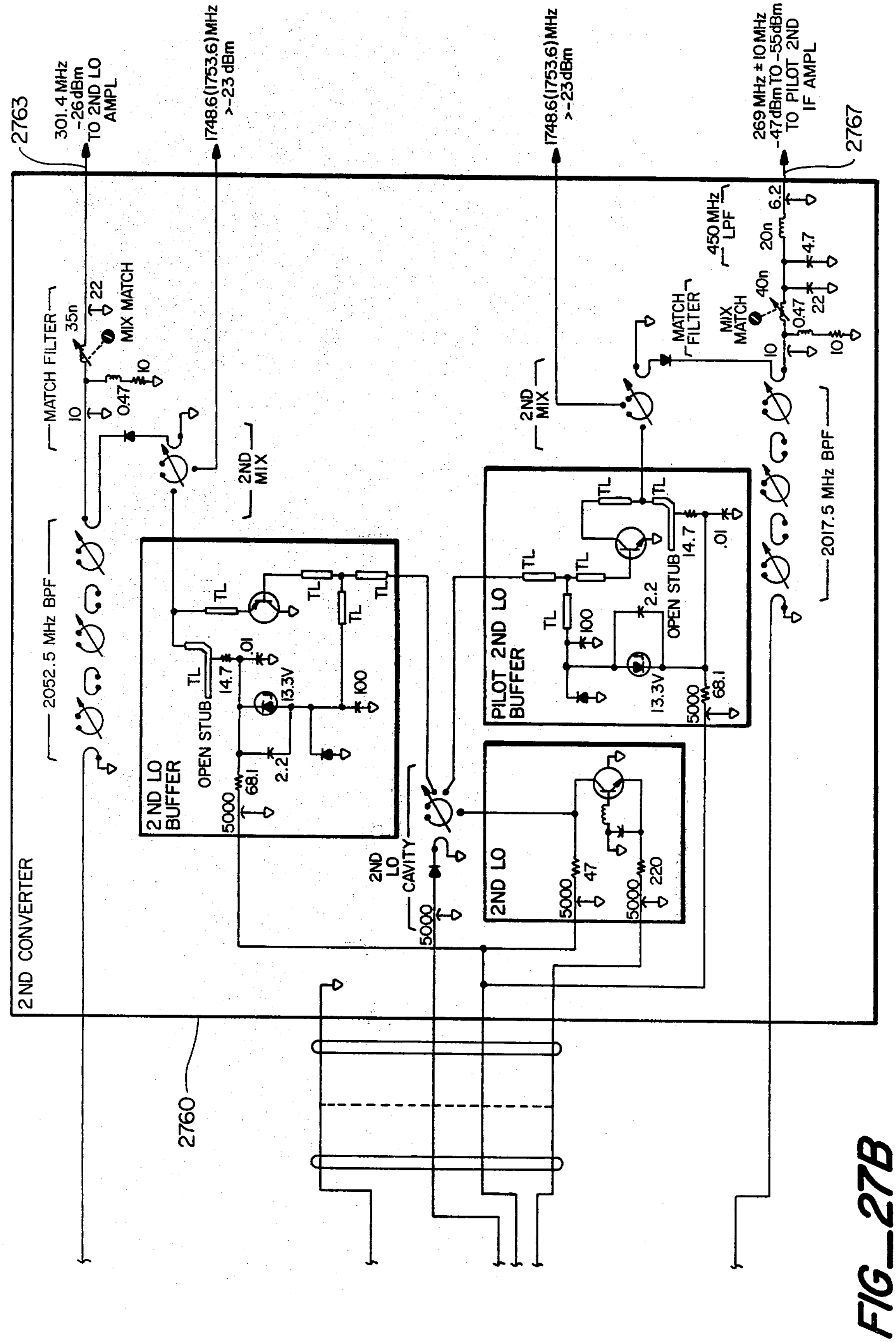
FIG_27B

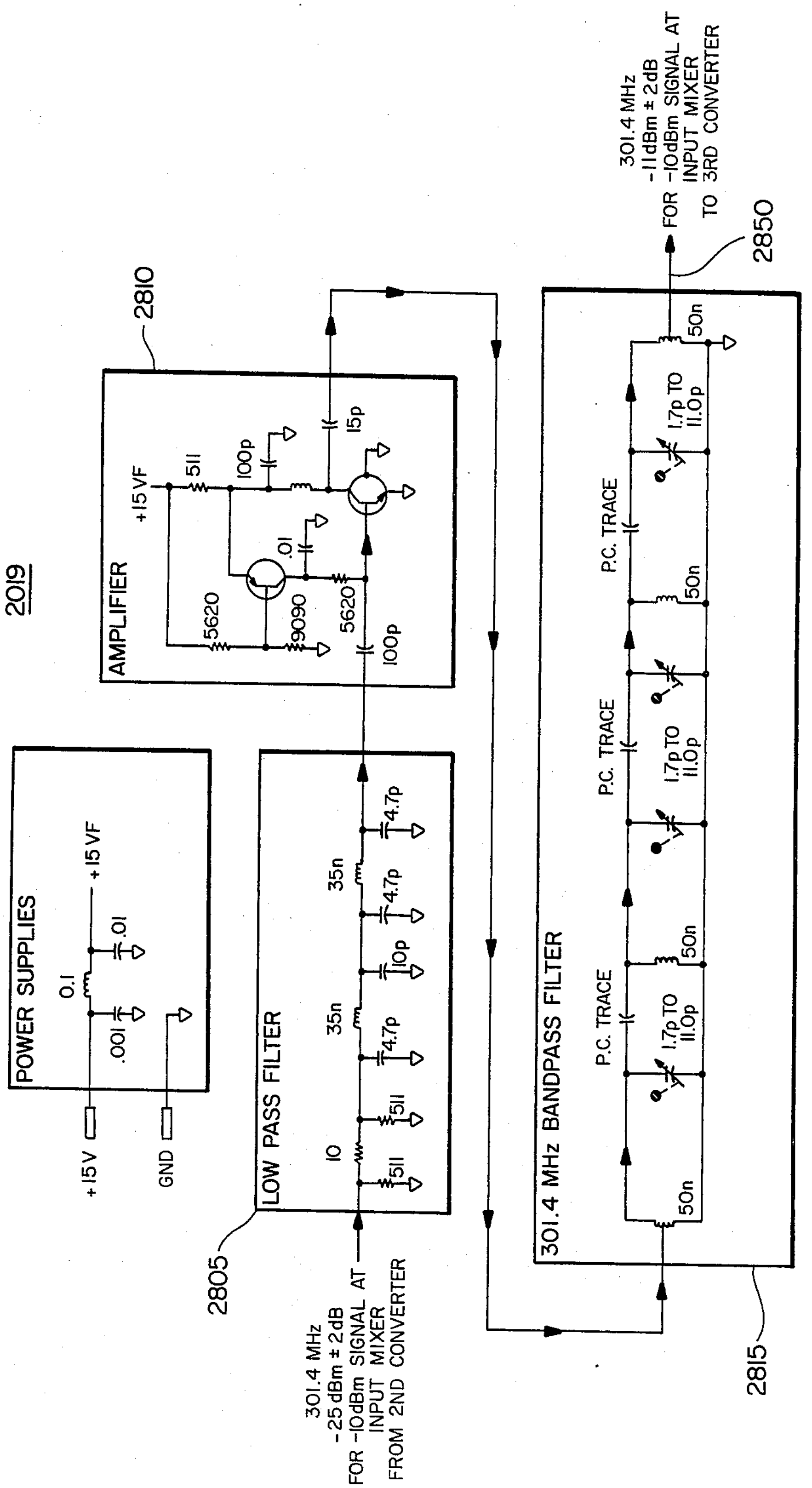
FIG_28

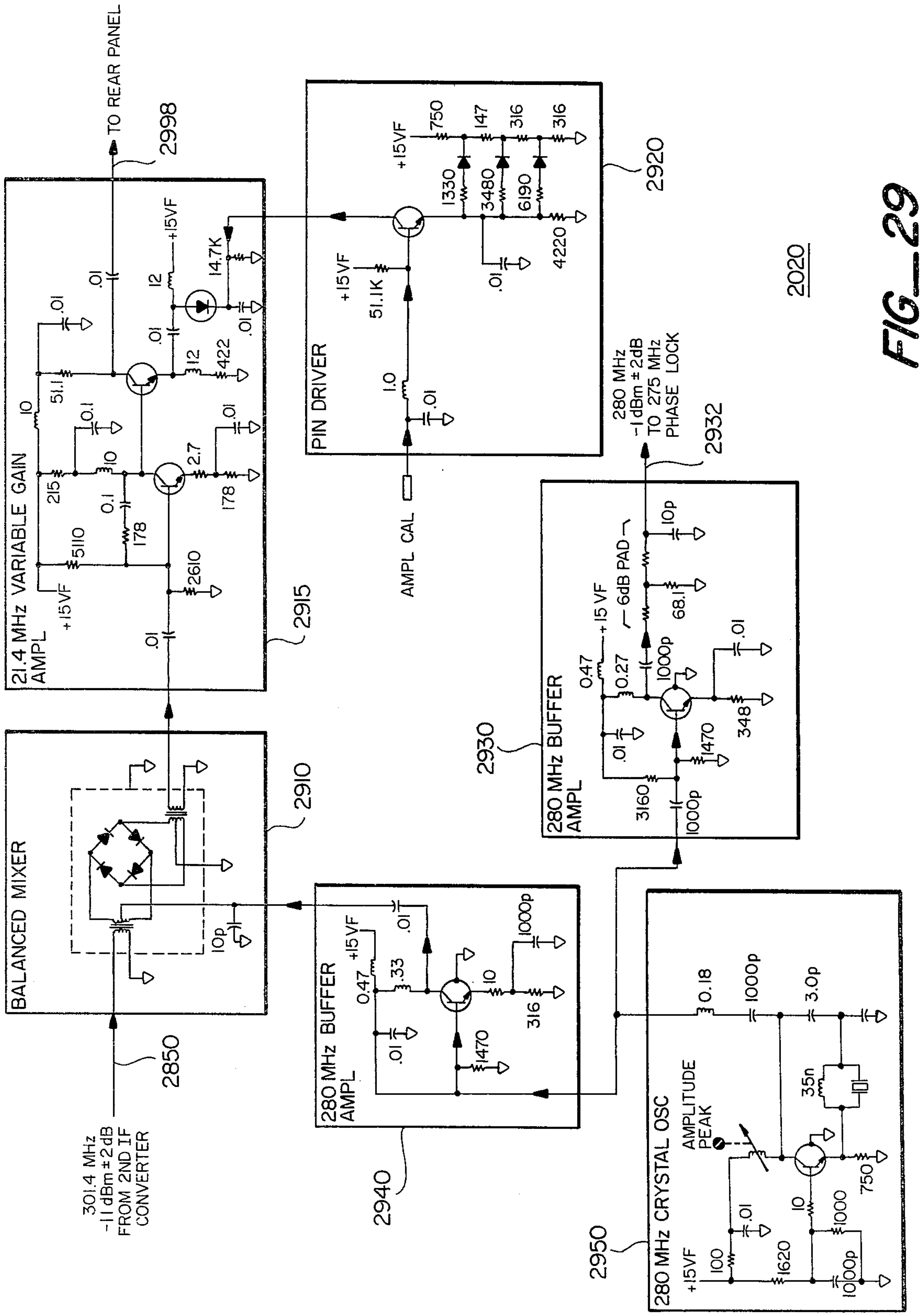
FIG_29

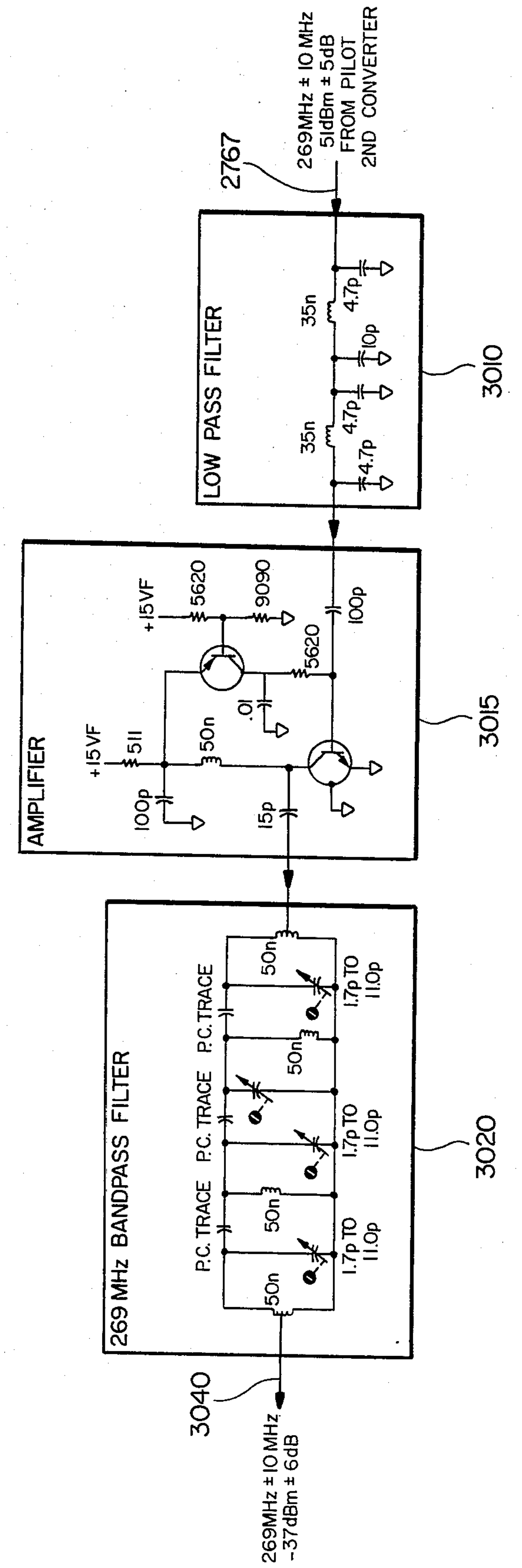
FIG_30

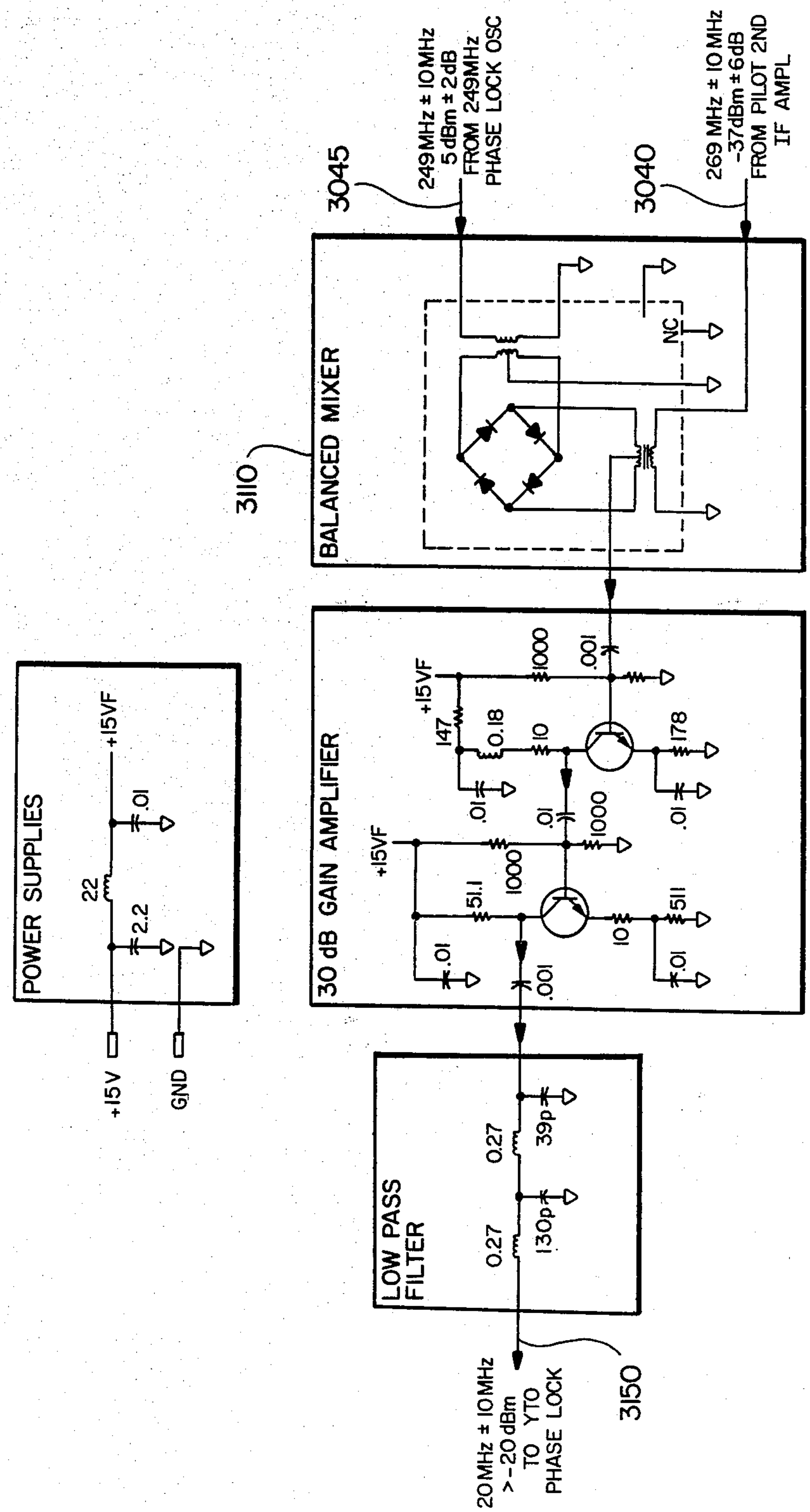
FIG_31

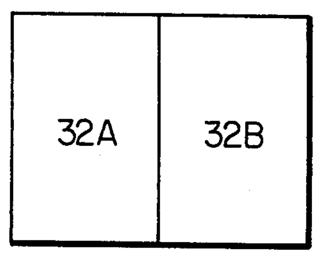
FIG_32

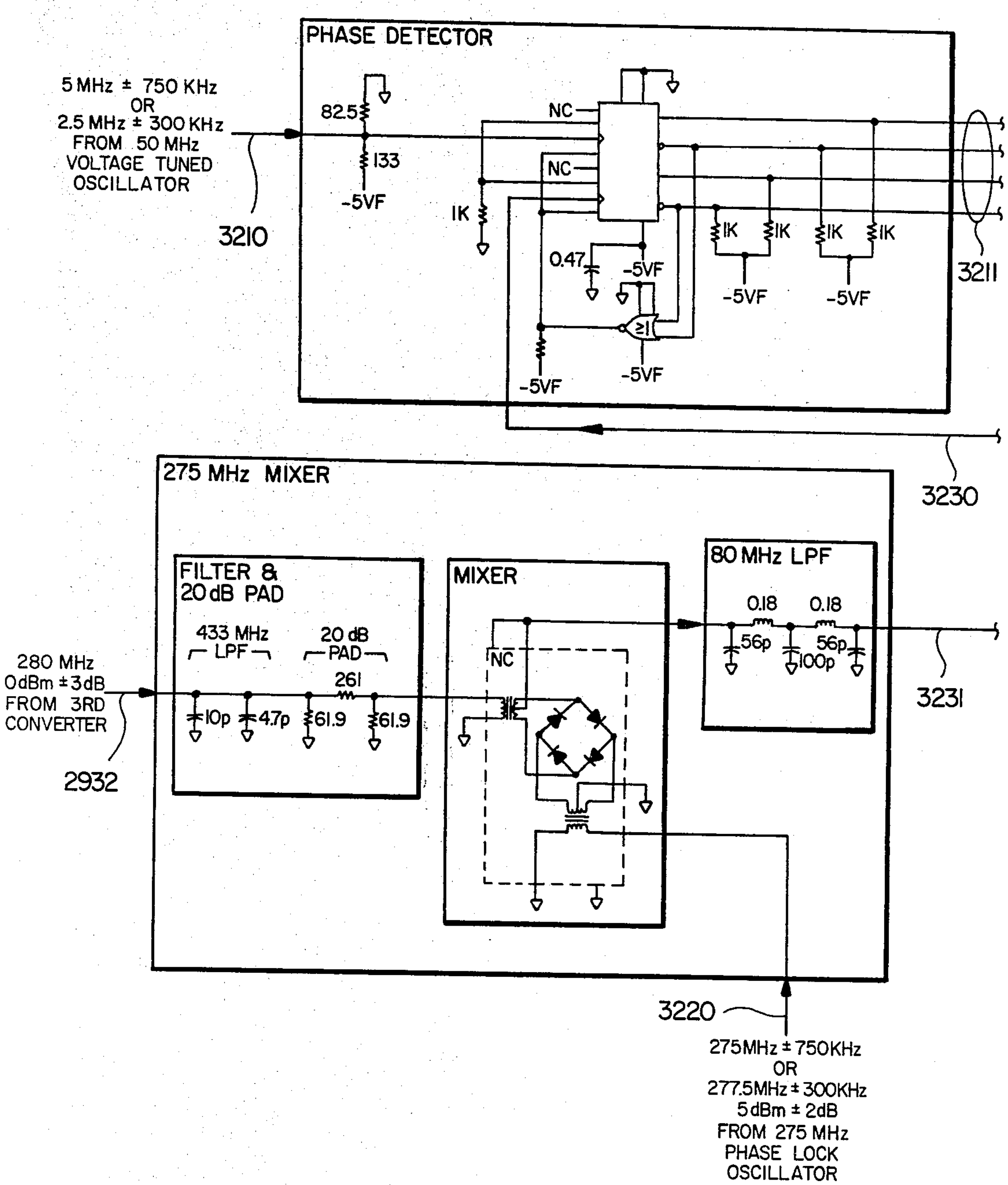
FIG_32A

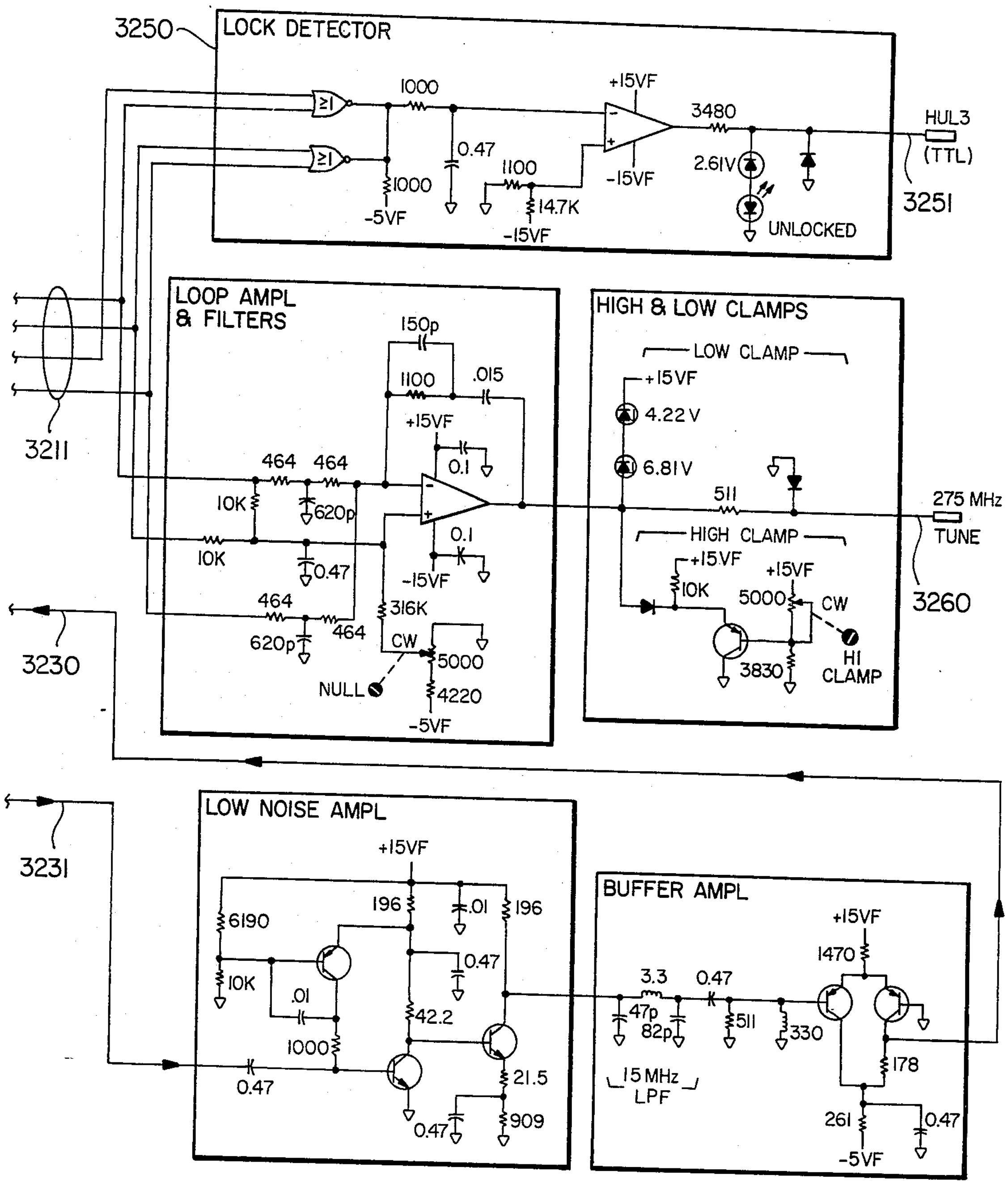
FIG_32B

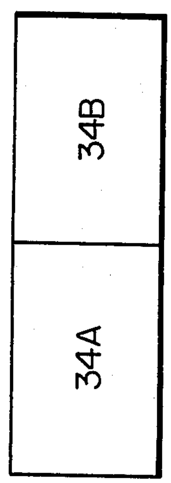
FIG_34

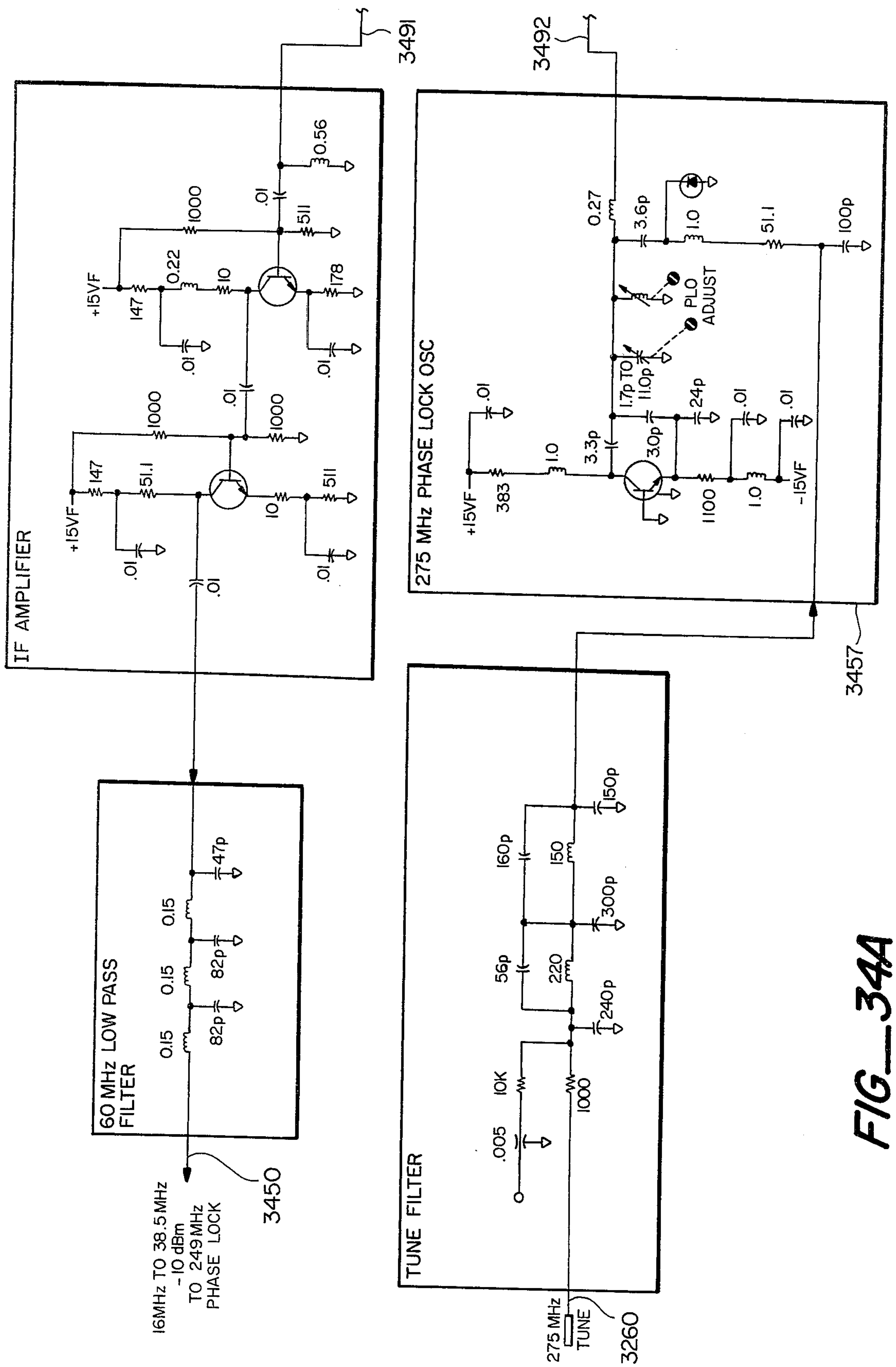
FIG._34A

FIG_34B
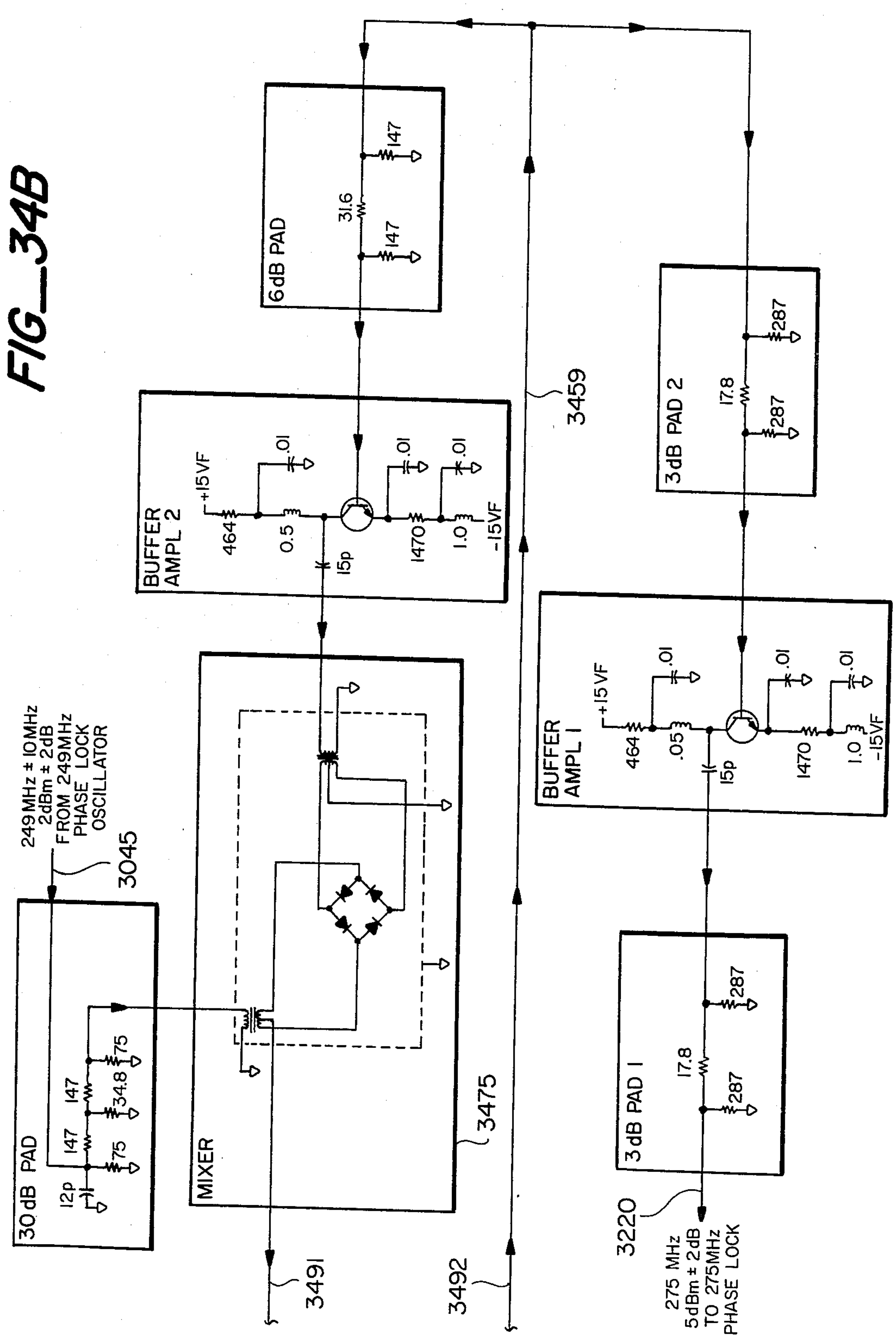

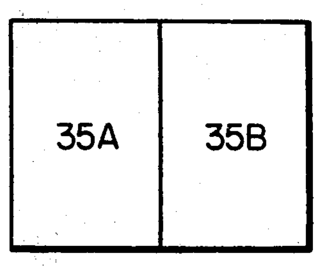
FIG_35

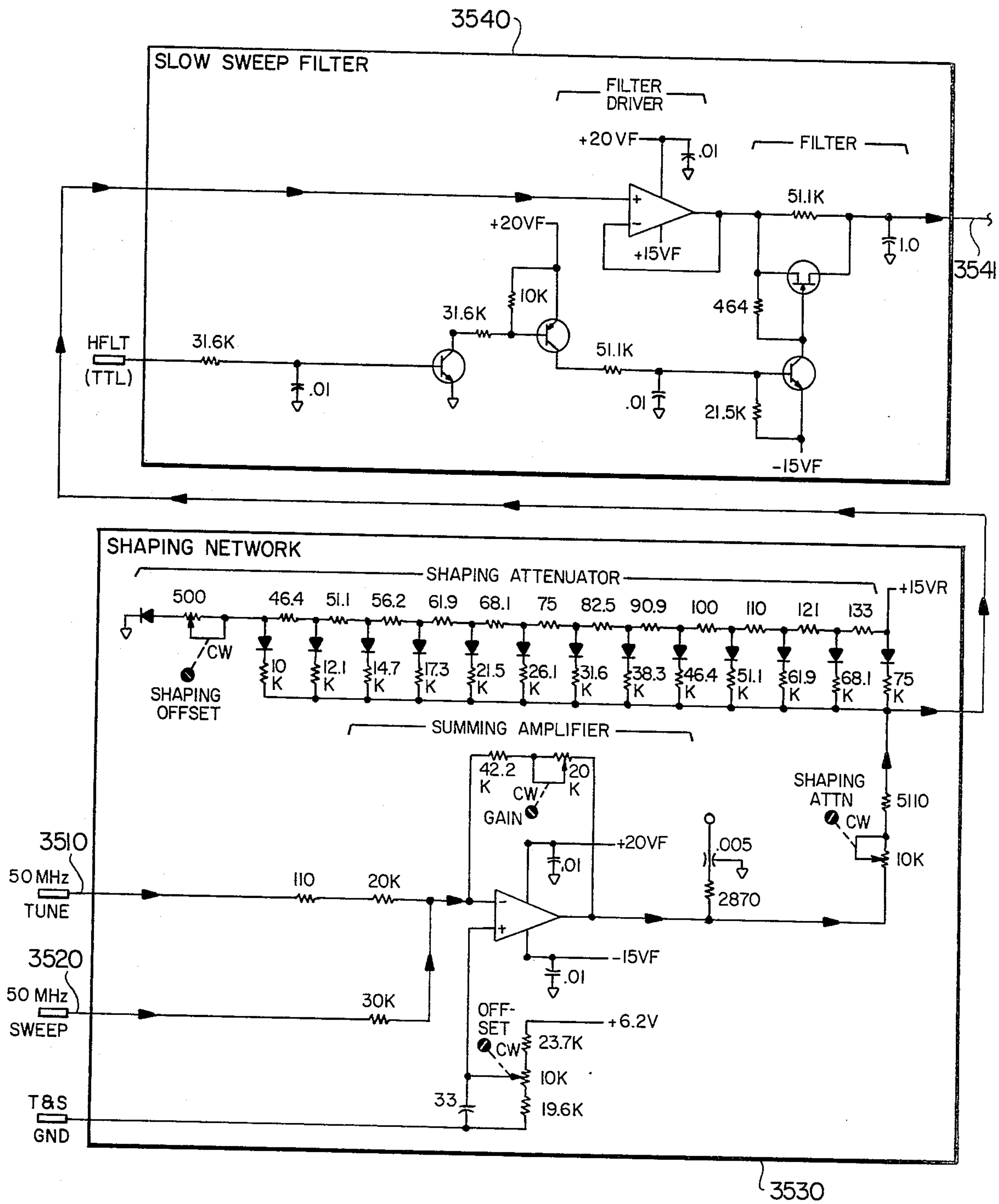
FIG_35A

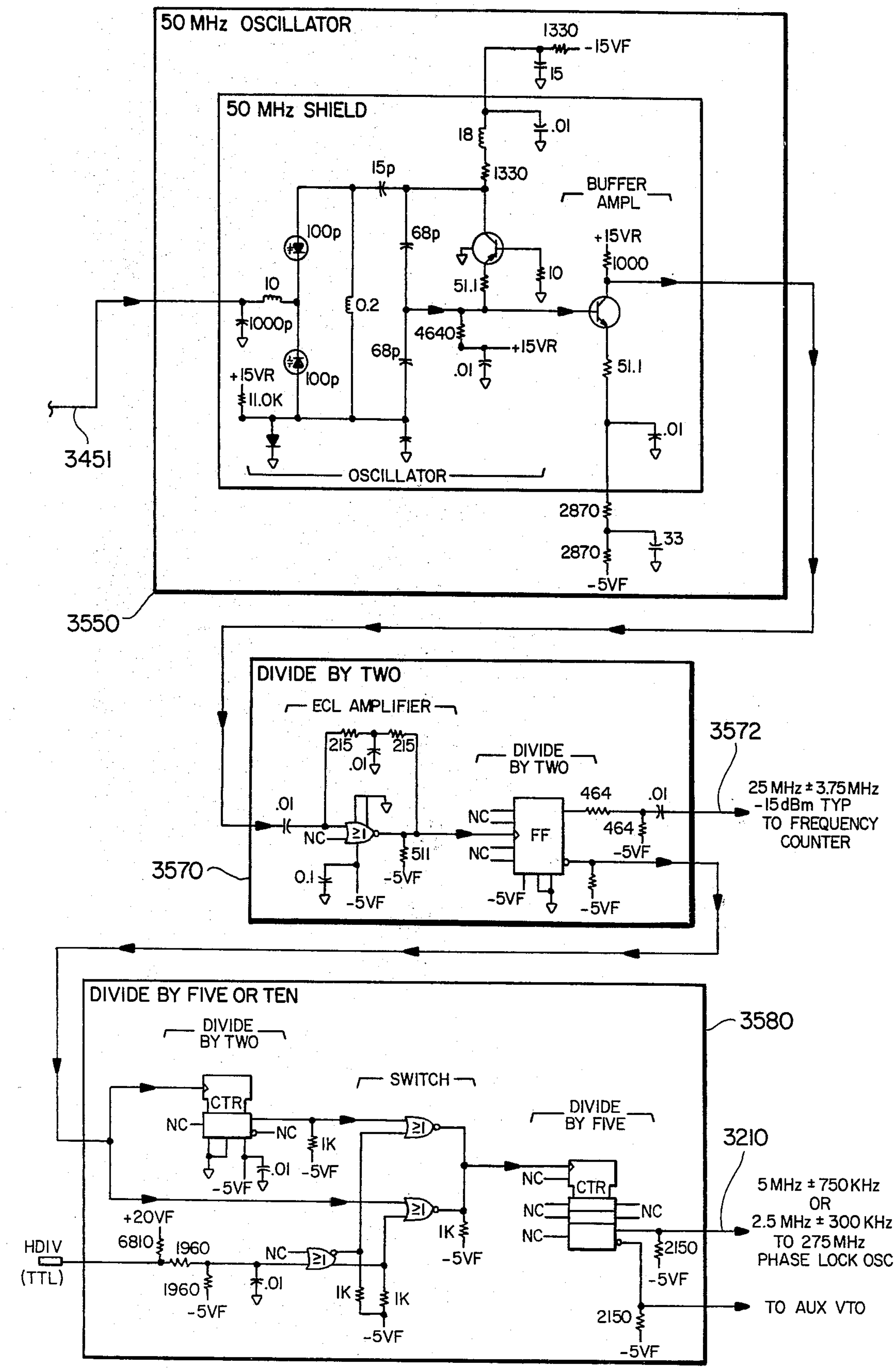
FIG_35B

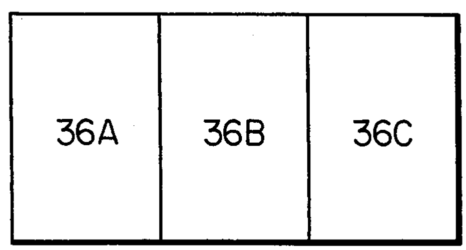
FIG_36

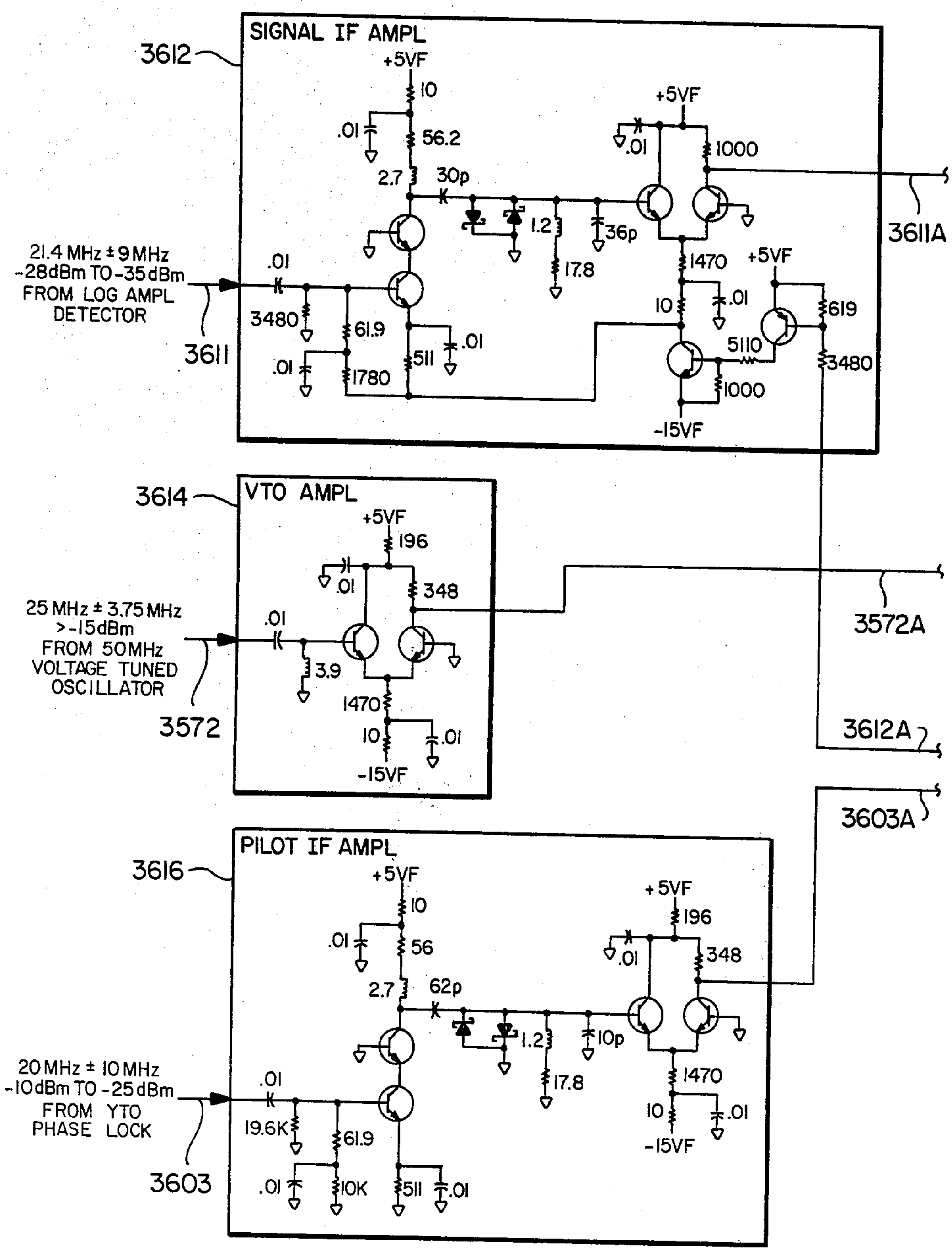
FIG_36A

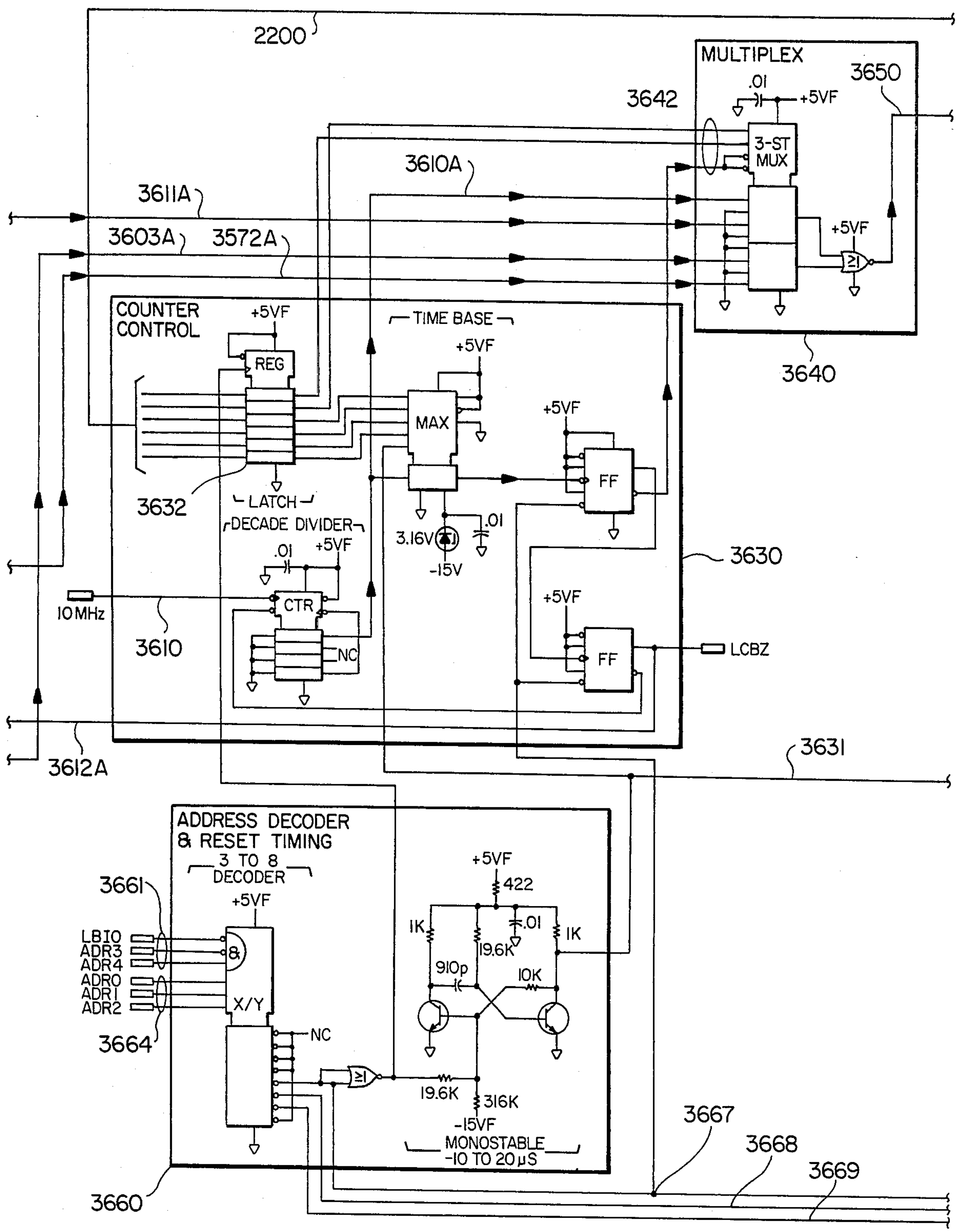
FIG_36B

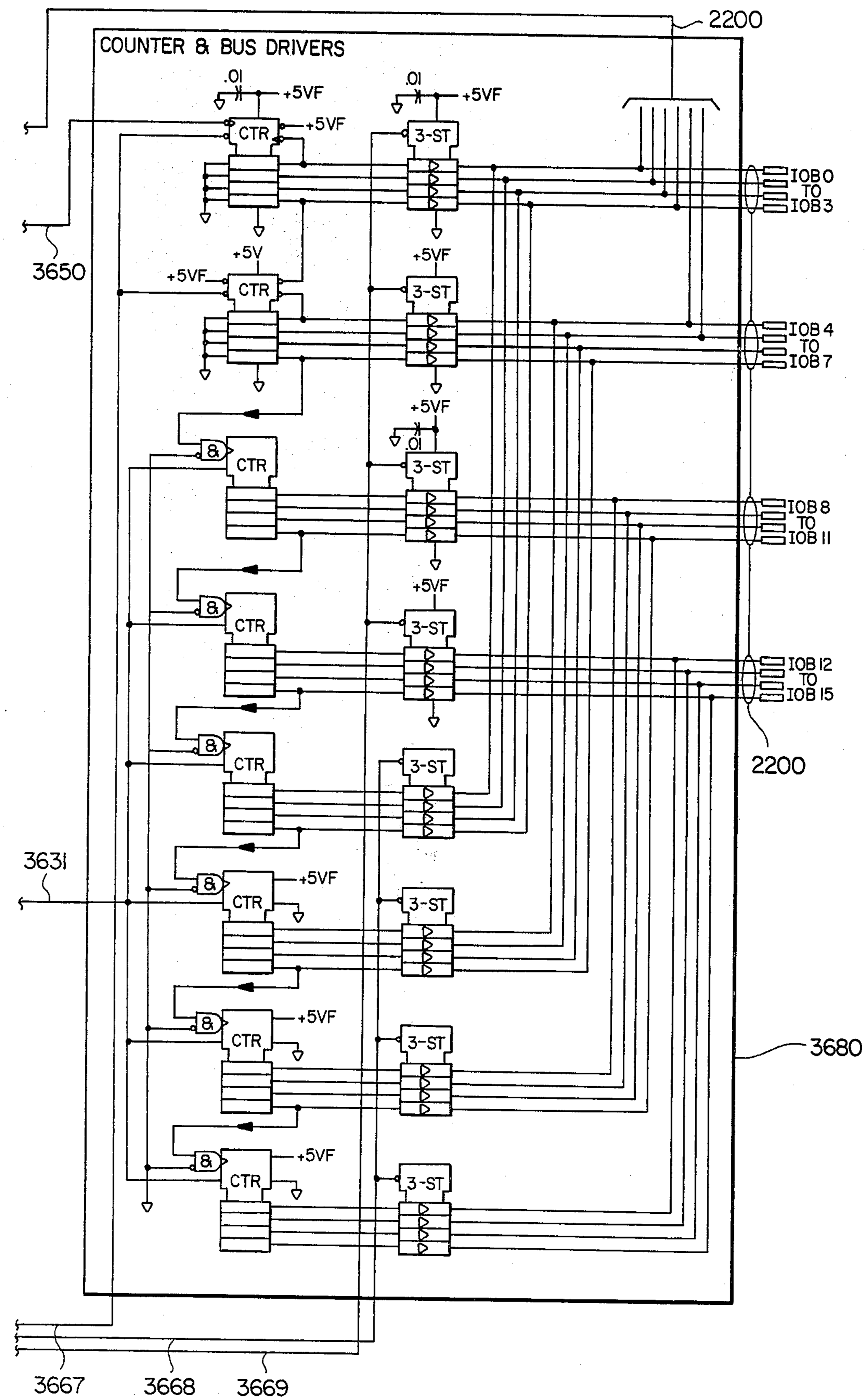
FIG_36C

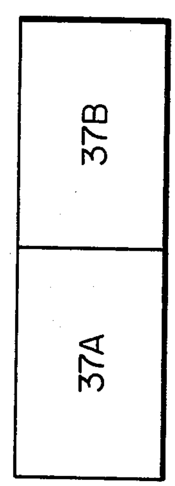
FIG_37

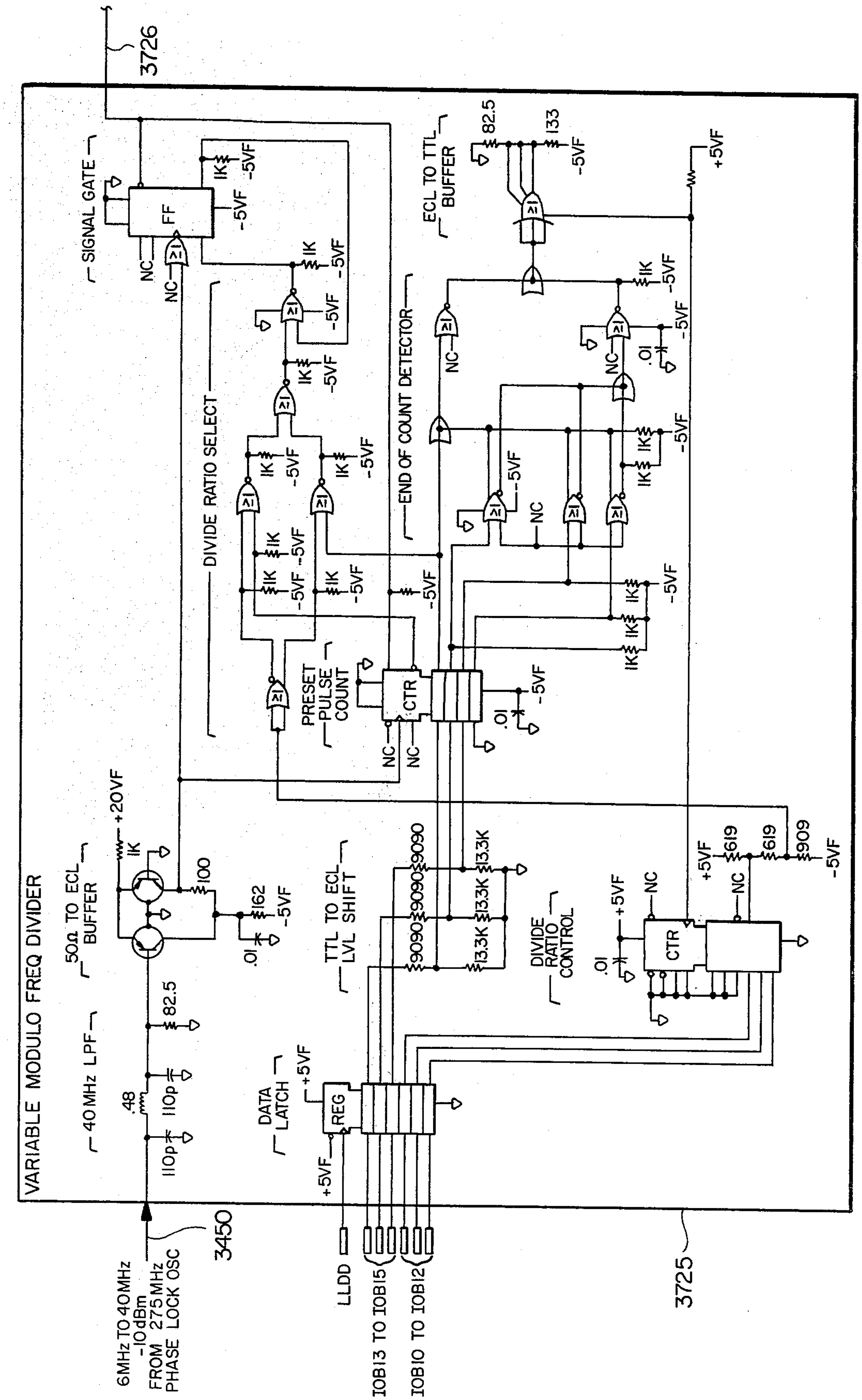
FIG_37A

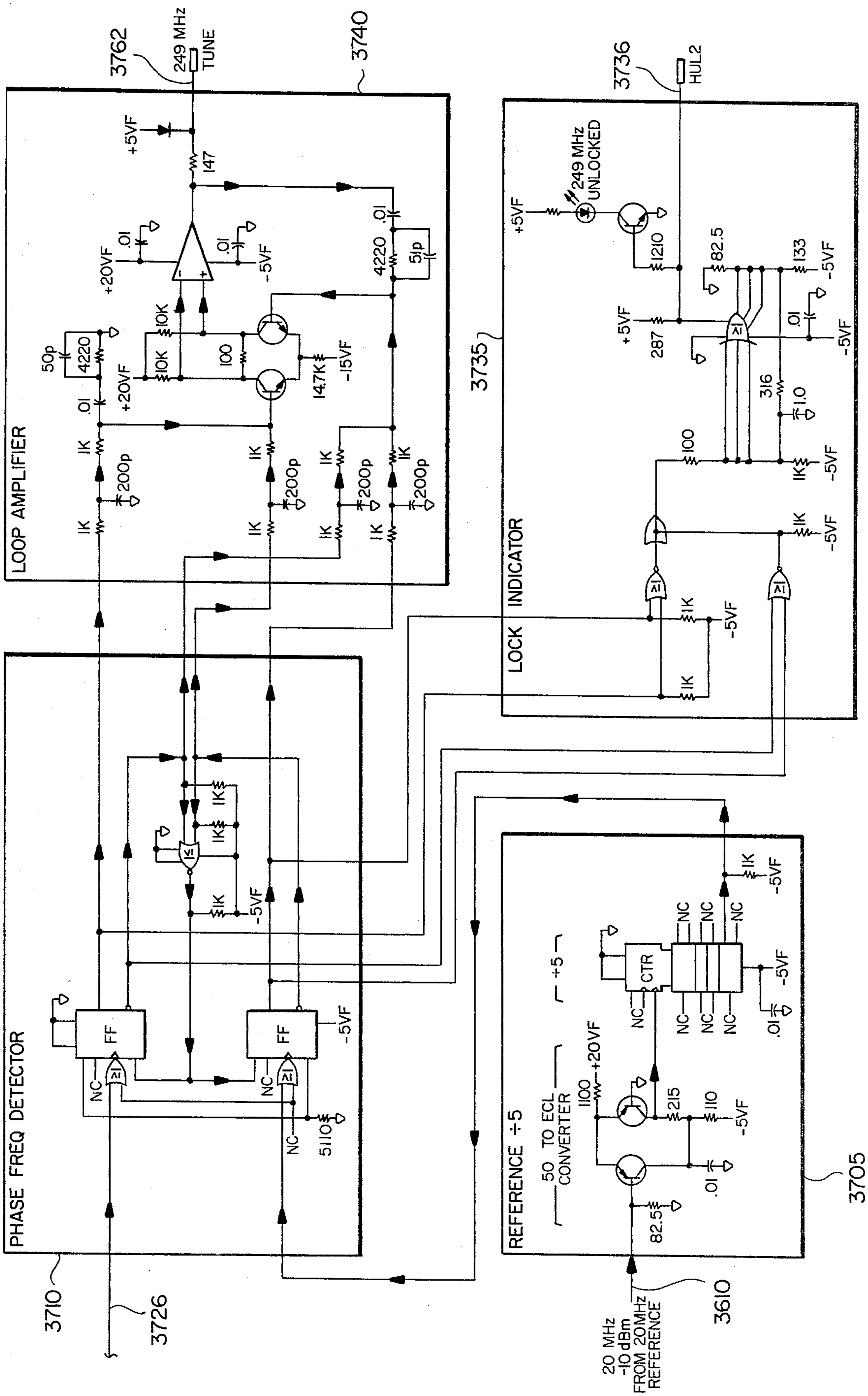
FIG_37B

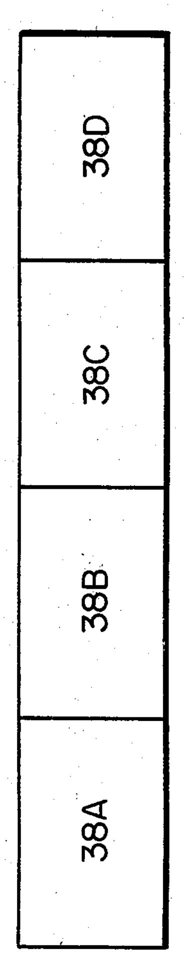
FIG_38

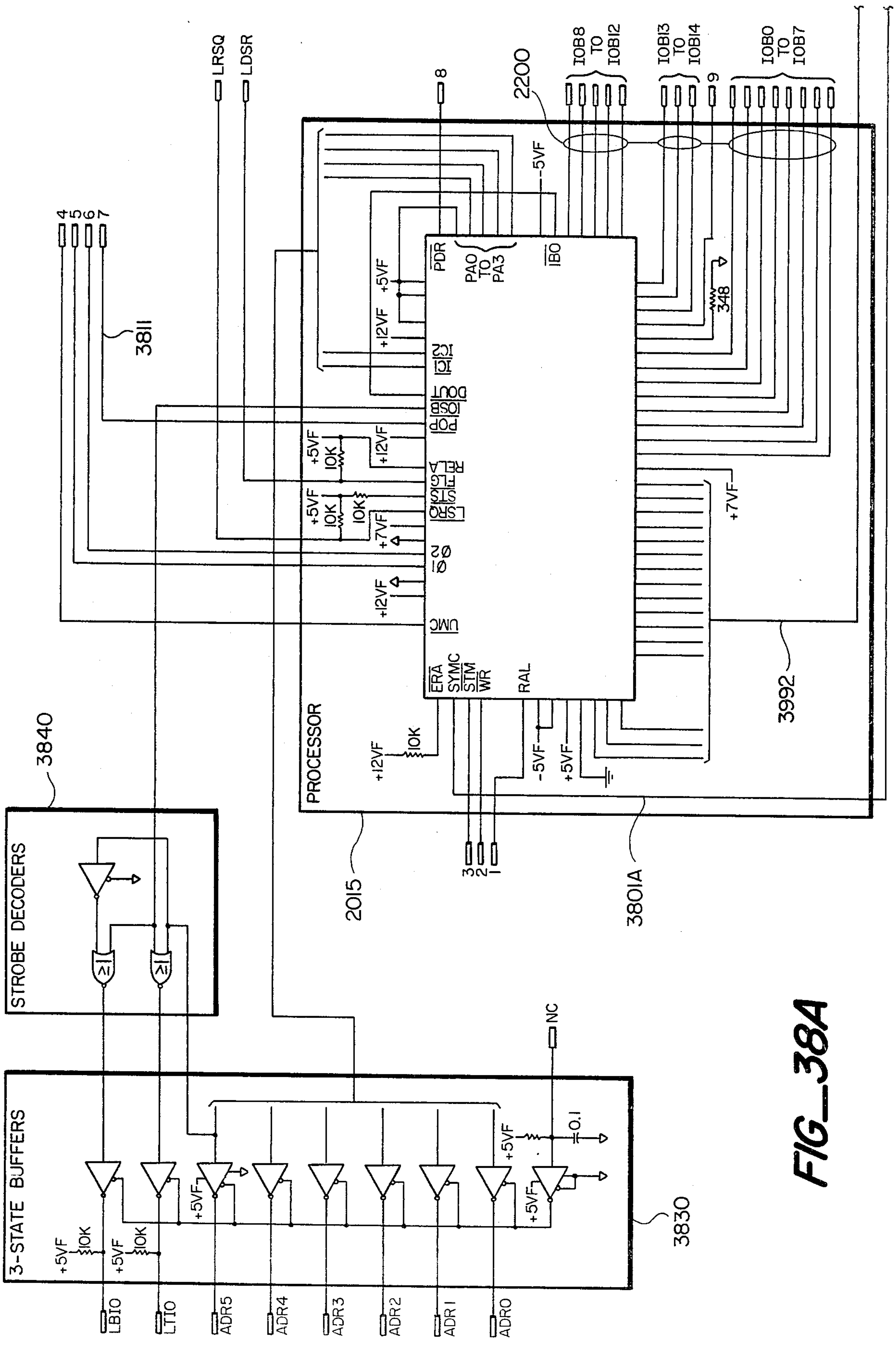
FIG_38A

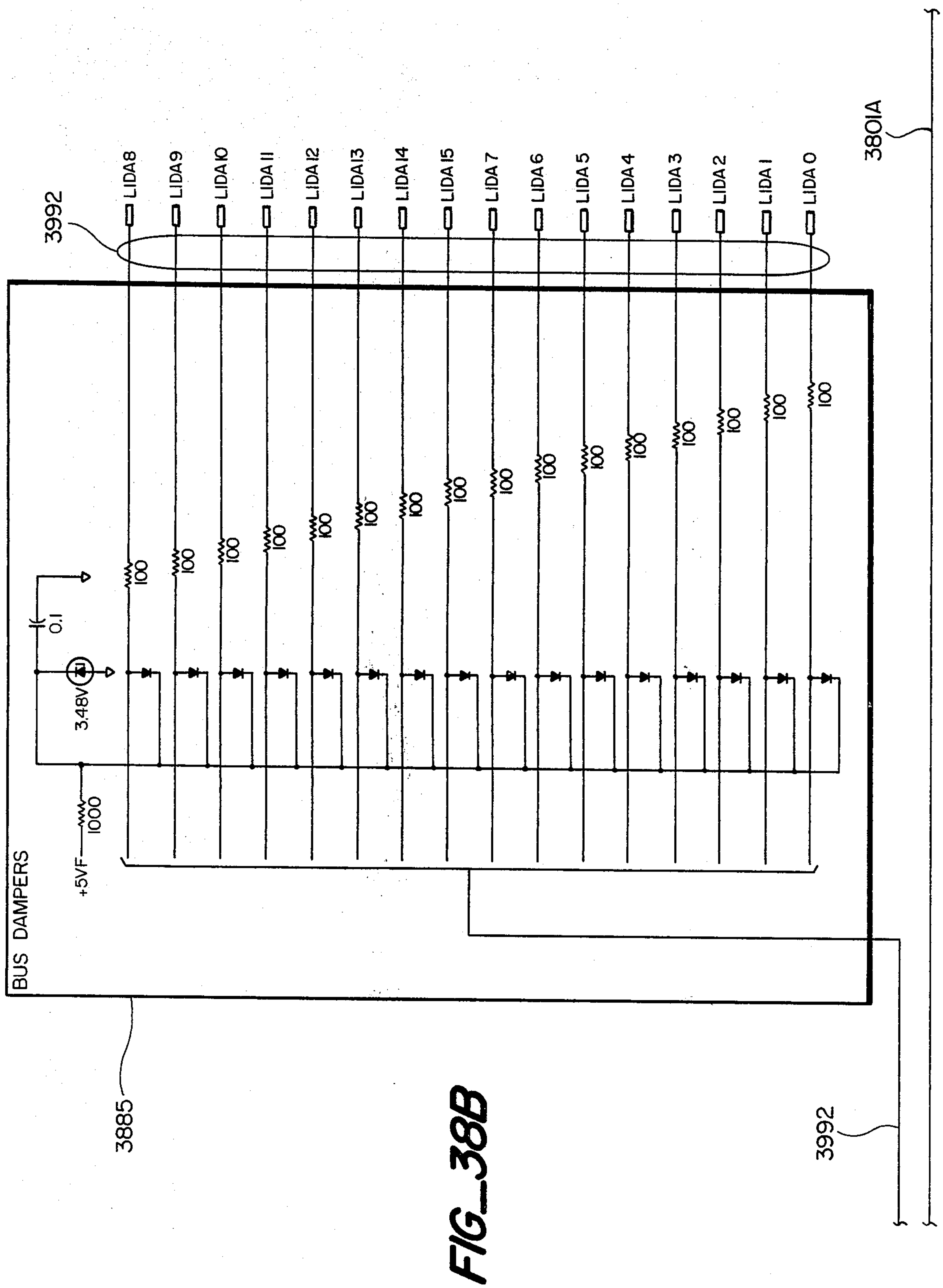
FIG_38B

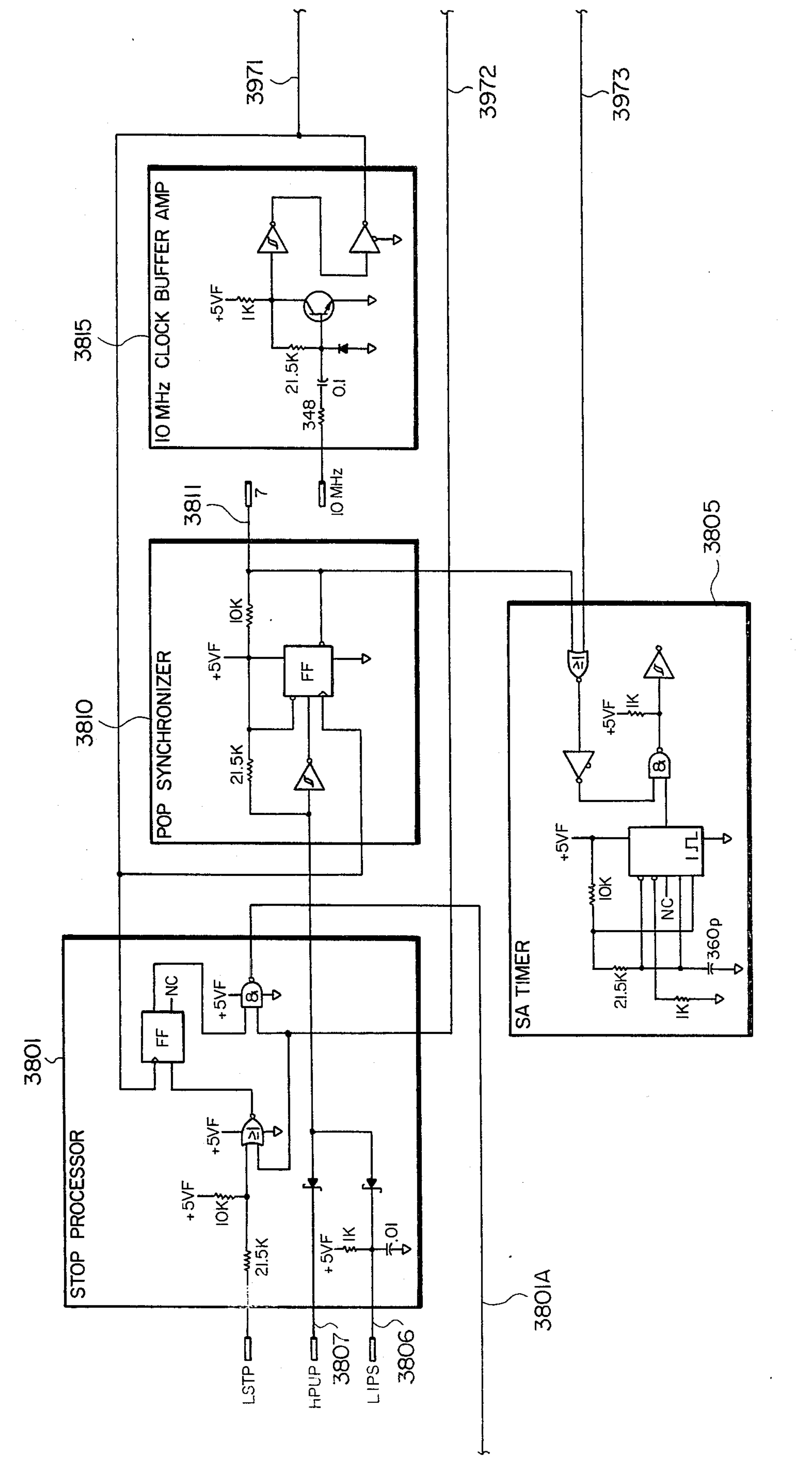
FIG_38C

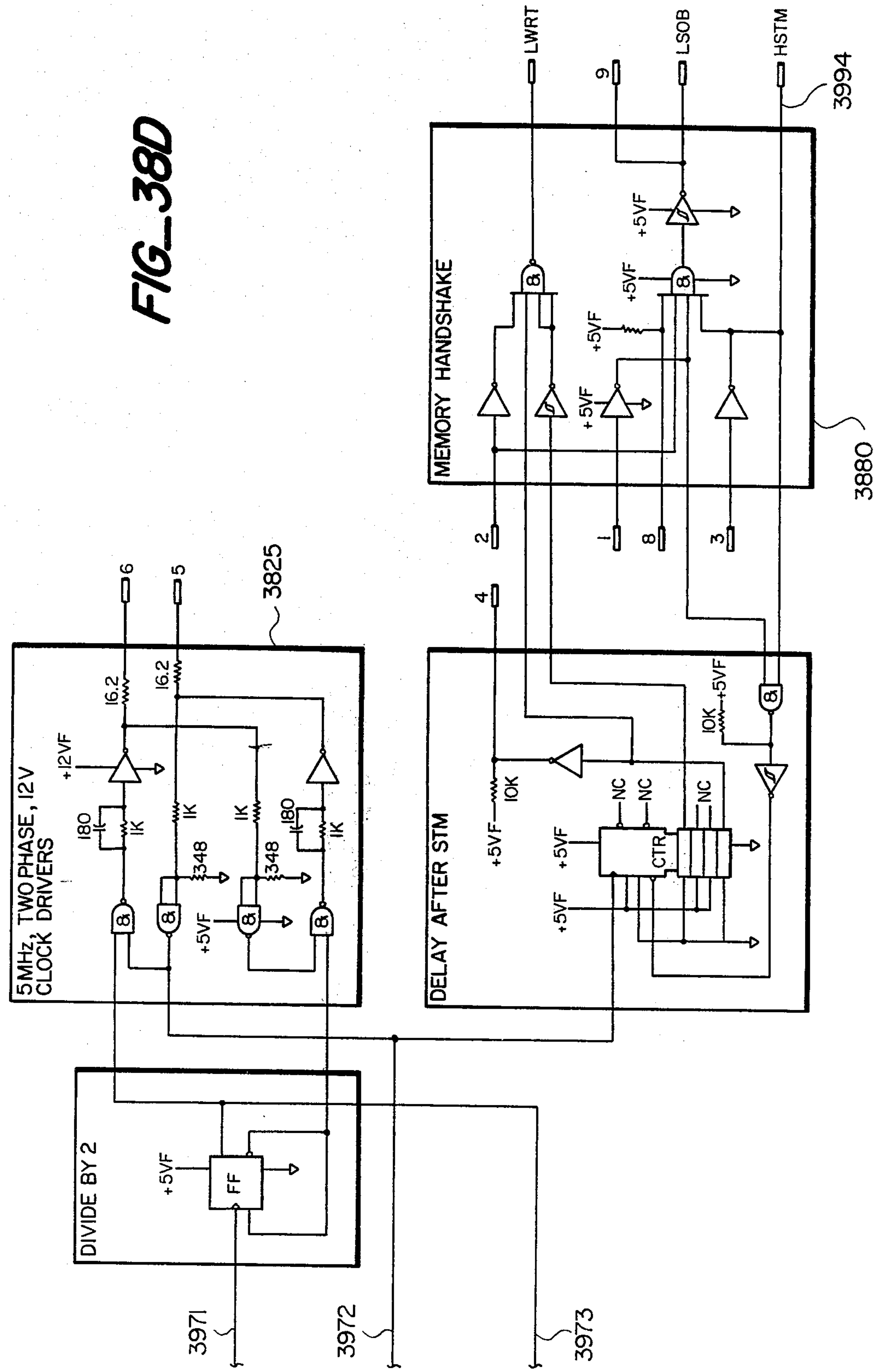
FIG_38D

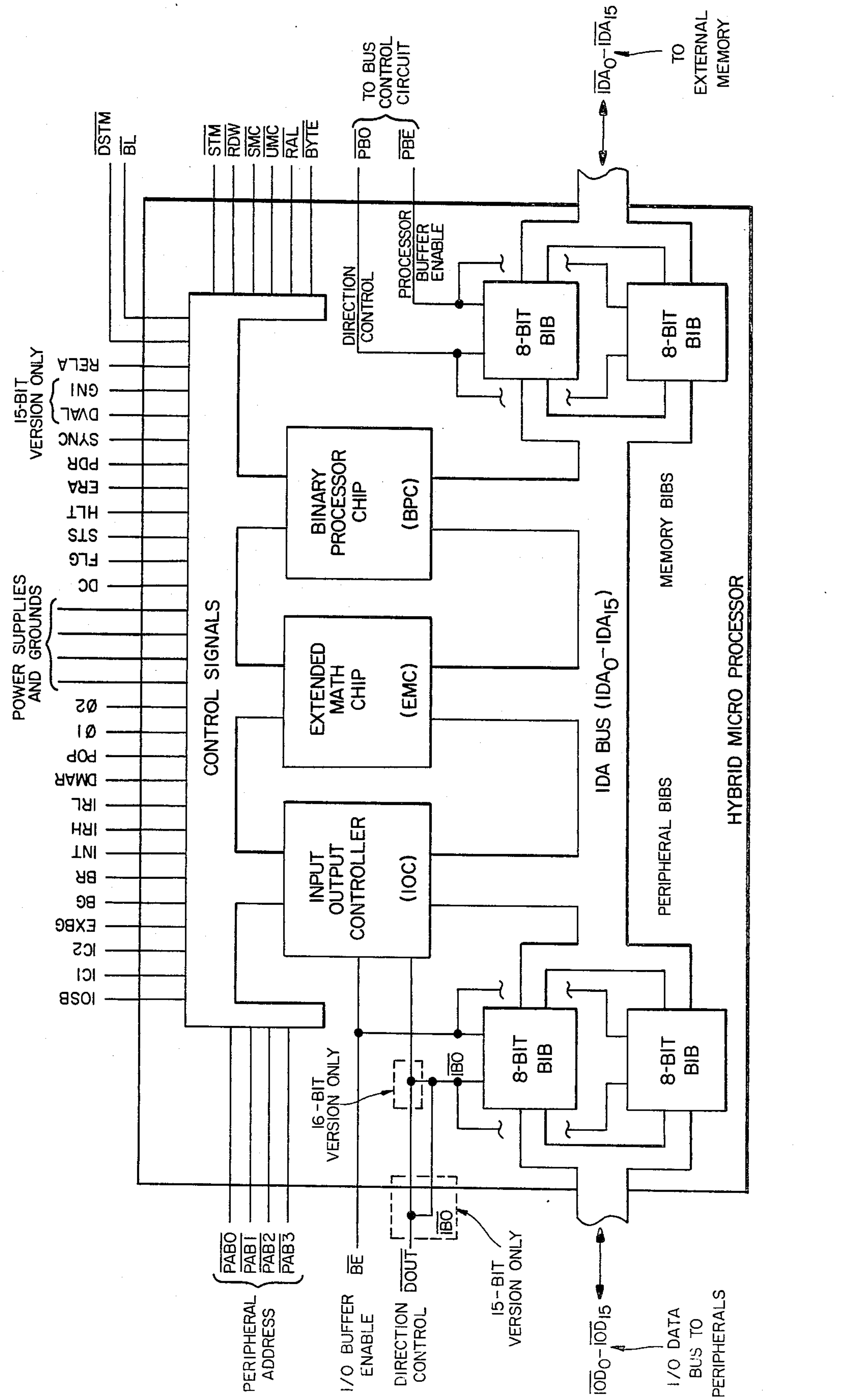
FIG_39

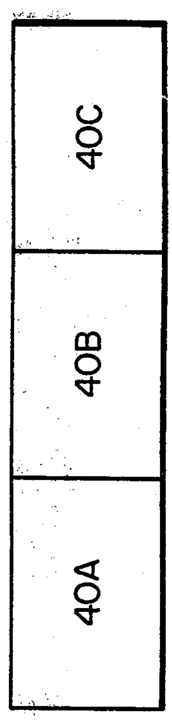
FIG_40

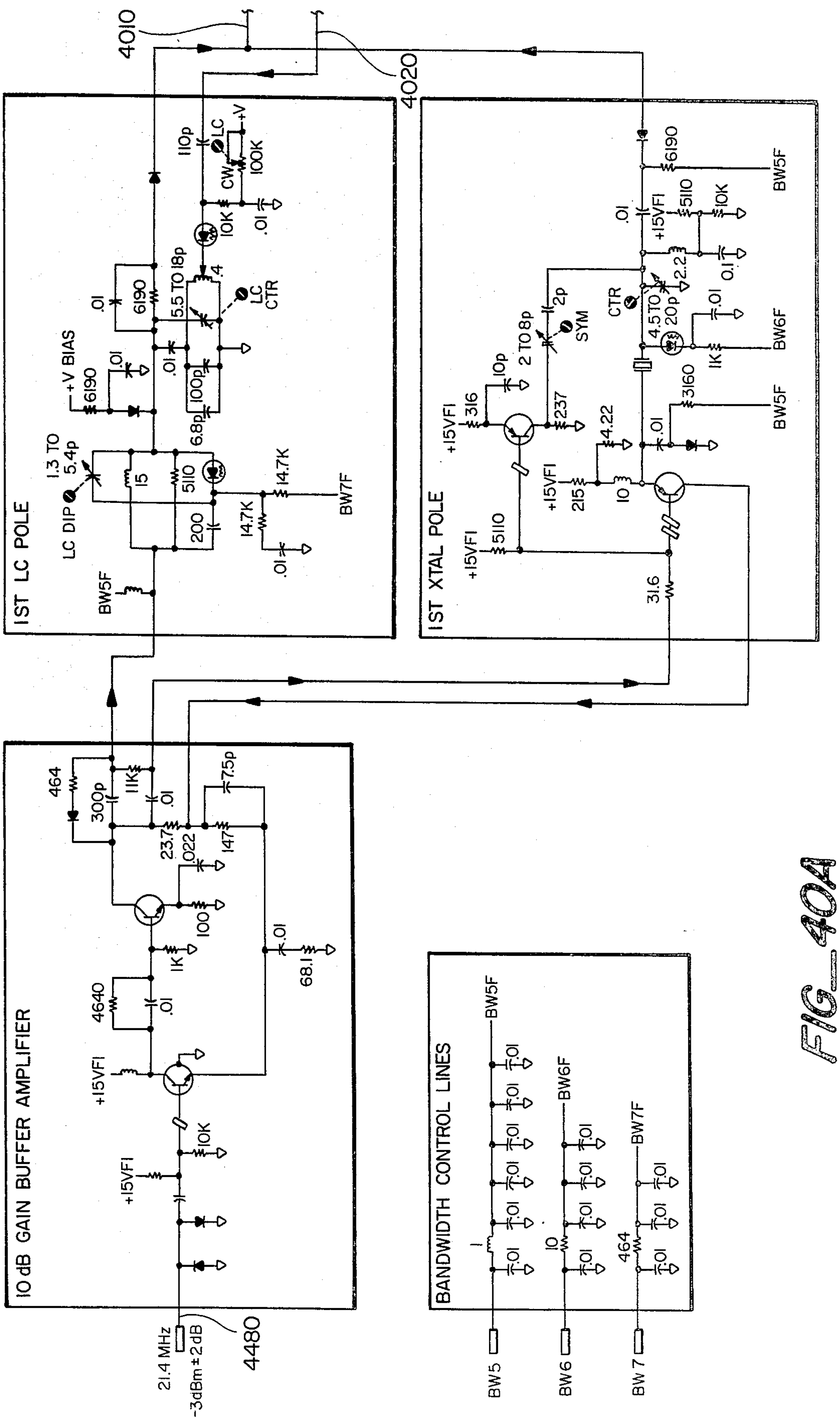
FIG_40A

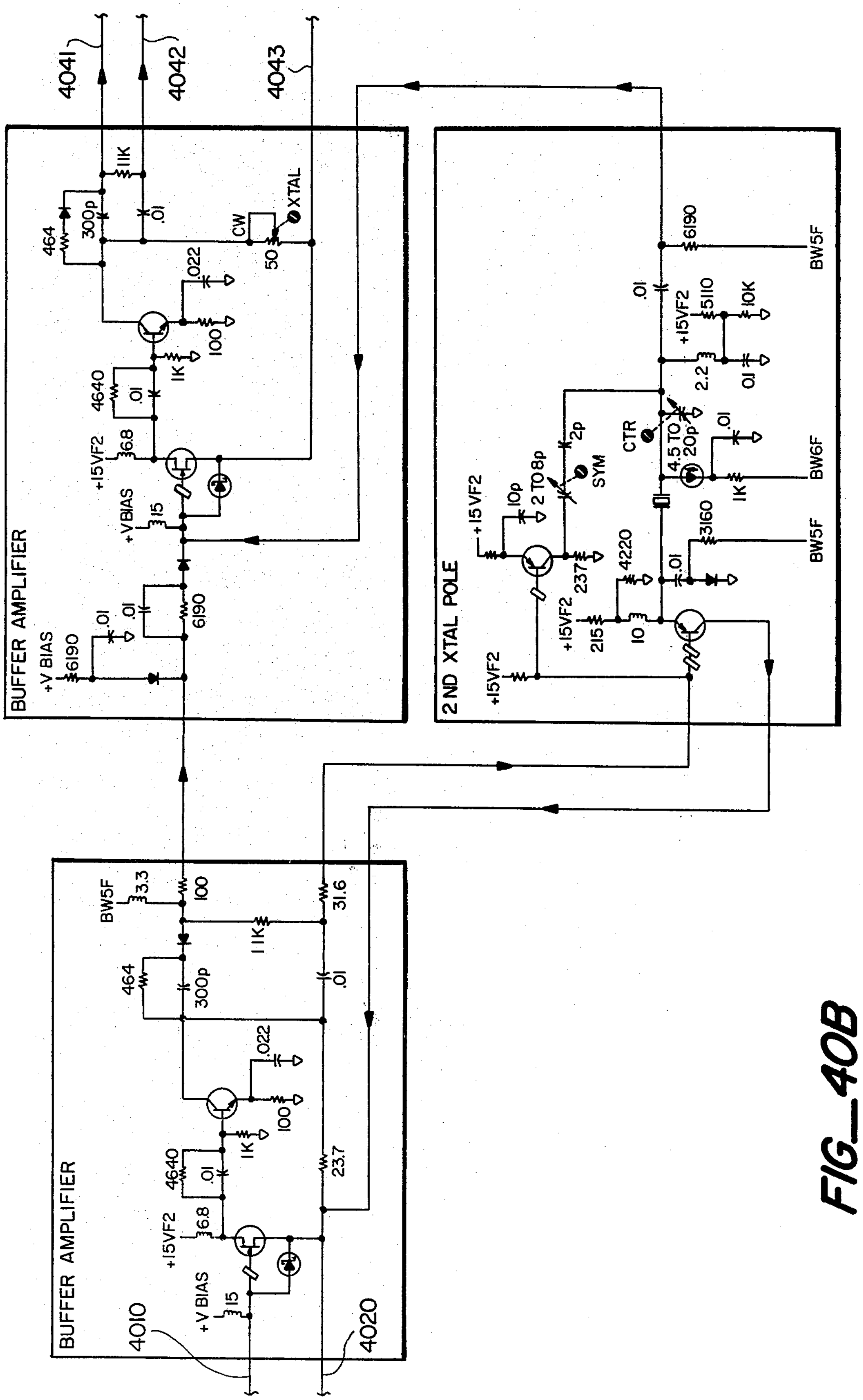
FIG_40B

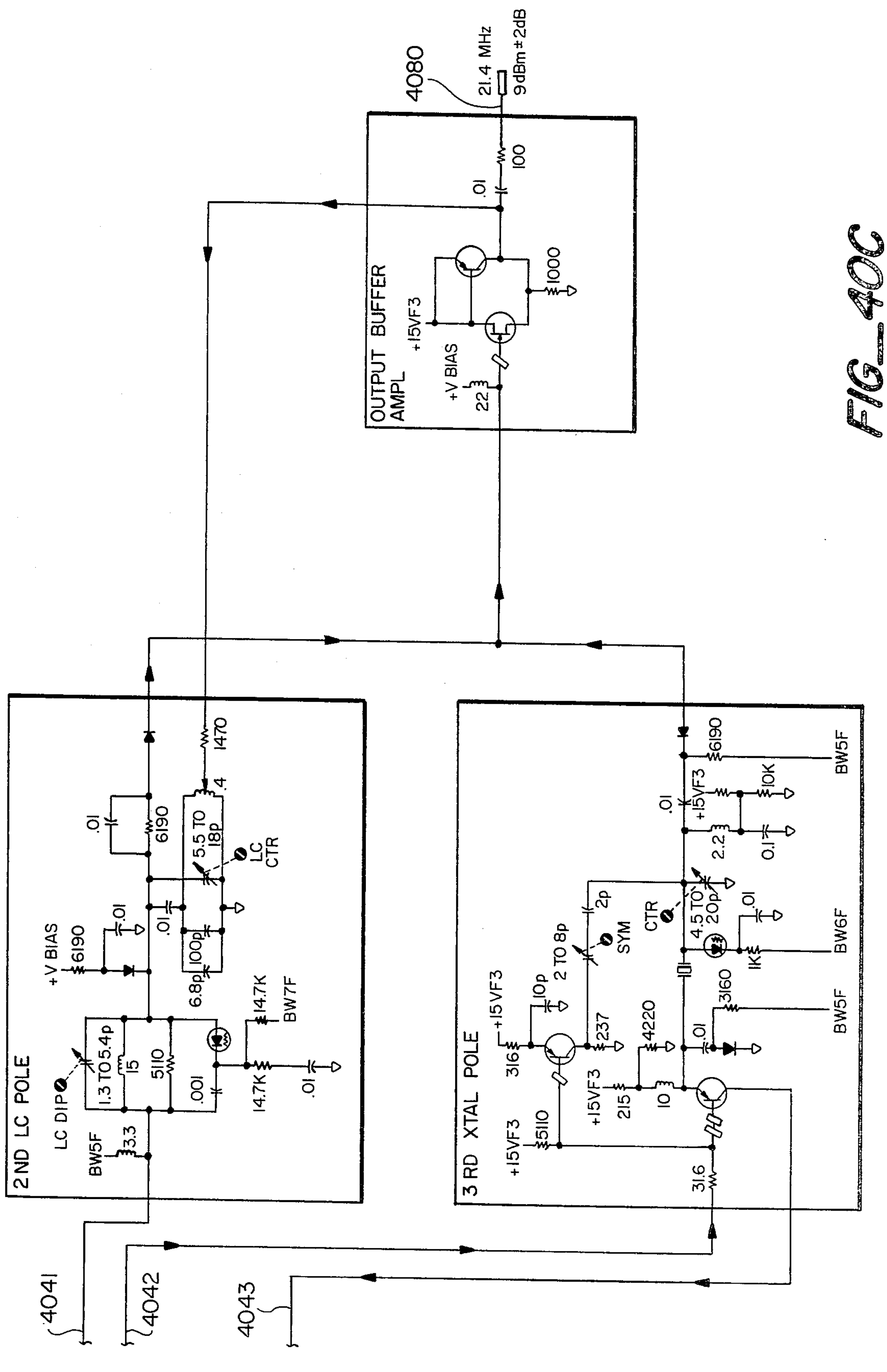
FIG_40C

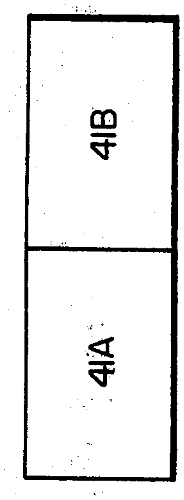
FIG_41

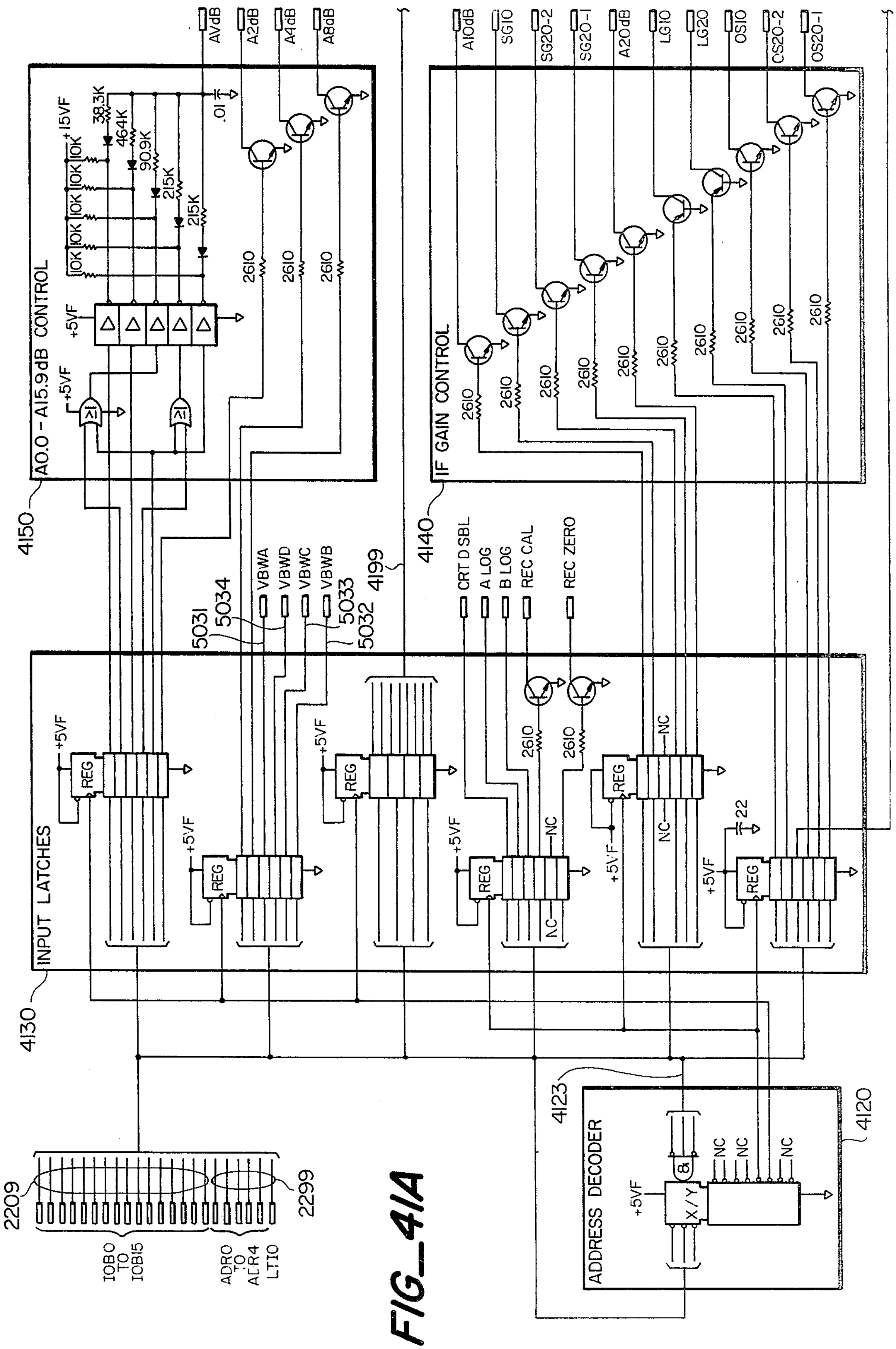
FIG_41A

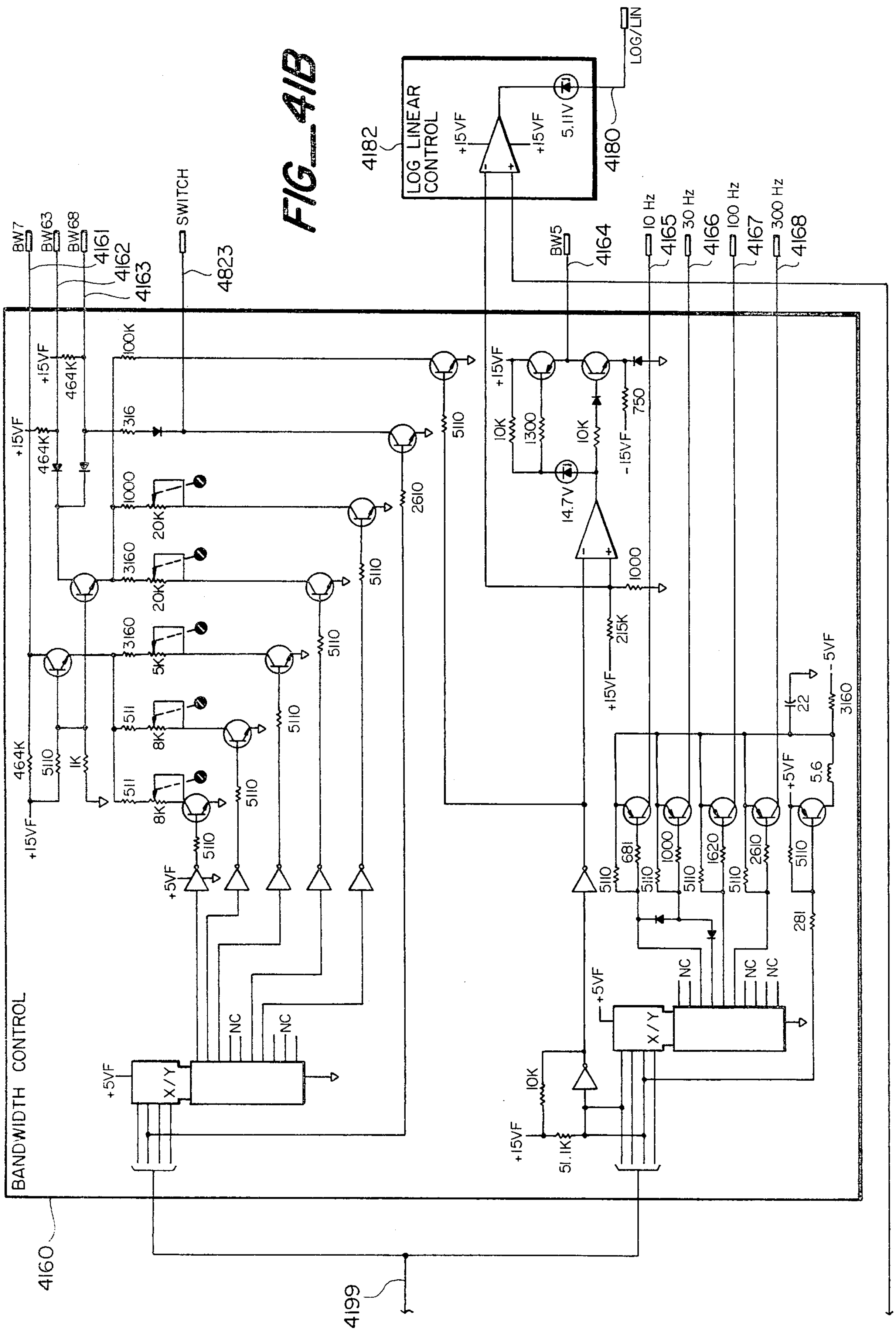
FIG_41B

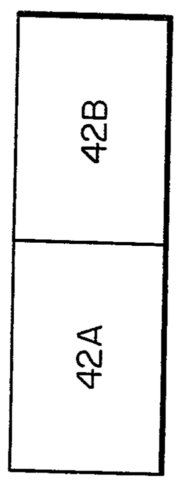
FIG_42

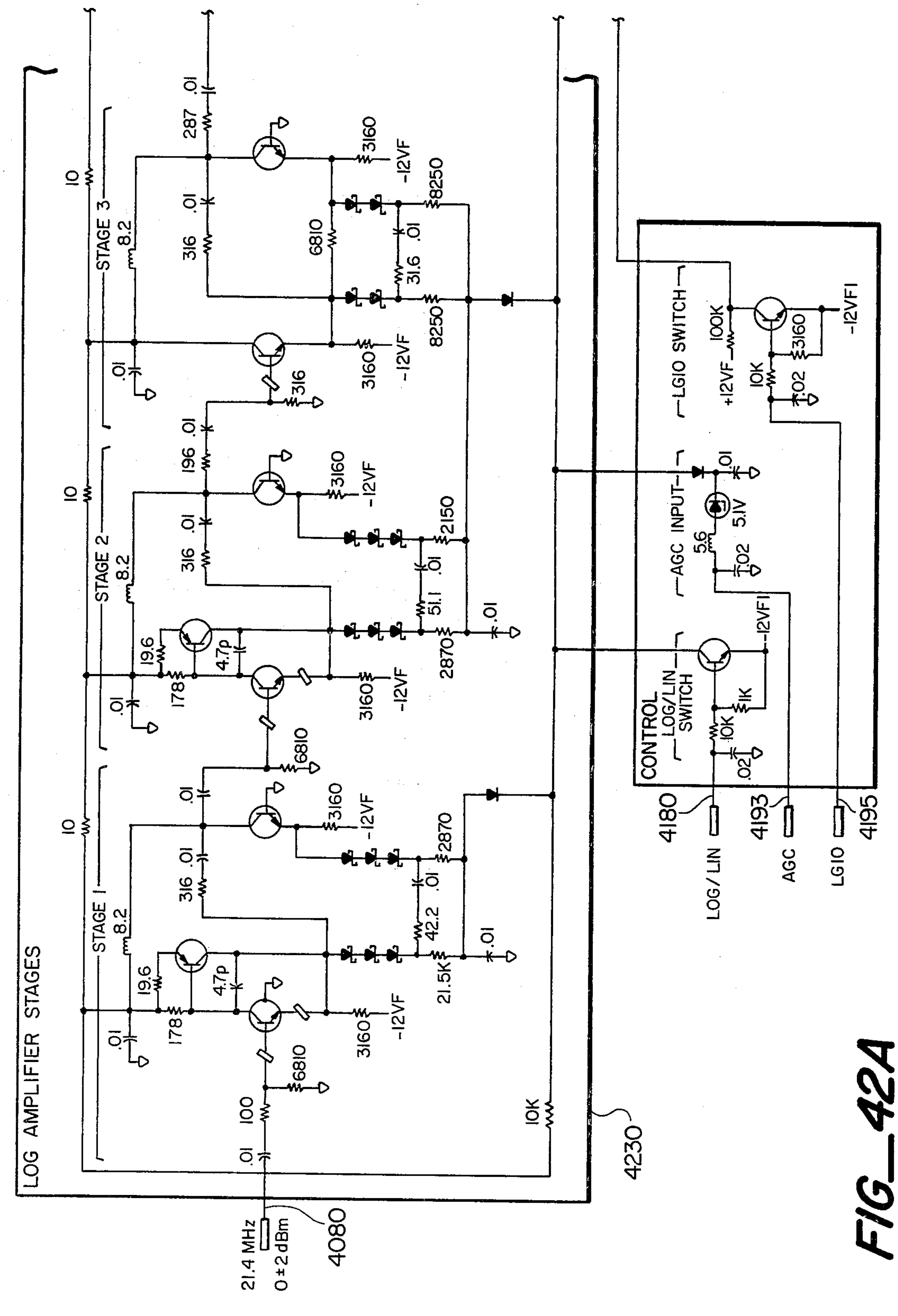
FIG_42A

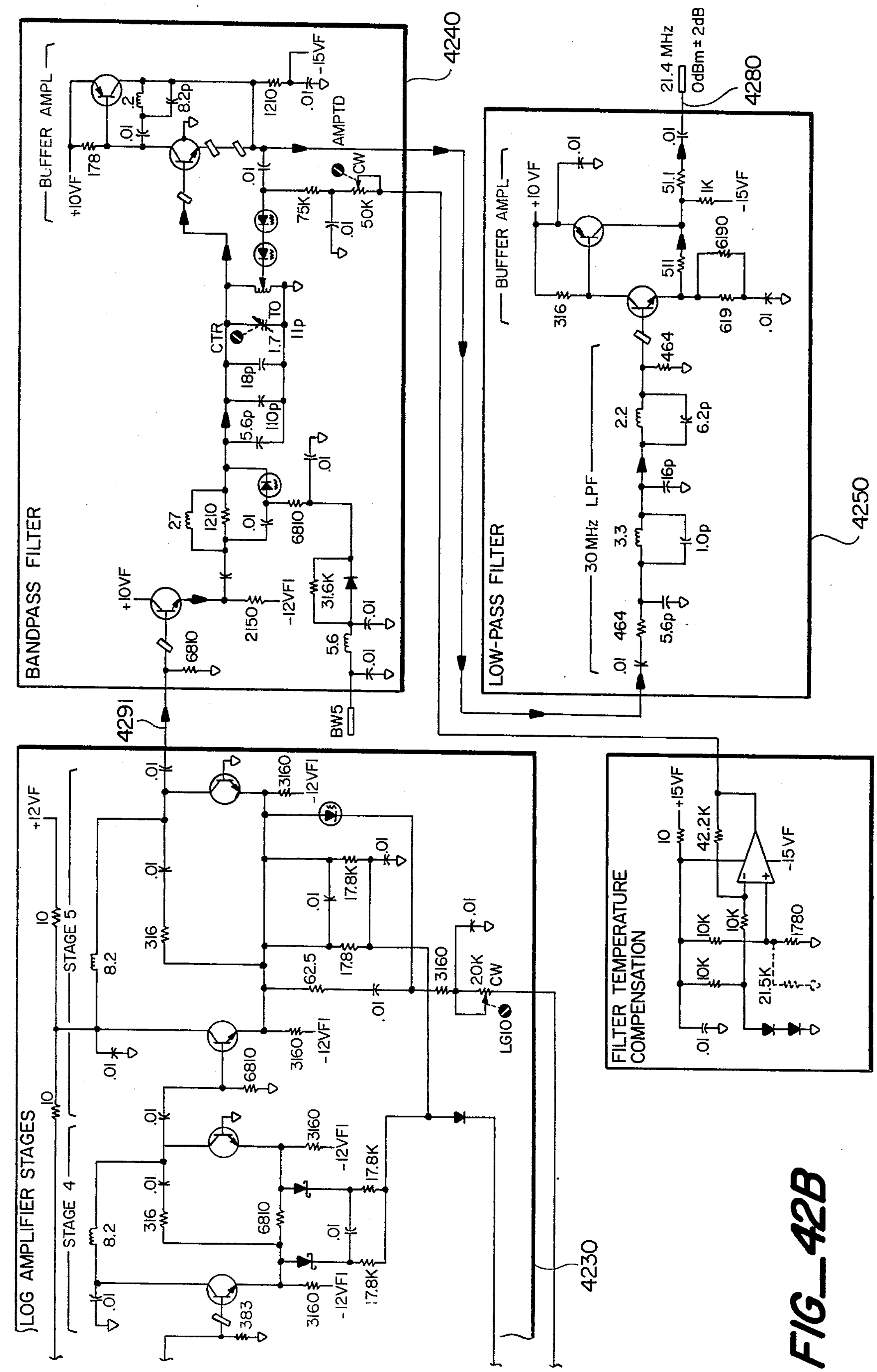
FIG_42B

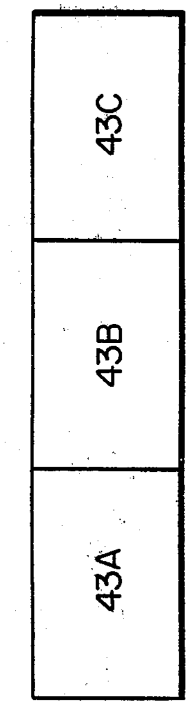
FIG_43

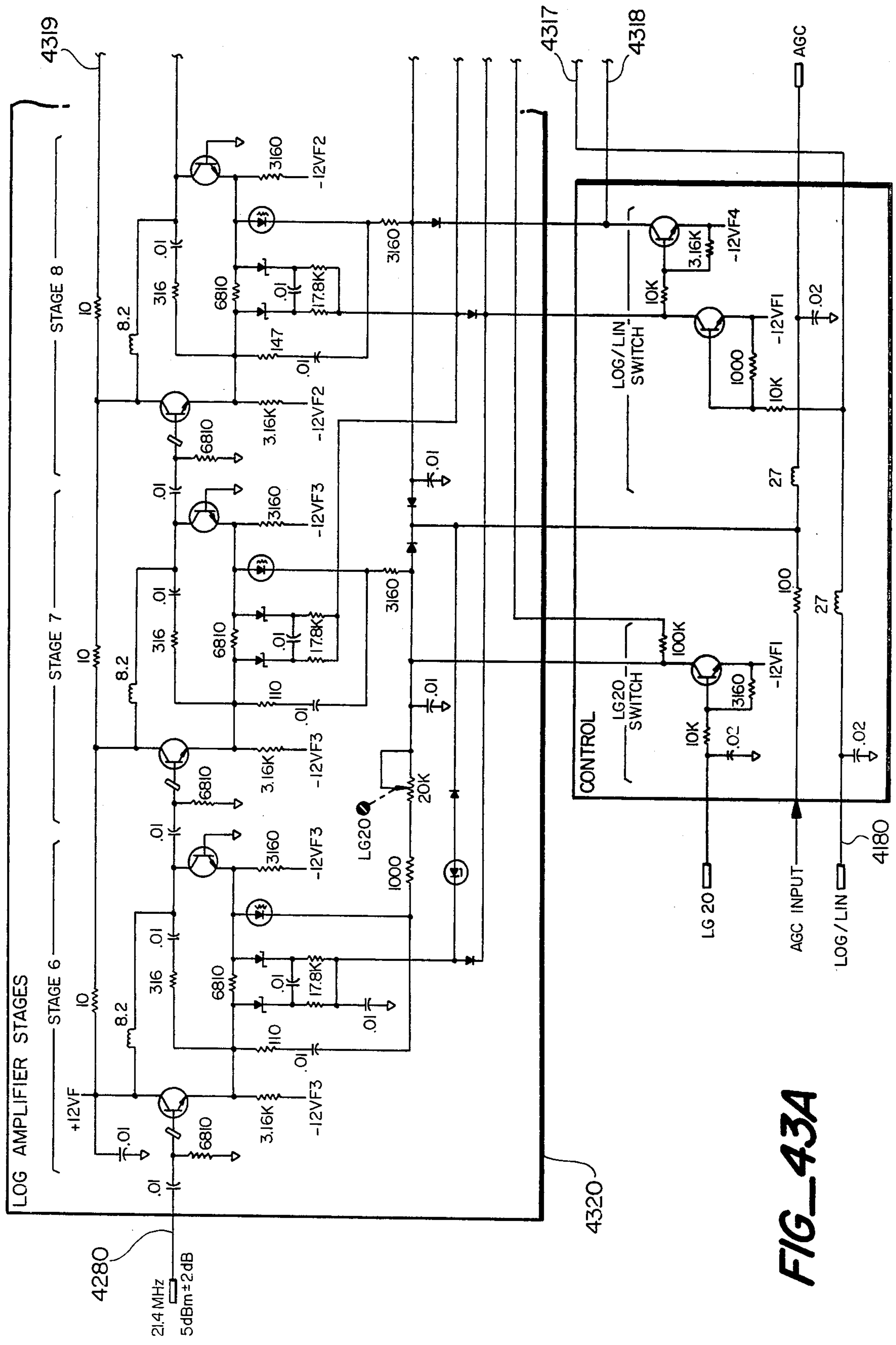
FIG_43A

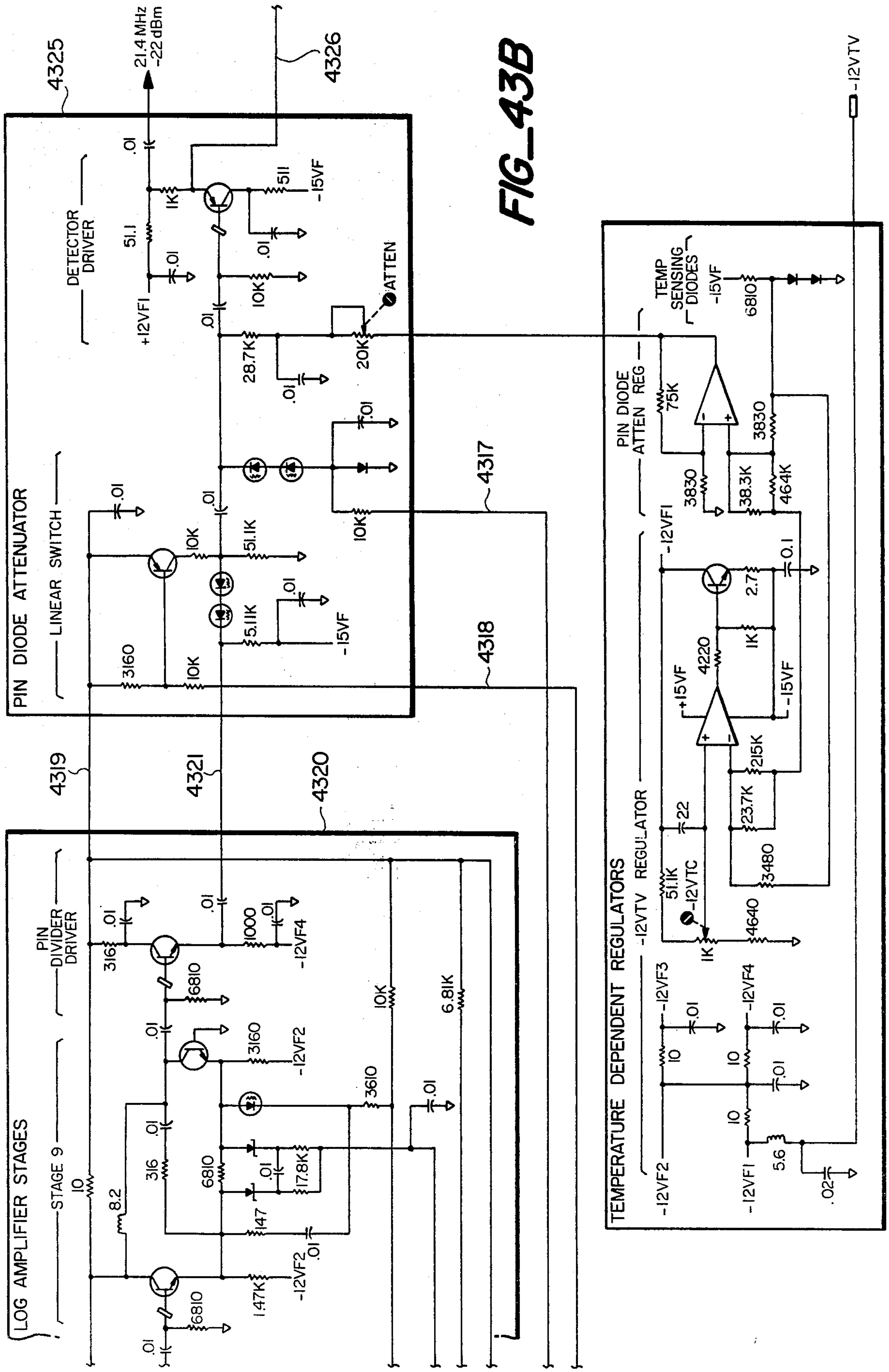
FIG_43B

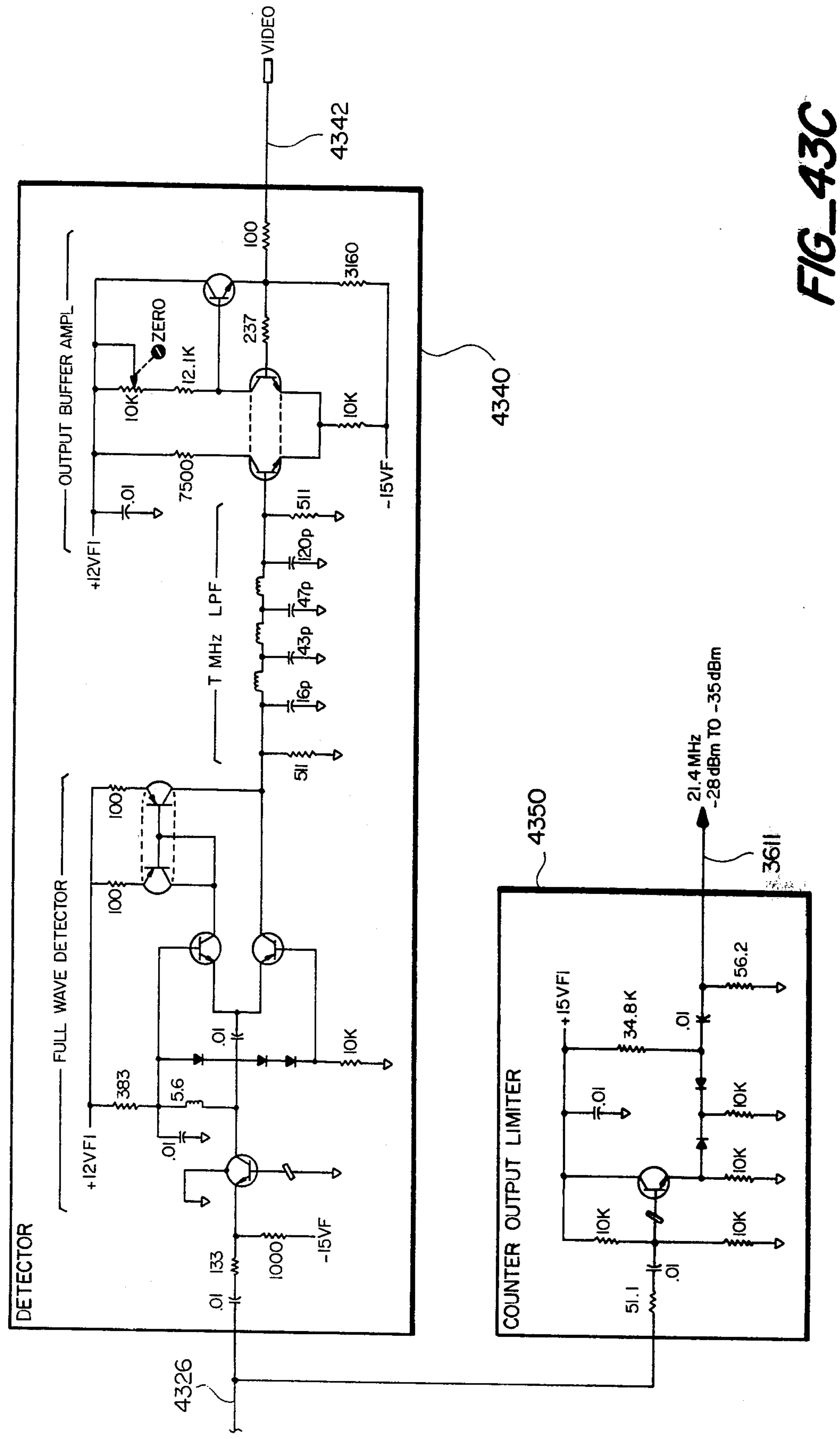
FIG_43C

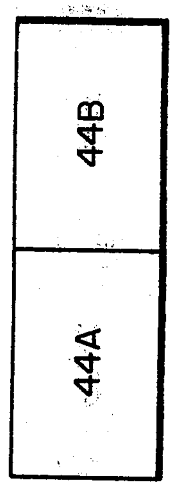
FIG_44

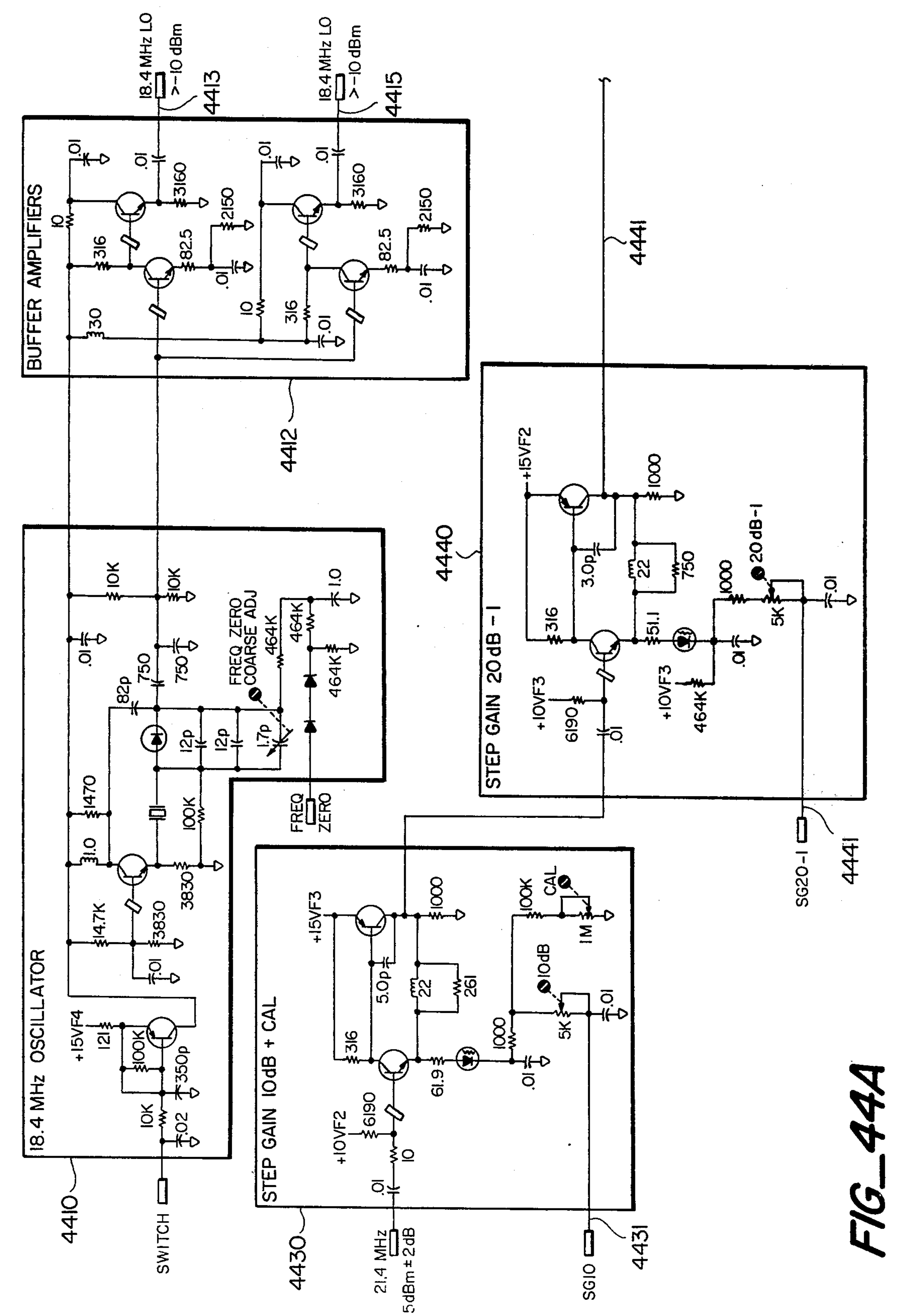
FIG_44A

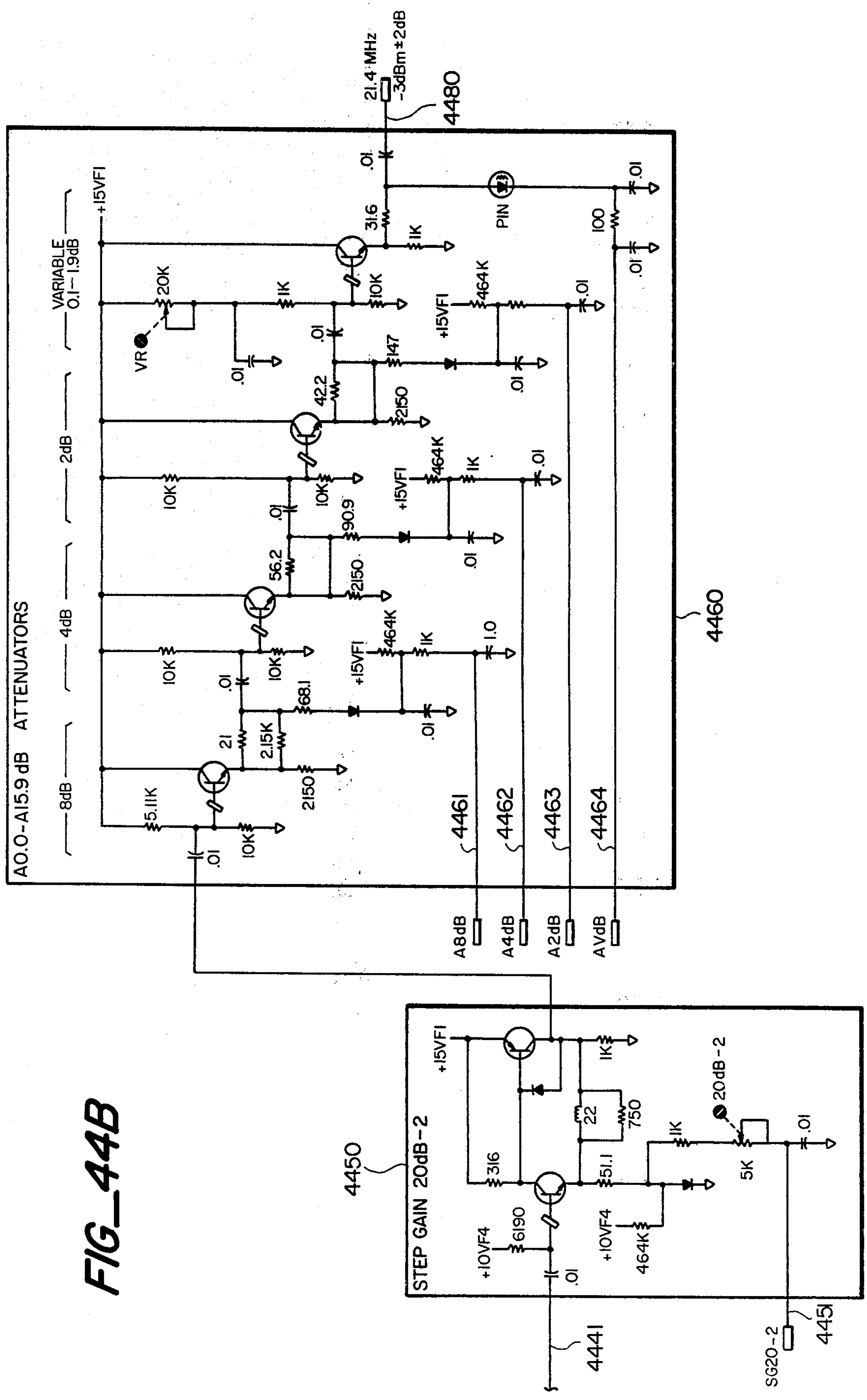
FIG_44B

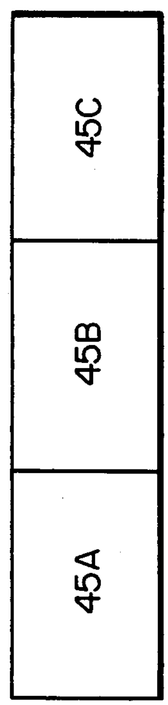
FIG_45

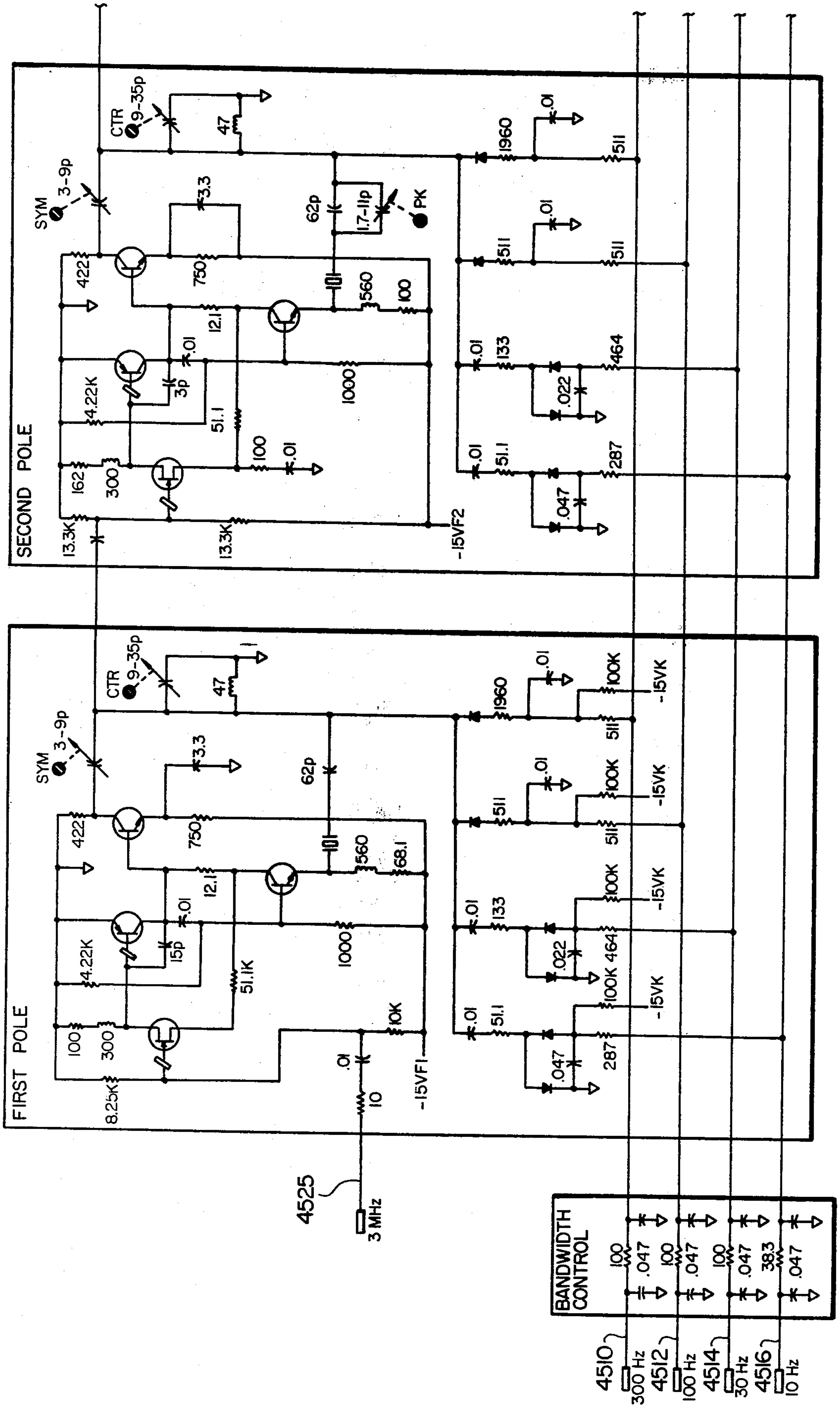
FIG_45A

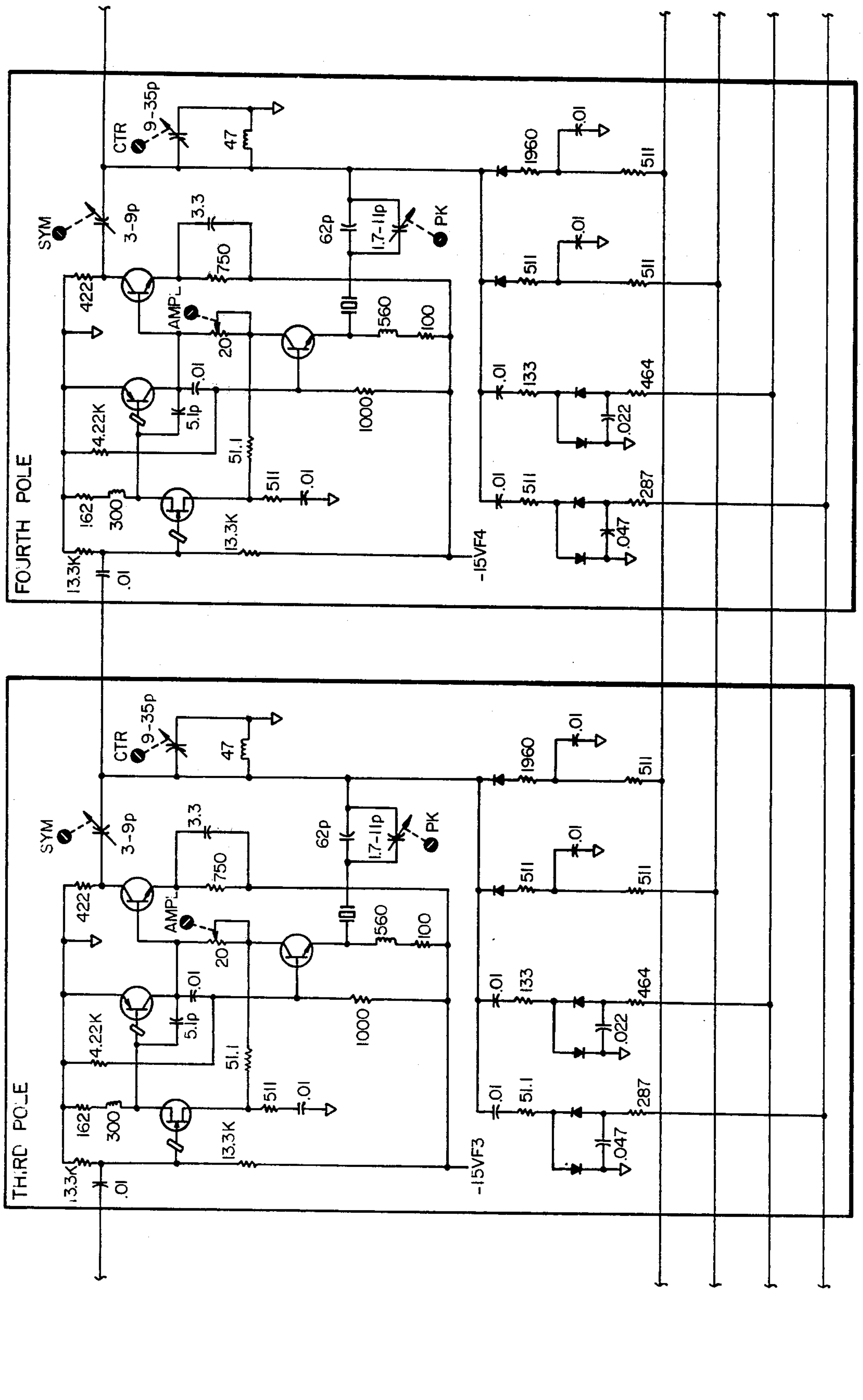
FIG_45B

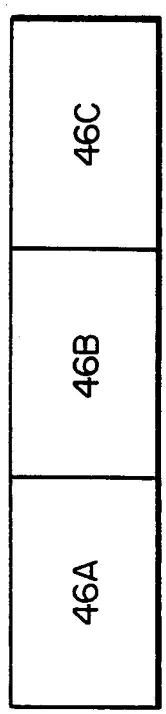
FIG_46

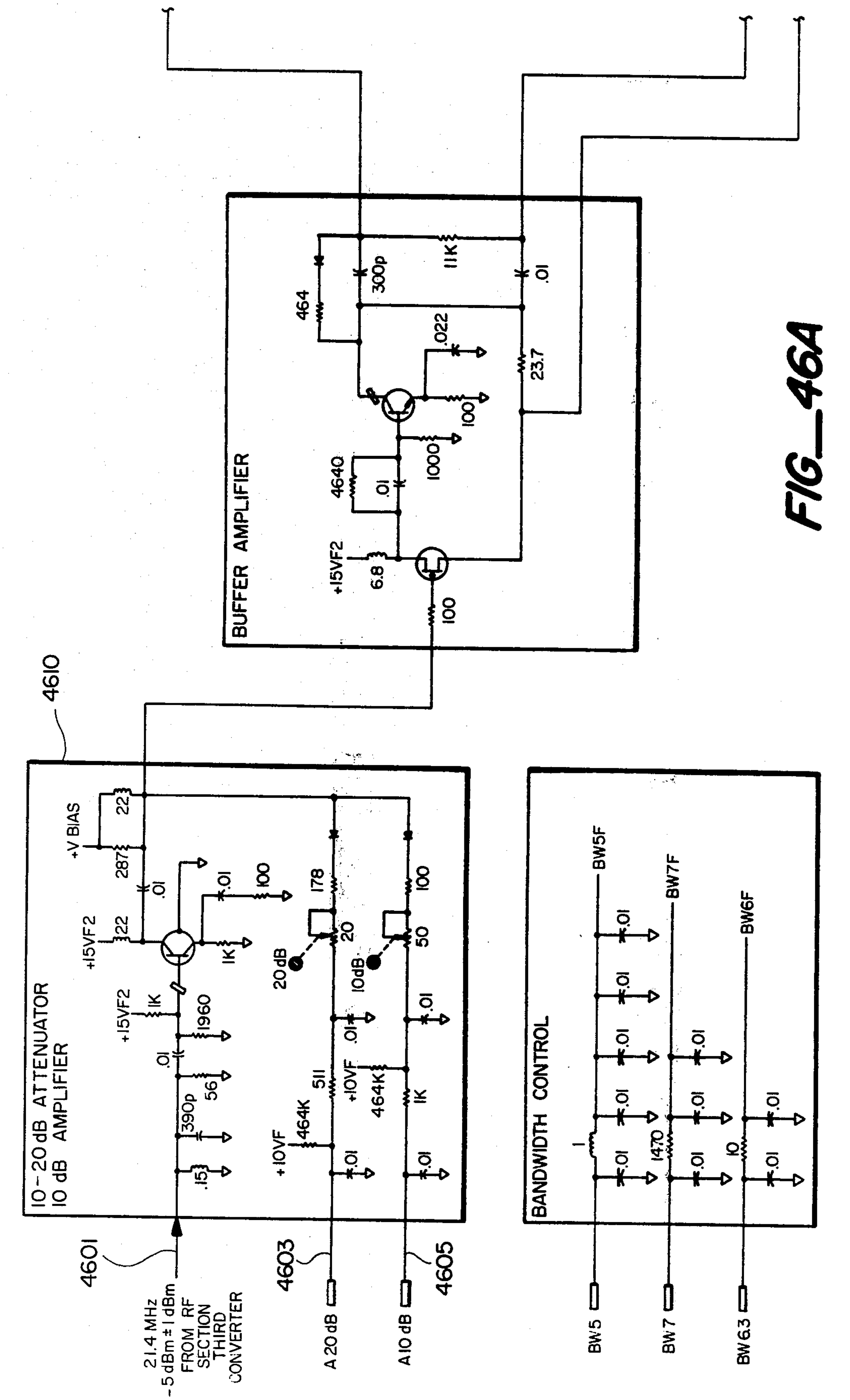
FIG_46A

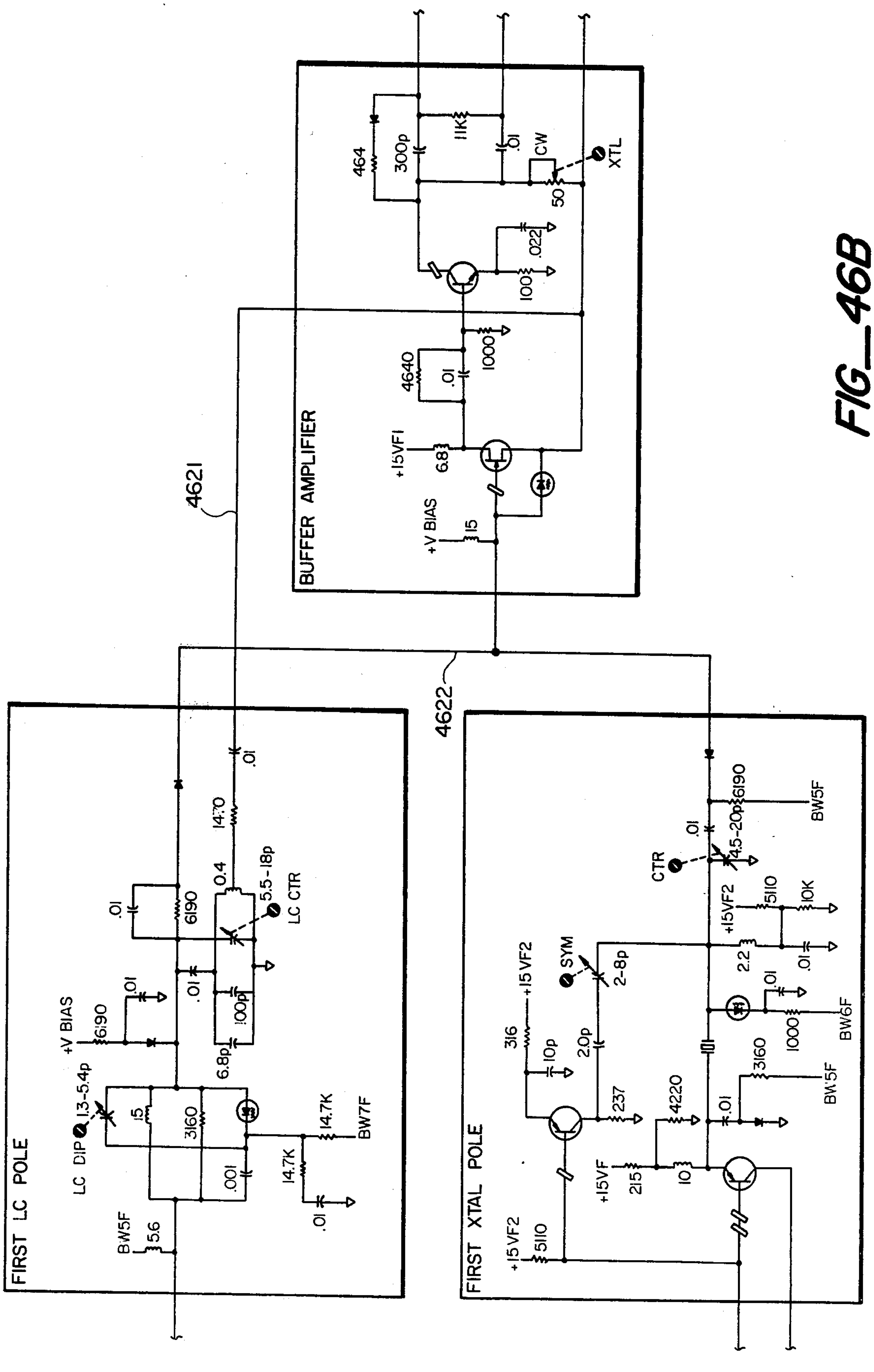
FIG_46B

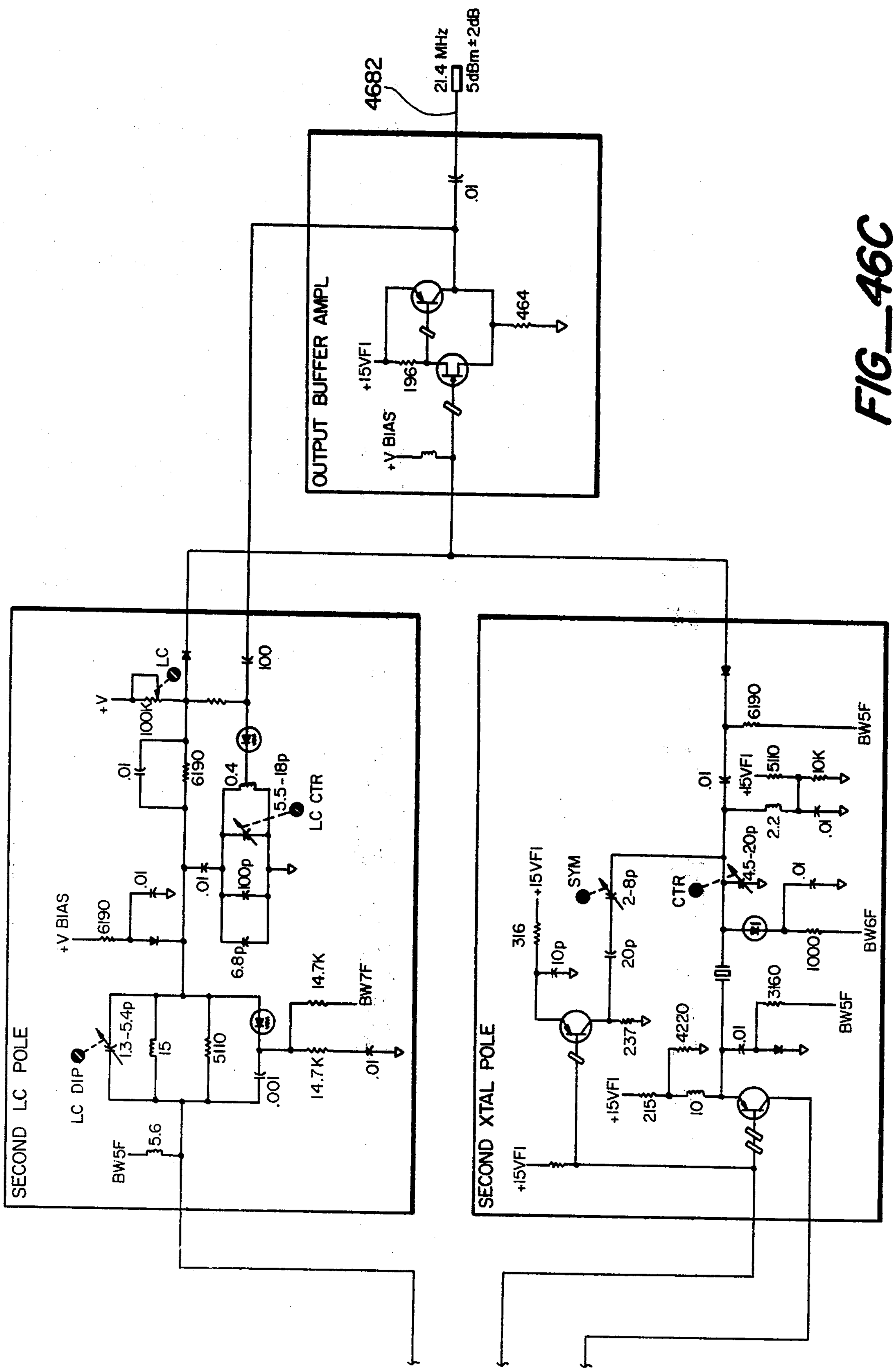
FIG_46C

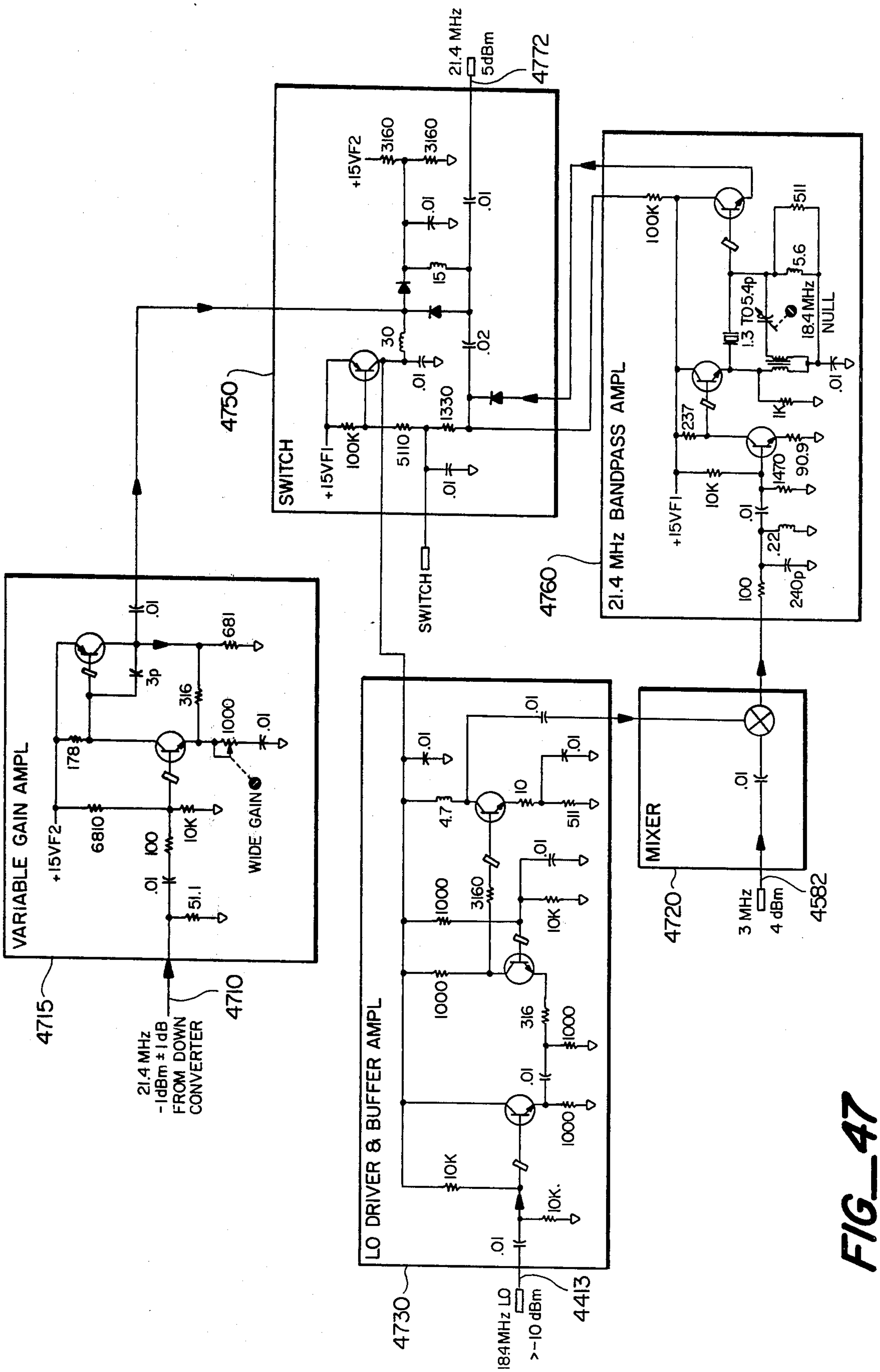
FIG_47

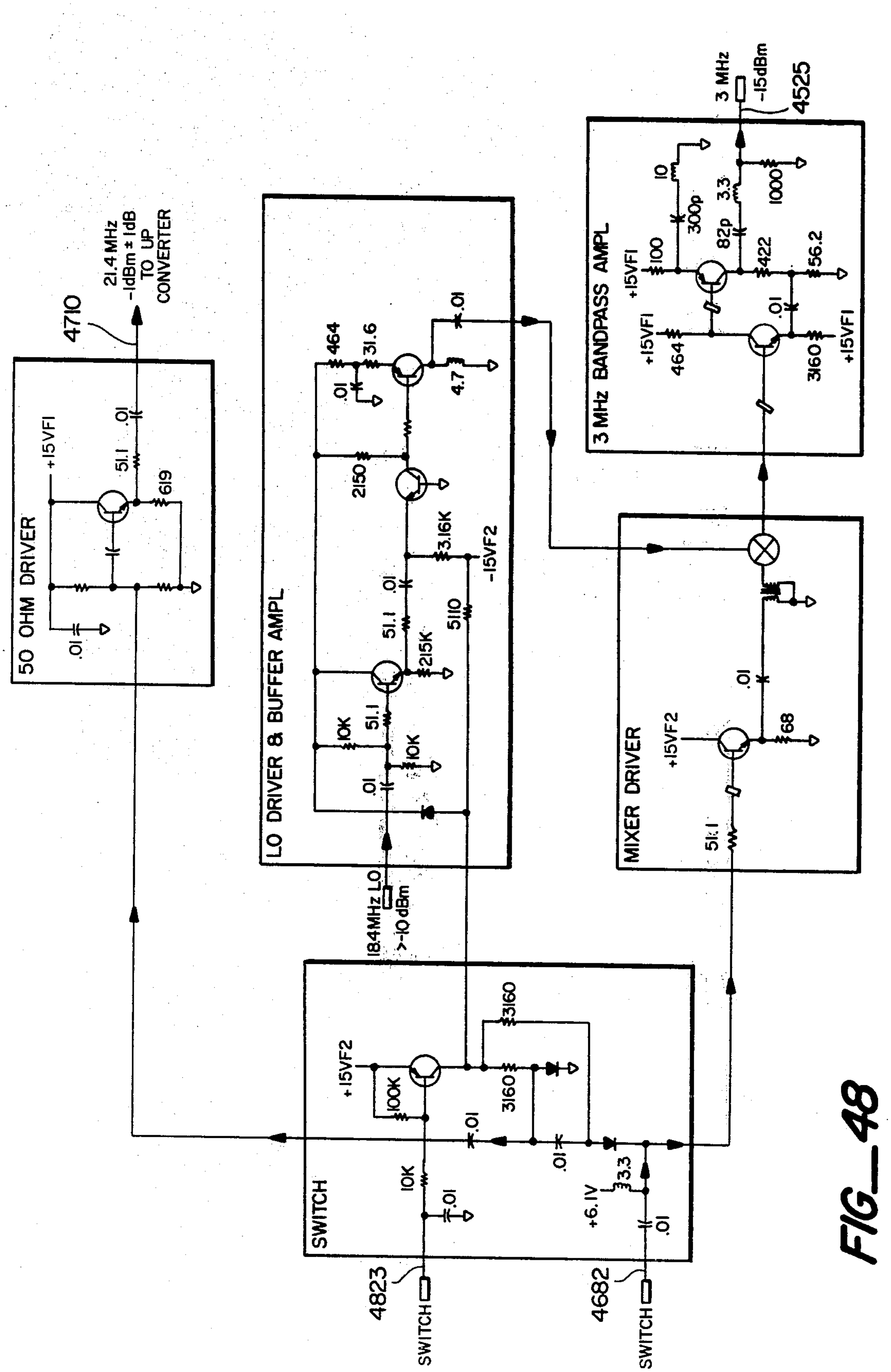
FIG_48

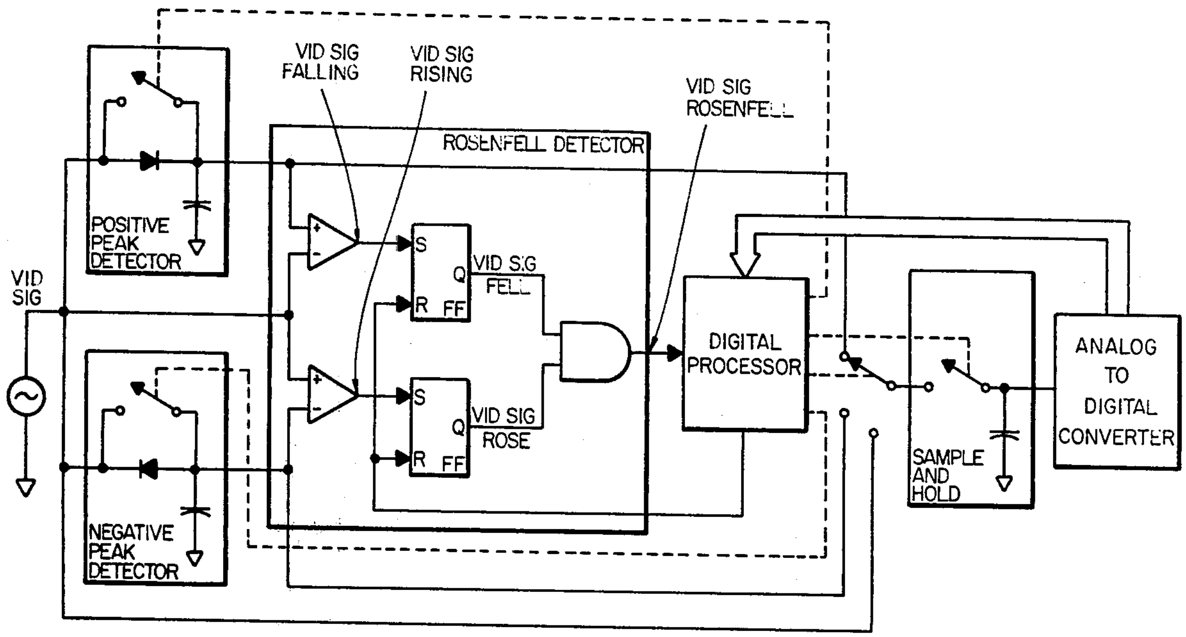
FIG_49A
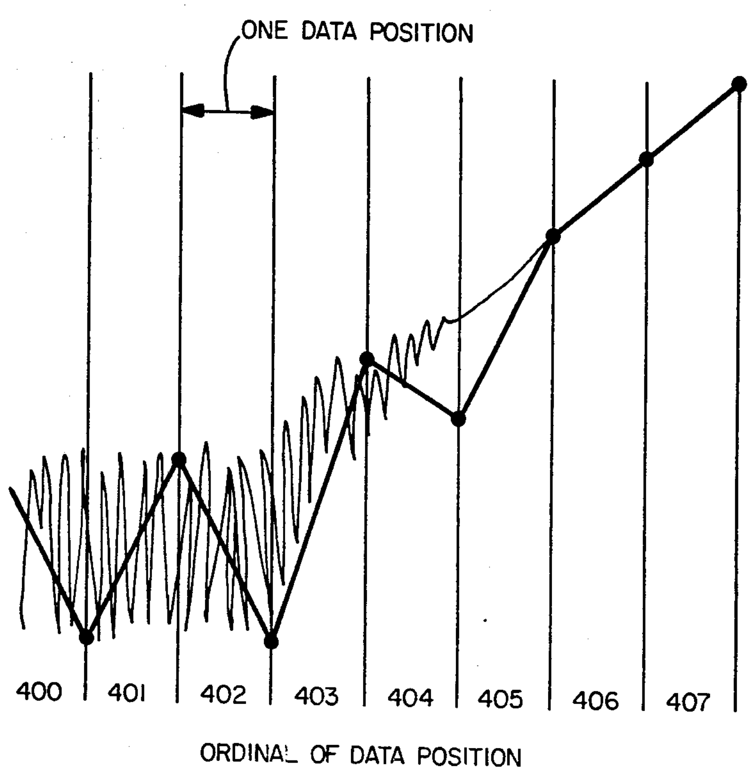
FIG_49B

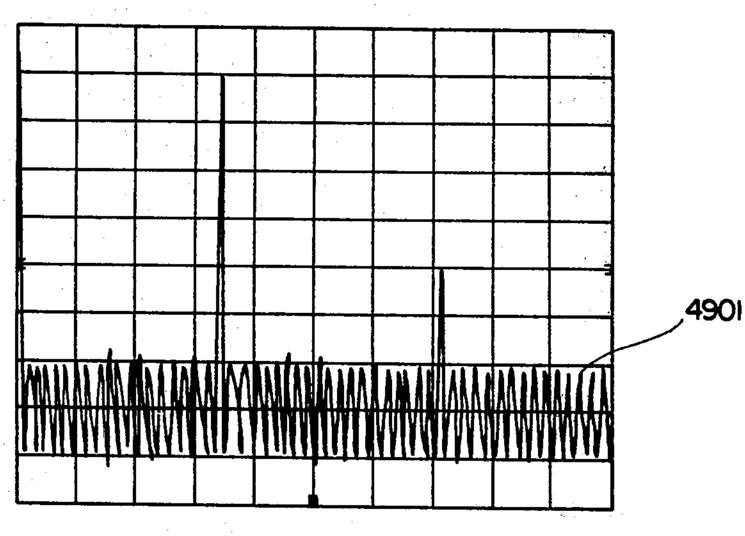
FIG_49C-1
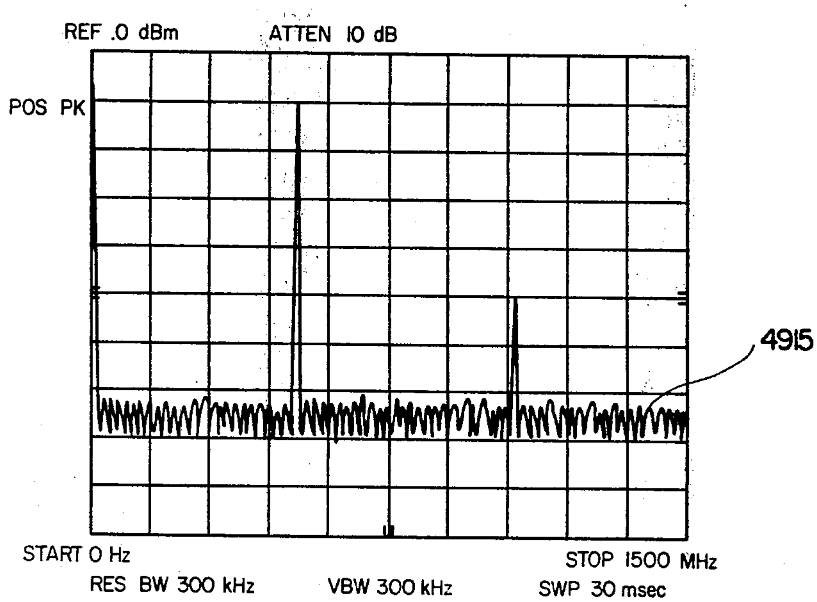
FIG_49C-2

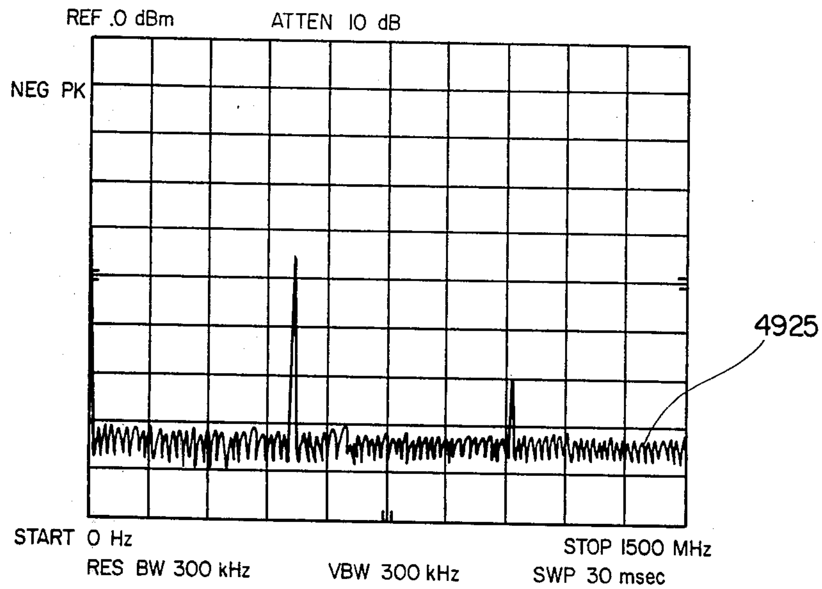
FIG_49C-3
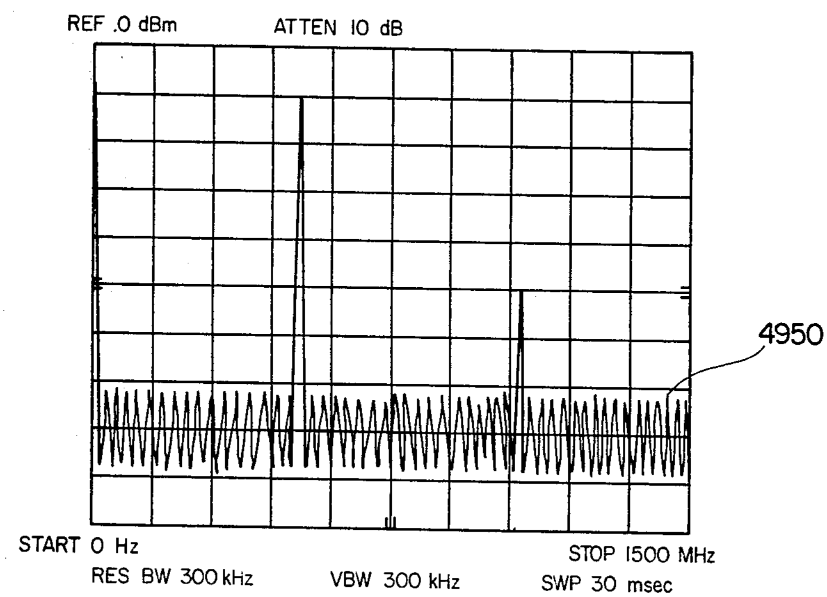
FIG_49C-4

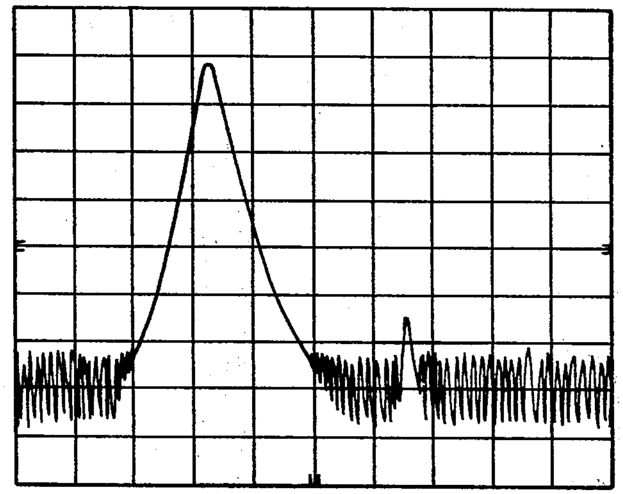
FIG_49D-1
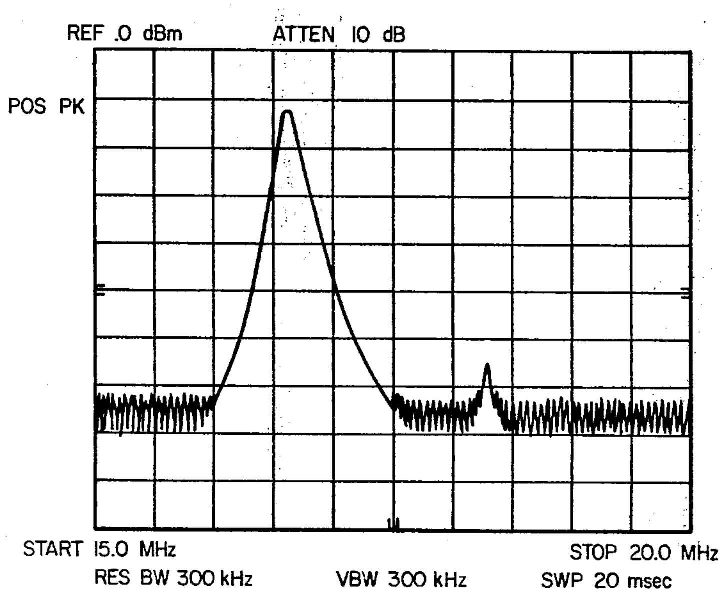
FIG_49D-2

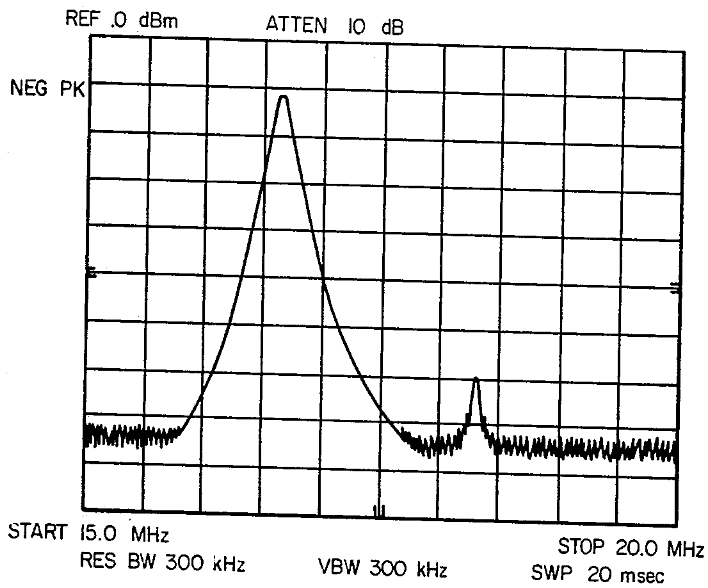
FIG_49D-3
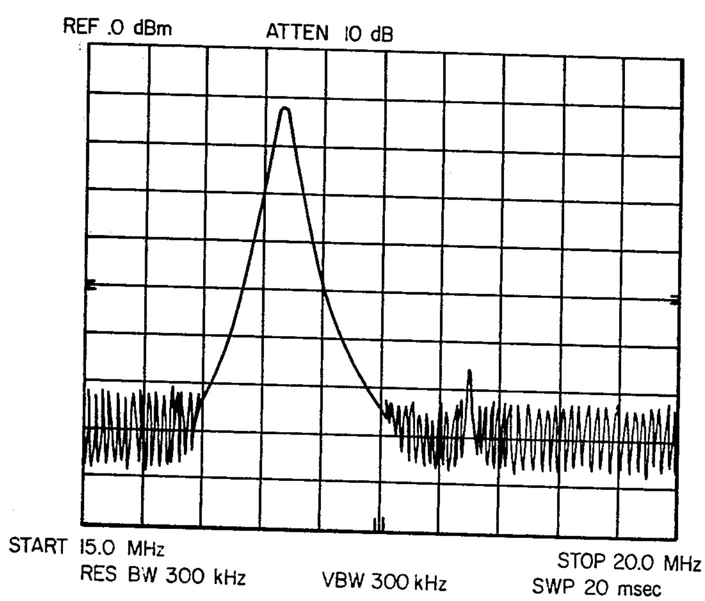
FIG_49D-4

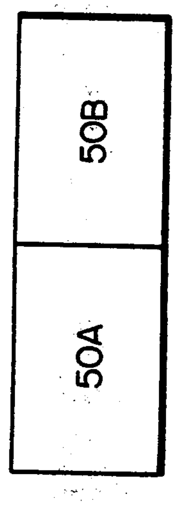
FIG_50

FIG_50A
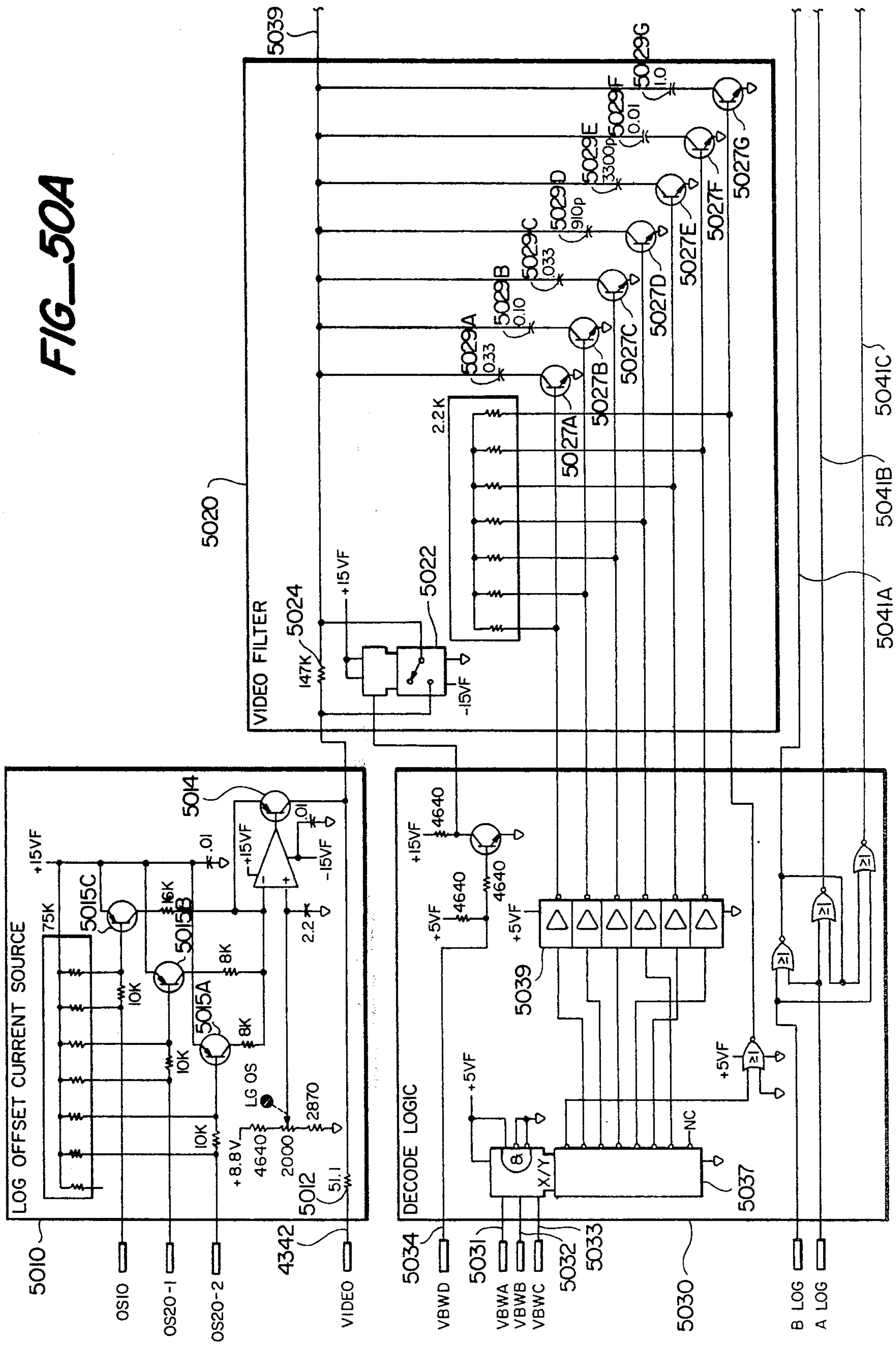

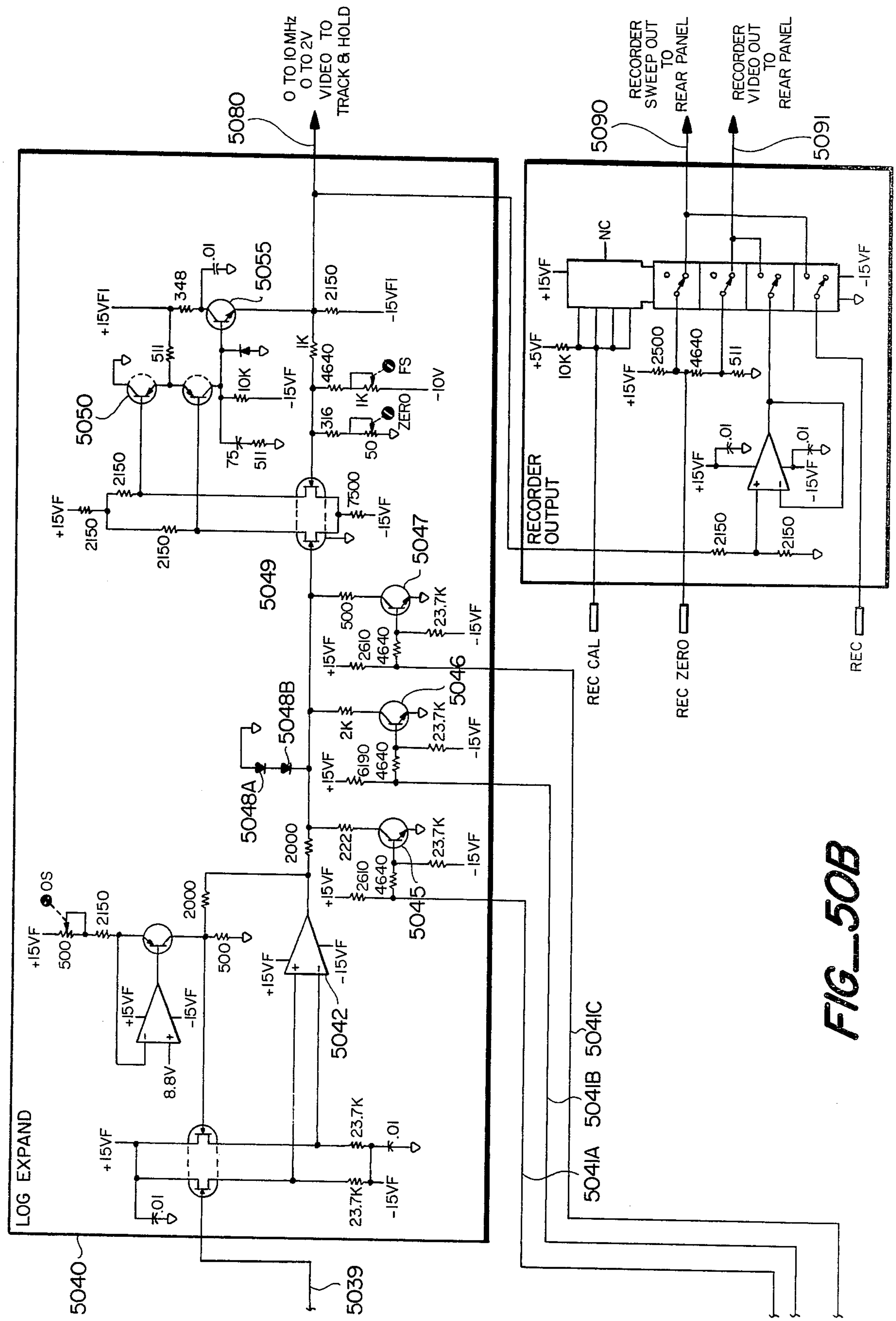
FIG_50B

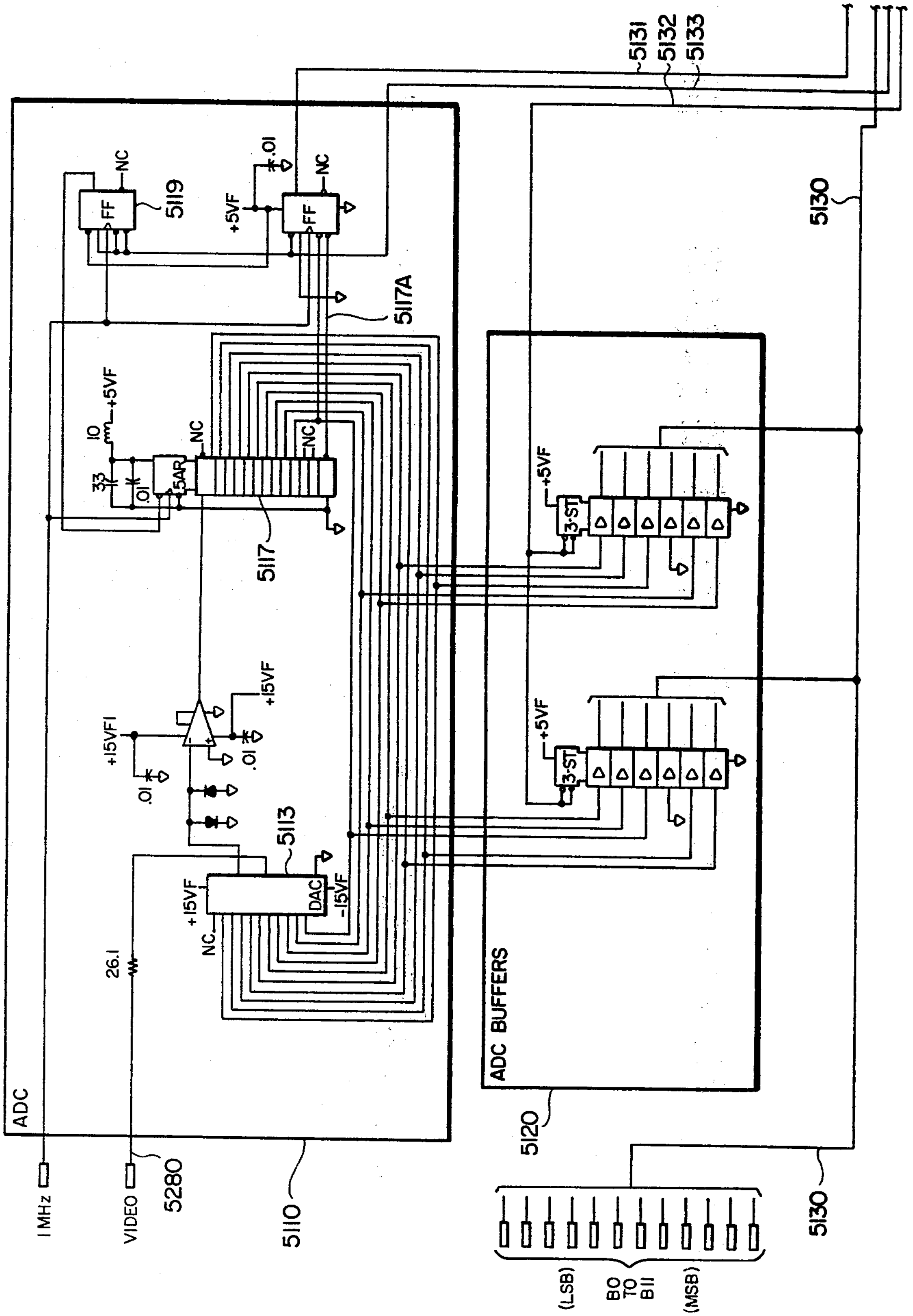
FIG_51A

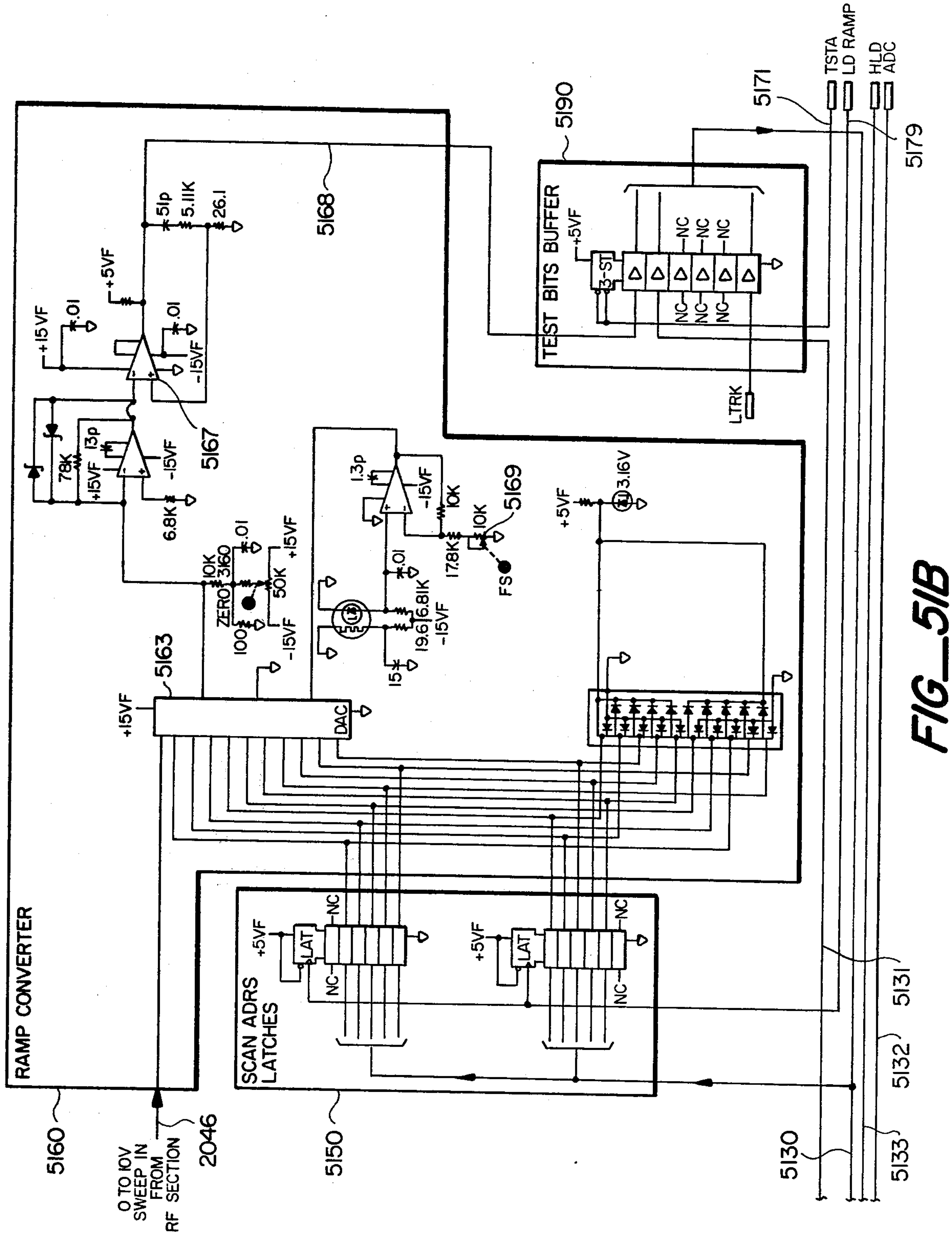
FIG_51B

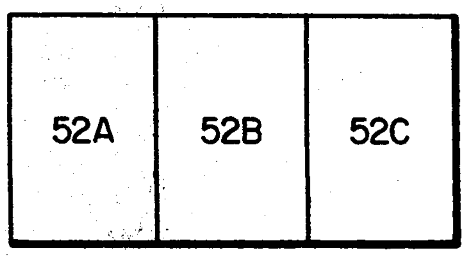
FIG_52

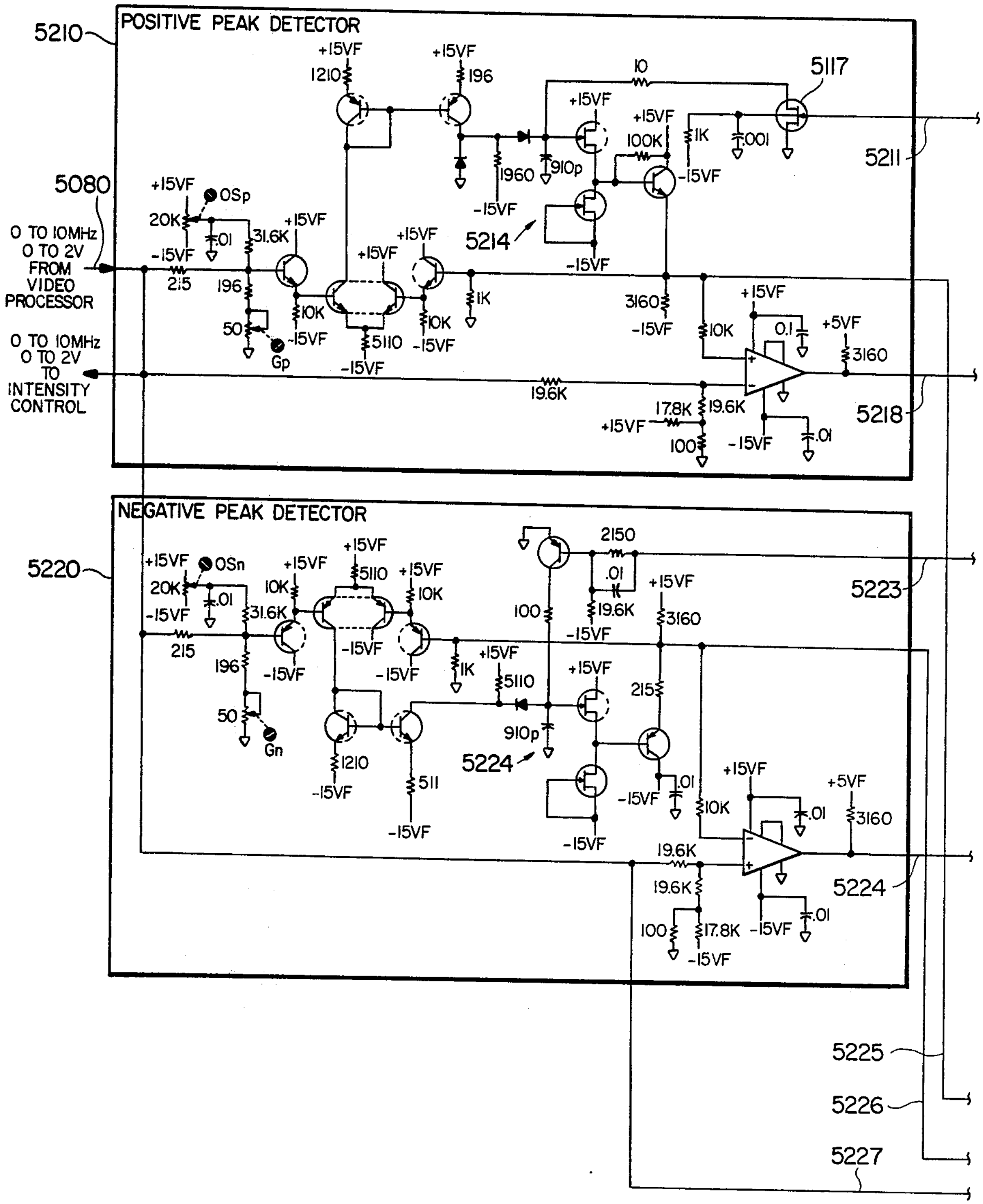
FIG_52A

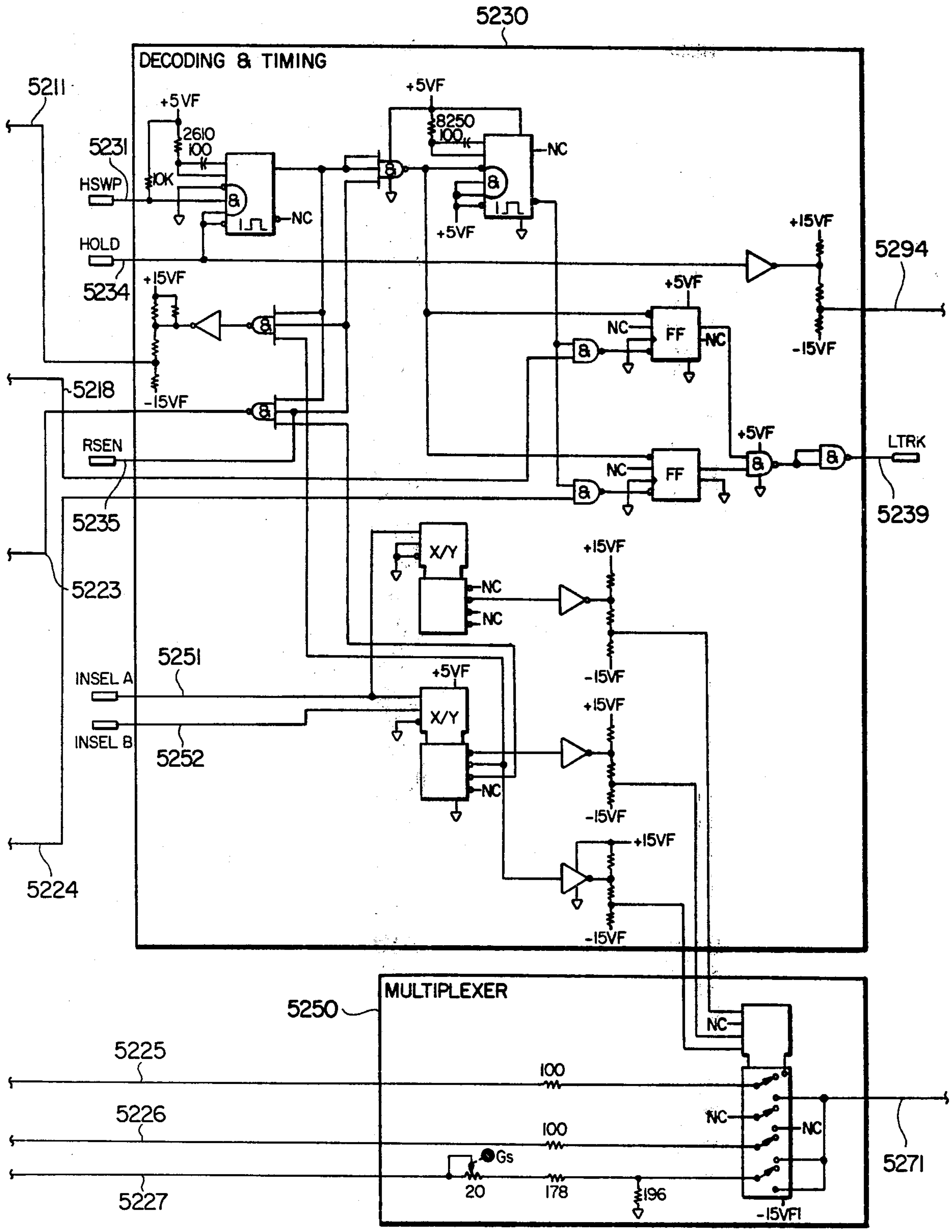
FIG_52B

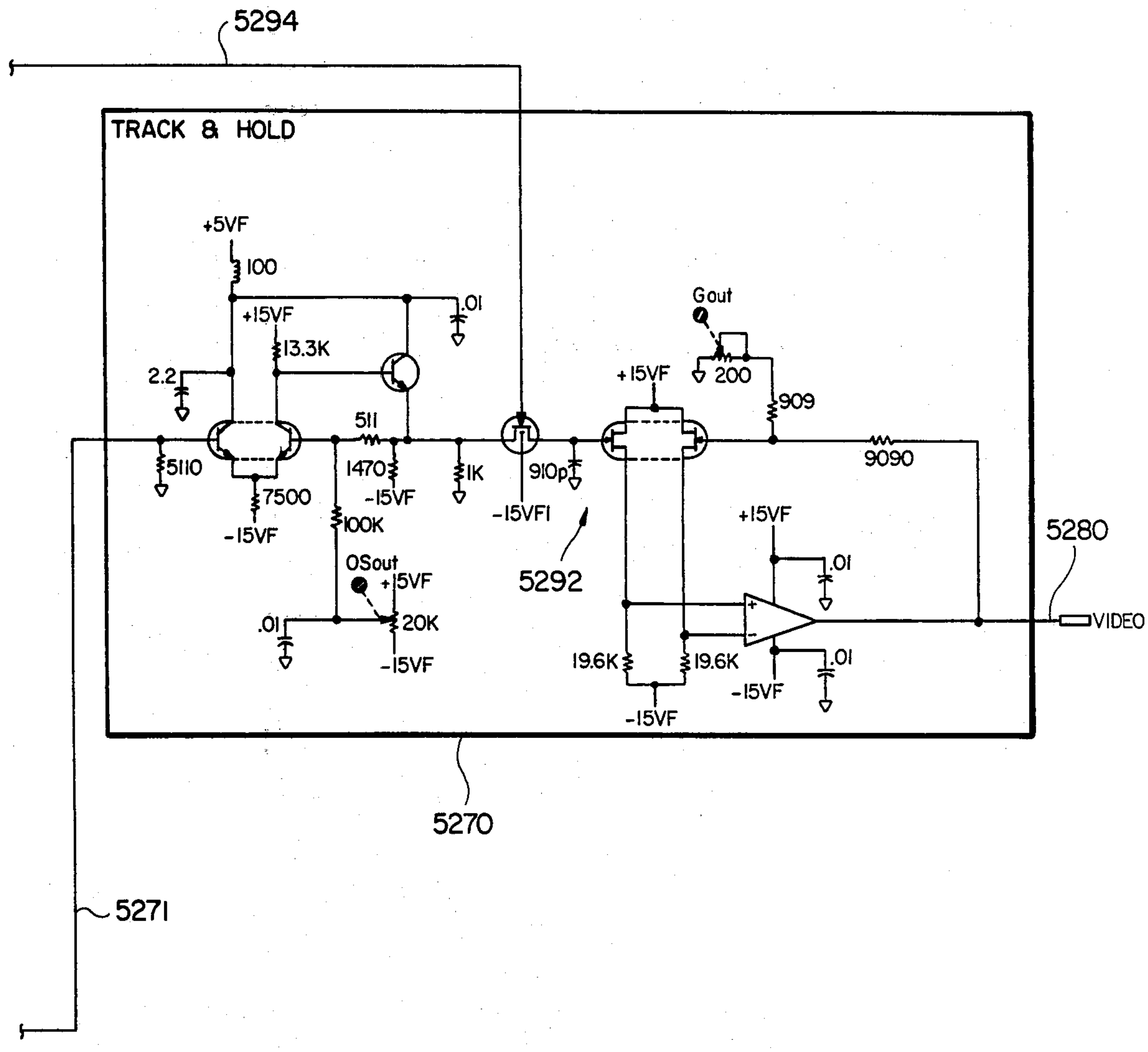
FIG_52C

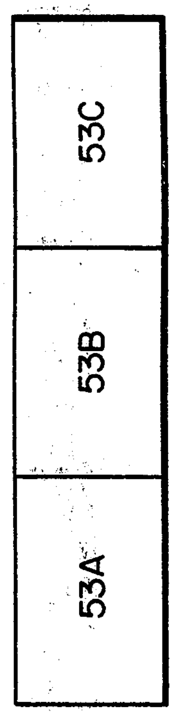
FIG_53

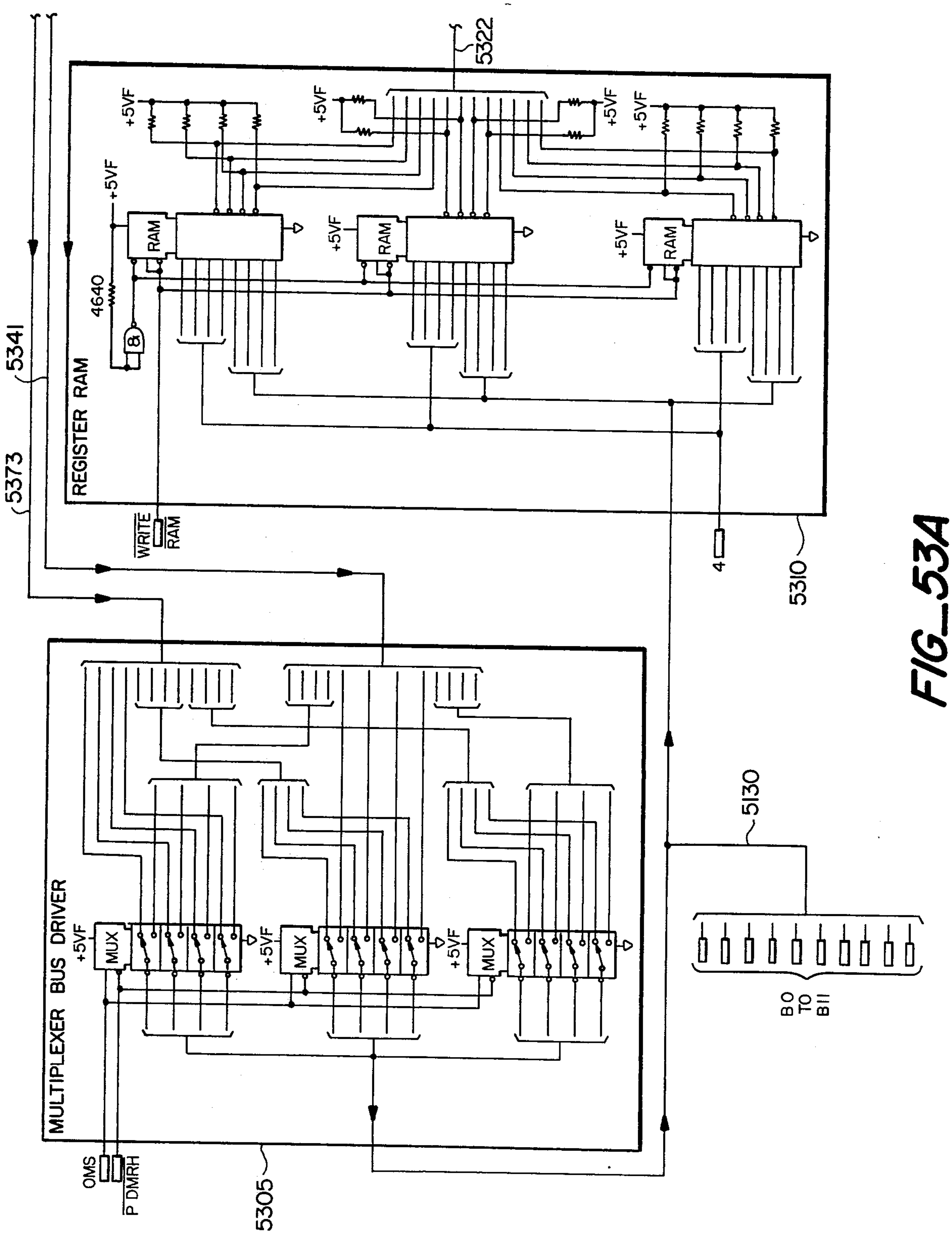
FIG_53A

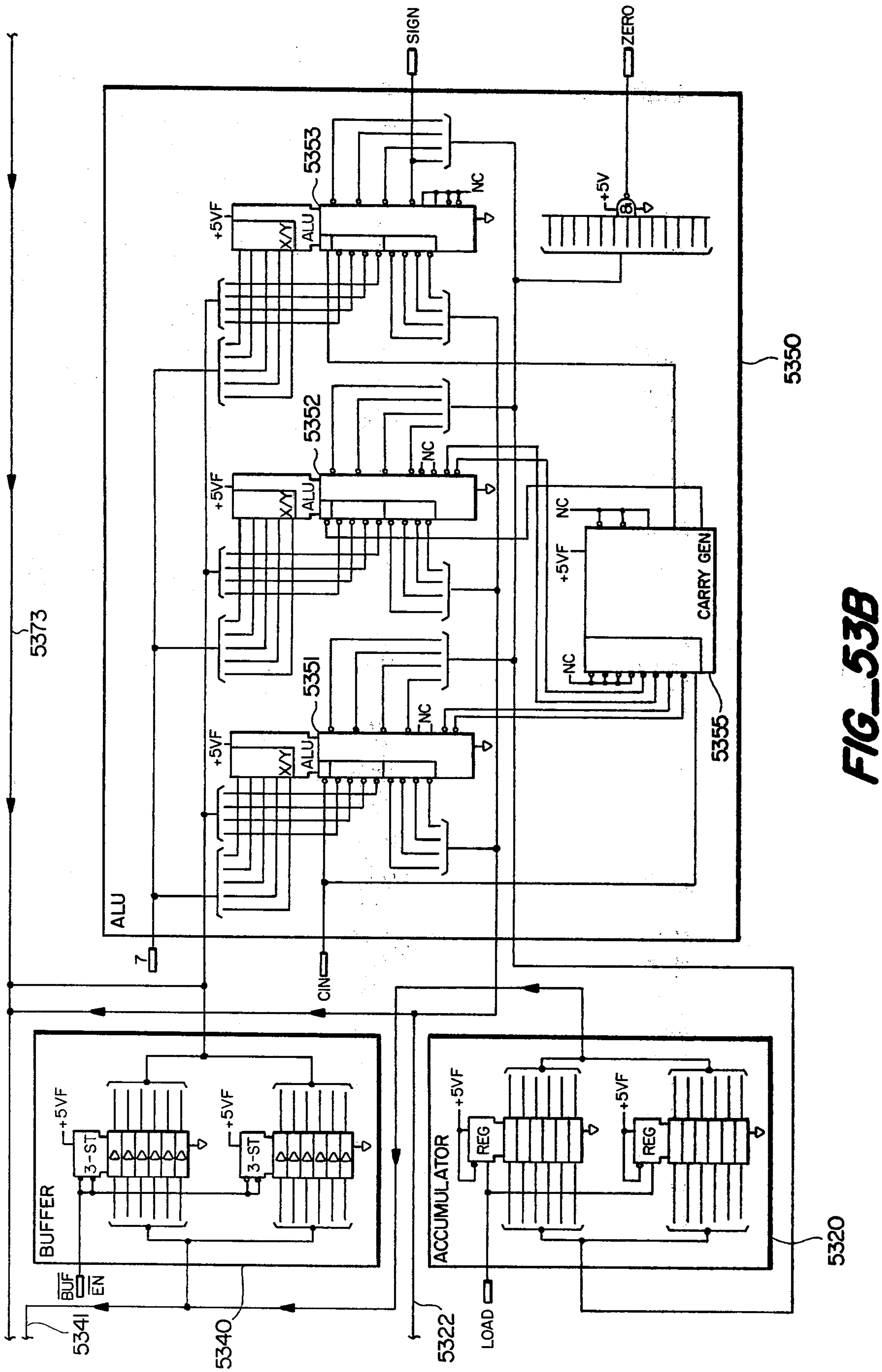
FIG_53B

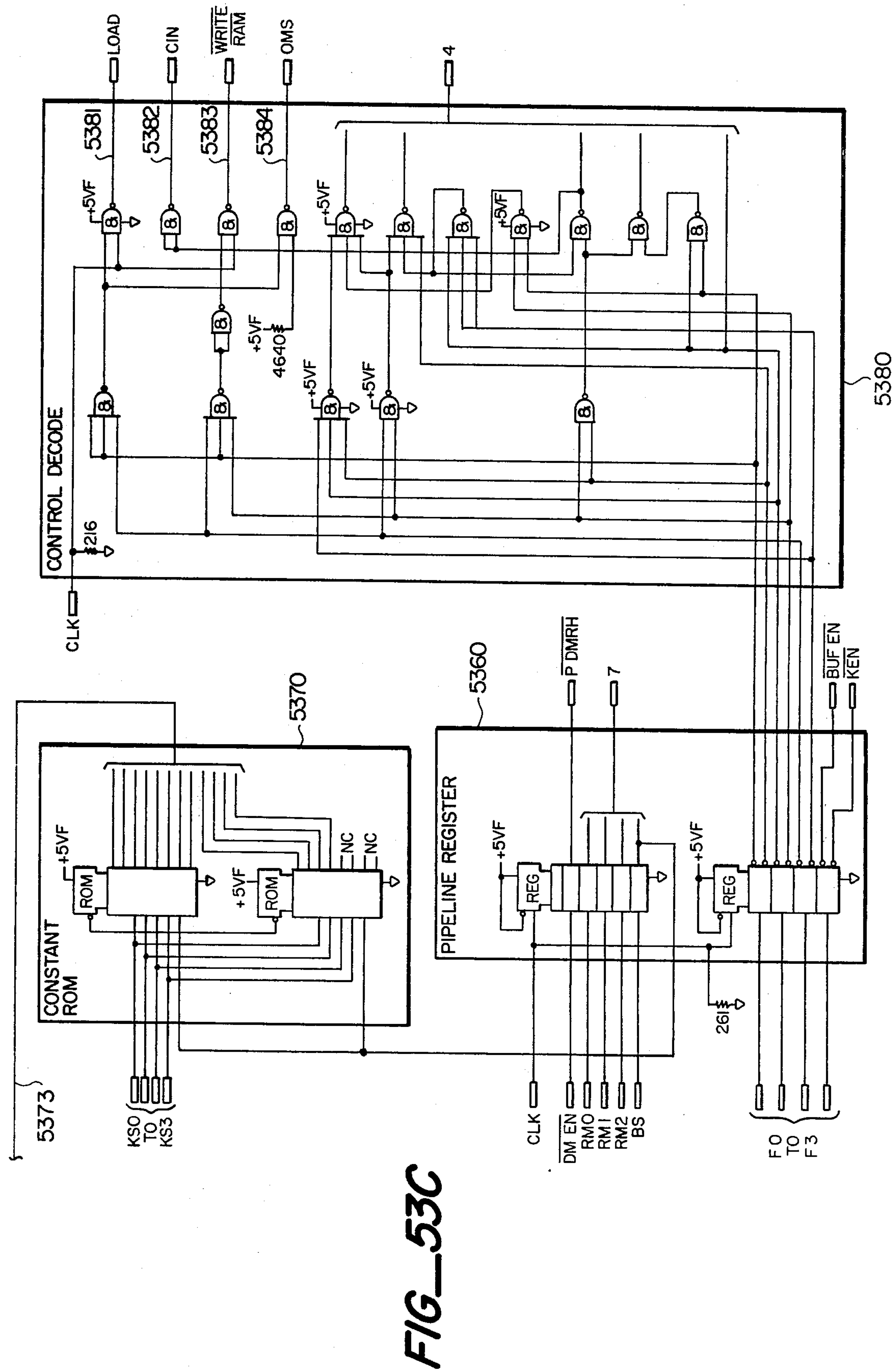
FIG_53C

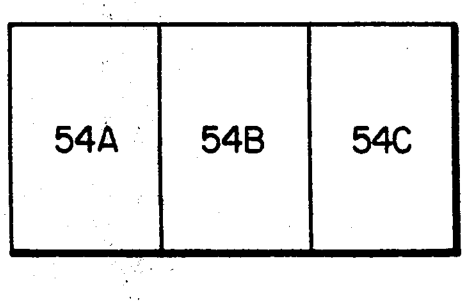
FIG_54

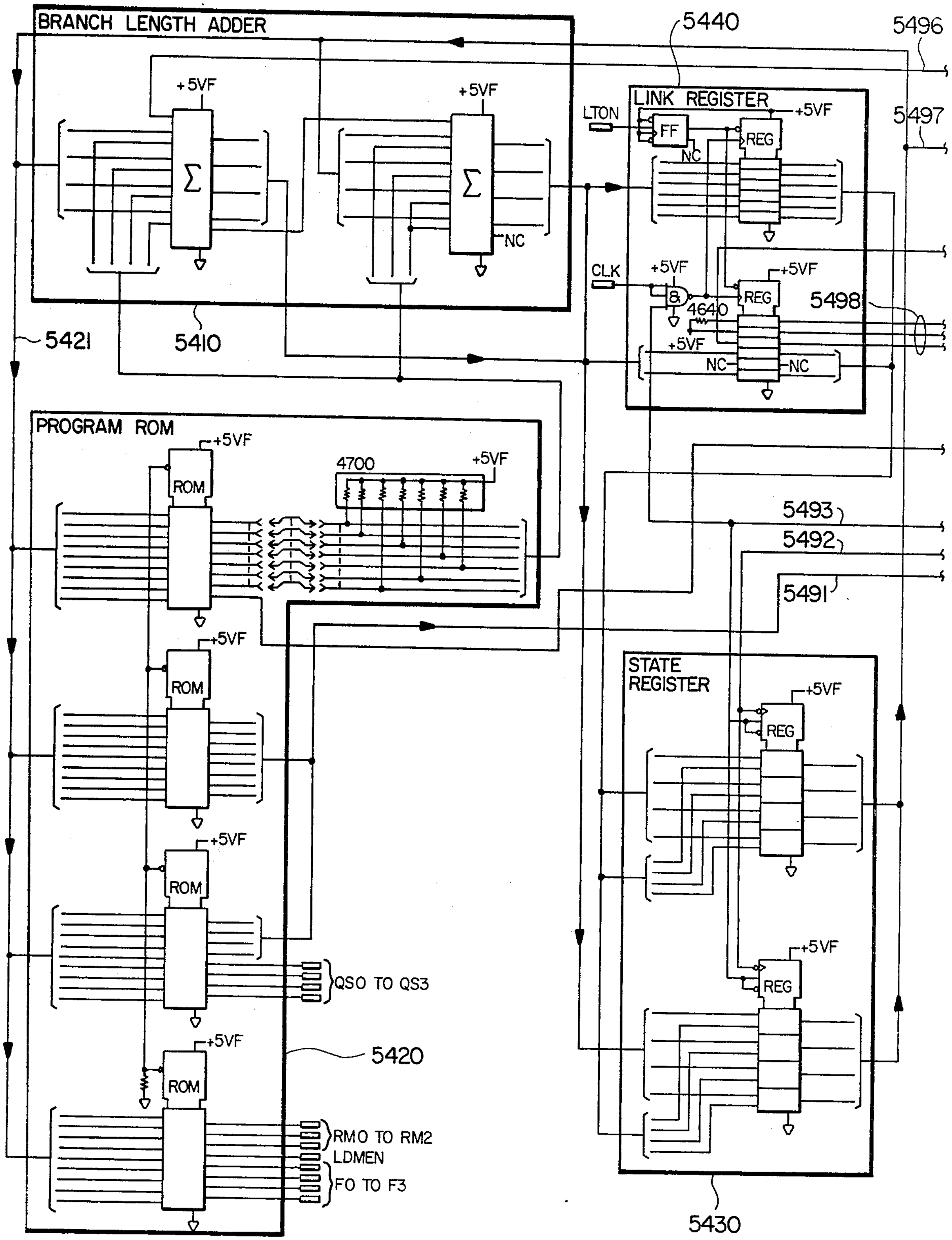
FIG_54A

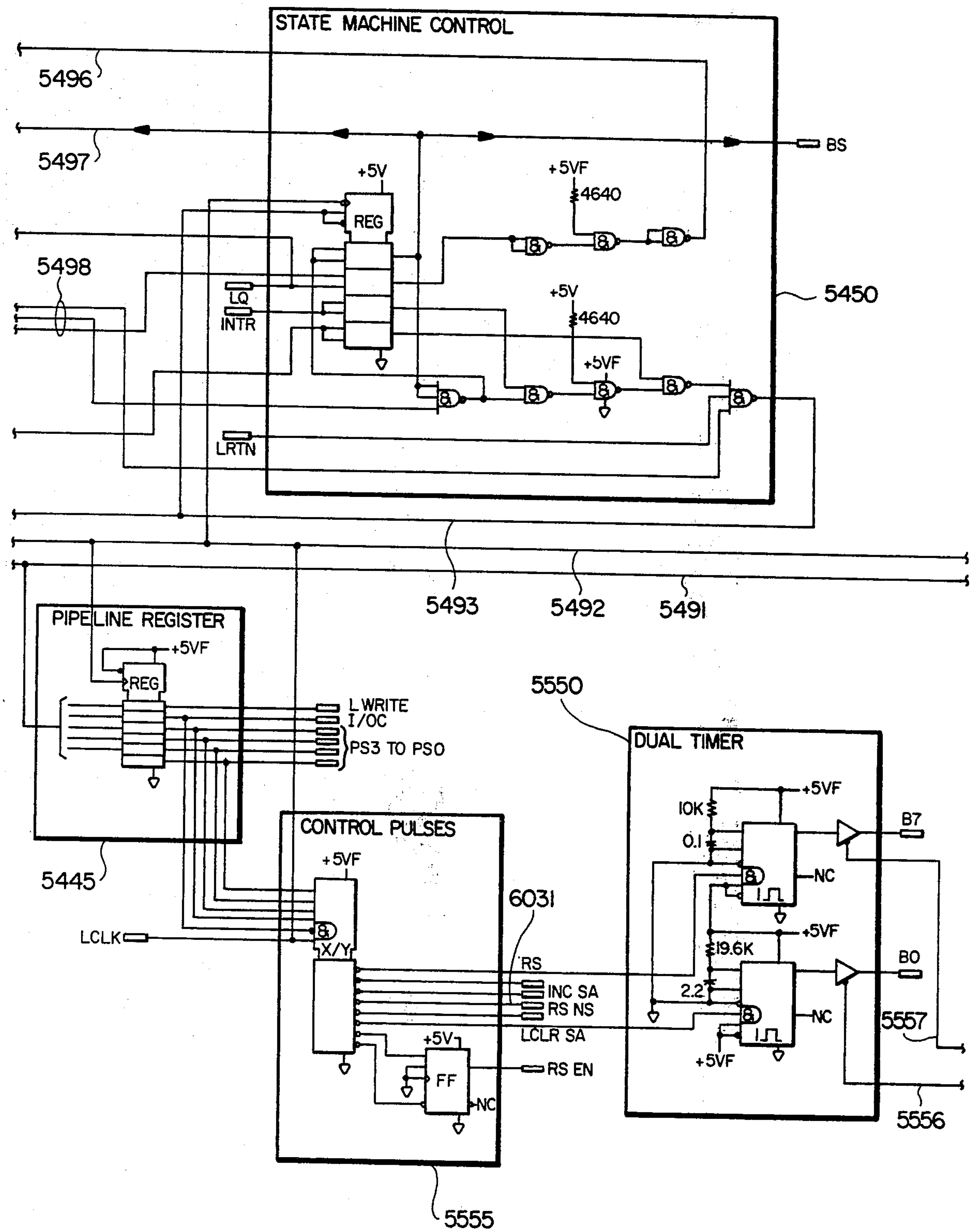
FIG_54B

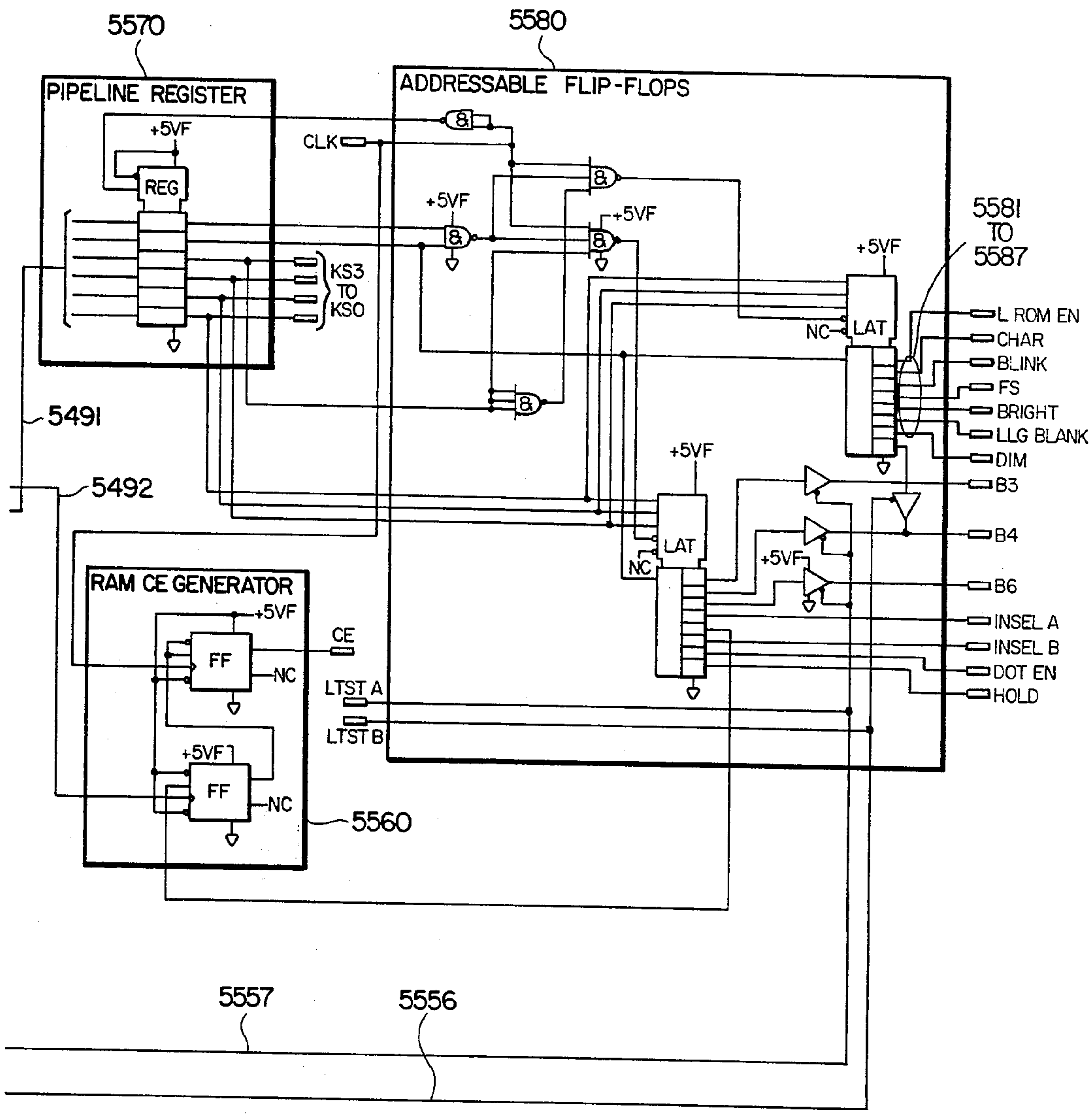
FIG_54C

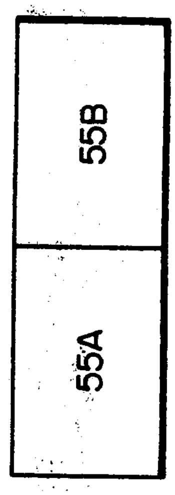
FIG_55

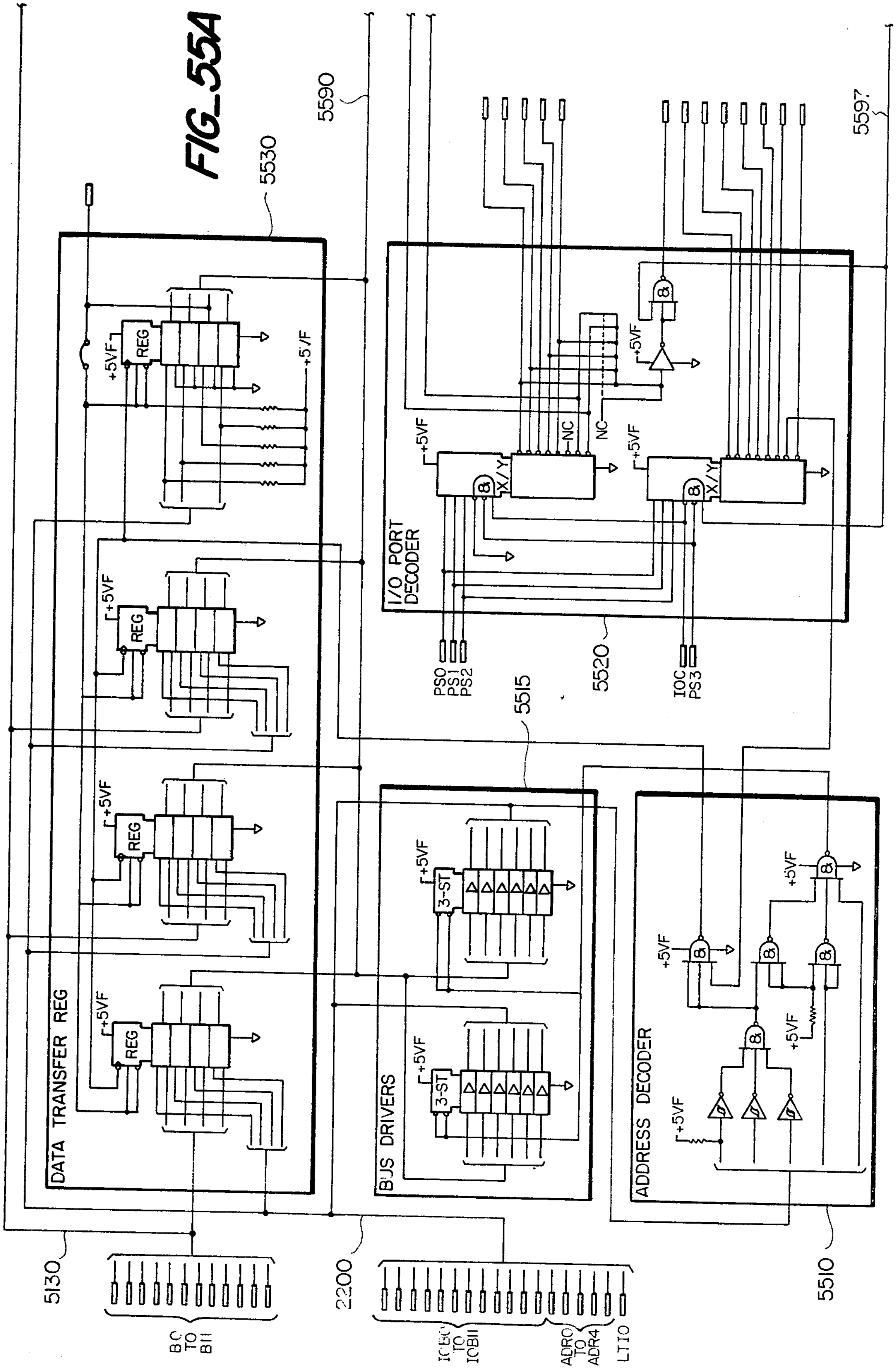
FIG_55A

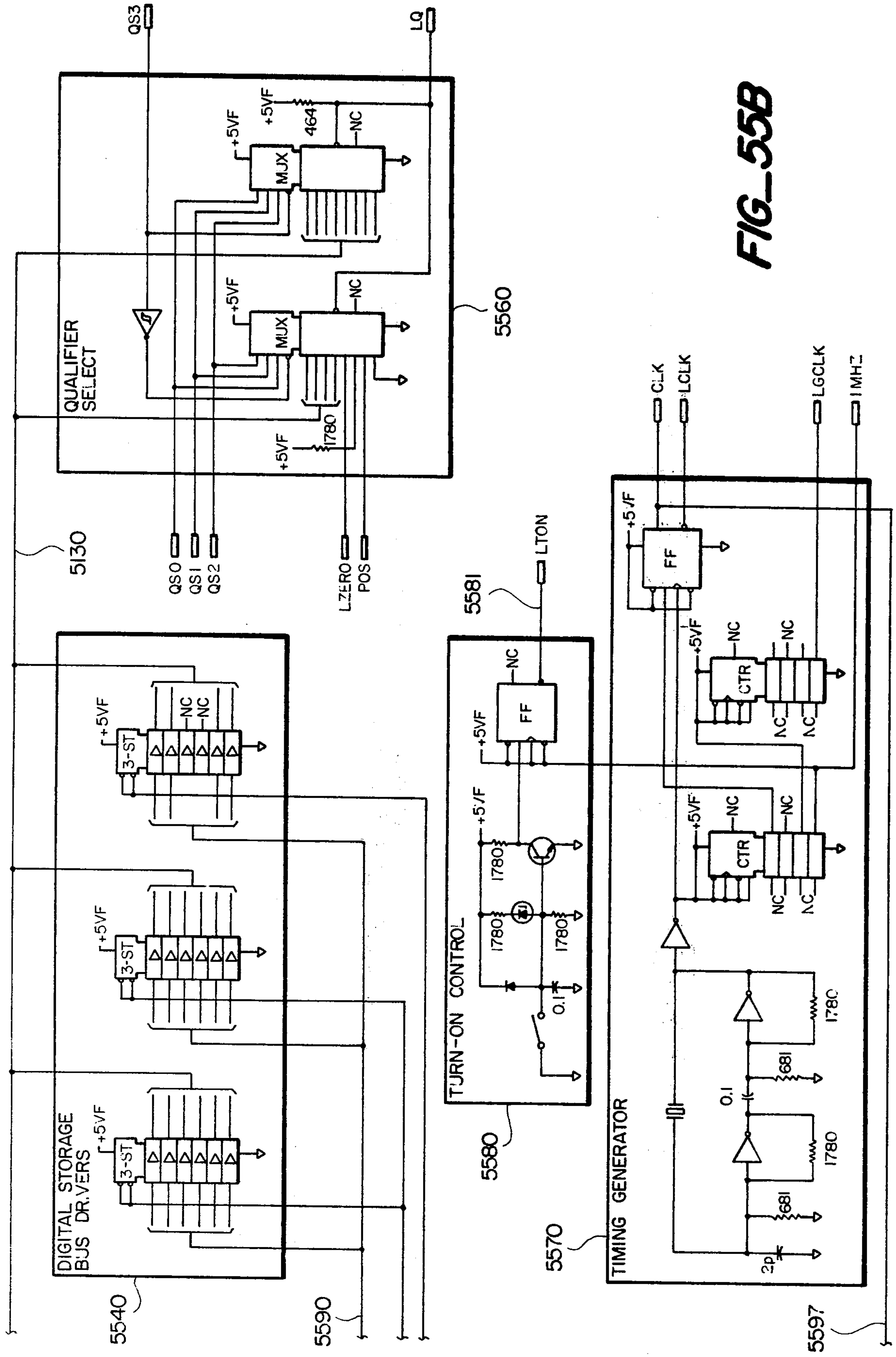
FIG_55B

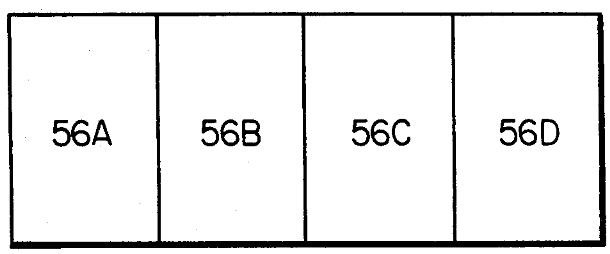
FIG_56

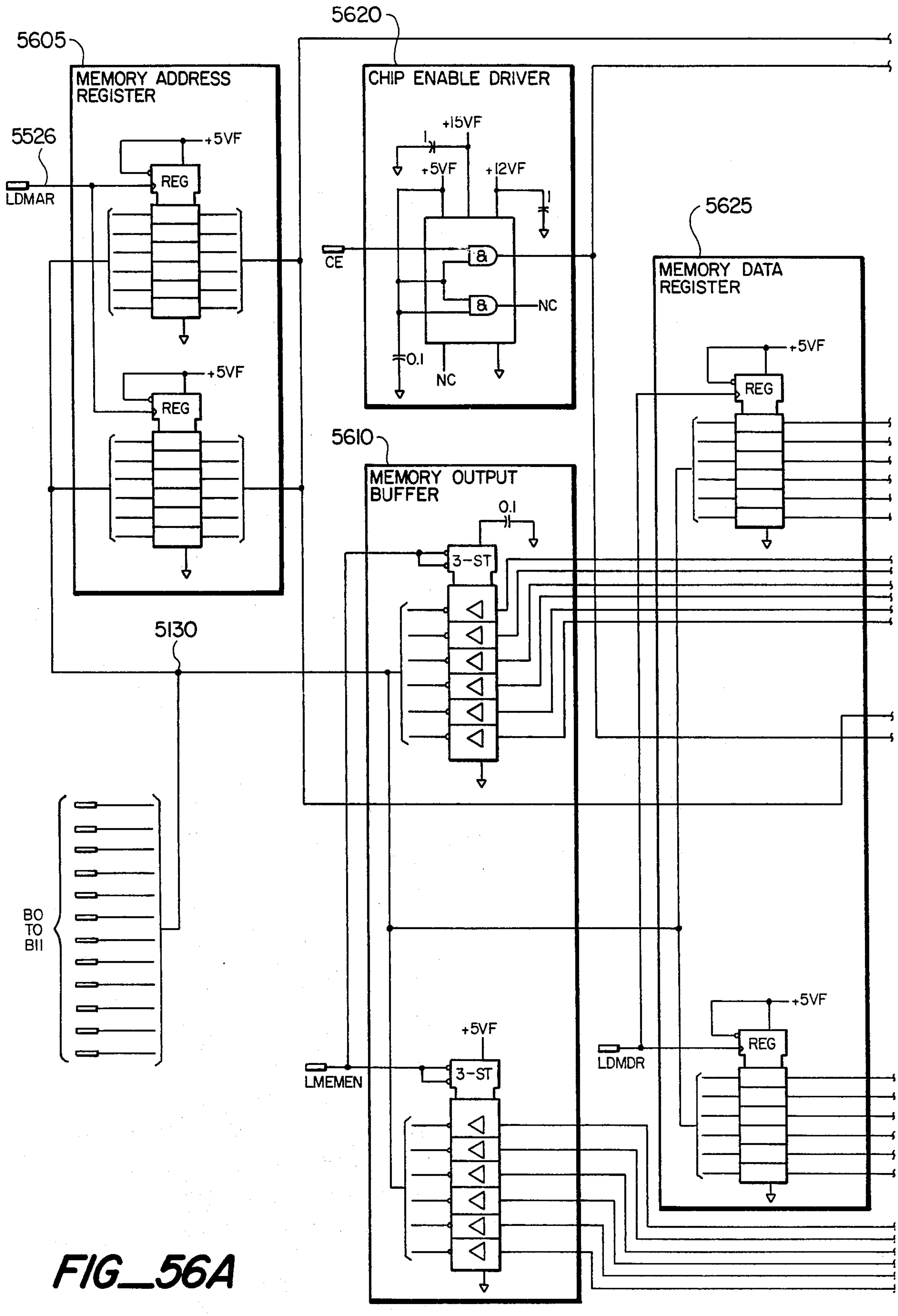
FIG_56A

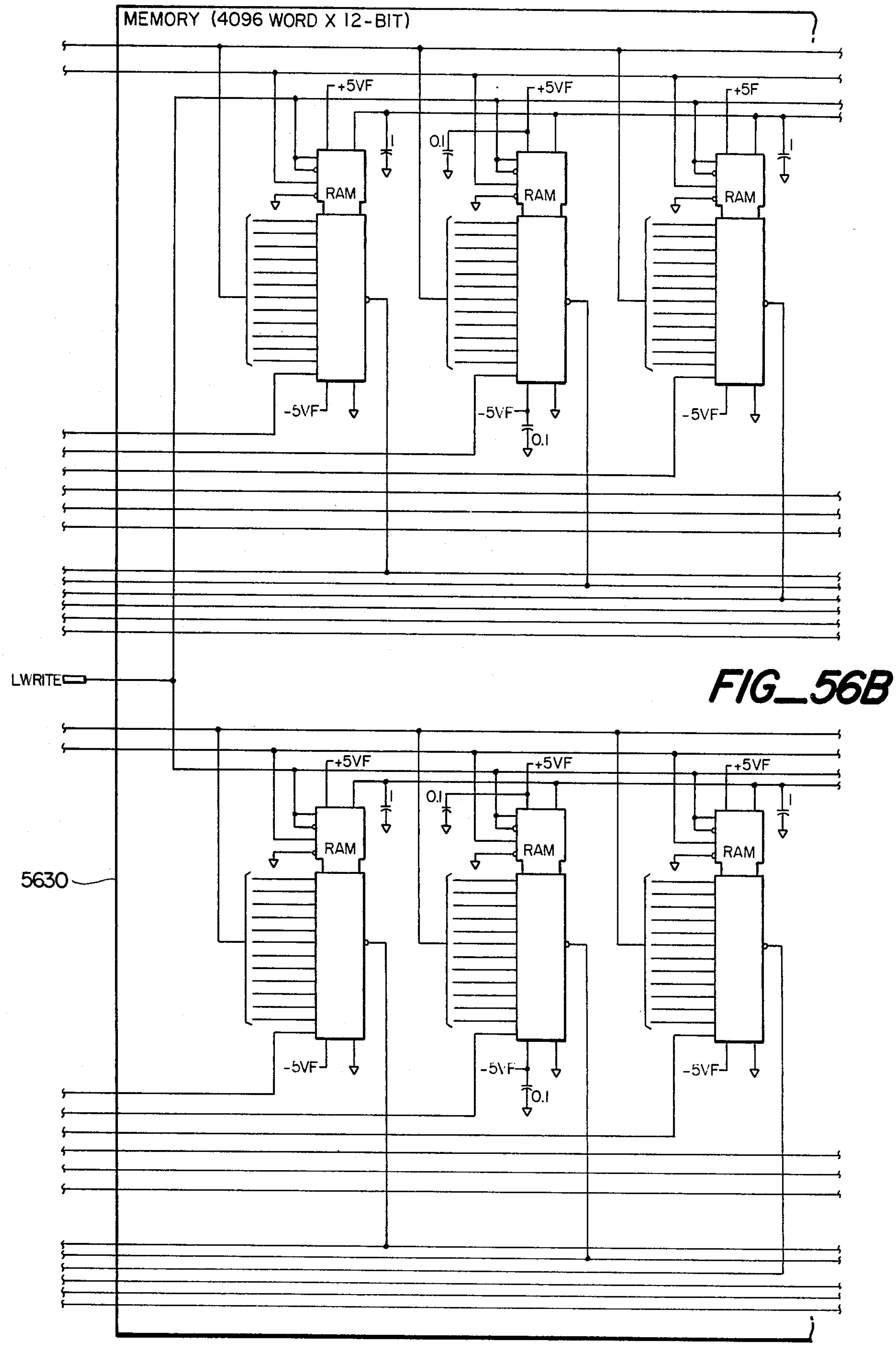
FIG_56B

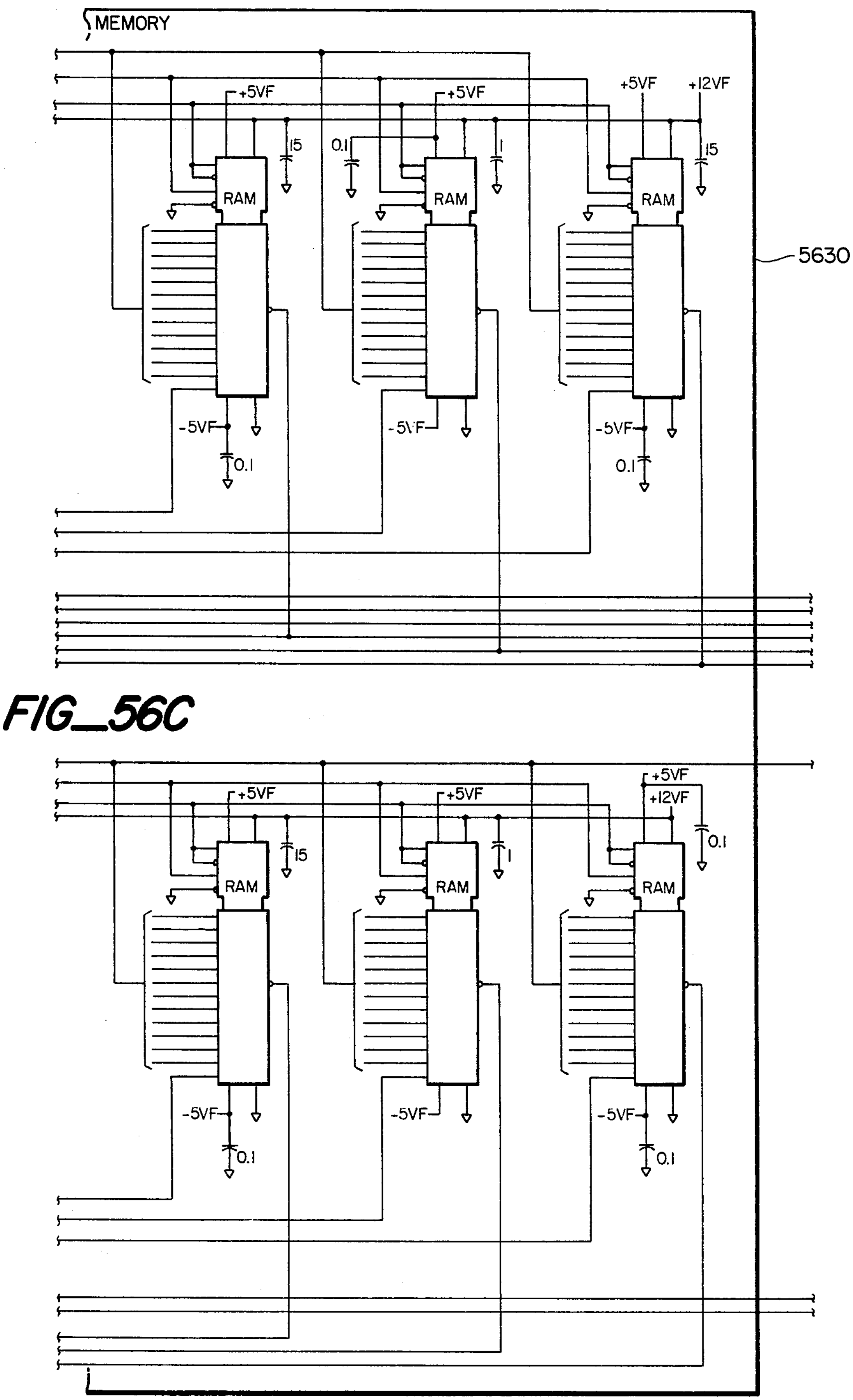
FIG_56C

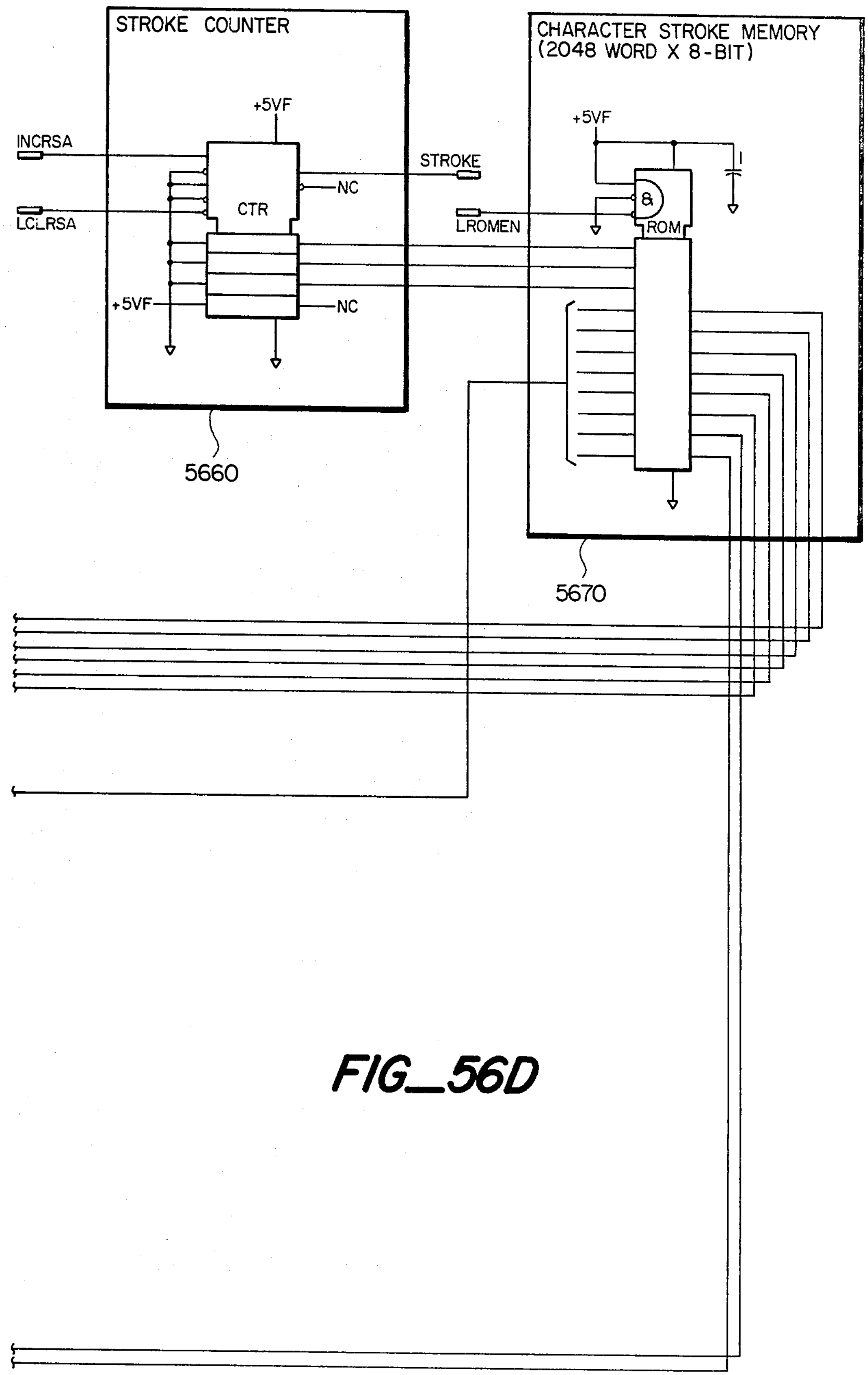
FIG_56D

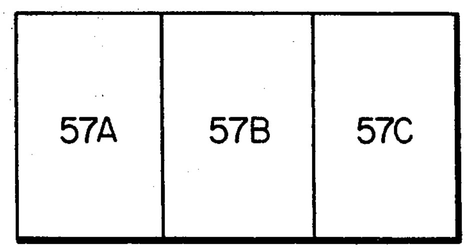
FIG_57

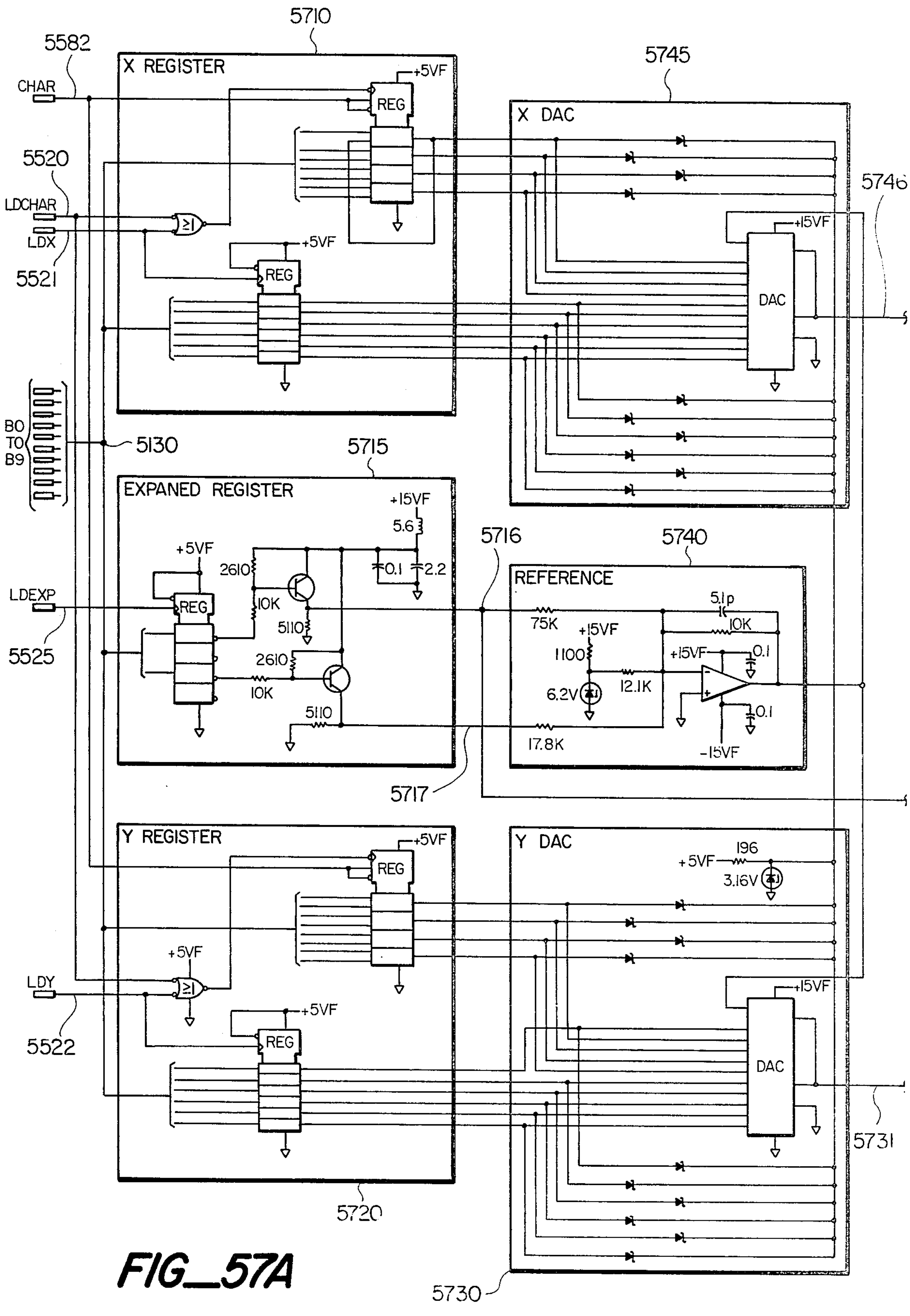
FIG_57A

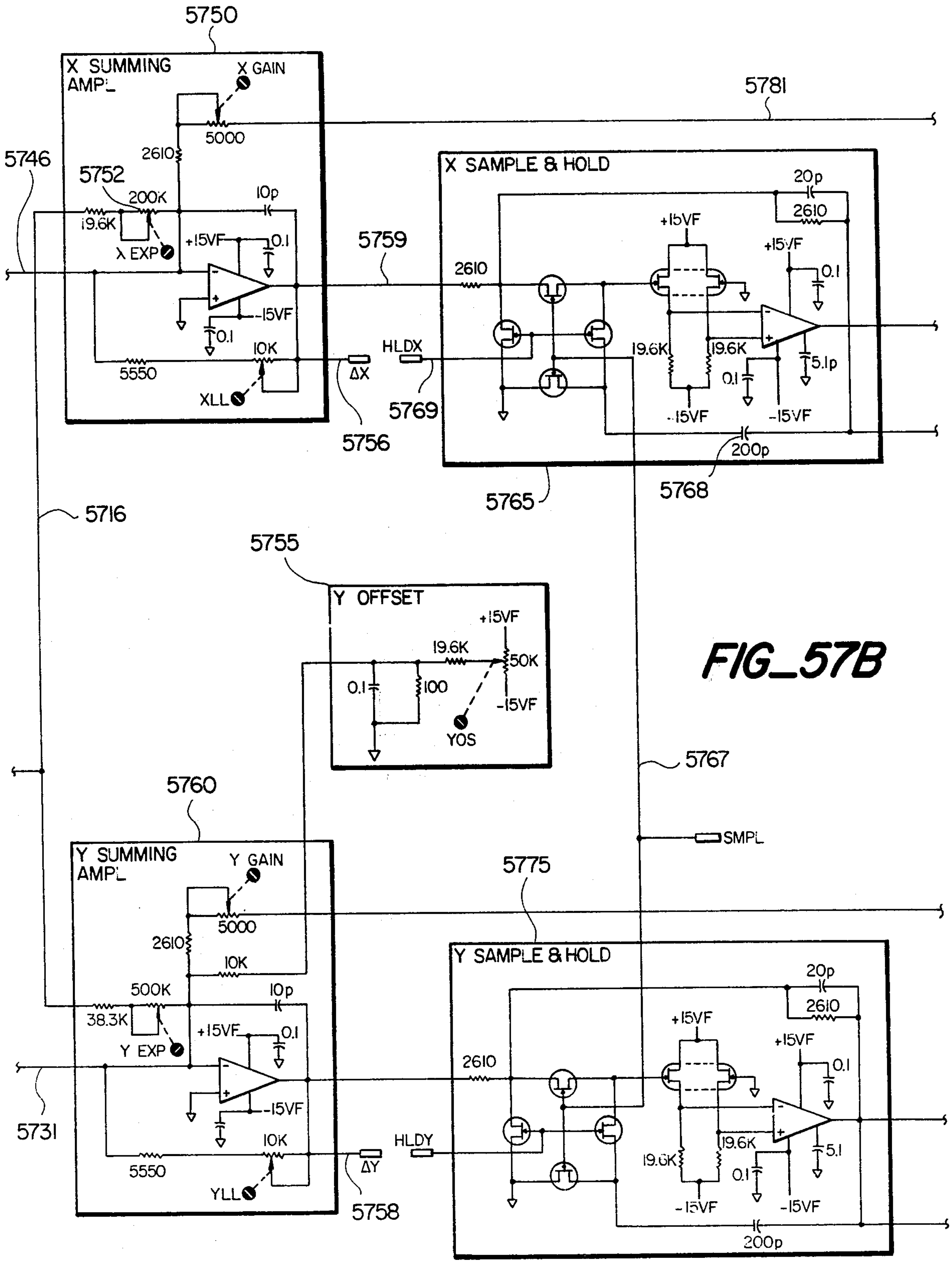
FIG_57B

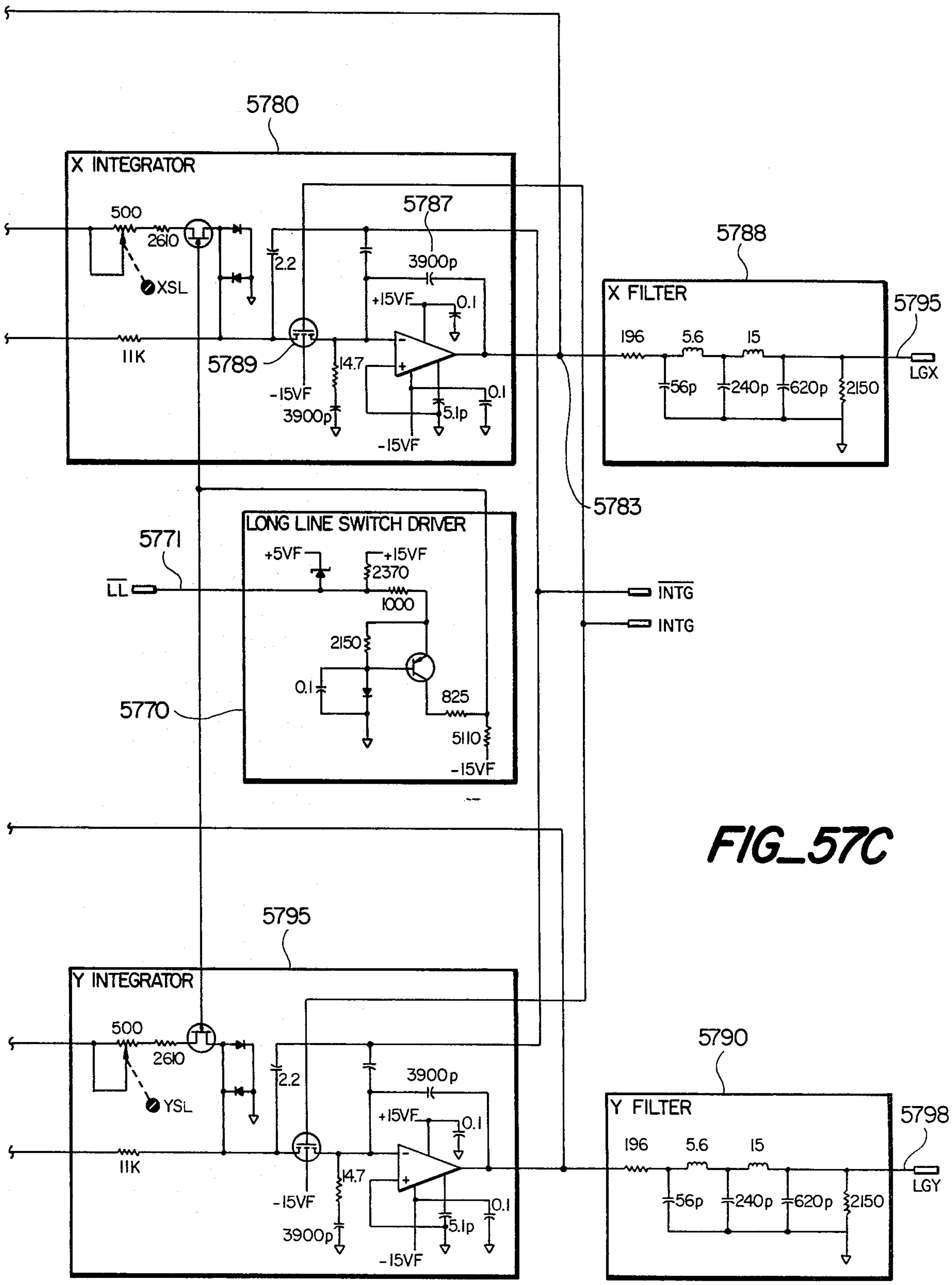
FIG_57C

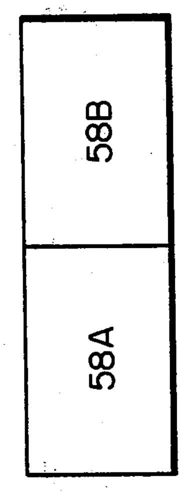
FIG_58

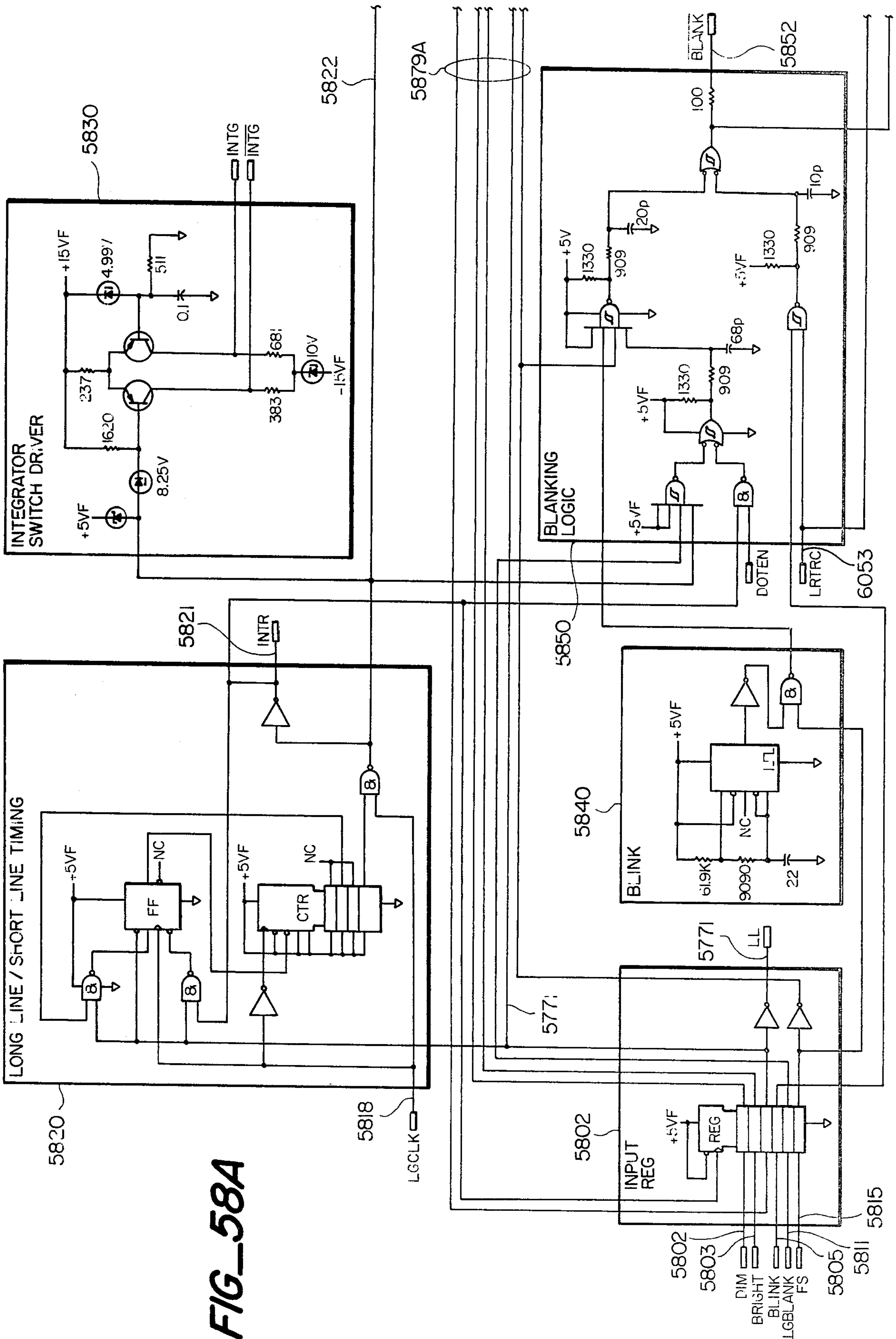
FIG_58A

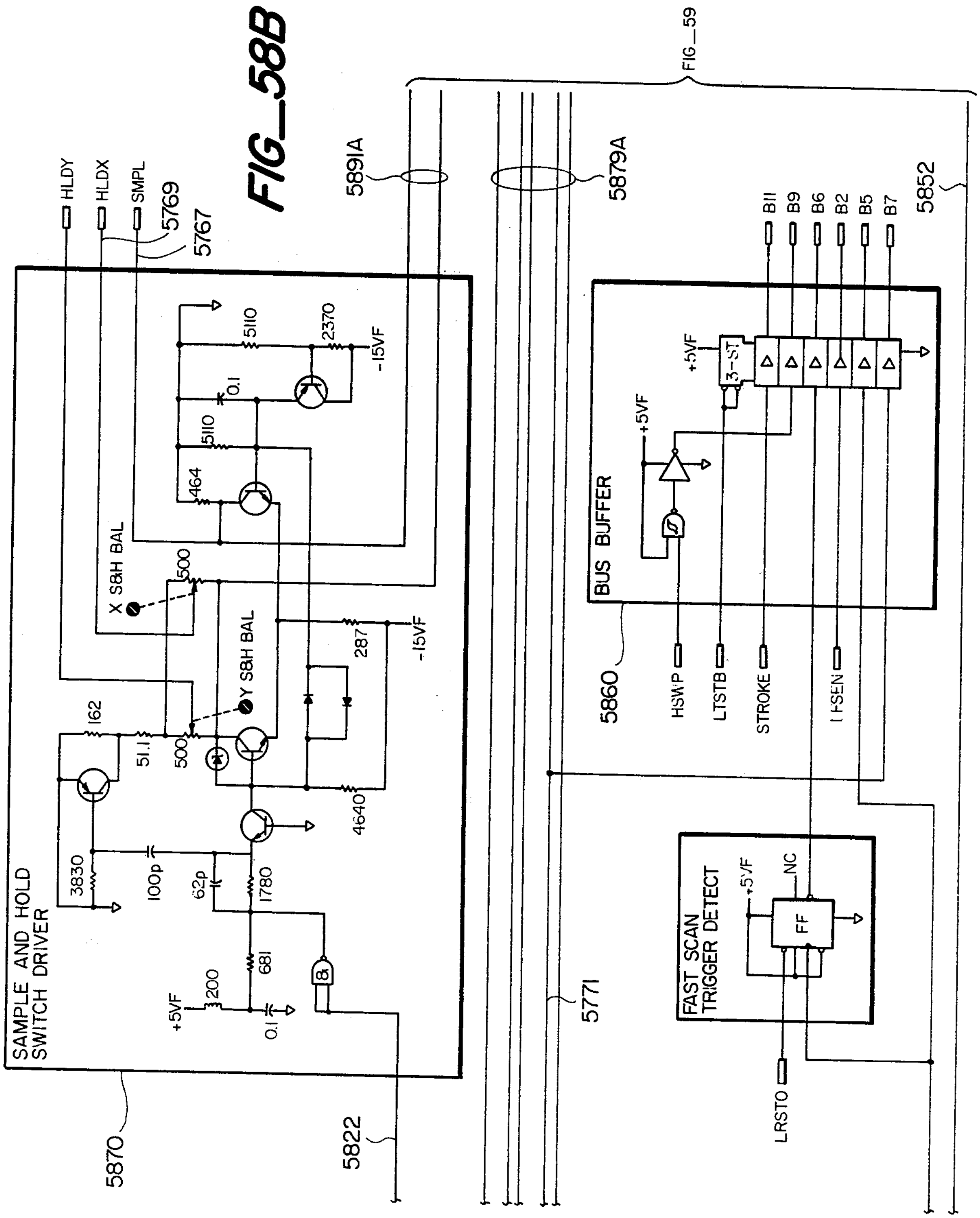
FIG_58B
FIG_59
HLDY
HLDX
SMPL
5769
5767
5891A
5879A
5852
SAMPLE AND HOLD SWITCH DRIVER
X S&H BAL
Y S&H BAL
5110
2370
-15VF
0.1
464
500
162
51.1
287
3830
100p
62p
1780
681
200
+5VF
4640
5870
5822
5771
BUS BUFFER
3-ST
B11
B9
B6
B2
B5
B7
5860
HSWP
LTSTB
STROKE
LFSEN
FAST SCAN TRIGGER DETECT
FF
NC
LRSTO

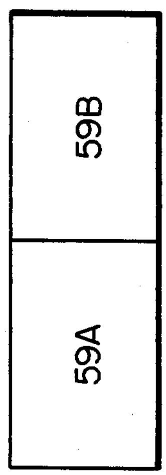
FIG_59

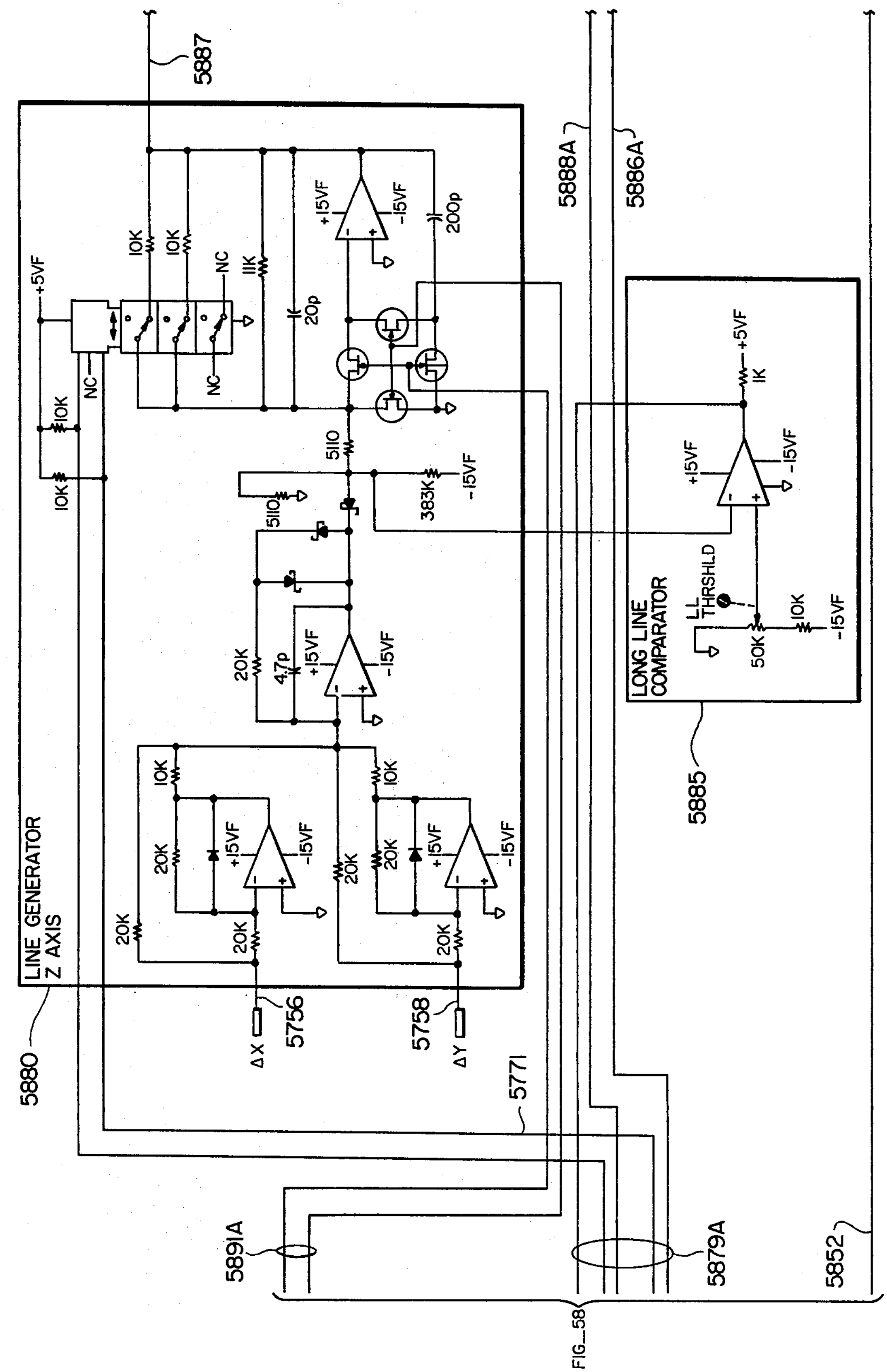
FIG_59A

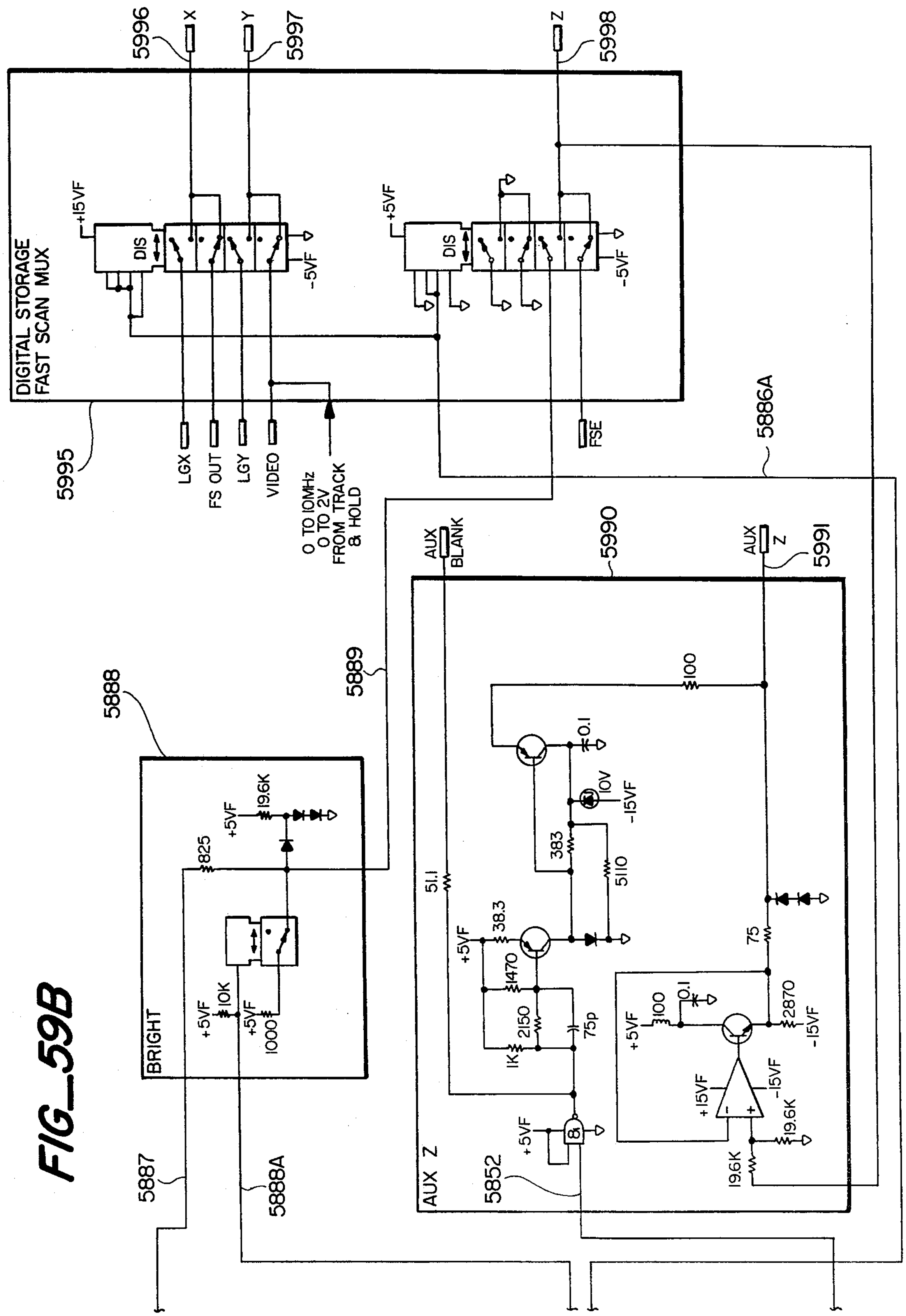
FIG_59B

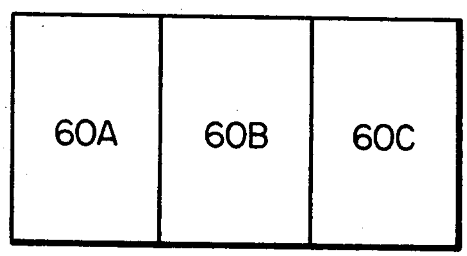
FIG_60

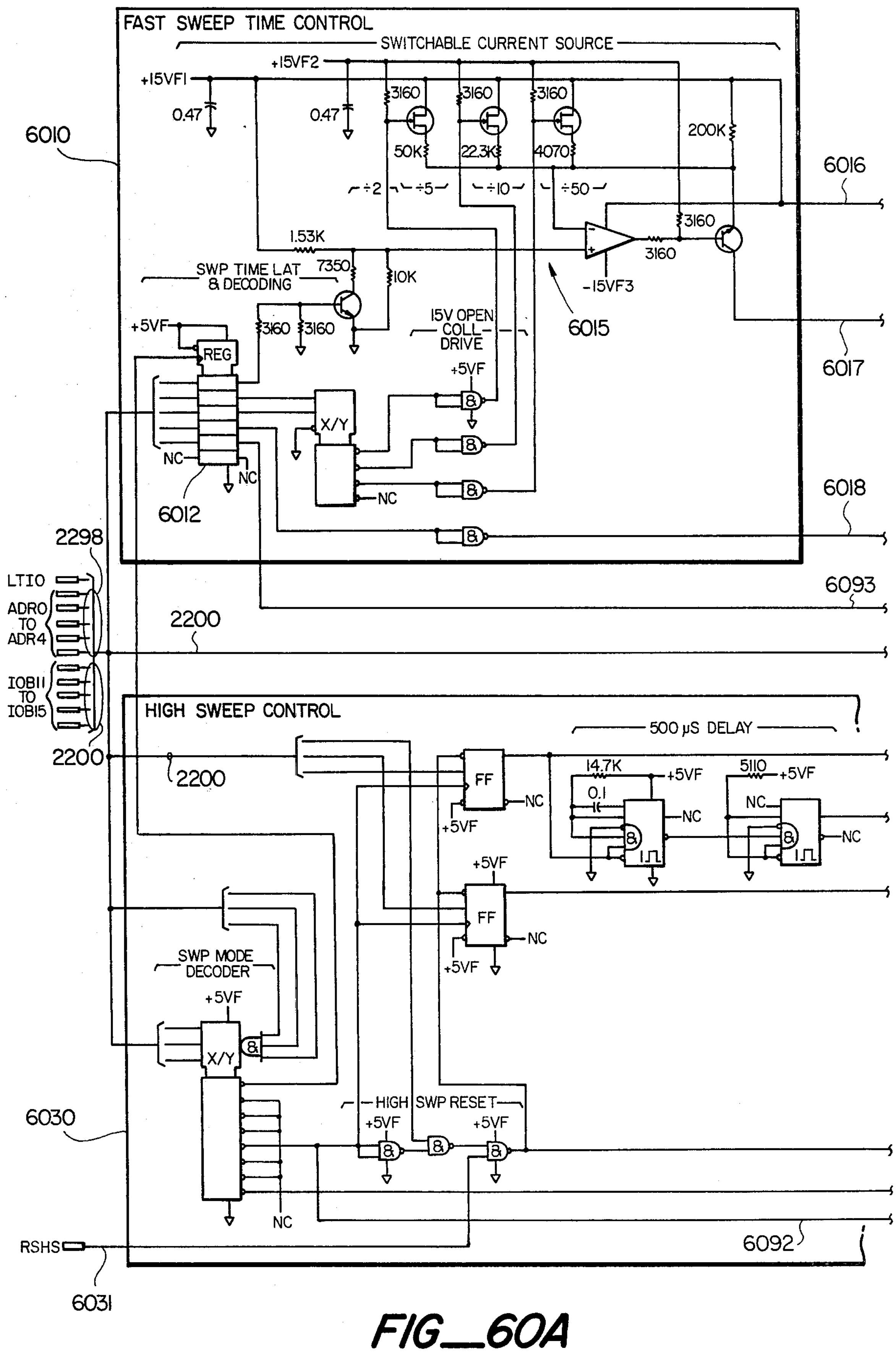
FIG_60A

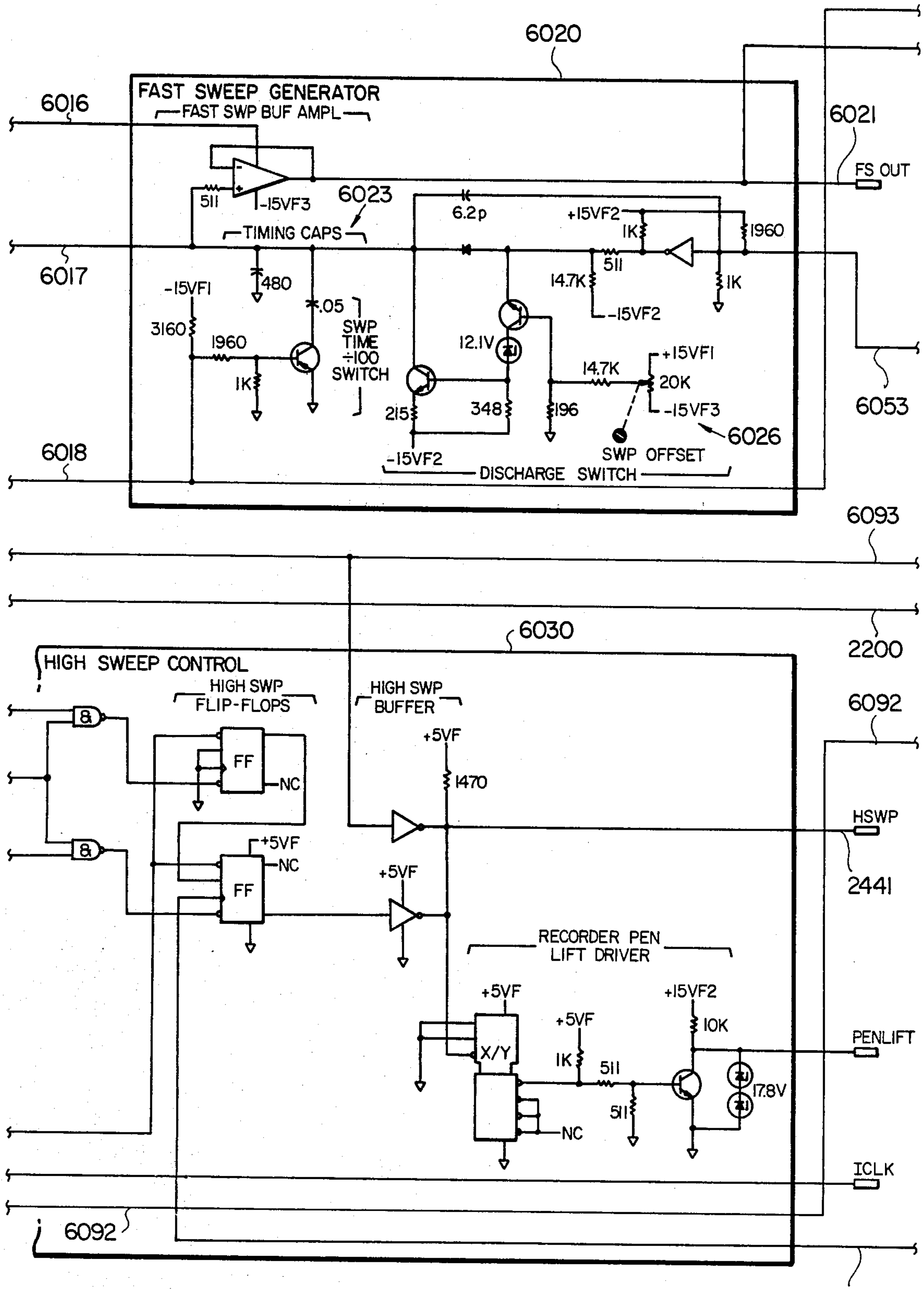
FIG_60B

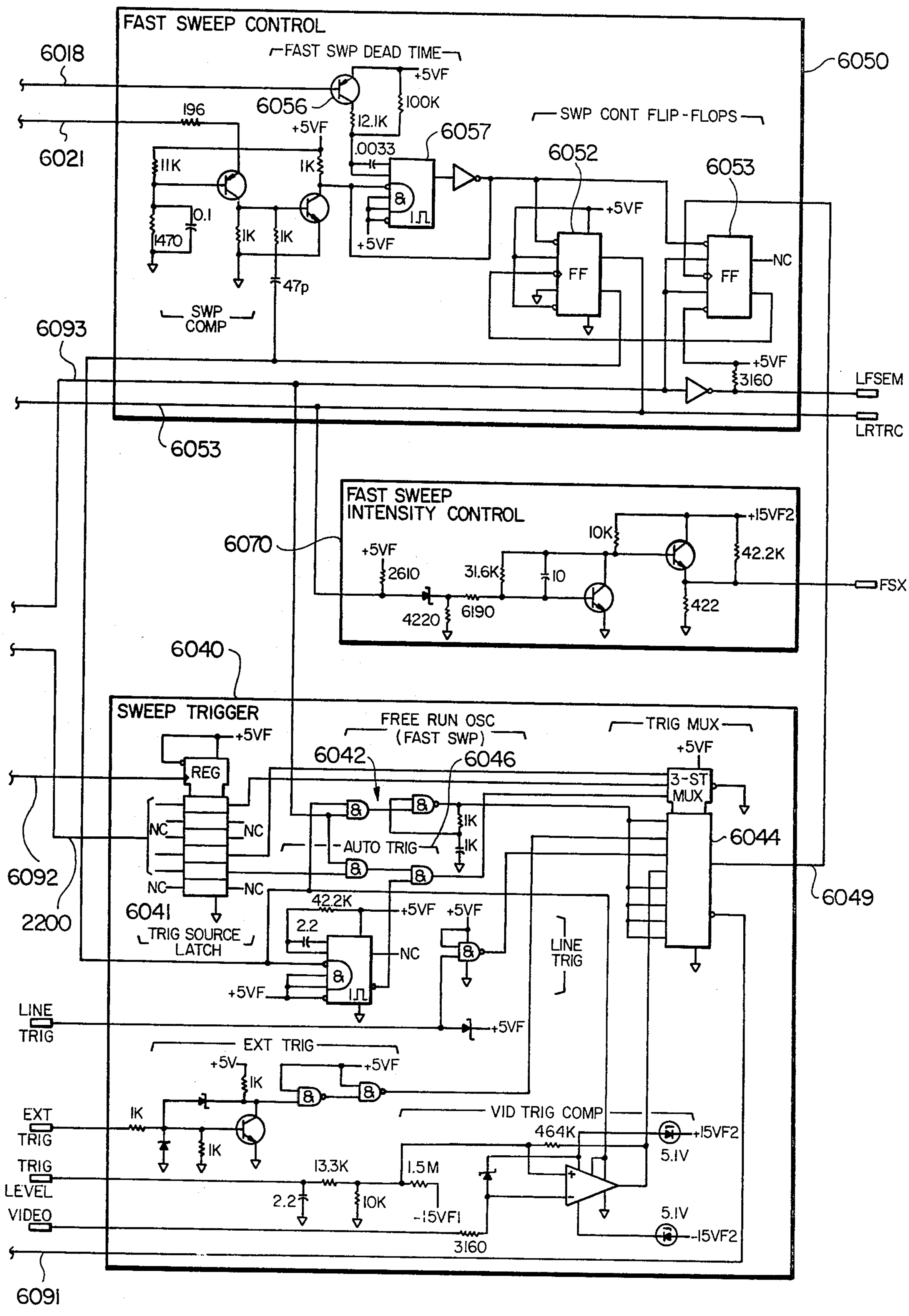
FIG_60C

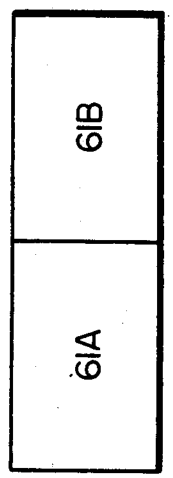
FIG._61

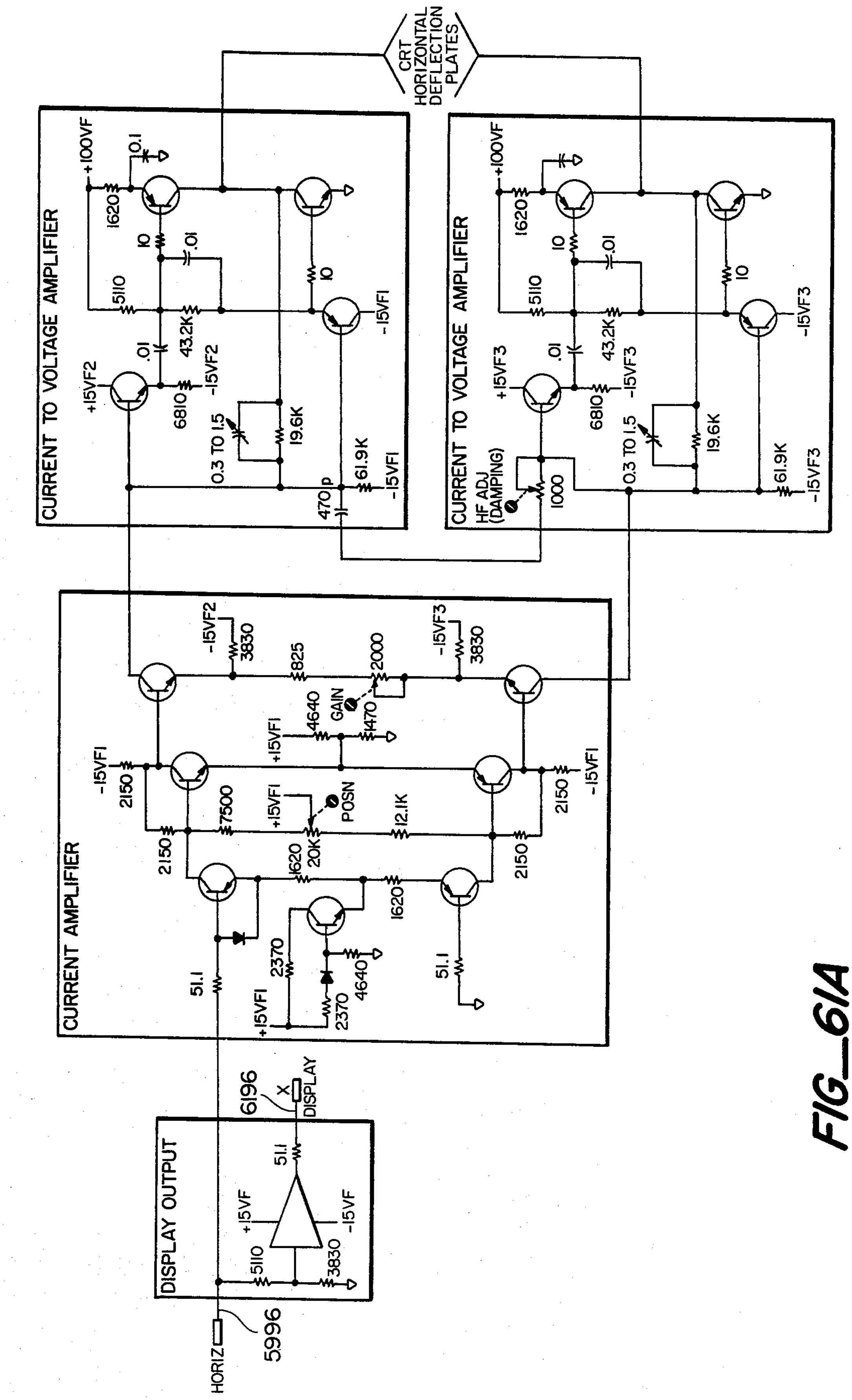
FIG_61A

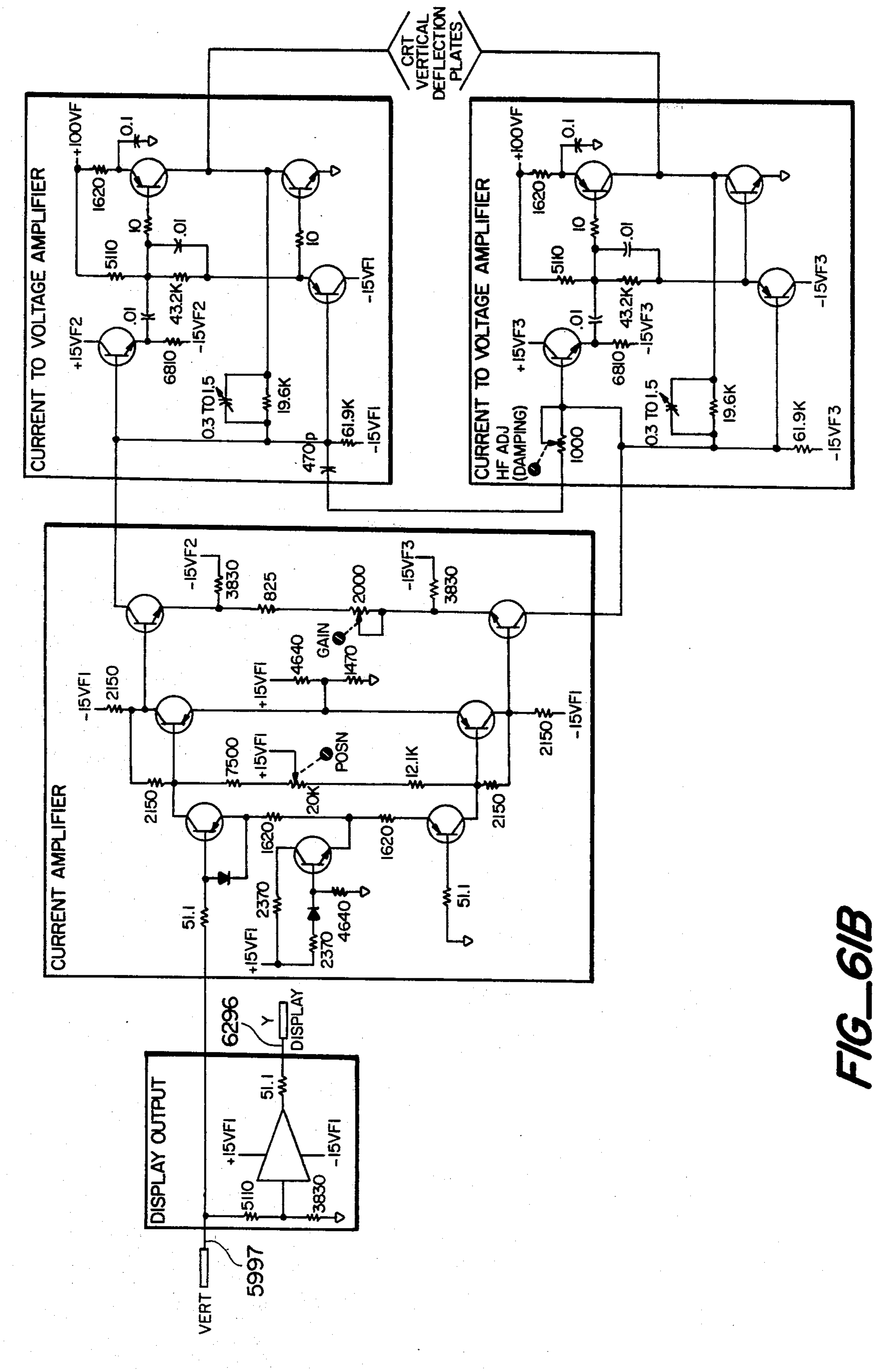
FIG_61B

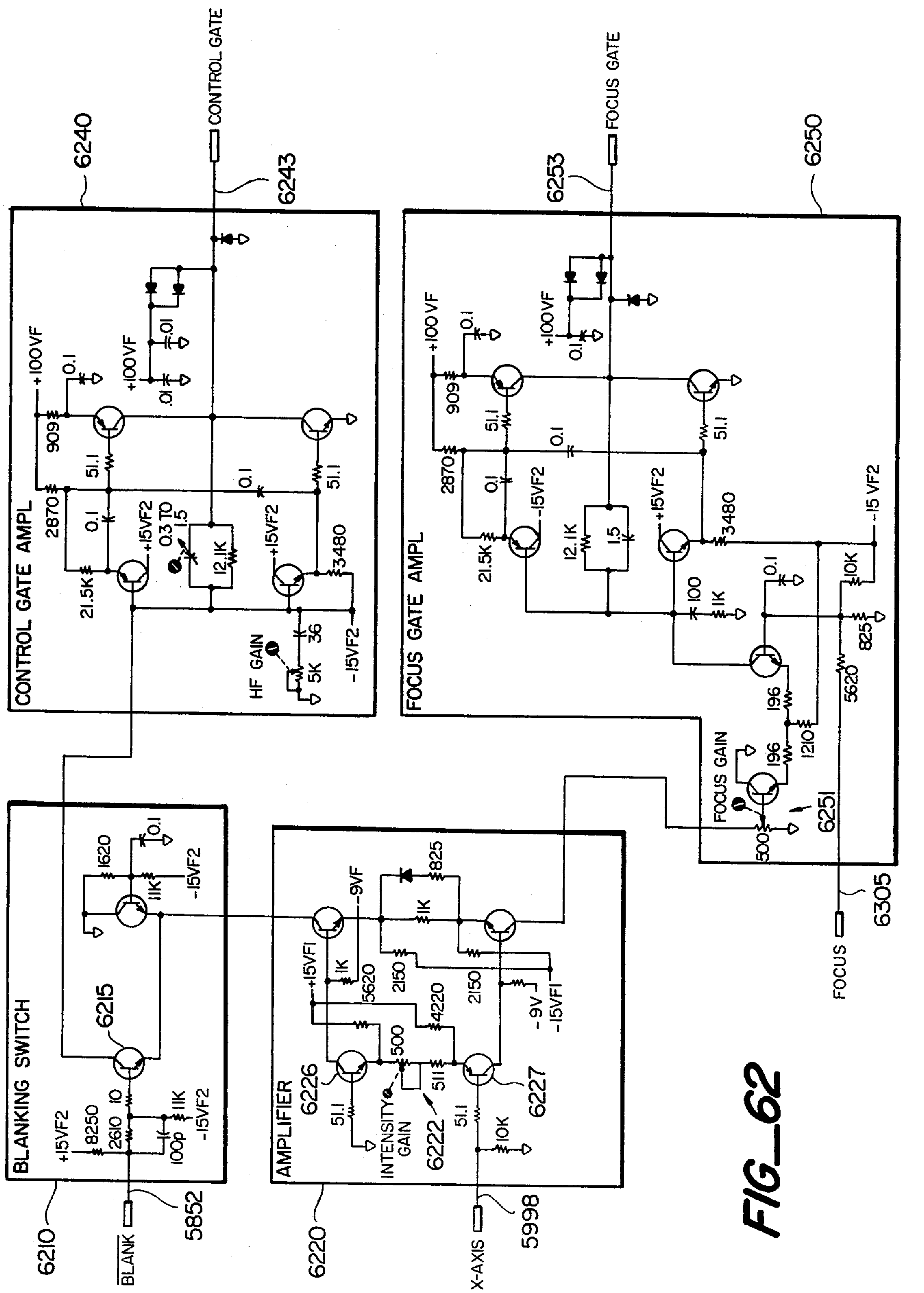
FIG_62

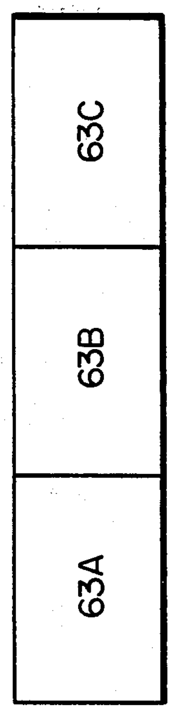
FIG_63

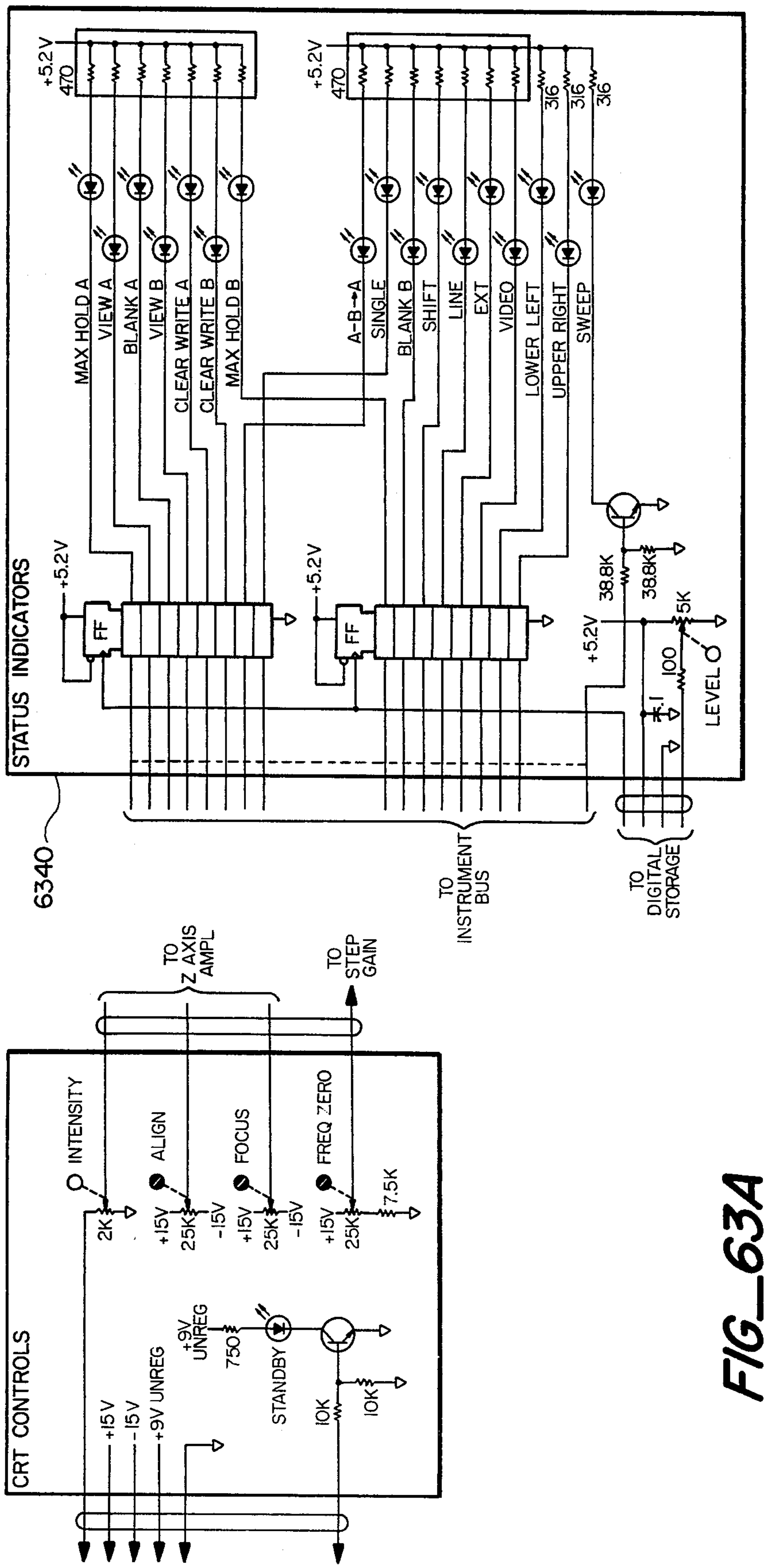
FIG_63A

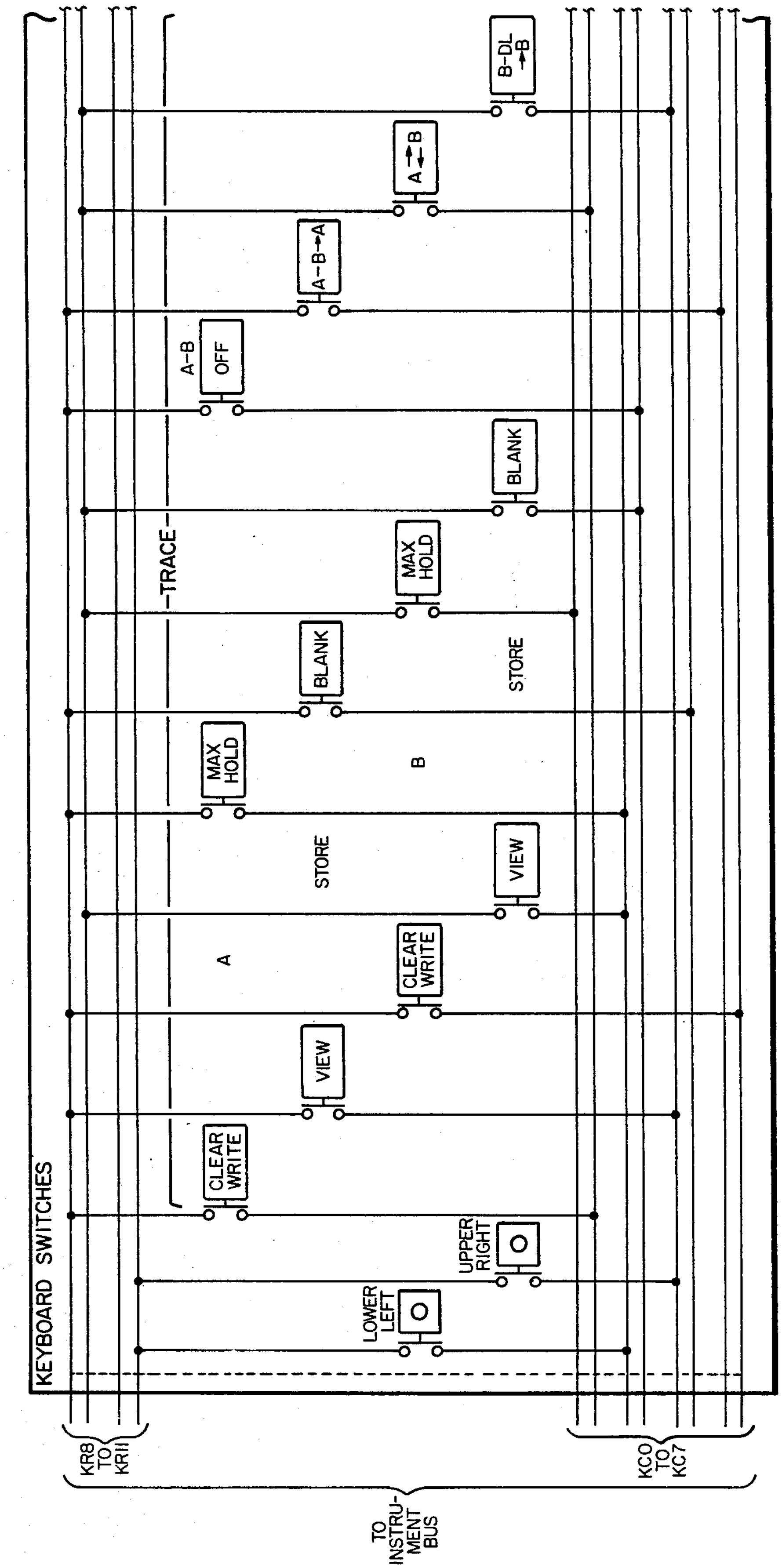
FIG_63B

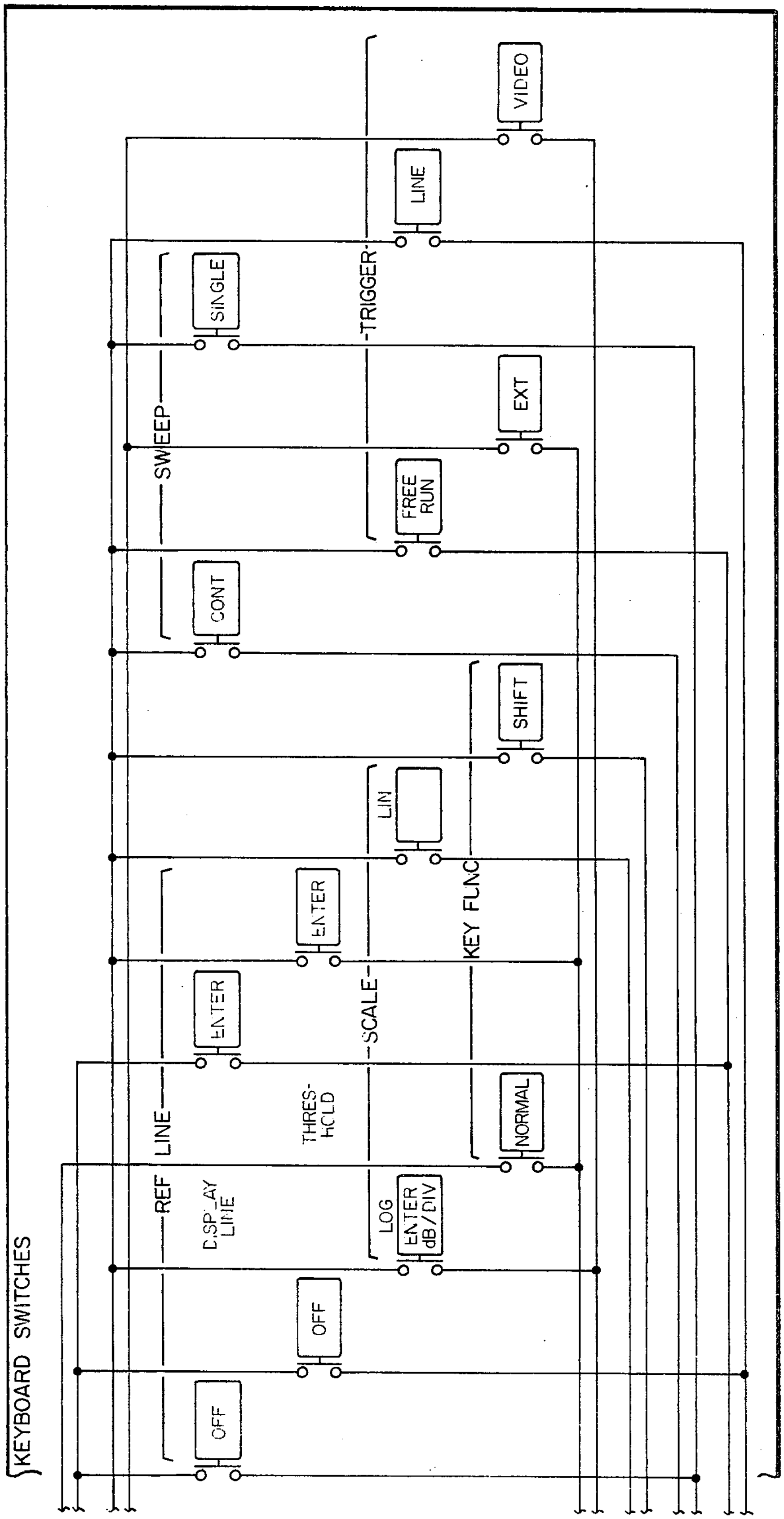
FIG_63C

SPECTRUM ANALYZER WITH PARAMETER UPDATING FROM A DISPLAY MARKER

BACKGROUND AND SUMMARY OF THE INVENTION

Spectrum Analyzers produce a display of amplitude vs. frequency of an input signal over a user settable frequency range. Typically, the user sets a center frequency and the unit scans over a predetermined band around the center frequency. Also, an amplitude reference is selected.

In previous spectrum analyzers, measurements of different relevant points on the displayed output was difficult to obtain accurately. In contrast, the preferred embodiment of the present invention provides a moveable marker which may be positioned on and moved along the displayed waveform. The frequency and amplitude at the present position of the marker is displayed and updated as the marker is moved. This moveable relative marker may also be used to facilitate the calculation of frequency and amplitude difference between any two selected points on the display. The marker is positioned on a first point. In response to a control button, a second marker is also provided at that point. This second marker image is then moved to the second measurement point. The difference in frequency and amplitude between these two relative positions is read out directly on the display screen itself.

The amplitude and frequency values at the marker position may be used to adjust various parameters in the machine. For example, the marker may be moved to a point on the display and that point may then be entered as a new center frequency, or it may become the amplitude reference level, or it may become the time interval for center frequency stepping, or using both markers, the interval between them may become the span-width for the entire display, i.e., the two marked positions become the start and stop frequencies.

In previous spectrum analyzers, it was difficult to select a particular portion of the displayed signal and then expand about that point as the center frequency. In the preferred embodiment, the marker may be positioned at any signal point, and using step-up and step-down keys, the frequency span-width about that point may be reduced or expanded.

To maintain the selected signal in the center of the display in previous spectrum analyzers, it was necessary to continuously tune the center frequency to coincide with the desired signal to be viewed as the center frequency. In the preferred embodiment, at the end of each scan, the marker may be positioned to coincide with the peak of the signal then being displayed. The frequency of this peak signal is then set to the center frequency, i.e., the center frequency is set to the value of the peak signal. This eliminates the need to reposition the marker as the scale is expanded since minor inaccuracies in positioning the marker are corrected during each expansion of the display. Therefore, as the span is reduced, the signal will remain in the center of the display. Also, if the signal is drifting, this feature will maintain the signal on the screen despite the drift.

Prior spectrum analyzers using rotating controls such as potentiometers and other tuning knobs have typically had fixed sensitivities for changing the control parameter in response to a rotation of the same magnitude, since the sensitivity of these controls was usually designed to accommodate the medium range positions. Therefore, the controls would be too sensitive to comfortably tune the lower bands and would move too slowly when tuning over larger bands. Prior spectrum analyzers have used multiple knobs or complicated clutch mechanisms with gear drives to overcome this problem. In contrast, the preferred embodiment; the sensitivity of the rotating control is controlled by the span-width selected, hence, regardless of the frequency range being displayed, a single rotation will still move the marker or other parameters being displayed the same distance across the display.

Previous spectrum analyzers used rotary controls having detent positions or continuously variable tuning. Each function on the spectrum analyzer was assigned either a detent rotary switch or a continuously variable switch. This had the disadvantage that this was not the optimum mode of entry for values for the most convenient way to enter values into the machine. In contrast in the preferred embodiment, a triple entry mode for data input is provided. Using this system, the parameter to be acted upon, e.g., the center frequency, frequency span, the start or stop frequency, etc. is selected, then the value is entered via a keyboard, step-up and step-down keys, or a rotary tuning control. This has the advantage that one may select the most convenient way to enter values for the mode he is operating in. The rotary knob is most useful when tuning or searching for a signal or specific frequency. The step-up and step-down keys are most convenient when one is progressing forward or backward through a limited set of even increments over a range. Of course, the keyboard is most useful for entering the desired value when the exact parameter is known.

In prior spectrum analyzers, if the input signal was preceded by a preamp, a down converter, an up converter, etc., it was necessary to calculate the actual frequency and amplitude for the signal of interest. In contrast the preferred embodiment provides enterable offsets whereby the frequency or amplitude levels can be offset a predetermined amount to calibrate them to take into account the presence of the intervening circuit element.

Also, previous spectrum analyzers were limited to entering a center frequency and span values. In contrast, the preferred embodiment enables the user to input a start and stop frequency and the center frequency and span are automatically determined. In addition, one may enter a new start or stop frequency to increase or decrease the span without having to calculate a center frequency for the band of interest.

In a spectrum analyzer with a digital display, i.e., where the display is produced in response to data representing a discrete number of sampled points, there is the problem that there may not be enough sample points to properly describe the analog signal. The real solutions would be to increase the sampling rate and the number of points displayed, but this is costly and not practical. Other solutions are compromises which sacrifice some information in order to preserve that information which is most useful for spectrum analysis. The preferred embodiment ensures the display of the most important parameter, i.e., correct signal amplitude. It is obtained from a peak detector which precedes the A/D converter. The peak detector holds the max. signal which occurs between samples for the A/D. After sampling the peak detector output, the peak detector is re-set to the input signal level. Thus, no signal peak is lost. Also, the preferred embodiment employs both a positive and negative peak detector circuit to allow a better presentation of signal noise, i.e., give an indication of the amplitude and frequency excursions in the noise signal.

BRIEF DESCRIPTION OF THE DRAWINGS

FIG. 1 is a simple block diagram of the preferred embodiment.

FIG. 2 shows the front panel controls of the preferred embodiment.

FIG. 3 illustrates a typical waveform display in the preferred embodiment.

FIG. 4 illustrates the waveform of the preferred embodiment with the marker in use.

FIG. 5 illustrates the amplitude and frequency difference readouts using the relative marker technique of the preferred embodiment.

FIGS. 6, 7 and 8 illustrate the display which is produced when a frequency or amplitude offset is used.

FIG. 9 illustrates the various active function readouts provided by the preferred embodiment.

FIG. 10 illustrates the X and Y coordinate system used in the display of the preferred embodiment.

FIG. 11 illustrates the display waveforms present when all three traces available in the preferred embodiment are displayed simultaneously.

FIG. 12 is a block diagram of the sweep and refresh operations of the preferred embodiment.

FIG. 13 illustrates the use of the basic marker mode.

FIGS. 14A and 14B illustrate the reading of frequency and amplitude levels of displayed signals using the marker.

FIGS. 15A and 15B illustrate the differential marker technique of the preferred embodiment.

FIGS. 16A, 16B, 16C, 16D and 16E illustrate the marker zoom feature of the preferred embodiment.

FIGS. 17A and 17B illustrate an example of the automatic marker zoom feature of the preferred embodiment.

FIGS. 18A and 18B illustrate the use of the marker and the center frequency control to bring a signal of interest to the center of the display.

FIGS. 19A, 19B and 19C illustrate the changing of the center frequency by selecting start and stop frequencies using the markers.

FIGS. 19C, 19D and 19E illustrate the technique whereby the center frequency may be changed in increments equal to the frequency difference between the two marker positions.

FIG. 19F illustrates the use of the signal tracking feature of the preferred embodiment.

FIGS. 19F and 19G illustrate the signal tracking feature of the preferred embodiment.

FIG. 20 illustrates the relationship of FIGS. 20A and 20B.

FIGS. 20A and 20B taken together are a detailed block diagram of the preferred embodiment.

FIG. 21 illustrates the relationhip of FIGS. 21A, 21B and 21C.

FIGS. 21A, 21B and 21C taken together are a circuit diagram of the front panel of the preferred embodiment.

FIG. 22 illustrates the relationship of FIGS. 22A, 22B, 22C, and 22D.

FIGS. 22A, 22B, 22C and 22D taken together illustrate the interface circuitry for the RF section to the processor 2015 of the preferred embodiment.

FIG. 24 illustrates the relationship of FIGS. 24A and 24B.

FIGS. 24A and 24B taken together are a schematic diagram of the frequency control circuitry of the preferred embodiment.

FIG. 25 is a block diagram illustrating the relationship of the YTO, the YTO phase lock circuitry, and other circuits within the preferred embodiment.

FIG. 26 illustrates the relationship of FIGS. 26A and 26B.

FIGS. 26A and 26B taken together are a schematic diagram of the phase lock circuitry of the preferred embodiment.

FIG. 27 shows the relationship of FIGS. 27A and 27B.

FIGS. 27A and 27B taken together are a schematic diagram of the RF converter circuitry of the preferred embodiment.

FIG. 28 is a schematic diagram of the second IF amplifier of the preferred embodiment.

FIG. 29 is a schematic diagram of the third converter circuitry of the preferred embodiment.

FIG. 30 is a schematic diagram of the pilot second IF amplifier of the preferred embodiment.

FIG. 31 is a schematic diagram of the pilot third converter circuitry of the preferred embodiment.

FIG. 32 shows the relationship of FIGS. 32A and 32B.

FIGS. 32A and 32B taken together are a schematic diagram of the 275 MHz phase lock circuitry of the preferred embodiment.

FIG. 34 shows the relationship of FIGS. 34A and 34B.

FIGS. 34A and 34B taken together are a schematic diagram of the 275 MHz phase lock oscillator of the preferred embodiment.

FIG. 35 shows the relationship of FIGS. 35A and 35B.

FIGS. 35A and 35B taken together are a schematic diagram of the 50 MHz voltage tuned oscillator of the preferred embodiment.

FIG. 36 shows the relationship of FIGS. 36A, 36B and 36C.

FIGS. 36A, 36B and 36C taken together are a schematic diagram of the frequency counter circuitry of the preferred embodiment.

FIG. 37 shows the relationship of FIGS. 37A and 37B.

FIGS. 37A and 37B taken together are a schematic diagram of the 249 MHz phase lock circuit of the preferred embodiment.

FIG. 38 shows the relationship of FIGS. 38A, 38B, 38C and 38D.

FIGS. 38A, 38B, 38C and 38D taken together are a schematic diagram of the processor used in the preferred embodiment.

FIG. 39 is a simplified block diagram of the processor used in the preferred embodiment.

FIG. 40 shows the relationship of FIGS. 40A, 40B and 40C.

FIGS. 40A, 40B and 40C taken together are a schematic diagram of the bandwidth filter circuitry of the preferred embodiment.

FIG. 41 shows the relationship of FIGS. 41A and 41B.

FIGS. 41A and 41B taken together are a schematic diagram of the IF control circuitry of the preferred embodiment.

FIG. 42 shows the relationship of FIGS. 42A and 42B.

FIGS. 42A and 42B taken together are a schematic diagram of the log amplifier and filter circuitry of the preferred embodiment.

FIG. 43 shows the relationship of FIGS. 43A and 43B.

FIGS. 43A and 43B taken together are a schematic diagram of the log amplifier and detector circuitry of the preferred embodiment.

FIG. 44 shows the relationship of FIGS. 44A and 44B.

FIGS. 44A and 44B taken together are a schematic diagram of the step gain circuitry of the preferred embodiment.

FIG. 46 shows the relationship of FIGS. 46A and 46B.

FIGS. 46A and 46B taken together are a schematic diagram of the attenuator bandwidth filter circuitry of the preferred embodiment.

FIG. 47 is a schematic diagram of the down converter circuitry of the preferred embodiment.

FIG. 48 is a schematic diagram of the up converter circuitry of the preferred embodiment.

FIG. 49A is a block diagram of the video processing system of the preferred embodiment.

FIGS. 49B, 49C-1-49D-4 and 49D show the waveform improvement obtained using the video processing system of the preferred embodiment.

FIG. 50 shows the relationship of FIGS. 50A and 50B.

FIGS. 50A and 50B taken together are a schematic diagram of the video processor circuitry of the preferred embodiment.

FIG. 51A and 51B taken together are a schematic diagram of the A/D converter circuitry of the preferred embodiment.

FIG. 52 shows the relationship of FIGS. 52A, 52B and 52C.

FIGS. 52A, 52B and 52C taken together are a schematic diagram of the track and hold circuitry of the preferred embodiment.

FIG. 53 shows the relationship of FIGS. 53A, 53B and 53C.

FIGS. 53A, 53B and 53C taken together are a schematic diagram of the data manipulator circuitry of the preferred embodiment.

FIG. 54 shows the relationship of FIGS. 54A, 54B and 54C.

FIGS. 54A, 54B and 54C taken together are a schematic diagram of the memory main control circuitry of the preferred embodiment.

FIG. 55 shows the relationship of FIGS. 55A and 55B.

FIGS. 55A and 55B taken together are a schematic diagram of the memory interface circuitry of the preferred embodiment.

FIG. 56 shows the relationship of FIGS. 56A, 56B and 56C.

FIGS. 56A, 56B and 56C taken together are a schematic diagram of the memory used in the preferred embodiment.

FIG. 57 shows the relationship of FIGS. 57A, 57B and 57C.

FIGS. 57A, 57B and 57C taken together are a schematic diagram of the line generator circuitry of the preferred embodiment.

FIG. 58 shows the relationship of FIGS. 58A and 58B.

FIG. 59 shows the relationship of FIGS. 59A and 59B.

FIGS. 58A, 58B, 59A and 59B taken together are a schematic diagram of the intensity control circuits of the preferred embodiment.

FIG. 60 shows the relationship of FIGS. 60A, 60B and 60C.

FIGS. 60A, 60B and 60C taken together are a schematic diagram of the sweep and video trigger circuits of the preferred embodiment.

FIG. 61 comprised of FIGS. 61A and 61B is a schematic diagram of the Y deflection amplifier of the preferred embodiment.

FIG. 62 is a schematic diagram of the X deflection amplifier of the preferred embodiment.

FIG. 63 comprised of 63A, 63B and 63C taken together are a schematic diagram of the status indicators and CRT controls of the preferred embodiment.

DESCRIPTION OF THE PREFERRED EMBODIMENT

Description of Basic Block Diagram

Figure 23A:
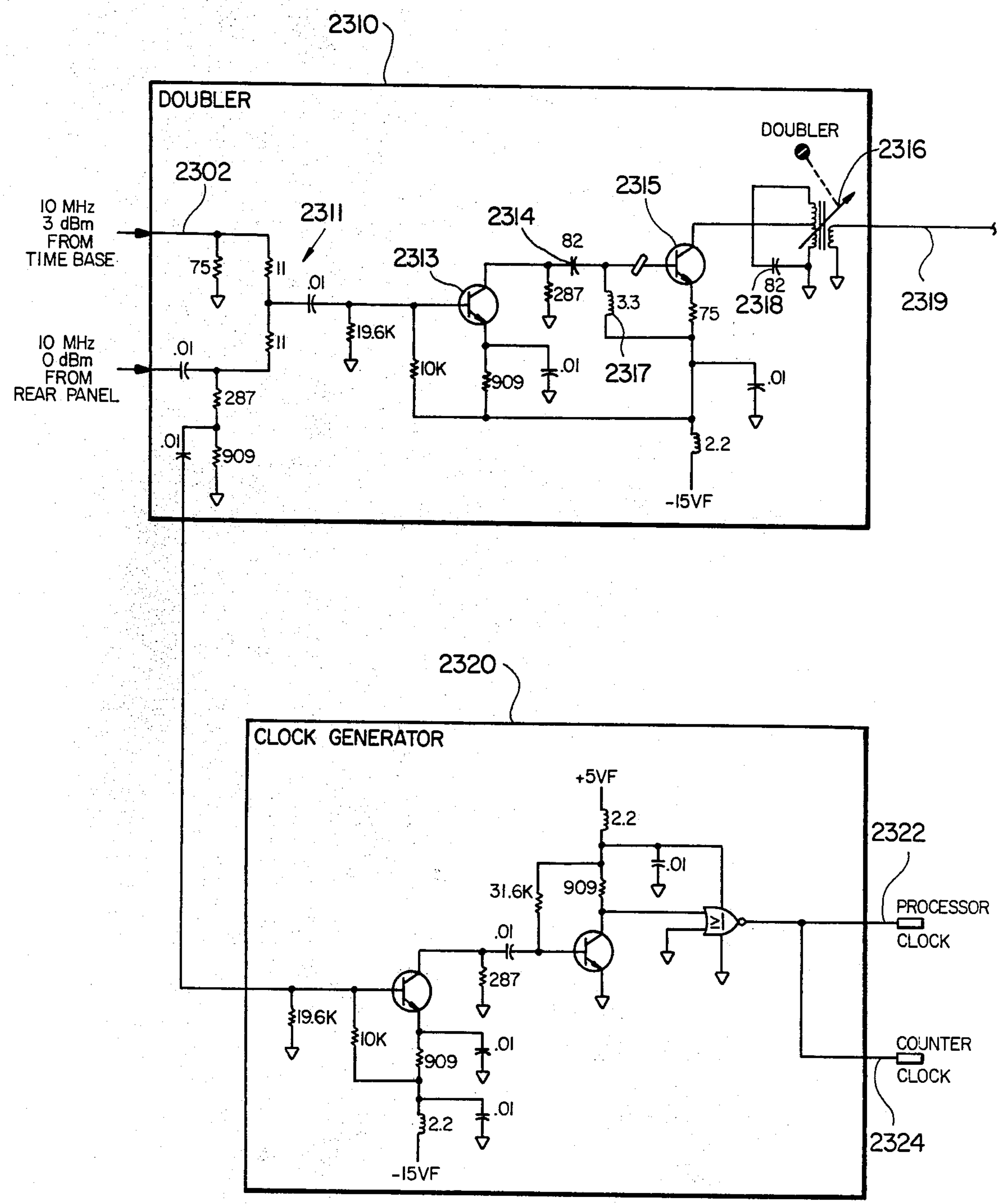
FIG. 23 is a schematic diagram of the 20 MHz reference circuit of the preferred embodiment.

Referring to FIG. 1, there is shown a block diagram of the preferred embodiment. An input signal on line 102 is input to a mixer 104. The signal on line 102 is mixed with the output signals on line 106 from local oscillators 108 to produce intermediate frequency (IF) signals on line 105. These IF signals are then amplified and filtered by IF amplifiers 109. Local oscillators 108 are controlled by tuning control circuits 112 and scan control circuit 114. The output signals from IF amplifiers 109 are input to a detector 111 which generates a video signal on line 123. Under the control of video processor 125 and display controller 135, the output signal is digitized and stored in random access memory 140. The signal on line 115 from scanner 114 is used to determine the address where the digitized values are stored. Other data stored in memory 140 includes special trace constants, display annotations, the graticule, the display marker, and miscellaneous constants and values for other special functions.

The rate of acquisition of the data is controlled by the ramp time of the signal produced by scanner 114. Each ramp is logically divided into 1,000 intervals corresponding to the 1,000 addresses. Likewise, the display screen is divided into 1,000 steps from left to right, each address being one point on the display screen.

The display of the data occurs at a rate determined by display controller 135. Under control of the display controller 135, the data is read out of memory 140 to D to A converter 150 which provides an analog level input to line generator 155 whose output is then coupled to the Y plates on CRT 175. At the same time that display controller 135 is reading the vertical data from memory 140, the horizontal corresponding to the address from which the data came is generated by D to A 160 and output to line generator 165 which is coupled to the X or horizontal plates of CRT 175.

Special display features and input data from front panel 210 are provided over a bus 190. This transfer of data from the front panel 210 to display controller 135 is under the control of the main control processor 250 which has its own ROM 251 and RAM 252 memories.

Activation of keys on front panel 210 which is shown more fully in FIGS. 2 and 63 are serviced by an interrupt type routine which interrogates the front panel to determine what operations have been selected. Once the operation which is selected has been determined, a microprogram corresponding to the operation selected and stored in ROM 251 is executed to perform that operation. Typically, this involves the transfer of data from the main processor to the display controller 135 which operates as a "slave" controller. Slave or display controller 135 then performs the necessary calculations or manipulation of data stored in memory 140 to change the display.

Description of the Front Panel Controls

Referring now to FIG. 2, there is shown the front panel controls of the preferred embodiment. Using the front panel controls shown, the user has convenient control over functions such as center frequency, frequency span, reference level, resolution bandwidth, and sweep time. For example, center frequency is controlled by a switch 260, frequency span is controlled by a switch 262, the start frequency is controlled by a switch 264, the stop frequency is controlled by a switch 266, and the reference level is controlled by a switch 268. Once a function is selected, its value can be changed by using the data control keys 314, 318, 310 and 300. For example, using data keyboard 300, one can enter an exact digital value. Using rotary control 310, one has continuous tuning capability. While using switches 314 and 318, one may change the value of the active function in steps. The changes in values and conditions which are input will also immediately cause the appropriate change in the displayed waveform on display 400.

Basically, the front panel controls are divided into two groups, i.e., function controls and data controls. The type of measurement of the signals input via channels 425 may be selected using the function controls. The data controls and the other miscellaneous functions provided add to the measurement efficiency, convenience and capability of the instrument.

To measure the frequency and amplitude of a signal input via input controls 425, the signal is first moved to the center of display 400 by pressing center frequency control 260 and then rotating rotary control 310 until the part of the signal waveform which is desired to be measured is centered in the display. When the signal is centered, the readout on display 400 will automatically display the signal frequency at positions 451 and 452 as shown in FIG. 3.

For better frequency resolution the frequency span of the display may be narrowed by pressing frequency span control 262 and then pressing step down control 314. The new span value would be displayed in position 453 as shown in FIG. 3. The signal peak would then be brought to the reference level by activating reference level switch 268, control 314 and then adjusting rotary control 310.

The most convenient place to start a new measurement is with a full 1500 MHz frequency span. This is most easily accomplished by pressing instrument preset control 230. This automatically presets all the analyzer functions to a 0 Hz to 1500 MHz display with a 0 dBm reference level. In this way, the entire 1500 MHz span possible with the preferred embodiment may be viewed to facilitate selection of the particular frequency range to investigate.

Signal frequencies and amplitudes as well as differences between various signals can be read out directly using the marker controls 380 and the various data controls described above. The marker is activated by pressing marker normal switch 381. The rotary control knob 310 is then used to position the marker 410 as shown in FIG. 4. The amplitude and frequency of the signal at the marker position are read out continuously at position 412. Therefore, as one moves the marker along the signal waveform by moving rotary control 310, the MHz and dBm displays are continuously updated.

Using this feature of the preferred embodiment it is possible to measure the differences between any two points on the displayed waveform. For example, if the marker was at position 410 and one measured the difference between the marker position 410 as shown in FIG. 4 and the next signal peak, 411, one would press marker control button 382 and use rotary control 310 to move the second marker to peak 411. The amplitude and frequency differences are then read out continuously in position 415 as shown in FIG. 5. More measurement techniques using the marker are discussed in more detail below.

The data controls are used to both enter and change function values for the selected function. Rotary control 310 and the data step keys 314 and 318 are used to make incremental changes to the value of the activated function. To the right of the function keys 390 is the data keyboard 300 which allows the stored value to be changed or an exact value input. Furthermore, these data controls change the activated function value in a manner which depends on the specific function selected and the current value of that function. For example, if the center frequency function has been selected by center frequency switch 260, the center frequency can be changed continuously with rotary control 310 or in steps proportional to the frequency span with the data step keys 314 and 318, or set exactly with the data number units keyboard 300. Resolution bandwidth can be set only to discrete values. An entry from the keyboard which may not coincide with an allowable bandwidth will select the nearest bandwidth. All data entries are displayed on the CRT as they are changed.

If it is desired to prevent data entry, the function can be deactivated by pressing hold switch 320. The active function readout is then blanked and the enabled light 321 goes out, indicating that no data entry can be made. The reenabling of the data controls is accomplished by pressing any function key.

Rotary data control 310 allows the continuous change of center frequency, frequency span, reference level, and the positions of the market, display line and threshold. It can also change the function values which are only incremented. Clockwise rotation of the rotary control 310 will increase the functional value. For continuous changes, the sensitivity of rotary control 310 is determined by both the measurement range and the speed at which the knob is turned. For example, when the center frequency is activated, control knob 310 increases the value of the center frequency one horizontal division of span per one quarter turn.

Data step keys 314 and 318 allow rapid increase or decrease of the active function value. The step size is dependent either upon the analyzers measurements range, a preset amount, or, for those parameters with fixed values, the next value in a sequence. For example, if center frequency control 260 has been activated, step control 318 will increase the center frequency value by an amount equal to one division of the frequency span, i.e., 1/10 of the frequency span. If the center frequency step size has been preset using control 228, step control 318 will inxcrease the center frequency by that preset amount. If the frequency span function was selected using control 262, step control 314 would change the span to the next lower value in predetermined sequence. If the center frequency is selected, each press of these step buttons results in a single step up or down of the center frequency value equal to the preselected value of 10% or to a preselected step value which has been stored using control 228.

The data keyboard 300 allows exact value entries to center frequency, frequency span, reference level, log scale and the positions of the markers, the display line, threshhold and the coupled functions. Coupled functions are those in which selection of one parameter will automatically select certain values for other parameters. This operation occurs whenever machine is in the auto mode as selected by controls 210, 214, 218, 222 and 226. This function can be disabled by placing these controls in the manual position. Function control 268 changes the absolute amplitude level of the top graticule line. The amplitude scale, i.e., the number of amplitude units per division is entered from the scale control group 225. Signal responses below the top graticule are measured by bringing the response to the reference level by activating switch 268. The maximum reference level value available is dependent on the input attenuator setting. Levels to the input mixer which could cause gain compression will be displayed off the top of the reference level graticule. The maximum reference level limit can be extended by activating shift control switch 410 and attenuate control switch 223. The reference level can be changed from +30 dBm to −99.9 dBm in 0.1 dB steps. Reference level dBm units are selected by instrument preset control 230 or with key function shift control 410. Reference level units may be read in dBmV, dBuV and volts. Of course, when a unit change is made, all readouts are converted so as to preserve the absolute power levels of all the readouts on the display.

The display readout of frequency and amplitude can be offset by values entered through using shift control key 410. The offset values are read out on the display. An offset frequency is entered by pressing shift control key 410, center frequency key 260 and then inputting the desired value via the data entry controls. An amplitude offset is entered by pressing shift control key 410, reference level control 268, and then inputting the desired amplitude offset via the data entry controls, i.e., keyboard 300. The amplitude offset can be used to take into effect external R.F. attenuation or gain in the reference level reading so that the signal level measured is the level at the input of the amplitude conversion device which is interposed between the spectrum analyzer and the signal source. For example, frequency offsets can be input such that when the spectrum analyzer of the preferred embodiment is used following a down converter, the frequency parameters can be entered and read out in actual, i.e., high frequency values. In the reverse situation, when an external preamplifier is used, its gain or loss may be taken into account to display the true signal level of the signal of interest before the preamplifier stage. Frequency offset is entered by activating shaft control 410 followed by center frequency 260, and then inputting the desired frequency offset via data entry controls 300, 310, 314 and 318. This frequency offset may be used, for example, to provide a base band frequency display scale for a signal which has been converted up or down. Amplitude offset is entered by activating shift key 410 followed by reference level control 268 and then inputting the desired amplitude offset via data keyboard 300, rotary control 310 and/or step control keys 314 and 318. This amplitude offset can be used to take into effect external R.F. attenuation or gain in the reference level reading so that the signal measurement corresponds to the level at the input of the amplitude conversion device.

To eliminate a frequency offset, one simply activates shift control 410, followed by center frequency control 260, and then inputs a data offset value of zero. Also, any frequency or amplitude offset can be eliminated by pressing instrument preset control 230. The frequency or amplitude offset is added to all the frequency or amplitude readouts, respectively, on the CRT display including the marker, the display line, threshhold, and the start frequency and stop frequency values which are displayed.

Data entry from the keyboard may be in Hz, kHz, MHz or GHz for frequency and dBm, −dBm, mV and uV for amplitude. The amplitude offset readout is always in dB. An entry in voltage can be made and will be converted to dB offset. Least significant digits are rounded for frequency inputs and dropped for amplitude offset entries. An example of the display which is produced when a frequency or amplitude offset is used in the preferred embodiment is shown in FIG. 6. Note that the amplitude offset is displayed in position 610 while the frequency offset is displayed in positions 611 and 612.

For example, assume that a 102.6 MHz up converter with 12.7 dB attenuation is placed between a signal source and the preferred embodiment. The offsets can be set so that the CRT display shows the trace reference to the signal as input to the converter. Amplitude offset is entered as a positive value since the amplitude readout must represent a more powerful signal. To enter the offset value in this example, one would press shift control key 410, reference level control 268 and enter 12.7 on data entry keyboard 300 followed by +dBm units key 601. The offset is displayed in position 610 as shown in FIg. 7.

Frequency offset is entered as a negative, since the input to the converter is lower than the value displayed. To enter a frequency offset one would press shift control key 410, followed by hold key 320, followed by center frequency control 390, and then input 102.6 on data entry keyboard 300, followed by MHz units key 602. The frequency offset would be displayed in position 618 on the display and the new value for the center frequency would be displayed in position 619, as shown in FIg. 8.

Referring now to FIG. 9 there is shown the display of the preferred embodiment. The entire frequency span being analyzed is displayed across the norizontal width of the display, the start frequency occurring at the left-most edge 905 of the display while the stop frequency occurs at the right-most edge 907 of the display. The center frequency is represented by the center vertical line 911 in the middle of the display. Various function readouts are provided to help interpret the waveform 915 which is being displayed. For example, the reference level is displayed in position 917. Marker frequency and amplitude are displayed in position 922 whenever a marker option is selected. Sweep time is displayed in position 925. The start frequency or the center frequency are displayed in position 927, depending upon which function is active, while the stop frequency or frequency span is displayed in position 929, depending upon which function has been selected.

There is also an active function readout for the function which is under current data control. In FIG. 9, the start frequency has been selected to be changed via keyboard 300, rotary control 310 or step control buttons 314 and 318. Therefore, the word start is displayed in position 931. The start frequency was selected by start frequency control switch 264. Similarly, if the center frequency control 260, reference level control 268, stop frequency 266 or frequency span 262 were selected, the display would so indicate in position 931. If the marker functions 380 were selected, the marker frequency and amplitude would be displayed in this position. This display of the frequency and/or amplitude will change dynamically with the manipulation of the data controls.

The full scale sweep speed is indicated in position 925. The video bandwidth is displayed in position 935. The resolution bandwidth is displayed in position 936. The RF attenuation is displayed in position 940 while if the measurement is uncalibrated, this will be indicated in position 945. The threshhold level is displayed in position 950, while the display line parameters are displayed in position 951 and the amplitude offset value is displayed in position 952. It should be noted that the displayed parameters shown in FIG. 9 are not necessarily always displayed together. For example, the measurement uncalibrated message shown in position 945 would only be present if the measurement were uncalibrated. Furthermore, the active function and value in position 931 would depend upon the function selected by the function control keys 390.

DISPLAY TRACES

Three separate traces referred to as Trace A, Trace B and Trace C can be written onto the display. Each trace is generated from 1,001 points across the graticule, connected by 1,000 point-to-point straight line vectors. The location of each point is designated by an X and a Y location using the graticule as a system of rectangular coordinates. This may be more clearly shown in FIG. 10. In addition, a trace overrange area which is also calibrated is provided which comprises an additional 23 display units above the top reference level graticule.

Trace controls 1,000 as shown in FIG. 2, may be used for controlling the writing, storing and manipulating of trace data. The three different traces are differentiated by their intensity. Trace A is bright, while Trace B and Trace C are comparatively dimmer. However, when there is any doubt, the specific trace can be isolated using view control 1010, blank control 1011, view control 1012 and blank control 1013.

Four mutually exclusive trace modes for Traces A and B determine the manner in which the traces are displayed. Indicator lights such as indicator 1003 indicate the current trace mode. Clear-Write control 1001 causes the display of the input signal response in Trace A. Max hold control 1002 causes the display and holding of the maximum responses of the input signal in Trace A. Both these controls are referred to as write mode controls, since they deal with the trace during a sweeping operation.

Store mode controls such as view control 1010 and blank control 1011 act on the trace information when the preferred embodiment is not in the sweeping mode. The view controls such as view control 1010 causes the storing of the current trace information in memory and displays it on the CRT. The blank controls such as blank control 1011 causes the storing of the current trace information and blanks it from the CRT display. An illustration of the display when all three traces are present is shown in FIG. 11.

TRACE MEMORY

Display traces are not written onto the display directly from the spectrum analyzers IF section. Instead, the analog signal response from the IF section is converted into digital words and stored in a trace memory. The contents of these trace memories is then used to create the display on the CRT display. The way in which this information in the trace memories is displayed depends upon the trace mode selected by trace controls 1,000. A block diagram showing these steps is shown in FIG. 12. The analyzers response is transferred into the trace memories at the sweep rate of the analyzer, i.e., its sweep time. The trace memory is then written onto the display at a refresh rate of about 50 Hz, rapid enough to prevent flickering of the trace on the CRT display. This refresh rate remains constant and therefore, the trace intensities also remain constant, regardless of how the sweep times of the spectrum analyzer are changed. Note that in the specification the word sweep refers to the spectrum analyzer sweeping from a start frequency to a stop frequency while the term refresh refers to the transfer of display memory data to the display.

For the write modes, those selected using the clear write and max hold controls 1001, 1002, 1008 and 1009, the analyzer signal response is written into trace memory during the sweep and the memory contents are then immediately displayed on the CRT. When first activated, the clear write controls of the 1001 and 1008 sets all the values in their respective trace memory to zero, i.e., the trace will sweep along the bottom line graticule if no data is input to the memory. The max hold controls 1002 and 1009 cause the latest analyzer signal response to be written into its respective trace memory only at those data words that correspond to the horizontal positions where the latest signal response is greater than the previously stored signal response values. When both clear write controls 1001 and 1008 are activated, the preferred embodiment will sweep and alternately write into trace memories A and B. Using the store mode controls 1010, 1011, 1012 and 1013, the previous memory data is saved, and no updating of the trace memory is made. The view controls 1010 and 1012 cause the trace data stored in their respective memories to be displayed on the CRT. Blank controls 1011 and 1013 cause the trace data not to be displayed on the CRT.

MARKER

There are two basic types of functions which are possible using the marker. Marker modes under the control of controls 381, 382, 383, 384, 385 and 386 are used to enable or disable the markers and their related functions. Marker entry controls 387, 388, 389 and 379 are used to allow the scaling of the display frequency and amplitude using the marker information.

The term markers is used in the preferred embodiment to refer to bright spots which are created directly on the display trace. The horizontal position of an activated marker is controlled by the data controls, i.e., keyboard 300, rotary control 310 and step keys 314 and 318. Using these controls, the marker can be positioned at a specific frequency with the data keyboard moved along the trace using rotary control 310 or caused to move along the trace in predetermined intervals using the step control keys 314 and 318. The readout of the marker amplitude and frequency, i.e., the amplitude and frequency of the trace where the marker is currently located, appears in the upper right of the display outisde the graticule. This is as shown in FIG. 13 in position 1301.

When a marker mode is active through the use of controls 381, 382, 383, 384 and 385, the amplitude and frequency will also be displayed in the active function area of the graticule, that is, position 931.

Briefly, the marker controls operate as follows: Control 386 is used to turn the marker function on and off. Normal control 381 causes the direct readout of the amplitude and frequency of the point where the marker is along the trace. To cause the direct readout of the amplitude and frequency differences between two points on the trace, one activates control 382. The present position of the marker on the trace when this control is activated then becomes the reference point for subsequent measurements as the marker is moved along the trace.

An activated marker mode can be deactivated by activating another function such as display line or by data hold control 320. This does not erase the marker itself, nor does it suspend the upper right display readout features. When the marker mode is reactivated, the data controls and active function readouts will simply continue from their last position.

Normal control 381 activates a single marker at the center of the display on the trace of highest priority if multiple traces are being displayed. Trace priority is defined in greater detail below. Once the marker is displayed on the trace, it may be moved along the trace by using the date entry controls 310, 314, 318 and the data entry keyboard 300. Rotation of rotary control 310 moves the marker continuously along the displayed trace at about five horizontal divisions for each full turn. The marker appears to move smoothly along the trace, but it is actually moving in the smallest display unit increments which in the preferred embodiment are 1,000 units for the full horizontal span. Step controls 314 and 318 move the marker along the trace one-tenth of the total width per step. In the preferred embodiment, step control 314 moves the marker to the left while step control 318 moves the marker to the right. For exact positioning of the marker, values entered via keyboard 300 will cause the marker to be placed at the frequency entered. If one enters a frequency which is out of range of the displayed span, the marker will be placed at the graticule edge.

The marker greatly simplifies reading the frequencies and amplitudes of displayed signals. This is explained with respect to FIGS. 14A and 14B. For a given display, the single marker is activated by pressing normal control 381. This causes the frequency and amplitude information to be read out in display areas 1402 and 1403. Assume, for example, that one was interested in determining the frequency and amplitude of the signal peaks 1404 and 1405. To read the frequency and amplitude values at peak 1405, one would move rotary control 310 to move the marker along the waveform until it was positioned at signal peak 1405 as shown in FIG. 14A. To read the information for signal peak 1404, one would move the rotary control 310 counter-clockwise until the marker 1400 was positioned at peak 1404 on waveform 1410. The frequency and amplitude information is read out continuously as the marker is moved. Therefore, as the marker is moved towards the peak, one can be sure when the peak is reached because it will be the highest amplitude displayed in display areas 1402 and 1403. As one moves the marker to either side of the peak of the signal waveform of interest, the amplitude reading would decrease. Thus, exact positioning of the marker is possible.

The differential marker technique using control 382 may be used to measure differences in frequency and amplitude between two points on the signal waveform. Activating control 382 causes a second marker to be generated at the position of the single marker already on the trace. If no single marker has been activated, control 382 will cause two markers to be generated at the center of the display. The first markers position is fixed. The second markers position, however, may be changed using the data controls 310, 314, 318 and keyboard 300. As the second marker is moved along the waveform, the first marker now stationary is used as a reference point. As the second marker is moved along the trace, the difference in frequency and amplitude between that markers position and the reference marker will be displayed in positions 1402 and 1403. An example showing the use of this differential marker technique is shown with respect to FIGS. 15A and 15B.

Referring now to FIG. 15A, assume that one is interested in determining the frequency and amplitude differential between the signal peak 1502 and the signal peak 1503. First, the marker would be set on one of the signal peaks, e.g., signal peak 1502 as shown, by using rotary control 310. Control 382 would then be activated to generate a second marker at this position.

Rotary control 310 would then be moved in the clockwise direction to move the second marker to peak 1503. The differences in the frequency and amplitude at the two signal peaks will then be read directly on the marker display in position 1402. In the example shown in FIG. 15B, the frequency difference is 7.67 MHz and −34.60 dB. As the marker is moved, the display in position 1402 changes dynamically. In this way, one can be sure that one is positioned at the very peak of the signal waveform at point 1503, since it will be the smallest differential displayed as one crosses the peak at point 1503.

MARKER ZOOM

Control 383 activates a single marker on the trace of highest priority. When the zoom mode is selected by control 383, rotary control 310 and step control keys 314 and 318 change the values of different functions. Rotary control 310 is used to position the marker along the signal waveform. Step controls 314 and 318, however, change the frequency span displayed by the spectrum analyzer and cause the frequency at the current marker position to become the new center frequency for the display. Thus, one moves the marker along the trace with rotary control 310 until a portion of the display is reached which is desired to be the new center frequency. Also, one may press zoom control 383 and then enter in an exact frequency via data keyboard 300. This will cause the marker to be positioned at that exact frequency on the display waveform. If that frequency is not on the display waveform, then the marker will be positioned at the graticule border.

For example, in wide frequency spans, it is often necessary to expand a portion of the frequency span about a specific signal in order to resolve questions regarding modulation sidebands or frequency drift. The use of the marker zoom feature to facilitate the display of the desired waveform and the desired frequency span is shown below with reference to FIGS. 16A, 16B, 16C, 16D and 16E.

Referring now to FIG. 16A there is shown a full span display from zero Hz to 1500 MHz. A specific signal of interest is selected by activating zoom control 383 and using rotary control 310 to position the marker at a waveform peak 1601. To center the marker and the signal peak in the display and also expand the frequency span in one step, one would simply press step control 314 to achieve the display shown in FIG. 16B. For further expansion of the display about this signal, one could simply press step control 314 twice more to achieve the display shown in FIG. 16C. The marker could then be more accurately positioned at the signal peak using rotary control 310 to achieve the display shown in FIG. 16D. This recentering and expanding can be continued until the desired display is achieved. For example, one could continue expanding the display using step control 314 and recentering the marker using rotary control 310 until the display as shown in FIG. 16E was achieved. Note that the frequency span in FIG. 16E is from 257.39 MHz to 262.39 MHz with a center frequency at 259.890 MHz. As with the other marker functions, the marker mode may be disabled using control 386 which will also cause the marker readout to be blanked from the CRT display.

AUTOMATIC ZOOM

The preferred embodiment can automatically zoom in on a signal peak specified by a marker. The desired frequency span can be directly input via keyboard 300. To use this automatic zoom function of the preferred embodiment, one would press normal marker control 381 and position rotary control 310 to identify the signal to be zoomed in upon. Then one would press signal track control 385 followed by span control 262 and then the desired frequency span would be entered via data keyboard 300. When the selected units key, e.g., key 601, 602, 603 or 604, is activated, the zooming process will begin.

Referring now to FIG. 17A and 17B, there is shown an example using the zooming process. Assume that a single carrier needs to be examined in a 200 KHz span in order to see the side bands present. A marker would be placed on the carrier of interest by pressing normal control 381 and positioning the marker using rotary control 310. One would then press signal track control 385 followed by frequency span control 262. The value of the desired frequency span would be entered via keyboard 300 by pressing digit keys 2,0,0, and the units key for KHz. The auto zoom process would then be completed and a display as shown in FIG. 17B would be displayed.

PEAK SEARCH

Activation of peak search control 387 places a single marker at the highest trace position of the highest priority trace. The active function is not changed. Using this control, one may place the marker at the peak of the signal response without using any of the other controls. The marker seeks the maximum trace response.

MARKER ENTRY

Marker to center frequency control 388, marker to reference level control 379 and marker delta control 389 are used to immediately set the corresponding function value equal to the readout of the active marker or markers. When one presses control 388, the frequency at the current position of the marker automatically becomes the center frequency. Similarly pressing marker to reference level control 379 causes the amplitude at the current marker position to become the reference level value. Also, one may use the marker delta control 382 to place a second marker on the screen. Thereafter, control 389 may be used to cause the step size affected by step control 314 and 318 to be equal to the difference between the two marker positions.

One of the fastest and most convenient ways to bring a signal of interest to the center of the display as the center frequency is by using control 388. One simply activates a single marker by, e.g., control 318 and brings it to the desired signal using rotary control 310 or peak search control 387 if it is the largest signal displayed. The signal frequency where the marker is positioned may then become the center frequency by simply pressing control 388. The display before and after pressing of control 388 is shown with reference to FIGS. 18A and 18B, respectively. A single marker is activated and brought to the desired signal point by pressing control 381 to activate a single marker and then using rotary control 310 to bring it to the desired signal point, for example, as shown in FIG. 18A. Note that if this signal point is also the highest trace position on the highest priority trace, peak search control 387 may be used to place the marker at this position. Once a marker is positioned, the center frequency may be changed to the marker frequency by simply pressing control 388.

Control 388 may also be used to change the center frequency if start and stop frequencies are read out. In this way, the markers may be used to tune to a particular portion of a spectrum being displayed. This is shown with respect to FIGS. 19A, 19B, and 19C. A single marker is activated and placed at either end of the desired frequency span using control 381 and rotary control 310. For example, at point 1901 as shown in FIG. 19A, a second marker is activated using control 382 and positioned using rotary control 310. The start and stop frequencies for the displayed frequency span may then be set equal to the left and right marker frequencies, respectively, by shift control key 41 followed by control 382. The frequency difference between the two marker positions then automatically becomes the frequency span for the display.

The data step keys 314 and 318 can also be used to move the center frequency in increments equal to the marker or marker differential frequency. This is illustrated with respect to FIGS. 19C, 19D and 19E wherein there is shown a technique for viewing a fundamental and its harmonics or any other evenly spaced portion of the spectrum with high resolution. First, one would narrow the frequency span displayed about the fundamental frequency of interest as necessary using zoom control 383 as described above, centering the carrier frequency as needed. One then sets the center frequency step size by positioning the markers and pressing control 389. The center frequency is now enabled by pressing control 390. Therefore, with each press of step control key 318, successive harmonics will be displayed. For example, as shown in FIGS. 19D and 19E, the first activation of step control key 318 would show the second harmonic, the next press of step control key 318 would give the third harmonic, and so on. Similar stepping can be accomplished using the marker controls 382 and 389 and step control keys 314 and 318 to locate intermodulation products or other evenly spaced signals such as communication channels.

SIGNAL TRACKING USING AUTOMATIC FREQUENCY CONTROL

The preferred embodiment is capable of automatically maintaining a drifting signal at the center of the display. This allows narrow band measurements to be made on unlocked oscillators by having the spectrum analyzer track the input signal and allows other measurements which were heretofore extremely difficult.

To operate the signal tracking feature of the preferred embodiment, one would press normal control 381 and place the marker on the signal to be tracked with rotary control 310. Signal track control 385 is then pressed to initiate the tracking operation. As the signal drifts, the center frequency will automatically change to bring the signal and the marker to the center of the display. Marker off control 386 or activation of any other marker mode or instrument preset control 230 will disable the tracking function.

As an example of the use of this feature, there is shown in FIG. 19F a signal of interest. The upper sideband of the transmitter is to be monitored as the carrier frequency is tuned. Therefore, the marker is activated using normal control 381 and positioned using rotary control 310 at the peak of the upper sideband signal 2105. Once signal track control 385 is pressed, the upper carrier sideband 2105 is tracked and may be "zoomed" in to produce the display of FIG. 19G by pressing frequency span control 262 followed by digit keys 1 and 0 and units KHz key 603. As the carrier frequency changes, the sideband response will remain in the center of the display. The center frequency and marker frequency readouts on the display in positions 2120 and 2130, respectively, will read out the sideband's frequency. Therefore, a combination of the features of the preferred embodiment activated by a signal track control 385 and marker control 382 allows the real time signal frequency drift to be read on the display.

DETAILED BLOCK DIAGRAM

The detailed circuitry of the preferred embodiment will now be discussed in more detail. Referring first to FIGS. 20A and 20B, there is shown a detailed block diagram of the preferred embodiment. FIG. 20A is primarily a block diagram of the RF section, while FIG. 20B is primarily a block diagram of the IF and display section of the preferred embodiment. Much of the interaction of the circuitry of the preferred embodiment is controlled by a processor 2015 which is described later in more detail. This processor operates under the control of microprograms which are stored in a memory 2014. Operator commands are input via the front panel 2020. The signal to be analyzed is input on line 425 through the front panel controls to the RF converter 2023. There it is converted using the 20 MHz reference signal provided on line 2017 from 20 MHz reference 2016 or from the frequency control unit 2022. Signal thus produced is thereafter processed by the IF amplifiers 2019 or 2009 and converters 2020 and 2010. Pilot third local oscillator 2007 produces the precise frequency in the range 238.5 MHz that will allow the preferred embodiment to be tuned to frequencies between the 20 MHz reference combs. This processing results in the providing of a signal on line 2040 to the IF and display sections for further processing and an IF counter output signal on line 2042 as well as sweep signals on line 2044 and 2046 to the video processor 2060 and the track and hold circuitry 2065. Various filters and converters in the circuit 2050 act with IF control 2055, data manipulator and memory control 2058 to cause the digital representations of the sampled signal to be stored in memory 2070. Data manipulator and control circuit 2058 along with trigger circuitry 2072 determine the sweep rate and the trigger level. Representations of the analyzed signal are then displayed on cathode ray tube 2078.

Each one of these circuits shown in FIGS. 20A and 20B is described in more detail with respect to the detailed schematic diagram and the description below. The numbers in each block refer to the detailed schematic diagrams for the circuitry used in the preferred embodiment to perform the functions of that block.

Referring now to FIGS. 21A, 21B and 21C, there is shown the circuitry of the front panel of the preferred embodiment. In this schematic, various front panel push-button keys, switches, and indicator LEDs as well as the input terminals 425 for the signal to be analyzed are shown. Other switch circuitry is shown in FIG. 63. The input select circuit 2102 includes two push-button switches, each with an LED in its center, i.e., switches 2104 and 2105. When switch 2105 is energized, input relay 2110 selects the input through the DC input connector 2112 for frequencies from 100 Hz to 1.5 GHz. Activation of switch 2104 selects the input through the blocking capacitor 2111 for frequencies from 100 KHz to 1.5 GHz.

Referring now to FIGS. 22A, 22B, 22C and 22D, there is shown the interface circuitry for the RF section to the processor 2015 shown in FIG. 20A and to the front panel controls. The keyboard is organized as a matrix of rows and columns of normally open single pole, single throw switches. This keyboard matrix 2210 includes drivers 2212 and 2214 for driving the rows of the matrix while drivers 2206 and 2208 gate the columns of the matrix onto the data bus. The processor determines which key has been activated by selectively polling the rows and columns through drivers 2206, 2208, 2212 and 2214 and causing them to be selectively read onto the data bus 2200.

The fact that a key has been pressed is determined by gate 2215. The circuit which includes transistor 2216 is used to de-bounce the key switch circuitry. Flip-flop 2213 latches when a key is pressed and is cleared later by the processor.

The instrument preset key generates the signal on line 2220 which presets various circuitry in the preferred embodiment. Also, the instrument preset signal on line 2220 causes the main processor to restart program execution at memory address 32. Service request circuitry 2230 encodes the various requests for service made by the Front Panel circuitry to the main processor 2015.

For example, a signal on line 2231 is generated whenever the keyboard requires servicing, i.e., a key has been depressed. Similarly, the rotary pulse generator generates a request by providing a signal on line 2232. These requests are encoded by encoder 2236 and gated onto the data bus 2200 via gates 2238. Gates 2245A, 2245B, 2245C, 2245D detect any change in the signals HINT and LRMT on lines 2247 and 2248. Flip-flop 2249 is latched in response to detection of a change in their state. Transistor 2251 pulls the signal HSWP on line 2252 low whenever a request is pending. Whenever the signal HSWP drops to a low level, the flip-flop 2254 will be latched. Gates 2238 gate the encoded request onto data bus 2200. Gates 2238 also gate LHBZ, LZBZ and HINT onto the bus.

Rotary pulse generator circuit 2259 receives signals RPG1 and RPG2 on lines 2261 and 2262. From these two signals, the RPG circuit 2259 determines whether it should increment or decrement and the rate at which the incrementing or decrementing is to be done. For further description of this type of circuitry, refer to U.S. Pat. No. 4,016,432 issued on Apr. 5, 1977 to Michael S. Marzalek and entitled "Variable Rate Rotary Pulse Generator". The rotary pulse generator is coupled to the rotary control 310 on the front panel as shown in FIG. 2. Note that circuit 2263 provides a hold-off of about 70 milliseconds which prevents flip-flop 2265 from requesting a service request due to the rotation of rotary control 310 for that time period. This gives the preferred embodiment time to respond to the last service request from the rotary pulse generator and to continue or finish a sweep before the next request occurs. This enables the operator to have received visual feedback from the last manipulation of rotary control 310 before another input is acted upon.

Referring now to FIG. 22D, address decoder circuit 2285 decodes the address lines and enables the appropriate circuits to gate or store data onto data bus 2200. In FIG. 22C, phase-lock flag circuit 2280 provides signals or "flags" which indicate the presence or absence of certain preselected conditions in the preferred embodiment. The states of these flags are stored in register 2282 and may be read out onto data bus 2200 when desired through the enabling of the appropriate address decoder signal on a line 2283. Front panel LED drive circuit 2268 latches the state of the front panel LEDs (light emitting diodes) and sinks the current to light them. The signal LIPS clear these registers and causes the lighting of the LEDs anytime the instrument preset key 230 is pressed. RF attenuator drive circuit 2270 comprises register 2271 which latches the state of the RF attenuator at the input relay. Transistors 2272 and 2273 drive the input relay while transistors 2274A-E drive the RF attenuator. The bridge rectifiers 2275A, 2275B and 2275C act as transient suppressors for the RF attenuator solenoids.

Referring now to FIG. 23, there is shown the 20 MHz reference circuit of the preferred embodiment. A 10 MHz signal from a frequency standard is input via line 2302 and processed to provide 20 MHz reference signals to the front panel, the YIG-tuned oscillator phase-lock shown in FIG. 26, the 249 MHz phase-lock shown in FIG. 37, and the comb generator shown in FIG. 27A. During internal time base operation of the instrument, a 10 MHz signal is applied to doubler 2310 from time base circuit 2081. This signal is split by the resistor network 2311. Power is applied to the clock generator circuit 2320 and to the doubler buffer amplifier 2313. The 10 MHz signal input to the doubler is amplified by buffer 2313 and used to drive transistor amplifier 2315 through the impedance matching network comprising capacitor 2314 and inductor 2317. The output pulse produced from transistor 2315 is coupled into the 20 MHz resonator transformer 2316 and capacitor 2318 to produce the 20 MHz output signal on line 2319. The time base signal input on line 2302 is input to the clock generator circuit 2320 which provides a processor clock signal on line 2322 and a counter clock signal on line 2324.

The signal on line 2319 is input to crystal filter circuitry 2330 where it drives the emitter-follower circuit comprising transistor 2332 which in turn provides a low output impedance driver for the crystal filter. Center frequency adjustment 2334 is available to vary the center frequency of the filter. The filtered signal is amplified by the amplifier circuit comprising transistor 2335. Inductor 2336 and capacitor 2337 are used to match the impedance of PIN diode 2338. The current through the PIN diode 2338 sets the attenuation for the desired comb drive level for use in the comb generator circuitry described with respect to FIG. 27A.

A small amount of the comb drive signal is used by AGC amplifier circuitry 2340 to compare the drive level to a reference set by a comb drive adjustment 2342. Op amp 2345 compares the drive level on line 2346 to the reference level set via control 2342. The output from op amplifier 2345 is then set to bias PIN diode 2338 for a value of attenuation that will cause the rectified drive voltage to equal the reference voltage.

Indicator driver circuit 2360 compares the rectified drive voltage received via line 2368 with a fixed voltage. If the drive drops too low, op amp 2365 will turn on the NO REF LED.

Figure 33:
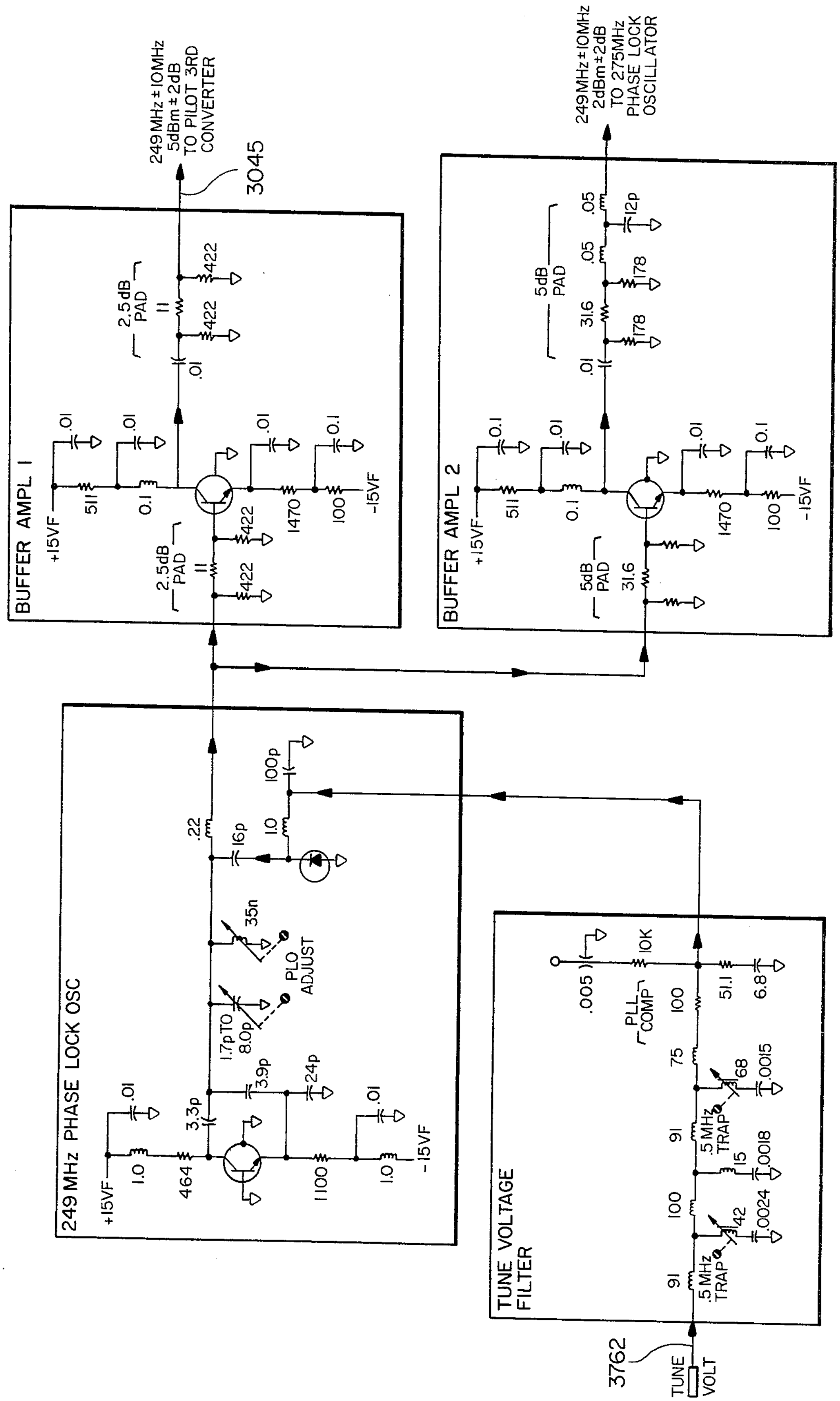
FIG. 33 is a schematic diagram of the 249 MHz phase lock oscillator of the preferred embodiment.

Buffer amplifier circuit 2350 receives a small amount of 20 MHz comb drive signal via line 2351. This circuit provides a 20 MHz, minus 15 dBm reference signal to the YIG-tuned oscillator phase lock circuit described with respect to FIG. 26 and a 20 MHz minus 10 dBm signal to the 249 MHz phase lock described with respect to FIG. 33. Also supplied is drive for calibrator circuit 2370.

The 20 MHz reference signal received from buffer amplifier 2350 is amplified by an emitter coupled pair 2371. This signal is clipped by the emitter coupled pair 2372 to set a precise level. The output then goes through a low pass filter 2376 to reduce the harmonic content.

Referring now to FIG. 24A and FIG. 24B, there is shown the frequency control circuitry of the preferred embodiment. This circuitry provides the tuning voltage to the 50 MHz voltage tuned oscillator (VTO) described with respect to FIG. 35, current to the YIG-tuned oscillator (YTO) described with respect to FIG. 26, sweep to the selected oscillator, and bias to the YTO. It also provides latching of data for the RF converter which is described with respect to FIG. 25 as well as latching of data for the above mentioned oscillators. It also indicates to the RF interface circuitry shown in FIG. 23 when there is an over range of the phase lock voltage and it supplies a frequency analog voltage to the third converter described with respect to FIG. 29.

The sweep generator circuit 2410, the sweep reference voltage circuit 2420, and the sweep generator current source 2430 provide the sweep signal for the VTO, shown in FIG. 35, and YTO, shown in FIG. 26.

This circuit also provides the horizontal display signal for the IF section.

The processor may stop the sweep at any time via signal HSWP on a line 2441. The timing capacitor 2412 receives a constant drive from transistor 2411 to provide the ramp for the sweeping frequency. The base emitter voltage of transistor 2411 sets the current. This voltage is determined by sweep generator current source circuit 2430 and by the output of operational amplifier 2422 in the sweep reference voltage circuit 2420. "Fast" potentiometer 2414 and "slow" potentiometer 2413 are provided to adjust sweep times to fit the particular characteristic curve of transistor 2411. Transistor 2415 acts as a buffer between transistor 2411 and sweep timing capacitor 2412 and also enables the sweep to be stopped by the sweep stop switch circuitry 2440 whenever the signal on line 2441 is low. The remainder of the sweep generator circuitry 2410 provides amplification to provide a useable sweep voltage. In the preferred embodiment, the sweep voltage provided on lines 2417 and 2418 varies between 0 and 10 volts. Sweep reference voltage circuitry 2420 basically provides temperature compensation of the sweep reference voltage.

Sweep generator current source 2430 comprises transistors 2433A, 2433B, 2433C, 2433D, 2433E and 2433F. These transistors are current switches which are controlled by register 2432. Register 2432 is loaded with a data word from I/O bus 2200 under control of address 5 signal on command bus 2299. The transistors switch resistors to provide appropriate current paths for the selected sweep times. Transistor 2434 is used for temperature compensation and causes a linear increase in the base emitter voltage of transistor 2411 in sweep generator 2410, causing an exponential increase in sweep time. In the preferred embodiment, when all six transistor switches 2433A-F are saturated, a 10 millisecond sweep will result; if transistor 2433A is off a times 10 multiplier is added causing a 100 millisecond sweep. Other multipliers are indicated on the schematic diagram.

The stopping of the sweep is accomplished by circuit 2440. The signal HSWP on line 2441 causes transistor 2445 to divert charging current from timing capacitor 2412 to ground thus stopping the sweep. An LED indicator 2447 is provided to provide an indication that the sweep has been stopped.

Decoder 2451 decodes the signals on address bus 2299 and provides the decoded address bus signals on line 2298. Decoded signals used to control circuitry elsewhere in the preferred embodiment are output by decoder 2253.

Referring now to FIGS. 24B and 24C, sweep attenuator circuit 2460 receives the sweep signal on line 2419 from sweep generator 2410 and provides an attenuated sweep signal on line 2461. D/A converter 2462 is a multiplying digital to analog converter whose input signal sweeps plus and minus five volts while the output signal which is buffered by op amp 2464 sweeps plus or minus five volts times N/1023 where N is the binary number input via lines 2463.

Various sweep options are selected by sweep select switches 2465 while reference voltages are provided by reference voltage circuits 2468.

Digital to analog converter circuits 2470 provide the VTO tune signal on line 2473 in response to the digital words received on data bus 2200. The digital words received from data bus 2200 are latched into registers 2474, 2476, 2477 and 2478. Circuits 2479A and 2479B are ten-bit multiplying digital to analog converters, similar to those manufactured by Analog Devices, Inc., and others.

The tuning signal provided on line 2478 is used to tune the VTO shown as block 2007 in FIG. 20A and described in more detail with respect to FIG. 35.

In a similar manner, circuits 2481, 2482, 2483, 2484, 2485 and 2486 provide control currents and bias voltages to the YIG-tuned oscillator (YTO). Tuning digital to analog converter 2481 receives digital words from data bus 2200 under control of address 3 on decoded address bus 2298. Circuit 2481 comprises a ten-bit digital to analog converter 2481C which responds to the data stored in latches 2481A and 2481B. YTO tuning signal is generated on a line 2481D and input to the YTO main coil tune driver circuit 2482 which sums the YTO tune signal with the sweep signal on line 2466.

The YIG-tuned oscillator is phase-locked to a reference voltage from the 20 MHz reference source 2016 shown in FIG. 20A by the phase lock circuitry shown in FIG. 26. The relationship of the YTO, the YTO phase lock circuitry and various other portions of the preferred embodiment is shown in the block diagram of FIG. 25.

Referring to FIGS. 26A and 26B, the phase lock circuitry phase locks the YTO to the 20 MHz reference voltage received from the circuitry shown in FIG. 23. A lock indication is provided and a filtered output of the pilot third IF amplifier circuit is routed to the frequency counter shown in FIG. 36. For wide sweeps, a sample/hold circuit retains the output voltage. 20 MHz reference amplifier 2605 receives the 20 MHz reference signal and provides such functions as impedance matching as well as setting the current and voltage levels necessary for the operation of phase frequency detector 2620.

Phase frequency detector 2620 is a dual D flip-flop 4-$\pi$-radian type detector consisting of D flip-flops 2621 and 2622. In the preferred embodiment, these are ECL flip-flops similar to 10131P manufactured by Motorola and others. If the signals at PIN 6 and 11 are in phase, outputs at PINS 2 and 14 will cancel when summed. If the signals are out of phase, outputs at PINS 2 and 14 will sum to an offset. When both flip-flops become set with active high (Q) outputs being at a logic high, gate 2623 will reset both flip-flop 2621 and flip-flop 2622. Note also that a low logic signal on line 2627 disables the phase frequency detector 2620.

Loop amplifier 2630 is configured as an integrator. Loop filter sample and hold circuit 2635 can be switched to several configurations, i.e., 10 KHz break point, loop grounded, or sample and hold.

Phase lock indicator 2640 circuit senses flip-flops 2621 and 2622 of phase frequency detector 2620 and provides the signal HUL1 on a line 2641 which indicates an unlocked YTO phase lock loop when in the high logic state.

Referring now to FIGS. 27A and 27B, there is shown the RF converter circuitry of the preferred embodiment. The RF converter circuitry has two conversion paths. In the first, the signal from the front panel is input via a line 2704 to first converter circuit 2705. The output is filtered, converted by converter 2760 and outut via line 2763 to the IF amplifier shown in FIG. 28.

The second conversion path starts with the comb generator 2720. The comb generator takes the 20 MHz signal received from the 20 MHz reference 2016 which is shown in FIG. 23 and forms a pulse containing the harmonics of 20 MHz. This pilot signal provided on a line 2723 is input to pilot first converter 2730 which mixes power from circuit 2710 with the pilot signal. The output is filtered down, converted by down converter 2760 and sent to the second IF amplifier shown in FIG. 30.

The first LO distribution circuit 2710 takes power from YIG oscillator 2703 and splits and amplifies it for input to first converter circuit 2705 and pilot first converter 2730. The net result is that the IF signals on line 2763 and 2767 are provided to the second IF amplifier 2019 which is shown in greater detail in FIG. 28 and to pilot second IF amplifier 2009 which is shown in more detail in FIG. 30.

Referring now to FIG. 28, there is shown a second IF amplifier which receives the IF signal from the second converter shown in FIG. 27 which is processed through low pass filter 2805 which has a cutoff of about 500 MHz and filters out the LO frequency and harmonics from the RF converter. It is then amplified by amplifier 2810 which is a common emitter amplifier circuit with approximately 19 dB gain. The signal is then input to band pass filter 2815 which rejects the image frequency from the second converter. The 3 dB bandwidth of the filter is about 9 MHz.

The signal thus produced is input to the third converter circuitry 2020 shown in FIG. 29 where it is input to balance mixer 2910 and mixed with the signal provided by oscillator 2950 and amplified by amplifier 2940. The output from the mixer is then input to variable gain amplifier 2915. The output of oscillator 2950 is also input to buffer amplifier 2930 which provides the signal on line 2932 to the 275 MHz mixer described with respect to FIG. 32.

Referring now to FIG. 30, there is shown the pilot second IF amplifier which receives the signal on line 2767 from the second converter circuit shown in FIG. 27. This signal is processed by low pass filter 3010 which has a cutoff of approximately 500 MHz. It is amplified by common emitter amplifier 3015 which has a gain of approximately 19 dB and is then processed by band pass filter 3020 which has a 3 dB bandwidth of approximately 23 MHz. The filtered amplified signal thus obtained is output on line 3040 to the circuitry shown in FIG. 31. In the circuitry shown in FIG. 31, this signal on line 3040 is mixed by mixer 3110 with the signal received on line 3045 from the phase lock oscillator shown in FIG. 33. This signal thus produced is then amplified and filtered and provided to the YIG tuned oscillator phase lock circuitry shown in FIG. 26 via line 3150.

Referring now to FIGS. 32A and 32B, there is shown the 275 MHz phase lock circuitry of the preferred embodiment. In this circuit, the signal on line 3220 which is received from the circuitry shown in FIG. 34 is mixed with the signal received on line 2932 from the circuitry shown in FIG. 29. The difference frequency signal on line 3230 is then compared with the reference signal received on line 3210 from the 50 MHz voltage tuned oscillator. In response to this comparison, the 275 MHz tune control signal on line 3260 is generated. Detection of the phase lock loop is indicated by lock detector circuit 3250. When the loop is locked, the signal on line 3251 will be low. When it is unlocked, the output level on this line will be high.

Referring now to FIG. 34, there is shown the 275 MHz phase lock oscillator circuit of the preferred embodiment. This circuit provides a variable offset from the nominal 280 MHz signal. The circuit receives the 275 MHz tune signal on line 3260 which determines the frequency of the 275 MHz oscillator 3457. The output of the oscillator on line 3459 is mixed by mixer 3475 with the signal on line 3045 and the resulting signal is amplified and filtered and provided on line 3450 to the 249 MHz phase lock circuitry shown in FIG. 36.

Referring now to FIG. 35, the 50 MHz oscillator 3550 is tuned by the 50 MHz tune signal 3510 and the 50 MHz sweep signal on line 3520. These signals are shaped by shaping network 3530 and filtered by filter 3540 and used to tune the 50 MHz oscillator 3550. The output is divided by dividers 3570 and 3580 and the respective outputs are provided on line 3572 to the frequency counter circuitry shown in FIG. 36 or on line 3210 to the phase lock circuitry shown in FIG. 32.

In FIGS. 36A, 36B and 36C, there is shown the frequency counter circuitry of the preferred embodiment. This circuit counts the following frequencies: the 50 MHz voltage-tuned oscillator signal received on line 3572, the IF signal received on line 3611 and the pilot IF signal from the phase lock circuitry shown in FIG. 26. The respective signals are amplified by amplifier circuits 3612, 3614 and 3616. The amplified signals are then input to multiplexer 3640. Also input to multiplexer 3640 is the 10 MHz reference signal from counter control circuit 3630. The multiplexer gates one of these signals to the output line 3650 in response to the input selected by the code placed in register 3632 from the data bus 2200. Strobing of the data word from the data bus 2200 into register 3632 is accomplished via address decoder circuit 3660. The strobe signal is supplied on line 3661 and the selection of the frequency counter circuitry is determined by decoding the address signals received on lines 3664. The decoding of certain octal addresses is used for specific purposes. For example, the decoding of octal address 24 will result in a signal being produced on line 3667. This will cause the counter and bus registers 3680 and various other circuitry in the frequency counter to be reset. The decoding of address 25 will result in a signal on line 3668, and will cause the high order four digits to be read from counter 3680. In a similar fashion, the decoding of an octal address 26 will cause a signal to be provided on line 3669 and the lower four bits of counter circuit 3680 will be read out onto the data bus 2200.

Referring now to FIGS. 37A and 37B, there is shown the 249 MHz phase lock circuitry. The frequency of the signal received on line 3450 from the 275 MHz phase lock oscillator shown in FIG. 34 is divided by variable modulo frequency divider circuit 3725. Phase frequency detector 3710 then compares the signal provided by circuit 3725 with the signal produced by divider circuit 3705 in response to the 20 MHz reference signal received on line 3610. If the two inputs are out of phase control voltage is generated to force a change in the frequency of the 249 MHz phase lock oscillator shown in FIG. 33 until the inputs are in phase. Also, an indication of the locked or unlocked state of the phase lock loop is provided by circuit 3735. An LED 3735 is illuminated when the loop is unlocked and also a high logic signal is provided on a line 3736 to indicate the unlocked state.

Referring now to FIGS. 38A, 38B, 38C and 38D, there is shown the circuitry of the processor 2015 for the RF section of the preferred embodiment. The interface circuitry connecting the processor to the other circuitry of the preferred embodiment is shown in FIG. 38. Basically, these consist of memory interface 3880, bus circuits 3885, 3840 and 3830 as well as timing and synchronizing circuits such as timer 3805, clock circuit 3815, synchronizing circuit 3810 and clock drivers 3825. The processor executes the instructions shown in Appendix A to control the various operations of the preferred embodiment. A block diagram of the microprocessor used in the preferred embodiment is shown in FIG. 39. An explanation of the notation used in this processor and definitions of all the instructions are contained in Appendix A. The various programs used in the preferred embodiment are contained in Appendices B-1 through B-30. The signals produced by the instructions in the programs are detailed in Appendix B-31. Program execution by the processor is suspended through stop processor circuit 3801. This circuit responds to the controls on the front panel and to various other conditions throughout the machine.

The processor reset signal POP is provided on line 3811. Whenever this line goes low, the processor is reset and forced to begin the execution of the program which begins with the instruction at octal address 40 as soon as the line returns high. This may be caused by the pressing of the instrument present button 230 on the front panel which causes the generation of the signal LIPS on line 3806 and by when power is first applied to the unit as indicated by the signal on line 3807. Once execution begins at instruction 40, various subprograms are executed which cause specific operations to occur in a predetermined sequence. Some examples of these operations are: phase lock the YIG-tuned oscillator, tune the voltage-tuned oscillator, select the correct scan time, select an appropriate frequency span width, set the IF section to the correct bandwidth and sensitivity, display the appropriate control settings on the CRT, etc. These programs interrogate the settings of the controls on the front panel and are responsive to changes in the circuitry and the front panel controls.

The subprograms which are in Appendices B-1 through B-30 are stored in a read-only memory which is read by the processor using a handshake interface circuit 3880. Any suitable ROM memory may be used. The address is output to the memory on lines 3992 and the signal HSTM on line 3994 is brought high. The positive edge of the signal on line 3994 causes the memory address register to receive the address on lines 3992.

The circuits shown in FIGS. 40A–C and 46A and 46B are bandwidth filters which operate at 21.4 MHz and are variable in bandwidth from 3 KHz to 3 MHz. The narrower bandwidths 3 KHz to 30 KHz are obtained from synchronously tuned crystal filters while the wider bandwidths are obtained from four synchronously tuned LC tank circuits. The IF control circuitry of the preferred embodiment is shown in FIGS. 41A and 41B. Control information for the IF video circuits is transmitted over data bus 2200. Address lines 2299 are monitored and decoded by circuit 4120 which controls the loading of the data on the bus 2200 into the input latches 4130. Data is strobed into the latches in response to the signal LTIO on line 4123 in response to the data word, gain control outputs are produced by circuit 4140, and predetermined attenuation steps are controlled by circuit 4150. In a similar fashion, bandwidth control circuit 4160 provides control signals on lines 4161, 4162, 4163, 4164, 4165, 4166, 4167, 4168. These signals control the crystal filters in LC tank circuits shown in FIGS. 40 and 46. The log linear control signal on line 4180 is provided by op amp circuit 4182. This signal is used in the circuitry shown in FIGS. 42A and 42B.

The log amplifier and filtering circuitry of FIGS. 42A and 42B provides the ability in the preferred embodiment to display signals in either a linear or a logarithmic mode. In the logarithmic mode, the calibrated display range is 90 dB. The circuitry of FIGS. 42A and 42B contains the first five of nine logarithmic stages and the circuitry shown in FIGS. 43A and 43B contains the circuitry for the last four logarithmic stages. After the IF signal received on line 4080 is processed by the five logarithmic amplifier stages of amplifier circuit 4230, the IF signal is processed by bandpass filter circuit 4240 and lowpass filter 4250 to yield the IF signal on lines 4280. All this circuitry is under control of the log/lin control signal on line 4180 and the AGC control signal on line 4193, and the LGIO control signal on line 4195. The AGC signal on line 4193 is used in the linear mode of display. Th gain increases as the voltage of this signal becomes more negative. The signal varies between 0 and 15 volts and controls a gain range of approximately 65 dB. The LGIO signal controls circuitry within amplifier 4230 which is used to activate a 10 dB gain step in the linear mode.

The log amplifier detector circuitry shown in FIGS. 43A and 43B contains the last four of the nine logarithmic amplifier stages (the first five stages are in the amplifier/filter circuitry shown in FIG. 42). Stages 6 and 7 of amplifiers 4320 are also used in the linear mode as a switchable 20 dB gain step. The output signal from the amplifiers on line 4321 is applied to the PIN diode attenuator circuit 4325. When in the logarithmic mode, this attenuation is varied with temperature to compensate for bias variations in the logarithmic amplifier stages. The IF signal output on line 4326 is then detected by detector circuit 4340 to produce the vertical video signal on line 4342 which is input to video processor 2060 which is described in greater detail with respect to FIG. 50. The counter output limiter circuit 4350 provides an amplitude/limited signal at the IF frequency which is used for frequency counting. The circuitry shown in FIG. 44 provides three functions: oscillator circuit 4410 provides an 18.4 MHz LO frequency to the up converter and down converter circuitry shown in FIGS. 47 and 48 respectively. These signals are provided on lines 4413 and 4415 after being amplified by amplifier circuit 4412. Also, the circuitry of FIGS. 44A and 44B provides 65.9 dB of gain in discrete 0.1 dB steps (from −15.9 dB to +50 dB). This is accomplished through step gain circuits 4430, 4440 and 4450 as well as attenuators 4460. The level of gain or attenuation is determined by the control signals on lines 4431, 4441, 4451, 4461, 4462, 4463 and 4464. The resulting IF signal is output on line 4480. The control signals received are provided in response to the program control of processor 2015 and the settings of the front panel controls.

Figure 45C:
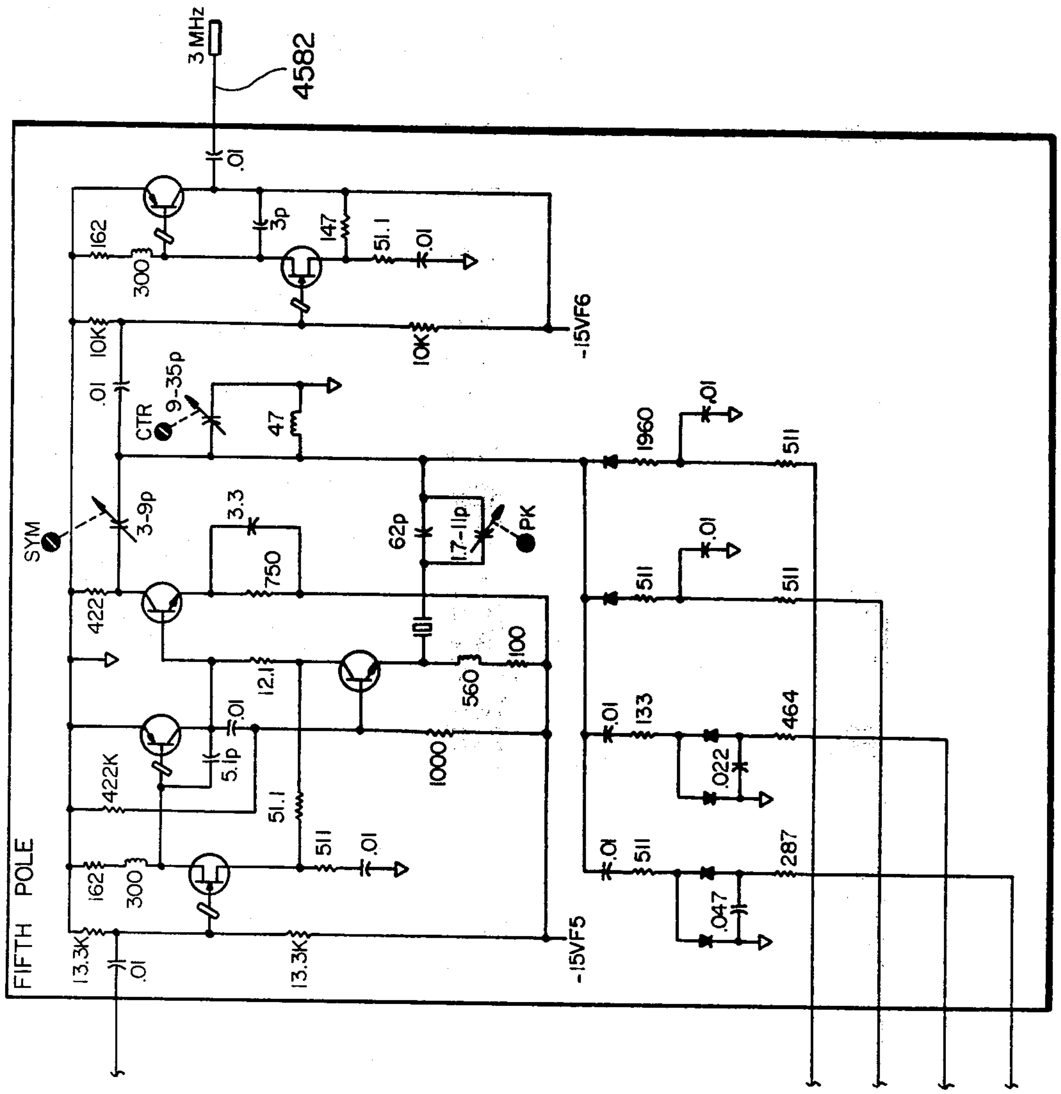
FIG. 45 shows the relationship of FIGS. 45A and 45B.
FIGS. 45A and 45B taken together are a schematic diagram of the 3 MHz bandwidth filter circuitry of the preferred embodiment.

The 3 MHz filter circuitry shown in FIGS. 45A and 45B is a variable bandwidth filter centered at 3 MHz. The bandwidths are controlled from 10 Hz to 300 Hz in a 1-3-10 sequence by the control lines 4510, 4512, 4514 and 4516. The signal being filtered is received on line 4525 from the down converter circuitry shown in FIGS. 46A and 46B and the filtered output on line 4582 is input to the up converter circuitry shown in FIG. 47. The filter circuit shown in FIGS. 45A and 45B forms a five pole synchronously tuned bandpass filter. Each amplifier has a negative output impedance to compensate for the series resistance of the crystal resonator.

Referring now to FIGS. 46A and 46B, there is shown attenuator and bandwidth filter circuitry of the preferred embodiment. Attenuation of the input signal received on line 4601 is supplied by attenuator/amplifier circuit 4610 in response to the control signals 4603 and 4605. As in the bandwidth filter circuitry shown in FIG. 40, the narrower bandwidths of the filter are obtained from synchronously tuned crystal filters while the wider bandwidths are obtained from four synchronously tuned LC tank circuits.

In FIG. 47 there is shown the up converter of the preferred embodiment. For the narrow bandwidths, i.e., less than or equal to 1 KHz, this circuitry converts the 3 MHz IF signal received on line 4582 and converts it to a 21.4 MHz IF signal on line 4772. This is accomplished by mixing the 3 MHz signal on line 4582 with the 18.4 MHz signal received on line 4413.

FIG. 48 shows the down converter circuitry of the preferred embodiment whereby the 21.4 MHz IF signal received on line 4682 is converted to a 3 MHz IF signal and output on line 4525.

VIDEO PROCESSOR

As mentioned above, in a spectrum analyzer with a digital display, i.e., where the display is produced in response to data representing a discrete number of sampled points, there is the problem that there may not be enough sample points to properly describe the analog signal. For example, assume that the display is made up of 1000 horizontal positions and their corresponding 1000 amplitude levels at those points. In that case, the resolution is 1/1000 of the full scale along the axis. For a 1000 MHz wide scan with an IF-bandwidth $<1$ MHz there would be a good chance of missing a signal or of displaying it with less than its true amplitude, because no sample was taken while the analyzer was sweeping across the signal. To avoid this problem, the ratio of scanwidth to bandwidth cannot exceed a certain ratio.

With 1000 samples per scanwidth, this ratio should be $\leq 200$ so that at least five samples are taken while the signal is within the 3 dB bandwidth of the IF filter. This would keep the amplitude error to $<0.1$ dB for a 100 dB full screen display.

A problem is the aspect ratio (SW/BW = aspect ratio) limitation of digital storage, as well as the limitation of the absolute speed at which incoming data gets converted into digital. The Nyquist theorem for sampling a band limited signal has to be satisfied ($f_s > 2BW$) in order to retain all the information. With a max. conversion rate of 50 KHz from analog to digital, the widest IF-bandwidth which satisfies Nyquist is $\simeq 10$ KHz. The analyzer has a max. IF-BW of 3 MHz and thus the 50 KHz sampling rate will lead to inaccurate descriptions of signals which have a 3 MHz information bandwidth, such signals as noise and impulse signals like RADAR.

Another problem is the sampling rate limitation. The previous aspect ratio limitation is really another form of sampling rate limitation. It is caused by the fact that there are insufficient numbers of samples to describe the display.

The real solutions would be to increase the sampling rate and the numbers of points displayed, but this is costly and not practical.

Other solutions are compromises which sacrifice some informatin in order to preserve that information which is most useful for spectrum analysis. In this regard, the most important parameter is correct signal amplitude. It can be obtained from a peak detector which precedes the A/D converter. The peak detector holds the max. signal which occurs between samples for the A/D. After sampling the peak detector output, the peak detector is reset to the input signal level. Thus, no signal peak is lost. Also, the preferred embodiment employs both a positive and negative peak detector circuit to allow a better presentation of signal noise, i.e., give an indication of the amplitude excursions in the noise signal.

A problem using the peak detector is that the displayed signal peak may show one address later than it actually occurred so that there would be an error in frequency. The seriousness of this problem depends on how many horizontal addresses are used.

Also, the peak detector will give a misleading display of noise as it traces out only the peaks of the noise impulses. The user might be misled into thinking that the noise has been smoothed by videofiltering. In that case, he would read the absolute noise level incorrectly, since the peak noise is many dB above the RMS noise level.

Another problem with using a positive peak detector only is that a signal which is just a few dB above the noise will look clean and again the user might not be aware that he is looking at the sum of signal plus peak noise. Measuring the signal level he could get several dB errors.

The preferred embodiment provides a better presentation of the noise which is present by using a negative peak detector in addition to the previously described positive peak detector. The outputs from these two peak detectors are then displayed in a predetermined manner. For example, the display might simply alternate between the outputs from the positive and the negative peak detectors.

VIDEO SIGNAL CONDITIONING

The video processing technique of the present invention accommodates the requirements of digital storage. During a frequency sweep, 1000 samples of the video signal are taken and stored. However, simply taking and storing 1000 samples does not give adequate results with all combinations of resolution bandwidth, frequency span, and sweep time.

Consider, for example, an often-encountered spectrum analyzer input: short duration RF pulses occurring at a relatively low repetition rate. When the analyzer sweeps across the RF pulse spectrum, the output of the video detector is a series of short pulses. The shape of these pulses corresponds to the impulse response of the spectrum analyzer system (approximately Gaussain) and their rise time is 0.12 μs when the resolution bandwidth is at its widest setting (3 MHz). Representing this signal with sampled data would require a sampling rate higher than 6 MHz but there are other limiting factors, such as CRT resolution.

A high-quality CRT display might have a 10-cm horizontal axis and a resolution of 40 lines/cm. RF spectrum analyzers typically sweep no faster than 20 ms per sweep, so multiple video signals occurring within a 50-μs sweep segment (20 ms × 1/400) will not be resolved, but will appear on the display as a single vertical line having the amplitude of the largest video signal and an intensity proportional to the summation of all the signals occurring within that segment. Thus, a peak detector that retains the peak value encountered during each 50-μs period would permit sampling at a 20-kHz rate for the 20-ms sweep. However, the information contained in the intensity modulation would be lost, corresponding to the loss of information resulting from the use of the slower sampling rate (as compared to 6 MHz).

Wideband impulse-type signals are not the only ones that can cause difficulties for the conversion process. CW signals can also be misrepresented when the analyzer is set for a high-aspect-ratio display (aspect ratio is defined as the ratio of frequency span to resolution bandwidth). Because the video signal resulting from a CW signal during a frequency sweep is a replica of the shape of the resolution-bandwidth filter response curve, at least five samples must be taken within the −3-dB points on the response curve to assure that the peak amplitude is captured with less than 0.1-dB error. This would limit the aspect ratio to 200 for a 1000-point display using sampled data.

For larger aspect ratio, a peak detector enables the peak amplitude to be captured by only one sample per data point. The trade-off is a sacrifice in frequency accuracy of 0.1% of the frequency span, but this is well within the visual resolution of the displayed spectrum.

A peak detector can give a misleading representation of noise. With noise as the input signal, the video signal can be considered as a tightly packed random sequence of individual impulse responses. However, a peak detector retains only the noise peaks and information on the variance is lost. Indeed, this can lead to erroneous results in measurements of low-level signals that are barely above the noise level. The peak-detected waveform may look very much like a video-averaged waveform whereas the peak is much higher than the true average because of the noise fluctuations.

For this reason, the preferred embodiment has both a negative peak detector and a positive peak detector driven in parallel by the video detector. The general scheme is to display the positive peak values for the odd-numbered data points and the negative peak values for the even-numbered points, giving a realistic reconstruction of noisy signals. However, this introduces a complication because it is desired to retain only the positive peak values of clean signals so amplitude measurement accuracy is preserved. Therefore, the video processor of the preferred embodiment displays positive and negative peaks alternately only when noise is present. Otherwise, only the positive peaks are displayed. FIG. 49B illustrates the concept.

A block diagram of the video processor is shown in FIG. 49A. The video signal is applied to the positive and negative peak detectors simultaneously. Before the start of a sweep, the switches in the peak detectors are closed and the capacitors charge to the value of the video signal. At the start of the sweep, the display's digital processor opens the switches and the positive peak detector tracks increases in the video signal while the negative peak detector tracks decreases. For example, the output of the positive peak detector increases only when the video signal increases above the value already stored on the capacitor and, of course, it never decreases.

When the processor determines the end of a data position (sampling interval), it selects the output of one of the two peak detectors to represent the signal at the A-to-D converter. If it selected the positive peak detector, it would then close the corresponding switch, re-initializing the capacitor to the present value of the video signal. If it had selected the negative peak detector, it would not reset the positive peak detector, but would retain the value stored on the capacitor for use in the next data position. However, for reasons given later, the negative peak detector is re-initialized at the end of every data position.

DETECTING NOISE

The most important information the processor needs to decide which peak detector to choose is whether or not the incoming signal contains noise. As shown in FIG. 49B, a noisy video signal is characterized by many variations and large deviations. Noise is present in each of the ordinals 400 through 404 and the signal rises and falls repeatedly. However, in ordinals 405 through 407 there is no noise and the signal increases monotonically. Using these signal properties, it is a relatively simple matter to determine whether or not a data position contains noise.

The "rosenfell" detector of FIG. 49A tells the processor when noise is present. The input stage of the rosenfell detector consists of two comparators. The upper comparator detects when the instantaneous video signal is less than the positive peak detector output, which can only mean that the video signal is falling. In a similar manner, the other comparator indicates when the video signal is rising.

Whenever the video signal falls, it causes the "fell" flip-flop to be set and whenever it rises, it causes the "rose" flip-flop to be set. If the video signal both rose and fell within a data position, the AND gate would send a "rosenfell" indication to the processor, signifying the presence of noise within the data position. Both flip-flops are reset at the beginning of the next data position.

TO RESET OR NOT

The success of the detection technique at reconstructing the video signal hinges on the rules for resetting the peak detectors. Assume that FIG. 49C-1 shows a video signal of interest. FIG. 49C-2 shows the waveform obtained by the preferred embodiment using the positive peak detector only. FIG. 49C-3 shows the waveform obtained by the preferred embodiment using only the negative peak detector. Combining the use of the positive and negative peak detectors allows the reconstruction and accurate display of the video signal. These figures demonstrate the importance of resetting the positive peak detector only when it had been chosen to represent the signal for the data position. The aspect ratio for this case is 3000, so the video signal rises out of the noise, reaches its maximum, and returns to the noise level all within one data position. The rosenfell detector would indicate the presence of noise and, if the ordinal were even, the processor would choose the negative peak detector output. However, since the positive peak detector is not reset on this data position, it holds the maximum signal value for the next data position, where the positive peak value is chosen. Thus, the video signal is reconstructed appropriately.

Again, assume that FIG. 49D-1 shows a video signal of interest. Also, as above, FIG. 49D-2 illustrates the display obtained using only the positive peak detector where FIG. 49D-3 illustrates the display obtained using only the negative peak detector. FIG. 49D-4 shows the reconstructed video signal obtainable using both the positive and negative peak detectors. These figures demonstrate the importance of resetting the negative peak detector at the end of every data position. When a noise-free video signal reverses direction at its peak, the rosenfell detector sees both a rise and a fall and indicates that noise is present within the data position. Then if the processor is also at an even ordinal, the negative peak value would be chosen. But, since the negative peak detector was reset to the value of the signal at the beginning of the data position, its value will be only slightly different from the positive peak detector value and the smooth reconstruction of the video signal is not disturbed perceptibly. At the next data position, the positive peak detector, which retained the maximum value, is chosen.

When the preferred embodiment is used for measuring noise or when it operates in a digital averaging mode, the rosenfell detector is bypassed and the video signal is sampled directly by the A-to-D converter.

The hardware implementation of this detection technique could encounter some practical problems when the analyzer sweeps slowly. The duration of a data position can become as long as 1.5 seconds and a peak value captured by either peak detector could be lost because of gradual discharge of the detector capacitor. This becomes a problem whenever the data position is 75 μs or longer; that is, the sweep time is 75 ms or longer. To avoid the loss of these values, the processor retrieves the values of both peak detectors from the A-to-D converter at least once every 30 μs, obtaining as many as 50,000 positive and negative peak detector values for the 1.5-second data positions. The processor, however, saves only the maximum and minimum values and at the end of the data position, chooses one or the other to represent the signal for that data position according to the same algorithm described above. These peak values, which the processor stores in its registers, are then reset whenever the peak detectors are reset. In effect, the processor simply extends the range of the peak detectors by carrying out the detection process digitally.

The A-to-D converter has 10-bit resolution, equivalent to a resolution of 0.1%. At the end of each data position, the display system processor takes the chosen value, performs any calculations that may be called for (max hold, A-B), and stores the result in memory along with sweep position information. The measurement data can be stored in any one of three areas (A, B, or C) reserved for these data arrays. During the display cycles, the data from any one of these areas can be displayed individually or simultaneously with data from the other areas.

The definitions and method steps used in the preferred embodiment are briefly summarized below:

A "sample" is defined as a video a-d conversion which occurs every 20–50 μsec. A "data position" is defined as 1/1000 of the horizontal display. Each data position has a specific memory address:

Even Data Position = 2, 4, 6, . . . 1000

Odd Data Position = 1, 3, 5, . . . 1001

The time range per data position = 20 μs→1.5 sec. While the number of samples per data position may vary from 1 to 50 thousand, only one sample per data position can be displayed.

Positive and negative peak detectors are used to find maximum deviations. A positive peak is the maximum value within a data position, a negative peak is the minimum value. The reset of a peak detector initializes the peak detector to the present value of the video signal.

"Video signal falling" is defined as the condition when the incoming video signal is less than the value held on the positive peak detector. "Video signal rising" is defined as the condition when the incoming video signal is greater than the value held on the negative peak detector. "Video signal fell" indicates that a condition of "video signal falling" has occurred within a data position. "Video signal rose" indicates that a condition of "video signal rising" has occurred within a data position. "Video signal rosenfell" indicates that the video signal both rose and fell within a data position. The reset of the "rosenfell" detector clears the indication of "video signal rose" and "video signal fell."

In the preferred embodiment, odd data positions will always contain positive peak values. Even data positions will contain negative peak values only if the video signal is defined as "noise." Otherwise, even data positions will contain positive peak values. The presence of "noise" is indicated by the presence of a "video signal rosenfell."

The negative peak detector is reset at the end of every data position. The positive peak detector is reset after the positive peak value has been chosen for the data position. Therefore, when a negative peak value is chosen for an even data position, the positive peak detector will not be reset until the end of the following data position. This ensures that any positive peak occurring during the time of the even data position will be retained. The rosenfell detector is reset at the end of every data position.

For data positions of long duration, one or more pairs of positive and negative peak detector values are converted. When more than one pair is converted, the digital processor selects and keeps only the maximum and minimum values. At the end of the data position, the maximum value is assigned to be the positive peak value and the minimum value is assigned to be the negative peak value. The algorithm stated above is then followed, and the rule for resetting the positive and negative peak detectors is applied to resetting the positive and negative peak values.

To make noise density measurements, the peak detectors are bypassed and the video signal is sampled and converted directly. This allows noise computations on direct samples of the video signal.

It should be emphasized that the method used in the preferred embodiment is weighted towards preserving the positive peak excursions of the signal. Since this is the most important parameter for a spectrum analyzer, the negative excursions are preserved only to the extent necessary to indicate the signal variations as for noise. These sequences of variations between using the information from the positive and negative PD could also be effectively used.

Referring now to FIGS. 50A and 50B, there is shown the schematic diagram for the video processor circuit of the preferred embodiment. This circuit filters the detected IF signal received on line 4342 from the circuitry shown in FIG. 43. The circuit also sets the DB/DIV log scale and the reference level offsets. Also, it provides the IF video output signal on line 5080 as well as recorder output control signals on lines 5090 and 5091. Video filter circuit 5020 is an RC low pass filter with selectable R and C elements. The series resistance R is one of two values controlled by switch 5022. When the switch is closed or in the zero position, the 147K resistor 5024 is short-circuited, and the series resistance is minimum. In this state, video bandwidths from 3 KHz to 3 MHz are attainable. The 3 MHz bandwidth is attained when transistors 5027A, B, C, D, E, F and G are turned off. When switch 5022 is open, the series resistance R is high, approximately equal to resistor 5024, and video bandwidths from 1 Hz to 1 KHz are attainable. The shunt capacitors 5029A through 5029G are selected by switching transistors 5027A through 5027G respectively. Only one of these switching transistors can be on at any one time and each capacitor except capacitor 5029G is used with the high series resistance for the lower bandwidths and the low series resistance for the higher bandwidths.

Log expand circuitry 5040 allows four different amplitude scales, 10, 5, 2 or 1 dB per division. Changes in the amplitude scale are accomplished by first amplifying the video signal and then attenuating it various amounts. Amplification is provided by FET input amplifier 5042 which has a gain of 5. The signal thus produced on line 5043 is then attenuated by voltage divider circuits under control of transistors 5045, 5046 and 5047. Diodes 5048A and 5048B clamp this attenuated signal at about minus 1.2 volts to prevent forward biasing any of the transistor 5045, 5046 and 5047 switch circuits in the forward state. A final amplifier consisting of transistor circuits 5049, 5050 and 5055 amplifies the attenuated signal by 4 and offsets the output plus 2 volts (a plus 2 volt output corresponds to a full scale signal). Log offset current source 5010 simulates log gain for reference levels below minus 60 dBm. This is achieved by offsetting the zero volt to 1 volt video input signal by driving current through the source resistance 5012. This current is changed by supplying different currents into the emitter of transistor 5014, the transistor current source. Currents are controlled by switching transistors 5015A, 5015B and 5015C.

The decode logic circuit 5030 performs additional decoding on control lines received from the IF control circuitry described with respect to FIG. 41. The signals VBWA, VBWB, VBWC and VBWD are received on lines 5031, 5032, 5033 and 5034 respectively. They are then decoded by a 1 of 8 decoder 5037 and the signals are then inverted by inverters 5039. In this way, the control signals are produced which control the capacitors in the video filter circuit 5020. The signals A LOG and B LOG are also decoded by decoding circuit 5030 which produces the control signals on lines 5041A, 5041B and 5041C which drive the switches that vary the attenuators in the log expand circuit 5040.

Figure 51:
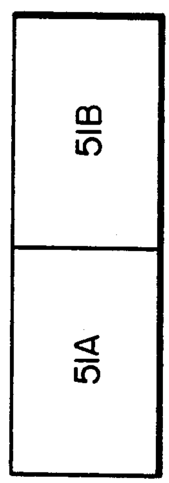
FIG. 51 shows the relationship of FIGS. 51A and 51B.

Referring now to FIGS. 51A and 51B, there is shown the analog/digital converter circuit of the preferred embodiment. This circuit is used to produce storable graph data. It converts analog data received from the track and hold circuitry shown in FIG. 52 on line 5280 and transfer this data to the digital storage bus 5130. The digital storage bus 5130 is used for all data input and output. The signal ADC on a line 5173 controls the loading of the digitized signals from ADC buffers 5120 onto data bus 5130. The signal HLD on a line 5177 is used to reset the ADC circuits 5110 and 5120 and to initiate the next analog to digital conversion. The signal LD RAMP on a line 5179 causes the updating of the ramp digital to analog converter 5160 by causing the loading and updating of the scan address latches 5150 with a new scan address. The signal TSTA on line 5171 enables the test bits from buffer 5190 onto the digital storage bus 5130.

The ADC circuit 5110 converts analog data into 10 bits of binary data which is placed in ADC buffers 5120 through the technique of successive approximation. The circuit comprises digital to analog converter 5113 and successive appproximation register 5117. To begin a conversion, the ADC is first reset to all zeros by the signal HLD on line 5177 going low. When the signal HLD goes high, each bit is individually tried in a "trial" conversion starting with the most significant bit. A decision is made to retain or drop the bit based on the comparator output. Once the decision has been made for each of the 10 bits, a conversion complete signal on line 5117A sets flip-flop 5119. This signal called BUSY can be transferred onto the digital storage bus through test bits buffer circuit 5190.

Ramp converter circuit 5160 makes a comparison between the analog sweep signal received on line 2046 and the scan address (X axis) received on the digital storage bus 5130 and input to latches 5150. Comparator 5167 makes the comparison and provides a signal RAMP on a line 5168. When this signal is high, it indicates that the scan address needs to be updated. When an update occurs, a new address is loaded into scan address latches 5150 and a new data point is sampled for A/D conversion. When a new address is placed in scan address latches 5150, an updated comparison between the sweep signal on line 2046 and the scan address in latches 5150. The signal SWP IN thus sets the sample rate. Minor adjustment can be made using variable potentiometer 5169.

Referring now to FIGS. 52A–C, the track and hold circuitry shown is used to insure that the true peak of the RF signal and a true representation of noise are displayed on the CRT display. This is accomplished by positive and negative peak detection circuits. The positive peak detector circuit 5210 acquires the most positive voltage to appear at its input on line 5080 and holds that voltage on holding capacitor 5214 until the circuit is reset by a pulse from the decoding and timing circuits 5230. C26 is discharged when the reset pulse turns on transistor 5117.

Negative peak detector circuit 5220 also receives the signal on line 5080 and acquires the most negative voltage to appear and holds that voltage on holding capacitor 5224 until reset by the reset pulse from decoding and timing circuits 5230.

Decoding and timing circuits 5230 provide the reset pulses to the peak detectors and the control signals to multiplexer circuit 5250. Signals received on lines 5251 and 5252 are used to control multiplexer circuit 5250. Signals HSWP on line 5231 and signal HOLD on line 5234 and signal RSEN on line 5235 control the providing of the reset pulses to positive and negative peak detectors 5210 and 5220. The status of the track and hold circuitry can be monitored by the control processor by monitoring status signal LTRK on line 5239. Track and hold circuit 5270 monitors the positive and negative peak detector output signals which are multiplexed through multiplexer 5250 onto line 5271. Track and hold circuit 5290 samples the signal on line 5271 and holds the sampled voltage on capacitor 5292. The output of the track and hold circuit on a line 5280 is then used by the analog to digital converter circuitry shown in FIG. 51 which converts it into Y axis graph data.

FIGS. 53A–C are a schematic diagram of the data manipulator circuitry of the preferred embodiment. This circuit contains 16 random access memory registers 5310 which are used for data storage during data manipulation. Thirty-two 12-bit ROM registers 5370 are used to store constants used during calculations. The arithmetic and logic unit 5350 is used to perform various arithmetic and logic functions upon the stored data. ALU circuits 5351, 5352 and 5353 are similar to the 74S181 circuits or the like manufactured by Texas Instruments and others. Circuit 5355 is a high-speed, look-ahead carry circuit similar to the 74S182 or the like manufactured by Texas Instruments and others. A pipeline register 5360 holds instructions received from the processor in sequential order. These instructions are then decoded by circuit 5380 and the appropriate arithmetic or logical functions are performed upon the stored data. Also, data words may be input and output to other areas of the circuitry of the preferred embodiment over I/O bus, i.e., digital storage bus 5130.

Referring now to FIGS. 54A–C, there is shown the main control circuitry or state machine which controls the digital storage processor. The digital storage processor includes the control circuitry shown in FIG. 54, the interface circuitry to the remainder of the spectrum analyzer of the preferred embodiment shown in FIG. 55, the data manipulating circuitry shown in FIG. 53 and the memory circuitry shown in FIG. 56.

State register 5430 indicates the present state and the position in the sequence of operations being performed. This present state data is supplied to program ROMs 5420 on lines 5421 where it causes the program ROMs to read out the appropriate memory contents. The digital storage processor alternates between two programs. One is the main program shown in Appendix C1; the other is the interrupt program shown in Appendix C2. Link register 5440 is used to store the respective returning positions and store multiplexed qualifier to the respective programs as they are being executed and interrupts and other monitored machine conditions cause the processor to switch from one program to the other. Thus, each program resumes at the correct state when the other is completed or temporarily suspended. Control signals for the input section and the CRT display section are provided by control pulse circuit 5555 and addressable flip-flop circuit 5580. The instruction definitions for the program stored in program ROM 5420 are shown in Appendix C3.

In FIGS. 55A and 55B, there is shown the interface circuitry which provides data transfer between processor 2015 which is described with respect to FIG. 20 and the digital storage processor which is described with respect to FIGS. 53, 54, 55 and 56. Basically, this circuit provides for the inputting and outputting of circuitry via the two processors and through the preferred embodiment using instrument bus 2200 and digital storage bus 5130.

The memory circuitry shown in FIGS. 56A–C contains 4,096 12-bit words of random access memory storage in memory circuits 5630 and also contains 2,048 8-bit words in memory 5670. In memory circuits 5630 are stored all the data that may be displayed on the CRT including the display annotation data such as center frequency, reference level, the graticule, all characters and complete data for traces A, B and C. Character stroke memory 5670 contains the stroke description of each character, the length and direction of each stroke required to draw a character, i.e., all the alphabetic characters as well as all the numerals and other indica used on the display.

Referring now to FIGS. 57A and 57B, there is shown the line generator circuitry of the preferred embodiment. This circuit receives a series of digital X and Y values which are loaded into X register circuit 5710 and Y register 5720. These values are received via bus 5130 and are clocked into the respective registers under control of the signals LDX and LDY. If signal LDX on line 5521 is present, the value on data bus 5130 will be loaded into the X register. If the signal LDY on line 5522 is present, then the digital word on data bus 5130 will be loaded into Y register 5720. The values placed in the X register 5710 and Y register 5720 are then converted to analog values by X digital to analog converter 5745 and Y digital to analog converter 5730. The successive X and Y values are connected with straight lines by a process called line generation which is similar to that of connecting dot-to-dot drawings on paper. Two independent line generators are required. The line generator circuit for the X values comprises summing-amplifier 5750, sample and hold circuit 5765, X integrator 5780 and filter 5785. The Y line generator circuit comprises summing-amplifier 5760, sample and hold circuit 5775, Y integrator 5795 and Y filter 5790. For each line drawn, there is a set up period followed by a drawing period. During the set up period, i.e., the conversion to analog values for each set of X and Y data, the display is blanked by the intensity control circuitry shown in FIG. 58 under control of the signal LLGBLANK on line 5811 and INTR on line 5821. X summing-amplifier 5750 receives the analog value for the next position on line 5746. It also receives an input indicating the present X value from integrator 5780 on line 5781 and it receives a shift value on line 5716 from expand register 5715. The three signals are summed to give a delta X equal to "next X" plus X shift minus present X. The X shift signal on line 5716 is a binary signal of zero volts or plus 5 volts and the amount of shift is adjusted by the potentiometer 5752.

Sample and hold circuit 5765 receives the new X value provided on line 5759 and holds it for input to the integrator 5780. Sample and hold circuit 5765 samples for 1 microsecond during the set up period and then holds the value during the drawig period which is either 4 microseconds or 19 microseconds. The sample mode is controlled by the signal SMPL on line 5767 while the hold mode is controlled by the signal HLDX on line 5769. Capacitor 5768 is the holding capacitor.

X integrator 5780 includes amplifier 5785, capacitor 5787 and transistor 5789 which form an integrate and hold circuit whose output is an analog signal on line 5783 which is the X display position. X filter 5788 is a 2.5 MHz low pass filter which smooths out transients from the X integrator and provides the signal LGX on line 5795. The Y circuitry works in a similar fashion and provides the signal LGY on line 5798. Y offset circuit 5755 supplies a signal to the Y summing amplifier 5760 such that the output of the Y line generator on line 5798 will be zero volts when the Y register contains all zeros and no origin shift for the display is present.

Referring now to FIGS. 58A and 58B, there is shown the intensity control circuitry of the preferred embodiment. This circuitry receives the delta X and delta Y signals on lines 5756 and 5758 respectively. It then approximates the line length and controls the Z axis level to the display. This circuitry also sets and controls the duration of the line generator drawing period which is either 4 microseconds or 19 microseconds depending on the approximate line length. The drawing period is controlled by providing the signal LL on line 5771. This circuitry also provides the drive signals to the line generator switches, and through the blanking logic 5850, it controls all display blanking.

The intensity level is modulated as a function of both delta X and delta Y signals received on lines 5756 and 5758. Line generator Z-axis circuit 5880 receives these signals and the magnitudes of these two signals are summed together to approximate line length. The output of this summing operation is provided to bright circuit 5888 on a line 5887. Bright circuit 5888 sets the Z-axis signal to maximum when bright lines are drawn. The signal LGZ on a line 5889 is output by bright control circuit 5888 and is input to multiplexer 5995 where it is multiplexed with the FSZ signal from the trigger circuitry shown in FIG. 60 and becomes the Z signal to the display. The Z signal also goes to the auxiliary Z circuit 5990 which provides the auxiliary Z signal on line 5991.

The line length approximation from the line generator Z-axis circuit 5880 also goes to the long line comparator circuit 5885 which decides whether the line should be drawn as a long line (19 microsecond drawing time) or a short line (4 microsecond drawing time). This decision is stored at the input register and sent to the line generator as the signal LL on line 5771. The long line/short line timing circuit 5820 uses the signal LL and the signal LGCLK on line 5818 to control the line generator set up and drawing periods. It provides the signal INTR on a line 5821 which is used by the main control circuitry shown in FIG. 54 to determine when to send new X and Y values to the line generator circuitry. It also provides timing signals to the integrator switch driver 5830 and the sample and hold switch driver 5870. These two circuits form the drive signals needed for the line generator.

The control of display blanking begins at the input register 5802. Blinking and blanking information are held in this register during the line drawing period. The blanking logic circuit 5850 controls the display blanking. It unblanks, blanks or blinks lines as required by input register 5802. It multiplexes the digital storage blanking with the fast sweep retrace blanking.

Referring now to FIG. 60 there is shown the trigger circuitry of the preferred embodiment. The most important function of the circuitry is to provide the HSWP signal on line 2441. This signal is generated by high sweep control circuit 6030. This signal is used by the A3 digital storage circuitry shown in FIG. 56 to control signal tracking and conversion. It is also used by the frequency control circuitry shown in FIG. 24 to control the sweep generator in that circuit (the sweep is in progress when the signal HSWP is high and is stopped immediately at any point during the sweep when the signal HSWP goes low). Several circuits in the RF section sweep under certain conditions. For example, when a front panel key is pressed the A15 processor described with respect to FIGS. 38A–D pulls HSWP low to immediately stop the sweep. The signal HSWP is caused to go high by the occurrence of a sweep trigger or by a command which is input over instrument bus 2200.

The fast sweep generator circuit 6020 produces a linear ramp voltage from zero volts to approximately plus 2.2 volts which is used as a horizontal sweep for the CRT display. This signal is provided on line 6021. Data on instrument bus line 2200, lines 11 through 14 specify the fast sweep generator sweep time. The data is latched into register 6012 in fast sweep time control circuit 6010. The data on bus 2200 is strobed into register 6012 when the address line on address bus 2298 is address 51 and strobe signal LTIO occurs. Once the value is loaded into register 6012, switchable current sources 6015 provide the control signals on line 6016 and 6017 which are used along with the most significant bit signal on line 6018 by fast sweep generator 6020 to provide the fast sweep ramp signal on line 6021.

Fast sweep control 6050 contains circuitry for the end of sweep detection and controls fast sweep dead time as well as fast sweep triggering. End of sweep detection is determined as follows: When the sweep ramp signal on line 6021 reaches about 2.2 volts, flip-flop 6052 is set and generates the signals on line 6053. This causes discharge switch 6026 to discharge timing capacitors 6023. This signal LRTRC on line 6053 is high during the sweep and supplies the retrace blanking signal to the intensity control circuitry shown in FIG. 59.

Multivibrator circuit 6057 controls the sweep dead time. The multivibrator is triggered at the end of the fast sweep ramp and holds flip-flop 6052 and 6053 reset for a time which is determined by the RC network 6056. In the preferred embodiment, the dead time is about 15 microseconds for sweep times and from one microsecond through 100 milliseconds and about 120 microseconds for sweep times from 200 microseconds through 10 milliseconds. Sweep trigger circuit 6040 produces triggers for all sweep times. It contains the video, external and line trigger circuits. The fast sweep free run oscillator 6042 triggers multiplexer circuit 6044 which provides the desired trigger signal on line 6049 and the fast sweep auto trigger circuit 6046. A valid trigger signal is provided on line 6049 when a negative going transition at the selected input of trigger multiplexer 6044 occurs. This trigger signal will start a sweep only if the fast sweep control circuit 6050 and the high sweep control circuit 6030 are in the proper states. Note that the trigger source desired is latched into trigger register 6041 and is received via data bus 2200.

In fast sweep mode, the X output of the line generator circuitry of FIG. 57 on line 5795 and the fast sweep ramp must be multiplexed to the X deflection amplifier shown in FIG. 61 to produce the display consisting of the graticule and characters with the fast sweep ramp and the analog video signal. The video signal from the video processor shown in FIG. 50 is multiplexed to the Y deflection amplifier shown in FIG. 60, when the fast sweep ramp is multiplexed to the X deflection amplifier. In fast sweep mode, the output from the line generator circuits of FIG. 57 is applied to the CRT deflection amplifiers following the completion of at least one fast sweep ramp.

To provide uniform intensity between the fast sweep trace and the other information displayed on the CRT, the fast sweep intensity control circuit 6070 generates a voltage to control the CRT beam intensity (Z-axis) when the fast sweep ramp is being multiplexed with the other signals. The FSZ signal is dependent on the duty cycle of the fast sweep ramp, i.e., the ratio of time during which the ramp is in progress to the sum of dead time and sweep time. In the preferred embodiment, this signal FSZ varies from about 150 millivolts for low beam intensity for high duty cycle operation to about 2 volts (high beam intensity for very low duty cycle operation). The signal LRTRC on line 6053 high during the fast sweep ramp provides a digital waveform which is averaged and inverted by transistors 6071 and its associated circuitry. This provides an output voltage to transistor 6072 that is dependent on the average value of the LRTRC signal.

Note that the signal HSWP on line 2441 may be cleared by setting instrument bus 2200 bit 13 high, selecting address 50 which will cause HSWP to be cleared at the next occurrence of strobe signal LTIO. Note that the signal HSWP may also be cleared by the digital control circuitry of FIG. 54 which provides the signal RSHS on line 6031.

FIGS. 61A and 61B show the X and Y deflection amplifiers which provide the drive signals to the CRT horizontal and vertical deflection plates.

Referring now to FIG. 62, there is shown the Z-axis circuitry of the preferred embodiment. This circuit receives two control signals from the intensity control circuitry shown in FIG. 58. One of these is a Z-axis signal on line 5998 which is a zero to 2 volt signal which is proportional to the CRT writing rate; the other is the blanking signal BLANK on line 5852. The Z signal after attenuation by the front panel intensity potentiometer 6222 drives the input stage of an amplifier comprising transistors 6226 and 6227. This amplifier supplies a differential current output to the focus gate amplifier circuitry 6250 and through the blanking switch circuitry 6210 to the control gate amplifier 6240.

The control gate amplifier 6240 is a virtual ground current summing junction. When the signal BLANK on line 5852 is low, transistor 6215 is off and the output of the control gate amplifier 6240 on line 6243 drops to a few volts blanking the CRT display.

The focus gate amplifier supplies a correction voltage on line 6253 to the focus grid of the CRT to compensate for defocusing effects which occur with varying intensity levels. The magnitude of this correction voltage is set by focus gain adjustment 6251.

FIG. 63 shows the schematic diagram of the keyboard switches of the preferred embodiment. Also shown is the circuitry for the status indicators which are activated as described in more detail above.

APPENDIX A

PROCESSOR 2015 MACHINE INSTRUCTIONS

NOTATION

Assembly language machine instructions are three-letter mnemonics. Each machine instruction source statement corresponds to a machine-operation in the object program produced by the assembler. Notation used is representing source statements is explained below:

| | |
|---|---|
| label | Optional statement label. Labels must begin with an alphabetic character, period, or certain other non-numeric characters. Labels may be one through five characters in length. If present, a label must begin in column 1. A space terminates a label. If a statement does not have label, then column 1 must be a blank. |
| m | Memory location. This can be an octal or decimal integer, a symbol used as a label elsewhere, or, an expression composed of a combination of these combined through + and - operators. Parentheses are not permitted in expressions. |
| n (lower case) | Numerical quantity. A numeric value that is not an address, but represents a shift or skip amount. |
| N (upper case) | Octal or decimal constant whose value is restricted to the range: $1 \le N \le 20_8 = 16_{10}$<br>ASMA allows N to also be any expression, provided that the value of the expression is within the stated range. |
| I | Indirect addressing indicator for memory reference instructions. Also indicates an automatic increment for place and withdraw instructions. |
| D | Decrement indicator for place and withdraw instructions. |
| P | Indicator used in Return instructions to instruct the IOC to pop its peripheral address stack. |
| reg. 0-7 | Register location. This can be an octal or decimal integer, or an assembler-pre-defined symbol. It might even be an expression. Regardless of what it is, it must have a value of $0_8$ through $7_8$, inclusive. |
| reg. 4-7 | Register location. Same rules as for reg. 0-7 above, except the value must be $4_8$ - $7_8$, inclusive. |
| .../... | The slash indicates the item on either side (but not both) may be used at this place in the source statement. |

| | |
|---|---|
| comments | Optional comments. Comments must be separated by at least one space from the material to the left of the comment. |
| [ ] | Brackets indicate that the item contained within them is optional. |

MEMORY REFERENCE GROUP

Each of the 14 memory reference instructions performs some operation based upon the contents of a referenced memory location. Unless the reference is to a location on the base page, it must be on the same current page as the instruction. The assembler determines which type of page-reference is used, and sets the B/C bit (bit 10) of the instruction accordingly. The least ten significant bits of the address of the referenced location are enclosed in bits 0-9 of the instruction. A memory reference may be indirect. In the source this is indicated with a ,I after the operand. This is assembled by making bit 15 of the instruction be a one.

| | | | |
|---|---|---|---|
| label | LDA | m [ ,I ] | comments |

Load A from m. The A register is loaded with the contents of the addressed memory location.

| | | | |
|---|---|---|---|
| label | LDB | m [ ,I ] | comments |

Load B from m. The B register is loaded with the contents of the addressed memory location.

| | | | |
|---|---|---|---|
| label | CPA | m [ ,I ] | comments |

Compare the contents of m with the contents of A; skip if unequal. The two 16-bit words are compared bit by bit. If they differ the next instruction is skipped, otherwise it is executed next.

| | | | |
|---|---|---|---|
| label | CPB | m [ ,I ] | comments |

Compare the contents of m with the contents of B; skip if unequal. The two 16-bit words are compared bit by bit. If they differ the next instruction is skipped, otherwise it is executed next.

| | | | |
|---|---|---|---|
| label | ADA | m [ ,I ] | comments |

Add the contents of m to A. The contents of the addressed memory location are added to those of A. The binary sum remains in A while the contents of m remain unchanged. If a carry occurs from bit 15 the E register is set to a one, otherwise, E is left unchanged. If an overflow occurs the OV register is set to a one, otherwise the OV register is left unchanged. The overflow condition occurs if there is a carry from either bits 14 or 15, but not both together.

| | | | |
|---|---|---|---|
| label | ADB | m [ ,I ] | comments |

Add the contents of m to B. Otherwise identical to ADA.

| | | | |
|---|---|---|---|
| label | STA | m [ ,I ] | comments |

Store the contents of A in m. The contents of the A register are stored into the addressed memory location, whose previous contents are lost.

| | | | |
|---|---|---|---|
| label | STB | m [ ,I ] | comments |

Store the contents of B in m. The contents of the B register are stored into the addressed memory location, whose previous contents are lost.

| | | | |
|---|---|---|---|
| label | JSM | m [ ,I ] | comments |

JSX is JSM to External Name

Jump to subroutine. JSM permits jumping to subroutines in either ROM or R/W memory. The value of the pointer in the return stack register (R) is incremented by one and the value of P (the location of the JSM) is stored in R,I. Program execution resumes at m.

| label | JMP | m [ ,I ] | comments |
|---|---|---|---|

JMX is JMP to External Name

Jump to m. Program execution continues at location m.

| label | ISZ | m [ ,I ] | comments |
|---|---|---|---|

Increment m; skip if zero. ISZ adds one to the contents of the referenced location, and writes the sum into that location. If the sum is zero, the next instruction is skipped. ISZ does not alter the contents of E and OV.

| label | DSZ | m [ ,I ] | comments |
|---|---|---|---|

Decrement m, skip if zero. DSZ subtracts one from the contents of the referenced location, and writes the difference into that location. If the difference is zero, the next instruction is skipped. DSZ does not alter the contents of E and OV.

| label | AND | m [ ,I ] | comments |
|---|---|---|---|

Logical and of A and m. The contents of A and m are and'ed, bit by bit, and the result is left in A.

| label | IOR | m [ ,I ] | comments |
|---|---|---|---|

Inclusive or of A and m. The contents of A and m are or'ed, bit by bit, and the result is left in A. The inclusive or is the "ordinary or" operation.

| label | RET | m [ ,P ] | comments |
|---|---|---|---|

Return. The R register is a pointer into a stack of words in R/W memory containing the addresses of previous subroutine calls. A read R,I occurs. That produces the address (P) of the latest JSM that occurred. The BPC then jumps to address P+n, and R is decremented. The value of n may range from -32 to 31, inclusive. The value of n is encoded into bits 0 through 5 of the instructions as a 6 bit, two's complement, binary number.

| label | CLA | comments |
|---|---|---|

Clear A.

of clearing the A register.

| label | CLB | comments |
|---|---|---|

Clear B.

of clearing the B register.

| label | NOP | comments |
|---|---|---|

Null operation.

SHIFT-ROTATE GROUP

The shift-rotate instructions perform re-arrangements of the bits of the A and B registers. Each shift-rotate instruction includes a four-bit field in which the shift or rotate amount is encoded. The number to be encoded in the field is represented by n. In the source text n may range from 1 to 16, inclusive. The four-bit field (bits 0 through 3) will contain the binary code for n-1.

| label | AAR | n | comments |
|---|---|---|---|

Arithmetic right shift of A. The A register is shifted right n places with the sign bit (bit 15) filling all vacated bit positions; the n+1 most significant bits become equal to the sign bit.

| | | | |
|---|---|---|---|
| label | ABR | n | comments |

Arithmetic right shift of B. The B register is shifted right n places with the sign bit (bit 15) filling all vacated bit positions; the n+1 most significant bits become equal to the sign bit.

| | | | |
|---|---|---|---|
| label | SAR | n | comments |

Shift A right. The A register is shifted right n places with all vacated bit positions cleared; the n most significant bits become zeros.

| | | | |
|---|---|---|---|
| label | SBR | n | comments |

Shift B right. The B register is shifted right n places with all vacated bit positions cleared: the n most significant bits become zeros.

| | | | |
|---|---|---|---|
| label | SAL | n | comments |

Shift A left. The A register is shifted left n places; the n least significant bits become zeros.

| | | | |
|---|---|---|---|
| label | SBL | n | comments |

Shift B left. The B register is shifted left n places; the n least significant bits become zeros.

| | | | |
|---|---|---|---|
| label | RAR | n | comments |

Rotate A right. The A register is rotated right n places, with bit 0 rotating into bit 15.

| | | | |
|---|---|---|---|
| label | RBR | n | comments |

Rotate B right. The B register is rotated right n places, with bit 0 rotating into bit 15.

ALTER-SKIP GROUP

The alter-skip instructions each contain a six bit field which allows a relative branch of any of 64 locations. The distance of the branch is represented by a displacement, n; n may be within the range of -32 to 31, inclusive.

The arguments for the instructions of this group are shown as *±n, or, m. An argument of n by itself will generally cause an error. Internally, the assembler subtracts the current value of * from the argument as part of the evaluation process. So *±n-* is simply ±n, and m-* becomes a relative displacement rather than an actual address. This business of subtracting * was done to allow symbols and addresses (these are m's) as arguments. Thus it is possible to write SZA HOOK. All that is required is that HOOK be within the allowable skip distance of the instruction.

Bits 0 through 5 are coded with the value of n (or m-*) as follows: if the value is positive or zero, bit 5 is zero, and bits 0 through 4 receive the straight binary code for the value of n - if the value is negative, bit 5 is a 1, and bits 0 through 4 receive a complemented and incremented binary code.

| For n or m-* = | bits 5 - 0 | meaning: |
|---|---|---|
| -32 | 100000 | if skip, next instruction is *-32 |
| - 7 | 111001 | if skip, next instruction is *-7 |
| - 1 | 111111 | if skip, next instruction is *-1 |
| 0 | 000000 | if skip, repeat this instruction |
| 1 | 000001 | do next instruction, regardless |
| 7 | 000111 | if skip, next instruction is *+7 |
| 31 | 011111 | if skip, next instruction is *+31 |

All instructions in the alter-skip group have the "skip" properties outlined above. Some of the instructions also have an optional "alter" property. This is where the general instruction form "skip if <some one bit condition>" is supplemented with the ability to alter the state of the bit mentioned in the condition. The alteration is to either set the bit, or clear it. If specified, the alteration is done *after* the condition is tested, never before.

To indicate in a source statement that an instruction includes the alter option, and to specify whether to clear or to set the tested bit, a comma-C or comma-S follows *±n/m. The C indicates clearing the bit, while an S indicates setting the bit.

The "alter" information is encoded into the 16 bit instruction word with 2 bits. For such instructions, bit 7 is called the H/$\overline{H}$ (Hold/Don't Hold) bit, and bit 6 is the C/S (Clear/Set) bit. If bit 7 is a zero (specifying H) the "alter" option is not active; neither S nor C followed n in the source statement of the instruction, and the tested bit is left unchanged. If bit 7 is a 1 (specifying $\overline{H}$), then "alter" option is active, and bit 6 specifies whether it is S or C.

| label | SZA | * ± n/m | comments |
|---|---|---|---|

Skip if A zero. If all 16 bits of the A register are zero, skip the amount indicated by n, or, to m.

| label | SZB | * ± n/m | comments |
|---|---|---|---|

Skip if B zero. If all 16 bits of the B register are zero, skip the amount indicated by n, or, to m.

| label | RZA | * ± n/m | comments |
|---|---|---|---|

Skip if A not zero. If any of the 16 bits of the A register are set, skip the amount indicated by n, or, to m.

| label | RZB | * ± n/m | comments |
|---|---|---|---|

Skip if B not zero. If any of the 16 bits of the B register are set, skip the amount indicated by n, or, to m.

| label | SIA | * ± n/m | comments |
|---|---|---|---|

Skip if A zero, and then increment A. The A register is tested, and then incremented by one. If all 16 bits of A were zero before the increment, skip the amount indicated by n, or, to m. SIA does not affect the contents of E or OV.

| label | SIB | * ± n/m | comments |
|---|---|---|---|

Skip if B zero, and then increment B. The B register is tested, and then incremented by one. If all 16 bits of B were zero before the increment, skip the amount indicated by n, or, to m. SIB does not affect the contents of E or OV.

| label | RIA | * ± n/m | comments |
|---|---|---|---|

Skip if A not zero, and then increment A. The A register is tested, and then incremented by one. If any bits of A were one before the increment, skip the amount indicated by n, or, to m. RIA does not affect the contents of E or OV.

| label | RIB | * ± n/m | comments |
|---|---|---|---|

Skip if B not zero, and then increment B. The B register is tested, and then incremented by one. If any bits of B were one before the increment, skip the amount indicated by n, or, to m. RIB does not affect the contents of E or OV.

In connection with the next four instructions, Flag and Status are controlled by the peripheral interface addressed by the current select code. The select code is the number that is stored in the register named PA, located in the IOC. Both Status and Flag originate such that when a missing interface is addressed Status and Flag will appear to be false, or not set.

| label | SFS | * ± n/m | comments |
|---|---|---|---|

Skip if Flag line set. If the Flag line is true, skip the amount indicated by n, or, to m.

| label | SFC | * ± n/m | comments |
|---|---|---|---|

Skip if Flag line clear. If the Flag line is false, skip the amount indicated by n, or, to m.

| label | SSS | * ± n/m | comments |
|---|---|---|---|

Skip if Status line set. If the Status line is true, skip the amount indicated by n, or, to m.

| label | SSC | * ± n/m | comments |
|---|---|---|---|

Skip if Status line clear. If the Status line is false, skip the amount indicated by n, or, to m.

| label | SDS | * ± n/m | comments |
|---|---|---|---|

Skip if Decimal Carry set. Decimal Carry (DC) is a one-bit register in the EMC. It is controlled by the EMC, but connected to the decimal carry input of the BPC. If DC is set, skip the amount indicated by n, or, to m.

| label | SDC | * ± n/m | comments |
|---|---|---|---|

Skip if Decimal Carry clear. Decimal Carry (DC) is a one-bit register in the EMC. It is controlled by the EMC, but connnected to the decimal carry input of the BPC. If DC is clear, skip the amount indicated by n, or, to m.

| label | SHS | * ± n/m | comments |
|---|---|---|---|

Skip if Halt line set. If the Halt line is true, skip the amount indicated by n, or, to m.

| label | SHC | * ± n/m | comments |
|---|---|---|---|

Skip if Halt line clear. If the Halt line if false, skip the amount indicated by n, or, to m.

| label | SLA | * ± n/m [ ,S/,C ] | comments |
|---|---|---|---|

Skip if the least significant bit of A is zero. If the least significant bit (bit 0) of the A register is a zero, skip the amount indicated by n, or, to m. If either S or C is present, bit 0 is altered accordingly after the test.

| label | SLB | * ± n/m [ ,S/,C ] | comments |
|---|---|---|---|

Skip if the least significant bit of B is zero. If the least significant bit (bit 0) of the B register is a zero, skip the amount indicated by n, or, to m. If either S of C is present, bit 0 is altered accordingly after the test.

| label | RLA | * ± n/m [ ,S/,C ] | comments |
|---|---|---|---|

Skip if the least significant bit of A is non-zero. If the least significant bit (bit 0) of the A register is a one, skip the amount indicated by n, or, to m. If either S or C is present, bit 0 altered accordingly after the test.

| label | RLB | * ± n/m [ ,S/,C ] | comments |
|---|---|---|---|

Skip if the least significant bit of B is non-zero. If the least significant bit (bit 0) of the B register is a one, skip the amount indicated by n, or, to m. If either S or C is present, bit 0 is altered accordingly after the test.

| label | SAP | * ± n/m [ ,S/,C ] | comments |
|---|---|---|---|

Skip if A positive. If the sign bit (bit 15) of the A register is a zero, skip the amount indicated by n, or, to m. If either S or C is present, bit 15 is altered accordingly after the test.

| | | | |
|---|---|---|---|
| label | SBP | * ± n/m [ ,S/,C ] | comments |

Skip if B positive. If the sign bit (bit 15) of the B register is a zero, skip the amount indicated by n, or, to m. If either S or C is present, bit 15 is altered accordingly after the test.

| | | | |
|---|---|---|---|
| label | SAM | * ± n/m [ ,S/,C ] | comments |

Skip if A minus. If the sign bit (bit 15) of the A register is a one, skip the amount indicated by n, or, to m. If either S or C is present, bit 15 is altered accordingly after the test.

| | | | |
|---|---|---|---|
| label | SBM | * ± n/m [ ,S/,C ] | comments |

Skip if B minus. If the sign bit (bit 15) of the B register is a one, skip the amount indicated by n, or, to m. If either S or C is present, bit 15 is altered accordingly after the test.

| | | | |
|---|---|---|---|
| label | SOS | * ± n/m [ ,S/,C ] | comments |

Skip if overflow set. If the one-bit overflow register (OV) is set, skip the amount indicated by n, or, to m. If either S or C is present, the OV register is altered accordingly after the test.

| | | | |
|---|---|---|---|
| label | SOC | * ± n/m [ ,S/,C ] | comments |

Skip if overflow clear. If the one-bit overflow register is clear, skip the amount indicated by n, or, to m. If either S or C is present, the OV register is altered accordingly after the test.

| | | | |
|---|---|---|---|
| label | SES | * ± n/m [ ,S/,C ] | comments |

Skip if extend set. If the extend register (E) is set, skip the amount indicated by n, or, to m. If either S or C is present, E is altered accordingly after the test.

| | | | |
|---|---|---|---|
| label | SEC | * ± n/m [ ,S/,C ] | comments |

Skip if extend clear. If the extend register (E) is clear, skip the amount indicated by n, or, to m. If either S or C is present, E is altered accordingly after the test.

COMPLEMENT-EXECUTE GROUP

| | | |
|---|---|---|
| label | CMA | comments |

Complement A. The A register is replaced by its one's (bit by bit) complement.

| | | |
|---|---|---|
| label | CMB | comments |

Complement B. The B register is replaced by its one's (bit by bit) complement.

| | | |
|---|---|---|
| label | TCA | comments |

Two's complement A. The A register is replaced by its one's (bit by bit) complement, and then incremented by one. The E and OV registers are updated according to the results of the increment, in the same fashion as for the ADA instruction.

| | | |
|---|---|---|
| label | TCB | comments |

Two's complement B. The B register is replaced by its one's (bit by bit) complement, and the incremented by one. The E and OV registers are updated according to the results of the increment, in the same fashion as for the ADB instruction.

| label | EXE | $0 \le m \le 37_8$ [ ,I ] | comments |
|---|---|---|---|

Execute register m. The contents of any register can be treated as the current instruction, and executed in the normal manner. The register is left unchanged unless the instruction code causes it to be altered. The next instruction executed will be the one following the EXE m, unless the code in m causes a branch.

Indirect addressing is allowed. An EXE m, I causes the contents of m to be taken as the address of the place in memory whose contents are to be executed; this can be anywhere in memory, and need not be another register. In 15-bit versions of the processor, multi-level indirect addressing with EXE instruction is possible. Only one level is possible with the 16-bit processor.

STACK GROUP

The stack group manages first-in, last-out firmware stacks. The "place" instructions put a word or byte into a stack pointed at by C or D.* The item that is placed is reg. 0-7. The "withdraw" instructions remove a word or a byte from a stack pointed at by C or D. The removed item is written into reg. 0-7.

By the end of each place or withdraw instruction the stack pointer is either incremented or decremented, as specified by the optional I or D, respectively. In the absence of either an I or a D, the assembler defaults to I for place instructions, and D for withdraw instructions.

Place instructions increment or decrement the stack pointer prior to the placement, and withdraw instructions do it after the withdrawal. In this way the pointer is always left pointing at the top of the stack.

For byte operations using 15-bit version of the processor bit 15 of the pointer register (C or D) indicates left or right half (1 = left, 0 = right). Stack instructions involving bytes toggle bit 15 at each increment or decrement; but the lower bits of the pointer increment or decrement only during the zero-to-one transition of bit 15.

In the 16-bit version of the processor, the least-significant bit of the pointer register indicates left or right half (1 = left, 0 = right). Full 16-bit addressing is maintained by a most-significant bit (for each pointer register) in the form of the CB and DB registers. The C and CB registers, and D and DB registers, act as 17-bit registers during the automatic increment or decrement to the pointer registers.

The values of C and D for place-byte instructions must not be the address of any internal register for the BPC, EMC, or IOC. The place and withdraw instructions can also initiate I/O operations, so they are also listed under the I/O group.

| label | PWC | reg. 0-7 [,I/,D] | comments |
|---|---|---|---|

Place the entire word of reg. into the stack pointed at by C.

| label | PWD | reg. 0-7 [,I/,D] | comments |
|---|---|---|---|

Place the entire word of reg. into the stack pointed at by D.

| label | PBC | reg. 0-7 [,I/,D] | comments |
|---|---|---|---|

Place the right half of reg. into the stack pointed at by C.

| label | PBD | reg. 0-7 [,I/,D] | comments |
|---|---|---|---|

Place the right half of reg. into the stack pointed at by D.

* C and D are registers in the IOC; addresses $16_8$ and $17_8$, respectively.

| label | WWC | reg. 0-7 [,I/,D] | comments |
|---|---|---|---|

Withdraw an entire word from the stack pointed at by C, and put it into reg.

| label | WWD | reg. 0-7 [,I/,D] | comments |
|---|---|---|---|

Withdraw an entire word from the stack pointed at by D, and put it into reg.

| label | WBC | reg. 0-7 [,I/,D] | comments |
|---|---|---|---|

Withdraw a byte from the stack pointed at by C, and put it into the right half of reg.

| label | WBD | reg. 0-7 [,I/,D] | comments |
|---|---|---|---|

Withdraw a byte from the stack pointed at by D, and put it into the right half of reg.

| label | CBL* | comments |
|---|---|---|

Set the CB register to a zero. This specifies the lower block of memory pointed at by C and CB.

| label | CBU* | comments |
|---|---|---|

Set the CB register to a one. This specifies the upper block of memory pointed at by C and CB.

| label | DBL* | comments |
|---|---|---|

Set the DB register to a zero. This specifies the lower block of memory pointed at by D and DB.

| label | DBU* | comments |
|---|---|---|

Set the DB register to a one. This specifies the upper block of memory pointed at by D and DB.

* Part of the 16-bit processor's instruction set only.

I/O GROUP

The states of $\overline{IC1}$ and $\overline{IC2}$ during the I/O Bus Cycles initiated by the instructions below depend upon which register is the operand of the instruction:

| | $\overline{IC1}$ | $\overline{IC2}$ |
|---|---|---|
| R4 | 1 | 1 |
| R5 | 1 | 0 |
| R6 | 0 | 1 |
| R7 | 0 | 0 |

| label | mem. ref. inst. | reg. 4-7 [,I] | comments |
|---|---|---|---|

Initiate an I/O Bus Cycle. Memory reference instructions 'reading' from reg. cause input I/O Bus Cycles; those 'writing' to reg. cause output I/O Bus Cycles. In either case the exchange is between A or B and the interface addressed by the PA register (Peripheral Address Register - $11_8$); reg. 4-7 do not really exist as physical registers within any chip on the IDA Bus.

| label | stack inst. | reg. 4-7 [,I/,D] | comments |
|---|---|---|---|

Initiate an I/O Bus Cycle. Place instructions 'read' from reg., therefore they cause input I/O Bus Cycles. Withdraw instructions 'write' into reg., therefore they cause output I/O Bus Cycles. In either case the exchange is between the addressed stack location and the interface addressed by PA.

INTERRUPT GROUP

| label | EIR | comments |
|---|---|---|

Enable the interrupt system. This instruction cancels DIR.

| label | DIR | comments |
|---|---|---|

Disable the interrupt system. This instruction cancels EIR.

DMA GROUP

| label | SDO* | comments |
|---|---|---|

Set DMA outwards. This instruction specifies the read-from-memory, write-to-peripheral direction for DMA transfers.

| label | SDI* | comments |
|---|---|---|

Set DMA inwards. This instruction specifies the read-from-peripheral, write-to-memory direction for DMA transfers.

| label | DMA | comments |
|---|---|---|

Enable the DMA mode. This instructions cancels PCM and DDR.

| label | PCM | comments |
|---|---|---|

Enable the Pulse Count Mode. This instruction cancels DMA and DDR.

| label | DDR | comments |
|---|---|---|

Disable Data Request. This instruction cancels the DMA Mode and the Pulse Count Mode.

THE FOUR-WORD GROUP

| label | CLR | N | comments |
|---|---|---|---|

Clear N words. This instruction clears N consecutive words, beginning with location < A >. Remember: $1 \leq N \leq 16_{10}$.

0 → location < A >

0 → location < A > + 1

∘

∘

∘

0 → location < A > + N - 1

| label | XFR | N | comments |
|---|---|---|---|

Transfer N words. This instruction transfers the N consecutive words beginning at location < A > to those beginning at < B >. Remember: $1 \leq N \leq 16_{10}$.

location < A > → location < B > location < A > + 1 → location < B > + 1

∘

∘

∘ location < A > + N - 1 → location < B > + N - 1

THE MANTISSA SHIFT GROUP

| label | MRX | comments |
|---|---|---|

Mantissa right shift of AR1 r-times, $r = < B_{0-3} >$, and $0 \leq r \leq 17_8 = 15_{10}$.

1st shift: $< A_{0-3} > \rightarrow D_1; \ldots. < D_j > \rightarrow D_{j+1}; \ldots.$ $D_{12}$ is lost
jth shift: $0 \rightarrow D_1; \ldots. < D_j > \rightarrow D_{j+1}; \ldots.$ $D_{12}$ is lost
rth shift: $0 \rightarrow D_1; \ldots. < D_j > \rightarrow D_{j+1}; \ldots. < D_{12} > \rightarrow A_{0-3};\ 0 \rightarrow DC;\ 0 \rightarrow A_{4-15}$ Notice:

1) The first shift does not necessarily shift in a zero; the first shift shifts in $< A_{0-3} >$.
2) The last digit shifted out ends up as $< A_{0-3} >$.
3) If only one digit-shift is done, (1) and (2) happen together.
4) After (2), SE is the same as $< A_{0-3} >$.
5) Any more than eleven shifts is wasteful.

| label | MRY | comments |
|---|---|---|

Mantissa right shift of AR2 $< B_{0-3} >$ -times. Otherwise identical to MRX.

| label | MLY | comments |
|---|---|---|

Mantissa left shift of AR2 one time.
$< A_{0-3} > \rightarrow D_{12}; \ldots < D_j > \rightarrow D_{j-1}; \ldots. < D_1 > \rightarrow A_{0-3};\ 0 \rightarrow DC;\ 0 \rightarrow A_{4-15}$ At the conclusion of the operation SE equals $< A_{0-3} >$.

| label | DRS | comments |
|---|---|---|

Mantissa right shift of AR1 one time.
$0 \rightarrow D_1; \ldots. < D_j > \rightarrow D_{j+1}; \ldots. < D_{12} > \rightarrow A_{0-3};\ 0 \rightarrow DC;\ 0 \rightarrow A_{4-15}$ At the conclusion of the operation SE equals $< A_{0-3} >$.

| label | NRM | comments |
|---|---|---|

Normalize AR2. The mantissa digits of AR2 are shifted left until $D_1 \neq 0$. If the original $D_1$ is non-zero, no shifts occur. If twelve shifts occur, then AR2 equals zero, and no further shifts are done. The number of shifts is stored as a binary number in B i. $0 \rightarrow B_{4-15}$; # of shifts $\rightarrow B_{0-3}$
ii. For $0 \leq < B_{0-3} > \leq 11$; $0 \rightarrow DC$
iii. If $< B_{0-3} > = 12$; $1 \rightarrow DC$

THE ARITHMETIC GROUP

| label | CMX | comments |
|---|---|---|

Ten's complement of AR1. The mantissa of AR1 is replaced with its ten's complement, and DC is set to zero.

The bug concerns the way Sync is treated. Under the right conditions a bus grant (think "DMA cycle") causes the EMC to give Sync too early. The result is simultaneous use of the IDA Bus by the EMC and BPC. The most apparent result is that the next instruction fetch by the BPC is garbled, which is a disaster.

| label | CMY | comments |
|---|---|---|

Ten's complement of AR2. The mantissa of AR2 is replaced with it ten's complement, and DC is set to zero.

| label | CDC | comments |
|---|---|---|

Clear Decimal Carry. Clears the DC register; $0 \rightarrow DC$.

| label | FXA | comments |
|---|---|---|

Fixed-point addition. The mantissas of AR1 and AR2 are added together, along with DC (as a $D_{12}$ -digit), and the result is placed in AR2. If an overflow occurs, DC is set to one, otherwise, DC is set to zero at the completion of the addition.

During the addition the exponents are not considered, and are left strictly alone. The signs are also left completely alone.

```
     < AR1 > =  D1  D2  D3--------D12
     < AR2 > =  D1  D2  D3--------D12
           +                    < DC > ← initial value of DC
   ------------------------------------
(overflow) → "D0" D1  D2  D3--------D12 → AR2
               ↘ DC (final value of DC)
```

| label | MWA | comments |
|---|---|---|

Mantissa Word Add. < B > is taken as four BCD digits, and added, as $D_9$ through $D_{12}$, to AR2. DC is also added in as a $D_{12}$. The result is left in AR2. If an overflow occurs, DC is set to one, otherwise, DC is set to zero at the completion of the addition.

During the addition the exponents are not considered, and are left strictly alone, as are the signs. MWA is intended primarily for use in rounding routines.

```
      < B > =  --------D9   D10  D11  D12
    < AR2 > =  D1------D9   D10  D11  D12
          +                    < DC > ← initial value of DC
   ------------------------------------------
(overflow) → "D0"  D1------D9   D10  D11  D12 → AR2
               ↘ DC (final value of DC)
```

| label | FMP | comments |
|---|---|---|

Fast multiply. The mantissas of AR1 and AR2 are added together (along with DC as $D_{12}$) < $B_{0-3}$>-times; the result accumulates in AR2.

The repeated additions are likely to cause some unknown number of overflows to occur. The number of overflows that occurs is returned in $A_{0-3}$.

FMP is used repeatedly to accumulate partial products during BCD multiplication. FMP operates strictly upon mantissa portions; signs and exponents are left strictly alone.

$$< AR2 > + ((< AR1 >) \cdot (< B_{0-3} >)) + DC \rightarrow AR2$$

DC doesn't enter into these repeated additions except for the first one as shown at right. 0 → DC immediately after each overflow.

Represents the initial value of DC.

$0 \rightarrow DC$, $0 \rightarrow A_{4-15}$ # of overflows $\rightarrow A_{0-3}$

| label | MPY | comments |
|---|---|---|

Binary Multiply Using Booth's Algorithm. The (binary) signed two's complement contents of the A and B registers are multiplied together. The thirty-two bit product is also a signed two's complement number, and is stored back into A and B. B receives the sign and most-significant bits, and A the least-significant bits:

$$< A > \cdot < B > \rightarrow \widehat{< B > < A >}$$

| label | FDV | comments |
|---|---|---|

Fast Divide. The mantissas of AR1 and AR2 are added together until the first decimal overflow occurs. The result of these additions accumulates into AR2. The number of additions without overflow (n) is placed into B.

$$< AR2 > + < AR1 > + < DC > \rightarrow AR2 \quad \text{(repeatedly until overflow)}$$

then $$0 \rightarrow DC, \quad 0 \rightarrow B_{4-15}, \quad n \rightarrow B_{0-3}$$

FDV is used in floating-point division to find the quotient digits of a division. In general, more than one application of FDV is needed to find each digit of the quotient.

As with the other BCD instructions, the signs and exponents of AR1 and AR2 are left strictly alone.

APPENDIX B-1

```
ASMB,R,L
                                       HED FLT POINT MATH ROUTINES - HYBRID VERSION
                                       NAM BPCFP,7  ET10585-1009A \
*
*     A-ET10585-1008A-2
*       ET10585-1008A   (S)
*       ET10585-1009A   (R)
*     16 MAR 1978
*     LYNN WHEELWRIGHT
*
       0                               EXT AR1LD,.LADC,.MPYD,.DIVF,AR1LN,AR1LP,AR1L
       0                               ENT DIV1,DIV1B,DIV1P,DIV1T,MPY1,MPY1B,MPY1P
       0                               ENT MPY1T,ADD1,ADD1B,ADD1P,ADD1T,SUB1,SUB1B
       0                               ENT SUB1P,SUB1T,MIN1,MIN1B,MIN1P,MIN1T
       0                               EXT .AMIN,.BMIN,AR0D,AR1D,AR2D,AR3D
       0                        A      EQU 0
       1                        B      EQU 1
       3                        R      EQU 3
      16                        C      EQU 16B
      17                        D      EQU 17B
   77763                        E      EQU 77763B
      20                        AR2    EQU 20B
   77770                        AR1    EQU 77770B
   77774                        AR0    EQU 77774B
   77764                        AR3    EQU 77764B
*
*
* FLOATING POINT SUBTRACT
*
       0  42000        1X  SUB1   JSM AR1LD
       1  42000       10X         JSM .AMIN
       2  66000       34R         JMP FADC
       3  42000        5X  SUB1B  JSM AR1LN
       4  66000        1R         JMP SUB1+1
       5  42000        6X  SUB1P  JSM AR1LP
       6  66000        1R         JMP SUB1+1
       7  42000        7X  SUB1T  JSM AR1LT
      10  66000        1R         JMP SUB1+1
*
* FLOATING POINT ADD
*
      11  42000       11X  MIN1B  JSM .BMIN
      12  42000        5X  ADD1B  JSM AR1LN          OPERAND ADDRESS ON CSTAK
      13  66000       34R         JMP FADC
      14  42000       11X  MIN1   JSM .BMIN
      15  42000        1X  ADD1   JSM AR1LD
      16  66000       34R         JMP FADC
      17  42000       11X  MIN1P  JSM .BMIN
      20  42000        6X  ADD1P  JSM AR1LP
      21  66000       34R         JMP FADC
      22   2000      162R  SFTA   LDA =D-12
      23 174040                   TCB
      24  20001        1A         ADA B
      25 172004                   SAP X11            ANYTHING TO DO?
      26   2000      163R         LDA =D0            YES
      27  75400                   MRX
      30  66000       55R         JMP ADONE
      31 170201            X11    RET 1
      32  42000       11X  MIN1T  JSM .BMIN
      33  42000        7X  ADD1T  JSM AR1LT          OPERAND ON CSTAK
      34   1770    77770A  FADC   LDA AR1
      35   4020       20A         LDB AR2
      36 170405                   AAR 6
      37 174405                   ABR 6
      40 174040                   TCB
      41  24000                   ADB A
      42  76413                   SZB ADONE          EXPON=?
      43 176457                   SBM SFTA           NO
      44   2000      162R         LDA =D-12
      45  20001        1A         ADA B
      46 172023                   SAP AR12           WORTH SHIFTING?
      47      1        1A         LDA B              YES
```

```
   50 170605              SAL 6
   51  20020   20A        ADA AR2         FIX UP EXPONENT
   52  30020   20A        STA AR2
   53   2000  163R        LDA =D0
   54  75500              MRY             SHIF ACCUM MANTISSA
   55  42000    2X  ADDNE JSM .LADC
   56  72717              SDC NORM
   57     20   20A        LDA AR2
   60  22000  164R        ADA =B100
   61  30020   20A        STA AR2
   62   2000  165R        LDA =D1
   63   6000  165R        LDB =D1
   64  75500              MRY
   65  22000  166R        ADA =D-5
   66 172402              SAM *+2
   67  71000              MWA
   70 170201              RET 1
   71   2000   13X  AR12  LDA AR1D
   72   6000   14X        LDB AR2D
   73  71403              XFR 4
   74 170201              RET 1
   75  71500        NORM  NRM
   76  72306              SDS NZERO
   77 174605              SBL 6
  100 174040              TCB
  101  24020   20A        ADB AR2
  102  34020   20A        STB AR2
  103 170201              RET 1
  104   6000  167R  NZERO LDB =B100100
  105  34020   20A        STB AR2
  106 170201              RET 1
* FLOATING POINT MULTIPLY
  107  42000    6X  MPY1P JSM AR1LP
  110  66000  116R        JMP FMPC
  111  42000    5X  MPY1B JSM AR1LN       OPERAND ADDRESS ON CSTAK
  112  66000  116R        JMP FMPC
  113  42000    1X  MPY1  JSM AR1LD
  114  66000  116R        JMP FMPC
  115  42000    7X  MPY1T JSM AR1LT       OPERAND ON CSTAK
  116  42000    3X  FMPC  JSM .MPYD
  117   2000   12X        LDA AR0D
  120   6000   13X        LDB AR1D
  121  71403              XFR 4
  122  71500              NRM
  123  76412              SZB FMPX
  124 174040              TCB
  125      1    1A        LDA B
  126 170605              SAL 6
  127  20020   20A        ADA AR2
  130  30020   20A        STA AR2
  131  26000  170R        ADB =D12
  132   2000  163R        LDA =D0
  133  75400              MRX
  134  71200              FXA
  135 170201        FMPX  RET 1
*
  136  42000    6X  DIV1P JSM AR1LP
  137  66000  145R        JMP FDVC
  140  42000    5X  DIV1B JSM AR1LN       OPERAND ADDRESS ON CSTAK
  141  66000  145R        JMP FDVC
  142  42000    1X  DIV1  JSM AR1LD
  143  66000  145R        JMP FDVC
  144  42000    7X  DIV1T JSM AR1LT       OPERAND ON CSTAK
  145   1771 77771A FDVC  LDA AR1+1
  146  61772 77772A       IOR AR1+2
  147  61773 77773A       IOR AR1+3
  150  72002              RZA FDVD
  151 170201              RET 1
  152  42000    4X  FDVD  JSM .DIVF
  153   2000   13X        LDA AR1D
  154   6000   14X        LDB AR2D
  155  71403              XFR 4
  156     20   20A        LDA AR2
  157  22000  164R        ADA =B100
  160  30020   20A        STA AR2
  161  66000   75R        JMP NORM
  161                     END
  162 177764
  163      0
  164    100
  165      1
  166 177773
  167 100100
  170     14

.AR1M   10X     .BMIN   11X     .DIVF   4X      .LADC   2X
.MPYD   3X      0       163R    1       165R    100     164R
100100  167R    14      170R    177764  162R    177773  166R

A       0A      ADD1    15R     ADD1B   12R     ADD1P   20R
ADD1T   33R     ADDNE   55R     AR0     77774A  AR0D    12X
AR1     77770A  AR12    71R     AR1D    13X     AR1LD   1X
AR1LN   5X      AR1LP   6X      AR1LT   7X      AR2     20A
AR2D    14X     AR3     77764A  AR3D    15X     B       1A
C       16A     D       17A     DIV1    142R    DIV1B   140R
```

```
DIV1F   136R     DIV1I   144R     E       77763A   FADC    34R
FDVC    145R     FDVD    152R     FMPC    116R     FMPX    135R
MIN1    14R      MIN1B   11R      MIN1P   17R      MIN1T   32R
MPY1    113R     MPY1B   111R     MPY1P   107R     MPY1I   115R
NORM    75R      NZERO   104R     R       3A       SFTA    22R
SUB1    0R       SUB1B   3R       SUB1P   5R       SUB1I   7R
XI1     31R

KSPMAX=2 MSPMAX=39 NSPMAX=6 SSPMAX=339 DSPMAX=61
```

APPENDIX B-2

```
ASMB,R,L
                                          HED MATH ROUTINES - CHIP VERSION \
                                          NAM BPCMC,7  ET10585-1011A \
 *
 *     A-ET10585-1010A-2
 *       ET10585-1010A   (S)
 *       ET10585-1011A   (R)
 *       12 JUN 1978
 *       LYNN WHEELWRIGHT
 *
       0                                  ENT AR1LD,.LADC,.MPYD,.DIVD,.DIVF,AR1LN,AR1L
       0                                  ENT .AMIN,.BMIN,AR1LP,.BDVF,.BDVS
       0                                  ENT ADD2,ADD3,ADD2B,ADD3B,ADD4B
       0                                  ENT ADD2P,ADD3P,ADD4P,ADD2T,ADD4T
       0                                  ENT MIN2,MIN3,MIN2B,MIN3B,MIN4B
       0                                  ENT MIN2P,MIN3P,MIN4P,MIN2T,MIN4T
       0                                  ENT SUB2,SUB3,SUB2B,SUB3B,SUB4B
       0                                  ENT SUB2P,SUB3P,SUB4P,SUB2T,SUB4T
       0                                  ENT MPY2,MPY3,MPY2B,MPY3B,MPY4B
       0                                  ENT MPY2P,MPY3P,MPY4P,MPY2T,MPY4T
       0                                  ENT DIV2,DIV3,DIV4,DIV2B,DIV3B,DIV4B
       0                                  ENT DIV2P,DIV4P,DIV2T,DIV4T
       0                                  ENT MOD2,MOD3,MOD4,MOD2B,MOD3B,MOD4B
       0                                  ENT MOD2P,MOD3P,MOD4P,MOD2T,MOD4T
       0                                  ENT ADD3T,SUB3T,MIN3T,MPY3T,DIV3T,MOD3T
       0                                  EXT AR0D,AR1D,AR2D,AR3D,.FRPB
       0                           A      EQU 0
       1                           B      EQU 1
       3                           R      EQU 3
      16                           C      EQU 16B
      17                           D      EQU 17B
   77763                           E      EQU 77763B
      20                           AR2    EQU 20B
       0        21                 AR2M   ABS AR2+1
   77770                           AR1    EQU 77770B
       1     77771                 AR1M   ABS AR1+1
   77774                           AR0    EQU 77774B
       2     77775                 AR0M   ABS AR0+1
       3     77777                 AR0L   ABS AR0+3
   77764                           AR3    EQU 77764B
       4     77765                 AR3M   ABS AR3+1
       5     77767                 AR3L   ABS AR3+3
 *
   77762                           TMPA   EQU 77762B
   77761                           TMPB   EQU 77761B
   77760                           CNTR   EQU 77760B
   77757                           TMP    EQU 77757B
   77756                           INDX   EQU 77756B
 *
 * LONG SUB
 *
       6  42000      437R  SUB2   JSM AR1LD
       7  42000      461R         JSM .AMIN
      10  66000       32R         JMP .LADC
      11  42000      443R  SUB2B  JSM AR1LN
      12  66000        7R         JMP SUB2+1
      13  42000      447R  SUB2P  JSM AR1LP
      14  66000        7R         JMP SUB2+1
      15  42000      454R  SUB2I  JSM AR1LI
      16  66000        7R         JMP SUB2+1
 *
 * LONG ADD
 *
      17  42000      473R  MIN2P  JSM .BMIN
      20  42000      447R  ADD2P  JSM AR1LP
      21  66000       32R         JMP .LADC
      22  42000      473R  MIN2B  JSM .BMIN
      23  42000      443R  ADD2B  JSM AR1LN        OPERAND ADDRESS ON CSTAK
      24  66000       32R         JMP .LADC
      25  42000      473R  MIN2   JSM .BMIN
      26  42000      437R  ADD2   JSM AR1LD
      27  66000       32R         JMP .LADC
      30  42000      473R  MIN2I  JSM .BMIN
      31  42000      454R  ADD2I  JSM AR1LI        OPERAND ON CSTAK
      32   1770    77770A  .LADC  LDA AR1
      33  20020       20A         ADA AR2
      34   4020       20A         LDB AR2
      35  71700                   CDC              CLEAR CARRY
      36  73403                   RLA OPSGN
      37  71200                SMSGN EXA
      40 170201                   RET 1
      41  77613                OPSGN RLB NAR2,C    OPPOSITE SIGNS
      42   1770    77770A         LDA AR1
      43  73201                   SLA *+1,C
      44  31770    77770A         STA AR1
      45   1771    77771A         LDA AR1+1
      46  61772    77772A         IOR AR1+2
```

```
 47  61773  77773A        IOR AR1+3
 50  72002                RZA *+2
 51 170201                RET 1           NOTHING TO DO
 52  71140                CMX             COMPLEMENT AR1
 53  66000     66R        JMP DOIT
 54  34020     20A  NAR2  STB AR2
 55     21     21A        LDA AR2+1
 56  60022     22A        IOR AR2+2
 57  60023     23A        IOR AR2+3
 60  72005                RZA DOIT-1
 61   2000      2X        LDA AR1D        MOVE AR1 TO AR2
 62   6000      3X        LDB AR2D
 63  71403                XFR 4
 64 170201                RET 1
 65  71040                CMY             COMPLEMENT AR2 (ACCUM)
 66  71200          DOIT  EXA
 67  72303                SDS CXIT        CARRY?
 70  44020     20A        ISZ AR2         NO, SET SIGN NEGATIVE
 71  71040                CMY             COMPLEMENT ACCUM
 72  71700          CXIT  CDC             CLEAR CARRY
 73 170201                RET 1
*
* LONG MULTIPLY
*
 74  42000    447R  MPY2P JSM AR1LP
 75  66000    101R        JMP SMPYC
 76  42000    443R  MPY2B JSM AR1LN       OPERAND ADDRESS ON CSTAK
 77  66000    101R        JMP SMPYC
100  42000    454R  MPY2I JSM AR1LI       OPERAND ON CSTAK
101  42000    110R  SMPYC JSM .MPYD
102   2000      2R        LDA AR0M        MOVE AR0 TO AR2
103   6000                LDB AR2M
104  71402                XFR 3
105 170201                RET 1
106  42000    437R  MPY2  JSM AR1LD
107  66000    101R        JMP SMPYC
*
110   6000      3R  .MPYD LDB AR0L
111  35756  77756A        STB INDX
112   6000      5R        LDB AR3L
113  35757  77757A        STB TMP
114   2000                LDA AR2M        MOVE AR2 TO AR3
115   6000      4R        LDB AR3M
116  71402                XFR 3
117  71602                CLR 3
120   2000      2R        LDA AR0M        CLEAR AR0,AR2
121  71602                CLR 3
122  71700                CDC
123  42000    137R        JSM MPY40
124  55757  77757A        DSZ TMP
125  55756  77756A        DSZ INDX
126  42000    137R        JSM MPY40
127  55757  77757A        DSZ TMP
130  55756  77756A        DSZ INDX
131  42000    137R        JSM MPY40
132   1770  77770A        LDA AR1
133  20020     20A        ADA AR2
134  52000    725R        AND =B177701
135  30020     20A        STA AR2
136 170201                RET 1
137   2000    726R  MPY40 LDA =D-4
140  31760  77760A        STA CNTR
141 105757  77757A  MPY42 LDB TMP,I       INDX=PRODUCT
142  76415                SZB MPY50       TMP=MPYR
143 174703                RBR 4
144 135757  77757A        STB TMP,I
145 174513                SBR 12
146  75000                FMP
147   6000    727R        LDB =D1
150  75500                MRY
151 161756  77756A        IOR INDX,I
152 170703                RAR 4
153 131756  77756A        STA INDX,I
154  45760  77760A        ISZ CNTR
155  66000    141R        JMP MPY42
156 170201                RET 1
157     23     23A  MPY50 LDA AR2+3
160 131756  77756A        STA INDX,I
161   2000    730R        LDA =D0
162   6000    731R        LDB =D4
163  75500                MRY
164 170201                RET 1
*
* LONG DIVIDE
*
165  42000    447R  DIV2P JSM AR1LP
166  66000    172R        JMP SDIVC
167  42000    443R  DIV2B JSM AR1LN       OPERAND ADDRESS ON CSTAK
170  66000    172R        JMP SDIVC
171  42000    454R  DIV2I JSM AR1LI       OPERAND ON CSTAK
172  42000    225R  SDIVC JSM .DIVD
173   2000      2X        LDA AR1D        MOVE AR1 TO AR2
174   6000      3X        LDB AR2D
175  71403                XFR 4
176 170201                RET 1
177  42000    437R  DIV2  JSM AR1LD
200  66000    172R        JMP SDIVC
*
201  42000    447R  MOD2P JSM AR1LP
```

```
202   66000    206R          JMP SMODC
203   42000    443R   MOD2B  JSM AR1LN       OPERAND ADDRESS ON CSTAK
204   66000    206R          JMP SMODC
205   42000    454R   MOD2I  JSM AR1LT       OPERAND ON CSTAK
206   42000    225R   SMODC  JSM .DIVD
207    2000      3X          LDA AR2D
210   66000    403R          JMP NINEC       RETURN FROM NINES COMP TO USER
211   42000    437R   MOD2   JSM AR1LD
212   66000    206R          JMP SMODC
  *
213    2000    732R   .DIVF  LDA =D-12       FLOATING POINT ENTRY
214   31760  77760A          STA CNTR          DO 12 DIGITS
215    2000      4R          LDA AR3M
216   31757  77757A          STA TMP         DIVIDEND POINTER
217   71602                  CLR 3            CLEAR LSH DIVIDEND
220    2000      1X          LDA AR0D
221   71603                  CLR 4           CLEAR QUOTIENT AND SHIFT COUNT
222   72101                  RIA *+1
223   31756  77756A          STA INDX        QUOTIENT POINTER
224   66000    277R          JMP DV002
225   71500           .DIVD  NRM             BCD ENTRY
226   35762  77762A          STB TMPA        TMPA=# LEADING ZEROES IN DIVID
227    2000                  LDA AR2M        SAVE DIVIDEND IN AR0
230    6000      2R          LDB AR0M
231   71402                  XFR 3
232    2000      1R          LDA AR1M        FETCH DIVISOR
233    6000                  LDB AR2M
234   71402                  XFR 3
235   71500                  NRM             DIV BY ZERO ??
236   72706                  SDC DV001
237    6000    733R   DOVFL  LDB =B114631    RETURN TO DUMBELL - DIV BY ZER
240   35771  77771A          STB AR1+1
241   35772  77772A          STB AR1+2
242   35773  77773A          STB AR1+3
243  170201                  RET 1
244   35761  77761A   DV001  STB TMPB        TMPB=# LEADING ZEROES IN DIVIS
245  174140                  CMB             COMPUTE # DIGITS TO BE GENERAT
246   25762  77762A          ADB TMPA        =# DIGITS = TMPA-TMPB-1
247   35760  77760A          STB CNTR
250   26000    734R          ADB =D12
251   35774  77774A          STB AR0         # DIGITS TO RIGHT SHIFT QUOTIE
                                                WHEN DONE
252    2000      2R          LDA AR0M
253    6000                  LDB AR2M
254   71402                  XFR 3           RETRIEVE DIVIDEND
255    5761  77761A          LDB TMPB
256   25000    732R          ADB =D-12       COMPUTE # DIGITS FOR LEFT SHIF
257   66000    262R          JMP *+3
260    2000    730R          LDA =D0
261   75541                  MLY             LEFT SHIFT FOR AR3 FOR FIRST D
262   76176                  RIB *-2
263    2000                  LDA AR2M        PUT IN AR3
264    6000      4R          LDB AR3M
265   35757  77757A          STB TMP         DIVIDEND POINTER
266   71402                  XFR 3
267    2000      2R          LDA AR0M
270   31756  77756A          STA INDX        QUOTIENT POINTER
271    6000                  LDB AR2M        RETRIEVE DIVIDEND
272   71402                  XFR 3
273   71602                  CLR 3           CLR AR0
274    2000    730R          LDA =D0
275    5761  77761A          LDB TMPB        RIGHT SHIFT AR2 FOR FIRST DIVI
276   75500                  MRY
277  173201           DV002  SOC *+1,C       CLEAR OVFL AND DC
300   71700                  CDC
301    2000      3X          LDA AR2D
302   42000    403R          JSM NINEC       9'S COMP AR2
303    2000      4X          LDA AR3D
304   42000    403R          JSM NINEC       9'S COMP AR3
305    5760  77760A          LDB CNTR
306  176404                  SBM *+4         ANYTHING TO DO?
307    2000      2X          LDA AR1D        NO
310   71603                  CLR 4           RESULT = 0
311  170201                  RET 1           EXIT TO USER
312   42000    342R          JSM DV015
313   42000    322R          JSM LOOP5
314   42000    322R          JSM LOOP5
315   42000    322R          JSM LOOP5
316   45756  77756A          ISZ INDX
317   42000    322R          JSM LOOP5
320   45757  77757A          ISZ TMP
321   66000    313R          JMP *-6
322  101757  77757A   LOOP5  LDA TMP,I       GET A DIGIT
323  170713                  RAR 12
324  131757  77757A          STA TMP,I
325   75541                  MLY             SHIFT IN DIVIDEND
326   12000    735R          CPA =D9         SHOULD BE NINE
327   66000    342R          JMP DV015       IT IS
330   22000    736R          ADA =D-10
331   31762  77762A          STA TMPA        TAKE SPECIAL ACTION
332    2000    737R          LDA =D-1         TO HANDLE 13 DIGIT REMAINDER
333   72501           DV005  SIA *+1
334   75041                  FDV
335   20001      1A          ADA B           COUNT # OF ADDS IN A REG
336   45762  77762A          ISZ TMPA        DONE ENOUGH
337   66000    333R          JMP DV005       NO
340    4000                  LDB A
341   66000    343R          JMP DV020       STORE DIGIT IN QUOTIENT
342   75041           DV015  FDV             GENERATE QUOTIENT DIGIT
343   71140           DV020  CMX
344   71200                  FXA             RESTORE DIVIDEND
```

```
        345   71140                     CMX
        346  101756   77756A            LDA INDX,1      STORE DIGIT IN QUOTIENT
        347  170603                     SAL 4
        350   60001       1A            IOR B
        351  131756   77756A            STA INDX,1
        352   45760   77760A            ISZ CNTR        DONE 12 DIGITS?
        353  170201                     RET 1           NO - RETURN TO LOOP
        354   54003       3A            DSZ R           YES - POP RETURN ADDRESS
        355    5774   77774A  DV045     LDB AR0         FIX UP LAST WORD OF QUOTIENT
        356   77002                     SLB *+2
        357  170603                     SAL 4
        360  174500                     SBR 1
        361   77002                     SLB *+2
        362  170607                     SAL 8
        363  131756   77756A            STA INDX,1
        364    2000       2R  DV050     LDA AR0M        FIX UP QUOTIENT
        365    6000       1R            LDB AR1M
        366   71402                     XFR 3
        367    2000     730R            LDA =D0
        370    5774   77774A            LDB AR0
        371   75400                     MRX             RIGHT JUSTIFY QUOTIENT
        372    1770   77770A            LDA AR1         FIX UP EXPONENT
        373    4020      20A            LDB AR2
        374   73202                     SLA *+2,C       CHECK SIGNS
        375   26000     727R            ADB =D1
        376  170040                     TCA
        377   20001       1A            ADA B
        400   52000     725R            AND =B177701
        401   31770   77770A            STA AR1
        402  170201                     RET 1
      *                      NINES COMPLEMENT ACCUMULATOR
        403   42000     405R  NINEC     JSM NINEL       AREG PTS TO ACCUMULATOR TO BE
        404   42000     405R            JSM NINEL         COMPLEMENTED
        405   72501           NINEL     SIA *+1
        406  104000                     LDB A,I
        407  174040                     TCB
        410   26000     733R            ADB =B114631
        411  134000                     STB A,I
        412  170201                     RET 1
      *
        413       3       3A  FRP1      LDA R
        414   22000     740R            ADA =D-2
        415  144000                     ISZ A,I
        416  100000                     LDA A,I
        417  100000                     LDA A,I
        420  170201                     RET 1
      *
        421   42000     413R  AR1SL     JSM FRP1        LOAD AR1 WITH 4 DIGIT BCD
        422  100000           AR1SA     LDA A,I
        423   31773   77773A            STA AR1+3
        424    2000       2X            LDA AR1D
        425   71602                     CLR 3
        426  170201                     RET 1
        427   70760           AR1SN     WWC A
        430   66000     422R            JMP AR1SA
        431   42000       5X  AR1SP     JSM .FRPB
        432  100001       1A            LDA B,I
        433   31773   77773A            STA AR1+3
        434    2000       2X            LDA AR1D
        435   71602                     CLR 3
        436  170201                     RET 1
        437   42000     413R  AR1LD     JSM FRP1
        440  172204                     SAP AR1LA,C
        441  100000                     LDA A,I
        442   66000     440R            JMP *-2
        443   70760           AR1LN     WWC A
        444    6000       2X  AR1LA     LDB AR1D
        445   71403                     XFR 4
        446  170201                     RET 1
        447   42000       5X  AR1LP     JSM .FRPB
        450       1       1A            LDA B
        451    6000       2X            LDB AR1D
        452   71403                     XFR 4
        453  170201                     RET 1
        454    2000     726R  AR1LT     LDA =D-4
        455   20016      16A            ADA C
        456   30016      16A            STA C
        457   72165                     RIA AR1LA
        460   66000     444R            JMP AR1LA
      *
        461    5770   77770A  .AMIN     LDB AR1
        462   77302                     SLB *+2,S
        463   77606                     RLB *+6,C
        464   35770   77770A            STB AR1
        465    5771   77771A            LDB AR1+1
        466   25772   77772A            ADB AR1+2
        467   25773   77773A            ADB AR1+3
        470   76002                     RZB *+2
        471   35770   77770A            STB AR1
        472  170201                     RET 1
        473   35761   77761A  .BMIN     STB TMPB
        474    4020      20A            LDB AR2
        475   77302                     SLB *+2,S
        476   77606                     RLB *+6,C
        477   34020      20A            STB AR2
        500    4021      21A            LDB AR2+1
        501   24022      22A            ADB AR2+2
        502   24023      23A            ADB AR2+3
        503   76002                     RZB *+2
```

```
 504  34020     20A         STB AR2
 505   5761  77761A         LDB TMPB
 506 170201                 RET 1
*
 507  42000    421R  SUB3   JSM AR1SL
 510  42000    461R         JSM .AMIN
 511  66000     32R         JMP .LADC
 512  42000    427R  SUB3B  JSM AR1SN
 513  66000    510R         JMP SUB3+1
 514  42000    431R  SUB3P  JSM AR1SP
 515  66000    510R         JMP SUB3+1
 516  42000    473R  MIN3P  JSM .BMIN
 517  42000    431R  ADD3P  JSM AR1SP
 520  66000     32R         JMP .LADC
 521  42000    473R  MIN3B  JSM .BMIN
 522  42000    427R  ADD3B  JSM AR1SN    OPERAND ADDRESS ON CSTAK
 523  66000     32R         JMP .LADC
 524  42000    473R  MIN3   JSM .BMIN
 525  42000    421R  ADD3   JSM AR1SL
 526  66000     32R         JMP .LADC
*
 527  42000    431R  MPY3P  JSM AR1SP
 530  66000    101R         JMP SMPYC
 531  42000    427R  MPY3B  JSM AR1SN    OPERAND ADDRESS ON CSTAK
 532  66000    101R         JMP SMPYC
 533  42000    421R  MPY3   JSM AR1SL
 534  66000    101R         JMP SMPYC
*
 535  42000    431R  DIV3P  JSM AR1SP
 536  66000    172R         JMP SDIVC
 537  42000    427R  DIV3B  JSM AR1SN    OPERAND ADDRESS ON CSTAK
 540  66000    172R         JMP SDIVC
 541  42000    421R  DIV3   JSM AR1SL
 542  66000    172R         JMP SDIVC
*
 543  42000    431R  MOD3P  JSM AR1SP
 544  66000    206R         JMP SMODC
 545  42000    427R  MOD3B  JSM AR1SN    OPERAND ADDRESS ON CSTAK
 546  66000    206R         JMP SMODC
 547  42000    421R  MOD3   JSM AR1SL
 550  66000    206R         JMP SMODC
*
  31                 ADD3T  EQU ADD2T
  30                 MIN3T  EQU MIN2T
  15                 SUB3T  EQU SUB2T
 100                 MPY3T  EQU MPY2T
 171                 DIV3T  EQU DIV2T
 205                 MOD3T  EQU MOD2T
*
 551  42000    565R  MOD4B  JSM DIV4B    OPERAND ADDRESS ON CSTAK
 552  66000    563R         JMP MOD4C+1
 553  42000      5X  MOD4P  JSM .FRPB
 554  66000    562R         JMP MOD4C
 555  42000    571R  MOD4I  JSM DIV4I    OPERAND ON CSTAK
 556  66000    563R         JMP MOD4C+1
 557 144003      3A  MOD4   ISZ R,I
 560 104003      3A         LDB R,I
 561 104001      1A         LDB B,I
 562  42000    576R  MOD4C  JSM BDIVB
 563      1      1A         LDA B
 564 170201                 RET 1
*
 565  70761          DIV4B  WWC B        OPERAND ADDRESS ON CSTAK
 566  66000    576R         JMP BDIVB
 567  42000      5X  DIV4P  JSM .FRPB
 570  66000    576R         JMP BDIVB
 571  70761          DIV4I  WWC B        OPERAND ON CSTAK
 572  66000    577R         JMP BDIVC
 573 144003      3A  DIV4   ISZ R,I
 574 104003      3A         LDB R,I
 575 104001      1A         LDB B,I      GET DEF TO ADDRESS
 576 104001      1A  BDIVB  LDB B,I      GET DIVISOR
 577  42000    635R  BDIVC  JSM .BDVS    SET UP FOR DIVIDE
 600   6000    730R         LDB =D0
 601 170600          BD005  SAL 1        SKIP OVER USELESS ZEROES
 602 172607                 SAM BD011,C
 603  45777  77777A         ISZ AR0+3
 604  66000    601R         JMP BD005
 605 170201                 RET 1
 606 170600          BD010  SAL 1
 607 174600                 SBL 1
 610 172202                 SAP *+2,C
 611  76501          BD011  SIB *+1
 612  25774  77774A  .BDVF  ADB AR0
 613 177603                 SES *+3,C
 614  25775  77775A         ADB AR0+1
 615 177602                 SES BD030,C
 616  72501                 SIA *+1
 617  45777  77777A  BD030  ISZ AR0+3    DONE?
 620  66000    606R         JMP BD010    NO.
 621  35774  77774A         STB AR0
 622   5757  77757A         LDB TMP
 623 176002                 SBP *+2
 624 170040                 TCA
 625   5776  77776A         LDB AR0+2
 626 176403                 SBM *+3
 627   5774  77774A         LDB AR0
 630 170201                 RET 1
 631   5774  77774A         LDB AR0
```

```
       632 174040                  TCB
       633 170040                  TCA
       634 170201                  RET  1
       635  75416          .BDVS   SZB  BOVFL
       636  31776  77776A          STA  AR0+2      SAVE DIVIDEND
       637  35757  77757A          STB  TMP        SAVE DIVISOR
       640 176402                  SBM  *+2
       641 174040                  TCB
       642  35774  77774A          STB  AR0        -DIVISOR
       643 174040                  TCB
       644  35775  77775A          STB  AR0+1      +DIVISOR
       645   6000    741R          LDB  =D-15
       646  35777  77777A          STB  AR0+3      CNTR
       647 172002                  SAP  *+2
       650 170040                  TCA
       651 177201                  SEC  *+1,C
       652 170201                  RET  1
       653   4000          BOVFL   LDB  A
       654   2000    742R          LDA  =D32767
       655 176002                  SBP  *+2
       656 170040                  TCA
       657 173701                  SOS  *+1,S
       660 170201                  RET  1
 *
       661  70761          ADD4B   WWC  B
       662  66000    664R          JMP  ADD4P+1
       663  42000      5X  ADD4P   JSM  .FRPB
       664 120001      1A          ADA  B,I
       665 170201                  RET  1
       666  70761          ADD4T   WWC  B
       667  20001      1A          ADA  B
       670 170201                  RET  1
       671  70761          MPY4B   WWC  B
       672  66000    674R          JMP  MPY4P+1
       673  42000      5X  MPY4P   JSM  .FRPB
       674 104001      1A          LDB  B,I
       675  75617                  MPY
       676 170201                  RET  1
       677  70761          MPY4T   WWC  B
       700  75617                  MPY
       701 170201                  RET  1
       702  42000      5X  SUB4P   JSM  .FRPB
       703 104001      1A  SUBC    LDB  B,I
       704 174040                  TCB
       705  20001      1A          ADA  B
       706 170201                  RET  1
       707  70761          SUB4B   WWC  B
       710  66000    703R          JMP  SUBC
       711  70761          SUB4T   WWC  B
       712  66000    704R          JMP  SUBC+1
       713  42000      5X  MIN4P   JSM  .FRPB
       714 170040          MINC    TCA
       715 120001      1A          ADA  B,I
       716 170201                  RET  1
       717  70761          MIN4B   WWC  B
       720  66000    714R          JMP  MINC
       721  70761          MIN4T   WWC  B
       722 170040                  TCA
       723  20001      1A          ADA  B
       724 170201                  RET  1
       724                         END
       725 177701
       726 177774
       727      1
       730      0
       731      4
       732 177764
       733 114631
       734     14
       735     11
       736 177766
       737 177777
       740 177776
       741 177761
       742  77777
.MAIN   461R     .BDVF   612R     .BDVS   635R     .BMIN   473R
.DIVL   225R     .DIVF   213R     .FRPB   5X       .LADC   32R
.MPYD   110R     0       730R     1       727R     11      735R
114631  733R     14      734R     177701  725R     177761  741R
177764  732R     177766  736R     177774  726R     177776  740R
177777  737R     4       731R     77777   742R     A       0A
ADD2    26R      ADD2B   23R      ADD2P   20R      ADD2T   31R
ADD3    525R     ADD3B   522R     ADD3P   517R     ADD3T   31R
ADD4B   661R     ADD4P   663R     ADD4T   666R     AR0     77774A
AR0D    1X       AR0L    3R       AR0M    2R       AR1     77770A
AR1D    2X       AR1LA   444R     AR1LD   437R     AR1LN   443R
AR1LF   447R     AR1LT   454R     AR1M    1R       AR1SA   422R
AR1SL   421R     AR1SN   427R     AR1SP   431R     AR2     20A
AR2D    3X       AR2M    0R       AR3     77764A   AR3D    4X
AR3L    5R       AR3M    4R       B       1A       BD005   601R
BD010   606R     BD011   611R     BD030   617R     BDIVB   576R
BDIVC   577R     BOVFL   653R     C       16A      CNTR    77760A
CXIT    72R      D       17A      DIV2    177R     DIV2B   167R
DIV2P   165R     DIV2T   171R     DIV3    541R     DIV3B   537R
DIV3P   535R     DIV3T   171R     DIV4    573R     DIV4B   565R
DIV4P   567R     DIV4T   571R     DO11    66R      DOVFL   237R
DV001   244R     DV002   277R     DV005   333R     DV015   342R
DV020   343R     DV045   355R     DV050   364R     E       77763A
ERR1    413R     INDX    77756A   LOOP5   322R     MIN2    25R
MIN2B   22R      MIN2P   17R      MIN2T   30R      MIN3    524R
```

| | | | | | | | |
|---|---|---|---|---|---|---|---|
| MIN3B | 521R | MIN3P | 516R | MIN31 | 30R | MIN4B | 717R |
| MIN4P | 713R | MIN4I | 721R | MINC | 714R | MOD2 | 211R |
| MOD2B | 203R | MOD2P | 201R | MOD2I | 205R | MOD3 | 547R |
| MOD3B | 545R | MOD3P | 543R | MOD31 | 205R | MOD4 | 557R |
| MOD4B | 551R | MOD4C | 562R | MOD4P | 553R | MOD4I | 555R |
| MPY2 | 106R | MPY2B | 76R | MPY2P | 74R | MPY2I | 100R |
| MPY3 | 533R | MPY3B | 531R | MPY3P | 527R | MPY3I | 100R |
| MPY40 | 137R | MPY42 | 141R | MPY4B | 671R | MPY4P | 673R |
| MPY41 | 677R | MPY50 | 157R | NAR2 | 54R | NINEC | 403R |
| NINEL | 405R | UPSGN | 41R | R | 3A | SDIVC | 172R |
| SMODC | 206R | SMPYC | 101R | SMSGN | 37R | SUB2 | 6R |
| SUB2B | 11R | SUB2P | 13R | SUB2I | 15R | SUB3 | 507R |
| SUB3B | 512R | SUB3P | 514R | SUB31 | 15R | SUB4B | 707R |
| SUB4P | 702R | SUB4I | 711R | SUBC | 703R | TMP | 77757A |
| TMPA | 77762A | TMPB | 77761A | | | | |

KSPMAX=2 MSPMAX=39 NSPMAX=6 SSPMAX=919 DSPMAX=158

APPENDIX B-3

```
  ,R,L
                                     HED BPC SERVICE ROUTINES - CHIP VERSION
                                     NAM BSRVC,7  ET10585-1031A \
 *
 *    A-ET10585-1030A-2
 *      ET10585-1030A   (S)
 *      ET10585-1031A   (R)
 *    7 MAR 1978
 *    LYNN WHEELWRIGHT
 *
          0                          ENT .MVE4,.CSHV,.LDAP,.STRD,.STRB,.LDBI
          0                          ENT .SAR2,.LDBA,.RAR2,.ADDR
          0                          ENT .ARGS,.STBC,.ARGA,.ARGL
          0                          ENT .UPC4,.CLBV,.LDBP,.STBP
          0                          ENT .LDSI,.LDSA,.LDSP,.DSGN,.STAP
          0                          ENT .RINA,.RINB,.RINI,.RTNL
          0                          ENT .CLNP,.CLAI,.CLAP
          0                          ENT .CLBI,.CLBP,.FRPB
          0                     A    EQU 0
          1                     B    EQU 1
          3                     R    EQU 3
         16                     C    EQU 16B
         17                     D    EQU 17B
      77763                     E    EQU 77763B
         20                     AR2  EQU 20B
      77777                     TMP  EQU 77777B
          0                          EXT AR2D
 *
     0 144003        3A  .ADDR  ISZ R,1        FETCH DEF
     1 100003        3A         LDA R,I
     2 100000                   LDA A,I
     3 170201                   RET 1
 *
     4  77004            .FRPB  SLB *+4        LSB=1 : VALUE
     5 174400                   ABR 1            LDB STACK INDEX
     6  25763    77763A         ADB E            JSM .FRPB
     7 170201                   RET 1                BREG=ADDRESS
    10 174400                   ABR 1          LSB=0 : NAME ITEM
    11  25763    77763A         ADB E
    12 104001        1A         LDB B,1
    13 170201                   RET 1
 *
    14 144003        3A  .LDBI  ISZ R,I
    15 100003        3A         LDA R,I
    16 100000                   LDA A,I
    17  66000       22R         JMP .LDB
    20  42000        4R  .LDBP  JSM .FRPB
    21      1        1A  .LDBA  LDA B
    22   6000        1X  .LDB   LDB AR2D
    23  71403                   XFR 4
    24 170201                   RET 1
    25 104003        3A  .MVE4  LDB R,1
    26  76501                   SIB *+1
    27 100001        1A         LDA B,1
    30  76501                   SIB *+1
    31 104001        1A         LDB B,I
    32  71403                   XFR 4
    33 170203                   RET 3
    34  70761            .STBC  WWC B
    35  66000       50R         JMP .STRB
    36  42000        4R  .STBP  JSM .FRPB
    37  66000       50R         JMP .STRB
    40 144003        3A  .STRD  ISZ R,1
    41 104003        3A         LDB R,1
    42 104001        1A         LDB B,1
    43  66000       50R         JMP .STRB
    44   4016       16A  .SAR2  LDB C
    45  26000      203R         ADB =D4
    46  34016       16A         STB C
    47  26000      204R         ADB =D-3
    50   2000        1X  .STRB  LDA AR2D
    51  71403                   XFR 4
    52 170201                   RET 1
    53   2000        1X  .RINB  LDA AR2D
    54  71602                   CLR 3
    55   5763    77763A  .RINI  LDB E
    56  76101                   RIB *+1
    57 100001        1A         LDA B,1
    60  30023       23A         STA AR2+3
    61   5763    77763A  .RINA  LDB E
```

```
62  34016      16A        STB C
63  70761                 WWC B
64  35763   77763A        STB E
65  70761                 WWC B
66  24016      16A        ADB C
67  34016      16A        STB C
70 170201                 RET 1
71   1763   77763A .RTNL  LDA E
72   6000       1X        LDB AR2D
73  72101                 RIA *+1
74  71403                 XFR 4
75  66000      61R        JMP .RINA
76   6000     205R .RAR2  LDB =D-4
77  24016      16A        ADB C
100 34016      16A        STB C
101 75501                 SIB *+1
102 170201                RET 1
103     20     20A .DSGN  LDA AR2
104 170700                RAR 1
105 170201                RET 1
106 35777   77777A .ARGL  STB TMP      AR2=1ST PARAM
107 42000      44R        JSM .SAR2
110  5777   77777A        LDB TMP
111 66000     113R        JMP .ARGS
112 70540          .ARGA  PWC A        AREG=1ST PARAM
113 70541          .ARGS  PWC B        BREG=-# WORDS ON STACK
114  5763   77763A        LDB E
115 70541                 PWC B
116  4016      16A        LDB C
117 35763   77763A        STB E
120 170201                RET 1
121  6000     203R .UPC4  LDB =D4      INCREMENT STACK 4
122 24016      16A        ADB C
123 34016      16A        STB C
124 170201                RET 1
125 144003      3A .CLBI  ISZ R,I      PUSH VARIABLE ON CSTAK
126 104003      3A        LDB R,I
127 104001      1A        LDB B,I
130 66000     132R        JMP .CLBV
131 42000       4R .CLBP  JSM .FRPB    PUSH PARAM ITEM ON CSTAK
132     1       1A .CLBV  LDA B        PUSH 4 WORDS ON CSTAK
133  4016      16A        LDB C
134 75501                 SIB *+1
135 71403                 XFR 4
136 26000     206R        ADB =D3
137 34016      16A        STB C
140 170201                RET 1
141 144003      3A .CLAI  ISZ R,I      PUSH DEF VALUE ON CSTAK
142 104003      3A        LDB R,I
143 104001      1A        LDB B,I
144 66000     153R        JMP .CSH
145 42000       4R .CLAP  JSM .FRPB    PUSH VALUE OF ITEM ON CSTAK
146 66000     153R        JMP .CSH
147 42000       4R .CLNP  JSM .FRPB    PUSH ADDRESS OF ITEM ON CSTAK
150 66000     154R        JMP .CSH+1
151 144003      3A .CSHV  ISZ R,I      PUSH ADDRESS ON CSTAK
152 104003      3A        LDB R,I
153 104001      1A .CSH   LDB B,I
154 70541                 PWC B
155 170201                RET 1
156 42000       4R .LDAP  JSM .FRPB
157 100001      1A        LDA B,I
160 170201                RET 1
161  2000       1X .LDSA  LDA AR2D
162 71602                 CLR 3
163 66000     175R        JMP .LDS1
164  2000       1X .LDSI  LDA AR2D
165 71602                 CLR 3
166 144003      3A        ISZ R,I
167 104003      3A        LDB R,I
170 104001      1A        LDB B,I
171 66000     175R        JMP .LDS1
172  2000       1X .LDSP  LDA AR2D
173 71602                 CLR 3
174 42000       4R        JSM .FRPB
175 100001      1A .LDS1  LDA B,I
176 30023      23A .LDS2  STA AR2+3
177 170201                RET 1
200 42000       4R .STAP  JSM .FRPB
201 130001      1A        STA B,I
202 170201                RET 1
202                       END
203      4
204 177775
205 177774
206      3

.ACBP   0R      .ARGA  112R     .ARGL  106R     .ARGS  113R
.CLAI 141R      .CLAP  145R     .CLBI  125R     .CLBP  131R
.CLBV 132R      .CLNP  147R     .CSH   153R     .CSHV  151R
.DSGN 103R      .FRPB    4R     .LDAP  156R     .LDB    22R
.LDBA  21R      .LDBI   14R     .LDBP   20R     .LDS1  175R
.LDS2 176R      .LDSA  161R     .LDSI  164R     .LDSP  172R
.SVE4  25R      .RAR2   76R     .RINA   61R     .RINB   53R
.RTN1  55R      .RTNL   71R     .SAR2   44R     .STAP  200R
.STBC  34R      .STBP   36R     .STRB   50R     .STRD   40R
```

```
.FFC4   121R      177774  205R      177775  204R      3       206R
4       203R      A       0A        AR2     20A       AR2D    1X
B       1A        C       16A       D       17A       E       77763A
R       3A        TMP     77777A

KSPMAX=2 MSPMAX=39 NSPMAX=6 SSPMAX=285 DSPMAX=158
```

APPENDIX B-4

```
ASMB,R,L
                                     HED ARRAY ADDRESS COMPUTE - CHIP VERSION \
                                     NAM ARRYC,7  ET10585-1033A \
 *
 *     A-ET10585-1032A-2
 *       ET10585-1032A   (S)
 *       ET10585-1033A   (R)
 *     2 MAR 1976
 *     LYNN WHEELWRIGHT
 *
        0                            ENT .ARRY,.ARRP
        0                            EXT .FRPB
        0                     A      EQU 0
        1                     B      EQU 1
        3                     R      EQU 3
        16                    C      EQU 16B
        17                    D      EQU 17B
     77763                    E      EQU 77763B
     77777                    TMP    EQU 77777B
     77776                    CNTR   EQU 77776B
     77775                    TPTR   EQU 77775B
        0  42000      1X      .ARRP  JSM .FRPB        GET ADDRESS OF ARRAY VECTOR
        1  66000      5R             JMP ARRAY
        2 144003      3A      .ARRY  ISZ R,I
        3 104003      3A             LDB R,I
        4 104001      1A             LDB B,I
        5  35775  77775A      ARRAY  STB TPTR
        6  76501                     SIB *+1
        7  34017     17A             STB D
       10  70571                     WWD B,I          GET # OF DIMS
       11  35776  77776A             STB CNTR
       12 174517                     CLB              D POINTS TO DIMENSION LIST
       13  35777  77777A             STB TMP
       14  66000     21R             JMP LSTRT
       15 104017     17A      LOOP   LDB D,I
       16  75617                     MPY              Dmax*(Cmax*(Bmax*A+B)+C)+D
       17  31777  77777A             STA TMP
       20  70760                     WWC A
       21  22000     36R      LSTRT  ADA =D-1         STARTS WITH ELEMENT 1
       22  70571                     WWD B,I          GET NEXT DIMENSION LIMIT
       23 174040                     TCB
       24  24000                     ADB A            CHECK FOR OUT OF RANGE
       25 176402                     SBM *+2
       26 170517                     CLA              OUT OF RANGE
       27  21777  77777A             ADA TMP
       30  45776  77776A             ISZ CNTR
       31  66000     15R             JMP LOOP
       32 105775  77775A             LDB TPTR,I
       33  24000                     ADB A
       34 100001      1A             LDA B,I
       35 170201                     RET 1
       35                            END
       36 177777

.ARRP   0R        .ARRY   2R        .FRPB   1X        177777  36R
A       0A        ARRAY   5R        B       1A        C       16A
CNTR    77776A    D       17A       E       77763A    LOOP    15R
LSTRT   21R       R       3A        TMP     77777A    TPTR    77775A

KSPMAX=2 MSPMAX=39 NSPMAX=6 SSPMAX=90 DSPMAX=158
```

APPENDIX B-5

```
ASMB,R,L
                                     HED ARRAY ADDRESS COMPUTE - ONE DIMENSION
                                     NAM ARRYS,7  ET10585-1059A \
 *
 *     A-ET10585-1058A-2
 *       ET10585-1058A   (S)
 *       ET10585-1059A   (R)
 *     2 MAR 1978
 *     LYNN WHEELWRIGHT
 *
        0                            ENT .ARAY,.ARAP,.LRAY,.LRAP
        0                            EXT .FRPB
        0                     A      EQU 0
        1                     B      EQU 1
        3                     R      EQU 3
        16                    C      EQU 16B
        17                    D      EQU 17B
     77763                    E      EQU 77763B
     77777                    TMP    EQU 77777B
     77776                    CNTR   EQU 77776B
     77775                    TPTR   EQU 77775B
        0 170601              .LRAP  SAL 2
        1  22000     25R             ADA =D-3
        2  42000      1X      .ARAP  JSM .FRPB        GET ADDRESS OF ARRAY VECTOR
        3  66000     11R             JMP ARRAY
        4 170601              .LRAY  SAL 2
        5  22000     25R             ADA =D-3
```

```
   6 144003        3A  .ARAY ISZ R,I
   7 104003        3A        LDB R,I
  10 104001        1A        LDB B,I
  11  35775   77775A  ARRAY STB TPTR
  12  22000       26R        ADA =D-1        STARTS WITH ELEMENT 1
  13  26000       27R        ADB =D2
  14 104001        1A        LDB B,I
  15 174040                  ICB
  16  24000                  ADB A           CHECK FOR OUT OF RANGE
  17 176402                  SBM *+2
  20 170517                  CLA             OUT OF RANGE
  21 105775   77775A         LDB TPTR,I      FETCH BEGIN OF ARRAY
  22  24000                  ADB A           ADD OFFSET
  23 100001        1A        LDA B,I         FETCH ITEM
  24 170201                  RET 1
  24                         END
  25 177775
  26 177777
  27      2

.ARAP   2R       .ARAY   6R       .ERPB   1A       .GRAP   0R
.LRAI   4R       177775  25R      177777  26R      2       27R
A       0A       ARRAY   11R      B       1A       C       16A
CNTR    77776A   D       17A      E       77763A   R       3A
TMP     77777A   TPTR    77775A

KSPMAX=2 MSPMAX=39 NSPMAX=6 SSPMAX=105 DSPMAX=158
```

APPENDIX B-6

```
ASM,R,L
                              HED TYPE CONVERSION ROUTINES - CHIP VERSION
                              NAM TYPEC,7  ET10585-1013A \
*
*   A-ET10585-1012A-2
*     ET10585-1012A  (S)
*     ET10585-1013A  (R)
*   20 MAR 78
*   LYNN WHEELWRIGHT
*
       0                      ENT CNV12,CNV13,CNV14,CNV21,CNV23,CNV24
       0                      ENT CNV31,CNV34,CNV41,CNV42,CNV43
       0                      ENT CDB
       0                      EXT AR2D
       0                A     EQU 0
       1                B     EQU 1
       3                R     EQU 3
      16                C     EQU 16B
      17                D     EQU 17B
   77763                E     EQU 77763B
      20                AR2   EQU 20B
   77776                CNTR  EQU 77776B
   77777                TMP   EQU 77777B
       0   6000   174R  CNV43 LDB =D0         CONVERT BINARY TO BCD
       1 172003               SAP *+3
       2 170040               TCA
       3  76501               SIB *+1
       4  34020    20A        STB AR2
       5 174500               SBR 1
       6  34021    21A        STB AR2+1
       7  34022    22A        STB AR2+2
      10  30023    23A        STA AR2+3
      11  22000   175R        ADA =D-16
      12 172005               SAP BCD10       A>=16
      13  22000   176R        ADA =D6
      14 172424               SAM BCD30       A<10
      15  62000   177R        IOR =B20
      16  66000    37R        JMP BCD20       THAT'S ALL
      17   2000   200R  BCD10 LDA =D-10000
      20  20023    23A        ADA AR2+3
      21 172406               SAM BCD15
      22  44022    22A        ISZ AR2+2
      23  22000   200R        ADA =D-10000
      24 172076               SAP *-2
      25  22000   201R        ADA =D10000
      26  30023    23A        STA AR2+3
      27 170603         BCD15 SAL 4
      30   6000   202R        LDB =D-1000
      31  42000    42R        JSM BCD50
      32   5000   203R        LDB =D-100
      33  42000    42R        JSM BCD50
      34   6000   204R        LDB =D-10
      35  42000    42R        JSM BCD50
      36  60023    23A        IOR AR2+3
      37  30023    23A  BCD20 STA AR2+3
      40 173201         BCD30 SOC *+1,C
      41 170201               RET 1
      42  35777 77777A  BCD50 STB TMP
      43  24023    23A        ADB AR2+3
      44 176410               SBM BCD60
      45  72501               SIA *+1
      46  25777 77777A        ADB TMP
      47 176076               SBP *-2
      50 174040               ICB
      51  25777 77777A        ADB TMP
      52 174040               ICB
      53  34023    23A        STB AR2+3
      54 170603         BCD60 SAL 4
      55 170201               RET 1
      56  42000    67R  CNV13 JSM CNV12
```

```
 57     21    21A  CNV23 LDA AR2+1
 60  60020    20A        IOR AR2
 61  60022    22A        IOR AR2+2
 62  72456               SZA BCD30
 63 173701               SOS *+1,S
 64   2000     1X        LDA AR2D
 65  71602               CLR 3
 66 170201               RET 1
  0                CNV42 EQU CNV43
 67   4020    20A  CNV12 LDB AR2
 70 176004               SBP *+4
 71   2000     1X        LDA AR2D
 72  71603               CLR 4
 73 170201               RET 1
 74 174405               ABR 6
 75 174040               TCB
 76  26000   205R        ADB =D12
 77  76410               SZB BCLY
100 176413               SBM BCLX
101   2000   174R        LDA =D0
102  75500               MRY
103  22000   206R        ADA =D-5
104 172403               SAM BCLY
105   6000   207R        LDB =D1
106  71000               MWA
107   2000   207R  BCLY  LDA =D1
110  50020    20A        AND AR2
111  30020    20A        STA AR2
112 170201               RET 1
113 173774         BCLX  SOS BCLY,S
114  66000   107R        JMP BCLY
115  42000         CNV41 JSM CNV43
116  71500         CNV31 NRM
117  72704               SDC *+4
120   2000   210R        LDA =B100100
121  30020    20A        STA AR2
122 170201               RET 1
123      1     1A        LDA B
124 170040               TCA
125  22000   205R        ADA =D12
126 170605               SAL 6
127  60020    20A        IOR AR2
130  30020    20A        STA AR2
131 170201               RET 1
116                CNV21 EQU CNV31
132  42000    67R  CNV14 JSM CNV12
133     22    22A  CNV24 LDA AR2+2
134  52000   211R        AND =B177774
135  60021    21A        IOR AR2+1
136  72015               RZA OVFL
137     23    23A  CNV34 LDA AR2+3
140  42000   156R        JSM CDB
141   4022    22A        LDB AR2+2
142  77002               SLB *+2
143  22000   201R        ADA =D10000
144 174500               SBR 1
145  77002               SLB *+2
146  22000   212R        ADA =D20000
147   4020    20A  CNVXT LDB AR2
150  77002               SLB *+2
151 170040               TCA
152 170201               RET 1
153   2000   213R  OVFL  LDA =D32767
154 173773               SOS CNVXT,S
155  66000   147R        JMP CNVXT
156   6000   174R  CDB   LDB =D0
157  42000   167R        JSM CDB20
160  42000   162R        JSM CDB10
161  42000   162R        JSM CDB10
162   4000         CDB10 LDB A              MPY BY 10
163 174601               SBL 2
164  24000               ADB A
165 174600               SBL 1
166   1777 77777A        LDA TMP
167 170713         CDB20 RAR 12
170  31777 77777A        STA TMP
171  52000   214R        AND =B17
172  20001     1A        ADA B
173 170201               RET 1
173                      END
174      0
175 177760
176      6
177     20
200 154360
201  23420
202 176030
203 177634
204 177766
205     14
206 177773
207      1
210 100100
211 177774
212  47040
213  77777
214     17

0      174R       1      207R      100100 210R      14     205R
154360 200R      17      214R      176030 202R      177634 203R
```

```
177760  175R        177766  204R        177773  206R        177774  211R
20      177R        23420   201R        47040   212R        6       176R
77777   213R        A       0A          AR2     20A         AR2D    1X
B       1A          BCD10   17R         BCD15   27R         BCD20   37R
BCD30   40R         BCD50   42R         BCD60   54R         BCLX    113R
BCLY    107R        C       16A         CDB     156R        CDB10   162R
CDB20   167R        CNTR    77776A      CNV12   67R         CNV13   56R
CNV14   132R        CNV21   116R        CNV23   57R         CNV24   133R
CNV31   116R        CNV34   137R        CNV41   115R        CNV42   0R
CNV43   0R          CNVX1   147R        D       17A         E       77763A
OVFL    153R        R       3A          TMP     77777A

KSPMAX=2 MSPMAX=39 NSPMAX=6 SSPMAX=324 DSPMAX=158
```

APPENDIX B-7

```
ASMB,L,R
                                  HED ROUND BCDL NUMBER TO GIVEN DIGIT \
                                  NAM ROUND,7   ET10585-1067A
     0                            ENT ROUND
     0                            EXT .DLFT
 *
 *   A-ET10585-1066A-2
 *     ET10585-1066A  (S)
 *     ET10585-1067A  (R)
 *   29 MAR 1978
 *   LYNN WHEELWRIGHT
 *
 *     BCDL PROCEDURE ROUND(L,I); VALUE L,I; BCDL L; INTEGER I;
 *        L=QUANTITY TO BE ROUNDED
 *         I=DIGIT TO BE ROUNDED TO
 *     DIGITS NUMBERED 0 - 11  0=MOST SIGNIFICANT
 *
     0                      A     EQU 0
     1                      B     EQU 1
    16                      C     EQU 16B
     0 104016      16A      ROUND LDB C,I
     1 174040                     ICB
     2  26000      17R            ADB =D11
     3 176003                     SBP *+3
     4  54016      16A            DSZ C
     5 170201                     RET 1
     6 134016      16A            STB C,I        SAVE SHIFT COUNT ON CSTAK
     7 170517                     CLA
    10  75500                     MRY
    11  22000      20R            ADA =D-5
    12 172403                     SAM *+3
    13   6000      21R            LDB =D1
    14  71000                     MWA            ADD 1 TO AR2
    15  70761                     WWC B          RETRIEVE SHIFT COUNT
    16  66000       1X            JMP .DLFT
    16              1X            END
    17      13
    20 177773
    21       1

.DLFT   1X        1        21R       13       17R       177773 20R
A       0A        B        1A        C        16A       ROUND  0R

KSPMAX=2 MSPMAX=39 NSPMAX=6 SSPMAX=46 DSPMAX=158
```

APPENDIX B-8

```
ASMB,R,L
                                  HED DECIMAL SHIFT FUNCTIONS - FDIGIT \
                                  NAM DSHFT,7  ET10585-1015A \
 *
 *   A-ET10585-1014A-2
 *     ET10585-1014A  (S)
 *     ET10585-1015A  (R)
 *   15 JULY 1977
 *   LYNN WHEELWRIGHT
 *
     0                            ENT .FDIG,.DLFT,.DRGT,.DSFT
 *
 *     DECIMAL SHIFT
 *     +=LEFT, -=RIGHT (BREG)
 *     AR2=DECIMAL NUMBER
 *     JSM .DSFT
 *
     0  76501              .FDIG  STB *+1
     1 176411              .DSFT  SBM .DRGT
     2                     .DLFT  EQU *          AR2=DEC. NUM
     2  76407                     SZB DL20       BREG=# OF SHIFTS
     3 176402                     SBM *+2        JSM .DLFT    LEFT SHIFT AR2
     4 174040                     ICB
     5  76501                     STB *+1
     6   2000      20R            LDA =D0
     7  75541                     MLY
    10  76176                     RIB *-2
    11 170201              DL20   RET 1
 *
    12                     .DRGT  EQU *          AR2=DEC. NUM
    12 176002                     SBP *+2        BREG=# OF SHIFTS (RIGHT)
    13 174040                     ICB            JSM .DRGT
    14   2000      20R            LDA =D0
    15  76402                     SZB *+2
```

```
      16  75500                      MPY
      17 170201                      RET 1
      17                             END
      20      0

.DLFT   2R        .DRGT   12R       .DSFT   1R        .FDIG   0R
J      20R        DL20    11R
```

KSPMAX=2 MSPMAX=39 NSPMAX=6 SSPMAX=39 DSPMAX=158

APPENDIX B-9

```
ASMB,R,L
                                     HED SHIFT ROTATE FUNCTIONS \
                                     NAM SHIFT,7  ET10585-1017A \
   *
   *      A-ET10585-1016A-2
   *        ET10585-1016A   (S)
   *        ET10585-1017A   (R)
   *      25 JULY 1977
   *      LYNN WHEELWRIGHT
   *
          0                          ENT .SRGT,.SLFT,.ARGT,.RLFT,.RRGT
          0                    A     EQU 0
          1                    B     EQU 1
          3                    R     EQU 3
          16                   C     EQU 16B
          17                   D     EQU 17B
   77777                       TMP   EQU 77777B
   *
          0  42000      12R   .SRGT JSM ZCHK         LDA WORD
          1  42000      12R   .SLFT JSM ZCHK         LDB SHIFT COUNT
          2  42000      12R   .ARGT JSM ZCHK         JSM .(SHIFT)
          3  42000      12R   .RRGT JSM ZCHK           AREG=RESULT
          4                   SDEF  DEF .SRGT
          5              6R   STAB  DEF *+1          *
          6 170500                  SAR 1            **
          7 170600                  SAL 1            *  *
         10 170400                  AAR 1            *   *
         11 170700                  RAR 1            *****
         12  76414            ZCHK  SZB ZRTN
         13  26000      33R         ADB =D-1
         14 174703                  RBR 4
         15 174513                  SBR 12
         16  35777   77777A         STB TMP
         17   6000       4R         LDB SDEF
         20 174040                  TCB
         21 124003       3A         ADB R,I
         22  26000       5R         ADB STAB
         23 104001       1A         LDB B,I
         24  25777   77777A         ADB TMP
         25  70001                  EXE B
         26  54003       3A   ZRTN  DSZ R
         27 170201                  RET 1
         30 174040            .RLFT TCB
         31  26000      34R         ADB =D16
         32  66000       3R         JMP .RRGT
         32                         END
         33 177777
         34     20

.ARGT   2R        .RLFT   30R       .RRGT   3R        .SLFT   1R
.SRGT   0R        177777  33R       20      34R       A       0A
B       1A        C       16A       D       17A       R       3A
SDEF    4R        STAB    5R        TMP     77777A    ZCHK    12R
ZRTN    26R
```

KSPMAX=2 MSPMAX=39 NSPMAX=6 SSPMAX=99 DSPMAX=158

APPENDIX B-10

```
ASMB,R,L
                                    HED TEST SET AND RESET BIT \
                                    NAM TSRBT,7  ET10585-1019A \
   *
   *     A-ET10585-1018A-2
   *       ET10585-1018A   (S)
   *       ET10585-1019A   (R)
   *     1 AUG 1977
   *     LYNN WHEELWRIGHT
   *
         0                          ENT .SBIT,.RBIT,.TBIT
         0                   A      EQU 0
         1                   B      EQU 1
         3                   R      EQU 3
         16                  C      EQU 16B
         17                  D      EQU 17B
  77777                      TMP    EQU 77777B
   * BIT TEST AND SET FUNCTIONS
         0                   .TBIT  EQU *            TEST BIT AND SET SIGN
         0  42000      14R          JSM BIT          LDA WORD
         1  50001       1A          AND B            LDB BIT# (0-15)
         2  72402                   SZA *+2          JSM .TBIT
         3   2000      27R          LDA =D-1             AREG = RESULT
         4 170201                   RET 1
         5                   .SBIT  EQU *
         5  42000      14R          JSM BIT
         6  60001       1A          IOR B
         7 170201                   RET 1
        10  42000      14R   .RBIT  JSM BIT
```

```
      11 174140               CMB
      12  50001      1A       AND B
      13 170201               RET 1
      14  31777  77777A  BIT  STA TMP
      15   2000     30R       LDA =D15
      16  50001      1A       AND B
      17   6000     31R       LDB =D1
      20  72404               SZA RTN
      21  22000     27R       ADA =D-1
      22  62000     26R       IOR SLFT
      23  70000               EXE A
      24   1777  77777A  RTN  LDA TMP
      25 170201               RET 1
      26 174600          SLFT SBL 1
      26                      END
      27 177777
      30     17
      31      1

.RBIT   10R      .SBIT   5R      .TBIT   0R       1        31R
17      30R      177777  27R     A       0A       B        1A
BIT     14R      C       16A     D       17A      R        3A
RTN     24R      SLFT    26R     TMP     77777A

KSPMAX=2 MSPMAX=39 NSPMAX=6 SSPMAX=62 DSPMAX=158
```

APPENDIX B-11

```
ASMB,R,L
                              HED TEST AND TURN FUNCTIONS
                              NAM TEST,7  ET10585-1021A
 *
 *    A-ET10585-1020A-2
 *      ET10585-1020A   (S)
 *      ET10585-1021A   (R)
 *    25 JULY 1977
 *    LYNN WHEELWRIGHT
 *
       0                      ENT .TEST,.TURN
       0                 A    EQU 0
       1                 B    EQU 1
       3                 R    EQU 3
      16                 C    EQU 16B
      17                 D    EQU 17B
 77777                   TMP  EQU 77777B
       0  42000     15R .TEST JSM KMGET
       1  50001      1A       AND B
       2  11777  77777A       CPA TMP
       3  66000      6R       JMP *+3       AREG_(ITEM AND MASK)=
       4   2000     40R       LDA =D0           (KEY AND MASK)
       5 170201               RET 1
       6   2000     41R       LDA =D-1
       7 170201               RET 1
      10  42000     15R .TURN JSM KMGET
      11 174140               CMB
      12  50001      1A       AND B
      13  61777  77777A       IOR TMP       AREG_ITEM AND NOT MASK OR
      14 170201               RET 1               KEY AND MASK
      15  54003      3A KMGET DSZ R         AREG = KEY
      16 144003      3A       ISZ R,I       GET MASK
      17 104003      3A       LDB R,I
      20 104001      1A       LDB B,I
      21  76403               SZB *+3
      22 104001      1A       LDB B,I
      23  66000     25R       JMP *+2
      24  70761               WWC B
      25  50001      1A       AND B
      26  31777  77777A       STA TMP       TMP = KEY AND MASK
      27 144003      3A       ISZ R,I
      30 100003      3A       LDA R,I
      31 100000               LDA A,I
      32  72403               SZA *+3
      33 100000               LDA A,I
      34  66000     36R       JMP *+2
      35  70760               WWC A
      36  44003      3A       ISZ R         AREG=ITEM
      37 170201               RET 1         BREG=MASK
      37                      END
      40      0
      41 177777

.TEST   0R       .TURN   10R     0       40R      177777  41R
A       0A       B       1A      C       16A      D       17A
KMGET   15R      R       3A      TMP     77777A

KSPMAX=2 MSPMAX=39 NSPMAX=6 SSPMAX=62 DSPMAX=158
```

APPENDIX B-12

```
ASMB,R,L
                              HED EQUAL CHECK
                              NAM DEQL,7  ET10585-1023A
 *
 *    A-ET10585-1022A-2
 *      ET10585-1022A   (S)
 *      ET10585-1023A   (R)
 *    15 JULY 1977
 *    LYNN WHEELWRIGHT
 *
```

```
      0                        ENT .EQL,.DEQL,.NEQL
     20                AR2     EQU 20B
*
      0      21   21A  .DEQL   LDA AR2+1
      1   60022   22A          IOR AR2+2
      2   60023   23A          IOR AR2+3
      3   72403        .EQL    SZA TRUE
      4    2000   12R  FALSE   LDA =D0
      5  170201                RET 1
      6    2000   13R  TRUE    LDA =D-1
      7  170201                RET 1
     10   72076        .NEQL   RZA TRUE
     11  170201                RET 1
     11                        END
     12       0
     13  177777

.DEQL   0R      .EQL    3R      .NEQL   10R     0       12R
177777  13R     AR2     20A     FALSE   4R      TRUE    6R

KSPMAX=2 MSPMAX=39 NSPMAX=6 SSPMAX=52 DSPMAX=158
```

APPENDIX B-13

```
ASMB,R,L
                               HED EXECUTE CASE STATEMENT \
                               NAM CASE,7  ET10585-1025A
*
*     A-ET10585-1024A-2
*       ET10585-1024A   (S)
*       ET10585-1025A   (R)
*     25 JULY 1977
*     LYNN WHEELWRIGHT
*
      0                        ENT .CASE
      0                A       EQU 0
      1                B       EQU 1
      3                R       EQU 3
     16                C       EQU 16B
     17                D       EQU 17B
*
      0   72402        .CASE   SZA *+2         DEF CN
      1  172002                SAP *+2         DEF CN-1
      2  170201                RET 1           .
      3  104003    3A          LDB R,I         .
      4   54001    1A          DSZ B           DEF C1
      5  104001    1A          LDB B,I         DEC -N
      6   24000                ADB A           JSM .CASE   AREG=CASE TO SELECT
      7  176402                SBM *+2
     10  170201                RET 1
     11  170140                CMA
     12  120003    3A          ADA R,I
     13   54003    3A          DSZ R
     14  100000                LDA A,I
     15  164000                JMP A,I
     15                        END

.CASE   0R      A       0A      B       1A      C       16A
D       17A     R       3A

KSPMAX=2 MSPMAX=39 NSPMAX=6 SSPMAX=31 DSPMAX=158
```

APPENDIX B-14

```
ASMB,R,L
                               HED PROCEDURE EXIT THROUGH FORMAL GOTO \
                               NAM FGTO,7  ET10585-1027A
*
*     A-ET10585-1026A-2
*       ET10585-1026A   (S)
*       ET10585-1027A   (R)
*     15 JULY 1977
*     LYNN WHEELWRIGHT
*
      0                        ENT .FGTO
      0                        EXT .CLV
      0                A       EQU 0
      1                B       EQU 1
      3                R       EQU 3
     16                C       EQU 16B
     17                D       EQU 17B
*
      0   42000    1X  .FGTO   JSM .CLV
      1  100001    1A          LDA B,I
      2   22000   11R          ADA =D-1
      3  104003    3A          LDB R,I
      4   54003    3A          DSZ R
      5  130003    3A          STA R,I
      6   26000   12R          ADB =D2
      7  104001    1A          LDB B,I
     10  164001    1A          JMP B,I         GO EXIT PROCEDURE
     10                        END
     11  177777
     12       2

.CLV    1X      .FGTO   0R      177777  11R     2       12R
A       0A      B       1A      C       16A     D       17A
R       3A

KSPMAX=2 MSPMAX=39 NSPMAX=6 SSPMAX=50 DSPMAX=158
```

APPENDIX B-15

```
ASMB,R,L
                                   HED READ AND WRITE ROUTINES - CHIP VERSION \
                                   NAM RDWRT,7  ET10585-1029A \
 *
 *     A-ET10585-1028A-2
 *       ET10585-1028A   (S)
 *       ET10585-1029A   (R)
 *     1 MAR 77
 *     LINN WHEELWRIGHT
 *
        0                          ENT .WSIR,.R4,.R5,.R6,.R7
        0                          ENT .W4,.W5,.W6,.W7
        0                          ENT .WSTP
        0                          ENT .RS4,.RS5,.RS6,.RS7,.WS4,.WS5,.WS6,.WS7
        0                          ENT .WSPS,.WSTS
        0                   A      EQU 0
        1                   B      EQU 1
        3                   R      EQU 3
       16                   C      EQU 16B
       17                   D      EQU 17B
    77763                   E      EQU 77763B
        4                   R4     EQU 4
        5                   R5     EQU 5
        6                   R6     EQU 6
        7                   R7     EQU 7
       20                   AR2    EQU 20B
       11                   PA     EQU 11B
    77777                   CNTR   EQU 77777B      AR1
 *
        0  34011      11A   .RS7   STB PA
        1      7       7A   .R7    LDA R7
        2  66000      27R          JMP RWEXT
        3  34011      11A   .RS6   STB PA
        4      6       6A   .R6    LDA R6
        5  66000      27R          JMP RWEXT
        6  34011      11A   .RS5   STB PA
        7      5       5A   .R5    LDA R5
       10  66000      27R          JMP RWEXT
       11  34011      11A   .RS4   STB PA
       12      4       4A   .R4    LDA R4
       13  66000      27R          JMP RWEXT
       14  34011      11A   .WS4   STB PA
       15 170140            .W4    CMA
       16  30004       4A          STA R4
       17  66000      27R          JMP RWEXT
       20  34011      11A   .WS5   STB PA
       21 170140            .W5    CMA
       22  30005       5A          STA R5
       23  66000      27R          JMP RWEXT
       24  34011      11A   .WS6   STB PA
       25 170140            .W6    CMA
       26  30006       6A          STA R6
       27 170140            RWEXT  CMA
       30  70430                   DIR
       31 170201                   RET 1
       32  34011      11A   .WS7   STB PA
       33 170140            .W7    CMA
       34  30007       7A          STA R7
       35  66000      27R          JMP RWEXT        LDB SUBCHANNEL (4-7)
 *                             LDA STRING ADDRESS
       36  30017      17A   .WSPS  STA D            JSM .WSPS
       37 144003       3A          ISZ R,I          DEC OUTPUT CHANNEL
       40 100003       3A          LDA R,I
       41 100000                   LDA A,I
       42  30011      11A          STA PA
       43  66000      54R          JMP .WSTS+1      LDB SUBCHANNEL (4-7)
       44 144003       3A   .WSTP  ISZ R,I          JSM .WSTP
       45 100003       3A          LDA R,I          DEC OUTPUT CHANNEL
       46 100000                   LDA A,I          DEF STRING
       47  30011      11A          STA PA
 *                             LDB SUBCHANNEL (4-7)
       50 144003       3A   .WSIR  ISZ R,I          JSM .WSIR
       51 100003       3A          LDA R,I          DEF STRING
       52 100000                   LDA A,I
       53  30017      17A   .WSTS  STA D            SET UP STACK POINTER
       54  74570                   WBD A,I          GET CHARACTER COUNT
       55  31777   77777A          STA CNTR
       56  72407                   SZA WS020
       57  74570            WS010  WBD A,I          GET CHAR
       60 170140                   CMA
       61 130001       1A          STA B,I
       62  70430                   DIR
       63  55777   77777A          DSZ CNTR
       64  66000      57R          JMP WS010
       65 170201            WS020  RET 1
       65                          END

.R4     12R       .R5     7R        .R6     4R        .R7     1R
.RS4    11R       .RS5    6R        .RS6    3R        .RS7    0R
.W4     15R       .W5     21R       .W6     25R       .W7     33R
.WS4    14R       .WS5    20R       .WS6    24R       .WS7    32R
.WSPS   36R       .WSTP   44R       .WSTR   50R       .WSTS   53R
A       0A        AR2     20A       B       1A        C       16A
CNTR    77777A    D       17A       E       77763A    PA      11A
R       3A        R4      4A        R5      5A        R6      6A
R7      7A        RWEXT   27R       WS010   57R       WS020   65R

KSPMAX=2 MSPMAX=39 NSPMAX=6 SSPMAX=182 DSPMAX=158
```

APPENDIX B-16

```
ASMB,R,L
                                    HED STORE A IN ADDRESS ON CSTAK
                                    NAM STAC,7  ET10585-1035A
 *
 *    A-ET10585-1034A-2
 *      ET10585-1034A   (S)
 *      ET10585-1035A   (R)
 *    15 JULY 1977
 *    LYNN WHEELWRIGHT
 *
        0                           ENT .STAC
        0                     A     EQU 0
        1                     B     EQU 1
        3                     R     EQU 3
       16                     C     EQU 16B
       17                     D     EQU 17B
 *
        0  70761           .STAC    WWC B
        1 130001      1A            STA B,1
        2 170201                    RET 1
        2                           END

.STAC   0R      A      0A      B      1A      C      16A
D       17A     R      3A

KSPMAX=2 MSPMAX=39 NSPMAX=6 SSPMAX=31 DSPMAX=158
```

APPENDIX B-17

```
ASMB,R,L
                                    HED AND FROM  ADDRESS ON CSTAK \
                                    NAM ANDB,7  ET10585-1037A
 *
 *    A-ET10585-1036A-2
 *      ET10585-1036A   (S)
 *      ET10585-1037A   (R)
 *    15 JULY 1977
 *    LYNN WHEELWRIGHT
 *
        0                           ENT .ANDB
        0                     A     EQU 0
        1                     B     EQU 1
        3                     R     EQU 3
       16                     C     EQU 16B
       17                     D     EQU 17B
 *
        0  70761           .ANDB    WWC B
        1 150001      1A            AND B,1
        2 170201                    RET 1
        2                           END

.ANDB   0R      A      0A      B      1A      C      16A
D       17A     R      3A

KSPMAX=2 MSPMAX=39 NSPMAX=6 SSPMAX=31 DSPMAX=158
```

APPENDIX B-18

```
ASMB,R,L
                                    HED IOR FROM  ADDRESS ON CSTAK \
                                    NAM ORB,7  ET10585-1039A \
 *
 *    A-ET10585-1038A-2
 *      ET10585-1038A   (S)
 *      ET10585-1039A   (R)
 *    15 JULY 1977
 *    LYNN WHEELWRIGHT
 *
        0                           ENT .ORB
        0                     A     EQU 0
        1                     B     EQU 1
        3                     R     EQU 3
       16                     C     EQU 16B
       17                     D     EQU 17B
 *
        0  70761           .ORB     WWC B
        1 160001      1A            IOR B,1
        2 170201                    RET 1
        2                           END

.ORB    0R      A      0A      B      1A      C      16A
D       17A     R      3A

KSPMAX=2 MSPMAX=39 NSPMAX=6 SSPMAX=30 DSPMAX=158
```

APPENDIX B-19

```
ASMB,R,L
                                    HED AND FROM CSTAK \
                                    NAM AND1,7  ET10585-1041A
 *
 *    A-ET10585-1040A-2
 *      ET10585-1040A   (S)
 *      ET10585-1041A   (R)
 *    15 JULY 1977
 *    LYNN WHEELWRIGHT
 *
```

```
      0                       ENT .ANDI
      0                  A    EQU 0
      1                  B    EQU 1
      3                  R    EQU 3
     16                  C    EQU 16B
     17                  D    EQU 17B
*
      0  70761          .ANDI WWC B
      1  50001     1A         AND B
      2 170201                RET 1
      2                       END

.ANDI   0R      A       0A      B       1A      C       16A
D       17A     R       3A

KSPMAX=2 MSPMAX=39 NSPMAX=6 SSPMAX=31 DSPMAX=158
```

APPENDIX B-20

```
ASMB,R,L
                              HED IOR FROM CSTAK \
                              NAM ORT,7  ET10585-1043A \
*
*    A-ET10585-1042A-2
*      ET10585-1042A  (S)
*      ET10585-1043A  (R)
*    15 JULY 1977
*    LYNN WHEELWRIGHT
*
      0                       ENT .ORT
      0                  A    EQU 0
      1                  B    EQU 1
      3                  R    EQU 3
     16                  C    EQU 16B
     17                  D    EQU 17B
*
      0  70761          .ORT  WWC B
      1  60001     1A         IOR B
      2 170201                RET 1
      2                       END

.ORT    0R      A       0A      B       1A      C       16A
D       17A     R       3A

KSPMAX=2 MSPMAX=39 NSPMAX=6 SSPMAX=30 DSPMAX=158
```

APPENDIX B-21

```
ASMB,L
                              HED ATTEN ERROR READ ROUTINE \
                              NAM ATNER,7   85680-90012A \
      0                       ENT ATNER
*
*    A-85680-90011A-2
*      85680-90011A  (S)
*      85680-90012A  (R)
*    13 SEP 1977
*    LYNN WHEELWRIGHT
*
*      INTEGER PROCEDURE ATNER(RFAT); VALUE RFAT;
*         INTEGER RFAT;
*         EXTERNAL;
*
*      THIS PROCEDURE READS RF ATTEN ERROR COEFFICIENTS
*      FROM PROM ON RF INTERFACE BD. ERROR IS STORED IN UNITS
*      OF .2 DB.
*
      0                  A    EQU 0
     11                  PA   EQU 11B
*
      0  52000    20R   ATNER AND =D7          ATNER(RFAT)
      1  22000    21R         ADA =D-2
      2 172003                SAP *+3
      3 170517                CLA
      4 170201                RET 1
      5   4000                LDB A
      6 174501                SBR 2
      7  26000    22R         ADB =D6
     10  34011    11A         STB PA
     11  62000    23R         IOR =D4
     12 100000                LDA A,I
     13 170140                CMA
     14  70430                DIR
     15 170607                SAL 8
     16 170406                AAR 7
     17 170201                RET 1
     17                       END
     20      7
     21 177776
     22      6
     23      4

177776  21R     4       23R     6       22R     7       20R
A       0A      ATNER   0R      PA      11A

KSPMAX=2 MSPMAX=39 NSPMAX=6 SSPMAX=36 DSPMAX=158
```

APPENDIX B-22

```
ASMB,R,L
                                        HED CHARACTER ROUTINES FOR BPCL
                                        NAM AIPCR,7 ET10585-1053A
  *
  *    A-ET10585-1052A-2
  *      ET10585-1052A  (S)
  *      ET10585-1053A  (R)
  *    7 MAR 1978
  *    LINN WHEELWRIGHT
  *
        0                               ENT ACHAR,APCHR,ICHAR,PCHAR,IPCHR
        0                               EXT AR3D
  *
  *      PROCEDURE ACHAR(C,S); VALUE C,S;
  *         INTEGER C; ALPHA S; EXTERNAL;
  *      PROCEDURE PCHAR(P,C,S); VALUE P,C,S;
  *         INTEGER P,C; ALPHA S; EXTERNAL;
  *      PROCEDURE ICHAR(P,C,S); VALUE P,C,S;
  *         INTEGER P,C; ALPHA S; EXTERNAL;
  *
        0                         A     EQU 0
        1                         B     EQU 1
       16                         C     EQU 16B
       17                         D     EQU 17B
    77763                         E     EQU 77763B
    77762                         APTR  EQU 77762B
    77761                         CNTR  EQU 77761B
  *
        0    6000       1X        APCHR LDB AR3D        AREG=CHAR
        1   70541                       PWC B
  *
        2 104016       16A        ACHAR LDB C,I
        3   70540                       PWC A
        4 144001        1A              ISZ B,I         INCREMENT LENGTH
        5 100001        1A              LDA B,I         STRING LENGTH
  *
        6 170700                  PCHAR RAR 1
        7   70761                       WWC B           GET CHARACTER
       10 120016       16A              ADA C,I         FORM STRING ADDRESS
       11 172212                        SAP EVEN,C      INDEX TO BYTE
       12   72101                 ODD   RIA *+1
       13   31762   77762A              STA APTR
       14    2000     104R              LDA =B377       FETCH BYTE MASK
       15 174607                        SBL 8           POSITION BYTE TO BE MERGED
       16 151762   77762A        PXIT  AND APTR,I      MASK OFF UNWANTED BYTE
       17   60001       1A              IOR B           MERGE NEW BYTE
       20 131762   77762A              STA APTR,I      PUT IT BACK
       21   54016      16A              DSZ C           FIX UP STACK
       22 170201                        RET 1           RETURN TO CALLER
       23   31762   77762A        EVEN  STA APTR
       24    2000     105R              LDA =B177400    FETCH BYTE MASK
       25   66000      16R              JMP PXIT
  *
       26    2000     106R        XIT3  LDA =D-3
       27   20016      16A              ADA C
       30   30016      16A              STA C
       31 170201                        RET 1
  *
       32   70541                 IPCHR PWC B           AREG=POSITION
       33   70541                       PWC B
       34    6000       1X              LDB AR3D        BREG=CHARACTER
       35   70741                       PWC B,D
       36   66000      40R              JMP *+2
  *
       37   54016      16A        ICHAR DSZ C           GET STRING ADDRESS
       40   70561                       WWC B,I
       41   70540                       PWC A           SAVE CHARACTER POSITION
       42 170040                        TCA
       43 172063                        SAP XIT3        ILLEGAL CHAR POSITION
       44 120001        1A              ADA B,I         GET LENGTH
       45 170140                        CMA
       46 172033                        SAP IAPND       OFF END OF STRING - APPEND IT
       47 170400                        AAR 1
       50   31761   77761A              STA CNTR        # OF WORDS TO JUGGLE
       51 100016       16A              LDA C,I         CHECK FOR EVEN LEN AND ODD INS
       52   73004                       SLA *+4
       53 100001        1A              LDA B,I
       54   73403                       RLA *+3         TEST FAILED - DON'T INCREASE C
       55   55761   77761A              DSZ CNTR
       56 100001        1A              LDA B,I
       57   72422                       SZA IAPND       NULL STRING
       60 170500                        SAR 1
       61   20001        1A              ADA B
       62   30017       17A              STA D
       63   72101                       RIA *+1
       64   31762   77762A              STA APTR
       65 144001        1A              ISZ B,I
       66 101762   77762A        ILOOP LDA APTR,I
       67 170507                        SAR 8
       70   70771                       WWD B
       71 174607                        SBL 8
       72   60001        1A              IOR B
       73 131762   77762A              STA APTR,I
       74   55762   77762A              DSZ APTR
       75   45761   77761A              ISZ CNTR
       76   66000      66R              JMP ILOOP
       77   70760                       WWC A
```

```
       100  66000      6R         JMP PCHAR
       101  54016     16A  IAPND  DSZ C
       102  70760                 WWC A
       103  66000      2R         JMP ACHAR
       103                        END
       104    377
       105 177400
       106 177775

177400 105R     177775 106R     377    104R     A      0A
ACHAR  2R       APCHR  0R       APTR   77762A   AR3D   1X
B      1A       C      16A      CNTR   77761A   D      17A
E      77763A   EVEN   23R      IAPND  101R     ICHAR  37R
ILOOP  66R      IPCHR  32R      ODD    12R      PCHAR  6R
PXIT   16R      XIT3   26R

KSPMAX=2 MSPMAX=39 NSPMAX=6 SSPMAX=124 DSPMAX=158
```

APPENDIX B-23

```
ASMB,R,L
                                      HED STRING CONVERSIONS FOR BPCL
                                      NAM CNVSI,7 ET10585-1055B
  *
  *      A-ET10585-1054B-2
  *        ET10585-1054B  (S)
  *        ET10585-1055B  (R)
  *      23 MAR 78
  *      LYNN WHEELWRIGHT
  *
           0                          ENT CNV15,CNV25,CNV45,APN25
           0                          EXT AR3D,CNV43,IPCHR
  *
  *        PROCEDURE CNV15(R); VALUE R;
  *          REAL R; EXTERNAL;
  *        PROCEDURE CNV25(D); VALUE D;
  *          BCDL D; EXTERNAL;
  *        PROCEDURE CNV45(I); VALUE I;
  *          INTEGER I; EXTERNAL;
  *        PROCEDURE APN25(D); VALUE D;
  *          BCDL D; EXTERNAL;
  *
           0                   A      EQU 0
           1                   B      EQU 1
          16                   C      EQU 16B
          17                   D      EQU 17B
          20                   AR2    EQU 20B
       77764                   AR3    EQU 77764B
       77777                   CNTR   EQU 77777B
           0  42000     77R    CNV15  JSM CNV25
           1  74770            CN.10  WBD A          REMOVE TRAILING ZEROES
           2  12000    146R           CPA =B60
           3  66000      5R           JMP *+2
           4  66000     17R           JMP CN.20
           5  55764  77764A           DSZ AR3
           6  66000      1R           JMP CN.10
           7  45764  77764A           ISZ AR3
          10     20     20A           LDA AR2        NUM=0
          11  72406                   SZA CN.20
          12 170416                   AAR 15         LIMIT EXP TO 1 TO -1
          13 172402                   SAM *+2
          14  72501                   SIA *+1
          15 170605                   SAL 6
          16  30020     20A           STA AR2
          17   4020     20A    CN.20  LDB AR2
          20 174405                   ABR 6
          21  76432                   SZB LDP        ZERO EXP - INSERT DECIMAL POIN
          22  26000    147R           ADB =D3
          23 176435                   SBM EXP        PROCESS EXPON
          24  26000    150R           ADB =D-16      WITHIN BOUNDS FOR FXD FORMAT?
          25 176033                   SBP EXP          NO-PROCESS EXPON
          26  26000    151R           ADB =D13
          27 176413                   SBM LDZRO      GO INSERT LEADING ZEROES
          30     20     20A           LDA AR2
          31  52000    152R           AND =D1
          32 170040                   TCA
          33  21764  77764A           ADA AR3
          34 170040                   TCA
          35  20001      1A           ADA B
          36 172434                   SAM CN.30      WITHIN STRING?
          37  21764  77764A           ADA AR3        NO - LENGTHEN IT
          40  31764  77764A           STA AR3
          41 170201                   RET 1
          42  70541            LDZRO  PWC B
          43   6000    146R           LDB =B60
          44     20     20A           LDA AR2
          45  52000    152R           AND =D1
          46  72101                   RIA *+1
          47  42000      3X           JSM IPCHR
          50 144016     16A           ISZ C,I
          51  66000     43R           JMP LDZRO+1
          52  54016     16A           DSZ C
          53     20     20A    LDP    LDA AR2
          54  52000    152R           AND =D1
          55  72101            IDP    RIA *+1
          56   6000    153R           LDB =B56       DECIMAL POINT
          57  66000      3X           JMP IPCHR
          60  42000    121R    EXP    JSM APSET
          61   2000    154R           LDA =B105      E
          62  42000    135R           JSM APCHR
```

```
        63     20     20A           LDA AR2
        64  70540                   PWC A
        65 170405                   AAR 6
        66  42000      2X           JSM CNV43
        67  42000    101R           JSM APN25
        70  70760                   WWC A
        71  66000     54R           JMP LDP+1
        72     20     20A   CN.30   LDA AR2
        73  52000    152R           AND =D1
        74  20001      1A           ADA B
        75  66000     55R           JMP IDP
 *
        76  42000      2X   CNV45   JSM CNV43
        77   2000      1X   CNV25   LDA AR3D      CLEAR STRING BUFFER
       100  71607                   CLR 8
       101  42000    121R   APN25   JSM APSET
       102  71500                   NRM
       103  72702                   SDC *+2
       104  54001      1A           DSZ B
       105  26000    155R           ADB =D-12
       106  35777  77777A           STB CNTR
       107     20     20A           LDA AR2
       110  73003                   SLA ALOOP
       111   2000    156R           LDA =B55      MINUS
       112  42000    135R           JSM APCHR
       113  75541           ALOOP   MLY
       114  62000    146R           IOR =B60
       115  42000    135R           JSM APCHR
       116  45777  77777A           ISZ CNTR
       117  66000    113R           JMP ALOOP
       120 170201                   RET 1
       121   5764  77764A   APSET   LDB AR3
       122  76404                   SZB *+4
       123  26000    157R           ADB =D-1
       124 174700                   RBR 1
       125  26000    160R           ADB =B100001  SET UP D REG AS CHAR POINTER
       126  26000      1X           ADB AR3D
       127  34017     17A           STB D
       130 176204                   SBP *+4,C
       131 100001      1A           LDA B,I
       132  52000    161R           AND =B177400  MASK OFF GARBAGE BYTE
       133 130001      1A           STA B,I
       134 170201                   RET 1
       135   4017     17A   APCHR   LDB D
       136  45764  77764A           ISZ AR3       INCREMENT STRING LENGTH
       137 176205                   SBP *+5,C     + = LAST CHAR WAS RIGHT BYTE
       140 160001      1A           IOR B,I       - = LAST CHAR WAS LEFT BYTE
       141 130001      1A           STA B,I
       142  34017     17A           STB D
       143 170201                   RET 1
       144  74550                   PBD A,I       STORE LEFT CHAR,ZERO RIGHT CHA
       145 170201                   RET 1
       145                          END
       146     60
       147      3
       150 177760
       151     15
       152      1
       153     56
       154    105
       155 177764
       156     55
       157 177777
       160 100001
       161 177400

1       152R     100001 160R     105     154R     15      151R
177400  161R     177760 150R     177764  155R     177777  157R
3       147R     55     156R     56      153R     60      146R
A       0A       ALOOP  113R     APCHR   135R     APN25   101R
APSET   121R     AR2    20A      AR3     77764A   AR3D    1X
B       1A       C      16A      CN.10   1R       CN.20   17R
CN.30   72R      CNTR   77777A   CNV15   0R       CNV25   77R
CNV43   2X       CNV45  76R      D       17A      EXP     60R
IDP     55R      IPCHR  3X       LDP     53R      LDZRO   42R

KSPMAX=2 MSPMAX=39 NSPMAX=6 SSPMAX=206 DSPMAX=158
```

APPENDIX B-24

```
ASMB,R,L
                                    HED TRACE DUMP TO HPIB \
                                    NAM TDUMP,7 85680-90010A \
 *
 *      A-85680-90009A-2
 *        85680-90009A  (S)
 *        85680-90010A  (R)
 *      28 APR 1978
 *      LYNN WHEELWRIGHT
 *
           0                        ENT TDUMP,PDUMP,ADUMP,SDUMP,STHPB,HPBSY,HBUS
           0                        ENT WHPIB,WEOI,IHPBT,IHPIB
           0                        EXT AR3D,CNV15,CNV45
 *
 *        PROCEDURE ADUMP(ADC,FMT,RDBMV);
 *          VALUE ADC,FMT; INTEGER ADC,FMT;
 *          REAL PROCEDURE RDBMV(A);
 *            VALUE A; INTEGER A;
```

```
*          EXTERNAL;
*        PROCEDURE PDUMP(FMT,RDBMV);
*          VALUE FMT; INTEGER FMT;
*          REAL PROCEDURE RDBMV(A);
*            VALUE A; INTEGER A;
*          EXTERNAL;
*        PROCEDURE IDUMP(FMT,RDBMV);
*          VALUE FMT; INTEGER FMT;
*          REAL PROCEDURE RDBMV(A);
*            VALUE A; INTEGER A;
*          EXTERNAL;
*        PROCEDURE SDUMP(FMT,RDBMV,CNT,ADDR,INCR);
*          VALUE FMT,CNT,ADDR,INCR;
*          INTEGER FMT,CNT,ADDR,INCR;
*          REAL PROCEDURE RDBMV(A);
*            VALUE A; INTEGER A;
*          EXTERNAL;
*        PROCEDURE STHPB(S); VALUE S;
*          ALPHA S; EXTERNAL;
*        PROCEDURE HPBSY(ABORT,LOCAL);
*          LABEL ABORT,LOCAL; EXTERNAL;
*        PROCEDURE HBUSY; EXTERNAL;
*        PROCEDURE WHPIB(N); VALUE N; INTEGER N;
*          EXTERNAL;
*        PROCEDURE WEOI; EXTERNAL;
*        INTEGER PROCEDURE IHPIB;
*          EXTERNAL;
*        PROCEDURE IHPBT(DSTAD,COUNT); VALUE COUNT;
*          INTEGER DSTAD,COUNT; EXTERNAL;
*
     0                     A      EQU 0
     1                     B      EQU 1
     3                     R      EQU 3
     4                     R4     EQU 4
     5                     R5     EQU 5
     6                     R6     EQU 6
     7                     R7     EQU 7
    11                     PA     EQU 11B
    16                     C      EQU 16B
    17                     D      EQU 17B
 77763                     E      EQU 77763B
    20                     AR2    EQU 20B
 77764                     AR3    EQU 77764B
 77754                     FMT    EQU 77754B
 77753                     CNTR   EQU 77753B
 77752                     DBMNV  EQU 77752B
 77751                     GTLCL  EQU 77751B
 77750                     ABORT  EQU 77750B
 77755                     SCNTR  EQU 77755B
*
     0    6000     262R   IHPIB  LDB =D4
     1   34011      11A          STB PA
     2    6000     263R          LDB =B177
     3   34007       7A          STB R7         HPIB BINARY INPUT
     4    6000     264R   IHP05  LDB =D2
     5   34011      11A          STB PA
     6    4007       7A   IHP07  LDB R7
     7  174614                   SBL 13
    10   16000     141R          CPB HPBRQ      HPIB INPUT?
    11   66000      15R          JMP IHP10      YES
    12   16000     140R   IHP09  CPB LOCAL      LOCAL?
    13   66000      23R          JMP IHP25
    14   66000       6R          JMP IHP07
    15    6000     262R   IHP10  LDB =D4        YES
    16   34011      11A          STB PA
    17       5       5A          LDA R5
    20  170140                   CMA
    21   52000     265R          AND =B377
    22  170201                   RET 1
    23    4006       6A   IHP25  LDB R6
    24  174600                   SBL 1
    25  176461                   SBM IHP07      HPIB IN LOCAL?
    26  165751   77751A          JMP GTLCL,1    BAILOUT - GO TO LOCAL
*
    27   70760            IHPBT  WWC A          GET ADDRESS OF DSTAD
    30   31755   77755A          STA SCNTR
    31  100000                   LDA A,I
    32  170140                   CMA
    33    6000     266R          LDB =D8
    34   34011      11A          STB PA
    35   30004       4A          STA R4         SET DST ADDRESS
    36   70760                   WWC A          FETCH # WORDS TO BE INPUT
    37  172006                   SAP IHP50-1
    40   42000                   JSM IHPIB
    41  170607                   SAL 8
    42   31753   77753A          STA CNTR
    43   42000                   JSM IHPIB
    44   61753   77753A          IOR CNTR
    45   31753   77753A          STA CNTR
    46   42000            IHP50  JSM IHPIB
    47  170607                   SAL 8
    50   30017      17A          STA D
    51   42000                   JSM IHPIB
    52   60017      17A          IOR D
    53    6000     266R          LDB =D8
    54   34011      11A          STB PA
    55  170140                   CMA
    56   30006       6A          STA R6         WRITE WORD IN DST
    57  145755   77755A          ISZ SCNTR,I    INCREMENT DSTAD
    60   55753   77753A          DSZ CNTR
```

```
61   66000      46R           JMP IHP50
62  170201                    RET 1
*
63   30017      17A   STHPB   STA D        DUMP STRING TO HPIB
64   74571                    WBD B,I      GET LENGTH
65   35755   77755A           STB SCNTR
66   76407                    SZB *+7      NOTHING TO DO
67   74570            SLOOP   WBD A,I
70  170140                    CMA
71   42000     116R           JSM HBUSY
72   30006       6A           STA R6
73   55755   77755A           DSZ SCNTR
74   66000      67R           JMP SLOOP
75  170201                    RET 1
*
76   52000     267R   TSET    AND =D3
77   22000     105R           ADA FTAB
100 100000                    LDA A,I      FETCH FORMAT POINTER
101  31754   77754A           STA FMT
102  70761                    WWC B        FETCH PROCEDURE ENTRY
103  35752   77752A           STB DBMNV
104 170201                    RET 1
105            106R   FTAB    DEF *+1
106            251R           DEF FMTAB
107            237R           DEF FMT4R
110            221R           DEF FMT8
111            230R           DEF FMT16
*
112  70761            HPBSY   WWC B        FETCH LABELS
113  35750   77750A           STB ABORT
114  70761                    WWC B
115  35751   77751A           STB GTLCL
116   6000     264R   HBUSY   LDB =D2
117  34011      11A           STB PA
120   4007       7A   BLOOP   LDB R7
121 174611                    SBL 10
122 176413                    SBM DONE
123 174602                    SBL 3
124  16000     141R           CPB HPBRG
125 165750   77750A           JMP ABORT,I
126  16000     140R           CPB LOCAL
127  66000     131R           JMP *+2
130  66000     120R           JMP BLOOP
131   4006       6A           LDB R6
132 174600                    SBL 1
133 176465                    SBM BLOOP
134 165751   77751A           JMP GTLCL,I
135   6000     262R   DONE    LDB =D4
136  34011      11A           STB PA
137 170201            TDONE   RET 1
140                   LOCAL   OCT 120000
141                   HPBRG   OCT 20000
*
142  42000     116R   WEOI    JSM HBUSY
143   6000     270R           LDB =D-3
144  34007       7A           STB R7
145 170201                    RET 1
*
146 170140            WHPIB   CMA
147  42000     116R           JSM HBUSY
150  30006       6A           STA R6
151 170201                    RET 1
*
152  31753   77753A   ADUMP   STA CNTR
153  70760                    WWC A
154  42000      76R           JSM TSET     GET ARGUMENTS
155   1753   77753A           LDA CNTR
156   6000     271R           LDB =D1
157  35753   77753A           STB CNTR
160 170140                    CMA
161 165754   77754A           JMP FMT,I
*
162   6000     271R   PDUMP   LDB =D1
163  66000     165R           JMP TDUMP+1
164   6000     272R   TDUMP   LDB =D1001
165  35753   77753A           STB CNTR
166  42000      76R           JSM TSET
167   2000     266R   ILOOP   LDA =D8
170  30011      11A           STA PA
171      5       5A           LDA R5
172 141754   77754A           JSM FMT,I
173  55753   77753A           DSZ CNTR
174  66000     167R           JMP ILOOP
175 170201                    RET 1
*
176  42000      76R   SDUMP   JSM TSET     FETCH FORMAT AND PROCEDURE
177  70760                    WWC A        FETCH COUNT
200  31753   77753A           STA CNTR
201   2000     266R   SDRLP   LDA =D8
202  30011      11A           STA PA
203  70760                    WWC A        FETCH DSTAD
204 170140                    CMA
205  30004       4A           STA R4       SET DSPL ADRS
206 170140                    CMA
207 120016      16A           ADA C,I      INCREMENT ADDRESS
210  70540                    PWC A
211  72600                    SFC *        WAIT FOR DIG STOR
212      5       5A           LDA R5       READ DIG STOR
213 141754   77754A           JSM FMT,I
214  55753   77753A           DSZ CNTR
```

```
215  66000   201R          JMP SURLP
216  54016    16A          DSZ C
217  54016    16A          DSZ C          UPDATE C STACK
220 170201                 RET 1
*
221 170501         FMT8    SAR 2
222   5753 77753A  FMT81   LDB CNTR
223  16000   271R          CPB =D1
224  42000   142R          JSM WEOI
225  42000   116R  FMT82   JSM HBUSY
226  30006     6A          STA R6
227 170201                 RET 1
*
230  62000   273R  FMT16   IOR =B170000
231  70540                 PWC A
232 170707                 RAR 8
233  42000   116R          JSM HBUSY
234  30006     6A          STA R6
235  70760                 WWC A
236  66000   222R          JMP FMT81
*
237  62000   273R  FMT4R   IOR =B170000
240 170140                 CMA
241  42000     3X          JSM CNV45
242   2000     1X  FMT4S   LDA AR3D
243  42000    63R          JSM STHP8
244   2000   274R          LDA =B-16      CR
245  42000   116R          JSM HBUSY
246  30006     6A          STA R6
247   2000   275R          LDA =B-13      LF
250  66000   222R          JMP FMT81
*
251  62000   273R  FMTA8   IOR =B170000
252 170140                 CMA
253 141752 77752A          JSM DBMNV,I
254 170517                 CLA
255   6000   276R          LDB =D7
256  75500                 MRY
257  71500                 NRM
260  42000     2X          JSM CNV15
261  66000   242R          JMP FMT4S
261                        END
262      4
263    177
264      2
265    377
266     10
267      3
270 177775
271      1
272   1751
273 170000
274 177762
275 177765
276      7

1       271R     10      266R     170000  273R     1751    272R
177     263R     177762  274R     177765  275R     177775  270R
2       264R     3       267R     377     265R     4       262R
7       276R     A       0A       ABORT   77750A   ADUMP   152R
AR2     20A      AR3     77764A   AR3D    1X       B       1A
BLOOP   120R     C       16A      CNTR    77753A   CNV15   2X
CNV45   3X       D       17A      DBMNV   77752A   DONE    135R
E       77763A   FMT     77754A   FMT16   230R     FMT4R   237R
FMT4S   242R     FMT8    221R     FMT81   222R     FMT82   225R
FMTA8   251R     FTAB    105R     GTLCL   77751A   HBUSY   116R
HPBRQ   141R     HPBSY   112R     IHP05   4R       IHP07   6R
IHP09   12R      IHP10   15R      IHP25   23R      IHP50   46R
IHP61   27R      IHP16   0R       LOCAL   140R     PA      11A
PDUMP   162R     R       3A       R4      4A       R5      5A
R6      6A       R7      7A       SCNTR   77755A   SDUMP   176R
SLOOP   67R      STHP8   63R      SURLP   201R     TDONE   137R
TDUMP   164R     TLOOP   167R     TSET    76R      WEOI    142R
WHP16   146R

KSPMAX=2 MSPMAX=39 NSPMAX=6 SSPMAX=384 DSPMAX=158
```

APPENDIX B-25

```
ASMB,R,L
                              HED VIDEO AVERAGE ROUTINE
                              NAM VDAVG,7  ET10585-1047A \
*
*   A-ET10585-1046A-2
*     ET10585-1046A  (S)
*     ET10585-1047A  (R)
*   15 JULY 1977
*   LYNN WHEELWRIGHT
*
    0                         ENT VDAVG,VDSUB
    0                         EXT .FLT,.FDVA,AR1D
    0  12000   213R   VDAVG   CPA =D1        N= AVERAGE #
    1  66000   135R           JMP STR1Z      P= PAGE OF MEMORY
    2  70540                  PWC A
    3  42000     1X           JSM .FLT
    4   2000     3X           LDA AR1D
    5   6000    13R           LDB AR3D
    6  71401                  XFR 2
```

```
     7  70760                 WWC  A
    10  22000    214R         ADA  =D-1
    11  42000      1X         JSM  .FLT
    12  42000      2X         JSM  .FDVA
    13         77764A  AR30   DEF  AR3
    14   1771  77771A         LDA  AR1+1
    15  31767  77767A         STA  AR3+3      AR3+3=(N-1)/N
    16   2000    213R         LDA  =D1
    17  42000      1X         JSM  .FLT
    20  42000      2X         JSM  .FDVA      AR1=1/N
    21         77764A         DEF  AR3
    22   1770  77770A         LDA  AR1
    23  72004                 RZA  STR
    24   2000    116R         LDA  RET4
    25  30020     20A         STA  AR2
    26  66000     42R         JMP  STRIA
    27 170140          STR    CMA
    30  22000    120R         ADA  ABR1
    31  30023     23A         STA  AR2+3
    32  22000    215R         ADA  =B4100
    33  30021     21A         STA  AR2+1
    34  52000    216R         AND  =B17
    35 170040                 TCA
    36  22000    117R         ADA  SBL15
    37  30020     20A         STA  AR2
    40   2000    115R         LDA  RET1
    41  30022     22A         STA  AR2+2
    42  42000    121R  STRIA  JSM  SETUP
    43   5774  77774A  LOOPA  LDB  TRAB
    44  72600                 SFC  *
    45  34004      4A         STB  R4
    46   5775  77775A         LDB  TRC
    47  72600                 SFC  *
    50      5      5A         LDA  R5
    51 170140                 CMA
    52 170604                 SAL  5
    53  72600                 SFC  *
    54  34004      4A         STB  R4
    55   5767  77767A         LDB  AR3+3
    56  72600                 SFC  *
    57  75617                 MPY
    60  31764  77764A         STA  AR3
    61  35765  77765A         STB  AR3+1
    62      5      5A         LDA  R5
    63 170140                 CMA
    64 170604                 SAL  5
    65   5774  77774A         LDB  TRAB
    66  72600                 SFC  *
    67  34004      4A         STB  R4
    70   5771  77771A         LDB  AR1+1
    71  72600                 SFC  *
    72  75617                 MPY
    73  35776  77776A         STB  X
    74  40020     20A         JSM  AR2
    75  20001      1A         ADA  B
    76   5776  77776A         LDB  X
    77  70023                 EXE  AR2+3
   100 177201                 SEC  *+1,C
   101  21764  77764A         ADA  AR3
   102 177202                 SEC  *+2,C
   103  75501                 SIB  *+1
   104  25765  77765A         ADB  AR3+1
   105  26000    217R         ADB  =D8
   106 174503                 SBR  4
   107 174140                 CMB
   110  34006      6A         STB  R6
   111  45774  77774A         ISZ  TRAB
   112  45775  77775A         ISZ  TRC
   113  55777  77777A         DSZ  CNTR
   114  66000     43R         JMP  LOOPA
   115 170201          RET1   RET  1
   116 170204          RET4   RET  4
   117 174616          SBL15  SBL  15
   120 174400          ABR1   ABR  1
 77764                 AR3    EQU  77764B
    20                 AR2    EQU  20B
 77770                 AR1    EQU  77770B
 77774                 TRAB   EQU  77774B
 77775                 TRC    EQU  77775B
 77776                 X      EQU  77776B
 77777                 CNTR   EQU  77777B
     4                 R4     EQU  4
     5                 R5     EQU  5
     6                 R6     EQU  6
     0                 A      EQU  0
     1                 B      EQU  1
    16                 C      EQU  16B
    11                 PA     EQU  11B
   121   6000    220R  SETUP  LDB  =D1001
   122  35777  77777A         STB  CNTR
   123   6000    217R         LDB  =D8
   124  34011     11A         STB  PA
   125  70761                 WWC  B
   126 174611                 SBL  10
   127  26000    220R         ADB  =D1001
   130 174140                 CMB
   131  35774  77774A         STB  TRAB
   132   6000    221R         LDB  =D-4074
   133  35775  77775A         STB  TRC
   134 170201                 RET  1
```

```
135  42000    121R  STRTZ JSM SETUP
136   5775 77775A   LOOPZ LDB TRC
137  72600                SFC *
140  34004      4A        STB R4
141  72600                SFC *
142      5      5A        LDA R5
143   5774 77774A         LDB TRAB
144  72600                SFC *
145  34004      4A        STB R4
146  72600                SFC *
147  30006      6A        STA R6
150  45774 77774A         ISZ TRAB
151  45775 77775A         ISZ TRC
152  55777 77777A         DSZ CNTR
153  66000    136R        JMP LOOPZ
154 170201                RET 1
155   6000    213R  VDSUB LDB =D1          C_C-B
156  70541                PWC B
157  42000    121R        JSM SETUP
160   5774 77774A   LOOPS LDB TRAB
161  72600                SFC *
162  34004      4A        STB R4
163   5775 77775A         LDB TRC
164  72600                SFC *
165      5      5A        LDA R5
166  72501                STA *+1
167 170604                SAL 5
170  72600                SFC *
171  34004      4A        STB R4
172  31776 77776A         STA X
173  72600                SFC *
174      5      5A        LDA R5
175 170140                CMA
176 170604                SAL 5
177  21776 77776A         ADA X
200  72600                SFC *
201  34004      4A        STB R4
202 170404                AAR 5
203 170140                CMA
204  72600                SFC *
205  30006      6A        STA R6
206  45774 77774A         ISZ TRAB
207  45775 77775A         ISZ TRC
210  55777 77777A         DSZ CNTR
211  66000    160R        JMP LOOPS
212 170201                RET 1
212                       END
213      1
214 177777
215   4100
216     17
217     10
220   1751
221 170026

.FDVA  2X     .FLT   1X      1      213R    10     217R
17     216R   170026 221R    1751   220R    177777 214R
4100   215R   A      0A      ABR1   120R    AR1    77770A
AR1D   3X     AR2    20A     AR3    77764A  AR3D   13R
B      1A     C      16A     CNTR   77777A  LOOPA  43R
LOOPS  160R   LOOPZ  136R    PA     11A     R4     4A
R5     5A     R6     6A      RET1   115R    RET4   116R
SBL15  117R   SETUP  121R    STR    27R     STRTA  42R
STRTZ  135R   TRAB   77774A  TRC    77775A  VDAVG  0R
VDSUB  155R   X      77776A

KSPMAX=2 MSPMAX=39 NSPMAX=6 SSPMAX=205 DSPMAX=158
```

APPENDIX B-26

```
ASMB,R,L
                               HED BINARY FLOATING POINT MATH \
                               NAM BFLT,7  ET10585-1049A
 *
 *    A=ET10585-1048A-2
 *      ET10585-1048A  (S)
 *      ET10585-1049A  (R)
 *    1 AUG 1977
 *    LYNN WHEELWRIGHT
 *
        0                      ENT .FMPA,.FMPB,.FDVA,.FDVB,.FLT,.FIX
        0                      ENT .FADA,.FADB
        0                      EXT AR1D,.BDVS,.BDVF
 *
 *      8 JUN 76
 *
     0 141003     3A  .FMPA ISZ R,I       JSM .FMPA  (AR1=ACCUM)
     1 104003     3A        LDB R,I       DEF OPERAND
     2 104001     1A        LDB B,I
     3 176677               SBM *-1,C     FOLLOW INDIRECTS
     4 100001     1A  .FMPB LDA B,I       GET EXPONENT
     5  21770 77770A        ADA AR1
     6  72501               STA *+1
     7  31770 77770A        STA AR1       EXPONENTS DONE
    10  76501               STB *+1
    11 100001     1A        LDA B,I
    12   5771 77771A        LDB AR1+1
    13  75617               MPY
    14  76010               RZB FMPS
```

```
 15  72007            RZA FMPS
 16  66000     77R    JMP FADNZ
 17 172002     FMPL   SAP *+2
 20  76101            RIB *+1
 21 170600            SAL 1
 22  55770  77770A    DSZ AR1
 23                   NOP
 24  35771  77771A FMPS STB AR1+1
 25 176404            SBM *+4
 26 174600            SBL 1
 27 176070            SBP FMPL
 30 170201            RET 1
 31 174600            SBL 1
 32 176465            SBM FMPL
 33 170201            RET 1
*
 34 144003      3A .FDVA ISZ R,I
 35 104003      3A    LDB R,I
 36 104001      1A    LDB B,I
 37 176677            SBM *-1,C
 40 173201       .FDVB SOC *+1,C
 41 100001      1A    LDA B,I
 42 170040            TCA
 43  21770  77770A    ADA AR1
 44  72501            SIA *+1
 45 173632            SOS FADNZ,C      EXPONENT OVERFLOW
 46  31773  77773A    STA AR1+3
 47  76501            SIB *+1
 50 104001      1A    LDB B,I
 51  16000    225R    CPB =B100000
 52  66000     70R    JMP FDV20
 53   1771  77771A    LDA AR1+1
 54  42000      2X    JSM .BDVS
 55 173407            SOS FDV10
 56   4000            LDB A
 57   2000    226R    LDA =D0
 60  42000      3X    JSM .BDVF
 61   4000            LDB A
 62   1773  77773A    LDA AR1+3
 63  66000    112R    JMP FADN-1
 64  31771  77771A FDV10 STA AR1+1
 65   2000    227R    LDA =D32767
 66  31770  77770A    STA AR1
 67 170201            RET 1
 70   5771  77771A FDV20 LDB AR1+1
 71  16000    225R    CPB =B100000
 72  66000     74R    JMP *+2
 73  66000    112R    JMP FADN-1
 74  72501            SIA *+1
 75 174500            SBR 1
 76  66000    100R    JMP FADNZ+1
*
 77   2000    230R FADNZ LDA =D-32767
100  31770  77770A    STA AR1
101  35771  77771A    STB AR1+1
102 170201            RET 1
103  35771  77771A FADNN STB AR1+1
104 174600            SBL 1
105  22000    231R    ADA =D-1
106 176475            SBM *-3
107  66000    122R    JMP FADNX
*
110   4000       .FLT LDB A            AREG = NUM TO BE FLOATED
111   2000    232R    LDA =D15
112  31770  77770A    STA AR1
113  76464       FADN SZB FADNZ
114   1770  77770A    LDA AR1
115 176466            SBM FADNN
116  35771  77771A    STB AR1+1
117 174600            SBL 1
120  22000    231R    ADA =D-1
121 176075            SBP *-3
122  72501      FADNX SIA *+1
123  31770  77770A    STA AR1
124 170201            RET 1
*
125 144003      3A .FADA ISZ R,I       JSM .FADA
126 104003      3A    LDB R,I          DEF OPERAND
127 104001      1A    LDB B,I
130 176677            SBM *-1,C
131 100001      1A .FADB LDA B,I       JSM .FADB
132 170040            TCA              BREG = OPER. ADDRESS
133  21770  77770A    ADA AR1
134 172423            SAM NEXPO
135  76501            SIB *+1
136  72003            RZA *+3
137 104001      1A    LDB B,I
140  66000    146R    JMP FADX-2
141  22000    233R    ADA =D-16
142 172014            SAP FADXT
143  22000    202R    ADA ABR16
144 104001      1A    LDB B,I
145  70000            EXE A
146 173201            SOC *+1,C
147  25771  77771A    ADB AR1+1
150 173243       FADX SOC FADN,C
151  45770  77770A    ISZ AR1
152                   NOP
153 174400            ABR 1
154  26000    225R    ADB =B100000
```

```
       155  35771  77771A         STB AR1+1
       156 170201          FADXI  RET 1
       157 170040          NEXPO  TCA
       160  22000   233R          ADA =D-16
       161 172405                 SAM *+5
       162      1    1A           LDA B
       163   6000    1X           LDB AR1D
       164  71401                 XFR 2
       165 170201                 RET 1
       166  22000   201R          ADA AAR16
       167  70540                 PWC A
       170 100001    1A           LDA B,I
       171  31770  77770A         STA AR1
       172  76501                 STB *+1
       173   1771  77771A         LDA AR1+1
       174 170016                 EXE C,I
       175 104001    1A           LDB B,I
       176  24000                 ADB A
       177  70760                 WWC A
       200  66000   150R          JMP FADX
       201 170417          AAR16  AAR 16
       202 174417          ABR16  ABR 16
     *
       203   1770  77770A  .FIX   LDA AR1           JSM .FIX
       204   5771  77771A         LDB AR1+1
       205 172415                 SAM FIXZ          CONTENTS OF AR1,AR1+1 FIXED
       206  22000   234R          ADA =D-15
       207  72405                 SZA FIXII+1
       210 172006                 SAP FIXOV
       211 170140                 CMA
       212  62000   224R          IOR ABR1
       213  70000         FIXII   EXE A
       214      1    1A           LDA B
       215 170201                 RET 1
       216   2000   227R  FIXOV   LDA =D32767
       217 170002                 SBP *+2
       220 170040                 TCA
       221 170201                 RET 1
       222   2000   226R  FIXZ    LDA =D0
       223 170201                 RET 1
       224 174400         ABR1    ABR 1
           0              A       EQU 0
           1              B       EQU 1
           3              R       EQU 3
          16              C       EQU 16B
          17              D       EQU 17B
      77774               AR0     EQU 77774B
      77770               AR1     EQU 77770B
      77770                       END
       225 100000
       226      0
       227  77777
       230 100001
       231 177777
       232     17
       233 177760
       234 177761

.BDVF   3X     .BDVS   2X     .FADA   125R    .FADB   131R
.FDVA   34R    .FDVB   40R    .FIX    203R    .FLT    110R
.FMPA   0R     .FMPB   4R     0       226R    100000  225R
100001  230R   17      232R   177760  233R    177761  234R
177777  231R   77777   227R   A       0A      AAR16   201R
ABR1    224R   ABR16   202R   AR0     77774A  AR1     77770A
AR1D    1X     B       1A     C       16A     D       17A
FADN    113R   FADNN   103R   FADNX   122R    FADNZ   77R
FADX    150R   FADXI   156R   FDV10   64R     FDV20   70R
FIXII   213R   FIXOV   216R   FIXZ    222R    FMPL    17R
FMPS    24R    NEXPO   157R   R       3A

KSPMAX=2 MSPMAX=39 NSPMAX=6 SSPMAX=256 DSPMAX=158
```

APPENDIX B-27

```
ASMB,R,L
                                HED DSA ROUTINES - BASE PAGE PORTION
                                NAM DSA,7  85680-90014A
  *
  *     A-85680-90013A-2
  *       85680-90013A  (S)
  *       85680-90014A  (R)
  *     27 SEP 1977
  *     LYNN WHEELWRIGHT
  *     DAVE SHARRIT
  *
        0                       ENT PARTB,AR0D,AR1D,AR2D,AR3D
        0                       EXT PINIT
        0                A      EQU 0
        1                B      EQU 1
        2                P      EQU 2
        3                R      EQU 3
        4                R4     EQU 4
        5                R5     EQU 5
        6                R6     EQU 6
        7                R7     EQU 7
       10                IV     EQU 10B
       11                PA     EQU 11B
       12                W      EQU 12B
       13                DMAPA  EQU 13B
       14                DMAC   EQU 14B
       15                DMAMA  EQU 15B
```

```
      16                    C     EQU 16B
      17                    D     EQU 17B
      20                    AR2   EQU 20B
      24                    SE    EQU 24B
 77774                      AR0   EQU 77774B
 77770                      AR1   EQU 77770B
 77764                      AR3   EQU 77764B
      0                           ORB
      0  14761              PWRON WBC B
      1  35770    77770A          STB AR1
      2  66000      10R           JMP .DSA
      3  77774              AR0D  ABS AR0
      4  77770              AR1D  ABS AR1
      5     20              AR2D  ABS AR2
      6  77764              AR3D  ABS AR3
      7          177746B    PARLC DEF *-41B
     10                     PARTB EQU *
     10                           ORR
```

APPENDIX B-28

```
HED DSA ROUTINES - MAIN PGM PORTION
*
*  CONSTANTS
*
 77707                      CM70  EQU 77707B
      0                     CM1   DEC -1
      1                     B30   OCT 30
      2                     B10   OCT 10
      3                     HYPT1 OCT 205         HYBRID CHECK SUM
      4                     B40   OCT 100040
      5                     ROMMX OCT 140000      16 K ROM
      6                     SRLC1 OCT 057767
      7                     SRLC2 OCT 057777
*
*********************************
*      INSTRUMENT PRESET BEGINS HERE
*********************************
*
     10                     .DSA  EQU *
     10 132000       7R     BEG   STA SRLC2,I     CLEAR DSA COUNTER
*
*********************************
*  HYBRID REGISTER CHECK
*********************************
*
     11   2000       2R           LDA B10
     12  71617                    CLR 16          CLEAR INTERNAL REGISTERS
     13  76603                    SSC *+3
     14 170717                    RAR 16
     15  72176                    RIA *-2         .5 SEC DELAY
     16 132000       6R           STA SRLC1,I     CLOCK DSA COUNTER
     17   2000       2R           LDA B10
     20   6000              HYB2  LDB CM1
     21  34003       3A     HYB3  STB R
     22 104000                    LDB A,1         READ REGISTER
     23  24012      12A           ADB W
     24  34012      12A           STB W           STORE CHECKSUM
     25   4003       3A           LDB R
     26 134000                    STB A,1         WRITE PATTERN
     27 174600              HYC4  SBL 1           RIGHT SHIFT PATTERN
     30  76071                    RZB HYB3        CYCLE BACK IF #0
     31  72501                    SIA *+1         INCREMENT REGISTER INDEX
     32  12000       1R           CPA B30         CHECK FOR LAST
     33  66000      35R           JMP *+2
     34 176064                    SBP HYB2        CYCLE BACK FOR NEXT REGISTER
     35  20012      12A           ADA W
     36  12000       3R           CPA HYPT1       CHECK CHECKSUM
     37  77202                    SLB *+2,C
     40   6000                    LDB CM1         ERROR DETECTED
     41  34015      15A           STB DRAMA
*
*********************************
* ROM CHECKSUM
*********************************
*
     42   2000       4R           LDA B40
     43  30017      17A           STA D           INITIALIZE ROM LOCATION
     44     17      17A     ROMCH LDA D
     45  12000       5R           CPA ROMMX       CHECK FOR LAST ROM LOCATION
     46  66000      75R           JMP THRU
     47   6000                    LDB CM1
     50  34020      20A           STB AR2         INITIALIZE BYTE ACCUMULATORS
     51  74570                    WBD A,1         READ UPPER BYTE
     52  24000                    ADB A           SUM UPPER BYTE
     53  74570                    WBD A,1         READ LOWER BYTE/INCR. STACK
     54  20020      20A           ADA AR2
     55  30020      20A           STA AR2         STORE LOWER BYTE SUM
     56     17      17A           LDA D
     57 170604                    SAL 5
     60  72071                    RZA *-7         CHECK FOR END OF ROM CHIP
     61     17      17A           LDA D
     62 170511                    SAR 10
     63  22000       7B           ADA PARLC
     64 114000                    CPB A,1         CHECK UPPER BYTE CHECK SUM
     65  66000      67R           JMP CHK2
     66  66000      73R           JMP ERR
     67   4020      20A     CHK2  LDB AR2
     70  72501                    SIA *+1
     71 114000                    CPB A,1         CHECK LOWER BYTE CHECK SUM
     72  66000      44R           JMP ROMCH
```

```
 73   6000                ERR    LDB CM1
 74  34015         15A           STB DMAMA
 75 132000          6R    THRU   STA SRLC1,I
*
 76   2000        417R    MDSA   LDA B17
 77  30003          3A           STA R
*
100  76211                       SSS RAM         DO RAM CHECK IF STATUS SET
101  66000        161R           JMP EERAM         OTHERWISE JUMP TO EMC CHECK
*
102   2000        413R    DSA    LDA B2
103  30011         11A           STA PA
104  30005          5A           STA R5          CLOCK IOSB
105 132000          6R           STA SRLC1,I     CLOCK DSA COUNTER
106  30005          5A           STA R5          CLOCK IOSB
107  30005          5A           STA R5          CLOCK IOSB
110 170201                       RET 1
*
*********************************
*     RAM TEST ROUTINE (FOR FOUR 1KX4 RAMS)
*********************************
*
111 174517                RAM    SBR 16
112  34021         21A           STB AR2+1
113  34022         22A           STB AR2+2
114   2000        150R           LDA RAMSI
115 134000                       STB A,I
116  72501                       SIA *+1         CLEAR MEMORY
117 172076                       SAP *-2
*
120   6000        152R           LDB RAMT9
121  42000        131R    RAMT1  JSM RAMTT
122      1          1A           LDA B
123 170040                       TCA
124  30022         22A           STA AR2+2       STORE OLD PATTERN
125 174700                       RBR 1           SHIFT PATTERN
126  16000        152R           CPB RAMT9       CHECK FOR END
127  66000        153R           JMP EDRAM
130  66000        121R           JMP RAMT1
131   2000        151R    RAMTT  LDA RAMSS
132  30023         23A           STA AR2+3
133     23         23A    RAMT0  LDA AR2+3
134 176402                       SBM *+2
135 170140                       CMA             COMPLEMENT ADDRESS
136  62000        151R           IOR RAMSS
137  30016         16A           STA C
140  70760                       WWC A,D         READ RAM LOCATION
141  20022         22A           ADA AR2+2       CHECK FOR CORRECT PATTERN
142  60021         21A           IOR AR2+1
143  30021         21A           STA AR2+1       STORE SCORE
144  70541                       PWC B,I         WRITE NEXT PATTERN IN RAM LOCA
145  44023         23A           ISZ AR2+3       INCREMENT ADDRESS, SKIP IF DON
146  66000        133R           JMP RAMT0
147 170201                       RET 1
150                       RAMSI  OCT 076000
151                       RAMSS  OCT 176000
152                       RAMT9  OCT 170360
*
153     21         21A    EDRAM  LDA AR2+1
154   6000                       LDB CM1
155  72404                       SZA EERAM       CHECK FOR PASS
156 170600                       SAL 1
157  34015         15A           STB DMAMA
160  66000        155R           JMP *-3
*
161  42000        102R    EERAM  JSM DSA
*
*********************************
*      DIGITAL STORAGE ROUTINE
*********************************
*
162   2000          2R    EMCH   LDA B10
163  30011         11A           STA PA
164  44011         11A           ISZ PA
165   6000        432R           LDB DS1C
166  34004          4A           STB R4
167  30011         11A           STA PA
170   2000        430R           LDA DSRAM
171  76002                       SSC *+2
172   2000        431R           LDA DSR2
173  30022         22A           STA AR2+2
174 170600                       SAL 1
175  30004          4A           STA R4
176 170040                       TCA
177 174517                       CLB
200  34006          6A           STB R6          SET DS RAM
201  70430                       DIR
202  72175                       RIA *-3
203  34017         17A           STB D
204  34023         23A           STB AR2+3
205   2000        244R           LDA DST9
206  72631                       SFC DST8
207   4022         22A    DST1   LDB AR2+2
210  34004          4A           STB R4
211  30016         16A           STA C
212 170517                DST2   CLA
213     23         23A           LDA AR2+3
214  20005          5A           ADA R5          READ DS MEMORY
215  60017         17A           IOR D
216  30017         17A           STA D
```

```
217 170517                  CLA
220  34004      4A          STB R4        SET DS ADDRESS
221  70430                  DIR
222 170517                  CLA
223     16     16A          LDA C
224  30006      6A          STA R6        WRITE DS MEMORY
225  26000                  ADB CM1
226 170064                  SBP DS12      INCR/SKIP
227 170040                  TCA
230  30023     23A          STA AR2+3
231     16     16A          LDA C
232 170600                  SAL 1
233 172054                  SAP DST1      CYCLE BACK
234   4017     17A          LDB D
235 174603                  SBL 4
236  76407                  SZB ETDS      CHECK FOR GOOD DS MEMORY
237   2000    413R   DST8   LDA B2
240  60015     15A          IOR DMAMA
241  30015     15A          STA DMAMA     SHIFT UNTIL BAD BITS GONE
242 174600                  SBL 1
243  66000    236R          JMP *-5
244                  DST9   OCT 5333
245  42000    102R   ETDS   JSM DSA
*
*********************************
*      IOC INTERFACE VERIFY
*********************************
*
246   6000    413R          LDB B2
247  34011     11A          STB PA
250   2000                  LDA CM1
251  30005      5A          STA R5        SET KEY ROWS TO 0
252  44011     11A          ISZ PA
253 174600                  SBL 1
254  34004      4A          STB R4        RESET RPG
255  54011     11A          DSZ PA
256      7      7A          LDA R7        READ RPG
257 170140                  CMA
260 170507                  SAR 8
261   4006      6A          LDB R6        READ KEY COLUMN
262 174607                  SBL 8
263  24000                  ADB A
264   2000    412R          LDA B1
265  76702                  SHC *+2       CHECK LSRQ
266  76403                  SZB *+3       CHECK
267  60015     15A          IOR DMAMA
270  30015     15A          STA DMAMA     STATUS GND: CYCLE AUTOCHECK
*                    STATUS T1: COUNTER IGNORE
271  76602                  SSC IOBEG     STATUS T2 OR T3: FULL POP TEST
272  66000     10R          JMP BEG       STATUS T0: CYCLE IOC ROUTINE
*
**************************************************
*      IOC EXERCISE ROUTINE (RF SECTION INTERFACE)
**************************************************
*
273   2000    420R   IOBEG  LDA STAK2     INIT. RETURN STACK POINTER
274  30003      3A          STA R
275 132000      6R          STA SRLC1,I   CLOCK DSA COUNTER (0111)
276  76203                  SSS *+3
277 132000      6R          STA SRLC1,I   CLOCK DSA (0011)
300  66000      1X          JMP PINIT
301 132000      7R          STA SRLC2,I   CLEAR DSA COUNTER
302   2000    414R          LDA B4
303  31776  77776A          STA LIND      INIT. LOOP INDEX
*
304  42000    102R   STLOP  JSM DSA
*
305 170517                  SAR 16
306  31777  77777A          STA APPL      INIT APPLIANCE COUNTER
307   5777  77777A   LOPA   LDB APPL      CHECK FOR = COUNTER
310  16000    410R          CPB CNTR
311  66000    331R          JMP GOIO
312 174500                  SBR 1
313  16000    415R          CPB B5
314  66000    322R          JMP NEXTO
315 174501                  SBR 2
316  16000    416R          CPB B6
317  66000    331R          JMP GOIO
320 174500                  SBR 1
321  76410                  SZB GOIO
322  45777  77777A   NEXTO  ISZ APPL
323   5777  77777A          LDB APPL
324 174505                  SBR 6
325  76462                  SZB LOPA
326  55776  77776A          DSZ LIND
327  66000    304R          JMP STLOP
330  66000    273R          JMP IOBEG
331   2000    420R   GOIO   LDA PAT1      CYCLE IOC WITH PATTERN 1
332  42000    336R          JSM PATER
333   2000    421R          LDA PAT2      CYCLE IOC WITH PATTERN 2
334  42000    336R          JSM PATER
335  66000    322R          JMP NEXTO
336   5777  77777A   PATER  LDB APPL      CHECK FOR ATTENUATOR
337  16000    417R          CPB ATTEN       AND CLEAR PATTERN
340 170517                  SAR 16
341  30016     16A          STA C
342   5777  77777A   PAT12  LDB APPL
343 174701                  RBR 2
344  34011     11A          STB PA        SET PER. ADDRESS
345 174515                  SBR 14
```

```
346  26000     414R          ADB B4
347 130001       1A          STA B,I     OUTPUT PATTERN
350   5777   77777A          LDB APPL
351  16000     411R          CPB LCKFL   CHECK FOR FLAG ADDRESS AND
352  42000     357R          JSM ROWSC      GO SUB ROWSCAN/READ
353 170700                   RAR 1       ROTATE PATTERN
354  10016      16A          CPA C       CHECK IF = STARTING PATTERN
355 170201                   RET 1           AND RETURN
356  66000     342R          JMP PATT2    LOOP BACK
357  31774   77774A  ROWSC   STA LIND3
360   6000       1R          LDB MAXCT
361  35775   77775A          STB LIND2   INIT ROWSCAN LOOP COUNTER
362   2000     422R          LDA PAT3
363   6000     413R  ROWS2   LDB B2
364  34011      11A          STB PA
365  30005       5A          STA R5      OUTPUT PATTERN TO KEYROW LINES
366  30001       1A          STA B
367 174501                   SBR 2
370  77003                   SLB *+3
371  44011      11A          ISZ PA
372  30006       6A          STA R6
373  42000     400R          JSM READO
374 170700                   RAR 1       ROTATE PATTERN
375  55775   77775A          DSZ LIND2   DECREMENT ROWSCAN LOOP COUNTER
376  66000     363R          JMP ROWS2   LOOP BACK IF NOT THROUGH
377   1774   77774A          LDA LIND3
400   5776   77776A  READO   LDB LIND
401  26000     423R          ADB CONST
402 104001       1A          LDB B,I
403  34011      11A          STB PA
404 174503                   SBR 4
405 104001       1A          LDB B,I     READ INPUT DEVICE FOR THIS LOO
406  35770   77770A          STB AR1
407 170201                   RET 1
*
410                  CNTR    OCT 24
411                  LCKFL   OCT 15
412                  B1      OCT 1
413                  B2      OCT 2
414                  B4      OCT 4
415                  B5      OCT 5
416                  B6      OCT 6
417                  B17     OCT 17
420                  PAT1    OCT 177757
421                  PAT2    OCT 007040
422                  PAT3    OCT 065200
423            423R  CONST   DEF *
424                          OCT 125     COUNTER
425                          OCT 162     RPG
426                          OCT 142     KEY COLUMN
427                          OCT 0       A
  1                  MAXCT   EQU B30
417                  ATTEN   EQU B17
420                  STAK2   EQU PAT1
77737                CM40    EQU 77737B
430                  DSRAM   DEC 1023
431                  DSR2    DEC 4095
432                  DSTC    OCT 7737
77777                APPL    EQU 77777B
77776                LIND    EQU 77776B
77775                LIND2   EQU 77775B
77774                LIND3   EQU 77774B
77774                        END PWRON
```

| | | | | | | | |
|---|---|---|---|---|---|---|---|
| .DSA | 10R | A | 0A | APPL | 77777A | AR0 | 77774A |
| AR0D | 3B | AR1 | 77770A | AR1D | 4B | AR2 | 20A |
| AR2D | 5B | AR3 | 77764A | AR3D | 6B | ATTEN | 417R |
| B | 1A | B1 | 412R | B10 | 2R | B17 | 417R |
| B2 | 413R | B30 | 1R | B4 | 414R | B40 | 4R |
| B5 | 415R | B6 | 416R | BEG | 10R | C | 16A |
| CHK2 | 67R | CM1 | 0R | CM40 | 77737A | CM70 | 77707A |
| CNTR | 410R | CONST | 423R | D | 17A | DMAC | 14A |
| DMAMA | 15A | DMAPA | 13A | DSA | 102R | DSR2 | 431R |
| DSRAM | 430R | DST1 | 207R | DST2 | 212R | DST8 | 237R |
| DST9 | 244R | DSTC | 432R | EDRAM | 153R | EERAM | 161R |
| EMCH | 162R | ERR | 73R | EIDS | 245R | GOIO | 331R |
| HYB2 | 20R | HYB3 | 21R | HYC4 | 27R | HYPT1 | 3R |
| IOBEG | 273R | IV | 10A | LCKFL | 411R | LIND | 77776A |
| LIND2 | 77775A | LIND3 | 77774A | LOPA | 307R | MAXCT | 1R |
| MDSA | 70R | NEXTO | 322R | P | 2A | PA | 11A |
| PARLC | 7B | PAR1B | 10B | PAT1 | 420R | PAT2 | 421R |
| PAT3 | 422R | PATER | 336R | PATT2 | 342R | PINIT | 1X |
| PWRON | 0B | R | 3A | R4 | 4A | R5 | 5A |
| R6 | 6A | R7 | 7A | RAM | 111R | RAMSS | 151R |
| RAMST | 150R | RAMT1 | 121R | RAM19 | 152R | RAMTI | 131R |
| RAMTU | 133R | READO | 400R | ROMCH | 44R | ROMMX | 5R |
| ROWS2 | 363R | ROWSC | 357R | SE | 24A | SRLC1 | 6R |
| SRLC2 | 7R | STAK2 | 420R | STLOP | 304R | THRU | 75R |
| * | 12A | | | | | | |

KSPMAX=2 MSPMAX=39 NSPMAX=6 SSPMAX=501 DSPMAX=158
KSPMAX=2 MSPMAX=39 NSPMAX=6 SSPMAX=501 DSPMAX=158

APPENDIX B-29

MEMORY MAP

| | | | | | |
|---|---|---|---|---|---|
| LSA | 1000 | 1433 | 40 | 50 | 1000 |
| APR27 | 1433 | 34161 | 50 | 50 | 1000 |
| BPCFF | 34161 | 34352 | 50 | 50 | 123 |
| BECMC | 34352 | 35315 | 50 | 50 | 123 |
| BSFVC | 35315 | 35524 | 50 | 50 | 123 |

```
ARRYC  35524  35563          50      50      123
ARRYS  35563  35613          50      50      123
TYPEC  35613  36030          50      50      123
ROUND  36030  36052          50      50      123
DSHFT  36052  36073          50      50      123
SHIFT  36073  36130          50      50      123
TSRBI  36130  36162          50      50      123
TEST   36162  36224          50      50      123
DEGL   36224  36240          50      50      123
CASE   36240  36256          50      50      123
RDWPT  36256  36344          50      50      123
STAC   36344  36347          50      50      123
ANDT   36347  36352          50      50      123
ORT    36352  36355          50      50      123
ATNEF  36355  36401          50      50      123
AIPCR  36401  36510          50      50      123
CNVST  36510  36672          50      50      123
TDUMP  36672  37171          50      50      123
VDAVG  37171  37413          50      50      123
BFLT   37413  37650          50      50      123
LINKS: 121 /77

.ADDP  35315 353     .AMIN  35033         .ANDT  36347 561
.ARAP  35565         .ARAY  35571 744     .ARGA  35427 776
.ARGL  35423 772     .ARGS  35430 746     .ARGT  36075
.ARRP  35524         .ARRY  35526 217     .BDVF  35164 121
.BDVS  35207 122     .EMIN  35045 443     .CASE  36240 602
.CLAI  35456         .CLAP  35462         .CLBI  35442 540
.CLBP  35446         .CLBV  35447         .CLNP  35464
.CSHV  35466 434     .DEGL  36224 752     .DIVD  34577
.DIVF  34565         .DLFT  36054 753     .DRGT  36064 755
.DSFT  36053 642     .DSGN  35420 174     .EQL   36227 701
.FADA  37540         .FADB  37544         .FDIG  36052 627
.FDVA  37447         .FDVB  37453         .FIX   37616
.FLT   37523         .FMPA  37413         .FMPB  37417
.FRFB  35321         .LADC  34404         .LDAP  35473 775
.LDBA  35336 624     .LDBI  35331 765     .LDBP  35335 736
.LDSA  35476 743     .LDSI  35501 751     .LDSP  35507
.LRAP  35563         .LRAY  35567 625     .MPYD  34462
.MVE4  35342 504     .NEGL  36234 617     .ORT   36352 615
.R4    36270         .R5    36265 501     .R6    36262 614
.R7    36257 211     .RAR2  35413         .RBIT  36140 606
.RLFT  36123 204     .RRGT  36076         .RS4   36267 330
.RS5   36264 730     .RS6   36261 212     .RS7   36256 702
.RINA  35376 773     .RINB  35370         .RINI  35372 734
.RINL  35406 631     .SAR2  35361 766     .SBIT  36135
.SLFT  36074 610     .SRGT  36073         .STAC  36344 342
.STAP  35515 735     .STBC  35351 300     .STBP  35353 761
.STRB  35365         .STRD  35355 770     .TBIT  36130 717
.TEST  36162 655     .TURN  36172 707     .UPC4  35436 771
.W4    36273 714     .W5    36277 706     .W6    36303 731
.W7    36311 705     .WS4   36272 727     .WS5   36276 703
.WS6   36302 732     .WS7   36310 677     .WSPS  36314
.WSTP  36322         .WSTR  36326 721     .WSIS  36331 726
ACHAR  36403 430     ADD1   34176 767     ADD1B  34173
ADD1P  34201         ADD1T  34214 756     ADD2   34400 567
ADD2P  34375         ADD2P  34372 570     ADD2T  34403 634
ADD3   35077 467     ADD3B  35074         ADD3P  35071
ADD3T  34403 601     ADD4B  35233 723     ADD4P  35235 665
ADD4T  35240 745     ADUMP  37044 354     APCHR  36401
APN25  36611         AR0D   43            AR1D   44
AR1LD  35011         AR1LN  35015         AR1LP  35021
AR1LT  35026         AR2D   45            AR3D   46
ATNER  36355 673     CDB    35771         CNV12  35702 737
CNV13  35671         CNV14  35745 155     CNV15  36510 431
CNV21  35731 742     CNV23  35672 565     CNV24  35746 754
CNV25  36607         CNV31  35731 750     CNV34  35752
CNV41  35730 757     CNV42  35613 652     CNV43  35613 637
CNV45  36606 426     DIV1   34323 747     DIV1B  34321
DIV1P  34317         DIV1T  34325 762     DIV2   34551 566
DIV2B  34541         DIV2P  34537         DIV2T  34543 462
DIV3   35113 572     DIV3B  35111         DIV3P  35107
DIV3T  34543         DIV4   35145 676     DIV4B  35137
DIV4P  35141         DIV4T  35143 201     HPUSY  37010 514
HPPST  37004 433     ICHAR  36440         IHPBT  36721 357
IHP1B  36672 361     IPCHR  36433         MIN1   34175 764
MIN1B  34172         MIN1P  34200         MIN1T  34213
MIN2   34377 613     MIN2B  34374         MIN2P  34371 741
MIN2T  34402         MIN3   35076 635     MIN3B  35073
MIN3P  35070         MIN3T  34402         MIN4B  35271
MIN4P  35265 733     MIN4T  35273         MOD2   34563 543
MOD2B  34555         MOD2P  34553         MOD2T  34557
MOD3   35121         MOD3B  35117         MOD3P  35115
MOD3T  34557         MOD4   35131 653     MOD4B  35123
MOD4P  35125         MOD4T  35127         MPY1   34274 763
MPY1B  34272         MPY1P  34270 760     MPY1T  34276 740
MPY2   34460 564     MPY2B  34450         MPY2P  34446
MPY2T  34452 531     MPY3   35105 636     MPY3B  35103
MPY3P  35101         MPY3T  34452         MPY4B  35243
MPY4P  35245 715     MPY4T  35251 671     PARIB  50
PCHAR  36407         PDUMP  37054 351     PINIT  1433
ROUND  36030 503     SDUMP  37070 130     STHPB  36755 427
SUB1   34161         SUB1B  34164         SUB1P  34156
SUB1T  34170 152     SUB2   34360 573     SUB2B  34363
SUB2P  34365 526     SUB2T  34367 641     SUB3   35061 177
SUB3B  35064         SUB3P  35066         SUB3T  34367
SUB4B  35261 256     SUB4P  35254 656     SUB4T  35263 661
TDUMP  37056 352     VDAVG  37171 164     VDSUB  37346 165
WEOI   37034 435     WHPIB  37040 436
KSPMAX=1 MSPMAX=17 NSPMAX=0 SSPMAX=1617 BSPMAX=230 ESPMAX=418
FSPMAX=3 LSPMAX=231 XSPMAX=0
```

APPENDIX B-30

MAIN CONTROL PROGRAM

```
ASMB,L,R
                                HED
                                NAM APR27,3
                                    ENT PINIT
                                    EXT AR0D,AR1D,AR2D,AR3D
      0                         A      EQU 0
      0                         B      EQU 1
      1                         P      EQU 2
      2                         R      EQU 3
      3                         R4     EQU 4
      4                         R5     EQU 5
      5                         R6     EQU 6
      6                         R7     EQU 7
      7                         IV     EQU 10B
     10                         PA     EQU 11B
     11                         *      EQU 12B
     12                         DMAPA  EQU 13B
     13                         DMAC   EQU 14B
     14                         DMAMA  EQU 15B
     15                         C      EQU 16B
     16                         D      EQU 17B
     17                         E      EQU 77763B
  77763                         AR2    EQU 20B
     20                         SE     EQU 24B
     24                         AR0    EQU 77774B
  77774                         AR1    EQU 77770B
  77770                         AR3    EQU 77764B
  77764
      0    2000      566R       PINIT  LDA =B76000
      1   30003        3A              STA R
      2    2000      567R              LDA =B76100
      3   30016       16A              STA C
      4   31763    77763A              STA E
      5   66000        6R              JMP ANFNG
      6                         ANFNG  EQU *
  77746                         V32742 EQU 32742   N
  77742                         V32738 EQU 32738   X
  77741                         V32737 EQU 32737   IY
     20                         V1   EQU 20B AR2
  77740                         V32736 EQU 32736   EFLAG
  77737                         V32735 EQU 32735   BLKS
     15                         V2   EQU 15B DMAMA
  77736                         V32734 EQU 32734   ETX
  77735                         V32733 EQU 32733   HPIB
  77734                         V32732 EQU 32732   CMOS
      6   66000    24714R         JMP A3
      7            77665A       V4 DEF T32693 MSTATE
     10                         K5   OCT 177777  177777
     11                         N6   DEC 39   39
  77665                         T32693 EQU 32693
  77661                         V32689 EQU 32689   LTEMP1
  77655                         V32685 EQU 32685   LTEMP2
  77651                         V32681 EQU 32681   LTEMP
  77713                         V7   EQU T32693+22 FSTEP
  77645                         V32677 EQU 32677   MFREQ
  77641                         V32673 EQU 32673   VTOFREQ
  77635                         V32669 EQU 32669   CFREST
  77631                         V32665 EQU 32665   FPILOT
  77665                         V8   EQU T32693   CFREQ
  77671                         V9   EQU T32693+4  SPAN
  77724                         V10  EQU T32693+31 AMF
  77625                         V32661 EQU 32661   CSIGNL
  77707                         V11  EQU T32693+18 FOFSET
  77621                         V32657 EQU 32657  .MANT
      3                         V12 EQU 3 RPTR
     16                         V13 EQU 16B CPTR
  77763                         V14 EQU 77763B  EPTR
  77620                         V32656 EQU 32656   PREFIX
  77617                         V32655 EQU 32655   DECFLG
  77616                         V32654 EQU 32654   XFLAG
  77675                         V15  EQU T32693+8  BLEDS
  77676                         V16  EQU T32693+9  TLEDS
  77677                         V17  EQU T32693+10 RFAT
  77731                         V18  EQU T32693+36 SINDEX
  77732                         V19  EQU T32693+37 STIM
  77733                         V20  EQU T32693+38 FSTIM
  77703                         V21  EQU T32693+14 STRIG
  77700                         V22  EQU T32693+11 RLVL
  77701                         V23  EQU T32693+12 RVBW
  77702                         V24  EQU T32693+13 VIDCON
  77721                         V25  EQU T32693+28 MRKR
  77723                         V26  EQU T32693+30 MKRMODE
  77720                         V27  EQU T32693+27 AMLVL
  77717                         V28  EQU T32693+26 AMKR
  77722                         V29  EQU T32693+29 MKRLVL
  77730                         V30  EQU T32693+35 KFLAG
  77706                         V31  EQU T32693+17 ROFSET
  77705                         V32  EQU T32693+16 THRESH
  77704                         V33  EQU T32693+15 LEVLIN
  77615                         V32653 EQU 32653   DAC1
  77614                         V32652 EQU 32652   DAC2
  77613                         V32651 EQU 32651   DAC4
  77612                         V32650 EQU 32650   NCHR
  77611                         V32649 EQU 32649   CHRC
  77610                         V32648 EQU 32648   ALIM
  77607                         V32647 EQU 32647   ACNT
  77606                         V32646 EQU 32646   SRCEID
  77605                         V32645 EQU 32645   SCANSL
  77604                         V32644 EQU 32644   SATN
  77603                         V32643 EQU 32643   PLOCK
```

```
77602          V32642 EQU 32642   LKMSK
77601          V32641 EQU 32641   HPBC
77600          V32640 EQU 32640   CTIM
77577          V32639 EQU 32639   CTBASE
77656          V34 EQU V32685+1   BCDA
77657          V35 EQU V32685+2   BCDB
77660          V36 EQU V32685+3   BCDC
77576          V32638 EQU 32638   RPGPTR
77575          V32637 EQU 32637   K
77574          V32636 EQU 32636   RPG
77573          V32635 EQU 32635   I
77572          V32634 EQU 32634   J
77571          V32633 EQU 32633   L
77570          V32632 EQU 32632   M
77567          V32631 EQU 32631   KEYCOL
77566          V32630 EQU 32630   KEYCODE
77565          V32629 EQU 32629   SRJEN
77564          V32628 EQU 32628   RPGCNT
77563          V32627 EQU 32627   DSTAD
   12  77473A  V37 DEF T32571   BWFRQ
   13            OCT 177777  177777
   14          K38 OCT 70  70
77473          T32571 EQU 32571
   15  77436A  V39 DEF T32542   BWAMP
   16            OCT 177777  177777
   17          N40 DEC 29  29
77436          T32542 EQU 32542
77473          V41 EQU T32571   KK
77474          V42 EQU T32571+1   KL
77475          V43 EQU T32571+2   KM
77476          V44 EQU T32571+3   KN
77435          V32541 EQU 32541   IF1
77434          V32540 EQU 32540   IF2
77433          V32539 EQU 32539   GIN1
77432          V32538 EQU 32538   GIN2
77431          V32537 EQU 32537   RPGSWP
77430          V32536 EQU 32536   SLEN
77713          V45 EQU T32693+22 ALIMSV
77671          V46 EQU T32693+4   CTBSV
77665          V47 EQU T32693   GIN1SV
77707          V48 EQU T32693+18 GIN2SV
77724          V49 EQU T32693+31 EFLGSV
77427          V32535 EQU 32535   AS
   20          T50 EQU *
   20          N51 DEC 2208  2208
   21          N52 DEC 128 128
   22          N53 DEC 0 0
   23          N54 DEC 2240  2240
   24          N55 DEC 432 432
   25            DEC 0 0
   26          N56 DEC 2272  2272
   27          N57 DEC 768 768
   30            DEC 0 0
   31          N58 DEC 2304  2304
   32          N59 DEC 336 336
   33          N60 DEC 960 960
   34          N61 DEC 2336  2336
   35          N62 DEC 80  80
   36            DEC 960 960
   37          N63 DEC 2368  2368
   40            DEC 0 0
   41          N64 DEC 896 896
   42          N65 DEC 2400  2400
   43            DEC 0 0
   44          N66 DEC 32  32
   45          N67 DEC 2432  2432
   46          N68 DEC 800 800
   47            DEC 32  32
   50            DEC 2400  2400
   51            DEC 0 0
   52            DEC 32  32
   53            DEC 2432  2432
   54          N69 DEC 704 704
   55            DEC 32  32
   56          N70 DEC 2976  2976
   57          N71 DEC 144 144
   60          N72 DEC 608 608
   61          N73 DEC 2688  2688
   62            DEC 80  80
   63          N74 DEC 992 992
   64          N75 DEC 3008  3008
   65            DEC 0 0
   66          N76 DEC 2560  2560
   67          N77 DEC 2496  2496
   70            DEC 0 0
   71          N78 DEC 640 640
   72          N79 DEC 2528  2528
   73            DEC 0 0
   74          N80 DEC 192 192
   75            DEC 2368  2368
   76            DEC 0 0
   77            DEC 896 896
  100          N81 DEC 2592  2592
  101          N82 DEC 816 816
  102            DEC 960 960
  103            DEC 2560  2560
  104          N83 DEC 720 720
  105            DEC 992 992
  106            DEC 2560  2560
  107          N84 DEC 656 656
```

```
110            DEC 992 992
111            DEC 2560  2560
112            DEC 720 720
113            DEC 992 992
114            DEC 2560  2560
115            DEC 704 704
116            DEC 992 992
117            DEC 2560  2560
120            DEC 640 640
121            DEC 992 992
122            DEC 2560  2560
123            DEC 704 704
124            DEC 992 992
125        N85 DEC 2752  2752
126        N86 DEC 832 832
127            DEC 768 768
130        N87 DEC 2768  2768
131            DEC 832 832
132        N88 DEC 864 864
133        N89 DEC 2784  2784
134            DEC 832 832
135            DEC 832 832
136        N90 DEC 2800  2800
137            DEC 832 832
140            DEC 800 800
141        N91 DEC 2816  2816
142            DEC 832 832
143        N92 DEC 928 928
144        N93 DEC 2832  2832
145            DEC 832 832
146            DEC 704 704
147        N94 DEC 2848  2848
150            DEC 832 832
151        N95 DEC 736 736
152        N96 DEC 2864  2864
153            DEC 832 832
154            DEC 896 896
155        N97 DEC 2656  2656
156            DEC 0 0
157        N98 DEC 480 480
160        N99 DEC 2960  2960
161            DEC 832 832
162        N100  DEC 672 672
163        N101  DEC 2464  2464
164            DEC 0 0
165            DEC 768 768
166        N102  DEC 2624  2624
167        N103  DEC 368 368
170            DEC 32  32
171        N104  DEC 2880  2880
172        N105  DEC 16  16
173            DEC 960 960
174        N106  DEC 2384  2384
175            DEC 0 0
176            DEC 832 832
177        N107  DEC 2944  2944
200            DEC 0 0
201        N108  DEC 352 352
202        N109  DEC 2192  2192
203            DEC 0 0
204        N110  DEC 288 288
205        N111  DEC 2176  2176
206            DEC 832 832
207            DEC 640 640
210    20R V112 DEF I50  SFIXY
211          OCT 177777  177777
212        K113  OCT 170 170
77426      V32534 EQU 32534  UFLAG
152        V114  EQU T50+90  UNCALAD
213 77005A V115 DEF T32261 ASAVE
214        K116  OCT 177776  177776
215        N117  DEC 7 7
216            DEC 39  39
77005      T32261 EQU 32261
217        I118 EQU *
217   570R   DEF ="RES BW"
220   574R   DEF ="VBW"
221   577R   DEF ="SWP"
222   602R   DEF ="ATTEN"
223   606R   DEF ="REF"
224   611R   DEF =" "
225   613R   DEF ="CENTER"
226   617R   DEF ="SPAN"
227   622R   DEF ="START"
230   626R   DEF ="STOP"
231   631R   DEF ="STEP"
232   634R   DEF =" "
233   634R   DEF =" "
234   636R   DEF ="DL"
235   640R   DEF ="TH"
236   642R   DEF ="LINEAR"
237   634R   DEF =" "
240   646R   DEF ="MKR "
241   651R   DEF ="MKR   "
242   646R   DEF ="MKR "
243   655R   DEF ="CNTR "
244   661R   DEF ="CNTR   "
245   655R   DEF ="CNTR "
246   666R   DEF ="YTO UNLOCK "
247   675R   DEF ="249 UNLOCK "
```

```
250      704R      DEF ="275 UNLOCK "
251      713R      DEF ="OVEN COLD "
252      721R      DEF ="EXT REF "
253      726R      DEF ="YTO UNCAL "
254      734R      DEF ="YTO ERROR "
255      742R      DEF ="MEAS UNCAL"
256      750R      DEF ="VID AVG "
257      755R      DEF ="SRQ "
260      760R      DEF ="OFFSET"
261      760R      DEF ="OFFSET"
262      634R      DEF =" "
263      634R      DEF =" "
264      764R      DEF ="2nd LO "
265      771R      DEF ="CORR'D"
266      775R      DEF ="BATTERY "
267      217R    V119 DEF T118 SFTAB
270                OCT 177777  177777
271              K120  OCT 50  50
272              T121 EQU *
272      570R      DEF ="RES BW"
273     1002R      DEF ="VIDEO BW"
274     1007R      DEF ="SWEEPTIME"
275     1015R      DEF ="RF ATTEN"
276     1022R      DEF ="REF LEVEL"
277     1030R      DEF ="LOG"
300      613R      DEF ="CENTER"
301      617R      DEF ="SPAN"
302      622R      DEF ="START"
303      626R      DEF ="STOP"
304     1033R      DEF ="CF STEP"
305     1040R      DEF ="TITLE:"
306     1044R      DEF ="DACS"
307     1047R      DEF ="DISPLAY LINE"
310     1056R      DEF ="THRESHOLD"
311      634R      DEF =" "
312      634R      DEF =" "
313     1064R      DEF ="MARKER"
314     1070R      DEF ="MARKER  "
315     1075R      DEF ="MARKER ZOOM"
316     1104R      DEF ="COUNTER"
317     1111R      DEF ="COUNTER  "
320     1117R      DEF ="COUNTER ZOOM"
321     1126R      DEF ="SAVE: REG"
322     1134R      DEF ="RECALL: REG"
323     1143R      DEF ="HP-IB ADRS: "
324     1152R      DEF ="ENTRY"
325      634R      DEF =" "
326     1156R      DEF ="PREAMP GAIN"
327     1165R      DEF ="SAVE LOCK"
330     1173R      DEF ="COUNTER RESOLN"
331      750R      DEF ="VID AVG "
332      634R      DEF =" "
333     1203R      DEF ="REF LVL OFFSET"
334     1213R      DEF ="FREQ OFFSET"
335     1222R      DEF ="SIGNAL IF"
336     1230R      DEF ="PILOT IF"
337     1235R      DEF ="VTO"
340     1240R      DEF ="SWEEP GEN"
341     1246R      DEF ="DSPL ADRS"
342     1254R      DEF ="WRITE:"
343     1260R      DEF ="MIXER LEVEL"
344     1267R      DEF ="DSPL ADRS INCR"
345      272R    V122 DEF T121 AFTAB
346                OCT 177777  177777
347              K123  OCT 53  53
350              T124 EQU *
350              K125  OCT 173776  173776
351              N126  DEC 1035  1035
352              N127  DEC 2060  2060
353                DEC 0 0
354              N128  DEC 1163  1163
355              N129  DEC 2085  2085
356              K130  OCT 173771  173771
357                DEC 1035  1035
360                DEC 2060  2060
361                DEC 0 0
362                DEC 1163  1163
363                DEC 2085  2085
364              K131  OCT 173764  173764
365                DEC 1035  1035
366              N132  DEC 2065  2065
367                DEC 0 0
370                DEC 1163  1163
371              N133  DEC 2100  2100
372              K134  OCT 173757  173757
373              K135  OCT 2002  2002
374                DEC 0 0
375              N136  DEC 2548  2548
376              K137  OCT 2001  2001
377              N138  DEC 216 216
400                OCT 2002  2002
401              N139  DEC 500 500
402              N140  DEC 2048  2048
403                OCT 2001  2001
404              N141  DEC 217 217
405                OCT 2002  2002
406              N142  DEC 1000  1000
407                DEC 2548  2548
410                OCT 2001  2001
411                DEC 216 216
412                DEC 1035  1035
```

```
413         K143  DEC 2152  2152
414         K144  OCT 173733  173733
415         K145  OCT 2202  2202
416         K146  OCT 4004  4004
417         K147  OCT 1774  1774
420               OCT 4004  4004
421         N148  DEC 4 4
422         K149  OCT 5774  5774
423               DEC 4 4
424               OCT 5774  5774
425               OCT 1774  1774
426         N150  DEC 1227  1227
427         K151  OCT 173714  173714
430         K152  OCT 2022  2022
431         K153  OCT 5750  5750
432               DEC 0 0
433         K154  OCT 4030  4030
434               DEC 0 0
435               OCT 5750  5750
436               DEC 0 0
437               OCT 4030  4030
440               DEC 0 0
441               DEC 1227  1227
442         K155  OCT 173675  173675
443               OCT 2002  2002
444               DEC 0 0
445               DEC 2048  2048
446         K156  OCT 3005  3005
447               OCT 2002  2002
450               OCT 5750  5750
451               DEC 0 0
452               DEC 2048  2048
453         N157  DEC 2148  2148
454               OCT 4030  4030
455               DEC 0 0
456               DEC 2048  2048
457               DEC 2148  2148
460         N158  DEC 1099  1099
461               DEC 1035  1035
462         N159  DEC 2119  2119
463               OCT 2002  2002
464               OCT 5750  5750
465               DEC 0 0
466               DEC 2048  2048
467               DEC 2048  2048
470               DEC 2048  2048
471         N160  DEC 24  24
472               OCT 3005  3005
473               OCT 2002  2002
474         K161  OCT 5634  5634
475               DEC 2048  2048
476               DEC 2048  2048
477         K162  OCT 1750  1750
500               OCT 5634  5634
501               DEC 2048  2048
502               DEC 2048  2048
503               DEC 24  24
504               DEC 1099  1099
505               DEC 1035  1035
506         N163  DEC 2139  2139
507               DEC 1227  1227
510         K164  OCT 173630  173630
511               OCT 2002  2002
512               DEC 1163  1163
513         N165  DEC 2115  2115
514         K166  OCT 173610  173610
515               OCT 2001  2001
516         K167  OCT 3777  3777
517         K168  OCT 2522  2522
520               DEC 0 0
521         N169  DEC 2695  2695
522         K170  OCT 2501  2501
523         N171  DEC 200 200
524         N172  DEC 208 208
525         K173  OCT 172100  172100
526         K174  OCT 2402  2402
527               DEC 16  16
530               DEC 2496  2496
531         K175  OCT 2401  2401
532         K176  OCT 176000  176000
533         K127  OCT 2060  2060
534         K177  OCT 174000  174000
535         N178  DEC 1027  1027
536         K179  OCT 172000  172000
537         K180  OCT 2024  2024
540   350R  V181 DEF T124 GRATCL
541               OCT 177777  177777
542               OCT 170 170
543         T182 EQU *
543         B183  HEX 10  10
544         B184  HEX 15  15
545         B185  HEX 20  20
546         B186  HEX 30  30
547         B120  HEX 50  50
550         B187  HEX 75  75
551         B188  HEX 99  99
552   543R  V189 DEF T182 LGTB
553               OCT 177777  177777
554         K117  OCT 7 7
555               EXT VDAVG
```

```
      0                    5X  P196  EQU VDAVG
    555                              EXT VDSUB
      0                    6X  P197  EQU VDSUB
    555                              EXT ATNER
      0                    7X  P198  EQU ATNER
    555                              EXT ACHAR
      0                   10X  P199  EQU ACHAR
    555                              EXT CNV15
      0                   11X  P200  EQU CNV15
    555                              EXT CNV45
      0                   12X  P201  EQU CNV45
    555                              EXT STHPB
      0                   13X  P202  EQU STHPB
    555                              EXT HPBSY
      0                   14X  P203  EQU HPBSY
    555                              EXT HBUSY
      0                   15X  P204  EQU HBUSY
    555                              EXT WEOI
      0                   16X  P205  EQU WEOI
    555                              EXT WHPIB
      0                   17X  P206  EQU WHPIB
    555                              EXT PDUMP
      0                   20X  P207  EQU PDUMP
    555                              EXT IDUMP
      0                   21X  P208  EQU IDUMP
    555                              EXT ADUMP
      0                   22X  P209  EQU ADUMP
    555                              EXT SDUMP
      0                   23X  P210  EQU SDUMP
    555                              EXT IHPIB
      0                   24X  P211  EQU IHPIB
    555                              EXT IHPBI
      0                   25X  P212  EQU IHPBI
    555                              EXT ROUND
      0                   26X  P213  EQU ROUND
    555                        P215  EQU * SKEY
    555     6000   1277R            LDB =D-1
    556    42000     27X            JSX .ARGA
    557     1676  77676A            LDA V16 TLEDS
    560    62000   1300R            IOR =B1000
    561    31676  77676A            STA V16 TLEDS
    562     6000   1301R            LDB =D-3   N
    563    42000     30X            JSX .LDAP
    564    42000  15546R            JSM P214   KEY
    565    66000     31X            JMX .RINA
    566    76000
    567    76100
    570 RES BW
    574 VBW
    577 SWP
    602 ATTEN
    606 REF
    611
    613 CENTER
    617 SPAN
    622 START
    626 STOP
    631 STEP
    634
    636 DL
    640 TH
    642 LINEAR
    646 MKR
    651 MKR
    655 CNTR
    661 CNTR
    666 YTO UNLOCK
    675 249 UNLOCK
    704 275 UNLOCK
    713 OVEN COLD
    721 EXT REF
    726 YTO UNCAL
    734 YTO ERROR
    742 MEAS UNCAL
    750 VID AVG
    755 SRQ
    760 OFFSET
    764 2nd LO
    771 CORR'D
    775 BATTERY
   1002 VIDEO BW
   1007 SWEEPTIME
   1015 RF ATTEN
   1022 REF LEVEL
   1030 LOG
   1033 CF STEP
   1040 TITLE:
   1044 DACS
   1047 DISPLAY LINE
   1056 THRESHOLD
   1064 MARKER
   1070 MARKER
   1075 MARKER ZOOM
   1104 COUNTER
   1111 COUNTER
   1117 COUNTER ZOOM
   1126 SAVE: REG
   1134 RECALL: REG
   1143 HP-IB ADRS:
   1152 ENTRY
```

```
1156 PREAMP GAIN
1165 SAVE LOCK
1173 COUNTER RESOLN
1203 REF LVL OFFSET
1213 FREQ OFFSET
1222 SIGNAL IF
1230 PILOT IF
1235 VTO
1240 SWEEP GEN
1246 DSPL ADRS
1254 WRITE:
1260 MIXER LEVEL
1267 DSPL ADRS INCR
1277 177777
1300   1000
1301 177775
 566                           LIT
1302                          P224   EQU * LOG
1302   6000     1363R            LDB =D-4
1303  42000       32X            JSX .ARGD
1304  42000       33X            JSX .UFC4
1305  42000       34X            JSX .STRD
1306           77742A            DEF V32738   X
1307   1742    77742A            LDA V32738   IX
1310 170405                      AAR 6
1311  22000     1277R            ADA =D-1
1312  31741    77741A            STA V32737   IY
1313   2000     1364R            LDA =B100
1314  31742    77742A            STA V32738   IX
1315  30020       20A            STA V1  AR2
1316  42000       35X            JSX ADD1
1317            1365R            DEF =F3.1622776
1320  42000       36X            JSX .SAR2
1321  42000       37X            JSX .LDBI
1322            1365R            DEF =F3.1622776
1323  42000       40X            JSX MINI
1324           77742A            DEF V32738   X
1325  42000       41X            JSX MPY1
1326            1371R            DEF =F1.924950591
1327  42000       42X            JSX DIVIT
1330  42000       34X            JSX .STRD
1331           77742A            DEF V32738   X
1332  42000       41X            JSX MPY1
1333           77742A            DEF V32738   X
1334   6000     1375R            LDB =D-9   I
1335  42000       43X            JSX .STBP
1336  42000       41X            JSX MPY1
1337            1376R            DEF =F2.15002535800-3
1340  42000       35X            JSX ADD1
1341            1402R            DEF =F5.82687660700-3
1342   6000     1375R            LDB =D-9   I
1343  42000       44X            JSX MPY1P
1344  42000       35X            JSX ADD1
1345            1406R            DEF =F4.08113897600-2
1346   6000     1375R            LDB =D-9   I
1347  42000       44X            JSX MPY1P
1350  42000       35X            JSX ADD1
1351            1412R            DEF =F4.51209517@-1
1352  42000       41X            JSX MPY1
1353           77742A            DEF V32738   X
1354  42000       35X            JSX ADD1
1355            1416R            DEF =F.5
1356  42000       36X            JSX .SAR2
1357   1741    77741A            LDA V32737   IY
1360  42000       45X            JSX CNV41
1361  42000       46X            JSX ADDIT
1362  66000       31X          JMX .RTNA
1363 177774
1364    100
1365 3.1622776
1371 1.924950591
1375 177767
1376 2.15002535800-3
1402 5.82687660700-3
1406 4.08113897600-2
1412 4.51209517@-1
1416        .5
1363                           LIT
1422                          P225   EQU * FIX
1422   1742    77742A            LDA V32738   IX
1423 170405                      AAR 6
1424  31741    77741A            STA V32737   IY
1425 170040                      ICA
1426 172032                     SAP A226
1427   1741    77741A            LDA V32737   IY
1430 170040                      TCA
1431  22000     1456R            ADA =D12
1432  70540                      PWC A
1433  42000       37X            JSX .LDBI
1434           77742A            DEF V32738   XL
1435  70761                      WWC B
1436  42000       47X            JSX .DRGI
1437  42000       50X            JSX CNV24
1440  31741    77741A            STA V32737   IY
1441   1742    77742A            LDA V32738   IX
1442 170405                      AAR 6
1443  70540                      PWC A
1444  42000       37X            JSX .LDBI
1445           77742A            DEF V32738   XL
1446  70761                      WWC B
```

```
1447  42000      51X    JSX .DLFT
1450  42000      34X    JSX .STRD
1451          77742A    DEF V32738   XL
1452   1742   77742A    LDA V32738   IX
1453  52000    1457R    AND =D1
1454  31742   77742A    STA V32738   IX
1455  66000    1462R    JMP A227
1456     14
1457      1
1456                   LIT
1460                   A226 EQU *
1460   2000    1463R    LDA =D0
1461  31741   77741A    STA V32737   IY
1462                   A227 EQU *
1462 170201             RET 1
1463      0
1463                   LIT
1464                   P228  EQU * PWR10
1464   6000    1503R    LDB =D-4
1465  42000      32X    JSX .ARGL
1466  42000      33X    JSX .UPC4
1467  42000      34X    JSX .STRD
1470          77742A    DEF V32738   X
1471  42000    1422R    JSM P225  FIX
1472   1741   77741A    LDA V32737   IY
1473  70540             PWC A
1474  42000      37X    JSX .LDBI
1475          77742A    DEF V32738   X
1476  42000      41X    JSX MPY1
1477           1512R    DEF =F2.302585093
1500  42000      34X    JSX .STRD
1501          77742A    DEF V32738   X
1502  42000      52X    JSX .DEQL
1503 172013             SAP A229
1504  42000      53X    JSX .LDSI
1505           1457R    DEF =D1
1506  42000      54X    JSX CNV31
1507  42000      34X    JSX .STRD
1510          77742A    DEF V32738   X
1511  66000    1632R    JMP A230
1512 2.302585093
1512                   LIT
1516                   A229 EQU *
1516  42000    1422R    JSM P225  FIX
1517  42000      37X    JSX .LDBI
1520           1565R    DEF =F8.68055555E-3
1521  42000      41X    JSX MPY1
1522          77742A    DEF V32738   X
1523  42000      35X    JSX ADD1
1524           1571R    DEF =F4.375E-2
1525  42000      41X    JSX MPY1
1526          77742A    DEF V32738   X
1527  42000      35X    JSX ADD1
1530           1575R    DEF =F1.664930556E-1
1531  42000      41X    JSX MPY1
1532          77742A    DEF V32738   X
1533  42000      35X    JSX ADD1
1534           1601R    DEF =F.4992181875
1535  42000      41X    JSX MPY1
1536          77742A    DEF V32738   X
1537  42000      35X    JSX ADD1
1540           1605R    DEF =F1.000021701
1541  42000      41X    JSX MPY1
1542          77742A    DEF V32738   X
1543  42000      35X    JSX ADD1
1544           1611R    DEF =F1.000043403
1545  42000      34X    JSX .STRD
1546          77742A    DEF V32738   X
1547                   A231 EQU *
1547   1741   77741A    LDA V32737   IY
1550  72002             RZA *+2
1551  66000    1632R    JMP A232
1552 172402             SAM *+2
1553  66000    1621R    JMP A233
1554  42000      37X    JSX .LDBI
1555          77742A    DEF V32738   X
1556  42000      55X    JSX DIV1
1557           1615R    DEF =F2.718281828
1560  42000      34X    JSX .STRD
1561          77742A    DEF V32738   X
1562  45741   77741A    ISZ V32737   IY
1563                    NOP
1564  66000    1631R    JMP A234
1565 8.68055555E-3
1571 4.375E-2
1575 1.664930556E-1
1601 .4992181875
1605 1.000021701
1611 1.000043403
1615 2.718281828
1565                   LIT
1621                   A233 EQU *
1621  42000      37X    JSX .LDBI
1622          77742A    DEF V32738   X
1623  42000      41X    JSX MPY1
1624           1615R    DEF =F2.718281828
1625  42000      34X    JSX .STRD
1626          77742A    DEF V32738   X
1627  55741   77741A    DSZ V32737   IY
1630                    NOP
```

```
1631                    A234 EQU *
1631  66000    1547R     JMP A231
1632                    A232 EQU *
1632                    A230 EQU *
1632  70760              WWC A
1633  31741   77741A     STA V32737   IY
1634 170605              SAL 6
1635  21742   77742A     ADA V32738   IX
1636  31742   77742A     STA V32738   IX
1637  30020      20A     STA V1  AR2
1640  42000      37X     JSX .LDBI
1641          77742A     DEF V32738   X
1642  66000      31X    JMX .RINA
1643                    T235 EQU *
1643                     DEC 0 0
1644                    N236  DEC 57  57
1645                    N237  DEC 470 470
1646                    N238  DEC 545 545
1647                    N239  DEC 1070  1070
1650                    N240  DEC 1145  1145
1651           1643R    V241 DEF T235 RLADJ
1652                     OCT 177777  177777
1653                    K242  OCT 6 6
1654                    T243 EQU *
1654                    B53 HEX 0 0
1655                    B236  HEX 57  57
1656                    B237  HEX 470 470
1657                    B238  HEX 545 545
1660                    B239  HEX 1070  1070
1661                    B240  HEX 1145  1145
1662           1654R    V244 DEF T243 RLADJB
1663                     OCT 177777  177777
1664                     OCT 6 6
1665                    P245  EQU * RLAD
1665 174517              CLB
1666  42000      56X     JSX .ARGS
1667  44016      16A     ISZ C
1670   1730   77730A     LDA V30 KFLAG
1671 170513              SAR 12
1672  52000    1457R     AND =D1
1673  70540              PWC A
1674   1730   77730A     LDA V30 KFLAG
1675 170514              SAR 13
1676  52000    1704R     AND =D6
1677  42000      57X     JSX ADD4I
1700  22000    1457R     ADA =D1
1701  42000      60X     JSX .ARAY
1702           1651R     DEF V241   RLADJ
1703  66000      31X    JMX .RINA
1704      6
1704                     LII
1705                    P246  EQU * DBSHFT
1705   6000    1363R     LDB =D-4
1706  42000      32X     JSX .ARGL
1707  42000      33X     JSX .UPC4
1710   1675   77675A     LDA V15 BLEDS
1711 170140              CMA
1712 170501              SAR 2
1713  52000    1457R     AND =D1
1714  70540              PWC A
1715  70761              WWC B
1716  42000      47X     JSX .DRGT
1717  66000      31X    JMX .RINA
1720                    P247  EQU * DBFIX
1720 174517              CLB
1721  42000      56X     JSX .ARGS
1722  42000      33X     JSX .UPC4
1723   1730   77730A     LDA V30 KFLAG
1724 170514              SAR 13
1725  52000    1704R     AND =D6
1726  22000    1457R     ADA =D1
1727  42000      60X     JSX .ARAY
1730           1662R     DEF V244   RLADJB
1731  42000      61X     JSX .LDSA
1732   2000    1463R     LDA =D0
1733  75541              MLY
1734  42000    1705R     JSM P246   DBSHFT
1735  66000      31X    JMX .RINA
1736                    P248  EQU * NANOV
1736   6000    1363R     LDB =D-4
1737  42000      32X     JSX .ARGL
1740  42000      33X     JSX .UPC4
1741  42000      53X     JSX .LDSI
1742           1770R     DEF =H2000
1743  42000    1705R     JSM P246   DBSHFT
1744  42000      62X     JSX CNV21
1745  42000      36X     JSX .SAR2
1746  42000    1720R     JSM P247   DBFIX
1747   6000    1375R     LDB =D-9   D
1750  42000      63X     JSX MIN2P
1751  42000      62X     JSX CNV21
1752  42000      42X     JSX DIV1I
1753  42000    1464R     JSM P228   PWR10
1754  42000      36X     JSX .SAR2
1755   1730   77730A     LDA V30 KFLAG
1756 170602              SAL 3
1757 172004             SAP A249
1760  42000      37X     JSX .LDBI
1761           1771R     DEF =F273.6606
1762  66000    1765R     JMP A250
```

```
1763                                 A249 EQU *
1763   42000          37X              JSX .LDB1
1764                1775R              DEF =F223.6@6
1765                                 A250 EQU *
1765   42000          64X              JSX MPY1I
1766   42000          65X              JSX CNV12
1767   66000          31X             JMX .RINA
1770   20000
1771  273.8686
1775  223.6@6
1770                                  LIT
2001                                 P251  EQU * DBM
2001    6000        1363R              LDB =D-4
2002   42000          32X              JSX .ARGL
2003   42000          33X              JSX .UPC4
2004   42000          53X              JSX .LDS1
2005                1770R              DEF =H2000
2006   42000        1705R              JSM P246   DBSHFT
2007   42000          62X              JSX CNV21
2010   42000          36X              JSX .SAR2
2011    1730      77730A               LDA V30 RELAG
2012  170602                           SAL 3
2013  172004                          SAP A252
2014   42000          37X              JSX .LDB1
2015                1771R              DEF =F273.8686
2016   66000        2021R              JMP A253
2017                                 A252 EQU *
2017   42000          37X              JSX .LDB1
2020                1775R              DEF =F223.6@6
2021                                 A253 EQU *
2021   42000          36X              JSX .SAR2
2022    6000        1375R              LDB =D-9   NV
2023   42000          66X              JSX .LDBP
2024   42000          52X              JSX .DEQL
2025  172004                          SAP A254
2026   42000          53X              JSX .LDS1
2027                1457R              DEF =D1
2030   66000        2031R              JMP A255
2031                                 A254 EQU *
2031                                 A255 EQU *
2031   42000          62X              JSX CNV21
2032   42000          42X              JSX DIV1I
2033   42000        1302R              JSM P224   LOG
2034   42000          64X              JSX MPY1I
2035   42000          36X              JSX .SAR2
2036   42000        1720R              JSM P247   DBFIX
2037   42000          62X              JSX CNV21
2040   42000          46X              JSX ADD1I
2041   42000          65X              JSX CNV12
2042   66000          31X             JMX .RINA
2043                                 P256  EQU * DLIMIT
2043    6000        2066R              LDB =D-8
2044   42000          32X              JSX .ARGL
2045   42000          33X              JSX .UPC4
2046    6000        1375R              LDB =D-9   A
2047   42000          30X              JSX .LDAP
2050   73004                          SLA A257
2051   42000          53X              JSX .LDS1
2052                1463R              DEF =D0
2053   66000        2065R              JMP A258
2054                                 A257 EQU *
2054    6000        2067R              LDB =D-17 LIM
2055   42000          63X              JSX MIN2P
2056    4020          20A              LDB AR2
2057   77004                          SLB A259
2060    6000        2067R              LDB =D-17 LIM
2061   42000          66X              JSX .LDBP
2062   66000        2065R              JMP A260
2063                                 A259 EQU *
2063    6000        1375R              LDB =D-9   A
2064   42000          66X              JSX .LDBP
2065                                 A260 EQU *
2065                                 A258 EQU *
2065   66000          31X             JMX .RINA
2066  177770
2067  177757
2066                                  LIT
2070                                 P261  EQU * IFBW
2070  174517                           CLB
2071   42000          56X              JSX .ARGS
2072   44016          16A              ISZ C
2073    1434      77434A               LDA V32540  IF2
2074  170513                           SAR 12
2075    6000        2107R              LDB =D3 IFBW
2076   42000          67X              JSX .STAP
2077  170040                           TCA
2100   22000        1704R              ADA =D6
2101  172005                          SAP A262
2102    6000        2107R              LDB =D3 IFBW
2103   42000          30X              JSX .LDAP
2104   22000        2110R              ADA =D-2
2105   66000          31X             JMX .RINA
2106                                 A262 EQU *
2106   66000          70X             JMX .RINI
2107       3
2110  177776
2107                                  LIT
2111                                 P263  EQU * VBW
2111  174517                           CLB
2112   42000          56X              JSX .ARGS
```

```
2113  44016     16A     ISZ C
2114   1434  77434A     LDA V32540  IF2
2115 170507             SAR 8
2116  52000   2131R     AND =B17
2117   6000   2107R     LDB =D3 VBW
2120  42000     67X     JSX .STAP
2121 170040             TCA
2122  22000   1704R     ADA =D6
2123 172005             SAP A264
2124   6000   2107R     LDB =D3 VBW
2125  42000     30X     JSX .LDAP
2126  22000   2110R     ADA =D-2
2127  66000     31X     JMX .RTNA
2130                   A264 EQU *
2130  66000     70X     JMX .RTN1
2131     17
2131                    LIT
2132                   P265  EQU * LIMIT
2132   6000   2110R     LDB =D-2
2133  42000     27X     JSX .ARGA
2134  44016     16A     ISZ C
2135   4000             LDB A
2136   2000   1463R     LDA =D0
2137 176413             SBM A266
2140   6000   1301R     LDB =D-3  I
2141  42000     30X     JSX .LDAP
2142   6000   2153R     LDB =D-5  J
2143  42000     71X     JSX MIN4P
2144 172004             SAP A267
2145   6000   2153R     LDB =D-5  J
2146  42000     30X     JSX .LDAP
2147  66000   2152R     JMP A268
2150                   A267 EQU *
2150   6000   1301R     LDB =D-3  I
2151  42000     30X     JSX .LDAP
2152                   A268 EQU *
2152                   A266 EQU *
2152  66000     31X     JMX .RTNA
2153 177773
2153                    LIT
2154                   P269  EQU * WSPIN
2154   1570  77570A     LDA V32632  M
2155 170603             SAL 4
2156  61571  77571A     IOR V32633  L
2157 170610             SAL 9
2160   6000   2107R     LDB =D3
2161  42000     72X     JSX .WS6
2162 170201             RET 1
2163                   P270  EQU * TLEDSOUT
2163   6000   1277R     LDB =D-1
2164  42000     27X     JSX .ARGA
2165  31676  77676A     STA V16 TLEDS
2166 170140             CMA
2167   6000   2172R     LDB =D13
2170  42000     72X     JSX .WS6
2171  66000     31X     JMX .RTNA
2172     15
2172                    LIT
2173                   P271  EQU * CRLF
2173   2000   2172R     LDA =D13
2174   6000   2203R     LDB =D8
2175  42000     72X     JSX .WS6
2176   2000   2204R     LDA =D10
2177  42000     73X     JSX .W6
2200   2000   2205R     LDA =B40
2201  42000     73X     JSX .W6
2202 170201             RET 1
2203     10
2204     12
2205     40
2203                    LIT
2206                   P272  EQU * SPACE
2206   2000   2205R     LDA =B40
2207   6000   2203R     LDB =D8
2210  42000     72X     JSX .WS6
2211 170201             RET 1
2212                   P273  EQU * DELTA
2212   6000   2221R     LDB =D9
2213  42000     74X     JSX .RS5
2214  31742  77742A     STA V32738  IX
2215   2000   2222R     LDA =D249
2216   6000   2203R     LDB =D8
2217  42000     72X     JSX .WS6
2220 170201             RET 1
2221     11
2222    371
2221                    LIT
2223                   P274  EQU * NBLK
2223   6000   1277R     LDB =D-1
2224  42000     27X     JSX .ARGA
2225   6000   2107R     LDB =D3
2226  75617             MPY
2227  22000   2110R     ADA =D-2
2230  31573  77573A     STA V32635  I
2231  42000     60X     JSX .ARAY
2232           210R     DEF V112  SFTXY
2233   6000   2203R     LDB =D8
2234  42000     75X     JSX .WS4
2235   2000   1463R     LDA =D0
2236  42000     73X     JSX .W6
```

```
2237    2000    2275R      LDA =B2102
2240   42000      73X      JSX .W6
2241    1573   77573A      LDA V32635  I
2242   22000    1457R      ADA =D1
2243   42000      60X      JSX .ARAY
2244             210R      DEF V112  SFTXY
2245   42000      73X      JSX .W6
2246    1573   77573A      LDA V32635  I
2247   22000    2276R      ADA =D2
2250   42000      60X      JSX .ARAY
2251             210R      DEF V112  SFTXY
2252   62000    2277R      IOR =B4000
2253   42000      73X      JSX .W6
2254    2000    2300R      LDA =B2101
2255   42000      73X      JSX .W6
2256    6000    1301R      LDB =D-3  N
2257   42000      30X      JSX .LDAP
2260   42000      60X      JSX .ARAY
2261             267R      DEF V119  SFTAB
2262    6000    1704R      LDB =D6
2263   42000      76X      JSX .WSTS
2264    6000    1301R      LDB =D-3  N
2265   42000      30X      JSX .LDAP
2266   12000    2301R      CPA =D19
2267   66000    2273R      JMP A276
2270   12000    2302R      CPA =D22
2271   66000    2273R      JMP *+2
2272   66000    2274R      JMP A275
2273                     A276 EQU *
2273   42000    2212R      JSM P273  DELTA
2274                     A275 EQU *
2274   66000      31X      JMX .RTNA
2275    2102
2276       2
2277    4000
2300    2101
2301      23
2302      26
2275                        LIT
2303                     P277  EQU * GOFSET
2303  174517               CLB
2304   42000      56X      JSX .ARGS
2305   44016      16A      ISZ C
2306    5677   77677A      LDB V17 RFAT
2307  174613               SBL 12
2310    1432   77432A      LDA V32538  GIN2
2311  176402              SBM A278
2312    1433   77433A      LDA V32539  GIN1
2313                     A278 EQU *
2313   66000      31X      JMA .RTNA
2314                     P279  EQU * SBLK
2314    6000    1277R      LDB =D-1
2315   42000      27X      JSX .ARGA
2316    6000    2107R      LDB =D3
2317   75617               MPY
2320   22000    2110R      ADA =D-2
2321   42000      60X      JSX .ARAY
2322             210R      DEF V112  SFTXY
2323   70541               PWC B
2324    6000    1301R      LDB =D-3  N
2325   42000      30X      JSX .LDAP
2326   42000      60X      JSX .ARAY
2327             267R      DEF V119  SFTAB
2330  100000               LDA A,I
2331   42000      77X      JSX ADD4B
2332   22000    2405R      ADA =D5
2333    6000    2203R      LDB =D8
2334   42000      75X      JSX .WS4
2335    2000    2205R      LDA =B40
2336   42000      73X      JSX .W6
2337    6000    1301R      LDB =D-3  N
2340   42000      30X      JSX .LDAP
2341  170500               SAR 1
2342   12000    2406R      CPA =D7
2343   66000    2351R      JMP A281
2344    6000    1301R      LDB =D-3  N
2345   42000      30X      JSX .LDAP
2346   12000    2407R      CPA =D34
2347   66000    2351R      JMP *+2
2350   66000    2355R      JMP A280
2351                     A281 EQU *
2351   42000    2173R      JSM P271  CRLF
2352    1616   77616A      LDA V32654  XFLAG
2353   62000    2410R      IOR =B200
2354   31616   77616A      STA V32654  XFLAG
2355                     A280 EQU *
2355    6000    1301R      LDB =D-3  N
2356   42000      30X      JSX .LDAP
2357   42000   14055R      JSM P216  MESSAGE
2360    6000    1301R      LDB =D-3  N
2361   42000      30X      JSX .LDAP
2362   12000    2411R      CPA =D4
2363   66000    2365R      JMP *+2
2364   66000    2374R      JMP A282
2365   42000    2303R      JSM P277  GOFSET
2366   72406              SZA A282
2367    6000    1704R      LDB =D6
2370   42000     100X      JSX .WSTR
2371            2412R      DEF =" PG "
2372    2000    2416R      LDA =D29
```

```
2373  42000  14055R    JSM P216   MESSAGE
2374                   A282 EQU *
2374   6000   1301R    LDB =D-3   N
2375  42000     30X    JSX .LDAP
2376   4000            LDB A
2377  26000   2417R    ADB =B177772
2400   2000   2420R    LDA =D145
2401  76402            SZB A283
2402   2000   2421R    LDA =D146
2403                   A283 EQU *
2403  42000     73X    JSX .W6
2404  66000     31X    JMX .RTNA
2405      5
2406      7
2407     42
2410    200
2411      4
2412     PG
2416     35
2417 177772
2420    221
2421    222
2405                    LIT
2422                   P284  EQU * BLKAD
2422   6000   1277R    LDB =D-1
2423  42000     27X    JSX .ARGA
2424   6000   2107R    LDB =D3
2425  75617            MPY
2426  22000   2110R    ADA =D-2
2427  42000     60X    JSX .ARAY
2430            210R   DEF V112   SFTXY
2431   6000   2203R    LDB =D8
2432  42000     75X    JSX .WS4
2433  66000     31X    JMX .RTNA
2434                   P285  EQU * BLKOF
2434   6000   1277R    LDB =D-1
2435  42000     27X    JSX .ARGA
2436  66000   2445R    JMP A286
2437                   T287 EQU *
2437                   DEC 0 0
2440                   K288  OCT 177401  177401
2441                   K289  OCT 742 742
2442          2437R    V290 DEF T287 SK16
2443                   OCT 177777  177777
2444                   K291  OCT 3 3
2445                   A286  EQU *
2445  42000   2422R    JSM P284   BLKAD
2446   6000   1301R    LDB =D-3   N
2447  42000     30X    JSX .LDAP
2450  12000   1456R    CPA =D12
2451  66000   2455R    JMP A293
2452  12000   2477R    CPA =D36
2453  66000   2455R    JMP *+2
2454  66000   2457R    JMP A292
2455                   A293 EQU *
2455   2000   2500R    LDA =D147
2456  66000   2475R    JMP A294
2457                   A292 EQU *
2457   6000   1301R    LDB =D-3   N
2460  42000     30X    JSX .LDAP
2461  52000   2131R    AND =D15
2462  70540            P*C A
2463   6000   1301R    LDB =D-3   N
2464  42000     30X    JSX .LDAP
2465 170503            SAR 4
2466  22000   1457R    ADA =D1
2467  42000     60X    JSX .ARAY
2470          2442R    DEF V290   SK16
2471  70761            W*C B
2472  42000    101X    JSX .IBIT
2473 170416            AAR 15
2474  22000   2421R    ADA =D146
2475                   A294 EQU *
2475  42000     73X    JSX .W6
2476  66000     31X    JMX .RTNA
2477     44
2500    223
2477                    LIT
2501                   P295  EQU * BLINK
2501   6000   1277R    LDB =D-1
2502  42000     27X    JSX .ARGA
2503  42000   2223R    JSM P274   NBLK
2504   6000   1301R    LDB =D-3   N
2505  42000     30X    JSX .LDAP
2506  42000   2422R    JSM P284   BLKAD
2507   6000   1301R    LDB =D-3   N
2510  42000     30X    JSX .LDAP
2511   4000            LDB A
2512  26000   2520R    ADB =B177741
2513   2000   1463R    LDA =D0
2514  76402            SZB A296
2515   2000   2521R    LDA =B21
2516                   A296 EQU *
2516  42000     73X    JSX .W6
2517  66000     31X    JMX .RTNA
2520 177741
2521     21
2520                    LIT
2522                   P297  EQU * RJUST
2522   6000   2110R    LDB =D-2
```

```
2523  42000     27X    JSX .ARGA
2524  42000   2314R    JSM P279   SBLK
2525   2000   2107R    LDA =D3
2526   6000   1301R    LDB =D-3   N
2527  42000    102X    JSX MPY4P
2530  22000   2110R    ADA =D-2
2531  42000     60X    JSX .ARAY
2532           210R    DEF V112   SFTXY
2533  22000   2276R    ADA =D2
2534  42000    103X    JSX .W4
2535   6000   1301R    LDB =D-3   N
2536  42000     30X    JSX .LDAP
2537  42000     60X    JSX .ARAY
2540           267R    DEF V119   SFTAB
2541 100000            LDA A,I
2542  21430  77430A    ADA V32536   SLEN
2543  22000   1457R    ADA =D1
2544 170603            SAL 4
2545   6000   2153R    LDB =D-5   P
2546  42000     71X    JSX MIN4P
2547  42000     73X    JSX .W6
2550  66000     31X    JMX .RINA
2551                  P298  EQU * ABLK
2551   1620  77620A    LDA V32656   PREFIX
2552  12000   2406R    CPA =D7
2553  66000   2555R    JMP *+2
2554  66000   2566R    JMP A299
2555   1675  77675A    LDA V15 BLEDS
2556 170604            SAL 5
2557 172007           SAP A299
2560   2000   2565R    LDA =D11
2561  42000   2223R    JSM P274    NBLK
2562   2000   2565R    LDA =D11
2563  42000   2314R    JSM P279    SBLK
2564  66000   2570R    JMP A300
2565     13
2565                   LIT
2566                  A299 EQU *
2566   2000   2565R    LDA =D11
2567  42000   2434R    JSM P285    BLKOF
2570                  A300 EQU *
2570   1616  77616A    LDA V32654   XFLAG
2571  62000   2644R    IOR =B10000
2572  31616  77616A    STA V32654   XFLAG
2573   1601  77601A    LDA V32641   HPBC
2574  52000   2645R    AND =B137777
2575  31601  77601A    STA V32641   HPBC
2576   2000   2646R    LDA =D3008
2577  31737  77737A    STA V32735   BLKS
2600   2000   1463R    LDA =D0
2601  31617  77617A    STA V32655   DECFLG
2602  31611  77611A    STA V32649   CHRC
2603  42000     53X    JSX .LDSI
2604          1463R    DEF =D0
2605  42000     34X    JSX .STRD
2606         77651A    DEF V32681   LTEMP
2607   1620  77620A    LDA V32656   PREFIX
2610  72433           SZA A301
2611  42000     60X    JSX .ARAY
2612           345R    DEF V122   AFTAB
2613 100000            LDA A,I
2614  22000   2406R    ADA =D7
2615  31612  77612A    STA V32650   NCHR
2616  21737  77737A    ADA V32735   BLKS
2617   6000   2203R    LDB =D8
2620  42000     75X    JSX .WS4
2621   1620  77620A    LDA V32656   PREFIX
2622  42000  14055R    JSM P216   MESSAGE
2623   1620  77620A    LDA V32656   PREFIX
2624 170040            TCA
2625  22000   2521R    ADA =D17
2626 172007           SAP A302
2627   1620  77620A    LDA V32656   PREFIX
2630  22000   2647R    ADA =D-24
2631 172004           SAP A302
2632  42000   2173R    JSM P271   CRLF
2633   2000   2521R    LDA =D17
2634  42000  14055R    JSM P216   MESSAGE
2635                  A302 EQU *
2635   1620  77620A    LDA V32656   PREFIX
2636 170500            SAR 1
2637  12000   1456R    CPA =D12
2640  66000   2643R    JMP A303
2641   2000   2500R    LDA =D147
2642  42000     73X    JSX .W6
2643                  A303 EQU *
2643                  A301 EQU *
2643 170201            RET 1
2644  10000
2645 137777
2646   5700
2647 177750
2644                   LIT
2650                  P304  EQU * UNCAL
2650   2000    152R    LDA V114   UNCALAD
2651   6000   2203R    LDB =D8
2652  42000     75X    JSX .WS4
2653   1426  77426A    LDA V32534   UFLAG
2654 172012           SAP A305
2655   2000   1463R    LDA =D0
```

```
2656  42000      73X    JSX .W6
2657   2000     152R    LDA V114  UNCALAD
2660  22000    2405R    ADA =D5
2661  42000     103X    JSX .W4
2662   6000    1704R    LDB =D6
2663  42000     100X    JSX .WSTR
2664            742R    DEF ="MEAS UNCAL"
2665  66000    2731R    JMP A306
2666                  A305 EQU *
2666   1733   77733A    LDA V20 FSTIM
2667 172415            SAM A309
2670   1426   77426A    LDA V32534  UFLAG
2671 170612             SAL 11
2672 172004            SAP A310
2673   1676   77676A    LDA V16 ILEDS
2674 170611             SAL 10
2675 172013            SAP A308
2676                  A310 EQU *
2676   1426   77426A    LDA V32534  UFLAG
2677 170615             SAL 14
2700 172004            SAP A311
2701   1676   77676A    LDA V16 ILEDS
2702 170614             SAL 13
2703 172005            SAP A308
2704                  A311 EQU *
2704                  A309 EQU *
2704   1426   77426A    LDA V32534  UFLAG
2705  52000    2723R    AND =B54
2706  22000    2724R    ADA =B177724
2707  72020            RZA A307
2710                  A308 EQU *
2710   2000    1463R    LDA =D0
2711  42000      73X    JSX .W6
2712   2000     152R    LDA V114  UNCALAD
2713  22000    2405R    ADA =D5
2714  42000     103X    JSX .W4
2715   6000    1704R    LDB =D6
2716  42000     100X    JSX .WSTR
2717           2725R    DEF =" *"
2720   2000    2420R    LDA =D145
2721  42000      73X    JSX .W6
2722  66000    2731R    JMP A312
2723     54
2724 177724
2725      *
2723                    LIT
2727                  A307 EQU *
2727   2000    2420R    LDA =D145
2730  42000      73X    JSX .W6
2731                  A312 EQU *
2731                  A306 EQU *
2731   1723   77723A    LDA V26 MKRMODE
2732 170040             ICA
2733  22000    2761R    ADA =D20
2734 172024            SAP A313
2735   1426   77426A    LDA V32534  UFLAG
2736 170610             SAL 9
2737 172021            SAP A313
2740   2000    2107R    LDA =D3
2741   5723   77723A    LDB V26 MKRMODE
2742  75617             MPY
2743  22000    2110R    ADA =D-2
2744  42000      60X    JSX .ARAY
2745            210R    DEF V112  SFIXY
2746  70541             PWC B
2747   1723   77723A    LDA V26 MKRMODE
2750  42000      60X    JSX .ARAY
2751            267R    DEF V119  SFTAB
2752 100000             LDA A,I
2753  42000      77X    JSX ADD4B
2754  22000    2405R    ADA =D5
2755  42000     103X    JSX .W4
2756   2000    2421R    LDA =D146
2757  42000      73X    JSX .W6
2760                  A313 EQU *
2760 170201             RET 1
2761     24
2761                    LIT
2762                  P314  EQU * AVGRST
2762   2000    1277R    LDA =B177777
2763  31607   77607A    STA V32647  ACNT
2764   1426   77426A    LDA V32534  UFLAG
2765  62000    2771R    IOR =B126
2766  31426   77426A    STA V32534  UFLAG
2767  42000    2650R    JSM P304  UNCAL
2770 170201             RET 1
2771    126
2771                    LIT
2772                  P315  EQU * DALG
2772  42000    2762R    JSM P314  AVGRST
2773   1702   77702A    LDA V24 VIDCON
2774 170611             SAL 10
2775 172002             SAP *+2
2776  66000    3043R    JMP A316
2777  66000    3006R    JMP A317
3000                  T318 EQU *
3000           3023R    DEF =" NEG PK"
3001           3030R    DEF =" POS PK"
3002           3035R    DEF =" SAMPLE"
3003           3000R  V319 DEF T318 ALGS
```

```
3004                      OCT 177777  177777
3005                      OCT 3 3
3006                     A317  EQU *
3006    2000   3042R      LDA =037
3007   42000   2223R      JSM P274   NBLK
3010    1702  77702A      LDA V24 VIDCON
3011  170502              SAR 3
3012   52000   2107R      AND =D3
3013   22000   1457R      ADA =D1
3014   42000     60X      JSX .ARAY
3015           3003R      DEF V319   ALGS
3016    6000   1704R      LDB =D6
3017   42000     76X      JSX .WSTS
3020    2000   2420R      LDA =D145
3021   42000     73X      JSX .W6
3022   66000   3045R      JMP A320
3023  NEG PK
3030  POS PK
3035  SAMPLE
3042      45
3023                      LIT
3043                     A316 EQU *
3043    2000   3042R      LDA =037
3044   42000   2434R      JSM P285   BLKOF
3045                     A320 EQU *
3045  170201              RET 1
3046                     P321   EQU * CLEAR
3046    6000   1277R      LDB =D-1
3047   42000     27X      JSX .ARGA
3050   22000   1277R      ADA =D-1
3051  170611              SAL 10
3052   22000   1457R      ADA =D1
3053    6000   2203R      LDB =D8
3054   42000     75X      JSX .WS4
3055    6000   1301R      LDB =D-3   N
3056   42000     30X      JSX .LDAP
3057    4000              LDB A
3060   26000   1363R      ADB =B177774
3061    2000   3110R      LDA =B2024
3062   76402              SZB A322
3063    2000   1463R      LDA =D0
3064                     A322 EQU *
3064   31572  77572A      STA V32634   J
3065    2000   3111R      LDA =B176001
3066   70540              PWC A
3067    2000   1457R      LDA =D1
3070                     A323 EQU *
3070   31573  77573A      STA V32635   I
3071  170040              TCA
3072   22000   3112R      ADA =D1001
3073  172005              SAP A324
3074    1572  77572A      LDA V32634   J
3075   72003              RZA A324
3076    2000   3113R      LDA =B2060
3077   66000   3101R      JMP A325
3100                     A324 EQU *
3100    1572  77572A      LDA V32634   J
3101                     A325 EQU *
3101   42000     73X      JSX .W6
3102    2000   1457R      LDA =D1
3103   21573  77573A      ADA V32635   I
3104  144016     16A      ISZ C,I
3105   66000   3070R      JMP A323
3106   54016     16A      DSZ C
3107   66000     31X      JMX .RTNA
3110    2024
3111  176001
3112    1751
3113    2060
3110                      LIT
3114                     P326   EQU * WDACS
3114    6000   1277R      LDB =D-1
3115   42000     27X      JSX .ARGA
3116    2000   3166R      LDA =D1023
3117   70540              PWC A
3120    6000   1301R      LDB =D-3   DAC
3121   42000     30X      JSX .LDAP
3122   42000   2132R      JSM P265   LIMIT
3123   31613  77613A      STA V32651   DAC4
3124   31614  77614A      STA V32652   DAC2
3125   31615  77615A      STA V32653   DAC1
3126   42000    104X      JSX .TURN
3127           3166R      DEF =B1777
3130          77604A      DEF V32644   SATN
3131   31604  77604A      STA V32644   SATN
3132    2000   1463R      LDA =D0
3133   31605  77605A      STA V32645   SCANSL
3134   31602  77602A      STA V32642   LKMSK
3135    1616  77616A      LDA V32654   XFLAG
3136   62000   2277R      IOR =B4000
3137   31616  77616A      STA V32654   XFLAG
3140    1603  77603A      LDA V32643   PLOCK
3141   52000   3167R      AND =B5777
3142   62000   3170R      IOR =B152000
3143   31603  77603A      STA V32643   PLOCK
3144    1615  77615A      LDA V32653   DAC1
3145    6000   1463R      LDB =D0
3146   42000     75X      JSX .WS4
3147    1614  77614A      LDA V32652   DAC2
3150   42000    105X      JSX .W5
```

```
3151    1613  77613A     LDA V32651  DAC4
3152   42000    106X     JSX .W7
3153    1604  77604A     LDA V32644  SATN
3154    5000   1457R     LDB =D1
3155   42000     75X     JSX .WS4
3156    1603  77603A     LDA V32643  PLOCK
3157   42000     73X     JSX .W6
3160    1605  77605A     LDA V32645  SCANSL
3161   42000    106X     JSX .W7
3162    1602  77602A     LDA V32642  LKMSK
3163    6000   2107R     LDB =D3
3164   42000    107X     JSX .WS5
3165   66000     31X     JMX .RINA
3166    1777
3167    5777
3170  152000
3166                   LIT
3171                   P327  EQU * HLDOF
3171    6000   1277R     LDB =D-1
3172   42000     27X     JSX .ARGA
3173    4000             LDB A
3174   26000   1277R     ADB =B177777
3175    2000   1457R     LDA =D1
3176  176403            SBM A328
3177    6000   1301R     LDB =D-3  N
3200   42000     30X     JSX .LDAP
3201                   A328 EQU *
3201  170601             SAL 2
3202    6000   2405R     LDB =D5
3203   42000     75X     JSX .WS4
3204   66000     31X     JMX .RINA
3205                   P329  EQU * BUSY
3205                   A330 EQU *
3205    6000   2276R     LDB =D2
3206   42000    110X     JSX .RS7
3207   31567  77567A     STA V32631  KEYCOL
3210  170612             SAL 11
3211  172002            SAP A331
3212   76673            SSC A330
3213                   A331 EQU *
3213  170201             RET 1
3214                   P332  EQU * WAIT
3214    6000   1277R     LDB =D-1
3215   42000     27X     JSX .ARGA
3216   42000   3171R     JSM P327  HLDOF
3217   42000   3205R     JSM P329  BUSY
3220   66000     31X     JMX .RINA
3221                   P333  EQU * CORREK
3221  174517             CLB
3222   42000     56X     JSX .ARGS
3223   44016     16A     ISZ C
3224    1740  77740A     LDA V32736  EFLAG
3225   52000   3231R     AND =B60
3226   22000   3232R     ADA =B177720
3227   42000    111X     JSX .EQL
3230   66000     31X   JMX .RINA
3231      60
3232  177720
3231                   LIT
3233                   P334  EQU * IFSAV
3233    1434  77434A     LDA V32540  IF2
3234  170507             SAR 8
3235   42000    104X     JSX .TURN
3236           3242R     DEF =B377
3237          77435A     DEF V32541  IF1
3240   31701  77701A     STA V23 RVBW
3241  170201             RET 1
3242     377
3242                   LIT
3243                   P335  EQU * WIF1
3243   42000   3233R     JSM P334  IFSAV
3244    5730  77730A     LDB V30 KFLAG
3245  174611             SBL 10
3246    1435  77435A     LDA V32541  IF1
3247  176002            SBP A336
3250   52000   3254R     AND =B177437
3251                   A336 EQU *
3251    5000   2172R     LDB =D13
3252   42000     75X     JSX .WS4
3253  170201             RET 1
3254  177437
3254                   LIT
3255                   P337  EQU * WRFAT
3255    1677  77677A     LDA V17 RFAT
3256  170140             CMA
3257    6000   2107R     LDB =D3
3260   42000    112X     JSX .WS7
3261    2000   2411R     LDA =D4
3262   42000   2314R     JSM P279  SBLK
3263   42000   2762R     JSM P314  AVGRST
3264    2000   2411R     LDA =D4
3265   42000   3214R     JSM P332  WAIT
3266    2000   2107R     LDA =D3
3267    6000   2107R     LDB =D3
3270   42000     75X     JSX .WS4
3271    2000   2411R     LDA =D4
3272   42000    103X     JSX .W4
3273  170201             RET 1
3274                   P338  EQU * RLMIN
3274  174517             CLB
```

```
3275  42000     56X   JSX .ARGS
3276  44016     16A   ISZ C
3277   5675  77675A   LDB V15 BLEDS
3300 174605           SBL 6
3301   2000   3311R   LDA =B176175
3302 176006           SBP A339
3303   1677  77677A   LDA V17 RFAT
3304  52000   2406R   AND =D7
3305   6000   3312R   LDB =D100
3306  75617           MPY
3307  22000   3313R   ADA =D-999
3310                 A339 EQU *
3310  66000     31X   JMX .RTNA
3311 176175
3312    144
3313 176031
3311                  LIT
3314                 P340  EQU * MXRLVL
3314 174517           CLB
3315  42000     56X   JSX .ARGS
3316  44016     16A   ISZ C
3317   1677  77677A   LDA V17 RFAT
3320 170403           AAR 4
3321  66000     31X   JMX .RTNA
3322                 P341  EQU * RFATV
3322 174517           CLB
3323  42000     56X   JSX .ARGS
3324  44016     16A   ISZ C
3325   2000   1704R   LDA =D6
3326  70540           PWC A
3327  42000   3314R   JSM P340   MXRLVL
3330  42000    113X   JSX DIV4
3331          3312R   DEF =D100
3332  22000   1457R   ADA =D1
3333 170040           TCA
3334  21573  77573A   ADA V32635  1
3335  42000   2132R   JSM P265  LIMIT
3336  22000   1457R   ADA =D1
3337  66000     31X   JMX .RTNA
3340                 P342  EQU * RLMAX
3340 174517           CLB
3341  42000     56X   JSX .ARGS
3342  44016     16A   ISZ C
3343   5730  77730A   LDB V30 RFLAG
3344 174612           SBL 11
3345   2000   3404R   LDA =D700
3346 176404           SBM A343
3347  42000   3314R   JSM P340   MXRLVL
3350 170040           TCA
3351  22000   3405R   ADA =D300
3352                 A343 EQU *
3352  70540           PWC A
3353   5675  77675A   LDB V15 BLEDS
3354 174605           SBL 6
3355   2000   3404R   LDA =D700
3356 176021           SBP A344
3357   1677  77677A   LDA V17 RFAT
3360  52000   2406R   AND =D7
3361  70540           PWC A
3362   1730  77730A   LDA V30 RFLAG
3363 170612           SAL 11
3364 172005           SAP A346
3365  42000   2070R   JSM P261   IFBW
3366 170040           TCA
3367  22000   1704R   ADA =D6
3370 172403           SAM A345
3371                 A346 EQU *
3371   2000   1463R   LDA =D0
3372  66000   3374R   JMP A347
3373                 A345 EQU *
3373   2000   1457R   LDA =D1
3374                 A347 EQU *
3374  42000     57X   JSX ADD4T
3375   6000   3312R   LDB =D100
3376  75617           MPY
3377                 A344 EQU *
3377  42000   2132R   JSM P265   LIMIT
3400  70540           PWC A
3401  42000   3314R   JSM P340   MXRLVL
3402  42000     57X   JSX ADD4T
3403  66000     31X   JMX .RTNA
3404   1274
3405    454
3404                  LIT
3406                 P348  EQU * RFLC
3406 174517           CLB
3407  42000     56X   JSX .ARGS
3410  44016     16A   ISZ C
3411   2000   1463R   LDA =D0
3412   6000   2107R   LDB =D3 RFLC
3413  42000     67X   JSX .STAP
3414  42000   3221R   JSM P333   CORRER
3415 172402           SAM *+2
3416  66000   3515R   JMP A349
3417   1677  77677A   LDA V17 RFAT
3420  42000      7X   JSM P198   ATNER
3421  70540           PWC A
3422  42000   2070R   JSM P261   IFBW
3423  42000     60X   JSX .ARAY
3424            15R   DEF V39 BWAMP
```

```
3425  42000     57X    JSX ADD4T
3426  70540            PWC A
3427   1603  77603A    LDA V32643  PLOCK
3430 170140            CMA
3431 170511            SAR 10
3432  52000   1457R    AND =D1
3433  70540            PWC A
3434   2000   2131R    LDA =D15
3435  42000     60X    JSX .ARAY
3436            15R    DEF V39 BWAMP
3437  42000    114X    JSX MPY4T
3440  42000     57X    JSX ADD4T
3441  70540            PWC A
3442   2000   2406R    LDA =D7
3443  70540            PWC A
3444   1573  77573A    LDA V32635  I
3445  22000   1363R    ADA =D-4
3446  42000   2132R    JSM P265  LIMIT
3447  22000   2301R    ADA =D19
3450  42000     60X    JSX .ARAY
3451            15R    DEF V39 BWAMP
3452  42000     57X    JSX ADD4T
3453   6000   2107R    LDB =D3 RFLC
3454  42000     67X    JSX .STAP
3455   1435  77435A    LDA V32541  IF1
3456 172022           SAP A350
3457 170514            SAR 13
3460  52000   2107R    AND =D3
3461 170040            TCA
3462  22000   2416R    ADA =D29
3463  42000     60X    JSX .ARAY
3464            15R    DEF V39 BWAMP
3465  70541            PWC B
3466  42000   2070R    JSM P261  IFBW
3467   4000            LDB A
3470  26000   3526R    ADB =B177766
3471   2000   1457R    LDA =D1
3472 176402           SBM A351
3473   2000   3527R    LDA =D14
3474                 A351 EQU *
3474  42000     60X    JSX .ARAY
3475            15R    DEF V39 BWAMP
3476  42000     77X    JSX ADD4B
3477  66000   3511R    JMP A352
3500                 A350 EQU *
3500   1573  77573A    LDA V32635  I
3501  22000   1363R    ADA =D-4
3502 170516            SAR 15
3503  70540            PWC A
3504   2000   2131R    LDA =D15
3505  21573  77573A    ADA V32635  I
3506  42000     60X    JSX .ARAY
3507            15R    DEF V39 BWAMP
3510  42000    114X    JSX MPY4T
3511                 A352 EQU *
3511   6000   2107R    LDB =D3 RFLC
3512  42000    115X    JSX ADD4P
3513   6000   2107R    LDB =D3 RFLC
3514  42000     67X    JSX .STAP
3515                 A349 EQU *
3515   6000   2107R    LDB =D3 RFLC
3516  42000     30X    JSX .LDAP
3517 172003           SAP A353
3520  22000   2153R    ADA =D-5
3521  66000   3523R    JMP A354
3522                 A353 EQU *
3522  22000   2405R    ADA =D5
3523                 A354 EQU *
3523  42000    113X    JSX DIV4
3524          2204R    DEF =D10
3525  66000     31X    JMX .RTNA
3526 177766
3527     16
3526                   LIT
3530                 P355  EQU * REFLEV
3530   6000   1277R    LDB =D-1
3531  42000     27X    JSX .ARGA
3532  66000   3571R    JMP A356
3533                 T357 EQU *
3533                 K358  OCT 347 347
3534                 K359  OCT 346 346
3535                 K360  OCT 343 343
3536                 K361  OCT 342 342
3537                 K362  OCT 341 341
3540                 K363  OCT 340 340
3541                 K364  OCT 300 300
3542                 K365  OCT 140 140
3543                 K366  OCT 100 100
3544                 K367  OCT 40  40
3545                   DEC 0 0
3546                 K368  OCT 400 400
3547                 K142  OCT 1000  1000
3550          3533R  V369 DEF T357 REFLOG
3551                   OCT 177777  177777
3552                 K184  OCT 15  15
3553                 T370 EQU *
3553                 K371  OCT 370 370
3554                 K372  OCT 360 360
3555                 K373  OCT 350 350
3556                   OCT 340 340
```

```
3557                  OCT 300 300
3560                  OCT 140 140
3561                  OCT 100 100
3562                  OCT 40  40
3563                  DEC 0 0
3564                  OCT 400 400
3565                  OCT 1000  1000
3566          3553R  V374 DEF T370 REFLIN
3567                  OCT 177777  177777
3570                 K375  OCT 13  13
3571                 A356  EQU *
3571   1606  77606A   LDA V32646  SRCEID
3572 170615           SAL 14
3573 172007          SAP A376
3574   1606  77606A   LDA V32646  SRCEID
3575  62000   2644R   IOR =B10000
3576  31606  77606A   STA V32646  SRCEID
3577   2000   3654R   LDA =B20
3600   6000   2411R   LDB =D4
3601  42000    112X   JSX .WS7
3602                 A376 EQU *
3602   1435  77435A   LDA V32541  IF1
3603 170516           SAR 15
3604  70540           PWC A
3605  42000   2070R   JSM P261  IFBW
3606 170040           TCA
3607  22000   1704R   ADA =D6
3610 170140           CMA
3611 170516           SAR 15
3612  42000     57X   JSX ADD41
3613   6000   3655R   LDB =D200
3614  75617           MPY
3615  22000   3656R   ADA =D999
3616  70540           PWC A
3617   5675  77675A   LDB V15 BLEDS
3620 174605           SBL 6
3621   2000   1457R   LDA =D1
3622 176003          SBP A377
3623   1677  77677A   LDA V17 RFAT
3624  52000   2406R   AND =D7
3625                 A377 EQU *
3625   6000   3312R   LDB =D100
3626  75617           MPY
3627  42000    116X   JSX SUB4I
3630  31742  77742A   STA V32738  IX
3631  42000   1665R   JSM P245  RLAD
3632   6000   1301R   LDB =D-3  LVL
3633  42000     71X   JSX MIN4P
3634  70540           PWC A
3635  42000   2303R   JSM P277  GOFSET
3636 170040           TCA
3637  21706  77706A   ADA V31 ROFSET
3640 170040           TCA
3641  42000     57X   JSX ADD4I
3642   6000   1301R   LDB =D-3  LVL
3643  42000     67X   JSX .STAP
3644  42000   3340R   JSM P342  RLMAX
3645   6000   1301R   LDB =D-3  LVL
3646  42000    117X   JSX SUB4P
3647 172010          SAP A378
3650  42000   3340R   JSM P342  RLMAX
3651   6000   1301R   LDB =D-3  LVL
3652  42000     67X   JSX .STAP
3653  66000   3671R   JMP A379
3654     20
3655    310
3656   1747
3654                 LIT
3657                 A378 EQU *
3657   1730  77730A   LDA V30 KFLAG
3660 170612           SAL 11
3661 172410          SAM A380
3662  42000   3274R   JSM P338  RLMIN
3663   6000   1301R   LDB =D-3  LVL
3664  42000     71X   JSX MIN4P
3665 172004          SAP A380
3666  42000   3274R   JSM P338  RLMIN
3667   6000   1301R   LDB =D-3  LVL
3670  42000     67X   JSX .STAP
3671                 A380 EQU *
3671                 A379 EQU *
3671   1742  77742A   LDA V32738  IX
3672   6000   1301R   LDB =D-3  LVL
3673  42000     71X   JSX MIN4P
3674 172007          SAP A381
3675   1742  77742A   LDA V32738  IX
3676  22000   3702R   ADA =D1999
3677   6000   1301R   LDB =D-3  LVL
3700  42000     67X   JSX .STAP
3701  66000   3740R   JMP A382
3702   3717
3702                 LIT
3703                 A381 EQU *
3703   1435  77435A   LDA V32541  IF1
3704 170516           SAR 15
3705   6000   3655R   LDB =D200
3706  75617           MPY
3707  21742  77742A   ADA V32738  IX
3710  22000   4044R   ADA =D1099
3711  70540           PWC A
```

```
3712    1675  77675A     LDA V15 BLEDS
3713  170140              CMA
3714  170510              SAR 9
3715   52000   1457R     AND =D1
3716   70540              PWC A
3717   42000   3314R     JSM P340  MXRLVL
3720   22000   3404R     ADA =D700
3721   42000    114X     JSX MPY4T
3722   42000     57X     JSX ADD4T
3723   31741  77741A     STA V32737  IY
3724    6000   1301R     LDB =D-3  LVL
3725   42000     30X     JSX .LDAP
3726    4000              LDB A
3727  174040              TCB
3730   25741  77741A     ADB V32737  IY
3731    1741  77741A     LDA V32737  IY
3732  176403             SBM A383
3733    6000   1301R     LDB =D-3  LVL
3734   42000     30X     JSX .LDAP
3735                    A383 EQU *
3735   22000   3702R     ADA =D1999
3736    6000   1301R     LDB =D-3  LVL
3737   42000     67X     JSX .STAP
3740                    A382 EQU *
3740   42000    113X     JSX DIV4
3741           3312R     DEF =D100
3742   22000   4045R     ADA =D-19
3743   31573  77573A     STA V32635  I
3744    1675  77675A     LDA V15 BLEDS
3745  170605              SAL 6
3746  172424             SAM A384
3747   42000   3322R     JSM P341  RFATV
3750   42000    120X     JSX .TEST
3751           2406R     DEF =D7
3752          77677A     DEF V17 RFAT
3753   72017             RZA A384
3754    1573  77573A     LDA V32635  I
3755   70540              PWC A
3756    1742  77742A     LDA V32738  IX
3757   70540              PWC A
3760   42000   3322R     JSM P341  RFATV
3761   42000    104X     JSX .TURN
3762           2406R     DEF =D7
3763          77677A     DEF V17 RFAT
3764   31677  77677A     STA V17 RFAT
3765   42000   3255R     JSM P337  WRFAT
3766   70760              WWC A
3767   31742  77742A     STA V32738  IX
3770   70760              WWC A
3771   31573  77573A     STA V32635  I
3772                    A384 EQU *
3772    1677  77677A     LDA V17 RFAT
3773   52000   2406R     AND =D7
3774  170040              TCA
3775   21573  77573A     ADA V32635  I
3776   70540              PWC A
3777   42000   2070R     JSM P261  IFBW
4000  170040              TCA
4001   22000   1704R     ADA =D6
4002  170140              CMA
4003  170516              SAR 15
4004  170600              SAL 1
4005   42000     57X     JSX ADD4T
4006   22000   2204R     ADA =D10
4007   31573  77573A     STA V32635  I
4010   42000   3406R     JSM P348  RFLC
4011   31572  77572A     STA V32634  J
4012    6000   1301R     LDB =D-3  LVL
4013   42000     30X     JSX .LDAP
4014   42000    113X     JSX DIV4
4015           3312R     DEF =D100
4016   70540              PWC A
4017    6000   1301R     LDB =D-3  LVL
4020   42000     30X     JSX .LDAP
4021   21572  77572A     ADA V32634  J
4022   42000    113X     JSX DIV4
4023           3312R     DEF =D100
4024   42000    116X     JSX SUB4T
4025  172021             SAP A385
4026    1742  77742A     LDA V32738  IX
4027   22000   3702R     ADA =D1999
4030   70540              PWC A
4031    6000   1301R     LDB =D-3  LVL
4032   42000     30X     JSX .LDAP
4033   21572  77572A     ADA V32634  J
4034   42000    116X     JSX SUB4T
4035  172411             SAM A385
4036   55573  77573A     DSZ V32635  I
4037                      NOP
4040   42000   3406R     JSM P348  RFLC
4041   22000   3312R     ADA =D100
4042   31572  77572A     STA V32634  J
4043   66000   4063R     JMP A386
4044    2113
4045  177755
4044                     LII
4046                    A385 EQU *
4046    1742  77742A     LDA V32738  IX
4047   22000   3702R     ADA =D1999
4050   70540              PWC A
```

```
4051     6000   1301R     LDB =D-3  LVL
4052    42000     30X     JSX .LDAP
4053    21572  77572A     ADA V32634   J
4054    42000    116X     JSX SUB4T
4055   172006            SAP A387
4056     1742  77742A     LDA V32738   IX
4057    22000   3702R     ADA =D1999
4060     6000   1301R     LDB =D-3  LVL
4061    42000    117X     JSX SUB4P
4062    31572  77572A     SIA V32634   J
4063                     A387 EQU *
4063                     A386 EQU *
4063     6000   1301R     LDB =D-3  LVL
4064    42000     30X     JSX .LDAP
4065    42000    121X     JSX MOD4
4066            3312R     DEF =D100
4067    21572  77572A     ADA V32634   J
4070    42000    122X     JSX CNV42
4071    42000     34X     JSX .STRD
4072           77655A     DEF V32685  LTEMP2
4073     1660  77660A     LDA V36 BCDC
4074   170507             SAR 8
4075     6000   4167R     LDB =B240
4076    75617             MPY
4077    21660  77660A     ADA V36 BCDC
4100    42000    104X     JSX .TURN
4101            3242R     DEF =B377
4102           77434A     DEF V32540   IF2
4103    31434  77434A     SIA V32540   IF2
4104     1435  77435A     LDA V32541   IF1
4105   172006            SAP A388
4106     1573  77573A     LDA V32635   I
4107    22000   2276R     ADA =D2
4110    42000     60X     JSX .ARAY
4111            3550R     DEF V369   REFLOG
4112    66000   4116R     JMP A389
4113                     A388 EQU *
4113     1573  77573A     LDA V32635   I
4114    42000     60X     JSX .ARAY
4115            3566R     DEF V374   REFLIN
4116                     A389 EQU *
4116    42000    104X     JSX .TURN
4117            3166R     DEF =B1777
4120           77435A     DEF V32541   IF1
4121    31435  77435A     SIA V32541   IF1
4122    42000   3243R     JSM P335   WIF1
4123     1434  77434A     LDA V32540   IF2
4124    42000    105X     JSX .W5
4125    42000   2303R     JSM P277   GOFSET
4126    70540             PWC A
4127    42000   3406R     JSM P348   RFLC
4130    70540             PWC A
4131    42000     37X     JSX .LDB1
4132           77655A     DEF V32685   LTEMP2
4133    42000     50X     JSX CNV24
4134    70540             PWC A
4135    42000   1665R     JSM P245   RLAD
4136    42000     57X     JSX ADD4I
4137    42000    116X     JSX SUB4I
4140    21706  77706A     ADA V31 ROFSET
4141    42000    116X     JSX SUB4I
4142    22000   4170R     ADA =D-99
4143    70540             PWC A
4144     1677  77677A     LDA V17 RFAT
4145    52000   2406R     AND =D7
4146    21573  77573A     ADA V32635   I
4147    22000   3526R     ADA =D-10
4150    70540             PWC A
4151    42000   2070R     JSM P261   IFBW
4152   170040             TCA
4153    22000   1704R     ADA =D6
4154   170140             CMA
4155   170416             AAR 15
4156   170600             SAL 1
4157    42000     57X     JSX ADD4T
4160     6000   3312R     LDB =D100
4161    75617             MPY
4162    42000     57X     JSX ADD4I
4163    31700  77700A     SIA V22 RLVL
4164     1730  77730A     LDA V30 KFLAG
4165    42000  15050R     JSM P223   AMPU
4166    66000     31X     JMX .RINA
4167      240
4170   177635
4167                      LIT
4171                     P390  EQU * LGDB
4171     6000   1277R     LDB =D-1
4172    42000     27X     JSX .ARGA
4173    42000    104X     JSX .TURN
4174            4207R     DEF =B160000
4175           77435A     DEF V32541   IF1
4176    31435  77435A     SIA V32541   IF1
4177    42000   3243R     JSM P335   WIF1
4200     2000   1704R     LDA =D6
4201    42000   2314R     JSM P279   SBLK
4202    42000   3221R     JSM P333   CORREK
4203   172003             SAP A391
4204     1700  77700A     LDA V22 RLVL
4205    42000   3530R     JSM P355   REFLEV
4206                     A391 EQU *
```

```
4206  66000      31X    JMX .RINA
4207 160000
4207                    LIT
4210                   P392  EQU * IFBWOUT
4210   6000    1277R    LDB =D-1
4211  42000      27X    JSX .ARGA
4212   1572   77572A    LDA V32634   J
4213  70540             PWC A
4214   1434   77434A    LDA V32540   IF2
4215  70540             PWC A
4216   6000    1301R    LDB =D-3   I
4217  42000      30X    JSX .LDAP
4220 170040             TCA
4221  22000    1704R    ADA =D6
4222 172006             SAP A393
4223   6000    1301R    LDB =D-3   I
4224  42000      30X    JSX .LDAP
4225  22000    2276R    ADA =D2
4226   6000    1301R    LDB =D-3   I
4227  42000      67X    JSX .STAP
4230                   A393 EQU *
4230   6000    1301R    LDB =D-3   I
4231  42000      30X    JSX .LDAP
4232 170613             SAL 12
4233  42000     104X    JSX .TURN
4234           4256R    DEF =B170000
4235          77434A    DEF V32540   IF2
4236  31434   77434A    STA V32540   IF2
4237   6000    2172R    LDB =D13
4240  42000     107X    JSX .WS5
4241  70760             WWC A
4242  31572   77572A    STA V32634   J
4243  11434   77434A    CPA V32540   IF2
4244  66000    4310R    JMP A394
4245  42000    2762R    JSM P314   AVGRST
4246  42000    3221R    JSM P333   CORREK
4247 172010             SAP A395
4250   1700   77700A    LDA V22 RLVL
4251  42000    3530R    JSM P355   REFLEV
4252  42000      37X    JSX .LDB1
4253          77665A    DEF V8   CFREQ
4254  42000    6750R    JSM P222   TUNE
4255  66000    4306R    JMP A396
4256 170000
4256                    LIT
4257                   A395 EQU *
4257   1572   77572A    LDA V32634   J
4260 170513             SAR 12
4261  31572   77572A    STA V32634   J
4262   6000    1301R    LDB =D-3   I
4263  42000      30X    JSX .LDAP
4264 170040             TCA
4265  22000    1704R    ADA =D6
4266 172005             SAP A399
4267   1572   77572A    LDA V32634   J
4270 170040             TCA
4271  22000    1704R    ADA =D6
4272 172012             SAP A398
4273                   A399 EQU *
4273   6000    1301R    LDB =D-3   I
4274  42000      30X    JSX .LDAP
4275 170040             TCA
4276  22000    1704R    ADA =D6
4277 172407             SAM A397
4300   1572   77572A    LDA V32634   J
4301 170040             TCA
4302  22000    1704R    ADA =D6
4303 172003             SAP A397
4304                   A398 EQU *
4304   1700   77700A    LDA V22 RLVL
4305  42000    3530R    JSM P355   REFLEV
4306                   A397 EQU *
4306                   A396 EQU *
4306   2000    1457R    LDA =D1
4307  42000    2314R    JSM P279   SBLK
4310                   A394 EQU *
4310  42000    3233R    JSM P334   IFSAV
4311  70760             WWC A
4312  31572   77572A    STA V32634   J
4313  66000      31X    JMX .RINA
4314                   P400   EQU * VBWOUT
4314   6000    1277R    LDB =D-1
4315  42000      27X    JSX .ARGA
4316   1434   77434A    LDA V32540   IF2
4317  70540             PWC A
4320   6000    1301R    LDB =D-3   I
4321  42000      30X    JSX .LDAP
4322 170040             TCA
4323  22000    1704R    ADA =D6
4324 172006             SAP A401
4325   6000    1301R    LDB =D-3   I
4326  42000      30X    JSX .LDAP
4327  22000    2276R    ADA =D2
4330   6000    1301R    LDB =D-3   I
4331  42000      67X    JSX .STAP
4332                   A401 EQU *
4332   6000    1301R    LDB =D-3   I
4333  42000      30X    JSX .LDAP
4334 170607             SAL 8
4335  42000     104X    JSX .TURN
```

```
4336               4355R     DEF =B7400
4337              77434A     DEF V32540   IF2
4340    31434     77434A     STA V32540   IF2
4341     6000      2172R     LDB =D13
4342    42000       107X     JSX .WS5
4343    70760                WAC A
4344     6000      1301R     LDB =D-3   I
4345    42000        67X     JSX .STAP
4346    11434     77434A     CPA V32540   IF2
4347    66000      4351R     JMP A402
4350    42000      2762R     JSM P314   AVGRSI
4351                        A402 EQU *
4351     2000      2276R     LDA =D2
4352    42000      2314R     JSM P279   SBLK
4353    42000      3233R     JSM P334   IFSAV
4354    66000        31X     JMX .RINA
4355     7400
4355                        LIT
4356                        P403  EQU * EXPSIX
4356     6000      1277R     LDB =D-1
4357    42000        27X     JSX .ARGA
4360    42000        33X     JSX .UPC4
4361   170040                TCA
4362   172404               SAM A404
4363    42000        53X     JSX .LDSI
4364               1463R     DEF =D0
4365    66000      4410R     JMP A405
4366                        A404 EQU *
4366     6000      1301R     LDB =D-3   ST
4367    42000        30X     JSX .LDAP
4370    22000      1277R     ADA =D-1
4371    42000       113X     JSX DIV4
4372               1704R     DEF =D6
4373    22000      1277R     ADA =D-1
4374    70540                PWC A
4375     6000      1301R     LDB =D-3   SI
4376    42000        30X     JSX .LDAP
4377    22000      1277R     ADA =D-1
4400    42000       121X     JSX MOD4
4401               1704R     DEF =D6
4402    22000      1457R     ADA =D1
4403    42000        60X     JSX .ARAY
4404                552R     DEF V189   LG1B
4405    42000        61X     JSX .LDSA
4406    70761                WWC B
4407    42000       123X     JSX .DSFI
4410                        A405 EQU *
4410    66000        31X    JMX .RINA
4411                        P406  EQU * EXP2
4411     6000      1277R     LDB =D-1
4412    42000        27X     JSX .ARGA
4413    42000        33X     JSX .UPC4
4414   170600                SAL 1
4415    22000      1277R     ADA =D-1
4416    42000      4356R     JSM P403   EXPSIX
4417    66000        31X    JMX .RINA
4420                        P407  EQU * EXP3
4420     6000      1277R     LDB =D-1
4421    42000        27X     JSX .ARGA
4422    42000        33X     JSX .UPC4
4423     6000      2107R     LDB =D3
4424    75617                MPY
4425    22000      1457R     ADA =D1
4426    42000      4356R     JSM P403   EXPSIX
4427    66000        31X    JMX .RINA
4430                        P408  EQU * LGSCL
4430   174517                CLB
4431    42000        56X     JSX .ARGS
4432    44016        16A     ISZ C
4433     1435     77435A     LDA V32541   IF1
4434   170514                SAR 13
4435    52000      2107R     AND =D3
4436   170040                TCA
4437    22000      2411R     ADA =D4
4440    42000      4411R     JSM P406   EXP2
4441    42000        50X     JSX CNV24
4442    66000        31X    JMX .RINA
4443                        P409  EQU * DBMA
4443     6000      1277R     LDB =D-1
4444    42000        27X     JSX .ARGA
4445    42000        33X     JSX .UPC4
4446    42000      4430R     JSM P408   LGSCL
4447    70540                PWC A
4450     6000      1301R     LDB =D-3   ADC
4451    42000        30X     JSX .LDAP
4452   170604                SAL 5
4453   170404                AAR 5
4454   170040                TCA
4455    22000      4470R     ADA =D1000
4456    42000       114X     JSX MPY4I
4457    42000       122X     JSX CNV42
4460    42000        36X     JSX .SAR2
4461     1700     77700A     LDA V22 RLVL
4462    42000       122X     JSX CNV42
4463     2000      1463R     LDA =D0
4464    75541                MLY
4465    42000       124X     JSX SUB21
4466    42000      1705R     JSM P246   DBSHFT
4467    66000        31X    JMX .RINA
4470     1750
```

```
4470                          LIT
4471                          P410  EQU * DBMNV
4471    6000     1277R           LDB =D-1
4472   42000       27X           JSX .ARGA
4473   42000       33X           JSX .UPC4
4474    1435    77435A           LDA V32541   IF1
4475  172402                     SAM *+2
4476   66000     4535R           JMP A411
4477    6000     1301R           LDB =D-3   A
4500   42000       30X           JSX .LDAP
4501   42000     4443R           JSM P409   DBMA
4502   42000       36X           JSX .SAR2
4503    1675    77675A           LDA V15 BLEDS
4504  170615                     SAL 14
4505  172010                     SAP A412
4506   42000     2070R           JSM P261   IFBW
4507   42000      125X           JSX CNV43
4510   42000      126X           JSX MPY3
4511             4532R           DEF =H500
4512   42000      127X           JSX MIN3
4513             1300R           DEF =H200
4514   66000     4517R           JMP A413
4515                          A412 EQU *
4515   42000       53X           JSX .LDS1
4516             1463R           DEF =D0
4517                          A413 EQU *
4517   42000      130X           JSX ADD2T
4520    6000     2107R           LDB =D3 DBMNV
4521   42000       43X           JSX .STBP
4522    1730    77730A           LDA V30 KFLAG
4523   52000     4533R           AND =B140000
4524   22000     4534R           ADA =B40000
4525   72004                     RZA A414
4526   42000     1736R           JSM P248   NANOV
4527    6000     2107R           LDB =D3 DBMNV
4530   42000       43X           JSX .STBP
4531                          A414 EQU *
4531   66000     4622R           JMP A415
4532    2400
4533  140000
4534   40000
4532                          LIT
4535                          A411 EQU *
4535    1700    77700A           LDA V22 RLVL
4536    6000     2204R           LDB =D10
4537   75617                     MPY
4540   42000      122X           JSX CNV42
4541   42000     1705R           JSM P246   DBSHFT
4542   42000     1736R           JSM P248   NANOV
4543   42000       62X           JSX CNV21
4544   42000       41X           JSX MPY1
4545             4623R           DEF =F1.0E-3
4546   42000       36X           JSX .SAR2
4547    6000     1301R           LDB =D-3   A
4550   42000       30X           JSX .LDAP
4551  170604                     SAL 5
4552  170404                     AAR 5
4553   42000       45X           JSX CNV41
4554   42000       64X           JSX MPY1T
4555   42000       65X           JSX CNV12
4556    6000     2107R           LDB =D3 DBMNV
4557   42000       43X           JSX .STBP
4560    1675    77675A           LDA V15 BLEDS
4561  170615                     SAL 14
4562  172405                     SAM A417
4563    1730    77730A           LDA V30 KFLAG
4564  170515                     SAR 14
4565   12000     2107R           CPA =D3
4566   66000     4622R           JMP A416
4567                          A417 EQU *
4567    6000     2107R           LDB =D3 DBMNV
4570   42000       66X           JSX .LDBP
4571   42000     2001R           JSM P251   DBM
4572   42000       36X           JSX .SAR2
4573    1675    77675A           LDA V15 BLEDS
4574  170615                     SAL 14
4575  172010                     SAP A418
4576   42000     2070R           JSM P261   IFBW
4577   42000      125X           JSX CNV43
4600   42000      126X           JSX MPY3
4601             4532R           DEF =H500
4602   42000      127X           JSX MIN3
4603             4627R           DEF =H55
4604   66000     4607R           JMP A419
4605                          A418 EQU *
4605   42000       53X           JSX .LDS1
4606             1463R           DEF =D0
4607                          A419 EQU *
4607   42000      130X           JSX ADD2T
4610    6000     2107R           LDB =D3 DBMNV
4611   42000       43X           JSX .STBP
4612    1730    77730A           LDA V30 KFLAG
4613  170515                     SAR 14
4614   12000     2107R           CPA =D3
4615   66000     4617R           JMP *+2
4616   66000     4622R           JMP A420
4617   42000     1736R           JSM P248   NANOV
4620    6000     2107R           LDB =D3 DBMNV
4621   42000       43X           JSX .STBP
4622                          A420 EQU *
```

```
4622                      A416 EQU *
4622                      A415 EQU *
4622  66000     131X        JMX .RINB
4623 1.06-3
4627    125
4623                        LIT
4630                      P421  EQU * RDBMV
4630   6000    1277R        LDB =D-1
4631  42000      27X        JSX .ARGA
4632  42000      33X        JSX .OPC4
4633   1675   77675A        LDA V15 BLEDS
4634  62000    2411R        IOR =D4
4635  31675   77675A        STA V15 BLEDS
4636   6000    1301R        LDB =D-3  A
4637  42000      30X        JSX .LDAP
4640  42000    4471R        JSM P410  DBMNV
4641  42000      62X        JSX CNV21
4642  42000      34X        JSX .STRD
4643              77742A    DEF V32738  X
4644   1675   77675A        LDA V15 BLEDS
4645  52000    2153R        AND =B177773
4646  31675   77675A        STA V15 BLEDS
4647   1730   77730A        LDA V30 KFLAG
4650 170515                 SAR 14
4651   4000                 LDB A
4652  26000    1301R        ADB =B177775
4653   2000    4663R        LDA =B1100
4654  76402                SZB A422
4655   2000    2410R        LDA =B200
4656                      A422 EQU *
4656 170040                 TCA
4657  21742   77742A        ADA V32738  IX
4660  31742   77742A        STA V32738  IX
4661  30020      20A        STA V1  AR2
4662  66000      31X      JMX .RINA
4663   1100
4663                        LIT
4664                      P423  EQU * VDCOP
4664  66000    4730R        JMP A424
4665                      I425 EQU *
4665                      D426  OCT 0,1010,103425,10000 20887151000
4671                      D427  OCT 0,1421,13424,4210 31117140888
4675                      D428  OCT 0,1050,103064,41042 22886344222
4701                      D429  OCT 0,1461,13064,51042  33116345222
4705                      D430  OCT 0,51104,43424,24210 524447142888
4711                      D431  OCT 0,51124,43425,30000 525447153000
4715                      D432  OCT 0,73050,103024,43146  762886144666
4721                      D433  OCT 0,73010,103424,13567  760887141777
4725               4665R  V434 DEF I425 NXIVDC
4726                        OCT 177777  177777
4727                        OCT 40  40
4730                      A424  EQU *
4730   5702   77702A        LDB V24 VIDCON
4731 174603                 SBL 4
4732   2000    5015R        LDA =B4007
4733 176010                SBP A435
4734   1566   77566A        LDA V32630  KEYCODE
4735  22000    5016R        ADA =B-141
4736  70540                 PWC A
4737  42000      37X        JSX .LDBI
4740               5017R    DEF =F887007887007
4741  70761                 WWC B
4742  42000     132X        JSX .FDIG
4743                      A435 EQU *
4743  31572   77572A        STA V32634  J
4744  12000    2203R        CPA =D8
4745  66000    4747R        JMP *+2
4746  66000    4751R        JMP A436
4747   2000    5015R        LDA =B4007
4750  31572   77572A        STA V32634  J
4751                      A436 EQU *
4751   1566   77566A        LDA V32630  KEYCODE
4752  22000    5016R        ADA =B-141
4753  70540                 PWC A
4754   1702   77702A        LDA V24 VIDCON
4755 170603                 SAL 4
4756 172012                SAP A437
4757   1676   77676A        LDA V16 TLEDS
4760 170610                 SAL 9
4761 172004                SAP A438
4762  42000      37X        JSX .LDBI
4763               5023R    DEF =F768888148888
4764  66000    4767R        JMP A439
4765                      A438 EQU *
4765  42000      37X        JSX .LDBI
4766               5027R    DEF =F288888148888
4767                      A439 EQU *
4767  66000    4776R        JMP A440
4770                      A437 EQU *
4770   1702   77702A        LDA V24 VIDCON
4771  52000    2406R        AND =D7
4772  22000    1457R        ADA =D1
4773  42000     133X        JSX .LRAY
4774               4725R    DEF V434  NXIVDC
4775  42000     134X        JSX .LDBA
4776                      A440 EQU *
4776  70761                 WWC B
4777  42000     132X        JSX .FDIG
5000  31573   77573A        STA V32635  I
5001 170613                 SAL 12
```

```
5002 172004              SAP A441
5003   1702    77702A     LDA V24 VIDCON
5004  62000     2277R     IOR =B4000
5005  66000     5012R     JMP A442
5006                     A441 EQU *
5006   1573    77573A     LDA V32635  I
5007  42000      104X     JSX .TURN
5010           77572A     DEF V32634  J
5011           77702A     DEF V24 VIDCON
5012                     A442 EQU *
5012  31702    77702A     STA V24 VIDCON
5013  42000     2650R     JSM P304  UNCAL
5014 170201               RET 1
5015   4007
5016 177637
5017 887007887007
5023 766888148888
5027 288888148888
5015                      LIT
5033                     P443  EQU * CPERIOD
5033 174517               CLB
5034  42000       56X     JSX .ARGS
5035  44016       16A     ISZ C
5036   5730    77730A     LDB V30 KFLAG
5037 174005               SBL 6
5040   1577    77577A     LDA V32639  CIBASE
5041 176412              SBM A444
5042  42000       37X     JSX .LDBI
5043            5054R     DEF =F443020000000
5044   5605    77605A     LDB V32645  SCANSL
5045  42000      132X     JSX .FDIG
5046  70540               RWC A
5047   1604    77604A     LDA V32644  SAIN
5050 170515               SAR 14
5051  52000     1457R     AND =D1
5052  42000       57X     JSX ADD4T
5053                     A444 EQU *
5053  66000       31X     JMX .RTNA
5054 443020000000
5054                      LIT
5060                     P445  EQU * WCNT
5060                     A446 EQU *
5060   6000     2276R     LDB =D2
5061  42000      110X     JSX .RS7
5062  31572    77572A     STA V32634  J
5063 170612               SAL 11
5064 172014              SAP A447
5065  76213              SSS A447
5066  76772              SHC A446
5067   1575    77575A     LDA V32637  K
5070 170500               SAR 1
5071  12000     1457R     CPA =D1
5072  66000     5074R     JMP *+2
5073  66000     5060R     JMP A446
5074   1572    77572A     LDA V32634  J
5075  52000     2406R     AND =D7
5076  22000     5115R     ADA =D-7
5077 172061              SAP A446
5100                     A447 EQU *
5100  76216              SSS A448
5101   1572    77572A     LDA V32634  J
5102 170612               SAL 11
5103 172013              SAP A449
5104   2000     1457R     LDA =D1
5105  42000     3214R     JSM P332  WAIT
5106   1575    77575A     LDA V32637  K
5107 170600               SAL 1
5110  42000      104X     JSX .TURN
5111            1704R     DEF =D6
5112           77616A     DEF V32654  XFLAG
5113  31616    77616A     STA V32654  XFLAG
5114  66000    32476R     JMP L193  RESET
5115 177771
5115                      LIT
5116                     A449 EQU *
5116                     A448 EQU *
5116 170201               RET 1
5117                     P450  EQU * COUNTIF
5117   6000     1277R     LDB =D-1
5120  42000       27X     JSX .ARGA
5121  42000       33X     JSX .UFC4
5122  42000       53X     JSX .LDSI
5123            1463R     DEF =D0
5124  42000       34X     JSX .STRD
5125           77655A     DEF V32665  LTEMP2
5126   6000     1301R     LDB =D-3  N
5127  42000       30X     JSX .LDAP
5130  12000     1704R     CPA =D6
5131  66000     5133R     JMP *+2
5132  66000     5140R     JMP A451
5133   1605    77605A     LDA V32645  SCANSL
5134  52000     2276R     AND =D2
5135  22000     1457R     ADA =D1
5136  31573    77573A     STA V32635  I
5137  66000     5213R     JMP A452
5140                     A451 EQU *
5140   1616    77616A     LDA V32654  XFLAG
5141 170613               SAL 12
5142 172016              SAP A453
5143   2000     1704R     LDA =D6
```

```
5144  70540              PWC A
5145  42000    5033R     JSM P443  CPERIOD
5146  70540              PWC A
5147   6000    1301R     LDB =D-3  N
5150  42000      30X     JSX .LDAP
5151  22000    1301R     ADA =D-3
5152  42000     135X     JSX .NEGL
5153 170516              SAR 15
5154  42000      57X     JSX ADD4I
5155  42000    2132R     JSM P265  LIMIT
5156  31573   77573A     STA V32635  I
5157  66000    5213R     JMP A454
5160                    A453 EQU *
5160   5605   77605A     LDB V32645  SCANSL
5161   1600   77600A     LDA V32640  CTIM
5162  76005              RZB A455
5163  42000    2070R     JSM P261  TFBW
5164 170500              SAR 1
5165 170040              TCA
5166  22000    2565R     ADA =D11
5167                    A455 EQU *
5167  31573   77573A     STA V32635  I
5170   6000    1301R     LDB =D-3  N
5171  42000      30X     JSX .LDAP
5172  12000    2107R     CPA =D3
5173  66000    5175R     JMP *+2
5174  66000    5204R     JMP A456
5175   2000    2276R     LDA =D2
5176  70540              PWC A
5177   1573   77573A     LDA V32635  I
5200  22000    5115R     ADA =D-7
5201  42000    2132R     JSM P265  LIMIT
5202  22000    2107R     ADA =D3
5203  66000    5212R     JMP A457
5204                    A456 EQU *
5204   2000    2405R     LDA =D5
5205  70540              PWC A
5206   1573   77573A     LDA V32635  I
5207  22000    1363R     ADA =D-4
5210  42000    2132R     JSM P265  LIMIT
5211  22000    1457R     ADA =D1
5212                    A457 EQU *
5212  31573   77573A     STA V32635  I
5213                    A454 EQU *
5213                    A452 EQU *
5213 170601              SAL 2
5214  70540              PWC A
5215   6000    1301R     LDB =D-3  N
5216  42000      30X     JSX .LDAP
5217  52000    2107R     AND =D3
5220  42000     136X     JSX .OR1
5221   6000    2405R     LDB =D5
5222  42000      75X     JSX .WS4
5223  42000    5060R     JSM P445  WCN1
5224   6000    2405R     LDB =D5
5225  42000      74X     JSX .RS5
5226  31657   77657A     STA V35 BCDB
5227  42000     137X     JSX .R6
5230  31660   77660A     STA V36 BCDC
5231  76604              SSC A458
5232  42000      37X     JSX .LDBI
5233           5246R     DEF =F20000000
5234  66000    5245R     JMP A459
5235                    A458 EQU *
5235   1573   77573A     LDA V32635  I
5236 170040              TCA
5237  22000    1704R     ADA =D6
5240  70540              PWC A
5241  42000      37X     JSX .LDBI
5242          77655A     DEF V32685  LTEMP2
5243  70761              WWC B
5244  42000      51X     JSX .DLFT
5245                    A459 EQU *
5245  66000      31X     JMX .RINA
5246 20000000
5246                     LIT
5252                    P460  EQU * YIGSLEW
5252 174517              CLB
5253  42000      56X     JSX .ARGS
5254  42000      33X     JSX .UPC4
5255   2000    1704R     LDA =D6
5256  42000    5117R     JSM P450  COUNTIF
5257  42000      34X     JSX .STRD
5260          77655A     DEF V32685  LTEMP2
5261   1573   77573A     LDA V32635  I
5262 170040              TCA
5263  22000    1704R     ADA =D6
5264  70540              PWC A
5265  42000      53X     JSX .LDSI
5266           1457R     DEF =D1
5267  70761              WWC B
5270  42000      51X     JSX .DLFT
5271  42000      34X     JSX .STRD
5272          77661A     DEF V32689  LTEMP1
5273  42000      53X     JSX .LDSI
5274           1463R     DEF =D0
5275   6000    2107R     LDB =D3 YIGSLEW
5276  42000      43X     JSX .STBP
5277   2000    1463R     LDA =D0
5300  31567   77567A     STA V32631  KEYCOL
```

```
5301                        A461 EQU *
5301   42000      37X         JSX .LDBI
5302          77655A          DEF V32685  LTEMP2
5303    6000   2107R          LDB =D3 YIGSLEW
5304   42000      63X         JSX MIN2P
5305    4020      20A         LDB AR2
5306   77202                  SLB *+2,C
5307   34020      20A         STB AR2
5310   42000     140X         JSX MIN2
5311          77661A          DEF V32689  LTEMP1
5312    4020      20A         LDB AR2
5313   77407                 RLB A463
5314   42000      37X         JSX .LDBI
5315           5340R          DEF =F8000000
5316   42000     140X         JSX MIN2
5317          77655A          DEF V32685  LTEMP2
5320    4020      20A         LDB AR2
5321   77024                 SLB A462
5322                        A463 EQU *
5322    1567  77567A          LDA V32631  KEYCOL
5323   22000   5344R          ADA =D-4000
5324  172021                 SAP A462
5325   45567  77567A          ISZ V32631  KEYCOL
5326                          NOP
5327   42000      37X         JSX .LDBI
5330          77655A          DEF V32685  LTEMP2
5331    6000   2107R          LDB =D3 YIGSLEW
5332   42000      43X         JSX .STBP
5333    2000   1704R          LDA =D6
5334   42000   5117R          JSM P450  COUNTIF
5335   42000      34X         JSX .STRD
5336          77655A          DEF V32685  LTEMP2
5337   66000   5301R          JMP A461
5340 80000000
5344  170140
5340                         LII
5345                        A462 EQU *
5345   42000      37X         JSX .LDBI
5346          77655A          DEF V32685  LTEMP2
5347   66000      31X         JMX .RTNA
5350                        P464  EQU * SRQM
5350    1740  77740A          LDA V32736  EFLAG
5351  170604                 SAL 5
5352  172404                 SAM A465
5353    2000   1364R          LDA =B100
5354    6000   2411R          LDB =D4
5355   42000     112X         JSX .WS7
5356                        A465 EQU *
5356  170201                  RET 1
5357                        P466  EQU * NOLOCK
5357    2000   1463R          LDA =D0
5360   31573  77573A          STA V32635  I
5361                        A467 EQU *
5361   45573  77573A          ISZ V32635  I
5362                          NOP
5363    1573  77573A          LDA V32635  I
5364  170040                  TCA
5365   22000   3654R          ADA =D16
5366    4000                  LDB A
5367    2000   1457R          LDA =D1
5370   42000     141X         JSX .SLFT
5371   51602  77602A          AND V32642  LKMSK
5372    6000   2107R          LDB =D3
5373   42000     107X         JSX .WS5
5374    6000   2276R          LDB =D2
5375   42000     110X         JSX .RS7
5376   31572  77572A          STA V32634  J
5377   52000   2406R          AND =D7
5400   12000   2406R          CPA =D7
5401   66000   5406R          JMP A468
5402    1573  77573A          LDA V32635  I
5403  170040                  TCA
5404   22000   1704R          ADA =D6
5405  172054                 SAP A467
5406                        A468 EQU *
5406    1573  77573A          LDA V32635  I
5407  170040                  TCA
5410   22000   2276R          ADA =D2
5411  172024                 SAP A469
5412    1573  77573A          LDA V32635  I
5413   22000   2417R          ADA =D-6
5414  172021                 SAP A469
5415    1573  77573A          LDA V32635  I
5416   70540                  PWC A
5417   42000   5350R          JSM P464  SRQM
5420    1573  77573A          LDA V32635  I
5421  170040                  TCA
5422   22000   3654R          ADA =D16
5423    4000                  LDB A
5424    1602  77602A          LDA V32642  LKMSK
5425   42000     142X         JSX .RBIT
5426   31602  77602A          STA V32642  LKMSK
5427    1573  77573A          LDA V32635  I
5430  170040                  TCA
5431   22000   5515R          ADA =D30
5432   42000   2501R          JSM P295  BLINK
5433   70760                  WWC A
5434   31573  77573A          STA V32635  I
5435                        A469 EQU *
5435    1573  77573A          LDA V32635  I
```

```
5436   66000   5540R     JMP A470
5437                    C471 EQU *
5437    2000   3166R     LDA =D1023
5440   70540             PWC A
5441    1613  77613A     LDA V32651   DAC4
5442   22000   1301R     ADA =D-3
5443   42000   2132R     JSM P265   LIMIT
5444   31613  77613A     STA V32651   DAC4
5445    6000   1463R     LDB =D0
5446   42000    112X     JSX .WS7
5447   72005            RZA A472
5450    1602  77602A     LDA V32642   LKMSK
5451   52000   5516R     AND =B37777
5452   62000   4534R     IOR =B40000
5453   31602  77602A     STA V32642   LKMSK
5454                    A472 EQU *
5454    2000   2405R     LDA =D5
5455   42000   3214R     JSM P332   WAIT
5456   66000   5541R     JMP A473
5457                    C474 EQU *
5457    2000   3166R     LDA =D1023
5460   70540             PWC A
5461    1613  77613A     LDA V32651   DAC4
5462   22000   2107R     ADA =D3
5463   42000   2132R     JSM P265   LIMIT
5464   31613  77613A     STA V32651   DAC4
5465    6000   1463R     LDB =D0
5466   42000    112X     JSX .WS7
5467   12000   3166R     CPA =D1023
5470   66000   5472R     JMP *+2
5471   66000   5476R     JMP A475
5472    1602  77602A     LDA V32642   LKMSK
5473   52000   5516R     AND =B37777
5474   62000   5517R     IOR =B100000
5475   31602  77602A     STA V32642   LKMSK
5476                    A475 EQU *
5476    2000   2405R     LDA =D5
5477   42000   3214R     JSM P332   WAIT
5500   66000   5541R     JMP A473
5501                    C476 EQU *
5501   42000   2154R     JSM P269   WSPIN
5502   66000   5541R     JMP A473
5503                    C477 EQU *
5503    2000   5520R     LDA =D24
5504   42000   2501R     JSM P295   BLINK
5505    1616  77616A     LDA V32654   XFLAG
5506  170610             SAL 9
5507  172013            SAP A478
5510   42000   5350R     JSM P464   SRQM
5511    1602  77602A     LDA V32642   LKMSK
5512   52000   5521R     AND =B175777
5513   31602  77602A     STA V32642   LKMSK
5514   66000   5530R     JMP A479
5515      30
5516   37777
5517  100000
5520      30
5521  175777
5515                     LIT
5522                    A478 EQU *
5522    1616  77616A     LDA V32654   XFLAG
5523   62000   1364R     IOR =B100
5524   31616  77616A     STA V32654   XFLAG
5525   42000     37X     JSX .LDB1
5526          77665A     DEF V8   CFREQ
5527   42000   6750R     JSM P222   TUNE
5530                    A479 EQU *
5530   66000   5541R     JMP A473
5531           5503R     DEF C477
5532           5501R     DEF C476
5533           5541R     DEF A473
5534           5541R     DEF A473
5535           5457R     DEF C474
5536           5437R     DEF C471
5537                     DEC -7
5540   42000    143X    A470  JSX .CASE
5541                    A473 EQU *
5541    1602  77602A     LDA V32642   LKMSK
5542    6000   2107R     LDB =D3
5543   42000    107X     JSX .WS5
5544  170201             RET 1
5545                    P480  EQU * VIOSLEW
5545  174517             CLB
5546   42000     56X     JSX .ARGS
5547   42000     33X     JSX .UPC4
5550   42000     53X     JSX .LDS1
5551           1463R     DEF =D0
5552    6000   2107R     LDB =D3 VIOSLEW
5553   42000     43X     JSX .STBP
5554    2000   2107R     LDA =D3
5555   42000   5117R     JSM P450   COUNTIF
5556   42000     34X     JSX .STRD
5557          77655A     DEF V32685   LTEMP2
5560    1573  77573A     LDA V32635   I
5561  170040             TCA
5562   22000   1704R     ADA =D6
5563   70540             PWC A
5564   42000     53X     JSX .LDS1
5565           1457R     DEF =D1
5566   70761             WWC B
```

```
5567   42000      51X    JSX .DLFT
5570   42000      36X    JSX .SAR2
5571    1604   77604A    LDA V32644   SATN
5572  172004            SAP A481
5573   42000      53X    JSX .LDS1
5574            1463R    DEF =D0
5575   66000    5600R    JMP A482
5576                    A481 EQU *
5576   42000      53X    JSX .LDS1
5577            1364R    DEF =H40
5600                    A482 EQU *
5600   42000     144X    JSX ADD31
5601   42000      34X    JSX .STRD
5602           77661A    DEF V32689   LTEMP1
5603    2000    1463R    LDA =D0
5604   31567   77567A    STA V32631   KEYCOL
5605                    A483 EQU *
5605    6000    2107R    LDB =D3 VTOSLEW
5606   42000      66X    JSX .LDBP
5607   42000     140X    JSX MIN2
5610           77655A    DEF V32685   LTEMP2
5611    4020      20A    LDB AR2
5612   77202             SLB *+2,C
5613   34020      20A    STB AR2
5614   42000     140X    JSX MIN2
5615           77661A    DEF V32689   LTEMP1
5616    4020      20A    LDB AR2
5617   77022            SLB A484
5620    1567   77567A    LDA V32631   KEYCOL
5621   22000    5640R    ADA =D-200
5622  172017            SAP A484
5623   45567   77567A    ISZ V32631   KEYCOL
5624                     NOP
5625   42000      37X    JSX .LDB1
5626           77655A    DEF V32685   LTEMP2
5627    6000    2107R    LDB =D3 VTOSLEW
5630   42000      43X    JSX .STBP
5631    2000    2107R    LDA =D3
5632   42000    5117R    JSM P450   COUNTIF
5633    2000    2107R    LDA =D3
5634   42000    5117R    JSM P450   COUNTIF
5635   42000      34X    JSX .STRD
5636           77655A    DEF V32685   LTEMP2
5637   66000    5605R    JMP A483
5640  177470
5640                     LIT
5641                    A484 EQU *
5641   42000      37X    JSX .LDB1
5642           77655A    DEF V32685   LTEMP2
5643   66000      31X   JMX .RTNA
5644                    P485  EQU * KSWP
5644    1604   77604A    LDA V32644   SATN
5645   52000    4534R    AND =B40000
5646   62000    1770R    IOR =B20000
5647    6000    1457R    LDB =D1
5650   42000      75X    JSX .WS4
5651  170201             RET 1
5652                    P486  EQU * SWPON
5652    1604   77604A    LDA V32644   SATN
5653    6000    1457R    LDB =D1
5654   42000      75X    JSX .WS4
5655  170201             RET 1
5656                    P487  EQU * VTOTUNE
5656    1605   77605A    LDA V32645   SCANSL
5657   73002            SLA A488
5660   42000    5644R    JSM P485   KSWP
5661                    A488 EQU *
5661    2000    2416R    LDA =D29
5662   42000    2434R    JSM P265   BLKOF
5663    2000    1300R    LDA =D512
5664   31615   77615A    STA V32653   DAC1
5665    2000    1463R    LDA =D0
5666   31573   77573A    STA V32635   I
5667    1605   77605A    LDA V32645   SCANSL
5670   73006            SLA A489
5671    1604   77604A    LDA V32644   SATN
5672   52000    4533R    AND =B140000
5673   62000    1770R    IOR =B20000
5674    6000    1457R    LDB =D1
5675   42000      75X    JSX .WS4
5676                    A489 EQU *
5676                    A490 EQU *
5676    1614   77614A    LDA V32652   DAC2
5677   21573   77573A    ADA V32635   I
5700   31614   77614A    STA V32652   DAC2
5701    1615   77615A    LDA V32653   DAC1
5702    6000    1463R    LDB =D0
5703   42000      75X    JSX .WS4
5704    1614   77614A    LDA V32652   DAC2
5705   42000     105X    JSX .W5
5706   42000    5545R    JSM P480   VTOSLEW
5707   42000     145X    JSX SUB2
5710           77641A    DEF V32673   VTOFREQ
5711   42000      34X    JSX .STRD
5712           77655A    DEF V32685   LTEMP2
5713   42000     146X    JSX DIV3
5714            5741R    DEF =H7500
5715   42000      50X    JSX CNV24
5716   31573   77573A    STA V32635   I
5717   72404            SZA A491
```

```
5720    1614   77614A     LDA V32652  DAC2
5721   52000    5742R     AND =B176000
5722   72454             SZA A490
5723                     A491 EQU *
5723    1614   77614A     LDA V32652  DAC2
5724   52000    5742R     AND =B176000
5725   72416             SZA A492
5726    2000    3166R     LDA =D1023
5727   70540              PWC A
5730    1614   77614A     LDA V32652  DAC2
5731   42000    2132R     JSM P265  LIMIT
5732   31614   77614A     STA V32652  DAC2
5733    6000    1463R     LDB =D0
5734   42000     107X     JSX .WS5
5735    2000    2416R     LDA =D29
5736   42000    2501R     JSM P295   BLINK
5737   42000    5350R     JSM P464   SRQM
5740   66000    5755R     JMP A493
5741   72400
5742  176000
5741                      LIT
5743                     A492 EQU *
5743    2000    3166R     LDA =D1023
5744   70540              PWC A
5745   42000      37X     JSX .LDB1
5746           77655A     DEF V32685  LTEMP2
5747   42000      50X     JSX CNV24
5750   42000     113X     JSX DIV4
5751            3654R     DEF =D16
5752   22000    1300R     ADA =D512
5753   42000    2132R     JSM P265  LIMIT
5754   31615   77615A     STA V32653  DAC1
5755                     A493 EQU *
5755    1615   77615A     LDA V32653  DAC1
5756    6000    1463R     LDB =D0
5757   42000      75X     JSX .WS4
5760    1605   77605A     LDA V32645  SCANSL
5761   73002             SLA A494
5762   42000    5652R     JSM P486  SWPON
5763                     A494 EQU *
5763  170201              RET 1
5764                     P495  EQU * FRQC
5764  174517              CLB
5765   42000      56X     JSX .ARGS
5766   42000      33X     JSX .UPC4
5767   42000    3221R     JSM P333  CORREK
5770  172006             SAP A496
5771   42000    2070R     JSM P261   IFBW
5772   42000     133X     JSX .LRAY
5773              12R     DEF V37 BWFRQ
5774   42000     134X     JSX .LDBA
5775   66000    6000R     JMP A497
5776                     A496 EQU *
5776   42000      53X     JSX .LDS1
5777            1463R     DEF =D0
6000                     A497 EQU *
6000   42000     145X     JSX SUB2
6001           77707A     DEF V11 FOFSET
6002   42000      36X     JSX .SAR2
6003    1605   77605A     LDA V32645  SCANSL
6004  170615              SAL 14
6005  172004             SAP A498
6006   42000      53X     JSX .LDS1
6007            6015R     DEF =H7000
6010   66000    6013R     JMP A499
6011                     A498 EQU *
6011   42000      53X     JSX .LDS1
6012            1463R     DEF =D0
6013                     A499 EQU *
6013   42000     130X     JSX ADD2I
6014   66000      31X    JMX .RTNA
6015   70000
6015                      LIT
6016                     P500  EQU * STUNE
6016    6000    1363R     LDB =D-4
6017   42000      32X     JSX .ARGL
6020   42000    5764R     JSM P495   FRQC
6021    6000    1375R     LDB =D-9   MFREG
6022   42000     147X     JSX ADD2P
6023    6000    1375R     LDB =D-9   MFREG
6024   42000      43X     JSX .STBP
6025   42000     150X     JSX ADD2
6026            6102R     DEF =F42500000
6027   42000     151X     JSX DIV2
6030            5246R     DEF =F20000000
6031   42000     152X     JSX CNV23
6032      23      23A     LDA AR2+3
6033   31746   77746A     STA V32742   N
6034    6000    1375R     LDB =D-9   MFREG
6035   42000      66X     JSX .LDBP
6036   42000     150X     JSX ADD2
6037            6106R     DEF =F1400000
6040   42000      36X     JSX .SAR2
6041   42000      53X     JSX .LDS1
6042           77746A     DEF V32742   N
6043   42000     153X     JSX MPY2
6044            5246R     DEF =F20000000
6045   42000     124X     JSX SUB21
6046   42000      34X     JSX .STRD
6047           77661A     DEF V32689  LTEMP1
```

```
6050  42000     37X    JSX .LDB1
6051          6112R    DEF =F4750000
6052  42000    140X    JSX MIN2
6053         77661A    DEF V32689  LTEMP1
6054  42000    151X    JSX DIV2
6055          6116R    DEF =F4000000
6056  42000     50X    JSX CNV24
6057 170040            TCA
6060  22000   2521R    ADA =D17
6061  31570  77570A    STA V32632  M
6062  42000    125X    JSX CNV43
6063  42000    127X    JSX MIN3
6064          6122R    DEF =H17
6065  42000    153X    JSX MPY2
6066          6116R    DEF =F4000000
6067  42000    150X    JSX ADD2
6070          6112R    DEF =F4750000
6071  42000    140X    JSX MIN2
6072         77661A    DEF V32689  LTEMP1
6073  42000    151X    JSX DIV2
6074          6123R    DEF =F250000
6075  42000     50X    JSX CNV24
6076  52000   3527R    AND =D14
6077  31571  77571A    STA V32633  L
6100  42000   2154R    JSM P269  WSPIN
6101  66000     31X    JMX .RTNA
6102 42500000
6106 1400000
6112 4750000
6116 4000000
6122      27
6123 250000
6102                    LTT
6127                   P501  EQU * MKIS
6127 174517              CLB
6130  42000     56X      JSX .ARGS
6131  44016     16A      ISZ C
6132   1723  77723A      LDA V26 MKRMODE
6133  42000    135X      JSX .NEQL
6134  70540              PWC A
6135   1605  77605A      LDA V32645  SCANSL
6136  42000    135X      JSX .NEQL
6137  51675  77675A      AND V15 BLEDS
6140  61616  77616A      IOR V32654  XFLAG
6141 170601              SAL 2
6142  70540              PWC A
6143   1740  77740A      LDA V32736  EFLAG
6144  52000   6157R      AND =B10003
6145  42000    111X      JSX .EQL
6146 170140              CMA
6147  42000    136X      JSX .ORT
6150  42000    154X      JSX .ANDI
6151  70540              PWC A
6152   1730  77730A      LDA V30 KFLAG
6153 170614              SAL 13
6154 170140              CMA
6155  42000    154X      JSX .ANDI
6156  66000     31X     JMX .RTNA
6157  10003
6157                    LTT
6160                   P502  EQU * EOS
6160  42000   5644R      JSM P485  KSWP
6161   1603  77603A      LDA V32643  PLOCK
6162 170603              SAL 4
6163 172002              SAP *+2
6164  66000   6245R      JMP A503
6165   1616  77616A      LDA V32654  XFLAG
6166  52000   2302R      AND =B26
6167  22000   6231R      ADA =B177754
6170  72004             RZA A504
6171  42000     37X      JSX .LDB1
6172         77605A      DEF V8  CFREQ
6173  42000   6016R      JSM P500  STONE
6174                   A504 EQU *
6174   1616  77616A      LDA V32654  XFLAG
6175  52000   6232R      AND =B177761
6176  31616  77616A      STA V32654  XFLAG
6177   1730  77730A      LDA V30 KFLAG
6200 170614              SAL 13
6201 172434             SAM A505
6202  42000   6127R      JSM P501  MKIS
6203 172003             SAP A506
6204   1721  77721A      LDA V25 MRKR
6205  66000   6207R      JMP A507
6206                   A506 EQU *
6206   2000   3112R      LDA =D1001
6207                   A507 EQU *
6207   6000   2221R      LDB =D9
6210  42000     72X      JSX .WS6
6211   2000   1457R      LDA =D1
6212  42000    106X      JSX .W7
6213   1676  77676A      LDA V16 TLEDS
6214  52000   6233R      AND =B600
6215  22000   6234R      ADA =B177200
6216  72007             RZA A506
6217   1702  77702A      LDA V24 VIDCON
6220 170140              CMA
6221  42000    104X      JSX .TURN
6222          1457R      DEF =D1
6223         77702A      DEF V24 VIDCON
```

```
6224  31702   77702A    STA V24 VIDCON
6225                   A508 EQU *
6225   2000    1463R    LDA =D0
6226   6000    2203R    LDB =D8
6227  42000     112X    JSX .WS7
6230  66000    6245R    JMP A509
6231 177754
6232 177761
6233    600
6234 177200
6231                    LIT
6235                   A505 EQU *
6235   2000    6350R    LDA =D4073
6236   6000    2221R    LDB =D9
6237  42000      72X    JSX .WS6
6240   2000    6351R    LDA =D3073
6241  42000     106X    JSX .W7
6242   2000    6352R    LDA =D3072
6243   6000    2203R    LDB =D8
6244  42000     112X    JSX .WS7
6245                   A509 EQU *
6245                   A503 EQU *
6245   1616   77616A    LDA V32654   XFLAG
6246 170603             SAL 4
6247 172002             SAP *+2
6250  66000    6577R    JMP A510
6251   1616   77616A    LDA V32654   XFLAG
6252 170612             SAL 11
6253 172402             SAM *+2
6254  66000    6372R    JMP A511
6255   1603   77603A    LDA V32643   PLOCK
6256  52000    6353R    AND =B7777
6257  62000    6354R    IOR =B150000
6260  31603   77603A    STA V32643   PLOCK
6261  52000    2645R    AND =B137777
6262   6000    1457R    LDB =D1
6263  42000      72X    JSX .WS6
6264   2000    2107R    LDA =D3
6265  42000    3214R    JSM P332   WAIT
6266   2000    2107R    LDA =D3
6267  42000    3214R    JSM P332   WAIT
6270   2000    2107R    LDA =D3
6271  42000    3214R    JSM P332   WAIT
6272   2000    3166R    LDA =D1023
6273  70540             PWC A
6274  42000    5252R    JSM P460   YIGSLEW
6275  42000     145X    JSX SUB2
6276           5246R    DEF =F20000000
6277   6000    2405R    LDB =D5
6300  42000      47X    JSX .DRGT
6301  42000      50X    JSX CNV24
6302  42000     113X    JSX DIV4
6303           2521R    DEF =D17
6304 170040             TCA
6305  21613   77613A    ADA V32651   DAC4
6306  42000    2132R    JSM P265   LIMIT
6307  31613   77613A    STA V32651   DAC4
6310   6000    1463R    LDB =D0
6311  42000     112X    JSX .WS7
6312   2000    5515R    LDA =D30
6313  42000    2434R    JSM P285   BLKOF
6314   1613   77613A    LDA V32651   DAC4
6315   6000    2521R    LDB =D17
6316  75617             MPY
6317  42000     122X    JSX CNV42
6320   6000    2405R    LDB =D5
6321  42000      51X    JSX .DLFT
6322  42000      36X    JSX .SAR2
6323  42000    5764R    JSM P495   FRQC
6324  42000     150X    JSX ADD2
6325          77665A    DEF V8   CFREQ
6326  42000     124X    JSX SUB2T
6327   4020      20A    LDB AR2
6330  77202             SLB *+2,C
6331  34020      20A    STB AR2
6332  42000     140X    JSX MIN2
6333           6355R    DEF =F9000000
6334   4020      20A    LDB AR2
6335  77027             SLB A512
6336   1616   77616A    LDA V32654   XFLAG
6337 170610             SAL 9
6340 172421             SAM A513
6341   1616   77616A    LDA V32654   XFLAG
6342  62000    1364R    IOR =B100
6343  31616   77616A    STA V32654   XFLAG
6344  42000      37X    JSX .LDBI
6345          77665A    DEF V8   CFREQ
6346  42000    6750R    JSM P222   TUNE
6347  66000    6364R    JMP A514
6350   7751
6351   6001
6352   6000
6353   7777
6354 150000
6355 9000000
6350                    LIT
6361                   A513 EQU *
6361   2000    5515R    LDA =D30
6362  42000    2501R    JSM P295   BLINK
6363  42000    5350R    JSM P464   SROM
```

```
6364                    A514 EQU *
6364                    A512 EQU *
6364    1603   77603A    LDA V32643  PLOCK
6365   52000    6371R    AND =B167777
6366   31603   77603A    STA V32643  PLOCK
6367   42000    5252R    JSM P460  TIGSLEW
6370   66000    6374R    JMP A515
6371  167777
6371                     LIT
6372                    A511 EQU *
6372    2000    5515R    LDA =D30
6373   42000    2434R    JSM P285  BLKUP
6374                    A515 EQU *
6374    1603   77603A    LDA V32643  PLOCK
6375    6000    1457R    LDB =D1
6376   42000      72X    JSX .WS6
6377    1605   77605A    LDA V32645  SCANSL
6400   73002            SLA A516
6401   42000    5545R    JSM P480  VIDSLEW
6402                    A516 EQU *
6402    2000    1277R    LDA =B177777
6403   31602   77602A    STA V32642  LKMSK
6404    6000    2107R    LDB =D3
6405   42000     107X    JSX .WS5
6406    1605   77605A    LDA V32645  SCANSL
6407  170040             TCA
6410   22000    1457R    ADA =D1
6411  172003            SAP A517
6412    2000    2107R    LDA =D3
6413   42000    3214R    JSM P332  WAIT
6414                    A517 EQU *
6414    2000    2411R    LDA =D4
6415   42000    3171R    JSM P327  HLDUP
6416    2000    1363R    LDA =B177774
6417   70540             PWC A
6420    2000    5520R    LDA =D24
6421                    A518 EQU *
6421   31572   77572A    STA V32634  J
6422   42000    2434R    JSM P285  BLKUP
6423    2000    1457R    LDA =D1
6424   21572   77572A    ADA V32634  J
6425  144016      16A    ISZ C,I
6426   66000    6421R    JMP A518
6427   54016      16A    DSZ C
6430                    A519 EQU *
6430    6000    2276R    LDB =D2
6431   42000     110X    JSX .RS7
6432   31567   77567A    STA V32631  KEYCOL
6433   52000    6122R    AND =B27
6434   22000    6450R    ADA =B177751
6435   72473            SZA A519
6436                    A520 EQU *
6436    1567   77567A    LDA V32631  KEYCOL
6437   52000    2406R    AND =D7
6440   12000    2406R    CPA =D7
6441   66000    6443R    JMP *+2
6442   66000    6451R    JMP A521
6443   42000    5357R    JSM P466  NOLOCK
6444    6000    2276R    LDB =D2
6445   42000     110X    JSX .RS7
6446   31567   77567A    STA V32631  KEYCOL
6447   66000    6436R    JMP A520
6450  177751
6450                     LIT
6451                    A521 EQU *
6451    1616   77616A    LDA V32654  XFLAG
6452   52000    6512R    AND =B177677
6453   31616   77616A    STA V32654  XFLAG
6454  170612             SAL 11
6455  172402             SAM *+2
6456   66000    6516R    JMP A522
6457    1602   77602A    LDA V32642  LKMSK
6460   52000    6513R    AND =B35777
6461   31602   77602A    STA V32642  LKMSK
6462    6000    2107R    LDB =D3
6463   42000     107X    JSX .WS5
6464    1605   77605A    LDA V32645  SCANSL
6465  170615             SAL 14
6466  172002            SAP A523
6467   42000    3205R    JSM P329  BUSY
6470                    A523 EQU *
6470    2000    2107R    LDA =D3
6471   42000    3214R    JSM P332  WAIT
6472    1603   77603A    LDA V32643  PLOCK
6473   52000    6514R    AND =B77777
6474    6000    1457R    LDB =D1
6475   42000      72X    JSX .WS6
6476    1603   77603A    LDA V32643  PLOCK
6477   52000    6353R    AND =B7777
6500   62000    6515R    IOR =B50000
6501   31603   77603A    STA V32643  PLOCK
6502    6000    1457R    LDB =D1
6503   42000      72X    JSX .WS6
6504   42000    5652R    JSM P486  SWPON
6505    2000    2107R    LDA =D3
6506   42000    3214R    JSM P332  WAIT
6507    2000    2107R    LDA =D3
6510   42000    3214R    JSM P332  WAIT
6511   66000    6576R    JMP A524
6512  177677
```

```
        6513   35777
        6514   77777
        6515   50000
        6512                          LII
        6516                          A522 EQU *
        6516    1604    77604A          LDA V32644   SATN
        6517   52000     4533R          AND =B140000
        6520   62000     1770R          IOR =B20000
        6521    6000     1457R          LDB =D1
        6522   42000      75X           JSX .WS4
        6523    1740    77740A          LDA V32736   EFLAG
        6524   52000     2107R          AND =D3
        6525   72023                  RZA A525
        6526   42000     5545R          JSM P480    VIOSLEW
        6527   42000      145X          JSX GUB2
        6530            77641A          DEF V32673   VIOFREQ
        6531   42000       34X          JSX .STRD
        6532            77655A          DEF V32685   LTEMP2
        6533   42000       50X          JSX CNV24
        6534   42000      113X          JSX DIV4
        6535             3654R          DEF =D16
        6536   21615    77615A          ADA V32653   DAC1
        6537   31615    77615A          STA V32653   DAC1
        6540   52000     5742R          AND =B176000
        6541   72403                  SZA A526
        6542   42000     5656R          JSM P487    VIOTUNE
        6543   66000     6547R          JMP A527
        6544                          A526 EQU *
        6544    1615    77615A          LDA V32653   DAC1
        6545    6000     1463R          LDB =D0
        6546   42000       75X          JSX .WS4
        6547                          A527 EQU *
        6547   66000     6553R          JMP A528
        6550                          A525 EQU *
        6550    1616    77616A          LDA V32654   XFLAG
        6551   62000     2203R          IOR =B10
        6552   31616    77616A          STA V32654   XFLAG
        6553                          A528 EQU *
        6553    1604    77604A          LDA V32644   SATN
        6554   52000     6514R          AND =B77777
        6555    6000     1457R          LDB =D1
        6556   42000       75X          JSX .WS4
        6557    2000     2276R          LDA =D2
        6560   42000     3214R          JSM P332   WAIT
        6561   42000     5652R          JSM P486   SWPON
        6562   42000     5545R          JSM P480   VIOSLEW
        6563    1616    77616A          LDA V32654  XFLAG
        6564   52000     1375R          AND =B177767
        6565   31616    77616A          STA V32654  XFLAG
        6566    2000     2405R          LDA =D5
        6567   42000     3171R          JSM P327   HLDOF
        6570                          A529 EQU *
        6570    6000     2276R          LDB =D2
        6571   42000      110X          JSX .RS7
        6572   31567    77567A          STA V32631   KEYCOD
        6573   52000     6122R          AND =B27
        6574   22000     6450R          ADA =B177751
        6575   72473                  SZA A529
        6576                          A524 EQU *
        6576   66000     6617R          JMP A530
        6577                          A510 EQU *
        6577    1616    77616A          LDA V32654   XFLAG
        6600  170612                    SAL 11
        6601  172005                   SAP A531
        6602    1603    77603A          LDA V32643   PLOCK
        6603   52000     6353R          AND =B7777
        6604   62000     6515R          IOR =B50000
        6605   31603    77603A          STA V32643   PLOCK
        6606                          A531 EQU *
        6606    1603    77603A          LDA V32643   PLOCK
        6607    6000     1457R          LDB =D1
        6610   42000       72X          JSX .WS6
        6611    2000     1463R          LDA =D0
        6612    6000     2107R          LDB =D3
        6613   42000      107X          JSX .WS5
        6614   42000     5652R          JSM P486   SWPON
        6615    2000     2411R          LDA =D4
        6616   42000     3214R          JSM P332   WAIT
        6617                          A530 EQU *
        6617   42000     2070R          JSM P261   IFBW
        6620  170400                    AAR 1
        6621  170040                    TCA
        6622   22000     1704R          ADA =D6
        6623   42000     3171R          JSM P327   HLDOF
        6624   42000     5060R          JSM P445   WCNT
        6625   42000     2111R          JSM P263   VBW
        6626  170400                    AAR 1
        6627  170040                    TCA
        6630   22000     1704R          ADA =D6
        6631   42000     3171R          JSM P327   HLDOF
        6632   42000     5060R          JSM P445   WCNT
        6633    1603    77603A          LDA V32643   PLOCK
        6634   62000     2277R          IOR =B4000
        6635   31603    77603A          STA V32643   PLOCK
        6636    6000     1457R          LDB =D1
        6637   42000       72X          JSX .WS6
        6640  170201                    RET 1
        6641                          P532 EQU * LOSHFT
        6641    6000     1363R          LDB =D-4
        6642   42000       32X          JSX .ARGD
```

```
6643    1730   77730A     LDA V30 KFLAG
6644   52000    2107R     AND =D3
6645   72023             RZA A533
6646    1605   77605A     LDA V32645   SCANSL
6647   52000    1704R     AND =D6
6650   72015             RZA A534
6651   42000     150X     JSX ADD2
6652            6677R     DEF =F7500000
6653   42000     146X     JSX DIV3
6654            2405R     DEF =D5
6655    6000    2405R     LDB =D5
6656   42000     132X     JSX .FDIG
6657  170611              SAL 10
6660  170140              CMA
6661   42000     104X     JSX .TURN
6662            6703R     DEF =B2000
6663           77603A     DEF V32643   PLOCK
6664   66000    6667R     JMP A535
6665                     A534 EQU *
6665    1603   77603A     LDA V32643   PLOCK
6666   62000    6703R     IOR =B2000
6667                     A535 EQU *
6667   66000    6675R     JMP A536
6670                     A533 EQU *
6670    1730   77730A     LDA V30 KFLAG
6671  170611              SAL 10
6672   42000     104X     JSX .TURN
6673            6703R     DEF =B2000
6674           77603A     DEF V32643   PLOCK
6675                     A536 EQU *
6675   31603   77603A     STA V32643   PLOCK
6676   66000      31X     JMX .RTNA
6677 7500000
6703    2000
6677                      LIT
6704                     P537  EQU * CPILOT
6704    6000    1277R     LDB =D-1
6705   42000      27X     JSX .ARGA
6706   42000      33X     JSX .UFC4
6707   42000    5117R     JSM P450  COUNTIF
6710   42000     150X     JSX ADD2
6711            6717R     DEF =F10000000
6712   42000     155X     JSX MUD2
6713            5246R     DEF =F20000000
6714   42000     150X     JSX ADD2
6715            6717R     DEF =F10000000
6716   66000      31X    JMX .RTNA
6717 10000000
6717                      LIT
6723                     P538  EQU * CSBLK
6723    1675   77675A     LDA V15 BLEDS
6724   52000    1457R     AND =D1
6725  170600              SAL 1
6726   22000    2406R     ADA =D7
6727   42000    2314R     JSM P279  SBLK
6730    2000    6703R     LDA =D1024
6731   70540              PWC A
6732    1675   77675A     LDA V15 BLEDS
6733   52000    1457R     AND =D1
6734  170600              SAL 1
6735   22000    2203R     ADA =D8
6736   42000    2522R     JSM P297  RJUST
6737  170201              RET 1
6740                     P539  EQU * CFDUMP
6740    1606   77606A     LDA V32646  SRCEID
6741   73006              SLA A540
6742   62000    5517R     IOR =B100000
6743   31606   77606A     STA V32646  SRCEID
6744    2000    3654R     LDA =B20
6745    6000    2411R     LDB =D4
6746   42000     112X     JSX .WS7
6747                     A540 EQU *
6747  170201              RET 1
6750                     P222  EQU * TUNE
6750    6000    1363R     LDB =D-4
6751   42000      32X     JSX .ARGL
6752   42000     156X     JSX .CLBI
6753            7220R     DEF =F1739100000
6754   42000      37X     JSX .LDBI
6755           77707A     DEF V11 FOFSET
6756    6000    1375R     LDB =D-9  F
6757   42000      63X     JSX MIN2P
6760   42000    2043R     JSM P256  DLIMIT
6761    6000    1375R     LDB =D-9  F
6762   42000      43X     JSX .STBP
6763   42000     150X     JSX ADD2
6764           77707A     DEF V11 FOFSET
6765   42000      34X     JSX .STRD
6766           77665A     DEF V8  CFREG
6767   42000    6740R     JSM P539  CFDUMP
6770   42000    5764R     JSM P495  FRQC
6771    6000    1375R     LDB =D-9  F
6772   42000     147X     JSX ADD2P
6773   42000     150X     JSX ADD2
6774           77707A     DEF V11 FOFSET
6775    6000    1375R     LDB =D-9  F
6776   42000      43X     JSX .STBP
6777    1603   77603A     LDA V32643  PLOCK
7000   52000    6353R     AND =B7777
7001   62000    4533R     IOR =B140000
```

```
7002  31603  77603A    STA V32643  PLOCK
7003  42000   5644R    JSM P485  KSWP
7004   1603  77603A    LDA V32643  PLOCK
7005  31573  77573A    STA V32635  I
7006   6000   1375R    LDB =D-9  F
7007  42000    66X     JSX .LDBP
7010  42000   6641R    JSM P532  LOSHFT
7011   1603  77603A    LDA V32643  PLOCK
7012  52000   7224R    AND =B27777
7013  62000   7225R    IOR =B110000
7014   6000   1457R    LDB =D1
7015  42000    72X     JSX .WS6
7016  42000   3221R    JSM P333  CORREK
7017 172010           SAP A541
7020   1603  77603A    LDA V32643  PLOCK
7021  42000   120X     JSX .TEST
7022          6703R    DEF =B2000
7023         77573A    DEF V32635  I
7024  72003           RZA A541
7025   1700  77700A    LDA V22 RLVL
7026  42000   3530R    JSM P355  REFLEV
7027                 A541 EQU *
7027  42000    37X     JSX .LDBI
7030         77665A    DEF V8  CFREG
7031  42000   6016R    JSM P500  STONE
7032   5604  77604A    LDB V32644  SATN
7033 174600            SBL 1
7034   2000   7226R    LDA =B42000
7035 176402           SBM A542
7036   2000   6015R    LDA =B70000
7037                 A542 EQU *
7037   6000   2107R    LDB =D3
7040  42000    72X     JSX .WS6
7041   1603  77603A    LDA V32643  PLOCK
7042 170604            SAL 5
7043 172004           SAP A543
7044  42000    37X     JSX .LDBI
7045          7227R    DEF =F31100000
7046  66000   7051R    JMP A544
7047                 A543 EQU *
7047  42000    37X     JSX .LDBI
7050          7233R    DEF =F26100000
7051                 A544 EQU *
7051  42000    36X     JSX .SAR2
7052   6000   1375R    LDB =D-9  F
7053  42000    66X     JSX .LDBP
7054  42000   150X     JSX ADD2
7055         77661A    DEF V32689  LTEMP1
7056  42000   124X     JSX SUB2I
7057  42000   151X     JSX DIV2
7060          7237R    DEF =F1700000
7061  42000    50X     JSX CNV24
7062  31613  77613A    STA V32651  DAC4
7063   5613  77613A    LDB V32651  DAC4
7064 174040            TCB
7065  26000   3166R    ADB =D1023
7066 176002           SBP A545
7067  22000   7243R    ADA =D-12
7070                 A545 EQU *
7070   6000   1463R    LDB =D0
7071  42000   112X     JSX .WS7
7072   1604  77604A    LDA V32644  SATN
7073 170600            SAL 1
7074 172031           SAP A546
7075  42000    37X     JSX .LDBI
7076          7244R    DEF =F2250000
7077  42000   140X     JSX MIN2
7100         77661A    DEF V32689  LTEMP1
7101  42000   151X     JSX DIV2
7102          6116R    DEF =F4000000
7103  42000    50X     JSX CNV24
7104 170040            TCA
7105  22000   2521R    ADA =D17
7106  31570  77570A    STA V32632  M
7107  42000   125X     JSX CNV43
7110  42000   127X     JSX MIN3
7111          6122R    DEF =H17
7112  42000   153X     JSX MPY2
7113          6116R    DEF =F4000000
7114  42000   150X     JSX ADD2
7115          7244R    DEF =F2250000
7116  42000   140X     JSX MIN2
7117         77661A    DEF V32689  LTEMP1
7120  42000   151X     JSX DIV2
7121          6123R    DEF =F250000
7122  42000    50X     JSX CNV24
7123  52000   3527R    AND =D14
7124  31571  77571A    STA V32633  L
7125                 A546 EQU *
7125   1570  77570A    LDA V32632  M
7126 170040            TCA
7127  22000   2521R    ADA =D17
7130 170603            SAL 4
7131  21571  77571A    ADA V32633  L
7132  42000   122X     JSX CNV42
7133  42000   153X     JSX MPY2
7134          6123R    DEF =F250000
7135  42000   140X     JSX MIN2
7136         77661A    DEF V32689  LTEMP1
7137  42000    36X     JSX .SAR2
```

```
7140   1604  77604A      LDA V32644  SAIN
7141 170600              SAL 1
7142 172004             SAP A547
7143  42000     53X      JSX .LDSI
7144          3654R      DEF =H10
7145  66000   7150R      JMP A548
7146                   A547 EQU *
7146  42000     53X      JSX .LDSI
7147          2405R      DEF =D5
7150                   A548 EQU *
7150  42000    157X      JSX MPY21
7151  42000     34X      JSX .STRD
7152         77641A      DEF V32673  VTOFREQ
7153  42000   5656R      JSM P487  VTOTUNE
7154  42000   5252R      JSM P460  YIGSLEW
7155   2000   3166R      LDA =D1023
7156  70540              PWC A
7157   2000   1704R      LDA =D6
7160  42000   6704R      JSM P537  CPILOT
7161   6000   1375R      LDB =D-9  F
7162  42000     63X      JSX MIN2P
7163  42000     36X      JSX .SAR2
7164   1603  77603A      LDA V32643  PLOCK
7165 170604              SAL 5
7166 172004             SAP A549
7167  42000     37X      JSX .LDBI
7170          5246R      DEF =F20000000
7171  66000   7174R      JMP A550
7172                   A549 EQU *
7172  42000     37X      JSX .LDBI
7173          7250R      DEF =F25000000
7174                   A550 EQU *
7174  42000    130X      JSX ADD21
7175  42000    151X      JSX DIV2
7176          7237R      DEF =F1700000
7177  42000     50X      JSX CNV24
7200  42000   2132R      JSM P265  LIMIT
7201  31613  77613A      STA V32651  DAC4
7202   6000   1463R      LDB =D0
7203  42000    112X      JSX .WS7
7204  42000   2154R      JSM P269  WSPIN
7205  42000   5252R      JSM P460  YIGSLEW
7206   1603  77603A      LDA V32643  PLOCK
7207  52000   6371R      AND =B167777
7210  31603  77603A      STA V32643  PLOCK
7211  42000     53X      JSX .LDSI
7212          1463R      DEF =D0
7213  42000     34X      JSX .STRD
7214         77635A      DEF V32669  CFREST
7215  42000   6723R      JSM P538  CSBLK
7216  42000   6160R      JSM P502  EOS
7217  66000     31X      JMX .RTNA
7220 173910000
7224  27777
7225 110000
7226  42000
7227 31100000
7233 26100000
7237 1700000
7243 177764
7244 2250000
7250 25000000
7220                     L11
7254                   P551  EQU * LOGSIX
7254   6000   1363R      LDB =D-4
7255  42000     32X      JSX .ARGL
7256  44016     16A      ISZ C
7257  42000     52X      JSX .DEQL
7260 172005             SAP A552
7261   2000   1463R      LDA =D0
7262   6000   2107R      LDB =D3 LOGSIX
7263  42000     67X      JSX .STAP
7264  66000   7326R      JMP A553
7265                   A552 EQU *
7265   4020     20A      LDB AR2
7266  77202              SLB *+2,C
7267  34020     20A      STB AR2
7270  71500              NRM
7271  35573  77573A      STB V32635  I
7272   6000   2204R      LDB =D10
7273  42000     47X      JSX .DRGT
7274   6000   1375R      LDB =D-9  L
7275  42000     43X      JSX .STBP
7276   1573  77573A      LDA V32635  I
7277 170040              ICA
7300  22000   2565R      ADA =D11
7301   6000   1704R      LDB =D6
7302  75617              MPY
7303  22000   1457R      ADA =D1
7304   6000   2107R      LDB =D3 LOGSIX
7305  42000     67X      JSX .STAP
7306   2000   1457R      LDA =D1
7307                   A555 EQU *
7307  31573  77573A      STA V32635  I
7310  42000     60X      JSX .ARAY
7311           552R      DEF V189  LGIB
7312  42000     61X      JSX .LDSA
7313   6000   1375R      LDB =D-9  L
7314  42000    160X      JSX SUB2P
7315   4020     20A      LDB AR2
```

```
7316  77010            SLB A554
7317   6000    1457R     LDB =D1
7320  25763   77763A     ADB E
7321 144001       1A     ISZ B,1
7322                     NOP
7323   2000    1457R     LDA =D1
7324  21573   77573A     ADA V32635   I
7325  66000    7307R     JMP A555
7326                   A554 EQU *
7326                   A553 EQU *
7326  66000      70X     JMX .RTN1
7327                   P556  EQU * LOG2
7327   6000    1363R     LDB =D-4
7330  42000      32X     JSX .ARGL
7331  44016      16A     ISZ C
7332  42000    7254R     JSM P551   LOGSIX
7333  22000    1457R     ADA =D1
7334 170400              AAR 1
7335  66000      31X    JMX .RTNA
7336                   P557  EQU * LOG3
7336   6000    1363R     LDB =D-4
7337  42000      32X     JSX .ARGL
7340  44016      16A     ISZ C
7341  42000    7254R     JSM P551   LOGSIX
7342  42000     113X     JSX DIV4
7343                2107R     DEF =D3
7344  66000      31X    JMX .RTNA
7345                   P558  EQU * SCAN1
7345   6000    1363R     LDB =D-4
7346  42000      32X     JSX .ARGL
7347  66000    7413R     JMP A559
7350                   T560 EQU *
7350                   K561  OCT 174077   174077
7351                   K562  OCT 170057   170057
7352                   K563  OCT 164067   164067
7353                   K564  OCT 160047   160047
7354                   K565  OCT 150073   150073
7355                   K566  OCT 144053   144053
7356                   K567  OCT 140075   140075
7357                   K568  OCT 130055   130055
7360                   K569  OCT 124065   124065
7361                   K570  OCT 120045   120045
7362                   K571  OCT 110071   110071
7363                   K572  OCT 104051   104051
7364                   K573  OCT 100076   100076
7365                   K574  OCT 56   56
7366                   K575  OCT 66   66
7367                   K576  OCT 46   46
7370                   K577  OCT 72   72
7371                   K578  OCT 52   52
7372                   K579  OCT 74   74
7373                   K580  OCT 54   54
7374                   K581  OCT 64   64
7375                   K582  OCT 44   44
7376                         OCT 70   70
7377                         OCT 50   50
7400                   K583  OCT 34   34
7401                   K584  OCT 14   14
7402                   K160  OCT 24   24
7403                         DEC 4 4
7404                   K186  OCT 30   30
7405                   K183  OCT 10   10
7406                   K185  OCT 20   20
7407                         DEC 0 0
7410           7350R   V585 DEF T560  SCANTAB
7411                         OCT 177777   177777
7412                         OCT 40   40
7413                   A559  EQU *
7413  42000      37X     JSX .LDB1
7414          77671A     DEF V9   SPAN
7415  42000      52X     JSX .DEQL
7416 172413             SAM A586
7417  42000      37X     JSX .LDB1
7420           7555R     DEF =F20000
7421   6000    1375R     LDB =D-9   ST
7422  42000      63X     JSX MIN2P
7423   4020      20A     LDB AR2
7424  77005             SLB A586
7425  42000      37X     JSX .LDB1
7426           7555R     DEF =F20000
7427   6000    1375R     LDB =D-9   SI
7430  42000      43X     JSX .SIBP
7431                   A586 EQU *
7431   1604   77604A     LDA V32644   SAIN
7432  70540              PWC A
7433   1606   77606A     LDA V32646   SRCEID
7434  73006             SLA A587
7435  62000    1770R     IOR =B20000
7436  31606   77606A     STA V32646   SRCEID
7437   2000    3654R     LDA =B20
7440   6000    2411R     LDB =D4
7441  42000     112X     JSX .WS7
7442                   A587 EQU *
7442   6000    1375R     LDB =D-9   S1
7443  42000      66X     JSX .LDBP
7444  42000     140X     JSX MIN2
7445           7561R     DEF =F15000
7446   4020      20A     LDB AR2
7447  77402              RLB *+2
7450  66000    7572R     JMP A588
```

```
7451    1732  77732A      LDA V19 STIM
7452   70540              PWC A
7453    2000   2205R      LDA =D32
7454   70540              PWC A
7455    6000   1375R      LDB =D-9  ST
7456   42000     66X      JSX .LDBP
7457   42000   7254R      JSM P551  LOGSIX
7460   22000   2647R      ADA =D-24
7461   42000   2132R      JSM P265  LIMIT
7462   31731  77731A      STA V18 SINDEX
7463   42000     60X      JSX .ARAY
7464           7410R      DEF V585  SCANTAB
7465   31732  77732A      STA V19 STIM
7466   70760              WWC A
7467   31573  77573A      STA V32635  I
7470   11732  77732A      CPA V19 STIM
7471   66000   7473R      JMP A589
7472   42000   2762R      JSM P314  AVGRST
7473                    A589 EQU *
7473    1731  77731A      LDA V18 SINDEX
7474  170040              TCA
7475   22000   2405R      ADA =D5
7476  170505              SAR 6
7477   42000    104X      JSX .TURN
7500           1300R      DEF =B1000
7501          77702A      DEF V24 VIDCON
7502   31702  77702A      STA V24 VIDCON
7503    1731  77731A      LDA V18 SINDEX
7504  170040              TCA
7505   22000   7565R      ADA =D18
7506   70540              PWC A
7507    1605  77605A      LDA V32645  SCANSL
7510   42000    111X      JSX .EQL
7511   42000    136X      JSX .ORT
7512   42000    104X      JSX .TURN
7513           5517R      DEF =B100000
7514          77604A      DEF V32644  SATN
7515   31604  77604A      STA V32644  SATN
7516    1733  77733A      LDA V20 FSTIM
7517  172402              SAM *+2
7520   66000   7554R      JMP A590
7521    1676  77676A      LDA V16 TLEDS
7522   52000   7566R      AND =B617
7523   72431             SZA A590
7524    1702  77702A      LDA V24 VIDCON
7525   52000   7567R      AND =B173777
7526   31702  77702A      STA V24 VIDCON
7527    2000   1463R      LDA =D0
7530    6000   2203R      LDB =D8
7531   42000     75X      JSX .WS4
7532    5676  77676A      LDB V16 TLEDS
7533  174614              SBL 13
7534    2000   3113R      LDA =B2060
7535  176402             SBM A591
7536    2000   7570R      LDA =B2020
7537                    A591 EQU *
7537   42000     73X      JSX .W6
7540    2000   6703R      LDA =D1024
7541   42000    103X      JSX .W4
7542    5676  77676A      LDB V16 TLEDS
7543  174611              SBL 10
7544    2000   3113R      LDA =B2060
7545  176402             SBM A592
7546    2000   7571R      LDA =B2030
7547                    A592 EQU *
7547   42000     73X      JSX .W6
7550    2000   1463R      LDA =D0
7551   31733  77733A      STA V20 FSTIM
7552   42000  10747R      JSM P219  MKRDEL
7553   42000  15224R      JSM P221  TRIGR
7554                    A590 EQU *
7554   66000   7641R      JMP A593
7555   20000
7561   15000
7565      22
7566     617
7567  173777
7570    2020
7571    2030
7555                      LII
7572                    A588 EQU *
7572    1702  77702A      LDA V24 VIDCON
7573   52000   7666R      AND =B172777
7574   62000   2277R      IOR =B4000
7575   31702  77702A      STA V24 VIDCON
7576    2000   1463R      LDA =D0
7577    6000   2203R      LDB =D8
7600   42000     75X      JSX .WS4
7601    2000   3113R      LDA =B2060
7602   42000     73X      JSX .W6
7603    2000   6703R      LDA =D1024
7604   42000    103X      JSX .W4
7605    2000   3113R      LDA =B2060
7606   42000     73X      JSX .W6
7607    2000   6352R      LDA =D3072
7610   42000    103X      JSX .W4
7611    2000   3110R      LDA =B2024
7612   42000     73X      JSX .W6
7613    2000   7667R      LDA =B157
7614   42000  15546R      JSM P214  KEY
```

```
7615   2000   1456R    LDA =D12
7616  70540            RWC A
7617   6000   1375R    LDB =D-9  ST
7620  42000     66X    JSX .LDBP
7621  42000   7327R    JSM P556  LOG2
7622  22000   1277R    ADA =D-1
7623  42000   2132R    JSM P265  LIMIT
7624  22000   1457R    ADA =D1
7625  31731  77731A    STA V16 SINDEX
7626  42000     60X    JSX .ARAY
7627          7410R    DEF V585  SCANTAB
7630  31733  77733A    STA V20 FSTIM
7631   2000   1463R    LDA =D0
7632  31732  77732A    STA V19 STIM
7633  42000  10747R    JSM P219  MKRDEL
7634   1604  77604A    LDA V32644  SATN
7635  52000   6514R    AND =B77777
7636  31604  77604A    STA V32644  SATN
7637   2000   7670R    LDA =B164
7640  42000  15546R    JSM P214  KEY
7641                 A593 EQU *
7641   1604  77604A    LDA V32644  SATN
7642   6000   1457R    LDB =D1
7643  42000     75X    JSX .WS4
7644   1732  77732A    LDA V19 STIM
7645  42000    105X    JSX .W5
7646  70760            WWC A
7647  31573  77573A    STA V32635  I
7650  42000    120X    JSX .TEST
7651          5517R    DEF =B100000
7652         77604A    DEF V32644  SATN
7653  72005           RZA A594
7654  42000   6160R    JSM P502  EOS
7655   2000   2107R    LDA =D3
7656   6000   2107R    LDB =D3
7657  42000     75X    JSX .WS4
7660                 A594 EQU *
7660   1733  77733A    LDA V20 FSTIM
7661   6000   1456R    LDB =D12
7662  42000    112X    JSX .WS7
7663   2000   2107R    LDA =D3
7664  42000   2314R    JSM P279  SBLK
7665  66000     31X    JMX .RINA
7666 172777
7667    157
7670    164
7666                   LIT
7671                 P595  EQU * YIGSHFT
7671   1603  77603A    LDA V32643  PLUCK
7672  31573  77573A    STA V32635  I
7673  42000   5764R    JSM P495  FRQC
7674  42000    150X    JSX ADD2
7675         77665A    DEF V8  CFREQ
7676  42000   6641R    JSM P532  LOSHFT
7677   1603  77603A    LDA V32643  PLUCK
7700  42000    120X    JSX .TEST
7701          6703R    DEF =B2000
7702         77573A    DEF V32635  I
7703  72025           RZA A596
7704   1616  77616A    LDA V32654  XFLAG
7705  52000   7731R    AND =B177737
7706  31616  77616A    STA V32654  XFLAG
7707   5573  77573A    LDB V32635  I
7710 174604           SBL 5
7711   2000   2107R    LDA =D3
7712 176402           SBM A597
7713   2000   1301R    LDA =B177775
7714                 A597 EQU *
7714  21613  77613A    ADA V32651  DAC4
7715  31613  77613A    STA V32651  DAC4
7716   1603  77603A    LDA V32643  PLUCK
7717   6000   1457R    LDB =D1
7720  42000     72X    JSX .WS6
7721   1613  77613A    LDA V32651  DAC4
7722   6000   1463R    LDB =D0
7723  42000    112X    JSX .WS7
7724  42000   3221R    JSM P333  CURREK
7725 172003           SAP A598
7726   1700  77700A    LDA V22 RLVL
7727  42000   3530R    JSM P355  REFLEV
7730                 A598 EQU *
7730                 A596 EQU *
7730 170201           RET 1
7731 177737
7731                   LIT
7732                 P599  EQU * FPNLON
7732   1565  77565A    LDA V32629  SRGEN
7733   6000   2276R    LDB =D2
7734  42000    107X    JSX .WS5
7735 172404           SAM A600
7736   2000   2107R    LDA =D3
7737   6000   2107R    LDB =D3
7740  42000     75X    JSX .WS4
7741                 A600 EQU *
7741   1565  77565A    LDA V32629  SRGEN
7742  42000    104X    JSX .TURN
7743          5517R    DEF =B100000
7744         77675A    DEF V15 BLEDS
7745  31675  77675A    STA V15 BLEDS
7746 170140           CMA
```

```
        7747    6000    2276R    LDB =D2
        7750   42000      75X    JSX .WS4
        7751    1601   77601A    LDA V32641   HPBC
        7752  172005            SAP A601
        7753    1602   77602A    LDA V32642   LKMSK
        7754    6000    2107R    LDB =D3
        7755   42000     107X    JSX .WS5
        7756   42000      15X    JSM P204   HBUSY
        7757                   A601 EQU *
        7757    1601   77601A    LDA V32641   HPBC
        7760  170601             SAL 2
        7761  172007            SAP A602
        7762    1676   77676A    LDA V16 ILEDS
        7763  170501             SAR 2
        7764   52000    2410R    AND =B200
        7765   61601   77601A    IOR V32641   HPBC
        7766    6000    2411R    LDB =D4
        7767   42000     112X    JSX .WS7
        7770                   A602 EQU *
        7770    1601   77601A    LDA V32641   HPBC
        7771   52000    7774R    AND =B57777
        7772   31601   77601A    STA V32641   HPBC
        7773  170201             RET 1
        7774   57777
        7774                    LIT
        7775                   P603  EQU * CSCANBW
        7775    1675   77675A    LDA V15 BLEDS
        7776  170610             SAL 9
        7777  172426            SAM A604
       10000    1605   77605A    LDA V32645   SCANSL
       10001   72424            SZA A604
       10002    2000    2565R    LDA =D11
       10003   70540             PWC A
       10004    1605   77605A    LDA V32645   SCANSL
       10005   52000    1704R    AND =D6
       10006    4000             LDB A
       10007    2000    2565R    LDA =D11
       10010   76402            SZB A605
       10011    2000    2172R    LDA =D13
       10012                   A605 EQU *
       10012   70540             PWC A
       10013   42000      37X    JSX .LDBI
       10014           77671A    DEF V9   SPAN
       10015   42000    7254R    JSM P551   LOGSIX
       10016   42000     116X    JSX SUB4I
       10017   42000     113X    JSX DIV4
       10020            2107R    DEF =D3
       10021   22000    2110R    ADA =D-2
       10022   42000    2132R    JSM P265   LIMIT
       10023   22000    2276R    ADA =D2
       10024   42000    4210R    JSM P392   IFBWOUT
       10025                   A604 EQU *
       10025   42000    2070R    JSM P261   IFBW
       10026   31473   77473A    STA V41 KK
       10027    1675   77675A    LDA V15 BLEDS
       10030  170607             SAL 8
       10031  172407            SAM A606
       10032    1473   77473A    LDA V41 KK
       10033   22000    2110R    ADA =D-2
       10034  170502             SAR 3
       10035  170040             TCA
       10036   21473   77473A    ADA V41 KK
       10037   42000    4314R    JSM P400   VBWOUT
       10040                   A606 EQU *
       10040   42000    2111R    JSM P263   VBW
       10041   31476   77476A    STA V44 KN
       10042    1605   77605A    LDA V32645   SCANSL
       10043   72002             RZA *+2
       10044   66000   10274R    JMP A607
       10045    1473   77473A    LDA V41  KK
       10046  170040             TCA
       10047   21476   77476A    ADA V44  KN
       10050  172006            SAP A608
       10051    1473   77473A    LDA V41  KK
       10052   21476   77476A    ADA V44  KN
       10053    6000    2107R    LDB =D3
       10054   75617             MPY
       10055   66000   10061R    JMP A609
       10056                   A608 EGU *
       10056    2000    1704R    LDA =D6
       10057    5473   77473A    LDB V41  KK
       10060   75617             MPY
       10061                   A609 EQU *
       10061   70540             PWC A
       10062   42000      37X    JSX .LDBI
       10063           77671A    DEF V9   SPAN
       10064   42000    7254R    JSM P551   LOGSIX
       10065   22000   10141R    ADA =D38
       10066   42000     116X    JSX SUB4I
       10067   70540             PWC A
       10070    1616   77616A    LDA V32654   XFLAG
       10071  170605             SAL 6
       10072  170416             AAR 15
       10073  170601             SAL 2
       10074   42000      57X    JSX ADD4I
       10075   31656   77656A    STA V34 BCDA
       10076   42000      53X    JSX .LDSI
       10077            1770R    DEF =B2000
       10100   42000     140X    JSX MIN2
       10101           77671A    DEF V9   SPAN
```

```
10102    4020       20A   LDB AR2
10103   77402             RLB *+2
10104   66000    10145R   JMP A610
10105    2000     2107R   LDA =D3
10106    5473    77473A   LDB V41 KK
10107   75617             MPY
10110   70540             PWC A
10111   42000       37X   JSX .LDBI
10112            77671A   DEF V9  SPAN
10113   42000     7254R   JSM P551  LOGSIX
10114   22000    10142R   ADA =D31
10115   42000      116X   JSX SUB4T
10116   70540             PWC A
10117    1616    77616A   LDA V32654  XFLAG
10120  170605             SAL 6
10121  170416             AAR 15
10122  170601             SAL 2
10123   42000       57X   JSX ADD4T
10124   31657    77657A   STA V35 BCDB
10125    1473    77473A   LDA V41 KK
10126   22000     1363R   ADA =D-4
10127  172011            SAP A611
10130    1657    77657A   LDA V35 BCDB
10131   22000    10143R   ADA =D-43
10132  172006            SAP A611
10133    1616    77616A   LDA V32654  XFLAG
10134  170605             SAL 6
10135  172403            SAM A611
10136    2000    10144R   LDA =D43
10137   31657    77657A   STA V35 BCDB
10140                    A611 EQU *
10140   66000    10161R   JMP A612
10141      46
10142      37
10143  177725
10144      53
10141                     LIT
10145                    A610 EQU *
10145    2000     2107R   LDA =D3
10146    5473    77473A   LDB V41 KK
10147   75617             MPY
10150  170040             TCA
10151   22000    10237R   ADA =D52
10152   70540             PWC A
10153    1616    77616A   LDA V32654  XFLAG
10154  170605             SAL 6
10155  170416             AAR 15
10156  170601             SAL 2
10157   42000       57X   JSX ADD4T
10160   31657    77657A   STA V35 BCDB
10161                    A612 EQU *
10161    1657    77657A   LDA V35 BCDB
10162  170040             TCA
10163   21656    77656A   ADA V34 BCDA
10164  172003            SAP A613
10165    1657    77657A   LDA V35 BCDB
10166   31656    77656A   STA V34 BCDA
10167                    A613 EQU *
10167    2000     2107R   LDA =D3
10170    5476    77476A   LDB V44 KN
10171   75617             MPY
10172  170040             TCA
10173   22000    10240R   ADA =D47
10174   70540             PWC A
10175    1616    77616A   LDA V32654  XFLAG
10176  170605             SAL 6
10177  170416             AAR 15
10200  170601             SAL 2
10201   42000       57X   JSX ADD4T
10202   31657    77657A   STA V35 BCDB
10203  170040             TCA
10204   21656    77656A   ADA V34 BCDA
10205  172003            SAP A614
10206    1657    77657A   LDA V35 BCDB
10207   31656    77656A   STA V34 BCDA
10210                    A614 EQU *
10210    1675    77675A   LDA V15 BLEDS
10211  170601             SAL 2
10212  172006            SAP A615
10213    1656    77656A   LDA V34 BCDA
10214   22000    10241R   ADA =D-29
10215  172003            SAP A615
10216    2000     2416R   LDA =D29
10217   31656    77656A   STA V34 BCDA
10220                    A615 EQU *
10220    1656    77656A   LDA V34 BCDA
10221   22000    10242R   ADA =D-27
10222  172003            SAP A616
10223    2000    10243R   LDA =D27
10224   31656    77656A   STA V34 BCDA
10225                    A616 EQU *
10225    1656    77656A   LDA V34 BCDA
10226  170040             TCA
10227   22000    10244R   ADA =D56
10230  172015            SAP A617
10231    2000    10244R   LDA =D56
10232   31656    77656A   STA V34 BCDA
10233    1426    77426A   LDA V32534  UFLAG
10234   62000     5517R   IOR =B100000
10235   31426    77426A   STA V32534  UFLAG
```

```
10236  66000  10250R   JMP A618
10237      64
10240      57
10241 177743
10242 177745
10243      33
10244      70
10237                   LIT
10245                  A617 EQU *
10245   1426  77426A    LDA V32534  UFLAG
10246  52000   6514R    AND =B77777
10247  31426  77426A    STA V32534  UFLAG
10250                  A618 EQU *
10250   1675  77675A    LDA V15 ELEDS
10251 170606            SAL 7
10252 172411           SAM A619
10253   1656  77656A    LDA V34 BCDA
10254  22000   2647R    ADA =D-24
10255  11731  77731A    CPA V18 SINDEX
10256  66000  10262R    JMP A620
10257   1656  77656A    LDA V34 BCDA
10260  42000   4356R    JSM P403  EXPSIX
10261  42000   7345R    JSM P558  SCANT
10262                  A620 EQU *
10262  66000  10273R    JMP A621
10263                  A619 EQU *
10263   1656  77656A    LDA V34 BCDA
10264  22000   2647R    ADA =D-24
10265 170040            TCA
10266  21731  77731A    ADA V18 SINDEX
10267 172004           SAP A622
10270   1426  77426A    LDA V32534  UFLAG
10271  62000   5517R    IOR =B100000
10272  31426  77426A    STA V32534  UFLAG
10273                  A622 EQU *
10273                  A621 EQU *
10273  66000  10277R    JMP A623
10274                  A607 EQU *
10274   1426  77426A    LDA V32534  UFLAG
10275  52000   6514R    AND =B77777
10276  31426  77426A    STA V32534  UFLAG
10277                  A623 EQU *
10277  42000   2650R    JSM P304  UNCAL
10300 170201            RET 1
10301                  P624  EQU * MKRACT
10301   1616  77616A    LDA V32654  XFLAG
10302 170602            SAL 3
10303 172006           SAP A625
10304   1576  77576A    LDA V32638  RPGPTR
10305  12000   7565R    CPA =D18
10306  66000  10310R    JMP *+2
10307  66000  10311R    JMP A625
10310  42000  12334R    JSM P217  MBLK
10311                  A625 EQU *
10311 170201            RET 1
10312                  P218  EQU * MKREL
10312 174517            CLB
10313  42000     56X    JSX .ARGS
10314  44016     16A    ISZ C
10315   1723  77723A    LDA V26 MKRMODE
10316  42000    121X    JSX MOD4
10317          2107R    DEF =D3
10320  22000   1277R    ADA =D-1
10321  42000    111X    JSX .EQL
10322  66000     31X   JMX .RTNA
10323                  P626  EQU * MKRROK
10323 174517            CLB
10324  42000     56X    JSX .ARGS
10325  44016     16A    ISZ C
10326   1676  77676A    LDA V16 TLEDS
10327  52000   2477R    AND =B44
10330  22000  10335R    ADA =B177734
10331  42000    111X    JSX .EQL
10332  61733  77733A    IOR V20 FSTIM
10333 170140            CMA
10334  66000     31X   JMX .RTNA
10335 177734
10335                   LIT
10336                  P627  EQU * MKRAD
10336  42000  10323R    JSM P626  MKRROK
10337 172022           SAP A628
10340   1702  77702A    LDA V24 VIDCON
10341 170603            SAL 4
10342 172004           SAP A631
10343   1676  77676A    LDA V16 TLEDS
10344 170615            SAL 14
10345 172404           SAM A630
10346                  A631 EQU *
10346   1676  77676A    LDA V16 TLEDS
10347  52000  10360R    AND =B201
10350  72403           SZA A629
10351                  A630 EQU *
10351   1721  77721A    LDA V25 MRKR
10352  66000  10355R    JMP A632
10353                  A629 EQU *
10353   1721  77721A    LDA V25 MRKR
10354  22000   6703R    ADA =D1024
10355                  A632 EQU *
10355   6000   2203R    LDB =D8
10356  42000     75X    JSX .WS4
```

```
10357  66000  10410R    JMP A633
10360    201
10360                  LIT
10361                  A628 EQU *
10361   1721  77721A    LDA V25 MRKR
10362  70540            PWC A
10363   1723  77723A    LDA V26 MKRMODE
10364  70540            PWC A
10365   1675  77675A    LDA V15 BLEDS
10366  70540            PWC A
10367   2000  10411R    LDA =B114
10370  42000  15546R    JSM P214  KEY
10371  70760            WWC A
10372  31675  77675A    STA V15 BLEDS
10373  70760            WWC A
10374  31723  77723A    STA V26 MKRMODE
10375  70760            WWC A
10376  31721  77721A    STA V25 MRKR
10377   1566  77566A    LDA V32630  KEYCODE
10400  12000  10412R    CPA =B113
10401  66000  10403R    JMP *+2
10402  66000  10406R    JMP A635
10403   1575  77575A    LDA V32637  K
10404  12000   2405R    CPA =D5
10405  66000  10410R    JMP A634
10406                  A635 EQU *
10406  54003      3A    DSZ V12 RPTR
10407                   NOP
10410                  A634 EQU *
10410                  A633 EQU *
10410 170201            RET 1
10411    114
10412    113
10411                  LIT
10413                  P636  EQU * MKRON
10413   1721  77721A    LDA V25 MRKR
10414  12000   3166R    CPA =D1023
10415  66000  10417R    JMP *+2
10416  66000  10424R    JMP A637
10417   2000  10522R    LDA =D501
10420  31721  77721A    STA V25 MRKR
10421  42000    161X    JSX .MVE4
10422         77665A    DEF V8  CFREQ
10423         77645A    DEF V32677  MFREQ
10424                  A637 EQU *
10424   1675  77675A    LDA V15 BLEDS
10425 170601            SAL 2
10426 172427           SAM A638
10427   2000   2203R    LDA =D8
10430  70540            PWC A
10431   1721  77721A    LDA V25 MRKR
10432  22000  10523R    ADA =D-501
10433  42000    122X    JSX CNV42
10434  42000    153X    JSX MPY2
10435         77671A    DEF V9  SPAN
10436  42000     26X    JSM P213  ROUND
10437   6000   2107R    LDB =D3
10440  42000     47X    JSX .DRGT
10441  42000    150X    JSX ADD2
10442         77665A    DEF V8  CFREQ
10443  42000     34X    JSX .STRD
10444         77645A    DEF V32677  MFREQ
10445  42000  10312R    JSM P218  MKREL
10446 172007           SAP A639
10447  42000     37X    JSX .LDBI
10450         77724A    DEF V10 AMF
10451  42000    140X    JSX MIN2
10452         77645A    DEF V32677  MFREQ
10453  42000     34X    JSX .STRD
10454         77645A    DEF V32677  MFREQ
10455                  A639 EQU *
10455                  A638 EQU *
10455  42000  10336R    JSM P627  MKRAD
10456   1675  77675A    LDA V15 BLEDS
10457 170613            SAL 12
10460 172402            SAM *+2
10461  66000  10525R    JMP A640
10462   1721  77721A    LDA V25 MRKR
10463  70540            PWC A
10464   2000  10524R    LDA =D968
10465  70540            PWC A
10466   1721  77721A    LDA V25 MRKR
10467  22000   2067R    ADA =D-17
10470  42000   2132R    JSM P265  LIMIT
10471  22000   1457R    ADA =D1
10472  31721  77721A    STA V25 MRKR
10473   2000   1463R    LDA =D0
10474  31722  77722A    STA V29 MKRLVL
10475  42000  10336R    JSM P627  MKRAD
10476   2000   2205R    LDA =D32
10477  70540            PWC A
10500                  A641 EQU *
10500  42000    162X    JSX .R5
10501  31473  77473A    STA V41 KK
10502 170604            SAL 5
10503 170404            AAR 5
10504  21722  77722A    ADA V29 MKRLVL
10505  31722  77722A    STA V29 MKRLVL
10506 154016     16A    DSZ C,1
10507  66000  10500R    JMP A641
```

```
10510  54016      16A    DSZ C
10511   2000    3166R    LDA =D1023
10512  70540             PWC A
10513   1722   77722A    LDA V29 MKRLVL
10514 170404             AAR 5
10515  42000    2132R    JSM P265  LIMIT
10516  31722   77722A    STA V29 MKRLVL
10517  70760             WWC A
10520  31721   77721A    STA V25 MKRR
10521  66000   10532R    JMP A642
10522    765
10523 177013
10524   1710
10522                   LIT
10525                  A640 EQU *
10525  42000     162X    JSX .R5
10526  31573   77573A    STA V32635  I
10527 170604             SAL 5
10530 170404             AAR 5
10531  31722   77722A    STA V29 MKRLVL
10532                  A642 EQU *
10532   1675   77675A    LDA V15 BLEDS
10533 170611             SAL 10
10534 172011            SAP A643
10535   1705   77705A    LDA V32 THRESH
10536  52000    1363R    AND =B177774
10537 170040             TCA
10540  21722   77722A    ADA V29 MKRLVL
10541 172004            SAP A643
10542   1705   77705A    LDA V32 THRESH
10543  52000    1363R    AND =B177774
10544  31722   77722A    STA V29 MKRLVL
10545                  A643 EQU *
10545   2000   10706R    LDA =D2050
10546  42000     103X    JSX .W4
10547   2000   10707R    LDA =B2202
10550  42000      73X    JSX .W6
10551   2000    4470R    LDA =D1000
10552  70540             PWC A
10553   1721   77721A    LDA V25 MKRR
10554  22000    1363R    ADA =D-4
10555  42000    2132R    JSM P265  LIMIT
10556  42000      73X    JSX .W6
10557   2000   10710R    LDA =D1015
10560  70540             PWC A
10561   1722   77722A    LDA V29 MKRLVL
10562  22000    1363R    ADA =D-4
10563  42000    2132R    JSM P265  LIMIT
10564  22000   10711R    ADA =D2052
10565  42000      73X    JSX .W6
10566   1575   77575A    LDA V32637  K
10567  12000    2107R    CPA =D3
10570  66000   10641R    JMP A644
10571   6000    2221R    LDB =D9
10572  42000      74X    JSX .RS5
10573  31573   77573A    STA V32635  I
10574   6000    2203R    LDB =D8
10575  42000      74X    JSX .RS5
10576  31573   77573A    STA V32635  I
10577  52000    6353R    AND =B7777
10600 170040             TCA
10601  21721   77721A    ADA V25 MKRR
10602 170040             TCA
10603 172005            SAP A645
10604  42000    6127R    JSM P501  MKIS
10605 172003            SAP A645
10606   1721   77721A    LDA V25 MKRR
10607  66000   10611R    JMP A646
10610                  A645 EQU *
10610   2000    3112R    LDA =D1001
10611                  A646 EQU *
10611  70540             PWC A
10612   1730   77730A    LDA V30 KFLAG
10613 170614             SAL 13
10614 172403            SAM A647
10615   2000    1463R    LDA =D0
10616  66000   10620R    JMP A648
10617                  A647 EQU *
10617   2000    6352R    LDA =D3072
10620                  A648 EQU *
10620  42000      57X    JSX ADD4T
10621   6000    2221R    LDB =D9
10622  42000      72X    JSX .WS6
10623   2000    2521R    LDA =D17
10624  42000    2422R    JSM P284  BLKAD
10625  42000     162X    JSX .R5
10626  31573   77573A    STA V32635  I
10627  52000    3166R    AND =B1777
10630  12000    2421R    CPA =D146
10631  66000   10633R    JMP *+2
10632  66000   10641R    JMP A649
10633   1723   77723A    LDA V26 MKRMODE
10634  42000    2223R    JSM P274  NBLK
10635   2000    2421R    LDA =D146
10636  42000      73X    JSX .W6
10637   2000    2521R    LDA =D17
10640  42000    2223R    JSM P274  NBLK
10641                  A649 EQU *
10641                  A644 EQU *
10641   1675   77675A    LDA V15 BLEDS
```

```
10642 170601                    SAL 2
10643 172416                    SAM A650
10644   1723    77723A           LDA V26 MKRMODE
10645  42000     2422R           JSM P284  BLKAD
10646   1435    77435A           LDA V32541   IF1
10647  52000     4207R           AND =B160000
10650  22000     5517R           ADA =B100000
10651  72006                    RZA A651
10652   1722    77722A           LDA V29 MKRLVL
10653  22000    10712R           ADA =D-100
10654 172003                    SAP A651
10655   2000     2521R           LDA =B21
10656  66000    10660R           JMP A652
10657                           A651 EQU *
10657   2000     1463R           LDA =D0
10660                           A652 EQU *
10660  42000       73X           JSX .W6
10661                           A650 EQU *
10661   1675    77675A           LDA V15 BLEDS
10662 170601                     SAL 2
10663 172012                    SAP A654
10664   1426    77426A           LDA V32534   UFLAG
10665 170610                     SAL 9
10666 172405                    SAM A655
10667   1575    77575A           LDA V32637   K
10670  12000     2276R           CPA =D2
10671  66000    10673R           JMP *+2
10672  66000    10675R           JMP A654
10673                           A655 EQU *
10673   1605    77605A           LDA V32645   SCANSL
10674  72005                    RZA A653
10675                           A654 EQU *
10675   2000     7570R           LDA =D1040
10676  70540                     PWC A
10677   1723    77723A           LDA V26 MKRMODE
10700  42000     2522R           JSM P297   RJUST
10701                           A653 EQU *
10701   2000     6703R           LDA =D1024
10702  70540                     PWC A
10703   2000     2521R           LDA =B17
10704  42000     2522R           JSM P297   RJUST
10705 170201                     RET 1
10706   4002
10707   2202
10710   1767
10711   4004
10712 177634
10706                            LIT
10713                           P656   EQU * GRAT
10713   6000     2110R           LDB =D-2
10714  42000       27X           JSX .ARGA
10715   6000     2153R           LDB =D-5   N
10716  42000       30X           JSX .LDAP
10717 170040                     TCA
10720   6000     1301R           LDB =D-3   M
10721  42000      115X           JSX ADD4P
10722  22000     1277R           ADA =B177777
10723  70540                     PWC A
10724   6000     1301R           LDB =D-3   M
10725  42000       30X           JSX .LDAP
10726                           A657 EQU *
10726  31573    77573A           STA V32635   I
10727  42000       60X           JSX .ARAY
10730              540R          DEF V181   GRATCL
10731  31572    77572A           STA V32634   J
10732 172005                     SAP A658
10733 170040                     TCA
10734   6000     2203R           LDB =D8
10735  42000       75X           JSX .WS4
10736  60000    10741R           JMP A659
10737                           A658 EQU *
10737   6000     2203R           LDB =D8
10740  42000       72X           JSX .WS6
10741                           A659 EQU *
10741   2000     1457R           LDA =D1
10742  21573    77573A           ADA V32635   I
10743 144016       16A           ISZ C,I
10744  66000    10726R           JMP A657
10745  54016       16A           DSZ C
10746  66000       31X           JMX .RTNA
10747                           P219   EQU * MKRDEL
10747   1723    77723A           LDA V26 MKRMODE
10750  72002                     RZA *+2
10751  66000    11007R           JMP A660
10752  42000    10413R           JSM P636   MKRON
10753  42000    10301R           JSM P624   MKRACT
10754  42000    10312R           JSM P218   MKREL
10755 172026                     SAP A661
10756  42000    10323R           JSM P626   MRKROK
10757 172024                     SAP A661
10760   2000     5015R           LDA =D2055
10761   6000     2203R           LDB =D8
10762  42000       75X           JSX .WS4
10763   2000    10707R           LDA =B2202
10764  42000       73X           JSX .W6
10765   2000     4470R           LDA =D1000
10766  70540                     PWC A
10767   1717    77717A           LDA V28 AMKR
10770  22000     1363R           ADA =D-4
10771  42000     2132R           JSM P265   LIMIT
```

```
10772  42000      73X     JSX .W6
10773   2000   10710R     LDA =D1015
10774  70540              PWC A
10775   1720   77720A     LDA V27 AMLVL
10776  22000    1363R     ADA =D-4
10777  42000    2132R     JSM P265  LIMIT
11000  22000   10711R     ADA =D2052
11001  42000      73X     JSX .W6
11002  66000   11007R     JMP A662
11003                    A661 EQU *
11003   2000    2221R     LDA =D9
11004  70540              PWC A
11005   2000    2406R     LDA =D7
11006  42000   10713R     JSM P656  GRAT
11007                    A662 EQU *
11007                    A660 EQU *
11007 170201              RET 1
11010                    P663  EQU * SIMRKR
11010   6000    1277R     LDB =D-1
11011  42000      27X     JSX .ARGA
11012   2000    4470R     LDA =D1000
11013  70540              PWC A
11014   6000    1301R     LDB =D-3  X
11015  42000      30X     JSX .LDAP
11016  22000    1277R     ADA =D-1
11017  42000    2132R     JSM P265  LIMIT
11020  22000    1457R     ADA =D1
11021  31721   77721A     STA V25 MRKR
11022   1616   77616A     LDA V32654  XFLAG
11023  52000    1704R     AND =D6
11024  22000    1363R     ADA =B177774
11025  72011              RZA A664
11026   1616   77616A     LDA V32654  XFLAG
11027  52000    2153R     AND =B177773
11030  31616   77616A     STA V32654  XFLAG
11031 170612              SAL 11
11032 172004              SAP A665
11033  42000      37X     JSX .LDBI
11034          77665A     DEF V8  CFREQ
11035  42000    6016R     JSM P500  STONE
11036                    A665 EQU *
11036                    A664 EQU *
11036   1426   77426A     LDA V32534  UFLAG
11037  62000    1364R     IOR =B100
11040  31426   77426A     STA V32534  UFLAG
11041  42000   10413R     JSM P636  MKRON
11042  42000    2650R     JSM P304  UNCAL
11043  66000      31X     JMX .RTNA
11044                    P666  EQU * WTHRSH
11044   6000    1277R     LDB =D-1
11045  42000      27X     JSX .ARGA
11046   2000    4470R     LDA =D1000
11047  70540              PWC A
11050   6000    1301R     LDB =D-3  I
11051  42000      30X     JSX .LDAP
11052  42000    2132R     JSM P265  LIMIT
11053  31705   77705A     STA V32 THRESH
11054   2000   11067R     LDA =D2169
11055   6000    2203R     LDB =D8
11056  42000      75X     JSX .WS4
11057   1705   77705A     LDA V32 THRESH
11060 170501              SAR 2
11061  52000   11070R     AND =B170777
11062  62000   11071R     IOR =B3000
11063  42000      73X     JSX .W6
11064   2000    2131R     LDA =D15
11065  42000    2314R     JSM P279  SBLK
11066  66000      31X     JMX .RTNA
11067   4171
11070 170777
11071   3000
11067                     LIT
11072                    P667  EQU * WLVLN
11072   6000    1277R     LDB =D-1
11073  42000      27X     JSX .ARGA
11074   2000    4470R     LDA =D1000
11075  70540              PWC A
11076   6000    1301R     LDB =D-3  L
11077  42000      30X     JSX .LDAP
11100  42000    2132R     JSM P265  LIMIT
11101  31704   77704A     STA V33 LEVLIN
11102   2000   11117R     LDA =D2060
11103   6000    2203R     LDB =D8
11104  42000      75X     JSX .WS4
11105   2000   10707R     LDA =B2202
11106  42000      73X     JSX .W6
11107   2000    1463R     LDA =D0
11110  42000      73X     JSX .W6
11111   1704   77704A     LDA V33 LEVLIN
11112  62000    2277R     IOR =D2048
11113  42000      73X     JSX .W6
11114   2000    3527R     LDA =D14
11115  42000    2314R     JSM P279  SBLK
11116  66000      31X     JMX .RTNA
11117   4014
11117                     LIT
11120                    P668  EQU * SPANW
11120   6000    1363R     LDB =D-4
11121  42000      32X     JSX .ARGL
11122  66000   11200R     JMP A669
```

```
11123                    T670 EQU *
11123                    D671  OCT 0,0,20,0  100000
11127                    D672  OCT 0,0,400,0 1000000
11133                    D673  OCT 0,0,20000,0 20000000
11137                    D674  OCT 0,27,0,0  1700000000
11143           11123R   V675 DEF T670 SPANLIMIT
11144                      OCT 177777  177777
11145                      OCT 20  20
11146                    T676 EQU *
11146                    D677  OCT 0,20106,0,0 2.046@-1
11152                    D678  OCT 0,10043,0,0 1.023@-1
11156                    D679  OCT 177600,50425,0,0  5.115@-3
11162                    D680  OCT 177400,60027,62160,54400   6.017647059@-5
11166           11146R   V681 DEF T676 SWPSENS
11167                      OCT 177777  177777
11170                      OCT 20  20
11171                    T682 EQU *
11171                    N683  DEC 1 1
11172                      DEC 1 1
11173                    N684  DEC 2 2
11174                      DEC 4 4
11175           11171R   V685 DEF T682 SCANITEM
11176                      OCT 177777  177777
11177                    K148  OCT 4 4
11200                    A669  EQU *
11200    1605   77605A     LDA V32645  SCANSL
11201   70540              PWC A
11202   42000      34X     JSX .STRD
11203           77671A     DEF V9  SPAN
11204    1606   77606A     LDA V32646  SRCEID
11205   73006             SLA A686
11206   62000    4534R     IOR =B40000
11207   31606   77606A     STA V32646  SRCEID
11210    2000    3654R     LDA =B20
11211    6000    2411R     LDB =D4
11212   42000     112X     JSX .WS7
11213                    A686 EQU *
11213   71500              NRM
11214   35600   77600A     STB V32640  CTIM
11215    6000    1463R     LDB =D0
11216   42000     132X     JSX .FDIG
11217   22000    2417R     ADA =D-6
11220  172003             SAP A687
11221   45600   77600A     ISZ V32640  CTIM
11222                      NOP
11223                    A687 EQU *
11223   42000      37X     JSX .LDBI
11224           77671A     DEF V9  SPAN
11225   42000     127X     JSX MIN3
11226            1457R     DEF =D1
11227    4020      20A     LDB AR2
11230   77414             RLB A688
11231    1604   77604A     LDA V32644  SATN
11232   31573   77573A     STA V32635  I
11233    2000    4207R     LDA =B160000
11234   31604   77604A     STA V32644  SATN
11235    2000    1463R     LDA =D0
11236   31605   77605A     STA V32645  SCANSL
11237   42000      53X     JSX .LDSI
11240            1463R     DEF =D0
11241   42000      34X     JSX .STRD
11242           77671A     DEF V9  SPAN
11243   66000   11401R     JMP A689
11244                    A688 EQU *
11244    1604   77604A     LDA V32644  SATN
11245   70540              PWC A
11246    1733   77733A     LDA V20 FSTIM
11247  172004             SAP A690
11250    1675   77675A     LDA V15 BLEDS
11251   52000   11303R     AND =B177377
11252   31675   77675A     STA V15 BLEDS
11253                    A690 EQU *
11253   42000     156X     JSX .CLBI
11254           11304R     DEF =F1699999900
11255   42000      53X     JSX .LDSI
11256           11310R     DEF =H100
11257   42000     140X     JSX MIN2
11260           77671A     DEF V9  SPAN
11261   42000    2043R     JSM P256  DLIMIT
11262   42000     163X     JSX ADD3
11263           11310R     DEF =H100
11264   42000      34X     JSX .STRD
11265           77671A     DEF V9  SPAN
11266    2000    1457R     LDA =D1
11267   31573   77573A     STA V32635  I
11270                    A691 EQU *
11270    1573   77573A     LDA V32635  I
11271   42000     133X     JSX .LRAY
11272           11143R     DEF V675  SPANLIMIT
11273   42000     134X     JSX .LDBA
11274   42000     145X     JSX SUB2
11275           77671A     DEF V9  SPAN
11276    4020      20A     LDB AR2
11277   77012             SLB A692
11300   45573   77573A     ISZ V32635  I
11301                      NOP
11302   66000   11270R     JMP A691
11303  177377
11304  1699999900
11310     400
```

```
11303                          LIT
11311                         A692 EQU *
11311     1573    77573A        LDA V32635   I
11312    42000       60X        JSX .ARAY
11313             11175R        DEF V685   SCANITEM
11314    31605    77605A        STA V32645   SCANSL
11315    42000       37X        JSX .LDBI
11316             77671A        DEF V9   SPAN
11317    42000       62X        JSX CNV21
11320    42000       36X        JSX .SAR2
11321     1573    77573A        LDA V32635   I
11322    42000      133X        JSX .LRAY
11323             11166R        DEF V681   SWPSENS
11324    42000      134X        JSX .LDBA
11325    42000       64X        JSX MPY1I
11326    42000       65X        JSX CNV12
11327    42000       34X        JSX .SIRD
11330             77655A        DEF V32685   LTEMP2
11331     2000     6703R        LDA =B2000
11332    31604    77604A        STA V32644   SAIN
11333                         A693 EQU *
11333    42000       37X        JSX .LDBI
11334             77655A        DEF V32685   LTEMP2
11335    42000      127X        JSX MIN3
11336             11353R        DEF =H1023
11337     4020       20A        LDB AR2
11340    77014                 SLB A694
11341    42000       37X        JSX .LDBI
11342             77655A        DEF V32685   LTEMP2
11343     6000     1457R        LDB =D1
11344    42000       47X        JSX .DRGI
11345    42000       34X        JSX .SIRD
11346             77655A        DEF V32685   LTEMP2
11347     1604    77604A        LDA V32644   SAIN
11350   170600                  SAL 1
11351    31604    77604A        STA V32644   SAIN
11352    66000    11333R        JMP A693
11353    10043
11353                          LIT
11354                         A694 EQU *
11354     1573    77573A        LDA V32635   I
11355    12000     1457R        CPA =D1
11356    66000    11360R        JMP *+2
11357    66000    11363R        JMP A695
11360     1604    77604A        LDA V32644   SAIN
11361    62000     4534R        IOR =B40000
11362    31604    77604A        STA V32644   SAIN
11363                         A695 EQU *
11363    70760                  WWC A
11364    31573    77573A        STA V32635   I
11365     1731    77731A        LDA V18 SINDEX
11366   170040                  ICA
11367    22000     7565R        ADA =D18
11370    42000      104X        JSX .IORN
11371              5517R        DEF =B100000
11372             77604A        DEF V32644   SAIN
11373    70540                  PWC A
11374    42000       37X        JSX .LDBI
11375             77655A        DEF V32685   LTEMP2
11376    42000       50X        JSX CNV24
11377    42000      136X        JSX .ORT
11400    31604    77604A        STA V32644   SAIN
11401                         A689 EQU *
11401     1605    77605A        LDA V32645   SCANSL
11402    22000     2110R        ADA =D-2
11403   172005                 SAP A696
11404     1603    77603A        LDA V32643   PLUCK
11405    52000    11451R        AND =B67777
11406    62000     5517R        IOR =B100000
11407    31603    77603A        STA V32643   PLUCK
11410                         A696 EQU *
11410     1604    77604A        LDA V32644   SAIN
11411     6000     1457R        LDB =D1
11412    42000       75X        JSX .WS4
11413     1605    77605A        LDA V32645   SCANSL
11414    42000      106X        JSX .W7
11415     1603    77603A        LDA V32643   PLUCK
11416    42000       73X        JSX .W6
11417    70760                  WWC A
11420    31572    77572A        STA V32634   J
11421     1605    77605A        LDA V32645   SCANSL
11422   170040                  ICA
11423    22000     1457R        ADA =D1
11424   170412                  AAR 11
11425    42000      104X        JSX .IORN
11426              3654R        DEF =D16
11427             77616A        DEF V32654   XFLAG
11430    31616    77616A        STA V32654   XFLAG
11431     1605    77605A        LDA V32645   SCANSL
11432    11572    77572A        CPA V32634   J
11433    66000    11435R        JMP *+2
11434    66000    11442R        JMP A698
11435     1573    77573A        LDA V32635   I
11436    42000      120X        JSX .TEST
11437              4534R        DEF =B40000
11440             77604A        DEF V32644   SAIN
11441    72011                 RZA A697
11442                         A698 EQU *
11442    42000       37X        JSX .LDBI
11443             77665A        DEF V8   CFREQ
```

```
11444   42000    6750R     JSM P222   TONE
11445    2000    2107R     LDA =D3
11446    6000    2107R     LDB =D3
11447   42000      75X     JSX .WS4
11450   66000   11462R     JMP A699
11451   67777
11451                     LIT
11452                     A697 EQU *
11452   42000    6723R     JSM P538   CSBLK
11453    1600   77600A     LDA V32640   CTIM
11454  170040              TCA
11455   22000    2406R     ADA =D7
11456  172004             SAP A700
11457    2000    2107R     LDA =D3
11460    6000    2107R     LDB =D3
11461   42000      75X     JSX .WS4
11462                     A700 EQU *
11462                     A699 EQU *
11462   42000    7775R     JSM P603   CSCANBW
11463   66000      31X     JMX .RTNA
11464                     P701  EQU * STEPD
11464    6000    1363R     LDB =D-4
11465   42000      32X     JSX .ARGL
11466   42000      37X     JSX .LDBI
11467           77707A     DEF V11 FOFSET
11470   42000     140X     JSX MIN2
11471           77665A     DEF V8  CFREQ
11472    6000    1375R     LDB =D-9   F
11473   42000     147X     JSX ADD2P
11474   42000      34X     JSX .STRD
11475           77655A     DEF V32685   LTEMP2
11476    1655   77655A     LDA V32685   LTEMP2
11477   73010             SLA A702
11500   42000      37X     JSX .LDBI
11501           77665A     DEF V8  CFREQ
11502   42000     140X     JSX MIN2
11503           77707A     DEF V11 FOFSET
11504    6000    1375R     LDB =D-9   F
11505   42000      43X     JSX .STBP
11506   66000   11523R     JMP A703
11507                     A702 EQU *
11507   42000     140X     JSX MIN2
11510            7220R     DEF =F1739100000
11511    4020      20A     LDB AR2
11512   77011             SLB A704
11513   42000      37X     JSX .LDBI
11514           77665A     DEF V8  CFREQ
11515   42000     140X     JSX MIN2
11516            7220R     DEF =F1739100000
11517   42000     150X     JSX ADD2
11520           77707A     DEF V11 FOFSET
11521    6000    1375R     LDB =D-9   F
11522   42000      43X     JSX .STBP
11523                     A704 EQU *
11523                     A703 EQU *
11523   42000      37X     JSX .LDBI
11524           77665A     DEF V8  CFREQ
11525    6000    1375R     LDB =D-9   F
11526   42000     147X     JSX ADD2P
11527   42000      34X     JSX .STRD
11530           77665A     DEF V8  CFREQ
11531    6000    1375R     LDB =D-9   F
11532   42000      66X     JSX .LDBF
11533   42000      52X     JSX .DEQL
11534  172002             SAP *+2
11535   66000   12177R     JMP A705
11536   42000    6740R     JSM P539   CFDUMP
11537    1616   77616A     LDA V32654   XFLAG
11540   62000    2205R     IOR =B40
11541   31616   77616A     STA V32654   XFLAG
11542    1571   77571A     LDA V32633   L
11543   70540              PWC A
11544    1604   77604A     LDA V32644   SATN
11545  170600              SAL 1
11546  172014             SAP A706
11547   42000     161X     JSX .MVE4
11550           11555R     DEF =F2500000
11551           77661A     DEF V32689   LTEMP1
11552    2000   11561R     LDA =D667
11553   31573   77573A     STA V32635   I
11554   66000   11567R     JMP A707
11555 2500000
11561    1233
11555                     LIT
11562                     A706 EQU *
11562   42000     161X     JSX .MVE4
11563           11777R     DEF =F1250000
11564           77661A     DEF V32689   LTEMP1
11565    2000   12003R     LDA =D333
11566   31573   77573A     STA V32635   I
11567                     A707 EQU *
11567    1604   77604A     LDA V32644   SATN
11570  170600              SAL 1
11571  172004             SAP A708
11572   42000      37X     JSX .LDBI
11573           12004R     DEF =F200000
11574   66000   11577R     JMP A709
11575                     A708 EQU *
11575   42000      37X     JSX .LDBI
11576           12010R     DEF =F400000
```

```
11577                          A709 EQU *
11577    42000       36X         JSX .SAR2
11600     6000     1375R         LDB =D-9   F
11601    42000       66X         JSX .LDBP
11602     6000     1375R         LDB =D-9   F
11603    42000      147X         JSX ADD2P
11604     6000     1704R         LDB =D6
11605    42000       51X         JSX .DLFT
11606    42000      164X         JSX DIV2T
11607    42000       34X         JSX .STRD
11610             77655A         DEF V32685   LTEMP2
11611    42000      146X         JSX DIV3
11612              5741R         DEF =H7500
11613    42000       50X         JSX CNV24
11614    21614    77614A         ADA V32652   DAC2
11615    31614    77614A         STA V32652   DAC2
11616    42000       37X         JSX .LDBI
11617             77655A         DEF V32685   LTEMP2
11620    42000      140X         JSX MIN2
11621             77641A         DEF V32673   VIOFREQ
11622    42000       34X         JSX .STRD
11623             77641A         DEF V32673   VIOFREQ
11624    42000       37X         JSX .LDBI
11625              7250R         DEF =F25000000
11626    42000      140X         JSX MIN2
11627             77641A         DEF V32673   VIOFREQ
11630    42000       34X         JSX .STRD
11631             77742A         DEF V32738   XL
11632     4020       20A         LDB AR2
11633    77202                   SLB *+2,C
11634    34020       20A         STB AR2
11635    42000      140X         JSX MIN2
11636             77661A         DEF V32689   LTEMP1
11637     4020       20A         LDB AR2
11640    77026                  SLB A710
11641     1742    77742A         LDA V32738   IX
11642   170601                   SAL 2
11643   170040                   ICA
11644    22000     2276R         ADA =D2
11645    31742    77742A         STA V32738   IX
11646    21571    77571A         ADA V32633   L
11647    31571    77571A         STA V32633   L
11650     1742    77742A         LDA V32738   IX
11651   170400                   AAR 1
11652     5573    77573A         LDB V32635   I
11653    75617                   MPY
11654    21614    77614A         ADA V32652   DAC2
11655    31614    77614A         STA V32652   DAC2
11656     1742    77742A         LDA V32738   IX
11657    42000      122X         JSX CNV42
11660    42000      153X         JSX MPY2
11661             77661A         DEF V32689   LTEMP1
11662    42000      140X         JSX MIN2
11663             77641A         DEF V32673   VIOFREQ
11664    42000       34X         JSX .STRD
11665             77641A         DEF V32673   VIOFREQ
11666                          A710 EQU *
11666    42000       37X         JSX .LDBI
11667             77655A         DEF V32685   LTEMP2
11670    42000       50X         JSX CNV24
11671    42000      113X         JSX DIV4
11672              3654R         DEF =D16
11673    21615    77615A         ADA V32653   DAC1
11674    31615    77615A         STA V32653   DAC1
11675    70760                   WWC A
11676    31573    77573A         STA V32635   I
11677    11571    77571A         CPA V32633   L
11700    66000    11702R         JMP *+2
11701    66000    11716R         JMP A712
11702     1615    77615A         LDA V32653   DAC1
11703    52000     5742R         AND =B176000
11704    72012                  RZA A712
11705    42000       37X         JSX .LDBI
11706             77655A         DEF V32685   LTEMP2
11707     4020       20A         LDB AR2
11710    77202                   SLB *+2,C
11711    34020       20A         STB AR2
11712    42000      127X         JSX MIN3
11713              5741R         DEF =H7500
11714     4020       20A         LDB AR2
11715    77002                  SLB A711
11716                          A712 EQU *
11716    42000     5656R         JSM P487   VIOTUNE
11717                          A711 EQU *
11717     1615    77615A         LDA V32653   DAC1
11720     6000     1463R         LDB =D0
11721    42000       75X         JSX .WS4
11722     1614    77614A         LDA V32652   DAC2
11723    42000      105X         JSX .W5
11724     6000     1375R         LDB =D-9   F
11725    42000       66X         JSX .LDBP
11726     6000     1375R         LDB =D-9   F
11727    42000      147X         JSX ADD2P
11730     6000     1704R         LDB =D6
11731    42000       47X         JSX .DRGI
11732    42000       50X         JSX CNV24
11733   170600                   SAL 1
11734   170040                   ICA
11735    21571    77571A         ADA V32633   L
11736    31571    77571A         STA V32633   L
```

```
11737 170403                AAR 4
11740 170040                TCA
11741  21570   77570A       ADA V32632   M
11742  31570   77570A       STA V32632   M
11743   1571   77571A       LDA V32633   L
11744  52000    3527R       AND =D14
11745  31571   77571A       STA V32633   L
11746   1746   77746A       LDA V32742   N
11747  70540                PWC A
11750                      A713 EQU *
11750   1570   77570A       LDA V32632   M
11751  22000    2066R       ADA =D-8
11752 172417                SAM A715
11753   1570   77570A       LDA V32632   M
11754  12000    2203R       CPA =D8
11755  66000   11757R       JMP *+2
11756  66000   12015R       JMP A714
11757   1571   77571A       LDA V32633   L
11760 170040                TCA
11761  22000    2204R       ADA =D10
11762 172407                SAM A716
11763   1571   77571A       LDA V32633   L
11764 170040                TCA
11765 172030                SAP A714
11766   1604   77604A       LDA V32644   SAIN
11767 170600                SAL 1
11770 172425                SAM A714
11771                      A716 EQU *
11771                      A715 EQU *
11771   1570   77570A       LDA V32632   M
11772  22000   12014R       ADA =D-13
11773  42000     113X       JSX DIV4
11774           2405R       DEF =D5
11775  31573   77573A       STA V32635   I
11776  66000   12042R       JMP A717
11777 1250000
12003    515
12004 200000
12010 400000
12014 177763
11777                       LIT
12015                      A714 EQU *
12015   1570   77570A       LDA V32632   M
12016 170040                TCA
12017  22000    2172R       ADA =D13
12020 172413                SAM A719
12021   1570   77570A       LDA V32632   M
12022  12000    2172R       CPA =D13
12023  66000   12025R       JMP *+2
12024  66000   12040R       JMP A718
12025   1571   77571A       LDA V32633   L
12026  22000    3526R       ADA =D-10
12027 172011                SAP A718
12030   1604   77604A       LDA V32644   SAIN
12031 170600                SAL 1
12032 172006                SAP A718
12033                      A719 EQU *
12033   1570   77570A       LDA V32632   M
12034  22000    2066R       ADA =D-8
12035  42000     113X       JSX DIV4
12036           2405R       DEF =D5
12037  66000   12041R       JMP A720
12040                      A718 EQU *
12040   2000    1463R       LDA =D0
12041                      A720 EQU *
12041  31573   77573A       STA V32635   I
12042                      A717 EQU *
12042   6000    2405R       LDB =D5
12043  75617                MPY
12044 170040                TCA
12045  21570   77570A       ADA V32632   M
12046  31570   77570A       STA V32632   M
12047   1573   77573A       LDA V32635   I
12050  42000     125X       JSX CNV43
12051  42000     163X       JSX ADD3
12052          77746A       DEF V32742   N
12053     23      23A       LDA AR2+3
12054  31746   77746A       STA V32742   N
12055   1573   77573A       LDA V32635   I
12056  72402                SZA *+2
12057  66000   11750R       JMP A713
12060  42000    2154R       JSM P269   *SPIN
12061   6000    1375R       LDB =D-9   F
12062  42000      66X       JSX .LDBP
12063  42000     150X       JSX ADD2
12064          77635A       DEF V32669   CFREST
12065   6000    1375R       LDB =D-9   F
12066  42000      43X       JSX .STBP
12067  70760                WWC A
12070  31573   77573A       STA V32635   I
12071   4020      20A       LDB AR2
12072  77202                SLB *+2,C
12073  34020      20A       STB AR2
12074  42000     145X       JSX SUB2
12075           7237R       DEF =F1700000
12076   4020      20A       LDB AR2
12077  77017                SLB A722
12100   1573   77573A       LDA V32635   I
12101  42000     120X       JSX .TEST
12102           1277R       DEF =B177777
```

```
12103             77746A    DEF V32742  N
12104    72412             SZA A722
12105     1605    77605A    LDA V32645  SCANSL
12106   170615              SAL 14
12107   172402              SAM *+2
12110    66000    12173R    JMP A721
12111     1731    77731A    LDA V18 SINDEX
12112   170040              ICA
12113    22000     2221R    ADA =D9
12114   172402              SAM *+2
12115    66000    12173R    JMP A721
12116                      A722 EQU *
12116     2000     3166R    LDA =D1023
12117    70540              PWC A
12120     6000     1375R    LDB =D-9  F
12121    42000      66X     JSX .LDBP
12122    42000     151X     JSX DIV2
12123              7237R    DEF =F1700000
12124    42000      50X     JSX CNV24
12125    21613    77613A    ADA V32651  DAC4
12126    42000     2132R    JSM P265  LIMIT
12127    31613    77613A    STA V32651  DAC4
12130     6000     1463R    LDB =D0
12131    42000     112X     JSX .WS7
12132     6000     1375R    LDB =D-9  F
12133    42000      66X     JSX .LDBP
12134    42000     155X     JSX MOD2
12135              7237R    DEF =F1700000
12136    42000      34X     JSX .STRD
12137             77635A    DEF V32669  CFREST
12140     1616    77616A    LDA V32654  XFLAG
12141   170612              SAL 11
12142   172415             SAM A723
12143     1603    77603A    LDA V32643  PLUCK
12144    52000    11451R    AND =B67777
12145    62000     7225R    IOR =B110000
12146     6000     1457R    LDB =D1
12147    42000      72X     JSX .WS6
12150    42000     7671R    JSM P595  YIGSHFT
12151    42000     5252R    JSM P460  YIGSLEW
12152     1603    77603A    LDA V32643  PLUCK
12153     6000     1457R    LDB =D1
12154    42000      72X     JSX .WS6
12155    42000     5252R    JSM P460  YIGSLEW
12156    66000    12166R    JMP A724
12157                      A723 EQU *
12157    42000      37X     JSX .LDB1
12160             12167R    DEF =F100000000
12161    42000     140X     JSX MIN2
12162             77671A    DEF V9  SPAN
12163     4020      20A     LDB AR2
12164    77002             SLB A725
12165    42000     6160R    JSM P502  EOS
12166                      A725 EQU *
12166                      A724 EQU *
12166    66000    12177R    JMP A726
12167 100000000
12167                       LIT
12173                      A721 EQU *
12173     6000     1375R    LDB =D-9  F
12174    42000      66X     JSX .LDBP
12175    42000      34X     JSX .STRD
12176             77635A    DEF V32669  CFREST
12177                      A726 EQU *
12177                      A705 EQU *
12177    66000      31X     JMX .RTNA
12200                      P727  EQU * STEPH
12200     6000     1363R    LDB =D-4
12201    42000      32X     JSX .ARGL
12202     1763    77763A    LDA E
12203    22000     2153R    ADA =D-5
12204    22000     2107R    ADA =D3
12205    31573    77573A    STA V32635  I
12206   101573    77573A    LDA V32635,I  I
12207    52000     2110R    AND =B177776
12210   131573    77573A    STA V32635,I  I
12211    42000     126X     JSX MPY3
12212              2405R    DEF =D5
12213     6000     1457R    LDB =D1
12214    42000      47X     JSX .DRGT
12215    42000    11464R    JSM P701  STEPD
12216    42000      37X     JSX .LDB1
12217             77671A    DEF V9  SPAN
12220     6000     1375R    LDB =D-9  F
12221    42000     147X     JSX ADD2P
12222    42000    11120R    JSM P668  SPANW
12223    66000      31X     JMX .RTNA
12224                      P728  EQU * STEPL
12224     6000     1363R    LDB =D-4
12225    42000      32X     JSX .ARGL
12226     1763    77763A    LDA E
12227    22000     2153R    ADA =D-5
12230    22000     2107R    ADA =D3
12231    31573    77573A    STA V32635  I
12232   101573    77573A    LDA V32635,I  I
12233    52000     2110R    AND =B177776
12234   131573    77573A    STA V32635,I  I
12235    42000     126X     JSX MPY3
12236              2405R    DEF =D5
12237     6000     1457R    LDB =D1
```

```
12240  42000     47X   JSX .DRGT
12241  42000  11464R   JSM P701   STEPD
12242   6000   1375R   LDB =D-9   F
12243  42000     66X   JSX .LDBP
12244  42000    140X   JSX MIN2
12245         77671A   DEF V9   SPAN
12246  42000  11120R   JSM P668   SPANW
12247  66000     31X   JMX .RTNA
12250                 P729  EQU * STEPF
12250   6000   1363R   LDB =D-4
12251  42000     32X   JSX .ARGL
12252  42000  11464R   JSM P701   STEPD
12253   1600  77600A   LDA V32640   CTIM
12254 170040           TCA
12255  22000   2203R   ADA =D8
12256 172004          SAF A730
12257   2000   2107R   LDA =D3
12260   6000   2107R   LDB =D3
12261  42000     75X   JSX .WS4
12262                 A730 EQU *
12262   2000   2406R   LDA =D7
12263  42000   2314R   JSM P279   SBLK
12264  66000     31X   JMX .RTNA
12265                 P731  EQU * DSWRT
12265   6000   1277R   LDB =D-1
12266  42000     27X   JSX .ARGA
12267   1563  77563A   LDA V32627   DSTAD
12270   6000   2203R   LDB =D8
12271  42000     75X   JSX .WS4
12272   6000   1301R   LDB =D-3   N
12273  42000     30X   JSX .LDAP
12274  42000     73X   JSX .W6
12275   1563  77563A   LDA V32627   DSTAD
12276  22000   1457R   ADA =D1
12277  52000   6353R   AND =B7777
12300  31563  77563A   STA V32627   DSTAD
12301  66000     31X   JMX .RTNA
12302                 P732  EQU * WKEY
12302   1612  77612A    LDA V32650   NCHR
12303  21737  77737A    ADA V32735   BLKS
12304  21611  77611A    ADA V32649   CHRC
12305   6000   2203R    LDB =D8
12306  42000     75X    JSX .WS4
12307   1566  77566A    LDA V32630   KEYCODE
12310  42000     73X    JSX .W6
12311   2000   2500R    LDA =D147
12312  42000     73X    JSX .W6
12313  42000     73X    JSX .W6
12314  45611  77611A    ISZ V32649   CHRC
12315                   NOP
12316 170201            RET 1
12317                 P733  EQU * CLRNUM
12317   1616  77616A    LDA V32654   XFLAG
12320 170602            SAL 3
12321 172012           SAP A734
12322   2000   1463R    LDA =D0
12323  31611  77611A    STA V32649   CHRC
12324   1616  77616A    LDA V32654   XFLAG
12325  52000   6371R    AND =B167777
12326  31616  77616A    STA V32654   XFLAG
12327  42000     53X    JSX .LDSI
12330          1463R    DEF =D0
12331  42000     34X    JSX .STRD
12332         77651A    DEF V32681   LTEMP
12333                 A734 EQU *
12333 170201            RET 1
12334                 P217  EQU * MBLK
12334   1576  77576A    LDA V32638   RPGPTR
12335  12000   7565R    CPA =D18
12336  66000  12341R    JMP A735
12337  42000   2551R    JSM P298   ABLK
12340  66000  12473R    JMP A736
12341                 A735 EQU *
12341   1723  77723A    LDA V26 MKRMODE
12342  22000  12375R    ADA =D-21
12343 172405           SAM A738
12344   1426  77426A    LDA V32534   UFLAG
12345 170610            SAL 9
12346 172002            SAP *+2
12347  66000  12456R    JMP A737
12350                 A738 EQU *
12350  66000  12376R    JMP A739
12351                 P740  EQU * COPY
12351                 A741 EQU *
12351   1573  77573A    LDA V32635   I
12352  42000    103X    JSX .W4
12353  42000    162X    JSX .R5
12354  31656  77656A    STA V34 BCDA
12355  52000   3242R    AND =B377
12356  31656  77656A    STA V34 BCDA
12357   1572  77572A    LDA V32634   J
12360  42000    103X    JSX .W4
12361   1656  77656A    LDA V34 BCDA
12362  12000   2421R    CPA =D146
12363  66000  12365R    JMP A742
12364  42000     73X    JSX .W6
12365                 A742 EQU *
12365  45573  77573A    ISZ V32635   I
12366                   NOP
12367  45572  77572A    ISZ V32634   J
```

```
12370                          NOP
12371   12000    2421R         CPA =D146
12372   66000   12374R         JMP *+2
12373   66000   12351R         JMP A741
12374  170201                  RET 1
12375  177753
12375                         LIT
12376                        A739   EQU *
12376   42000   12317R         JSM P733   CLRNUM
12377    1616   77616A         LDA V32654   XFLAG
12400   62000    2644R         IOR =B10000
12401   31616   77616A         STA V32654   XFLAG
12402    2000    1463R         LDA =D0
12403   31617   77617A         STA V32655   DECFLG
12404    1737   77737A         LDA V32735   BLKS
12405   21612   77612A         ADA V32650   NCHR
12406   31572   77572A         STA V32634   J
12407    6000    2203R         LDB =D8
12410   34011      11A         STB PA
12411    2000    2107R         LDA =D3
12412    5723   77723A         LDB V26 MKRMODE
12413   75617                  MPY
12414   22000    2110R         ADA =D-2
12415   42000      60X         JSX .ARAY
12416              210R        DEF V112   SFTXY
12417   70541                  PWC B
12420    1723   77723A         LDA V26 MKRMODE
12421   42000      60X         JSX .ARAY
12422              267R        DEF V119   SFTAB
12423  100000                  LDA A,I
12424   42000      77X         JSX ADD4B
12425   22000    1704R         ADA =D6
12426   31573   77573A         STA V32635   I
12427   42000   12351R         JSM P740   COPY
12430   42000    2173R         JSM P271   CRLF
12431    1572   77572A         LDA V32634   J
12432   22000    2276R         ADA =D2
12433   31572   77572A         STA V32634   J
12434    2000    2107R         LDA =D3
12435    6000    2521R         LDB =D17
12436   75617                  MPY
12437   22000    2110R         ADA =D-2
12440   42000      60X         JSX .ARAY
12441              210R        DEF V112   SFTXY
12442   70541                  PWC B
12443    2000    2521R         LDA =D17
12444   42000      60X         JSX .ARAY
12445              267R        DEF V119   SFTAB
12446  100000                  LDA A,I
12447   42000      77X         JSX ADD4B
12450   22000    1704R         ADA =D6
12451   31573   77573A         STA V32635   I
12452   42000   12351R         JSM P740   COPY
12453    2000    2500R         LDA =D147
12454   42000      73X         JSX .W6
12455   66000   12473R         JMP A743
12456                        A737 EQU *
12456   42000   12317R         JSM P733   CLRNUM
12457    1612   77612A         LDA V32650   NCHR
12460   21737   77737A         ADA V32735   BLKS
12461    6000    2203R         LDB =D8
12462   42000      75X         JSX .WS4
12463    2000    2500R         LDA =D147
12464   42000      73X         JSX .W6
12465   42000      73X         JSX .W6
12466    1616   77616A         LDA V32654   XFLAG
12467   62000    2644R         IOR =B10000
12470   31616   77616A         STA V32654   XFLAG
12471    2000    1463R         LDA =D0
12472   31617   77617A         STA V32655   DECFLG
12473                        A743 EQU *
12473                        A736 EQU *
12473  170201                  RET 1
12474                        P744   EQU * UNITS
12474   66000   12513R         JMP A746
12475                        I747 EQU *
12475                        B748   HEX 1113   1113
12476                        B749   HEX 2311   2311
12477                        B750   HEX 1114   1114
12500                        B751   HEX 0223   0223
12501                        B752   HEX 2111   2111
12502                        B753   HEX 1110   1110
12503                          HEX 10   10
12504                        B754   HEX 2010   2010
12505                        B755   HEX 210 210
12506                        B683   HEX 1 1
12507                        B756   HEX 1200   1200
12510           12475R       V757 DEF I747 UNITSTAB
12511                          OCT 177777   177777
12512                          OCT 13   13
12513                        A746   EQU *
12513    1740   77740A         LDA V32736   EFLAG
12514  170606                  SAL 7
12515  172025                 SAP A758
12516    1601   77601A         LDA V32641   HPBC
12517  170601                  SAL 2
12520  172422                 SAM A758
12521    2000    3654R         LDA =B20
12522    6000    2411R         LDB =D4
12523   42000     112X         JSX .WS7
```

```
12524    1740  77740A     LDA V32736  EFLAG
12525   52000  11303R     AND =B177377
12526   31740  77740A     STA V32736  EFLAG
12527    1616  77616A     LDA V32654  XFLAG
12530  170600             SAL 1
12531  172011            SAP A759
12532    1620  77620A     LDA V32656  PREFIX
12533   12000  10243R     CPA =D27
12534   66000  12542R     JMP A759
12535    1565  77565A     LDA V32629  SRQEN
12536   52000   5517R     AND =B100000
12537   62000   6514R     IOR =B77777
12540   31565  77565A     STA V32629  SRQEN
12541   66000  13027R     JMP L745  EXU
12542                   A759 EQU *
12542                   A758 EQU *
12542    1620  77620A     LDA V32656  PREFIX
12543   72002             RZA *+2
12544   66000  13027R     JMP A760
12545    1566  77566A     LDA V32630  KEYCODE
12546   12000   2107R     CPA =D3
12547   66000  12551R     JMP *+2
12550   66000  12555R     JMP A761
12551    1616  77616A     LDA V32654  XFLAG
12552  170602             SAL 3
12553  172002             SAP *+2
12554   66000  13027R     JMP A760
12555                   A761 EQU *
12555    1617  77617A     LDA V32655  DECFLG
12556  172003            SAP A762
12557   22000   1457R     ADA =D1
12560   31617  77617A     STA V32655  DECFLG
12561                   A762 EQU *
12561    1616  77616A     LDA V32654  XFLAG
12562  170602             SAL 3
12563  172407            SAM A764
12564    1611  77611A     LDA V32649  CHRC
12565   12000   1457R     CPA =D1
12566   66000  12570R     JMP *+2
12567   66000  12604R     JMP A763
12570    1651  77651A     LDA V32681  LTS
12571   73013            SLA A763
12572                   A764 EQU *
12572    1651  77651A     LDA V32681  LTS
12573   73005            SLA A765
12574   42000     53X     JSX .LDSI
12575           1457R     DEF =D1
12576   42000    165X     JSX .BMIN
12577   66000  12602R     JMP A766
12600                   A765 EQU *
12600   42000     53X     JSX .LDSI
12601           1457R     DEF =D1
12602                   A766 EQU *
12602   42000     34X     JSX .STRD
12603          77651A     DEF V32681  LTEMP
12604                   A763 EQU *
12604    1601  77601A     LDA V32641  HPBC
12605  170600             SAL 1
12606  172014            SAP A767
12607   42000     37X     JSX .LDBI
12610          77651A     DEF V32681  LTEMP
12611   42000     50X     JSX CNV24
12612   21617  77617A     ADA V32655  DECFLG
12613   31617  77617A     STA V32655  DECFLG
12614   42000    161X     JSX .MVE4
12615          77621A     DEF V32657  MANT
12616          77651A     DEF V32681  LTEMP
12617    1601  77601A     LDA V32641  HPBC
12620   52000   2645R     AND =B137777
12621   31601  77601A     STA V32641  HPBC
12622                   A767 EQU *
12622    1620  77620A     LDA V32656  PREFIX
12623   22000   1277R     ADA =D-1
12624   52000   2107R     AND =D3
12625   22000   2203R     ADA =D8
12626   70540             PWC A
12627    1620  77620A     LDA V32656  PREFIX
12630   22000   2107R     ADA =D3
12631  170501             SAR 2
12632   42000     60X     JSX .ARAY
12633          12510R     DEF V757  UNITSTAB
12634   42000     61X     JSX .LDSA
12635   70761             WWC B
12636   42000    132X     JSX .FDIG
12637   66000  13001R     JMP A768
12640                   C769 EQU *
12640    1566  77566A     LDA V32630  KEYCODE
12641   12000   2107R     CPA =D3
12642   66000  12644R     JMP *+2
12643   66000  12661R     JMP A770
12644    1620  77620A     LDA V32656  PREFIX
12645   12000   2107R     CPA =D3
12646   66000  12655R     JMP A771
12647    1576  77576A     LDA V32638  RPGPTR
12650   12000   7565R     CPA =D18
12651   66000  12653R     JMP *+2
12652   66000  12661R     JMP A770
12653    1605  77605A     LDA V32645  SCANSL
12654   72005            RZA A770
12655                   A771 EQU *
```

```
12655   1617   77617A    LDA V32655   DECFLG
12656  22000    1704R    ADA =D6
12657  31617   77617A    STA V32655   DECFLG
12660  66000   12706R    JMP A772
12661                   A770 EQU *
12661   1566   77566A    LDA V32630   KEYCODE
12662  12000   10240R    CPA =B57
12663  66000   12665R    JMP *+2
12664  66000   12670R    JMP A773
12665   1617   77617A    LDA V32655   DECFLG
12666  22000    2221R    ADA =D9
12667  31617   77617A    STA V32655   DECFLG
12670                   A773 EQU *
12670   1566   77566A    LDA V32630   KEYCODE
12671  12000   12734R    CPA =B43
12672  66000   12674R    JMP *+2
12673  66000   12677R    JMP A774
12674   1617   77617A    LDA V32655   DECFLG
12675  22000    1704R    ADA =D6
12676  31617   77617A    STA V32655   DECFLG
12677                   A774 EQU *
12677   1566   77566A    LDA V32630   KEYCODE
12700  12000   10141R    CPA =B46
12701  66000   12703R    JMP *+2
12702  66000   12706R    JMP A775
12703   1617   77617A    LDA V32655   DECFLG
12704  22000    2107R    ADA =D3
12705  31617   77617A    STA V32655   DECFLG
12706                   A775 EQU *
12706                   A772 EQU *
12706  66000   13002R    JMP A776
12707                   C777 EQU *
12707   1566   77566A    LDA V32630   KEYCODE
12710  12000    2107R    CPA =D3
12711  66000   12713R    JMP *+2
12712  66000   12735R    JMP A778
12713   1730   77730A    LDA V30 KFLAG
12714 170606             SAL 7
12715 172005             SAP A779
12716   1620   77620A    LDA V32656   PREFIX
12717 170500             SAR 1
12720  12000    2406R    CPA =D7
12721  66000   12735R    JMP A778
12722                   A779 EQU *
12722   1730   77730A    LDA V30 KFLAG
12723 170515             SAR 14
12724   4000             LDB A
12725  26000    1301R    ADB =B177775
12726   2000    2221R    LDA =D9
12727  76402             SZB A780
12730   2000    1457R    LDA =D1
12731                   A780 EQU *
12731  21617   77617A    ADA V32655   DECFLG
12732  31617   77617A    STA V32655   DECFLG
12733  66000   12775R    JMP A781
12734     43
12734                    LIT
12735                   A778 EQU *
12735   1566   77566A    LDA V32630   KEYCODE
12736  22000   10241R    ADA =D-29
12737  42000     113X    JSX DIV4
12740           2107R    DEF =D3
12741  66000   12774R    JMP A782
12742                   C783 EQU *
12742   1617   77617A    LDA V32655   DECFLG
12743  22000    2107R    ADA =D3
12744  31617   77617A    STA V32655   DECFLG
12745  66000   12775R    JMP A784
12746                   C785 EQU *
12746  45617   77617A    ISZ V32655   DECFLG
12747                    NOP
12750  42000      37X    JSX .LDBI
12751          77651A    DEF V32681   LTEMP
12752  42000     165X    JSX .BMIN
12753  42000      34X    JSX .STRD
12754          77651A    DEF V32681   LTEMP
12755  66000   12775R    JMP A784
12756                   C786 EQU *
12756   1617   77617A    LDA V32655   DECFLG
12757  22000    1704R    ADA =D6
12760  31617   77617A    STA V32655   DECFLG
12761  66000   12775R    JMP A784
12762                   C787 EQU *
12762  45617   77617A    ISZ V32655   DECFLG
12763                    NOP
12764  66000   12775R    JMP A784
12765          12762R    DEF C787
12766          12775R    DEF A784
12767          12775R    DEF A784
12770          12756R    DEF C786
12771          12746R    DEF C785
12772          12742R    DEF C783
12773                    DEC -7
12774  42000     143X   A782  JSX .CASE
12775                   A784 EQU *
12775                   A781 EQU *
12775  66000   13002R    JMP A776
12776          12707R    DEF C777
12777          12640R    DEF C769
13000                    DEC -3
```

```
13001  42000    143X   A768  JSX .CASE
13002                  A776 EQU *
13002   1617  77617A    LDA V32655  DECFLG
13003 172010            SAP A788
13004  22000   2565R    ADA =D11
13005  70540            PWC A
13006  42000     37X    JSX .LDBI
13007         77651A    DEF V32681  LTEMP
13010  42000     26X    JSM P213  ROUND
13011  42000     34X    JSX .STRD
13012         77651A    DEF V32681  LTEMP
13013                  A788 EQU *
13013  42000     37X    JSX .LDBI
13014         77651A    DEF V32681  LTEMP
13015   5617  77617A    LDB V32655  DECFLG
13016  42000    123X    JSX .DSFI
13017  42000     34X    JSX .STRD
13020         77651A    DEF V32681  LTEMP
13021   1616  77616A    LDA V32654  XFLAG
13022  52000  11451R    AND =B67777
13023  62000   5517R    IOR =B100000
13024  31616  77616A    STA V32654  XFLAG
13025   2000   1463R    LDA =D0
13026  31617  77617A    STA V32655  DECFLG
13027                  A760 EQU *
13027                  L745  EQU * EXU
13027 170201            RET 1
13030                  P789  EQU * WCRLF
13030   2000   2172R    LDA =D13
13031  42000     17X    JSM P206  WHPIB
13032   1730  77730A    LDA V30 KFLAG
13033 170607            SAL 8
13034 172402            SAM A790
13035  42000     16X    JSM P205  WEOI
13036                  A790 EQU *
13036   2000   2204R    LDA =D10
13037  42000     17X    JSM P206  WHPIB
13040   1730  77730A    LDA V30 KFLAG
13041  52000  13044R    AND =B177577
13042  31730  77730A    STA V30 KFLAG
13043 170201            RET 1
13044 177577
13044                   LIT
13045                  P791  EQU * DHPB
13045   1601  77601A    LDA V32641  HPBC
13046 172406            SAM A792
13047  62000   5517R    IOR =B100000
13050  31601  77601A    STA V32641  HPBC
13051   2000   1463R    LDA =D0
13052   6000   2107R    LDB =D3
13053  42000    107X    JSX .WS5
13054                  A792 EQU *
13054  42000    166X    JSX .CSHV
13055         32476R    DEF L193  RESET
13056  42000    166X    JSX .CSHV
13057         32473R    DEF L195  ABORT
13060  42000     14X    JSM P203  HPBSY
13061 170201            RET 1
13062                  P793  EQU * NDUMP
13062   6000   2417R    LDB =D-6
13063  42000     32X    JSX .ARGL
13064  66000  13163R    JMP A794
13065                  T795 EQU *
13065         13126R    DEF ="Hz"
13066         13130R    DEF ="KHz"
13067         13133R    DEF ="MHz"
13070         13065R   V796 DEF T795 HZUNIT
13071                   OCT 177777  177777
13072                   OCT 3 3
13073                  T797 EQU *
13073                  N798  DEC 237 237
13074                  K799  OCT 155 155
13075                   OCT 40  40
13076         13073R   V800 DEF T797 SUNIT
13077                   OCT 177777  177777
13100                   OCT 3 3
13101                  T801 EQU *
13101                  K802  OCT 156 156
13102                   DEC 237 237
13103                   OCT 155 155
13104                   OCT 40  40
13105         13101R   V803 DEF T801 VUNIT
13106                   OCT 177777  177777
13107                   OCT 4 4
77773                  V804  EQU 77773B  ASEND
13110                  P805  EQU * DBL
13110   1675  77675A    LDA V15 BLEDS
13111 170501            SAR 2
13112  52000   1457R    AND =D1
13113  22000   1457R    ADA =D1
13114 170040            TCA
13115  21573  77573A    ADA V32635  I
13116  31656  77656A    STA V34 BCDA
13117 172006            SAP A806
13120   6000  13136R    LDB =D-11 DIGS
13121  42000     71X    JSX MIN4P
13122  31573  77573A    STA V32635  I
13123   6000  13136R    LDB =D-11 DIGS
13124  42000     67X    JSX .STAP
13125                  A806 EQU *
```

```
13125 170201              RET 1
13126 HZ
13130 KHZ
13133 MHZ
13136 177765
13126                    LIT
13137                    P807  EQU * HZSEC
13137    1573   77573A     LDA V32635  I
13140   42000     121X     JSX MOD4
13141            2107R     DEF =D3
13142   31656   77656A     STA V34 BCDA
13143   72405              SZA A809
13144    1573   77573A     LDA V32635  I
13145 170040               ICA
13146   22000    2221R     ADA =D9
13147 172004               SAP A806
13150                    A809 EQU *
13150    1656   77656A     LDA V34 BCDA
13151   22000    2107R     ADA =D3
13152   31656   77656A     STA V34 BCDA
13153                    A808 EQU *
13153    1573   77573A     LDA V32635  I
13154   12000    1456R     CPA =D12
13155   66000   13157R     JMP *+2
13156   66000   13162R     JMP A810
13157    1656   77656A     LDA V34 BCDA
13160   22000    2107R     ADA =D3
13161   31656   77656A     STA V34 BCDA
13162                    A810 EQU *
13162 170201               RET 1
13163                    A794  EQU *
13163    6000    1375R     LDB =D-9  NUM
13164   42000      66X     JSX .LDBP
13165   71500              NRM
13166   35573   77573A     STB V32635  I
13167   42000      34X     JSX .STRD
13170           77742A     DEF V32738  XL
13171    6000   13136R     LDB =D-11 DIGS
13172   42000      30X     JSX .LDAP
13173 172402               SAM *+2
13174   66000   13247R     JMP A811
13175   42000      37X     JSX .LDBI
13176           77671A     DEF V9  SPAN
13177   42000      52X     JSX .DEGL
13200 172015               SAP A812
13201    2000    2107R     LDA =D3
13202   70540              PWC A
13203   42000    2070R     JSM P261  IFBW
13204 170500               SAR 1
13205   22000    2110R     ADA =D-2
13206   42000    2132R     JSM P265  LIMIT
13207   21573   77573A     ADA V32635  I
13210 170040               ICA
13211   22000    1456R     ADA =D12
13212    6000   13136R     LDB =D-11 DIGS
13213   42000      67X     JSX .STAP
13214   66000   13225R     JMP A813
13215                    A812 EQU *
13215   71500              NRM
13216   35572   77572A     STB V32634  J
13217    1573   77573A     LDA V32635  I
13220 170040               ICA
13221   21572   77572A     ADA V32634  J
13222   22000    2411R     ADA =D4
13223    6000   13136R     LDB =D-11 DIGS
13224   42000      67X     JSX .STAP
13225                    A813 EQU *
13225 170040               ICA
13226 172410               SAM A814
13227   42000      53X     JSX .LDSI
13230            1463R     DEF =D0
13231   42000      34X     JSX .STRD
13232           77742A     DEF V32738  XL
13233    2000    1456R     LDA =D12
13234   31573   77573A     STA V32635  I
13235   66000   13247R     JMP A815
13236                    A814 EQU *
13236    6000   13136R     LDB =D-11 DIGS
13237   42000      30X     JSX .LDAP
13240   22000    1277R     ADA =D-1
13241   70540              PWC A
13242   42000      37X     JSX .LDBI
13243           77742A     DEF V32738  XL
13244   42000      26X     JSM P213  ROUND
13245   42000      34X     JSX .STRD
13246           77742A     DEF V32738  XL
13247                    A815 EQU *
13247                    A811 EQU *
13247    1573   77573A     LDA V32635  I
13250   12000    1456R     CPA =D12
13251   66000   13253R     JMP *+2
13252   66000   13260R     JMP A816
13253    2000    1457R     LDA =D1
13254   31573   77573A     STA V32635  I
13255    6000   13136R     LDB =D-11 DIGS
13256   42000      67X     JSX .STAP
13257   66000   13263R     JMP A817
13260                    A816 EQU *
13260 170040               ICA
13261   22000    1456R     ADA =D12
```

```
13262  31573  77573A    STA V32635  I
13263                 A817 EQU *
13263   6000  13136R    LDB =D-11 DIGS
13264  42000     30X    JSX .LDAP
13265 170040            TCA
13266  21573  77573A    ADA V32635  I
13267 172004           SAP A818
13270   1573  77573A    LDA V32635  I
13271   6000  13136R    LDB =D-11 DIGS
13272  42000     67X    JSX .STAP
13273                 A818 EQU *
13273   6000  13136R    LDB =D-11 DIGS
13274  42000     30X    JSX .LDAP
13275  31656  77656A    STA V34 BCDA
13276   6000  12014R    LDB =D-13 UNTS
13277  42000     30X    JSX .LDAP
13300  66000  13357R    JMP A819
13301                 C820 EQU *
13301  42000  13137R    JSM P807  HZSEC
13302  66000  13360R    JMP A821
13303                 C822 EQU *
13303  42000  13137R    JSM P807  HZSEC
13304  66000  13360R    JMP A821
13305                 C823 EQU *
13305   1730  77730A    LDA V30 KFLAG
13306 170515           SAR 14
13307  12000   2107R    CPA =D3
13310  66000  13312R    JMP *+2
13311  66000  13322R    JMP A824
13312   1573  77573A    LDA V32635  I
13313  42000    121X    JSX MOD4
13314          2107R    DEF =D3
13315  31656  77656A    STA V34 BCDA
13316  72003           RZA A825
13317   2000   2107R    LDA =D3
13320  31656  77656A    STA V34 BCDA
13321                 A825 EQU *
13321  66000  13323R    JMP A826
13322                 A824 EQU *
13322  42000  13110R    JSM P805  DBL
13323                 A826 EQU *
13323  66000  13360R    JMP A821
13324                 C827 EQU *
13324  42000  13110R    JSM P805  DBL
13325  66000  13360R    JMP A821
13326                 C828 EQU *
13326   1573  77573A    LDA V32635  I
13327  22000   1363R    ADA =D-4
13330  31656  77656A    STA V34 BCDA
13331 172006           SAP A829
13332   2000   2411R    LDA =D4
13333  31573  77573A    STA V32635  I
13334   6000  13136R    LDB =D-11 DIGS
13335  42000     67X    JSX .STAP
13336  66000  13346R    JMP A830
13337                 A829 EQU *
13337   1573  77573A    LDA V32635  I
13340 170040            TCA
13341  22000   2406R    ADA =D7
13342 172004           SAP A831
13343   1656  77656A    LDA V34 BCDA
13344   6000  13136R    LDB =D-11 DIGS
13345  42000     67X    JSX .STAP
13346                 A831 EQU *
13346                 A830 EQU *
13346  66000  13360R    JMP A821
13347         13326R    DEF C828
13350         13324R    DEF C827
13351         13360R    DEF A821
13352         13305R    DEF C823
13353         13360R    DEF A821
13354         13303R    DEF C822
13355         13301R    DEF C820
13356                   DEC -8
13357  42000    143X  A819  JSX .CASE
13360                 A821 EQU *
13360   1573  77573A    LDA V32635  I
13361  22000   1277R    ADA =D-1
13362  42000    113X    JSX DIV4
13363          2107R    DEF =D3
13364  31573  77573A    STA V32635  I
13365   6000  12014R    LDB =D-13 UNTS
13366  42000     30X    JSX .LDAP
13367  22000   1301R    ADA =D-3
13370 172007           SAP A832
13371   1573  77573A    LDA V32635  I
13372 170040            TCA
13373  22000   2276R    ADA =D2
13374 172003           SAP A832
13375   2000   2276R    LDA =D2
13376  31573  77573A    STA V32635  I
13377                 A832 EQU *
13377   1656  77656A    LDA V34 BCDA
13400   6000  13136R    LDB =D-11 DIGS
13401  42000     71X    JSX MIN4P
13402 172004           SAP A833
13403   1656  77656A    LDA V34 BCDA
13404   6000  13136R    LDB =D-11 DIGS
13405  42000     67X    JSX .STAP
13406                 A833 EQU *
```

```
13406   2000  13442R    LDA =B30060
13407  31773  77773A    STA V804  ASEND
13410   1656  77656A    LDA V34 BCDA
13411 170605            SAL 6
13412  61742  77742A    IOR V32738  IX
13413  31742  77742A    STA V32738  IX
13414  42000     37X    JSX .LDBI
13415         77742A    DEF V32738  X
13416  42000     11X    JSM P200  CNV15
13417   1742  77742A    LDA V32738  IX
13420  52000   1457R    AND =D1
13421   6000  13136R    LDB =D-11 DIGS
13422  42000    115X    JSX ADD4P
13423  70540            PWC A
13424   1742  77742A    LDA V32738  IX
13425 170405            AAR 6
13426   6000  13136R    LDB =D-11 DIGS
13427  42000    117X    JSX SUB4P
13430 170516            SAR 15
13431  42000     57X    JSX ADD4I
13432  31572  77572A    STA V32634  J
13433 101427  77427A    LDA V32535,I  AS
13434 170040            TCA
13435  21572  77572A    ADA V32634  J
13436 172005           SAP A834
13437   1572  77572A    LDA V32634  J
13440 131427  77427A    STA V32535,I  AS
13441  66000  13467R    JMP A835
13442  30060
13442                  LIT
13443                 A834 EQU *
13443 101427  77427A    LDA V32535,I  AS
13444 170040            TCA
13445  21572  77572A    ADA V32634  J
13446 170040            TCA
13447 172020           SAP A836
13450 101427  77427A    LDA V32535,I  AS
13451  70540            PWC A
13452   1742  77742A    LDA V32738  IX
13453  52000   1457R    AND =D1
13454  21656  77656A    ADA V34 BCDA
13455  70761            WWC B
13456  10001      1A    CPA B
13457  66000  13461R    JMP *+2
13460  66000  13465R    JMP A837
13461   1427  77427A    LDA V32535  AS
13462  70540            PWC A
13463   2000  13532R    LDA =B56
13464  42000     10X    JSM P199  ACHAR
13465                 A837 EQU *
13465   1572  77572A    LDA V32634  J
13466 131427  77427A    STA V32535,I  AS
13467                 A836 EQU *
13467                 A835 EQU *
13467   1601  77601A    LDA V32641  HPBC
13470 172402            SAM *+2
13471  66000  13555R    JMP A838
13472   6000  12014R    LDB =D-13 UNTS
13473  42000     30X    JSX .LDAP
13474  12000   1457R    CPA =D1
13475  66000  13512R    JMP A840
13476  12000   2276R    CPA =D2
13477  66000  13512R    JMP A840
13500   6000  12014R    LDB =D-13 UNTS
13501  42000     30X    JSX .LDAP
13502  12000   2411R    CPA =D4
13503  66000  13505R    JMP *+2
13504  66000  13551R    JMP A839
13505   1730  77730A    LDA V30 KFLAG
13506 170515            SAR 14
13507  12000   2107R    CPA =D3
13510  66000  13512R    JMP *+2
13511  66000  13551R    JMP A839
13512                 A840 EQU *
13512   1573  77573A    LDA V32635  I
13513   6000   2107R    LDB =D3
13514  75617            MPY
13515  31573  77573A    STA V32635  I
13516   6000  12014R    LDB =D-13 UNTS
13517  42000     30X    JSX .LDAP
13520 170500            SAR 1
13521  66000  13536R    JMP A841
13522                 C842 EQU *
13522   1573  77573A    LDA V32635  I
13523  22000   2417R    ADA =D-6
13524  31573  77573A    STA V32635  I
13525  66000  13537R    JMP A843
13526                 C844 EQU *
13526   1573  77573A    LDA V32635  I
13527  22000   1375R    ADA =D-9
13530  31573  77573A    STA V32635  I
13531  66000  13537R    JMP A843
13532     56
13532                  LIT
13533         13526R    DEF C844
13534         13522R    DEF C842
13535                   DEC -3
13536  42000    143X  A841  JSX .CASE
13537                 A843 EQU *
13537   1573  77573A    LDA V32635  I
```

```
13540  72411             SZA A845
13541   1427   77427A     LDA V32535   AS
13542  70540              PWC A
13543   2000   13554R     LDA =B105
13544  42000      10X     JSM P199   ACHAR
13545   1427   77427A     LDA V32535   AS
13546  42000      13X     JSM P202   STHPB
13547   1573   77573A     LDA V32635   I
13550  42000      12X     JSM P201   CNV45
13551                    A845 EQU *
13551                    A839 EQU *
13551   1427   77427A     LDA V32535   AS
13552  42000      13X     JSM P202   STHPB
13553  66000   13776R     JMP A846
13554    105
13554                     LIT
13555                    A838 EQU *
13555  45573   77573A     ISZ V32635   I
13556                     NOP
13557   1427   77427A     LDA V32535   AS
13560   6000    1704R     LDB =D6
13561  42000      76X     JSX .WSTS
13562 101427   77427A     LDA V32535,I   AS
13563  22000    1457R     ADA =D1
13564  31430   77430A     STA V32536   SLEN
13565   1616   77616A     LDA V32654   XFLAG
13566 170607              SAL 8
13567 172006              SAP A847
13570   2000    2172R     LDA =D13
13571  42000      73X     JSX .W6
13572   2000    2204R     LDA =D10
13573  42000      73X     JSX .W6
13574  66000   13602R     JMP A848
13575                    A847 EQU *
13575   6000   12014R     LDB =D-13 UNTS
13576  42000      30X     JSX .LDAP
13577  72403              SZA A849
13600   2000    2205R     LDA =B40
13601  42000      73X     JSX .W6
13602                    A849 EQU *
13602                    A848 EQU *
13602   1616   77616A     LDA V32654   XFLAG
13603  52000   13044R     AND =B177577
13604  31616   77616A     STA V32654   XFLAG
13605   6000   12014R     LDB =D-13 UNTS
13606  42000      30X     JSX .LDAP
13607  66000   13775R     JMP A850
13610                    C851 EQU *
13610   1573   77573A     LDA V32635   I
13611  42000      60X     JSX .ARAY
13612          13070R     DEF V796   HZUNIT
13613   6000    1704R     LDB =D6
13614  42000      76X     JSX .WSTS
13615   1573   77573A     LDA V32635   I
13616  42000      60X     JSX .ARAY
13617          13070R     DEF V796   HZUNIT
13620 100000              LDA A,I
13621  21430   77430A     ADA V32536   SLEN
13622  31430   77430A     STA V32536   SLEN
13623  66000   13776R     JMP A852
13624                    C853 EQU *
13624   1573   77573A     LDA V32635   I
13625  42000      60X     JSX .ARAY
13626          13076R     DEF V800   SUNIT
13627  42000      73X     JSX .W6
13630   6000    1704R     LDB =D6
13631  42000     100X     JSX .WSTR
13632          13665R     DEF ="sec"
13633   1430   77430A     LDA V32536   SLEN
13634  22000    2411R     ADA =D4
13635  31430   77430A     STA V32536   SLEN
13636  66000   13776R     JMP A852
13637                    C854 EQU *
13637   6000    1704R     LDB =D6
13640  42000     100X     JSX .WSTR
13641          13670R     DEF ="dB"
13642   1430   77430A     LDA V32536   SLEN
13643  22000    2276R     ADA =D2
13644  31430   77430A     STA V32536   SLEN
13645  66000   13776R     JMP A852
13646                    C855 EQU *
13646   1730   77730A     LDA V30 KFLAG
13647 170515              SAR 14
13650  12000    2107R     CPA =D3
13651  66000   13653R     JMP *+2
13652  66000   13672R     JMP A856
13653   1430   77430A     LDA V32536   SLEN
13654  22000    2276R     ADA =D2
13655  31430   77430A     STA V32536   SLEN
13656   1573   77573A     LDA V32635   I
13657  42000      60X     JSX .ARAY
13660          13105R     DEF V803   VUNIT
13661  42000      73X     JSX .W6
13662   2000    2771R     LDA =B126
13663  42000      73X     JSX .W6
13664  66000   13715R     JMP A857
13665 sec
13670 dB
13665                     LIT
13672                    A856 EQU *
```

```
13672    6000    1704R    LDB =D6
13673   42000     100X    JSX .WSTR
13674           13670R    DEF ="dB"
13675    1730   77730A    LDA V30 KFLAG
13676  172003            SAP A858
13677    2000   13752R    LDA =D237
13700   66000   13702R    JMP A859
13701                    A858 EQU *
13701    2000   13753R    LDA =B155
13702                    A859 EQU *
13702   42000      73X    JSX .W6
13703    1430   77430A    LDA V32536  SLEN
13704   22000    2107R    ADA =D3
13705   31430   77430A    STA V32536  SLEN
13706    1730   77730A    LDA V30 KFLAG
13707  170515             SAR 14
13710   72405            SZA A860
13711   45430   77430A    ISZ V32536  SLEN
13712                     NOP
13713    2000    2771R    LDA =B126
13714   42000      73X    JSX .W6
13715                    A860 EQU *
13715                    A857 EQU *
13715    1675   77675A    LDA V15 BLEDS
13716  170615             SAL 14
13717  172007            SAP A861
13720    1430   77430A    LDA V32536  SLEN
13721   22000    2406R    ADA =D7
13722   31430   77430A    STA V32536  SLEN
13723    6000    1704R    LDB =D6
13724   42000     100X    JSX .WSTR
13725           13754R    DEF =" (1 Hz)"
13726                    A861 EQU *
13726   66000   13776R    JMP A852
13727                    C862 EQU *
13727    6000    1704R    LDB =D6
13730   42000     100X    JSX .WSTR
13731           13761R    DEF ="dB/"
13732    1430   77430A    LDA V32536  SLEN
13733   22000    2107R    ADA =D3
13734   31430   77430A    STA V32536  SLEN
13735   66000   13776R    JMP A852
13736                    C863 EQU *
13736    6000    1704R    LDB =D6
13737   42000     100X    JSX .WSTR
13740           13670R    DEF ="dB"
13741    1430   77430A    LDA V32536  SLEN
13742   22000    2276R    ADA =D2
13743   31430   77430A    STA V32536  SLEN
13744   66000   13776R    JMP A852
13745                    C864 EQU *
13745    2000   13764R    LDA =B130
13746   42000      73X    JSX .W6
13747   45430   77430A    ISZ V32536  SLEN
13750                     NOP
13751   66000   13776R    JMP A852
13752     355
13753     155
13754  (1 Hz)
13761  dB/
13764     130
13752                     LIT
13765           13745R    DEF C864
13766           13736R    DEF C863
13767           13727R    DEF C862
13770           13646R    DEF C855
13771           13637R    DEF C854
13772           13624R    DEF C853
13773           13610R    DEF C851
13774                     DEC -8
13775   42000     143X   A850 JSX .CASE
13776                    A852 EQU *
13776                    A846 EQU *
13776   66000      31X    JMX .RTNA
13777                    P865 EQU * DSPITEM
13777    2000    2646R    LDA =D3008
14000   31737   77737A    STA V32735  BLKS
14001    2000   14033R    LDA =D3012
14002    6000    2203R    LDB =D8
14003   42000      75X    JSX .WS4
14004    1620   77620A    LDA V32656  PREFIX
14005   72002             RZA *+2
14006   66000   14047R    JMP A866
14007   42000      60X    JSX .ARAY
14010             345R    DEF V122  AFTAB
14011    6000    1704R    LDB =D6
14012   42000      76X    JSX .WS1S
14013    1620   77620A    LDA V32656  PREFIX
14014   12000    2301R    CPA =D19
14015   66000   14021R    JMP A868
14016   12000    2302R    CPA =D22
14017   66000   14021R    JMP *+2
14020   66000   14022R    JMP A867
14021                    A868 EQU *
14021   42000    2212R    JSM P273  DELTA
14022                    A867 EQU *
14022    1620   77620A    LDA V32656  PREFIX
14023  170500             SAR 1
14024   12000    1456R    CPA =D12
14025   66000   14027R    JMP *+2
```

```
14026  66000  14037R     JMP A869
14027   6000   1704R     LDB =D6
14030  42000    100X     JSX .wSTR
14031          14034R    DEF ="    "
14032  66000  14040R     JMP A870
14033   5704
14034
14033                   LIT
14037                   A869 EQU *
14037  42000   2173R     JSM P271   CRLF
14040                   A870 EQU *
14040   1620  77620A     LDA V32656  PREFIX
14041  42000     60X     JSX .ARAY
14042            345R     DEF V122   AFTAB
14043 100000             LDA A,1
14044  22000   2406R     ADA =D7
14045  31612  77612A     STA V32650  NCHR
14046  66000  14051R     JMP A871
14047                   A866 EQU *
14047   2000   2411R     LDA =D4
14050  31612  77612A     STA V32650  NCHR
14051                   A871 EQU *
14051   2000   2500R     LDA =D147
14052  42000     73X     JSX .W6
14053  42000     73X     JSX .W6
14054 170201             RET 1
14055                   P216  EQU * MESSAGE
14055   6000   1277R     LDB =D-1
14056  42000     27X     JSX .ARGA
14057  66000  14413R     JMP A872
14060                   C873 EQU *
14060   2000   1457R     LDA =D1
14061  70540             PWC A
14062  70540             PWC A
14063  42000   2070R     JSM P261   IFBW
14064  42000   4420R     JSM P407   EXP3
14065  42000  13062R     JSM P793   NDUMP
14066  66000  14414R     JMP A874
14067                   C875 EQU *
14067   2000   1457R     LDA =D1
14070  70540             PWC A
14071  70540             PWC A
14072  42000   2111R     JSM P263   VBW
14073  42000   4420R     JSM P407   EXP3
14074  42000  13062R     JSM P793   NDUMP
14075  66000  14414R     JMP A874
14076                   C876 EQU *
14076   2000   2276R     LDA =D2
14077  70540             PWC A
14100  70540             PWC A
14101   1733  77733A     LDA V20 FSTIM
14102 172004             SAP A877
14103   1731  77731A     LDA V18 SINDEX
14104  42000   4411R     JSM P406   EXP2
14105  66000  14111R     JMP A878
14106                   A877 EQU *
14106   1731  77731A     LDA V18 SINDEX
14107  22000   5520R     ADA =D24
14110  42000   4356R     JSM P403   EXPSIX
14111                   A878 EQU *
14111  42000  13062R     JSM P793   NDUMP
14112  66000  14414R     JMP A874
14113                   C879 EQU *
14113   2000   2107R     LDA =D3
14114  70540             PWC A
14115   2000   2276R     LDA =D2
14116  70540             PWC A
14117   1677  77677A     LDA V17 RFAT
14120  52000   2406R     AND =D7
14121   6000   2204R     LDB =D10
14122  75617             MPY
14123  42000    122X     JSX CNV42
14124  42000  13062R     JSM P793   NDUMP
14125  66000  14414R     JMP A874
14126                   C880 EQU *
14126   2000   2411R     LDA =D4
14127  70540             PWC A
14130  70540             PWC A
14131   2000   4470R     LDA =D1000
14132  42000   4471R     JSM P410   DBMNV
14133  42000  13062R     JSM P793   NDUMP
14134  66000  14414R     JMP A874
14135                   C881 EQU *
14135   1435  77435A     LDA V32541   IF1
14136 172010             SAP A882
14137   2000   2405R     LDA =D5
14140  70540             PWC A
14141   2000   2276R     LDA =D2
14142  70540             PWC A
14143  42000   4430R     JSM P408   LGSCL
14144  42000    122X     JSX CNV42
14145  42000  13062R     JSM P793   NDUMP
14146                   A882 EQU *
14146  66000  14414R     JMP A874
14147                   C883 EQU *
14147   2000   1457R     LDA =D1
14150  70540             PWC A
14151   2000   1277R     LDA =B177777
14152  70540             PWC A
14153  42000     37X     JSX .LDBI
```

```
14154            77665A   DEF V8  CFREQ
14155   42000    13062R   JSM P793  NDUMP
14156   66000    14414R   JMP A874
14157                    C884 EQU *
14157    2000     1457R   LDA =D1
14160   70540             PWC A
14161    2000     1277R   LDA =B177777
14162   70540             PWC A
14163   42000       37X   JSX .LDBI
14164            77671A   DEF V9  SPAN
14165   42000    13062R   JSM P793  NDUMP
14166   66000    14414R   JMP A874
14167                    C885 EQU *
14167    2000     1457R   LDA =D1
14170   70540             PWC A
14171    2000     1277R   LDA =B177777
14172   70540             PWC A
14173   42000       37X   JSX .LDBI
14174            77671A   DEF V9  SPAN
14175   42000      126X   JSX MPY3
14176             2405R   DEF =D5
14177    6000     1457R   LDB =D1
14200   42000       47X   JSX .DRGT
14201   42000      140X   JSX MIN2
14202            77665A   DEF V8  CFREQ
14203   42000    13062R   JSM P793  NDUMP
14204   66000    14414R   JMP A874
14205                    C886 EQU *
14205    2000     1457R   LDA =D1
14206   70540             PWC A
14207    2000     1277R   LDA =B177777
14210   70540             PWC A
14211   42000       37X   JSX .LDBI
14212            77671A   DEF V9  SPAN
14213   42000      126X   JSX MPY3
14214             2405R   DEF =D5
14215    6000     1457R   LDB =D1
14216   42000       47X   JSX .DRGT
14217   42000      150X   JSX ADD2
14220            77665A   DEF V8  CFREQ
14221   42000    13062R   JSM P793  NDUMP
14222   66000    14414R   JMP A874
14223                    C887 EQU *
14223    2000     1457R   LDA =D1
14224   70540             PWC A
14225    2000     1277R   LDA =B177777
14226   70540             PWC A
14227   42000       37X   JSX .LDBI
14230            77713A   DEF V7  FSTEP
14231   42000    13062R   JSM P793  NDUMP
14232   66000    14414R   JMP A874
14233                    C888 EQU *
14233    2000     1463R   LDA =D0
14234   70540             PWC A
14235    2000     2411R   LDA =D4
14236   70540             PWC A
14237    1614    77614A   LDA V32652  DAC2
14240   42000      122X   JSX CNV42
14241   42000    13062R   JSM P793  NDUMP
14242   66000    14414R   JMP A874
14243                    C889 EQU *
14243    2000     2411R   LDA =D4
14244   70540             PWC A
14245   70540             PWC A
14246    1704    77704A   LDA V33 LEVLIN
14247   42000     4471R   JSM P410  DBMNV
14250   42000    13062R   JSM P793  NDUMP
14251   66000    14414R   JMP A874
14252                    C890 EQU *
14252    2000     2411R   LDA =D4
14253   70540             PWC A
14254   70540             PWC A
14255    1705    77705A   LDA V32 THRESH
14256   52000     1363R   AND =B177774
14257   42000     4471R   JSM P410  DBMNV
14260   42000    13062R   JSM P793  NDUMP
14261   66000    14414R   JMP A874
14262                    C891 EQU *
14262    1675    77675A   LDA V15 BLEDS
14263  170501             SAR 2
14264   62000     2411R   IOR =D4
14265   42000      104X   JSX .TURN
14266             1704R   DEF =D6
14267            77675A   DEF V15 BLEDS
14270   31675    77675A   STA V15 BLEDS
14271   42000    10312R   JSM P218  MKREL
14272  172402             SAM *+2
14273   66000    14341R   JMP A892
14274    1730    77730A   LDA V30 KFLAG
14275  170515             SAR 14
14276   12000     2107R   CPA =D3
14277   66000    14301R   JMP *+2
14300   66000    14341R   JMP A892
14301    2000     2406R   LDA =D7
14302   70540             PWC A
14303    2000     2107R   LDA =D3
14304   70540             PWC A
14305    1435    77435A   LDA V32541  IF1
14306  172015            SAP A893
14307    1720    77720A   LDA V27 AMLVL
```

```
14310  42000    4471R    JSM P410  DBMNV
14311  42000      62X    JSX CNV21
14312  42000      36X    JSX .SAR2
14313   1722   77722A    LDA V29 MKRLVL
14314  42000    4471R    JSM P410  DBMNV
14315  42000      62X    JSX CNV21
14316  42000      41X    JSX MPY1
14317          14335R    DEF =F10000.0
14320  42000      42X    JSX DIV1T
14321  42000      65X    JSX CNV12
14322  66000   14333R    JMP A894
14323                   A893 EQU *
14323   1720   77720A    LDA V27 AMLVL
14324  42000     122X    JSX CNV42
14325  42000      36X    JSX .SAR2
14326   1722   77722A    LDA V29 MKRLVL
14327  42000     122X    JSX CNV42
14330   6000    2411R    LDB =D4
14331  42000      51X    JSX .DLFT
14332  42000     164X    JSX DIV2I
14333                   A894 EQU *
14333  42000   13062R    JSM P793  NDUMP
14334  66000   14365R    JMP A895
14335 10000.0
14335                    LIT
14341                   A892 EQU *
14341  42000   10312R    JSM P218  MKREL
14342 172003             SAP A896
14343   2000    1704R    LDA =D6
14344  66000   14346R    JMP A897
14345                   A896 EQU *
14345   2000    2411R    LDA =D4
14346                   A897 EQU *
14346  70540             PWC A
14347   2000    2405R    LDA =D5
14350  70540             PWC A
14351  42000   10312R    JSM P218  MKREL
14352 172004             SAP A898
14353   1720   77720A    LDA V27 AMLVL
14354  42000    4471R    JSM P410  DBMNV
14355  66000   14360R    JMP A899
14356                   A898 EQU *
14356  42000      53X    JSX .LDS1
14357           1463R    DEF =D0
14360                   A899 EQU *
14360  42000      36X    JSX .SAR2
14361   1722   77722A    LDA V29 MKRLVL
14362  42000    4471R    JSM P410  DBMNV
14363  42000     124X    JSX SUB2T
14364  42000   13062R    JSM P793  NDUMP
14365                   A895 EQU *
14365   1675   77675A    LDA V15 BLEDS
14366  52000    5115R    AND =B177771
14367  31675   77675A    STA V15 BLEDS
14370  66000   14414R    JMP A874
14371          14262R    DEF C891
14372          14414R    DEF A874
14373          14252R    DEF C890
14374          14243R    DEF C889
14375          14233R    DEF C888
14376          14414R    DEF A874
14377          14223R    DEF C887
14400          14205R    DEF C886
14401          14167R    DEF C885
14402          14157R    DEF C884
14403          14147R    DEF C883
14404          14135R    DEF C881
14405          14126R    DEF C880
14406          14113R    DEF C879
14407          14076R    DEF C876
14410          14067R    DEF C875
14411          14060R    DEF C873
14412                    DEC -18
14413  42000     143X   A872  JSX .CASE
14414                   A874 EQU *
14414   6000    1301R    LDB =D-3   N
14415  42000      30X    JSX .LDAP
14416  42000     113X    JSX DIV4
14417           1704R    DEF =D6
14420  12000    2107R    CPA =D3
14421  66000   14423R    JMP *+2
14422  66000   14511R    JMP A900
14423   1733   77733A    LDA V20 FSTIM
14424 172002             SAP *+2
14425  66000   14511R    JMP A900
14426   1605   77605A    LDA V32645  SCANSL
14427  72027             RZA A901
14430   2000    2276R    LDA =D2
14431  70540             PWC A
14432   2000    2411R    LDA =D4
14433  70540             PWC A
14434   1731   77731A    LDA V18 SINDEX
14435  22000    5520R    ADA =D24
14436  42000    4356R    JSM P403  EXPSIX
14437   6000    2107R    LDB =D3
14440  42000      47X    JSX .DRG1
14441  42000      36X    JSX .SAR2
14442  42000   10312R    JSM P218  MKREL
14443 172005             SAP A902
14444   1717   77717A    LDA V28 AMKR
```

```
14445 170040          TCA
14446  21721  77721A   ADA V25 MRKR
14447  66000  14452R   JMP A903
14450                 A902 EQU *
14450   1721  77721A   LDA V25 MRKR
14451  22000   1277R   ADA =D-1
14452                 A903 EQU *
14452  42000    122X   JSX CNV42
14453  42000    157X   JSX MPY2T
14454  42000  13062R   JSM P793  NDUMP
14455  66000  14510R   JMP A904
14456                 A901 EQU *
14456   1675  77675A   LDA V15 BLEDS
14457 170601           SAL 2
14460 172011          SAP A905
14461  42000     37X   JSX .LDBI
14462         77645A   DEF V32677  MFREQ
14463  71500           NRM
14464  35572  77572A   SIB V32634  J
14465  42000     37X   JSX .LDBI
14466         77671A   DEF V9  SPAN
14467  71500           NRM
14470  35573  77573A   SIB V32635  I
14471                 A905 EQU *
14471   2000   1457R   LDA =D1
14472  70540           PWC A
14473   5675  77675A   LDB V15 BLEDS
14474 174601           SBL 2
14475   2000   1277R   LDA =B177777
14476 176006          SBP A906
14477  42000   5033R   JSM P443  CPERIOD
14500  22000   1704R   ADA =D6
14501 170040           TCA
14502  21572  77572A   ADA V32634  J
14503 170040           TCA
14504                 A906 EQU *
14504  70540           PWC A
14505  42000     37X   JSX .LDBI
14506         77645A   DEF V32677  MFREQ
14507  42000  13062R   JSM P793  NDUMP
14510                 A904 EQU *
14510  66000  14740R   JMP A907
14511                 A900 EQU *
14511   6000   1301R   LDB =D-3  N
14512  42000     30X   JSX .LDAP
14513  22000  14714R   ADA =D-25
14514  66000  14737R   JMP A908
14515                 C909 EQU *
14515   2000   1463R   LDA =D0
14516  70540           PWC A
14517   2000   2276R   LDA =D2
14520  70540           PWC A
14521   1735  77735A   LDA V32733  HPIB
14522  42000    122X   JSX CNV42
14523  42000  13062R   JSM P793  NDUMP
14524  66000  14740R   JMP A910
14525                 C911 EQU *
14525   2000   1463R   LDA =D0
14526  70540           PWC A
14527   2000   1456R   LDA =D12
14530  70540           PWC A
14531  42000     37X   JSX .LDBI
14532         77651A   DEF V32681  LTEMP
14533  42000  13062R   JSM P793  NDUMP
14534  66000  14740R   JMP A910
14535                 C912 EQU *
14535   2000   1704R   LDA =D6
14536  70540           PWC A
14537   2000   2411R   LDA =D4
14540  70540           PWC A
14541  42000   2303R   JSM P277  GOFSET
14542  42000    122X   JSX CNV42
14543  42000  13062R   JSM P793  NDUMP
14544  66000  14740R   JMP A910
14545                 C913 EQU *
14545   2000   1457R   LDA =D1
14546  70540           PWC A
14547  70540           PWC A
14550   1730  77730A   LDA V30 KFLAG
14551 170605           SAL 6
14552 172012          SAP A914
14553   1577  77577A   LDA V32639  CTBASE
14554 170040           TCA
14555  22000   1704R   ADA =D6
14556  70540           PWC A
14557  42000     53X   JSX .LDSI
14560          1457R   DEF =D1
14561  70761           WWC B
14562  42000     51X   JSX .DLFT
14563  66000  14566R   JMP A915
14564                 A914 EQU *
14564  42000     53X   JSX .LDSI
14565          1463R   DEF =D0
14566                 A915 EQU *
14566  42000  13062R   JSM P793  NDUMP
14567  66000  14740R   JMP A910
14570                 C916 EQU *
14570   2000   1463R   LDA =D0
14571  70540           PWC A
```

```
14572    2000     2405R    LDA =D5
14573   70540              PWC A
14574    1610    77610A    LDA V32648  ALIM
14575   42000      122X    JSX CNV42
14576   42000    13062R    JSM P793   NDUMP
14577   66000    14740R    JMP A910
14600                     C917 EQU *
14600    2000     1463R    LDA =D0
14601   70540              PWC A
14602    2000     2107R    LDA =D3
14603   70540              PWC A
14604   42000       37X    JSX .LDBI
14605            77655A    DEF V32685  LTEMP2
14606   42000    13062R    JSM P793   NDUMP
14607   66000    14740R    JMP A910
14610                     C918 EQU *
14610    2000     1704R    LDA =D6
14611   70540              PWC A
14612    2000     2411R    LDA =D4
14613   70540              PWC A
14614    1706    77706A    LDA V31 ROFSET
14615   42000      122X    JSX CNV42
14616   42000    13062R    JSM P793   NDUMP
14617   66000    14740R    JMP A910
14620                     C919 EQU *
14620    2000     1457R    LDA =D1
14621   70540              PWC A
14622    2000     1277R    LDA =B177777
14623   70540              PWC A
14624   42000       37X    JSX .LDBI
14625            77707A    DEF V11 FOFSET
14626   42000    13062R    JSM P793   NDUMP
14627   66000    14740R    JMP A910
14630                     C920 EQU *
14630    2000     1457R    LDA =D1
14631   70540              PWC A
14632    2000     1456R    LDA =D12
14633   70540              PWC A
14634   42000       37X    JSX .LDBI
14635            77625A    DEF V32661   CSIGNL
14636   42000    13062R    JSM P793   NDUMP
14637    1601    77601A    LDA V32641   HPBC
14640  172005             SAP A921
14641    2000     2723R    LDA =B54
14642   42000       17X    JSM P206   WHPIB
14643    2000     2172R    LDA =D13
14644   42000    14055R    JSM P216   MESSAGE
14645                     A921 EQU *
14645   66000    14740R    JMP A910
14646                     C922 EQU *
14646    2000     2477R    LDA =D36
14647   42000    14055R    JSM P216   MESSAGE
14650   66000    14740R    JMP A910
14651                     C923 EQU *
14651    2000     2477R    LDA =D36
14652   42000    14055R    JSM P216   MESSAGE
14653   66000    14740R    JMP A910
14654                     C924 EQU *
14654    2000     2276R    LDA =D2
14655   70540              PWC A
14656    2000     2107R    LDA =D3
14657   70540              PWC A
14660   42000       37X    JSX .LDBI
14661            77625A    DEF V32661   CSIGNL
14662   42000    13062R    JSM P793   NDUMP
14663   66000    14740R    JMP A910
14664                     C925 EQU *
14664    2000     1463R    LDA =D0
14665   70540              PWC A
14666    2000     2411R    LDA =D4
14667   70540              PWC A
14670    1563    77563A    LDA V32627   DSTAD
14671   42000      122X    JSX CNV42
14672   42000    13062R    JSM P793   NDUMP
14673   66000    14740R    JMP A910
14674                     C926 EQU *
14674    2000     2411R    LDA =D4
14675   70540              PWC A
14676   70540              PWC A
14677    1730    77730A    LDA V30 KFLAG
14700  170515              SAR 14
14701   12000     2107R    CPA =D3
14702   66000    14704R    JMP *+2
14703   66000    14710R    JMP A927
14704   42000     3314R    JSM P340   MXRLVL
14705   42000      122X    JSX CNV42
14706   42000     1736R    JSM P248   NANOV
14707   66000    14712R    JMP A928
14710                     A927 EQU *
14710   42000     3314R    JSM P340   MXRLVL
14711   42000      122X    JSX CNV42
14712                     A928 EQU *
14712   42000    13062R    JSM P793   NDUMP
14713   66000    14740R    JMP A910
14714  177747
14714                      LIT
14715            14674R    DEF C926
14716            14740R    DEF A910
14717            14664R    DEF C925
14720            14654R    DEF C924
```

```
14721                14651R     DEF C923
14722                14646R     DEF C922
14723                14630R     DEF C920
14724                14620R     DEF C919
14725                14610R     DEF C918
14726                14600R     DEF C917
14727                14570R     DEF C916
14730                14545R     DEF C913
14731                14740R     DEF A910
14732                14535R     DEF C912
14733                14740R     DEF A910
14734                14525R     DEF C911
14735                14515R     DEF C909
14736                           DEC -18
14737    42000        143X   A908  JSX .CASE
14740                        A910 EQU *
14740                        A907 EQU *
14740    66000         31X      JMX .RTNA
14741                        P929  EQU * ENTRY
14741     6000       1277R      LDB =D-1
14742    42000         27X      JSX .ARGA
14743   172002                  SAP *+2
14744   170040                  TCA
14745    31576     77576A       STA V32638   RPGPTR
14746    31620     77620A       STA V32656   PREFIX
14747    42000        113X      JSX DIV4
14750                1704R      DEF =D6
14751    12000       2107R      CPA =D3
14752    66000      14754R      JMP *+2
14753    66000      14756R      JMP A930
14754     2000       7565R      LDA =D18
14755    31576     77576A       STA V32638   RPGPTR
14756                        A930 EQU *
14756     2000       1463R      LDA =D0
14757    31564     77564A       STA V32628   RPGCNT
14760    31431     77431A       STA V32537   RPGSWP
14761     2000       2107R      LDA =D3
14762     6000       2107R      LDB =D3
14763    42000         75X      JSX .WS4
14764     6000       1301R      LDB =D-3   N
14765    42000         30X      JSX .LDAP
14766   172003                  SAP A931
14767     2000       1463R      LDA =D0
14770    31576     77576A       STA V32638   RPGPTR
14771                        A931 EQU *
14771    42000      13777R      JSM P865   DSPITEM
14772    42000       2551R      JSM P298   ABLK
14773     1616     77616A       LDA V32654   XFLAG
14774   170600                  SAL 1
14775   172013                  SAP A932
14776     1620     77620A       LDA V32656   PREFIX
14777    12000      10243R      CPA =D27
15000    66000      15004R      JMP A934
15001     1740     77740A       LDA V32736   EFLAG
15002   170606                  SAL 7
15003   172003                  SAP A933
15004                        A934 EQU *
15004     2000      15026R      LDA =B7760
15005    66000      15007R      JMP A935
15006                        A933 EQU *
15006     2000       6514R      LDA =B77777
15007                        A935 EQU *
15007    31565     77565A       STA V32629   SRQEN
15010                        A932 EQU *
15010     1576     77576A       LDA V32638   RPGPTR
15011    42000        111X      JSX .EQL
15012    70540                  PWC A
15013     1565     77565A       LDA V32629   SRQEN
15014    52000      15026R      AND =B7760
15015    22000      15027R      ADA =B170020
15016    42000        111X      JSX .EQL
15017    42000        136X      JSX .ORT
15020   170140                  CMA
15021    42000        104X      JSX .TURN
15022                5517R      DEF =B100000
15023               77565A      DEF V32629   SRQEN
15024    31565     77565A       STA V32629   SRQEN
15025    66000         31X      JMX .RTNA
15026     7760
15027   170020
15026                           LIT
15030                        P936  EQU * ALTCK
15030     1676     77676A       LDA V16 TLEDS
15031    52000       6233R      AND =B600
15032    22000       6234R      ADA =B177200
15033    72013                  RZA A937
15034     1566     77566A       LDA V32630   KEYCODE
15035   170040                  TCA
15036    22000      15047R      ADA =B145
15037   172004                  SAP A938
15040     1702     77702A       LDA V24 VIDCON
15041    52000       2110R      AND =B177776
15042    66000      15045R      JMP A939
15043                        A938 EQU *
15043     1702     77702A       LDA V24 VIDCON
15044    62000       1457R      IOR =D1
15045                        A939 EQU *
15045    31702     77702A       STA V24 VIDCON
15046                        A937 EQU *
15046   170201                  RET 1
15047      145
```

```
15047                          LIT
15050                        P223  EQU * AMPU
15050    6000    1277R         LDB =D-1
15051   42000      27X         JSX .ARGA
15052   42000    1665R         JSM P245  RLAD
15053   31573   77573A         STA V32635  I
15054    6000    1301R         LDB =D-3  N
15055   42000      30X         JSX .LDAP
15056   42000     104X         JSX .TURN
15057            4533R         DEF =B140000
15060           77730A         DEF V30 KFLAG
15061   31730   77730A         STA V30 KFLAG
15062    1573   77573A         LDA V32635  I
15063  170040                  TCA
15064   21700   77700A         ADA V22 RLVL
15065   70540                  PWC A
15066   42000    1665R         JSM P245  RLAD
15067   42000      57X         JSX ADD4T
15070   31700   77700A         STA V22 RLVL
15071    2000    2405R         LDA =D5
15072   42000    2314R         JSM P279  SBLK
15073    1675   77675A         LDA V15 BLEDS
15074  170612                  SAL 11
15075  172003                 SAP A940
15076    2000    3527R         LDA =D14
15077   42000    2314R         JSM P279  SBLK
15100                        A940 EQU *
15100    1675   77675A         LDA V15 BLEDS
15101  170611                  SAL 10
15102  172003                 SAP A941
15103    2000    2131R         LDA =D15
15104   42000    2314R         JSM P279  SBLK
15105                        A941 EQU *
15105    1723   77723A         LDA V26 MKRMODE
15106   72407                 SZA A942
15107   42000   10323R         JSM P626  MRKROK
15110  172005                 SAP A942
15111    2000    6703R         LDA =D1024
15112   70540                  PWC A
15113    2000    2521R         LDA =D17
15114   42000    2522R         JSM P297  RJUST
15115                        A942 EQU *
15115   42000   10301R         JSM P624  MKRACT
15116   66000      31X         JMX .RTNA
15117                        P943  EQU * SMODE
15117    1675   77675A         LDA V15 BLEDS
15120  170613                  SAL 12
15121  172404                 SAM A945
15122    1730   77730A         LDA V30 KFLAG
15123  170614                  SAL 13
15124  172003                 SAP A944
15125                        A945 EQU *
15125    2000   15047R         LDA =B145
15126   66000   15130R         JMP A946
15127                        A944 EQU *
15127    2000   15132R         LDA =B141
15130                        A946 EQU *
15130   42000     555R         JSM P215  SKEY
15131  170201                  RET 1
15132     141
15132                          LIT
15133                        P947  EQU * TRNOFF
15133    6000    1277R         LDB =D-1
15134   42000      27X         JSX .ARGA
15135   11620   77620A         CPA V32656  PREFIX
15136   66000   15140R         JMP *+2
15137   66000   15142R         JMP A948
15140    2000    1463R         LDA =D0
15141   42000   14741R         JSM P929  ENTRY
15142                        A948 EQU *
15142   66000      31X         JMX .RTNA
15143                        P949  EQU * UNBLANK
15143    1575   77575A         LDA V32637  K
15144   12000    2107R         CPA =D3
15145   66000   15222R         JMP A950
15146    6000    2221R         LDB =D9
15147   42000      74X         JSX .RS5
15150   31742   77742A         STA V32738  IX
15151    6000    2203R         LDB =D8
15152   42000      74X         JSX .RS5
15153   31742   77742A         STA V32738  IX
15154   52000    3166R         AND =B1777
15155   31742   77742A         STA V32738  IX
15156    1676   77676A         LDA V16 TLEDS
15157   52000    1704R         AND =D6
15160   72404                 SZA A951
15161    1742   77742A         LDA V32738  IX
15162   22000    6703R         ADA =D1024
15163   31742   77742A         STA V32738  IX
15164                        A951 EQU *
15164                        A952 EQU *
15164    1742   77742A         LDA V32738  IX
15165   42000     103X         JSX .W4
15166    2000    1375R         LDA =B177767
15167   70540                  PWC A
15170    2000    1463R         LDA =D0
15171                        A953 EQU *
15171   31573   77573A         STA V32635  I
15172   42000     162X         JSX .R5
15173   31572   77572A         STA V32634  J
```

```
15174   1573  77573A    LDA V32635  I
15175  21742  77742A    ADA V32738  IX
15176  42000    103X    JSX .W4
15177   5572  77572A    LDB V32634  J
15200 174604            SBL 5
15201   1572  77572A    LDA V32634  J
15202 176402            SBM A954
15203  52000   7567R    AND =B173777
15204                  A954 EQU *
15204  42000     73X    JSX .W6
15205   2000   1457R    LDA =D1
15206  21573  77573A    ADA V32635  I
15207 144016     16A    ISZ C,I
15210  66000  15171R    JMP A953
15211  54016     16A    DSZ C
15212   1742  77742A    LDA V32738  IX
15213  22000   6703R    ADA =D1024
15214  31742  77742A    STA V32738  IX
15215  22000  15223R    ADA =D-2048
15216 172004            SAP A955
15217   1676  77676A    LDA V16 ILEDS
15220  52000   3231R    AND =B60
15221  72443            SZA A952
15222                  A955 EQU *
15222                  A950 EQU *
15222 170201            RET 1
15223 174000
15223                   LIT
15224                  P221  EQU * TRIGR
15224  66000  15235R    JMP A956
15225                  T957 EQU *
15225                  K958  OCT 140000  140000
15226                  K959  OCT 50000 50000
15227                  K960  OCT 44000 44000
15230                   DEC 0 0
15231                  K961  OCT 54000 54000
15232         15225R   V962 DEF T957 MTRIG
15233                   OCT 177777  177777
15234                  K963  OCT 5 5
15235                  A956  EQU *
15235   1607  77607A    LDA V32647  ACNT
15236 172003            SAP A964
15237   2000   1463R    LDA =D0
15240  31607  77607A    STA V32647  ACNT
15241                  A964 EQU *
15241  42000   2650R    JSM P304  UNCAL
15242  42000  15143R    JSM P949  UNBLANK
15243   1676  77676A    LDA V16 ILEDS
15244 170512            SAR 11
15245  52000   2406R    AND =D7
15246  22000   1457R    ADA =D1
15247  42000     60X    JSX .ARAY
15250         15232R    DEF V962  MTRIG
15251  31703  77703A    STA V21 STRIG
15252 172005            SAP A965
15253   1733  77733A    LDA V20 FSTIM
15254 172003            SAP A965
15255   2000   4534R    LDA =B40000
15256  31703  77703A    STA V21 STRIG
15257                  A965 EQU *
15257   1730  77730A    LDA V30 KFLAG
15260 170613            SAL 12
15261 172006            SAP A966
15262   1733  77733A    LDA V20 FSTIM
15263 172004            SAP A966
15264   1703  77703A    LDA V21 STRIG
15265  52000   2645R    AND =B137777
15266  31703  77703A    STA V21 STRIG
15267                  A966 EQU *
15267   1603  77603A    LDA V32643  PLUCK
15270  52000   7567R    AND =B173777
15271  31603  77603A    STA V32643  PLUCK
15272  42000   6160R    JSM P502  EOS
15273 170201            RET 1
15274                  P967  EQU * IMODE
15274   6000   1277R    LDB =D-1
15275  42000     27X    JSX .ARGA
15276  42000    104X    JSX .TURN
15277         15312R    DEF =B34000
15300         77676A    DEF V16 ILEDS
15301  42000   2163R    JSM P270  ILEDSOUT
15302   6000   1301R    LDB =D-3  N
15303  42000     30X    JSX .LDAP
15304  42000    104X    JSX .TURN
15305          2203R    DEF =D8
15306         77730A    DEF V30 KFLAG
15307  31730  77730A    STA V30 KFLAG
15310  42000  15224R    JSM P221  TRIGR
15311  66000     31X    JMX .RTNA
15312  34000
15312                   LIT
15313                  P968  EQU * CFDF
15313   6000   1277R    LDB =D-1
15314  42000     27X    JSX .ARGA
15315  42000    104X    JSX .TURN
15316          1457R    DEF =D1
15317         77675A    DEF V15 BLEDS
15320  31675  77675A    STA V15 BLEDS
15321  52000   1457R    AND =D1
15322 170600            SAL 1
```

```
15323  22000   2406R    ADA =D7
15324  42000   2223R    JSM P274  NBLK
15325   1675  77675A    LDA V15 BLEDS
15326  52000   1457R    AND =D1
15327 170600            SAL 1
15330  22000   2203R    ADA =D8
15331  42000   2223R    JSM P274  NBLK
15332  42000   6723R    JSM P538  CSBLK
15333  66000     31X    JMX .RINA
15334                  P969  EQU * CLRDA
15334   1620  77620A    LDA V32656  PREFIX
15335  12000  15343R    CPA =D40
15336  66000  15340R    JMP *+2
15337  66000  15342R    JMP A970
15340   2000   1463R    LDA =D0
15341  42000  14741R    JSM P929  ENTRY
15342                  A970 EQU *
15342 170201            RET 1
15343     50
15343                   LIT
15344                  P971  EQU * USFT
15344   1676  77676A    LDA V16 TLEDS
15345  52000  15350R    AND =B176777
15346  42000   2163R    JSM P270  TLEDSOUT
15347 170201            RET 1
15350 176777
15350                   LIT
15351                  P972  EQU * SAVPREP
15351   1601  77601A    LDA V32641  HPBC
15352  52000  15404R    AND =B177400
15353  61577  77577A    IOR V32639  CTBASE
15354  31671  77671A    STA V46 CTBSV
15355   1610  77610A    LDA V32648  ALIM
15356 170600            SAL 1
15357  61713  77713A    IOR V45 ALIMSV
15360  31713  77713A    STA V45 ALIMSV
15361   1740  77740A    LDA V32736  EFLAG
15362  42000    104X    JSX .TURN
15363          1363R    DEF =B177774
15364         77724A    DEF V49 EFLGSV
15365  70540            PWC A
15366   1426  77426A    LDA V32534  UFLAG
15367 170501            SAR 2
15370  52000   2276R    AND =D2
15371  42000    136X    JSX .ORT
15372  31724  77724A    STA V49 EFLGSV
15373   1433  77433A    LDA V32539  GIN1
15374 170600            SAL 1
15375  61665  77665A    IOR V47 GIN1SV
15376  31665  77665A    STA V47 GIN1SV
15377   1432  77432A    LDA V32538  GIN2
15400 170600            SAL 1
15401  61707  77707A    IOR V48 GIN2SV
15402  31707  77707A    STA V48 GIN2SV
15403 170201            RET 1
15404 177400
15404                   LIT
15405                  P973  EQU * SAVCLR
15405   2000   1463R    LDA =D0
15406  31671  77671A    STA V46 CTBSV
15407   1713  77713A    LDA V45 ALIMSV
15410  52000   1457R    AND =D1
15411  31713  77713A    STA V45 ALIMSV
15412   1724  77724A    LDA V49 EFLGSV
15413  52000   1457R    AND =D1
15414  31724  77724A    STA V49 EFLGSV
15415   1665  77665A    LDA V47 GIN1SV
15416  52000   1457R    AND =D1
15417  31665  77665A    STA V47 GIN1SV
15420   1707  77707A    LDA V48 GIN2SV
15421  52000   1457R    AND =D1
15422  31707  77707A    STA V48 GIN2SV
15423 170201            RET 1
15424                  P974  EQU * SAVFIX
15424   1713  77713A    LDA V45 ALIMSV
15425 170500            SAR 1
15426  31610  77610A    STA V32648  ALIM
15427   1671  77671A    LDA V46 CTBSV
15430  52000   3242R    AND =B377
15431  31577  77577A    STA V32639  CTBASE
15432   1724  77724A    LDA V49 EFLGSV
15433  42000    104X    JSX .TURN
15434         15467R    DEF =B143454
15435         77740A    DEF V32736  EFLAG
15436  31740  77740A    STA V32736  EFLAG
15437   1724  77724A    LDA V49 EFLGSV
15440 170601            SAL 2
15441  42000    104X    JSX .TURN
15442          2203R    DEF =D8
15443         77426A    DEF V32534  UFLAG
15444  31426  77426A    STA V32534  UFLAG
15445   1671  77671A    LDA V46 CTBSV
15446  42000    104X    JSX .TURN
15447         15470R    DEF =B1400
15450         77601A    DEF V32641  HPBC
15451  31601  77601A    STA V32641  HPBC
15452   6000   1704R    LDB =D6
15453  42000     74X    JSX .RS5
15454  31572  77572A    STA V32634  J
15455 170601            SAL 2
```

```
15456 172407                SAM A975
15457   1665  77665A         LDA V47 GIN1SV
15460 170400                 AAR 1
15461  31433  77433A         STA V32539  GIN1
15462   1707  77707A         LDA V48 GIN2SV
15463 170400                 AAR 1
15464  31432  77432A         STA V32538  GIN2
15465                      A975 EQU *
15465  42000  15405R         JSM P973  SAVCLR
15466 170201                 RET 1
15467 143454
15470   1400
15467                        LIT
15471                      P976  EQU * NUMBER
15471   1620  77620A         LDA V32656  PREFIX
15472  72002                 RZA *+2
15473  66000  15531R         JMP A977
15474  42000  12317R         JSM P733  CLRNUM
15475   1611  77611A         LDA V32649  CHRC
15476  22000   7243R         ADA =D-12
15477 172017                SAP A978
15500  42000     37X         JSX .LDBI
15501         77651A         DEF V32681  LTEMP
15502   1566  77566A         LDA V32630  KEYCODE
15503  75541                 MLY
15504  42000     34X         JSX .STRD
15505         77651A         DEF V32681  LTEMP
15506  42000  12302R         JSM P732  WKEY
15507   1617  77617A         LDA V32655  DECFLG
15510 172006                SAP A979
15511   1601  77601A         LDA V32641  HPBC
15512 170600                 SAL 1
15513 172403                SAM A979
15514  55617  77617A         DSZ V32655  DECFLG
15515                        NOP
15516                      A979 EQU *
15516                      A978 EQU *
15516   1620  77620A         LDA V32656  PREFIX
15517 170500                 SAR 1
15520  12000   1456R         CPA =D12
15521  66000  15523R         JMP *+2
15522  66000  15531R         JMP A980
15523   2000   2411R         LDA =D4
15524   6000   2411R         LDB =D4
15525  42000    112X         JSX .*S7
15526   1616  77616A         LDA V32654  XFLAG
15527  62000   5517R         IOR =B100000
15530  31616  77616A         STA V32654  XFLAG
15531                      A980 EQU *
15531                      A977 EQU *
15531 170201                 RET 1
15532                      P981  EQU * DSPW
15532   1620  77620A         LDA V32656  PREFIX
15533  12000  15544R         CPA =D41
15534  66000  15536R         JMP *+2
15535  66000  15541R         JMP A983
15536   1616  77616A         LDA V32654  XFLAG
15537 170602                 SAL 3
15540 172403                SAM A982
15541                      A983 EQU *
15541   2000  15545R         LDA =B177727
15542  42000  14741R         JSM P929  ENTRY
15543                      A982 EQU *
15543 170201                 RET 1
15544     51
15545 177727
15544                        LIT
15546                      P214  EQU * KEY
15546   6000   1277R         LDB =D-1
15547  42000     27X         JSX .ARGA
15550  31566  77566A         STA V32630  KEYCODE
15551   2000   1463R         LDA =D0
15552  31564  77564A         STA V32628  RPGCNT
15553   1616  77616A         LDA V32654  XFLAG
15554  52000  15666R         AND =B77776
15555  31616  77616A         STA V32654  XFLAG
15556   1601  77601A         LDA V32641  HPBC
15557 170140                 CMA
15560 170600                 SAL 1
15561  51616  77616A         AND V32654  XFLAG
15562 170600                 SAL 1
15563 172033                SAP A985
15564   1740  77740A         LDA V32736  EFLAG
15565 170606                 SAL 7
15566 172405                SAM A988
15567   1620  77620A         LDA V32656  PREFIX
15570  12000  10243R         CPA =D27
15571  66000  15573R         JMP *+2
15572  66000  15601R         JMP A987
15573                      A988 EQU *
15573   1566  77566A         LDA V32630  KEYCODE
15574  22000  15667R         ADA =B-47
15575 172421                SAM A986
15576   1566  77566A         LDA V32630  KEYCODE
15577  12000  10240R         CPA =B57
15600  66000  15616R         JMP A986
15601                      A987 EQU *
15601   1620  77620A         LDA V32656  PREFIX
15602  12000  10243R         CPA =D27
15603  66000  15605R         JMP *+2
15604  66000  24634R         JMP L984  EXIT
```

```
15605   1566  77566A     LDA V32630  KEYCODE
15606 170040             TCA
15607  22000  15670R     ADA =B55
15610 172402             SAM *+2
15611  66000  24634R     JMP L984  EXIT
15612   1566  77566A     LDA V32630  KEYCODE
15613  22000  15671R     ADA =B-72
15614 172402             SAM *+2
15615  66000  24634R     JMP L984  EXIT
15616                   A986 EQU *
15616                   A985 EQU *
15616   1676  77676A     LDA V16 ILEDS
15617 170605             SAL 6
15620 172402             SAM *+2
15621  66000  15702R     JMP A989
15622   1566  77566A     LDA V32630  KEYCODE
15623  12000   2204R     CPA =B12
15624  66000  15637R     JMP A991
15625  12000   2107R     CPA =D3
15626  66000  15637R     JMP A991
15627   1566  77566A     LDA V32630  KEYCODE
15630  11736  77736A     CPA V32734  ETX
15631  66000  15633R     JMP *+2
15632  66000  15641R     JMP A990
15633   1620  77620A     LDA V32656  PREFIX
15634  12000   1456R     CPA =D12
15635  66000  15637R     JMP *+2
15636  66000  15641R     JMP A990
15637                   A991 EQU *
15637   2000  15672R     LDA =B140
15640  31566  77566A     STA V32630  KEYCODE
15641                   A990 EQU *
15641   1566  77566A     LDA V32630  KEYCODE
15642  12000  15673R     CPA =B52
15643  66000  15645R     JMP *+2
15644  66000  15647R     JMP A992
15645   2000  15670R     LDA =B55
15646  31566  77566A     STA V32630  KEYCODE
15647                   A992 EQU *
15647   1620  77620A     LDA V32656  PREFIX
15650  12000   1456R     CPA =D12
15651  66000  15653R     JMP *+2
15652  66000  15674R     JMP A993
15653   1566  77566A     LDA V32630  KEYCODE
15654  12000  15672R     CPA =B140
15655  66000  15674R     JMP A993
15656   1566  77566A     LDA V32630  KEYCODE
15657  12000   3042R     CPA =B45
15660  66000  15674R     JMP A993
15661   1611  77611A     LDA V32649  CHRC
15662  22000  15671R     ADA =D-58
15663 172002             SAP A994
15664  42000  12302R     JSM P732  WKEY
15665                   A994 EQU *
15665  66000  24634R     JMP L984  EXIT
15666  77776
15667 177731
15670     55
15671 177706
15672    140
15673     52
15666                    LIT
15674                   A993 EQU *
15674   1566  77566A     LDA V32630  KEYCODE
15675  22000  15701R     ADA =B-40
15676 172002             SAP A996
15677  42000  15344R     JSM P971  USFT
15700                   A996 EQU *
15700                   A995 EQU *
15700  66000  15712R     JMP A997
15701 177740
15701                    LIT
15702                   A989 EQU *
15702   1566  77566A     LDA V32630  KEYCODE
15703  22000   3232R     ADA =B-60
15704 172406             SAM A998
15705   1566  77566A     LDA V32630  KEYCODE
15706  22000  15671R     ADA =B-72
15707 172003             SAP A998
15710  42000  15471R     JSM P976  NUMBER
15711  66000  24634R     JMP L984  EXIT
15712                   A998 EQU *
15712                   A997 EQU *
15712   1566  77566A     LDA V32630  KEYCODE
15713 170504             SAR 5
15714  22000   1457R     ADA =D1
15715  66000  24626R     JMP A999
15716                   C1000 EQU *
15716   1566  77566A     LDA V32630  KEYCODE
15717  22000   1457R     ADA =D1
15720  66000  16754R     JMP A1001
15721                   C1002 EQU *
15721   1616  77616A     LDA V32654  XFLAG
15722 170515             SAR 14
15723   6000  15026R     LDB =B7760
15724  75617             MPY
15725  42000    104X     JSX .TURN
15726          6514R     DEF =B77777
15727         77565A     DEF V32629  SRGEN
```

```
15730  31565  77565A   STA V32629  SRQEN
15731   6000   2276R   LDB =D2
15732  42000    107X   JSX .WS5
15733   1740  77740A   LDA V32736  EFLAG
15734  52000  16167R   AND =B175377
15735  62000  11310R   IOR =B400
15736  31740  77740A   STA V32736  EFLAG
15737  66000  16755R   JMP A1003
15740                 C1004 EQU *
15740   1676  77676A   LDA V16 ILEDS
15741  52000  16170R   AND =B611
15742  72410           SZA A1005
15743   1740  77740A   LDA V32736  EFLAG
15744  62000   2277R   IOR =B4000
15745  31740  77740A   STA V32736  EFLAG
15746   1601  77601A   LDA V32641  HPBC
15747  52000  16171R   AND =B157777
15750  31601  77601A   STA V32641  HPBC
15751  42000  15224R   JSM P221  TRIGR
15752                 A1005 EQU *
15752  66000  16755R   JMP A1003
15753                 C1006 EQU *
15753  42000  12474R   JSM P744  UNITS
15754  66000  16755R   JMP A1003
15755                 C1007 EQU *
15755  42000  15224R   JSM P221  TRIGR
15756   1740  77740A   LDA V32736  EFLAG
15757  52000  16172R   AND =B174777
15760  62000   1300R   IOR =B1000
15761  31740  77740A   STA V32736  EFLAG
15762  66000  16755R   JMP A1003
15763                 C1008 EQU *
15763   2000   2411R   LDA =D4
15764  42000   3046R   JSM P321  CLEAR
15765   2000   6352R   LDA =D3072
15766  31563  77563A   STA V32627  DSTAD
15767   1426  77426A   LDA V32534  UFLAG
15770  52000  16173R   AND =B177733
15771  31426  77426A   STA V32534  UFLAG
15772  42000   2650R   JSM P304  UNCAL
15773  66000  16755R   JMP A1003
15774                 C1009 EQU *
15774   1740  77740A   LDA V32736  EFLAG
15775  52000  16174R   AND =B174377
15776  62000   6703R   IOR =B2000
15777  31740  77740A   STA V32736  EFLAG
16000   1616  77616A   LDA V32654  XFLAG
16001 170600           SAL 1
16002 172021           SAP A1010
16003   1620  77620A   LDA V32656  PREFIX
16004  12000  10243R   CPA =D27
16005  66000  16023R   JMP A1010
16006   1565  77565A   LDA V32629  SRQEN
16007  52000   5517R   AND =B100000
16010  62000   6514R   IOR =B77777
16011  31565  77565A   STA V32629  SRQEN
16012   6000   2276R   LDB =D2
16013  42000    107X   JSX .WS5
16014   2000   2411R   LDA =D4
16015  42000   3214R   JSM P332  WAIT
16016   2000   2107R   LDA =D3
16017   6000   2107R   LDB =D3
16020  42000     75X   JSX .WS4
16021   2000   2411R   LDA =D4
16022  42000    103X   JSX .W4
16023                 A1010 EQU *
16023  66000  16755R   JMP A1003
16024                 C1011 EQU *
16024   1740  77740A   LDA V32736  EFLAG
16025  52000   5521R   AND =B175777
16026  31740  77740A   STA V32736  EFLAG
16027  66000  16755R   JMP A1003
16030                 C1012 EQU *
16030   1601  77601A   LDA V32641  HPBC
16031  52000  16175R   AND =B176377
16032  62000  11310R   IOR =B400
16033  31601  77601A   STA V32641  HPBC
16034  66000  16755R   JMP A1003
16035                 C1013 EQU *
16035   1601  77601A   LDA V32641  HPBC
16036  52000  16175R   AND =B176377
16037  62000   1300R   IOR =B1000
16040  31601  77601A   STA V32641  HPBC
16041  66000  16755R   JMP A1003
16042                 C1014 EQU *
16042  42000  13045R   JSM P791  OHPB
16043  42000     24X   JSM P211  IHPIB
16044  31567  77567A   STA V32631  KEYCOL
16045  42000     53X   JSX .LDSI
16046          1463R   DEF =D0
16047  42000     34X   JSX .STRD
16050         77655A   DEF V32685  LTEMP2
16051   1567  77567A   LDA V32631  KEYCOL
16052  52000   2406R   AND =D7
16053  31660  77660A   STA V36 BCDC
16054   1567  77567A   LDA V32631  KEYCOL
16055 170600           SAL 1
16056  42000    104X   JSX .TURN
16057         16176R   DEF =B160
16060         77660A   DEF V36 BCDC
```

```
16061  31660  77660A    STA V36 BCDC
16062   1567  77567A    LDA V32631  KEYCOL
16063 170601            SAL 2
16064  42000    104X    JSX .TURN
16065         16177R    DEF =B3400
16066         77660A    DEF V36 BCDC
16067  31660  77660A    STA V36 BCDC
16070  42000   7732R    JSM P599  FPNLON
16071   2000  16200R    LDA =D33
16072  42000   2501R    JSM P295  BLINK
16073   2000  16200R    LDA =D33
16074  42000   2314R    JSM P279  SBLK
16075  66000  16755R    JMP A1003
16076                 C1015 EQU *
16076   1601  77601A    LDA V32641  HPBC
16077  52000  16175R    AND =B176377
16100  62000  15470R    IOR =B1400
16101  31601  77601A    STA V32641  HPBC
16102  66000  16755R    JMP A1003
16103                 C1016 EQU *
16103  42000  13045R    JSM P791  UHPB
16104   2000  16201R    LDA =D1025
16105  31573  77573A    STA V32635  I
16106   2000   3112R    LDA =D1001
16107  70540            PWC A
16110  42000    166X    JSX .CSHV
16111         77573A    DEF V32635  I
16112  42000     25X    JSM P212  IHPBT
16113  66000  16755R    JMP A1003
16114                 C1017 EQU *
16114   1676  77676A    LDA V16 ILEDS
16115 170605            SAL 6
16116 172403           SAM A1018
16117   2000  16200R    LDA =D33
16120  42000   2434R    JSM P265  BLKOF
16121                 A1018 EQU *
16121  66000  16755R    JMP A1003
16122                 C1019 EQU *
16122   1601  77601A    LDA V32641  HPBC
16123  52000  16175R    AND =B176377
16124  31601  77601A    STA V32641  HPBC
16125  66000  16755R    JMP A1003
16126                 C1020 EQU *
16126  42000  15532R    JSM P961  DSPW
16127  42000  13045R    JSM P791  UHPB
16130  42000     24X    JSM P211  IHPIB
16131 170607            SAL 8
16132  31572  77572A    STA V32634  J
16133  42000     24X    JSM P211  IHPIB
16134  61572  77572A    IOR V32634  J
16135  42000  12265R    JSM P731  DSWRT
16136  66000  16755R    JMP A1003
16137                 C1021 EQU *
16137  42000  13045R    JSM P791  UHPB
16140  42000  10323R    JSM P626  MRKRON
16141 172402            SAM *+2
16142  66000  16220R    JMP A1022
16143   1723  77723A    LDA V26 MKRMODE
16144  72002            RZA *+2
16145  66000  16220R    JMP A1022
16146   1675  77675A    LDA V15 BLEDS
16147 170601            SAL 2
16150 172010           SAP A1023
16151   1426  77426A    LDA V32534  UFLAG
16152 170610            SAL 9
16153 172005           SAP A1023
16154   1601  77601A    LDA V32641  HPBC
16155  52000  15470R    AND =B1400
16156  72002            RZA *+2
16157  66000  16220R    JMP A1022
16160                 A1023 EQU *
16160   1601  77601A    LDA V32641  HPBC
16161  52000  15470R    AND =B1400
16162  72020           RZA A1024
16163   2000   7565R    LDA =D18
16164  42000  14055R    JSM P216  MESSAGE
16165  42000  13030R    JSM P789  WCRLF
16166  66000  16217R    JMP A1025
16167 175377
16170    611
16171 157777
16172 174777
16173 177733
16174 174377
16175 176377
16176    160
16177   3400
16200     41
16201   2001
16167                 LIT
16202                 A1024 EQU *
16202  42000    166X    JSX .CSHV
16203          4630R    DEF P421  RDBMV
16204   1601  77601A    LDA V32641  HPBC
16205 170507            SAR 8
16206  70540            PWC A
16207  42000  10312R    JSM P218  MKREL
16210 172005           SAP A1026
16211   1717  77717A    LDA V28 AMKR
16212 170040            TCA
```

```
16213  21721   77721A    ADA V25 MRKR
16214  66000   16216R    JMP A1027
16215                  A1026 EQU *
16215   1721   77721A    LDA V25 MRKR
16216                  A1027 EQU *
16216  42000      22X    JSM P209  ADUMP
16217                  A1025 EQU *
16217  66000   16224R    JMP A1028
16220                  A1022 EQU *
16220  42000     167X    JSX .ADDR
16221          16243R    DEF ="999999999999"
16222  42000      13X    JSM P202  STHPB
16223  42000   13030R    JSM P789  WCRLF
16224                  A1028 EQU *
16224  66000   16755R    JMP A1003
16225                  C1029 EQU *
16225  42000   13045R    JSM P791  OHPB
16226  42000   10323R    JSM P626  MRKROK
16227 172402             SAM *+2
16230  66000   16270R    JMP A1030
16231   1723   77723A    LDA V26 MKRMODE
16232  72002             RZA *+2
16233  66000   16270R    JMP A1030
16234   1601   77601A    LDA V32641  HPBC
16235  52000   15470R    AND =B1400
16236  72014            RZA A1031
16237   2000    2521R    LDA =D17
16240  42000   14055R    JSM P216  MESSAGE
16241  42000   13030R    JSM P789  WCRLF
16242  66000   16267R    JMP A1032
16243 999999999999
16243                    LIT
16252                  A1031 EQU *
16252  42000     166X    JSX .CSHV
16253           4630R    DEF P421  RDBMV
16254   1601   77601A    LDA V32641  HPBC
16255 170507             SAR 8
16256  70540             PWC A
16257  42000   10312R    JSM P218  MKREL
16260 172005            SAP A1033
16261   1720   77720A    LDA V27 AMLVL
16262 170040             TCA
16263  21722   77722A    ADA V29 MKRLVL
16264  66000   16266R    JMP A1034
16265                  A1033 EQU *
16265   1722   77722A    LDA V29 MKRLVL
16266                  A1034 EQU *
16266  42000      22X    JSM P209  ADUMP
16267                  A1032 EQU *
16267  66000   16274R    JMP A1035
16270                  A1030 EQU *
16270  42000     167X    JSX .ADDR
16271          16243R    DEF ="999999999999"
16272  42000      13X    JSM P202  STHPB
16273  42000   13030R    JSM P789  WCRLF
16274                  A1035 EQU *
16274  66000   16755R    JMP A1003
16275                  C1036 EQU *
16275   2000    1457R    LDA =D1
16276   6000    2203R    LDB =D8
16277  42000      75X    JSX .WS4
16300  42000   13045R    JSM P791  OHPB
16301  42000     166X    JSX .CSHV
16302           4630R    DEF P421  RDBMV
16303   1601   77601A    LDA V32641  HPBC
16304 170507             SAR 8
16305  42000      21X    JSM P208  TDUMP
16306  66000   16755R    JMP A1003
16307                  C1037 EQU *
16307   2000   16201R    LDA =D1025
16310   6000    2203R    LDB =D8
16311  42000      75X    JSX .WS4
16312  42000   13045R    JSM P791  OHPB
16313  42000     166X    JSX .CSHV
16314           4630R    DEF P421  RDBMV
16315   1601   77601A    LDA V32641  HPBC
16316 170507             SAR 8
16317  42000      21X    JSM P208  TDUMP
16320  66000   16755R    JMP A1003
16321                  C1038 EQU *
16321   1563   77563A    LDA V32627  DSTAD
16322   6000    2203R    LDB =D8
16323  42000      75X    JSX .WS4
16324  22000    1457R    ADA =D1
16325  52000    6353R    AND =B7777
16326  31563   77563A    STA V32627  DSTAD
16327  42000   13045R    JSM P791  OHPB
16330  42000     166X    JSX .CSHV
16331           4630R    DEF P421  RDBMV
16332   1601   77601A    LDA V32641  HPBC
16333 170507             SAR 8
16334  42000      20X    JSM P207  PDUMP
16335  42000   15334R    JSM P969  CLRDA
16336  66000   16755R    JMP A1003
16337                  C1039 EQU *
16337  66000   16407R    JMP A1040
16340                  T1041 EQU *
16340                  K1042 OCT 24050  24050
16341                  K1043 OCT 23447  23447
16342                  K1044 OCT 3001   3001
```

```
16343                    K1045 OCT 22445  22445
16344                    K1046 OCT 4007   4007
16345                    K1047 OCT 21042  21042
16346                    K1048 OCT 7416   7416
16347                    K1049 OCT 11022  11022
16350                    K1050 OCT 10421  10421
16351                    K1051 OCT 21443  21443
16352                    K1052 OCT 20040  20040
16353                    K1053 OCT 6014   6014
16354                    K1054 OCT 17430  17430
16355                    K1055 OCT 22044  22044
16356                    K1056 OCT 23046  23046
16357                    K1057 OCT 20441  20441
16360                    K1058 OCT 5413   5413
16361                    K1059 OCT 6415   6415
16362           16340R   V1060 DEF T1041  OTLIST
16363                          OCT 177777  177777
16364                    K1061 OCT 22   22
16365                    P1062 EQU * NOSKIP
16365 174517                   CLB
16366  42000       56X         JSX .ARGS
16367  44016       16A         ISZ C
16370   1573   77573A          LDA V32635   I
16371  22000   16400R          ADA =D-145
16372  70540                   PWC A
16373   1573   77573A          LDA V32635   I
16374 170040                   TCA
16375  22000    2500R          ADA =D147
16376  42000     136X          JSX .ORT
16377  66000      31X         JMX .RTNA
16400 177557
16400                          LIT
16401                    P1063 EQU * DSRD
16401   6000    2203R          LDB =D8
16402  42000      74X          JSX .RS5
16403  31573   77573A          STA V32635   I
16404  52000    6353R          AND =B7777
16405  31573   77573A          STA V32635   I
16406 170201                   RET 1
16407                    A1040 EQU *
16407  42000   13045R          JSM P791   OHPB
16410   2000   16476R          LDA =B177756
16411  70540                   PWC A
16412   2000    1457R          LDA =D1
16413                    A1064 EQU *
16413  31572   77572A          STA V32634   J
16414  42000      60X          JSX .ARAY
16415           16362R         DEF V1060 OTLIST
16416 170507                   SAR 8
16417  31573   77573A          STA V32635   I
16420   1572   77572A          LDA V32634   J
16421  42000      60X          JSX .ARAY
16422           16362R         DEF V1060 OTLIST
16423  52000    3242R          AND =B377
16424  31741   77741A          STA V32737   IY
16425   1573   77573A          LDA V32635   I
16426 170040                   TCA
16427  21741   77741A          ADA V32737   IY
16430  22000    1277R          ADA =B177777
16431  70540                   PWC A
16432   1741   77741A          LDA V32737   IY
16433                    A1065 EQU *
16433  31741   77741A          STA V32737   IY
16434  42000    2422R          JSM P284   BLKAD
16435  42000   16401R          JSM P1063 DSRD
16436  42000   16365R          JSM P1062 NOSKIP
16437 172402                   SAM *+2
16440  66000   16477R          JMP A1066
16441  42000   16401R          JSM P1063  DSRD
16442  42000   16401R          JSM P1063  DSRD
16443  42000   16401R          JSM P1063  DSRD
16444  42000   16401R          JSM P1063  DSRD
16445   1741   77741A          LDA V32737   IY
16446  12000    2172R          CPA =D13
16447  66000   16453R          JMP A1067
16450  12000    2477R          CPA =D36
16451  66000   16453R          JMP A1067
16452  42000   16401R          JSM P1063 DSRD
16453                    A1067 EQU *
16453                    A1068 EQU *
16453  42000   16365R          JSM P1062 NOSKIP
16454 172023                  SAP A1069
16455   1573   77573A          LDA V32635   I
16456  72421                  SZA A1069
16457   1573   77573A          LDA V32635   I
16460  12000    2521R          CPA =B21
16461  66000   16477R          JMP A1069
16462   1573   77573A          LDA V32635   I
16463  12000    2204R          CPA =D10
16464  66000   16470R          JMP A1071
16465  12000    2172R          CPA =D13
16466  66000   16470R          JMP *+2
16467  66000   16472R          JMP A1070
16470                    A1071 EQU *
16470   2000    2205R          LDA =B40
16471  31573   77573A          STA V32635   I
16472                    A1070 EQU *
16472   1573   77573A          LDA V32635   I
16473  42000      17X          JSM P206   WHPIB
16474  42000   16401R          JSM P1063 DSRD
```

```
16475  66000  16453R     JMP A1068
16476 177756
16476                   LIT
16477                   A1069 EQU *
16477                   A1066 EQU *
16477   1741  77741A     LDA V32737  IY
16500  12000   2172R     CPA =D13
16501  66000  16505R     JMP A1072
16502   1730  77730A     LDA V30 KFLAG
16503  62000   2410R     IOR =B200
16504  31730  77730A     STA V30 KFLAG
16505                   A1072 EQU *
16505  42000  13030R     JSM P789  WCRLF
16506   2000   1457R     LDA =D1
16507  21741  77741A     ADA V32737  IY
16510 144016     16A     ISZ C,I
16511  66000  16433R     JMP A1065
16512  54016     16A     DSZ C
16513   2000   1457R     LDA =D1
16514  21572  77572A     ADA V32634  J
16515 144016     16A     ISZ C,I
16516  66000  16413R     JMP A1064
16517  54016     16A     DSZ C
16520  66000  16755R     JMP A1003
16521                   C1073 EQU *
16521  42000  13045R     JSM P791  OHPB
16522   2000  10142R     LDA =B37
16523  42000     17X     JSM P206  WHPIB
16524  42000  15351R     JSM P972  SAVPREP
16525   2000  15667R     LDA =B177731
16526  70540             PWC A
16527   2000   1457R     LDA =D1
16530                   A1074 EQU *
16530  31573  77573A     STA V32635  I
16531  42000     60X     JSX .ARAY
16532             7R     DEF V4  MSTATE
16533 170507             SAR 8
16534  42000     17X     JSM P206  WHPIB
16535   1573  77573A     LDA V32635  I
16536  42000     60X     JSX .ARAY
16537             7R     DEF V4  MSTATE
16540  42000     17X     JSM P206  WHPIB
16541   2000   1457R     LDA =D1
16542  21573  77573A     ADA V32635  I
16543 144016     16A     ISZ C,I
16544  66000  16530R     JMP A1074
16545  54016     16A     DSZ C
16546  42000     16X     JSM P205  WEOI
16547   2000  16571R     LDA =B245
16550  42000     17X     JSM P206  WHPIB
16551  42000  15405R     JSM P973  SAVCLR
16552  66000  16755R     JMP A1003
16553                   C1075 EQU *
16553  66000  16572R     JMP A1076
16554                   P1077 EQU * KEYETX
16554 174517             CLB
16555  42000     56X     JSX .ARGS
16556  44016     16A     ISZ C
16557   1566  77566A     LDA V32630  KEYCODE
16560  22000   1301R     ADA =D-3
16561  42000    111X     JSX .EQL
16562  70540             PWC A
16563   1736  77736A     LDA V32734  ETX
16564 170040             TCA
16565  21566  77566A     ADA V32630  KEYCODE
16566  42000    111X     JSX .EQL
16567  42000    136X     JSX .ORT
16570  66000     31X     JMX .RTNA
16571    245
16571                   LIT
16572                   A1076 EQU *
16572  42000  13045R     JSM P791  OHPB
16573  42000  15532R     JSM P981  DSPW
16574                   A1078 EQU *
16574  42000     24X     JSM P211  IHPIB
16575  31566  77566A     STA V32630  KEYCODE
16576  42000  16554R     JSM P1077 KEYETX
16577 172403             SAM A1079
16600   1566  77566A     LDA V32630  KEYCODE
16601  42000  12265R     JSM P731  DSWRI
16602                   A1079 EQU *
16602  42000  16554R     JSM P1077 KEYETX
16603 172071             SAP A1078
16604  66000  16755R     JMP A1003
16605                   C1080 EQU *
16605   2000  16710R     LDA =B177730
16606  42000  14741R     JSM P929  ENTRY
16607  66000  16755R     JMP A1003
16610                   C1081 EQU *
16610  42000  15532R     JSM P981  DSPW
16611   1601  77601A     LDA V32641  HPBC
16612  52000  16711R     AND =B165777
16613  31601  77601A     STA V32641  HPBC
16614  66000  16755R     JMP A1003
16615                   C1082 EQU *
16615   1601  77601A     LDA V32641  HPBC
16616  52000   6371R     AND =B167777
16617  31601  77601A     STA V32641  HPBC
16620  66000  16755R     JMP A1003
16621                   C1083 EQU *
```

```
16621    1601   77601A        LDA V32641   HPBC
16622   52000   16712R        AND =B163777
16623   62000    2644R        IOR =B10000
16624   31601   77601A        STA V32641   HPBC
16625   66000   16755R        JMP A1003
16626                   C1084 EQU *
16626    1565   77565A        LDA V32629   SRQEN
16627   62000    5517R        IOR =B100000
16630   31565   77565A        STA V32629   SRQEN
16631    2000    2107R        LDA =D3
16632    6000    2107R        LDB =D3
16633   42000      75X        JSX .WS4
16634   66000   16755R        JMP A1003
16635                   C1085 EQU *
16635   42000   13045R        JSM P791   OHPB
16636    1620   77620A        LDA V32656   PREFIX
16637   42000   14055R        JSM P216   MESSAGE
16640   42000   13030R        JSM P789   WCRLF
16641   66000   16755R        JMP A1003
16642                   C1086 EQU *
16642   42000   13045R        JSM P791   OHPB
16643   42000     166X        JSX .CSHV
16644           24714R        DEF L194   POP
16645   42000     166X        JSX .CSHV
16646           32473R        DEF L195   ABORT
16647   42000      14X        JSM P203   HPBSY
16650    2000   15667R        LDA =B177731
16651   70540                 PWC A
16652    2000    1457R        LDA =D1
16653                   A1087 EQU *
16653   31573   77573A        STA V32635   I
16654   42000      24X        JSM P211   IHPIB
16655  170607                 SAL 8
16656   31572   77572A        STA V32634   J
16657    1573   77573A        LDA V32635   I
16660   42000      60X        JSX .ARAY
16661               7R        DEF V4   MSTATE
16662   70541                 PWC B
16663   42000      24X        JSM P211   IHPIB
16664   61572   77572A        IOR V32634   J
16665   42000     170X        JSX .STAC
16666    2000    1457R        LDA =D1
16667   21573   77573A        ADA V32635   I
16670  144016      16A        ISZ C,I
16671   66000   16653R        JMP A1087
16672   54016      16A        DSZ C
16673   42000      24X        JSM P211   IHPIB
16674   12000   16571R        CPA =B245
16675   66000   16677R        JMP *+2
16676   66000   24714R        JMP L194   POP
16677    1601   77601A        LDA V32641   HPBC
16700   52000    6514R        AND =B77777
16701   31601   77601A        STA V32641   HPBC
16702   42000   15424R        JSM P974   SAVFIX
16703    2000   14714R        LDA =B177747
16704   42000   14741R        JSM P929   ENTRY
16705    2000    3231R        LDA =B60
16706   42000   15546R        JSM P214   KEY
16707   66000   16755R        JMP A1003
16710  177730
16711  165777
16712  163777
16710                         LIT
16713           16642R        DEF C1086
16714           16635R        DEF C1085
16715           16626R        DEF C1084
16716           16621R        DEF C1083
16717           16615R        DEF C1082
16720           16610R        DEF C1081
16721           16605R        DEF C1080
16722           16553R        DEF C1075
16723           16755R        DEF A1003
16724           16521R        DEF C1073
16725           16337R        DEF C1039
16726           16321R        DEF C1038
16727           16307R        DEF C1037
16730           16275R        DEF C1036
16731           16225R        DEF C1029
16732           16137R        DEF C1021
16733           16126R        DEF C1020
16734           16122R        DEF C1019
16735           16114R        DEF C1017
16736           16103R        DEF C1016
16737           16076R        DEF C1015
16740           16042R        DEF C1014
16741           16035R        DEF C1013
16742           16030R        DEF C1012
16743           16024R        DEF C1011
16744           15774R        DEF C1009
16745           15763R        DEF C1008
16746           15755R        DEF C1007
16747           15753R        DEF C1006
16750           15740R        DEF C1004
16751           32476R        DEF L193   RESET
16752           15721R        DEF C1002
16753                         DEC -33
16754   42000     143X  A1001 JSX .CASE
16755                   A1003 EQU *
16755   66000   24627R        JMP A1088
16756                   C1089 EQU *
```

```
16756     1566   77566A     LDA V32630  KEYCODE
16757    22000    2520R     ADA =B-37
16760    66000   17263R     JMP A1090
16761                     C1091 EQU *
16761     1676   77676A     LDA V16 TLEDS
16762   170605              SAL 6
16763   172004             SAP A1093
16764     1601   77601A     LDA V32641  HPBC
16765   170601              SAL 2
16766   172402             SAM A1092
16767                     A1093 EQU *
16767    42000   12474R     JSM P744  UNITS
16770                     A1092 EQU *
16770    66000   17264R     JMP A1094
16771                     C1095 EQU *
16771     1601   77601A     LDA V32641  HPBC
16772    52000   17017R     AND =B171777
16773    31601   77601A     STA V32641  HPBC
16774    66000   17264R     JMP A1094
16775                     C1096 EQU *
16775     1601   77601A     LDA V32641  HPBC
16776    52000   17017R     AND =B171777
16777    62000    6703R     IOR =B2000
17000    31601   77601A     STA V32641  HPBC
17001    66000   17264R     JMP A1094
17002                     C1097 EQU *
17002    42000   12474R     JSM P744  UNITS
17003    66000   17264R     JMP A1094
17004                     C1098 EQU *
17004    42000   13045R     JSM P791  OHPB
17005    42000      24X     JSM P211  IHP1B
17006    31736   77736A     STA V32734  ETX
17007    66000   17264R     JMP A1094
17010                     C1099 EQU *
17010     1617   77617A     LDA V32655  DECFLG
17011    12000    1277R     CPA =B177777
17012    66000   17014R     JMP *+2
17013    66000   17020R     JMP A1100
17014     2000    1463R     LDA =D0
17015    31617   77617A     STA V32655  DECFLG
17016    66000   17032R     JMP A1101
17017   171777
17017                      LIT
17020                     A1100 EQU *
17020    42000      37X     JSX .LDBI
17021            77651A     DEF V32681  LTEMP
17022     6000    1457R     LDB =D1
17023    42000      47X     JSX .DRG1
17024    42000      34X     JSX .STRD
17025            77651A     DEF V32681  LTEMP
17026     1617   77617A     LDA V32655  DECFLG
17027   172003             SAP A1102
17030    22000    1457R     ADA =D1
17031    31617   77617A     STA V32655  DECFLG
17032                     A1102 EQU *
17032                     A1101 EQU *
17032     1611   77611A     LDA V32649  CHRC
17033   170040              TCA
17034   172012             SAP A1103
17035    55611   77611A     DSZ V32649  CHRC
17036                       NOP
17037     1737   77737A     LDA V32735  BLKS
17040    21612   77612A     ADA V32650  NCHR
17041    21611   77611A     ADA V32649  CHRC
17042     6000    2203R     LDB =D8
17043    42000      75X     JSX .WS4
17044     2000    2500R     LDA =D147
17045    42000      73X     JSX .W6
17046                     A1103 EQU *
17046     1611   77611A     LDA V32649  CHRC
17047    72010             RZA A1104
17050    42000      53X     JSX .LDSI
17051             1463R     DEF =D0
17052    42000      34X     JSX .STRD
17053            77651A     DEF V32681  LTEMP
17054     1616   77616A     LDA V32654  XFLAG
17055    62000    2644R     IOR =B10000
17056    31616   77616A     STA V32654  XFLAG
17057                     A1104 EQU *
17057    66000   17264R     JMP A1094
17060                     C1105 EQU *
17060    42000   12474R     JSM P744  UNITS
17061    66000   17264R     JMP A1094
17062                     C1106 EQU *
17062    42000   15224R     JSM P221  TRIGR
17063    66000   17264R     JMP A1094
17064                     C1107 EQU *
17064     1676   77676A     LDA V16 TLEDS
17065   170605              SAL 6
17066   172005             SAP A1108
17067    42000   15344R     JSM P971  USFT
17070     1616   77616A     LDA V32654  XFLAG
17071    62000   11310R     IOR =B400
17072    31616   77616A     STA V32654  XFLAG
17073                     A1108 EQU *
17073     5616   77616A     LDB V32654  XFLAG
17074   174606              SBL 7
17075     2000   17114R     LDA =B177742
17076   176402             SBM A1109
17077     2000    2647R     LDA =B177750
```

```
17100                     A1109 EQU *
17100  42000   14741R       JSM P929  ENTRY
17101  66000   17264R       JMP A1094
17102                     C1110 EQU *
17102   1676   77676A       LDA V16 TLEDS
17103 170605                SAL 6
17104 172011                SAP A1111
17105  42000   15344R       JSM P971  USFT
17106   1616   77616A       LDA V32654  XFLAG
17107  52000   11303R       AND =B177377
17110  31616   77616A       STA V32654  XFLAG
17111   2000    1463R       LDA =D0
17112  42000   14741R       JSM P929  ENTRY
17113  66000   17117R       JMP A1112
17114 177742
17114                       LIT
17115                     A1111 EQU *
17115   2000   14714R       LDA =B177747
17116  42000   14741R       JSM P929  ENTRY
17117                     A1112 EQU *
17117  66000   17264R       JMP A1094
17120                     C1113 EQU *
17120   2000    1463R       LDA =D0
17121  42000   14741R       JSM P929  ENTRY
17122  66000   17264R       JMP A1094
17123                     C1114 EQU *
17123   1676   77676A       LDA V16 TLEDS
17124 170605                SAL 6
17125 172006                SAP A1115
17126  42000   15344R       JSM P971  USFT
17127   2000   17132R       LDA =B177726
17130  42000   14741R       JSM P929  ENTRY
17131  66000   17206R       JMP A1116
17132 177726
17132                       LIT
17133                     A1115 EQU *
17133   2000   17230R       LDA =D441
17134  31613   77613A       STA V32651  DAC4
17135   6000    1463R       LDB =D0
17136  42000     112X       JSX .WS7
17137   2000    1463R       LDA =D0
17140  42000   14741R       JSM P929  ENTRY
17141  42000    2762R       JSM P314  AVGRST
17142  42000     161X       JSX .MVE4
17143          17231R       DEF =F750000000
17144          77665A       DEF V8  CFREQ
17145  42000     161X       JSX .MVE4
17146          17235R       DEF =F1500000000
17147          77671A       DEF V9  SPAN
17150   2000    2107R       LDA =D3
17151  31731   77731A       STA V18 SINDEX
17152  31600   77600A       STA V32640  CTIM
17153   1675   77675A       LDA V15 BLEDS
17154  52000   17241R       AND =B177077
17155  31675   77675A       STA V15 BLEDS
17156   2000    2172R       LDA =D13
17157  42000    4210R       JSM P392  IFBWOUT
17160   2000    2172R       LDA =D13
17161  42000    4314R       JSM P400  VBWOUT
17162   1616   77616A       LDA V32654  XFLAG
17163  52000   15404R       AND =B177400
17164  62000    3654R       IOR =B20
17165  31616   77616A       STA V32654  XFLAG
17166   2000    2411R       LDA =D4
17167  31605   77605A       STA V32645  SCANSL
17170  42000      37X       JSX .LDBI
17171          17235R       DEF =F1500000000
17172  42000   11120R       JSM P668  SPANW
17173  42000      37X       JSX .LDBI
17174          77665A       DEF V8  CFREQ
17175  42000    6750R       JSM P222  TUNE
17176  42000      37X       JSX .LDBI
17177           7555R       DEF =F20000
17200  42000    7345R       JSM P558  SCANT
17201  42000   15224R       JSM P221  TRIGR
17202   2000    1457R       LDA =D1
17203  42000   15313R       JSM P968  CFDF
17204   2000   10411R       LDA =B114
17205  42000   15546R       JSM P214  KEY
17206                     A1116 EQU *
17206  66000   17264R       JMP A1094
17207                     C1117 EQU *
17207  42000   12317R       JSM P733  CLRNUM
17210  42000   12302R       JSM P732  WKEY
17211   2000    1457R       LDA =D1
17212  31651   77651A       STA V32681  LTS
17213  42000   15344R       JSM P971  USFT
17214  66000   17264R       JMP A1094
17215                     C1118 EQU *
17215   1620   77620A       LDA V32656  PREFIX
17216  72407                SZA A1119
17217   1617   77617A       LDA V32655  DECFLG
17220  72005                RZA A1120
17221   2000    1277R       LDA =B177777
17222  31617   77617A       STA V32655  DECFLG
17223  42000   12317R       JSM P733  CLRNUM
17224  42000   12302R       JSM P732  WKEY
17225                     A1120 EQU *
17225                     A1119 EQU *
17225  66000   17264R       JMP A1094
```

```
17226                    C1121 EQU *
17226  42000   12474R     JSM P744  UNITS
17227  66000   17264R     JMP A1094
17230    671
17231 750000000
17235 1500000000
17241 177077
17230                     LIT
17242          17226R     DEF C1121
17243          17215R     DEF C1118
17244          17207R     DEF C1117
17245          17123R     DEF C1114
17246          17264R     DEF A1094
17247          17120R     DEF C1113
17250          17102R     DEF C1110
17251          17064R     DEF C1107
17252          17062R     DEF C1106
17253          17060R     DEF C1105
17254          17010R     DEF C1099
17255          17004R     DEF C1098
17256          17002R     DEF C1097
17257          16775R     DEF C1096
17260          16771R     DEF C1095
17261          16761R     DEF C1091
17262                     DEC -17
17263  42000     143X    A1090 JSX .CASE
17264                    A1094 EQU *
17264   1566   77566A     LDA V32630  KEYCODE
17265  22000   17330R     ADA =B-73
17266  66000   17506R     JMP A1122
17267                    C1123 EQU *
17267   1676   77676A     LDA V16 ILEDS
17270 170605              SAL 6
17271 172003              SAP A1124
17272   2000   10241R     LDA =B177743
17273  42000   14741R     JSM P929  ENTRY
17274                    A1124 EQU *
17274  42000   15344R     JSM P971  USFT
17275   1677   77677A     LDA V17 RFAT
17276  52000    1375R     AND =B177767
17277  31677   77677A     STA V17 RFAT
17300   6000    1704R     LDB =D6
17301  42000     171X     JSX .RS4
17302  31573   77573A     STA V32635  I
17303  42000     104X     JSX .TURN
17304          17331R     DEF =B30000
17305          77730A     DEF V30 KFLAG
17306  31730   77730A     STA V30 KFLAG
17307   1700   77700A     LDA V22 RLVL
17310  42000    3530R     JSM P355  REFLEV
17311   1426   77426A     LDA V32534  UFLAG
17312  70540              PWC A
17313  42000    3255R     JSM P337  WRFAI
17314  70760              WWC A
17315  31426   77426A     STA V32534  UFLAG
17316  42000    2650R     JSM P304  UNCAL
17317  42000    2551R     JSM P298  ABLK
17320  66000   17507R     JMP A1125
17321                    C1126 EQU *
17321   1676   77676A     LDA V16 ILEDS
17322 170605              SAL 6
17323 172007              SAP A1127
17324  42000   15344R     JSM P971  USFT
17325   2000    2520R     LDA =B177741
17326  42000   14741R     JSM P929  ENTRY
17327  66000   17427R     JMP A1128
17330 177705
17331  30000
17330                     LIT
17332                    A1127 EQU *
17332  42000   10323R     JSM P626  MRKROK
17333 172402              SAM *+2
17334  66000   17410R     JMP A1129
17335   1605   77605A     LDA V32645  SCANSL
17336  72002              RZA *+2
17337  66000   17410R     JMP A1129
17340   1723   77723A     LDA V26 MKRMODE
17341  72003              RZA A1130
17342   2000   17407R     LDA =B115
17343  42000   15546R     JSM P214  KEY
17344                    A1130 EQU *
17344   1730   77730A     LDA V30 KFLAG
17345 170612              SAL 11
17346  61675   77675A     IOR V15 BLEDS
17347 170140              CMA
17350  42000     104X     JSX .TURN
17351           1770R     DEF =B20000
17352          77675A     DEF V15 BLEDS
17353  31675   77675A     STA V15 BLEDS
17354   1723   77723A     LDA V26 MKRMODE
17355  42000     121X     JSX MOD4
17356           2107R     DEF =D3
17357  22000    7565R     ADA =D18
17360  70540              PWC A
17361   1675   77675A     LDA V15 BLEDS
17362 170601              SAL 2
17363 170516              SAR 15
17364   6000    2107R     LDB =D3
17365  75617              MPY
17366  42000      57X     JSX ADD4I
```

```
17367  31723  77723A    STA V26 MKRMODE
17370   1426  77426A    LDA V32534  UFLAG
17371  62000   1364R    IOR =B100
17372  31426  77426A    STA V32534  UFLAG
17373   1576  77576A    LDA V32638  RPGPTR
17374  12000   7565R    CPA =D18
17375  66000  17377R    JMP *+2
17376  66000  17401R    JMP A1131
17377   1723  77723A    LDA V26 MKRMODE
17400  42000  14741R    JSM P929  ENTRY
17401                  A1131 EQU *
17401   2000   2521R    LDA =D17
17402  42000   2434R    JSM P285  BLKOF
17403  42000   7775R    JSM P603  CSCANBW
17404  42000  10413R    JSM P636  MKRON
17405  42000  12334R    JSM P217  MBLK
17406  66000  17427R    JMP A1132
17407    115
17407                  LIT
17410                  A1129 EQU *
17410   1675  77675A    LDA V15 BLEDS
17411 170601            SAL 2
17412 172015            SAP A1133
17413   1723  77723A    LDA V26 MKRMODE
17414  42000    121X    JSX MOD4
17415          2107R    DEF =D3
17416  22000   7565R    ADA =D18
17417  31723  77723A    STA V26 MKRMODE
17420   1675  77675A    LDA V15 BLEDS
17421  52000  16171R    AND =B157777
17422  31675  77675A    STA V15 BLEDS
17423   2000   2521R    LDA =D17
17424  42000   2434R    JSM P285  BLKOF
17425  42000  10413R    JSM P636  MKRON
17426  42000   7775R    JSM P603  CSCANBW
17427                  A1133 EQU *
17427                  A1132 EQU *
17427                  A1128 EQU *
17427  66000  17507R    JMP A1125
17430                  C1134 EQU *
17430   1676  77676A    LDA V16 TLEDS
17431 170605            SAL 6
17432 172003            SAP A1135
17433   2000  10241R    LDA =B177743
17434  42000  14741R    JSM P929  ENTRY
17435                  A1135 EQU *
17435  42000  15344R    JSM P971  USFI
17436   1677  77677A    LDA V17 RFAT
17437  62000   2203R    IOR =B10
17440  31677  77677A    STA V17 RFAT
17441   6000   1704R    LDB =D6
17442  42000    171X    JSX .RS4
17443  31573  77573A    STA V32635  I
17444 170501            SAR 2
17445  42000    104X    JSX .TURN
17446         17331R    DEF =B30000
17447         77730A    DEF V30 RFLAG
17450  31730  77730A    STA V30 RFLAG
17451   1700  77700A    LDA V22 RLVL
17452  42000   3530R    JSM P355  REFLEV
17453   1426  77426A    LDA V32534  UFLAG
17454  70540            PWC A
17455  42000   3255R    JSM P337  WRFAT
17456  70760            WWC A
17457  31426  77426A    STA V32534  UFLAG
17460  42000   2650R    JSM P304  UNCAL
17461  42000   2551R    JSM P298  ABLK
17462  66000  17507R    JMP A1125
17463                  C1136 EQU *
17463   1601  77601A    LDA V32641  HPBC
17464  62000   4534R    IOR =B40000
17465  31601  77601A    STA V32641  HPBC
17466  42000    161X    JSX .MVE4
17467         77651A    DEF V32681  LTEMP
17470         77621A    DEF V32657  MANT
17471   2000  15047R    LDA =B145
17472  31566  77566A    STA V32630  KEYCODE
17473  42000  12302R    JSM P732  WKEY
17474  42000     53X    JSX .LDSI
17475          1463R    DEF =D0
17476  42000     34X    JSX .STRD
17477         77651A    DEF V32681  LTEMP
17500  66000  17507R    JMP A1125
17501         17463R    DEF C1136
17502         17430R    DEF C1134
17503         17321R    DEF C1126
17504         17267R    DEF C1123
17505                   DEC -5
17506  42000    143X   A1122 JSX .CASE
17507                  A1125 EQU *
17507  66000  24627R    JMP A1088
17510                  C1137 EQU *
17510   1676  77676A    LDA V16 TLEDS
17511 170605            SAL 6
17512 172002            SAP *+2
17513  66000  20573R    JMP A1138
17514   1566  77566A    LDA V32630  KEYCODE
17515  22000  20421R    ADA =B-100
17516  66000  20571R    JMP A1139
17517                  C1140 EQU *
```

```
17517    1675  77675A       LDA V15 BLEDS
17520   52000   6512R       AND =B177677
17521   31675  77675A       STA V15 BLEDS
17522   42000   7775R       JSM P603  CSCANBW
17523    2000   1457R       LDA =D1
17524   42000  15133R       JSM P947  TRNOFF
17525   66000  20572R       JMP A1141
17526                 C1142 EQU *
17526    1675  77675A       LDA V15 BLEDS
17527   52000  13044R       AND =B177577
17530   31675  77675A       STA V15 BLEDS
17531   42000   7775R       JSM P603  CSCANBW
17532    2000   2276R       LDA =D2
17533   42000  15133R       JSM P947  TRNOFF
17534   66000  20572R       JMP A1141
17535                 C1143 EQU *
17535    1675  77675A       LDA V15 BLEDS
17536   52000  11303R       AND =B177377
17537   31675  77675A       STA V15 BLEDS
17540   42000   7775R       JSM P603  CSCANBW
17541    2000   2107R       LDA =D3
17542   42000  15133R       JSM P947  TRNOFF
17543   66000  20572R       JMP A1141
17544                 C1144 EQU *
17544    1675  77675A       LDA V15 BLEDS
17545   52000  15350R       AND =B176777
17546   31675  77675A       STA V15 BLEDS
17547    1700  77700A       LDA V22 RLVL
17550   42000   3530R       JSM P355  REFLEV
17551    2000   2411R       LDA =D4
17552   42000  15133R       JSM P947  TRNOFF
17553   66000  20572R       JMP A1141
17554                 C1145 EQU *
17554    1675  77675A       LDA V15 BLEDS
17555   52000   5521R       AND =B175777
17556   31675  77675A       STA V15 BLEDS
17557    2000   2565R       LDA =D11
17560   42000  15133R       JSM P947  TRNOFF
17561    2000   2565R       LDA =D11
17562   42000   2434R       JSM P285  BLKOF
17563   66000  20572R       JMP A1141
17564                 C1146 EQU *
17564    1675  77675A       LDA V15 BLEDS
17565   62000   1364R       IOR =B100
17566   31675  77675A       STA V15 BLEDS
17567    2000   1457R       LDA =D1
17570   42000  14741R       JSM P929  ENTRY
17571   66000  20572R       JMP A1141
17572                 C1147 EQU *
17572    1675  77675A       LDA V15 BLEDS
17573   62000   2410R       IOR =B200
17574   31675  77675A       STA V15 BLEDS
17575    2000   2276R       LDA =D2
17576   42000  14741R       JSM P929  ENTRY
17577   66000  20572R       JMP A1141
17600                 C1148 EQU *
17600    1675  77675A       LDA V15 BLEDS
17601   62000  11310R       IOR =B400
17602   31675  77675A       STA V15 BLEDS
17603    2000   2107R       LDA =D3
17604   42000  14741R       JSM P929  ENTRY
17605   66000  20572R       JMP A1141
17606                 C1149 EQU *
17606    1675  77675A       LDA V15 BLEDS
17607   62000   1300R       IOR =B1000
17610   31675  77675A       STA V15 BLEDS
17611    2000   2411R       LDA =D4
17612   42000  14741R       JSM P929  ENTRY
17613   66000  20572R       JMP A1141
17614                 C1150 EQU *
17614    1675  77675A       LDA V15 BLEDS
17615   62000   6703R       IOR =B2000
17616   31675  77675A       STA V15 BLEDS
17617    2000   2565R       LDA =D11
17620   42000  14741R       JSM P929  ENTRY
17621   66000  20572R       JMP A1141
17622                 C1151 EQU *
17622   42000  10323R       JSM P626  MRKROK
17623  172402               SAM *+2
17624   66000  17666R       JMP A1152
17625    2000   4256R       LDA =B170000
17626   31722  77722A       STA V29 MKRLVL
17627    2000   1457R       LDA =D1
17630   31721  77721A       STA V25 MRKR
17631   42000  10336R       JSM P627  MKRAD
17632    2000  20422R       LDA =B176027
17633   70540               PWC A
17634    2000   1457R       LDA =D1
17635                 A1153 EQU *
17635   31572  77572A       STA V32634  J
17636   42000    162X       JSX .R5
17637   31573  77573A       STA V32635  I
17640  170604               SAL 5
17641  170404               AAR 5
17642   31573  77573A       STA V32635  I
17643  170040               TCA
17644   21722  77722A       ADA V29 MKRLVL
17645  172005              SAP A1154
17646    1573  77573A       LDA V32635  I
17647   31722  77722A       STA V29 MKRLVL
```

```
17650    1572   77572A    LDA V32634  J
17651   31721   77721A    STA V25 MRKR
17652                   A1154 EQU *
17652    2000    1457R    LDA =D1
17653   21572   77572A    ADA V32634  J
17654  144016      16A    ISZ C,I
17655   66000   17635R    JMP A1153
17656   54016      16A    DSZ C
17657    1723   77723A    LDA V26 MRKMODE
17660   72003             RZA A1155
17661    2000    7565R    LDA =D18
17662   31723   77723A    STA V26 MRKMODE
17663                   A1155 EQU *
17663    1721   77721A    LDA V25 MRKR
17664   42000   11010R    JSM P663  STMRKR
17665   42000   10301R    JSM P624  MRKACI
17666                   A1152 EQU *
17666   66000   20572R    JMP A1141
17667                   C1156 EQU *
17667    2000    3166R    LDA =D1023
17670   31721   77721A    STA V25 MRKR
17671    1723   77723A    LDA V26 MRKMODE
17672   42000   15133R    JSM P947  TRNOFF
17673    2000    2521R    LDA =D17
17674   42000    2434R    JSM P285  BLKOF
17675    2000    7565R    LDA =D18
17676   42000    2434R    JSM P285  BLKOF
17677    2000    3042R    LDA =D37
17700   42000   15133R    JSM P947  TRNOFF
17701    2000   10141R    LDA =D38
17702   42000   15133R    JSM P947  TRNOFF
17703    2000    2477R    LDA =D36
17704   42000   15133R    JSM P947  TRNOFF
17705    1616   77616A    LDA V32654  XFLAG
17706   52000    2302R    AND =B26
17707   22000    6231R    ADA =B177754
17710   72004             RZA A1157
17711   42000      37X    JSX .LDBI
17712           77665A    DEF V8  CFREG
17713   42000    6016R    JSM P500  STUNE
17714                   A1157 EQU *
17714    1616   77616A    LDA V32654  XFLAG
17715   52000    1704R    AND =D6
17716   22000    1363R    ADA =B177774
17717    4000             LDB A
17720    2000   20423R    LDA =B21016
17721   76402             SZB A1158
17722    2000   20424R    LDA =B21010
17723                   A1158 EQU *
17723   70540             PWC A
17724    2000    1463R    LDA =D0
17725   42000     104X    JSX .TURN
17726                     NOP
17727           77616A    DEF V32654  XFLAG
17730   31616   77616A    STA V32654  XFLAG
17731    2000    1463R    LDA =D0
17732   31723   77723A    STA V26 MRKMODE
17733    1740   77740A    LDA V32736  EFLAG
17734   52000    2644R    AND =B10000
17735  170600             SAL 1
17736   61601   77601A    IOR V32641  HPBC
17737   31601   77601A    STA V32641  HPBC
17740    1740   77740A    LDA V32736  EFLAG
17741   52000   20425R    AND =B167774
17742   31740   77740A    STA V32736  EFLAG
17743    2000    2221R    LDA =D9
17744   70540             PWC A
17745    2000    1457R    LDA =D1
17746   42000   10713R    JSM P656  GRAT
17747    1675   77675A    LDA V15 BLEDS
17750   31573   77573A    STA V32635  I
17751    1675   77675A    LDA V15 BLEDS
17752   52000   20426R    AND =B117767
17753   31675   77675A    STA V15 BLEDS
17754    1573   77573A    LDA V32635  I
17755  170613             SAL 12
17756  172002             SAP A1159
17757   42000   15117R    JSM P943  SMODE
17760                   A1159 EQU *
17760   42000    7775R    JSM P603  CSCANBW
17761   66000   20572R    JMP A1141
17762                   C1160 EQU *
17762   42000   10323R    JSM P626  MRKROK
17763  172030             SAP A1161
17764    1675   77675A    LDA V15 BLEDS
17765  170601             SAL 2
17766   70540             PWC A
17767    1605   77605A    LDA V32645  SCANSL
17770   42000     135X    JSX .NEGL
17771   42000     154X    JSX .ANDI
17772  170516             SAR 15
17773    6000    2107R    LDB =D3
17774   75617             MPY
17775   22000    7565R    ADA =D18
17776   31723   77723A    STA V26 MRKMODE
17777    2000   20427R    LDA =B173
20000   42000   15546R    JSM P214  KEY
20001    2000    2521R    LDA =D17
20002   42000    2434R    JSM P285  BLKOF
20003   42000   10413R    JSM P636  MRKON
```

```
20004   1723   77723A     LDA V26 MKRMODE
20005  42000   14741R     JSM P929  ENTRY
20006  42000   12334R     JSM P217  MBLK
20007   2000    2221R     LDA =D9
20010  70540              PWC A
20011   2000    2406R     LDA =D7
20012  42000   10713R     JSM P656  GRAI
20013                   A1161 EQU *
20013  66000   20572R     JMP A1141
20014                   C1162 EQU *
20014   1723   77723A     LDA V26 MKRMODE
20015  72425              SZA A1163
20016  42000   10323R     JSM P626  MRKROK
20017 172023              SAP A1163
20020  42000    2762R     JSM P314  AVGRST
20021  42000   10312R     JSM P218  MKREL
20022 172004              SAP A1164
20023  42000      37X     JSX .LDB1
20024          77724A     DEF V10 AMF
20025  66000   20030R     JMP A1165
20026                   A1164 EQU *
20026  42000      53X     JSX .LDS1
20027           1463R     DEF =D0
20030                   A1165 EQU *
20030  42000     150X     JSX ADD2
20031          77645A     DEF V32677  MFREQ
20032  42000    6750R     JSM P222  TUNE
20033   2000   10522R     LDA =D501
20034  31721   77721A     STA V25 MRKR
20035   1426   77426A     LDA V32534  UFLAG
20036  62000    1364R     IOR =B100
20037  31426   77426A     STA V32534  UFLAG
20040  42000    2650R     JSM P304  UNCAL
20041  42000   12334R     JSM P217  MBLK
20042                   A1163 EQU *
20042  66000   20572R     JMP A1141
20043                   C1166 EQU *
20043  42000   10323R     JSM P626  MRKROK
20044 172402              SAM *+2
20045  66000   20150R     JMP A1167
20046   1723   77723A     LDA V26 MKRMODE
20047  72003              RZA A1168
20050   2000   17407R     LDA =B115
20051  42000   15546R     JSM P214  KEY
20052                   A1168 EQU *
20052   2000   20427R     LDA =B173
20053  42000   15546R     JSM P214  KEY
20054  42000   10312R     JSM P218  MKREL
20055 172005              SAP A1170
20056   1723   77723A     LDA V26 MKRMODE
20057  11620   77620A     CPA V32656  PREFIX
20060  66000   20062R     JMP *+2
20061  66000   20145R     JMP A1169
20062                   A1170 EQU *
20062  42000   10312R     JSM P218  MKREL
20063 172006              SAP A1171
20064  42000      37X     JSX .LDB1
20065          77724A     DEF V10 AMF
20066  42000     150X     JSX ADD2
20067          77645A     DEF V32677  MFREQ
20070  66000   20073R     JMP A1172
20071                   A1171 EQU *
20071  42000      37X     JSX .LDB1
20072          77645A     DEF V32677  MFREQ
20073                   A1172 EQU *
20073  42000      34X     JSX .STRD
20074          77724A     DEF V10 AMF
20075  42000      53X     JSX .LDS1
20076           1463R     DEF =D0
20077  42000      34X     JSX .STRD
20100          77645A     DEF V32677  MFREQ
20101   1675   77675A     LDA V15 BLEDS
20102 170601              SAL 2
20103  70540              PWC A
20104   1605   77605A     LDA V32645  SCANSL
20105  42000     135X     JSX .NEQL
20106  42000     154X     JSX .ANDT
20107 170516              SAR 15
20110   6000    2107R     LDB =D3
20111  75017              MPY
20112  22000    2301R     ADA =D19
20113  31723   77723A     STA V26 MKRMODE
20114   1721   77721A     LDA V25 MRKR
20115  31717   77717A     STA V28 AMKR
20116   1722   77722A     LDA V29 MKRLVL
20117  31720   77720A     STA V27 AMLVL
20120   2000    2521R     LDA =D17
20121  42000    2434R     JSM P285  BLKOF
20122  42000   10413R     JSM P636  MKRON
20123   2000    2153R     LDA =B177773
20124  70540              PWC A
20125   2000   10706R     LDA =D2050
20126                   A1173 EQU *
20126  31573   77573A     STA V32635  I
20127   6000    2203R     LDB =D8
20130  42000      75X     JSX .*S4
20131  42000     162X     JSX .R5
20132  31572   77572A     STA V32634  J
20133   1573   77573A     LDA V32635  I
20134  22000    2405R     ADA =D5
```

```
20135   42000    103X      JSX .W4
20136    1572  77572A      LDA V32634   J
20137   42000     73X      JSX .W6
20140    2000   1457R      LDA =D1
20141   21573  77573A      ADA V32635   I
20142  144016     16A      ISZ C,I
20143   66000  20126R      JMP A1173
20144   54016     16A      DSZ C
20145                    A1169 EQU *
20145    1723  77723A      LDA V26 MKRMODE
20146   42000  14741R      JSM P929  ENTRY
20147   42000  12334R      JSM P217  MBLK
20150                    A1167 EQU *
20150   66000  20572R      JMP A1141
20151                    C1174 EQU *
20151   42000  10323R      JSM P626  MRKROK
20152  172012             SAP A1175
20153    2000  20427R      LDA =B173
20154   42000  15546R      JSM P214  KEY
20155    2000  17407R      LDA =B115
20156   42000  15546R      JSM P214  KEY
20157    1723  77723A      LDA V26 MKRMODE
20160   22000   2276R      ADA =D2
20161   31723  77723A      STA V26 MKRMODE
20162   42000  14741R      JSM P929  ENTRY
20163   42000  12334R      JSM P217  MBLK
20164                    A1175 EQU *
20164   66000  20572R      JMP A1141
20165                    C1176 EQU *
20165    1723  77723A      LDA V26 MKRMODE
20166   72416             SZA A1177
20167   42000  10323R      JSM P626  MRKROK
20170  172014             SAP A1177
20171   42000     37X      JSX .LDBI
20172          77645A      DEF V32677   MFREQ
20173    4020     20A      LDB AR2
20174   77202              SLB *+2,C
20175   34020     20A      STB AR2
20176   42000     34X      JSX .STRD
20177          77713A      DEF V7  FSTEP
20200    1675  77675A      LDA V15 BLEDS
20201   62000   6703R      IOR =B2000
20202   31675  77675A      STA V15 BLEDS
20203   42000  12334R      JSM P217  MBLK
20204                    A1177 EQU *
20204   66000  20572R      JMP A1141
20205                    C1178 EQU *
20205    1723  77723A      LDA V26 MKRMODE
20206   72433             SZA A1179
20207   42000  10323R      JSM P626  MRKROK
20210  172031             SAP A1179
20211    1722  77722A      LDA V29 MKRLVL
20212   42000   4471R      JSM P410  DBMNV
20213   42000     34X      JSX .STRD
20214          77655A      DEF V32685  LTEMP2
20215    1730  77730A      LDA V30 KFLAG
20216  170515              SAR 14
20217   12000   2107R      CPA =D3
20220   66000  20222R      JMP *+2
20221   66000  20224R      JMP A1180
20222   42000   2001R      JSM P251  DBM
20223   66000  20224R      JMP A1181
20224                    A1180 EQU *
20224                    A1181 EQU *
20224   42000     50X      JSX CNV24
20225   70540              PWC A
20226    1435  77435A      LDA V32541   IF1
20227  170140              CMA
20230  170516              SAR 15
20231    6000   2405R      LDB =D5
20232   75617              MPY
20233   42000     57X      JSX ADD4T
20234   42000   3530R      JSM P355  REFLEV
20235   42000   2762R      JSM P314  AVGRST
20236   42000  12334R      JSM P217  MBLK
20237    2000   4470R      LDA =D1000
20240   31722  77722A      STA V29 MKRLVL
20241                    A1179 EQU *
20241   66000  20572R      JMP A1141
20242                    C1182 EQU *
20242    1723  77723A      LDA V26 MKRMODE
20243   72414             SZA A1183
20244   42000  10323R      JSM P626  MRKROK
20245  172012             SAP A1183
20246    1675  77675A      LDA V15 BLEDS
20247  170140              CMA
20250   42000    104X      JSX .TURN
20251           4534R      DEF =B40000
20252          77675A      DEF V15 BLEDS
20253   31675  77675A      STA V15 BLEDS
20254  170140              CMA
20255    6000   2276R      LDB =D2
20256   42000     75X      JSX .WS4
20257                    A1183 EQU *
20257   66000  20572R      JMP A1141
20260                    C1184 EQU *
20260    2000   1277R      LDA =B177777
20261   31574  77574A      STA V32636   RPG
20262    1616  77616A      LDA V32654   XFLAG
20263   62000   1457R      IOR =D1
20264   31616  77616A      STA V32654   XFLAG
```

```
20265  66000  20572R    JMP A1141
20266                 C1185 EQU *
20266   2000   1457R    LDA =D1
20267  31574  77574A    STA V32636  RPG
20270   1616  77616A    LDA V32654  XFLAG
20271  62000   1457R    IOR =D1
20272  31616  77616A    STA V32654  XFLAG
20273  66000  20572R    JMP A1141
20274                 C1186 EQU *
20274   2000   2406R    LDA =D7
20275  42000  14741R    JSM P929  ENTRY
20276   1675  77675A    LDA V15 BLEDS
20277  73003            SLA A1187
20300   2000   1463R    LDA =D0
20301  42000  15313R    JSM P968  CFDF
20302                 A1187 EQU *
20302  66000  20572R    JMP A1141
20303                 C1188 EQU *
20303   2000   2203R    LDA =D8
20304  42000  14741R    JSM P929  ENTRY
20305   1675  77675A    LDA V15 BLEDS
20306  73003            SLA A1189
20307   2000   1463R    LDA =D0
20310  42000  15313R    JSM P968  CFDF
20311                 A1189 EQU *
20311  66000  20572R    JMP A1141
20312                 C1190 EQU *
20312   2000   2221R    LDA =D9
20313  42000  14741R    JSM P929  ENTRY
20314   1675  77675A    LDA V15 BLEDS
20315  73403            RLA A1191
20316   2000   1457R    LDA =D1
20317  42000  15313R    JSM P968  CFDF
20320                 A1191 EQU *
20320  66000  20572R    JMP A1141
20321                 C1192 EQU *
20321   2000   2204R    LDA =D10
20322  42000  14741R    JSM P929  ENTRY
20323   1675  77675A    LDA V15 BLEDS
20324  73403            RLA A1193
20325   2000   1457R    LDA =D1
20326  42000  15313R    JSM P968  CFDF
20327                 A1193 EQU *
20327  66000  20572R    JMP A1141
20330                 C1194 EQU *
20330   2000   2405R    LDA =D5
20331  42000  14741R    JSM P929  ENTRY
20332  66000  20572R    JMP A1141
20333                 C1195 EQU *
20333   2000   6514R    LDA =B77777
20334   6000   2276R    LDB =D2
20335  42000    107X    JSX .WS5
20336   2000   2411R    LDA =D4
20337  42000   3214R    JSM P332  WAIT
20340   2000  10242R    LDA =B177745
20341  42000  14741R    JSM P929  ENTRY
20342   1565  77565A    LDA V32629  SRQEN
20343   6000   2276R    LDB =D2
20344  42000    107X    JSX .WS5
20345   2000   2411R    LDA =D4
20346  42000   3214R    JSM P332  WAIT
20347  66000  20572R    JMP A1141
20350                 C1196 EQU *
20350  42000  13045R    JSM P791  UHPB
20351  42000     24X    JSM P211  IHPIB
20352  31735  77735A    STA V32733  HPIB
20353  42000   7732R    JSM P599  FPNLON
20354   2000  14033R    LDA =D3012
20355   6000   2203R    LDB =D8
20356  42000     75X    JSX .WS4
20357   6000   1704R    LDB =D6
20360  42000    100X    JSX .WSTR
20361          1143R    DEF ="HP-IB ADRS: "
20362   1735  77735A    LDA V32733  HPIB
20363  22000   2205R    ADA =B40
20364  42000     73X    JSX .W6
20365   1735  77735A    LDA V32733  HPIB
20366  22000   1364R    ADA =B100
20367  42000     73X    JSX .W6
20370   2000   2205R    LDA =B40
20371  42000     73X    JSX .W6
20372   2000  20430R    LDA =D26
20373  42000  14055R    JSM P216  MESSAGE
20374  42000   2173R    JSM P271  CRLF
20375   6000   1704R    LDB =D6
20376  42000    100X    JSX .WSTR
20377         20431R    DEF ="REV 28.4.78"
20400   2000   2500R    LDA =D147
20401  42000     73X    JSX .W6
20402  66000  20572R    JMP A1141
20403                 C1197 EQU *
20403   2000   2276R    LDA =D2
20404  42000   3046R    JSM P321  CLEAR
20405   1734  77734A    LDA V32732  CMDS
20406  12000  20440R    CPA =B123456
20407  66000  20411R    JMP *+2
20410  66000  20442R    JMP A1198
20411   1730  77730A    LDA V30 KFLAG
20412 170610            SAL 9
20413 172005            SAP A1199
```

```
20414   2000  14714R    LDA =B177747
20415  42000  14741R    JSM P929  ENTRY
20416   2000  20441R    LDA =B67
20417  42000  15546R    JSM P214  KEY
20420                 A1199 EQU *
20420  66000  20525R    JMP A1200
20421 177700
20422 176027
20423  21016
20424  21010
20425 167774
20426 117767
20427    173
20430     32
20431 REV 28.4.78
20440 123456
20441     67
20421                 LIT
20442                 A1198 EQU *
20442   2000  15343R    LDA =D40
20443  42000   2501R    JSM P295  BLINK
20444   2000   7565R    LDA =D18
20445  31735  77735A    STA V32733  HPIB
20446   1616  77616A    LDA V32654  XFLAG
20447  52000  11303R    AND =B177377
20450  31616  77616A    STA V32654  XFLAG
20451   2000   5115R    LDA =B177771
20452  70540            PWC A
20453   2000   1457R    LDA =D1
20454                 A1201 EQU *
20454  31474  77474A    STA V42 KL
20455  42000  24635R    JSM P220  SAVEM
20456   2000   1457R    LDA =D1
20457  21474  77474A    ADA V42 KL
20460 144016     16A    ISZ C,I
20461  66000  20454R    JMP A1201
20462  54016     16A    DSZ C
20463   2000  10241R    LDA =B177743
20464  70540            PWC A
20465   2000   1457R    LDA =D1
20466                 A1202 EQU *
20466  31474  77474A    STA V42 KL
20467  42000     60X    JSX .ARAY
20470            15R    DEF V39 BWAMP
20471  70541            PWC B
20472   2000   1463R    LDA =D0
20473  42000    170X    JSX .STAC
20474   2000   1457R    LDA =D1
20475  21474  77474A    ADA V42 KL
20476 144016     16A    ISZ C,I
20477  66000  20466R    JMP A1202
20500  54016     16A    DSZ C
20501   2000  12014R    LDA =B177763
20502  70540            PWC A
20503   2000   2276R    LDA =D2
20504                 A1203 EQU *
20504  31474  77474A    STA V42 KL
20505  42000    133X    JSX .LRAY
20506            12R    DEF V37 BWFRQ
20507  70541            PWC B
20510  42000     53X    JSX .LDSI
20511          1463R    DEF =D0
20512  42000    172X    JSX .STBC
20513   2000   1457R    LDA =D1
20514  21474  77474A    ADA V42 KL
20515 144016     16A    ISZ C,I
20516  66000  20504R    JMP A1203
20517  54016     16A    DSZ C
20520   1740  77740A    LDA V32736  EFLAG
20521  52000   2067R    AND =B177757
20522  31740  77740A    STA V32736  EFLAG
20523   2000  20440R    LDA =B123456
20524  31734  77734A    STA V32732  CMUS
20525                 A1200 EQU *
20525   1735  77735A    LDA V32733  HPIB
20526 170600            SAL 1
20527  22000   1457R    ADA =D1
20530   6000   2411R    LDB =D4
20531  42000    112X    JSX .WS7
20532  66000  20572R    JMP A1141
20533         20403R    DEF C1197
20534         20350R    DEF C1196
20535         20333R    DEF C1195
20536         20330R    DEF C1194
20537         20321R    DEF C1192
20540         20312R    DEF C1190
20541         20303R    DEF C1188
20542         20274R    DEF C1186
20543         20266R    DEF C1185
20544         20260R    DEF C1184
20545         20242R    DEF C1182
20546         20205R    DEF C1178
20547         20165R    DEF C1176
20550         20151R    DEF C1174
20551         20043R    DEF C1166
20552         20014R    DEF C1162
20553         17762R    DEF C1160
20554         17667R    DEF C1156
20555         17622R    DEF C1151
```

```
20556                17614R     DEF C1150
20557                17606R     DEF C1149
20560                17600R     DEF C1148
20561                17572R     DEF C1147
20562                17564R     DEF C1146
20563                17554R     DEF C1145
20564                17544R     DEF C1144
20565                17535R     DEF C1143
20566                17526R     DEF C1142
20567                17517R     DEF C1140
20570                           DEC -30
20571    42000         143X  A1139 JSX .CASE
20572                        A1141 EQU *
20572    66000       22352R     JMP A1204
20573                        A1138 EQU *
20573     1566       77566A     LDA V32630   KEYCODE
20574    12000       13554R     CPA =B105
20575    66000       20577R     JMP A1205
20576    42000       15344R     JSM P971   USF1
20577                        A1205 EQU *
20577     1566       77566A     LDA V32630   KEYCODE
20600    22000       20421R     ADA =B-100
20601    66000       22351R     JMP A1206
20602                        C1207 EQU *
20602     2000        1463R     LDA =D0
20603    42000       15050R     JSM P223   AMPU
20604    42000        2551R     JSM P298   ABLK
20605    66000       22352R     JMP A1208
20606                        C1209 EQU *
20606     2000        4534R     LDA =B40000
20607    42000       15050R     JSM P223   AMPU
20610    42000        2551R     JSM P298   ABLK
20611    66000       22352R     JMP A1208
20612                        C1210 EQU *
20612     2000        5517R     LDA =B100000
20613    42000       15050R     JSM P223   AMPU
20614    42000        2551R     JSM P298   ABLK
20615    66000       22352R     JMP A1208
20616                        C1211 EQU *
20616     2000        4533R     LDA =B140000
20617    42000       15050R     JSM P223   AMPU
20620    42000        2551R     JSM P298   ABLK
20621    66000       22352R     JMP A1208
20622                        C1212 EQU *
20622     2000        7243R     LDA =B177764
20623    42000       14741R     JSM P929   ENTRY
20624     1620       77620A     LDA V32656   PREFIX
20625    42000        2223R     JSM P274   NBLK
20626     2000        2407R     LDA =D34
20627    42000          60X     JSX .ARAY
20630                  210R     DEF V112   SFTXY
20631    31737       77737A     STA V32735   BLKS
20632     2000        2405R     LDA =D5
20633    31612       77612A     STA V32650   NCHR
20634    21737       77737A     ADA V32735   BLKS
20635    42000         103X     JSX .W4
20636     2000       17330R     LDA =B177705
20637    70540                  PWC A
20640     2000        1457R     LDA =D1
20641                        A1213 EQU *
20641    31573       77573A     STA V32635   I
20642     2000        2500R     LDA =D147
20643    42000          73X     JSX .W6
20644     2000        1457R     LDA =D1
20645    21573       77573A     ADA V32635   I
20646   144016          16A     ISZ C,I
20647    66000       20641R     JMP A1213
20650    54016          16A     DSZ C
20651    66000       22352R     JMP A1208
20652                        C1214 EQU *
77626                        V1215 EQU V32661+1   CSIGB
77627                        V1216 EQU V32661+2   CSIGC
77630                        V1217 EQU V32661+3   CSIGD
20652     1616       77616A     LDA V32654   XFLAG
20653    70540                  PWC A
20654    62000        2277R     IOR =B4000
20655    31616       77616A     STA V32654   XFLAG
20656    42000       15224R     JSM P221   TRIGR
20657    70760                  WWC A
20660    31616       77616A     STA V32654   XFLAG
20661     2000        1463R     LDA =D0
20662    31626       77626A     STA V1215 CSIGB
20663    31625       77625A     STA V32661   CSIGA
20664     2000        4533R     LDA =B140000
20665     6000        1456R     LDB =D12
20666    42000          72X     JSX .WS6
20667     2000       15343R     LDA =D40
20670     6000        2405R     LDB =D5
20671    42000          75X     JSX .WS4
20672                        A1218 EQU *
20672    76302                 SHS A1219
20673    66000       20672R     JMP A1218
20674                        A1219 EQU *
20674    42000         162X     JSX .R5
20675    31627       77627A     STA V1216 CSIGC
20676    42000         137X     JSX .R6
20677    31630       77630A     STA V1217 CSIGD
20700     2000        1457R     LDA =D1
20701    42000        3214R     JSM P332   WAIT
20702     2000       15667R     LDA =B177731
```

```
20703  42000   14741R     JSM P929  ENTRY
20704  66000   22352R     JMP A1208
20705                   C1220 EQU *
20705   2000   15701R     LDA =B177740
20706  42000   14741R     JSM P929  ENTRY
20707   1730   77730A     LDA V30 KFLAG
20710  62000    2411R     IOR =D4
20711  31730   77730A     STA V30 KFLAG
20712   2000   21176R     LDA =B175
20713  42000   15546R     JSM P214  KEY
20714   1676   77676A     LDA V16 ILEDS
20715  52000    6233R     AND =B600
20716  22000    6234R     ADA =B177200
20717  72405              SZA A1222
20720   1676   77676A     LDA V16 ILEDS
20721  52000   21177R     AND =B210
20722  22000   21200R     ADA =B177570
20723  72003              RZA A1221
20724                   A1222 EQU *
20724   2000   21201R     LDA =B152
20725  42000   15546R     JSM P214  KEY
20726                   A1221 EQU *
20726   1676   77676A     LDA V16 ILEDS
20727  52000   21202R     AND =B401
20730  22000   11303R     ADA =B177377
20731  72003              RZA A1223
20732   2000    3312R     LDA =B144
20733  42000   15546R     JSM P214  KEY
20734                   A1223 EQU *
20734   1676   77676A     LDA V16 ILEDS
20735  52000   21203R     AND =B411
20736  22000    1277R     ADA =B177777
20737  72003              RZA A1224
20740   2000   15132R     LDA =B141
20741  42000   15546R     JSM P214  KEY
20742                   A1224 EQU *
20742   1676   77676A     LDA V16 ILEDS
20743  52000   21204R     AND =B211
20744  22000    2066R     ADA =B177770
20745  72003              RZA A1225
20746   2000   21205R     LDA =B147
20747  42000   15546R     JSM P214  KEY
20750                   A1225 EQU *
20750   2000   21201R     LDA =B152
20751  42000     555R     JSM P215  SKEY
20752  42000   15117R     JSM P943  SMODE
20753  42000   15224R     JSM P221  TRIGR
20754  66000   22352R     JMP A1208
20755                   C1226 EQU *
20755   1730   77730A     LDA V30 KFLAG
20756 170614              SAL 13
20757 172014              SAP A1227
20760   2000    2205R     LDA =D32
20761  42000   15133R     JSM P947  TRNOFF
20762   2000    2205R     LDA =D32
20763  42000    2434R     JSM P285  BLKOF
20764   2000   21206R     LDA =B153
20765  42000     555R     JSM P215  SKEY
20766   1730   77730A     LDA V30 KFLAG
20767  52000    2153R     AND =B177773
20770  31730   77730A     STA V30 KFLAG
20771  42000   15117R     JSM P943  SMODE
20772  42000   15224R     JSM P221  TRIGR
20773                   A1227 EQU *
20773  66000   22352R     JMP A1208
20774                   C1228 EQU *
20774   1730   77730A     LDA V30 KFLAG
20775  62000    3654R     IOR =B20
20776  31730   77730A     STA V30 KFLAG
20777  66000   22352R     JMP A1208
21000                   C1229 EQU *
21000   2000    1463R     LDA =D0
21001  42000    3114R     JSM P326  WDACS
21002   2000    2172R     LDA =D13
21003  42000   14741R     JSM P929  ENTRY
21004  66000   22352R     JMP A1208
21005                   C1230 EQU *
21005   2000   17407R     LDA =B115
21006  42000   15546R     JSM P214  KEY
21007   1740   77740A     LDA V32736  EFLAG
21010  52000    1363R     AND =B177774
21011  62000    2276R     IOR =B2
21012  31740   77740A     STA V32736  EFLAG
21013  66000   22352R     JMP A1208
21014                   C1231 EQU *
21014   1723   77723A     LDA V26 MKRMODE
21015  72407              SZA A1232
21016   1675   77675A     LDA V15 BLEDS
21017  52000    1375R     AND =B177767
21020  31675   77675A     STA V15 BLEDS
21021  42000   15117R     JSM P943  SMODE
21022  42000   10413R     JSM P636  MKRON
21023  42000   10301R     JSM P624  MKRACT
21024                   A1232 EQU *
21024  66000   22352R     JMP A1208
21025                   C1233 EQU *
21025  42000   10323R     JSM P626  MKRKOK
21026 172013              SAP A1234
21027   1723   77723A     LDA V26 MKRMODE
21030  72003              RZA A1235
21031   2000   17407R     LDA =B115
```

```
21032  42000   15546R     JSM P214  KEY
21033                   A1235 EQU *
21033   1675   77675A     LDA V15 BLEDS
21034  62000    2203R     IOR =B10
21035  31675   77675A     STA V15 BLEDS
21036  42000   15117R     JSM P943  SMODE
21037  42000   10413R     JSM P636  MKRON
21040  42000   10301R     JSM P624  MKRACT
21041                   A1234 EQU *
21041  66000   22352R     JMP A1208
21042                   C1236 EQU *
21042   2000   17407R     LDA =B115
21043  42000   15546R     JSM P214  KEY
21044   1740   77740A     LDA V32736  EFLAG
21045  52000    1363R     AND =B177774
21046  62000    2107R     IOR =B3
21047  31740   77740A     STA V32736  EFLAG
21050  66000   22352R     JMP A1208
21051                   C1237 EQU *
21051  42000   10312R     JSM P218  MKREL
21052 172025             SAP A1238
21053  42000   10323R     JSM P626  MRKROK
21054 172023             SAP A1238
21055  42000      37X     JSX .LDBI
21056          77645A     DEF V32677  MFREQ
21057   4020      20A     LDB AR2
21060  77202              SLB *+2,C
21061  34020      20A     SIB AR2
21062  42000   11120R     JSM P668  SPANW
21063  42000      37X     JSX .LDBI
21064          77645A     DEF V32677  MFREQ
21065  42000     146X     JSX DIV3
21066           2276R     DEF =D2
21067  42000     150X     JSX ADD2
21070          77724A     DEF V10 AMP
21071  42000    6750R     JSM P222  TUNE
21072   2000   10522R     LDA =D501
21073  42000   11010R     JSM P663  STMRKR
21074  42000    2762R     JSM P314  AVGRST
21075   2000   17407R     LDA =B115
21076  42000   15546R     JSM P214  KEY
21077                   A1238 EQU *
21077  66000   22352R     JMP A1208
21100                   C1239 EQU *
21100   2000   21207R     LDA =B177746
21101  42000   14741R     JSM P929  ENTRY
21102  66000   22352R     JMP A1208
21103                   C1240 EQU *
21103   2000   17407R     LDA =B115
21104  42000   15546R     JSM P214  KEY
21105   1740   77740A     LDA V32736  EFLAG
21106  52000    1363R     AND =B177774
21107  62000    1457R     IOR =B1
21110  31740   77740A     STA V32736  EFLAG
21111  66000   22352R     JMP A1208
21112                   C1241 EQU *
21112   1616   77616A     LDA V32654  XFLAG
21113  62000    6703R     IOR =B2000
21114  31616   77616A     STA V32654  XFLAG
21115  66000   22352R     JMP A1208
21116                   C1242 EQU *
21116   1730   77730A     LDA V30 KFLAG
21117  52000    1363R     AND =B177774
21120  31730   77730A     STA V30 KFLAG
21121   2000   10141R     LDA =D38
21122  42000    2434R     JSM P285  BLKOF
21123  42000      37X     JSX .LDBI
21124          77665A     DEF V8  CFREQ
21125  42000    6750R     JSM P222  TUNE
21126  66000   22352R     JMP A1208
21127                   C1243 EQU *
21127   1730   77730A     LDA V30 KFLAG
21130  52000    1363R     AND =B177774
21131  62000    1457R     IOR =B1
21132  31730   77730A     STA V30 KFLAG
21133   2000   10141R     LDA =D38
21134  42000    2223R     JSM P274  NBLK
21135   2000   21210R     LDA =D172
21136  42000      73X     JSX .W6
21137   2000    2420R     LDA =D145
21140  42000      73X     JSX .W6
21141  42000      37X     JSX .LDBI
21142          77665A     DEF V8  CFREQ
21143  42000    6750R     JSM P222  TUNE
21144  66000   22352R     JMP A1208
21145                   C1244 EQU *
21145   1730   77730A     LDA V30 KFLAG
21146  52000    1363R     AND =B177774
21147  62000    2276R     IOR =B2
21150  31730   77730A     STA V30 KFLAG
21151   2000   10141R     LDA =D38
21152  42000    2223R     JSM P274  NBLK
21153   2000   21211R     LDA =B136
21154  42000      73X     JSX .W6
21155   2000    2420R     LDA =D145
21156  42000      73X     JSX .W6
21157  42000      37X     JSX .LDBI
21160          77665A     DEF V8  CFREQ
21161  42000    6750R     JSM P222  TUNE
21162  66000   22352R     JMP A1208
```

```
21163                      C1245 EQU *
21163    2000    21212R      LDA =B177735
21164   42000    14741R      JSM P929  ENTRY
21165   66000    22352R      JMP A1208
21166                      C1246 EQU *
21166   66000    21417R      JMP A1247
21167                      P1248 EQU * SLVL
21167  174517                CLB
21170   42000       56X      JSX .ARGS
21171   44016       16A      ISZ C
21172    1722    77722A      LDA V29 MKRLVL
21173   42000     4471R      JSM P410  DBMNV
21174   42000       50X      JSX CNV24
21175   66000       31X     JMX .RTNA
21176     175
21177     210
21200  177570
21201     152
21202     401
21203     411
21204     211
21205     147
21206     153
21207  177746
21210     254
21211     136
21212  177735
21176                       LIT
21213                      P1249 EQU * RFSET
21213    6000     1277R      LDB =D-1
21214   42000       27X      JSX .ARGA
21215   42000      104X      JSX .TURN
21216             2406R      DEF =D7
21217            77677A      DEF V17 RFAT
21220   31677    77677A      STA V17 RFAT
21221   42000     3255R      JSM P337  WRFAT
21222   66000       31X      JMX .RTNA
77467                      V1250 EQU I32542+25 A20
77466                      V1251 EQU I32542+24 A10
77465                      V1252 EQU I32542+23 A0
77460                      V1253 EQU I32542+18 SG50
77454                      V1254 EQU I32542+14 LOOFS
21223                      P1255 EQU * SILVL
21223   42000     2303R      JSM P277  GOFSET
21224   70540                PWC A
21225   42000     1665R      JSM P245  RLAD
21226   22000    21232R      ADA =D-70
21227   42000      116X      JSX SUB4I
21230   42000     3530R      JSM P355  REFLEV
21231  170201                RET 1
21232  177672
21232                       LIT
21233                      P1256 EQU * IKSCAN
21233    2000     1463R      LDA =D0
21234   31426    77426A      STA V32534  UFLAG
21235   31620    77620A      STA V32656  PREFIX
21236    2000    14033R      LDA =D3012
21237    6000     2203R      LDB =D8
21240   42000       75X      JSX .WS4
21241    6000     1704R      LDB =D6
21242   42000      100X      JSX .WSTR
21243            21301R      DEF ="CALIBRAIING!"
21244    2000     2500R      LDA =D147
21245   42000       73X      JSX .W6
21246    1675    77675A      LDA V15 BLEDS
21247  170140                CMA
21250    6000     2276R      LDB =D2
21251   42000       75X      JSX .WS4
21252                      L1257 EQU * AGAIN
21252    2000     6514R      LDA =B77777
21253    6000     2276R      LDB =D2
21254   42000      107X      JSX .WS5
21255    2000     2107R      LDA =D3
21256    6000     2107R      LDB =D3
21257   42000       75X      JSX .WS4
21260    2000     2405R      LDA =D5
21261   42000      103X      JSX .W4
21262    2000     7670R      LDA =B164
21263   42000    15546R      JSM P214  KEY
21264    1702    77702A      LDA V24 VIDCON
21265    6000     2221R      LDB =D9
21266   42000       75X      JSX .WS4
21267    1703    77703A      LDA V21 STRIG
21270    6000     1456R      LDB =D12
21271   42000       72X      JSX .WS6
21272    2000     1463R      LDA =D0
21273    6000     2107R      LDB =D3
21274   42000      107X      JSX .WS5
21275    2000     1704R      LDA =D6
21276   42000      103X      JSX .W4
21277                      A1258 EQU *
21277   76311                SHS A1259
21300   66000    21277R      JMP A1258
21301 CALIBRAIING!
21301                       LIT
21310                      A1259 EQU *
21310    6000     2276R      LDB =D2
21311   42000      110X      JSX .RS7
21312   31573    77573A      STA V32635  1
```

```
21313  52000   2406R    AND =D7
21314  72422            SZA A1260
21315   2000  14033R    LDA =D3012
21316   6000   2203R    LDB =D8
21317  42000     75X    JSX .WS4
21320   6000   1704R    LDB =D6
21321  42000    100X    JSX .WSTR
21322         21326R    DEF ="CALIB ABORTED"
21323   2000   2500R    LDA =D147
21324  42000     73X    JSX .W6
21325  66000  32476R    JMP L193  RESET
21326 CALIB ABORTED
21326                   LIT
21336                  A1260 EQU *
21336   2000  10412R    LDA =B113
21337  42000  15546R    JSM P214  KEY
21340   2000   2405R    LDA =D5
21341   6000   2107R    LDB =D3
21342  42000     75X    JSX .WS4
21343   1675  77675A    LDA V15 BLEDS
21344  62000   2411R    IOR =D4
21345  31675  77675A    STA V15 BLEDS
21346   1722  77722A    LDA V29 MKRLVL
21347 170040            TCA
21350  22000  21367R    ADA =D1019
21351 172404            SAM A1262
21352   1722  77722A    LDA V29 MKRLVL
21353  22000  10712R    ADA =D-100
21354 172025            SAP A1261
21355                  A1262 EQU *
21355   2000  14033R    LDA =D3012
21356   6000   2203R    LDB =D8
21357  42000     75X    JSX .WS4
21360   6000   1704R    LDB =D6
21361  42000    100X    JSX .WSTR
21362         21370R    DEF ="ADJUST AMPTD CAL"
21363   2000   2500R    LDA =D147
21364  42000     73X    JSX .W6
21365  42000   5350R    JSM P464  SRGM
21366  66000  32476R    JMP L193  RESET
21367   1773
21370 ADJUST AMPTD CAL
21367                   LIT
21401                  A1261 EQU *
21401   1721  77721A    LDA V25 MRKR
21402  22000  21413R    ADA =D-500
21403 172002            SAP *+2
21404 170040            TCA
21405 170040            TCA
21406  22000  21414R    ADA =D400
21407 172007            SAP A1263
21410   2000  21415R    LDA =B116
21411  42000  15546R    JSM P214  KEY
21412  66000  21252R    JMP L1257 AGAIN
21413 177014
21414    620
21415    116
21413                   LIT
21416                  A1263 EQU *
21416 170201            RET 1
21417                  A1247 EQU *
21417   2000  22222R    LDA =D39
21420  42000   2434R    JSM P285  BLKOF
21421   2000  15132R    LDA =B141
21422  42000  15546R    JSM P214  KEY
21423   2000  22223R    LDA =B143
21424  42000  15546R    JSM P214  KEY
21425   1730  77730A    LDA V30 KFLAG
21426  70540            PWC A
21427   1706  77706A    LDA V31 ROFSET
21430  70540            PWC A
21431   1677  77677A    LDA V17 RFAT
21432  70540            PWC A
21433   1606  77606A    LDA V32646  SRCEID
21434  70540            PWC A
21435   2000   1463R    LDA =D0
21436  31606  77606A    STA V32646  SRCEID
21437   1677  77677A    LDA V17 RFAT
21440  52000   2131R    AND =B17
21441  62000  22224R    IOR =B174700
21442  31677  77677A    STA V17 RFAT
21443   1676  77676A    LDA V16 TLEDS
21444  52000  22225R    AND =B410
21445  72403            SZA A1264
21446   2000  21206R    LDA =B153
21447  42000  15546R    JSM P214  KEY
21450                  A1264 EQU *
21450   2000   7667R    LDA =B157
21451  42000  15546R    JSM P214  KEY
21452   2000   1463R    LDA =D0
21453  31706  77706A    STA V31 ROFSET
21454   2000   2723R    LDA =B54
21455  42000  15546R    JSM P214  KEY
21456   2000  22226R    LDA =B166
21457  42000  15546R    JSM P214  KEY
21460   2000  22227R    LDA =B106
21461  42000  15546R    JSM P214  KEY
21462   2000   1463R    LDA =D0
21463  42000  15313R    JSM P968  CFDF
21464   1730  77730A    LDA V30 KFLAG
```

```
21465  52000  22230R    AND =B37770
21466  31730  77730A    STA V30 KFLAG
21467  42000  15050R    JSM P223  AMPU
21470   2000  22231R    LDA =B104
21471  42000  15546R    JSM P214  KEY
21472   1740  77740A    LDA V32736  EFLAG
21473  52000  22232R    AND =B177703
21474  31740  77740A    STA V32736  EFLAG
21475   2000  22233R    LDA =B162
21476  42000  15546R    JSM P214  KEY
21477  42000  21223R    JSM P1255 STLVL
21500  42000     37X    JSX .LDBI
21501         11133R    DEF D673   20000000
21502  42000    150X    JSX ADD2
21503         77707A    DEF V11 FOFSET
21504  42000   6750R    JSM P222  TUNE
21505  42000     37X    JSX .LDBI
21506           6717R   DEF =F10000000
21507  42000  11120R    JSM P668  SPANW
21510   2000  22234R    LDA =B124
21511  42000    555R    JSM P215  SKEY
21512  42000  21233R    JSM P1256 TKSCAN
21513   2000   2172R    LDA =D13
21514  22000   2110R    ADA =B177776
21515  42000    113X    JSX DIV4
21516           1277R   DEF =B177777
21517  22000   1277R    ADA =B177777
21520  70540            PWC A
21521   2000   2172R    LDA =D13
21522                A1265 EQU *
21522  31474  77474A    STA V42 KL
21523  42000   4210R    JSM P392  IFBWOUT
21524   1474  77474A    LDA V42 KL
21525  42000   4420R    JSM P407  EXP3
21526  42000    126X    JSX MPY3
21527           2405R   DEF =D5
21530  42000  11120R    JSM P668  SPANW
21531   2000   2405R    LDA =D5
21532  42000   3214R    JSM P332  WAIT
21533  42000  21233R    JSM P1256 TKSCAN
21534   1474  77474A    LDA V42 KL
21535  42000    133X    JSX .LRAY
21536             12R   DEF V37 BWFRQ
21537  70541            PWC B
21540  42000     37X    JSX .LDBI
21541         11133R    DEF D673   20000000
21542  42000    140X    JSX MIN2
21543         77645A    DEF V32677  MFREQ
21544  42000    145X    JSX SUB2
21545         77707A    DEF V11 FOFSET
21546  42000    172X    JSX .STBC
21547   1474  77474A    LDA V42 KL
21550  42000     60X    JSX .ARAY
21551             15R   DEF V39 BWAMP
21552  70541            PWC B
21553  42000   2303R    JSM P277  GOFSET
21554  70540            PWC A
21555  42000  21167R    JSM P1248 SLVL
21556  22000   4470R    ADA =D1000
21557  42000    116X    JSX SUB4T
21560  42000    170X    JSX .STAC
21561   1474  77474A    LDA V42 KL
21562  12000   2221R    CPA =D9
21563  66000  21567R    JMP A1267
21564  12000   2204R    CPA =D10
21565  66000  21567R    JMP *+2
21566  66000  21623R    JMP A1266
21567                A1267 EQU *
21567   2000  22235R    LDA =B161
21570  42000  15546R    JSM P214  KEY
21571   2000   4207R    LDA =B160000
21572  42000   4171R    JSM P390  LGDB
21573   2000   2405R    LDA =D5
21574  42000   3214R    JSM P332  WAIT
21575  42000  21233R    JSM P1256 TKSCAN
21576   6000   3526R    LDB =B177766
21577  25474  77474A    ADB V42 KL
21600   2000   3527R    LDA =D14
21601  76402            SZB A1268
21602   2000   1457R    LDA =D1
21603                A1268 EQU *
21603  42000     60X    JSX .ARAY
21604             15R   DEF V39 BWAMP
21605  70541            PWC B
21606  42000   2303R    JSM P277  GOFSET
21607  70540            PWC A
21610   1474  77474A    LDA V42 KL
21611  42000     60X    JSX .ARAY
21612             15R   DEF V39 BWAMP
21613  70541            PWC B
21614  42000  21167R    JSM P1248 SLVL
21615  42000    173X    JSX SUB4B
21616  22000   4470R    ADA =D1000
21617  42000    116X    JSX SUB4T
21620  42000    170X    JSX .STAC
21621   2000  22233R    LDA =B162
21622  42000  15546R    JSM P214  KEY
21623                A1266 EQU *
21623   1474  77474A    LDA V42 KL
21624  12000   2203R    CPA =D8
```

```
21625  66000  21627R    JMP *+2
21626  66000  21651R    JMP A1269
21627   2000   4627R    LDA =B125
21630  42000    555R    JSM P215   SKEY
21631   2000   2405R    LDA =D5
21632  42000   3214R    JSM P332   WAIT
21633  42000  21233R    JSM P1256 TKSCAN
21634  42000   2303R    JSM P277   GOFSET
21635  70540            PWC A
21636   2000   2203R    LDA =D8
21637  42000     60X    JSX .ARAY
21640            15R    DEF V39 BWAMP
21641  70541            PWC B
21642  42000  21167R    JSM P1248 SLVL
21643  22000   4470R    ADA =D1000
21644  42000    173X    JSX SUB4B
21645  42000    116X    JSX SUB4T
21646  31454  77454A    STA V1254 LOOPS
21647   2000  22234R    LDA =B124
21650  42000    555R    JSM P215   SKEY
21651                 A1269 EQU *
21651   1474  77474A    LDA V42 KL
21652 170040            TCA
21653  22000   2276R    ADA =D2
21654 172003           SAP A1270
21655   2000  21415R    LDA =B116
21656  42000  15546R    JSM P214   KEY
21657                 A1270 EQU *
21657   2000   1277R    LDA =B177777
21660  21474  77474A    ADA V42 KL
21661 144016     16A    ISZ C,I
21662  66000  21522R    JMP A1265
21663  54016     16A    DSZ C
21664   2000  22235R    LDA =B161
21665  42000  15546R    JSM P214   KEY
21666   2000   4207R    LDA =B160000
21667  42000   4171R    JSM P390   LGDB
21670   2000  22236R    LDA =B111
21671  42000  15546R    JSM P214   KEY
21672   2000   2411R    LDA =D4
21673  42000   4210R    JSM P392   IFBWOUT
21674  42000     53X    JSX .LDSI
21675          1300R    DEF =H200
21676  42000  11120R    JSM P668   SPANW
21677   2000   2405R    LDA =D5
21700  42000   3214R    JSM P332   WAIT
21701  42000  21233R    JSM P1256 TKSCAN
21702  42000  21167R    JSM P1248 SLVL
21703  31475  77475A    STA V43 KM
21704   2000   1363R    LDA =B177774
21705  70540            PWC A
21706   2000   1463R    LDA =D0
21707                 A1271 EQU *
21707  31474  77474A    STA V42 KL
21710  22000   2411R    ADA =D4
21711 170614            SAL 13
21712  42000   4171R    JSM P390   LGDB
21713   2000   2405R    LDA =D5
21714  42000   3214R    JSM P332   WAIT
21715  42000  21233R    JSM P1256 TKSCAN
21716   1474  77474A    LDA V42 KL
21717 170040            TCA
21720  22000   2416R    ADA =D29
21721  42000     60X    JSX .ARAY
21722            15R    DEF V39 BWAMP
21723  70541            PWC B
21724  42000  21167R    JSM P1248 SLVL
21725 170040            TCA
21726  21475  77475A    ADA V43 KM
21727 170040            TCA
21730  42000    170X    JSX .STAC
21731   2000   1457R    LDA =D1
21732  21474  77474A    ADA V42 KL
21733 144016     16A    ISZ C,I
21734  66000  21707R    JMP A1271
21735  54016     16A    DSZ C
21736   2000  22233R    LDA =B162
21737  42000  15546R    JSM P214   KEY
21740   2000   2405R    LDA =D5
21741  42000   3214R    JSM P332   WAIT
21742  42000  21233R    JSM P1256 TKSCAN
21743  42000  21167R    JSM P1248 SLVL
21744  31475  77475A    STA V43 KM
21745   2000   1463R    LDA =D0
21746  31467  77467A    STA V1250 A20
21747   2000   2417R    LDA =B177772
21750  70540            PWC A
21751   2000   2276R    LDA =D2
21752                 A1272 EQU *
21752  31474  77474A    STA V42 KL
21753  42000  21213R    JSM P1249 RFSET
21754  42000  21223R    JSM P1255 STLVL
21755   1474  77474A    LDA V42 KL
21756  12000   1704R    CPA =D6
21757  66000  21761R    JMP *+2
21760  66000  21766R    JMP A1273
21761   2000  22237R    LDA =B107
21762  42000  15546R    JSM P214   KEY
21763   2000   2276R    LDA =D2
21764  42000   4314R    JSM P400   VBWOUT
```

```
21765  42000    7775R     JSM P603  CSCANBW
21766                   A1273 EQU *
21766   2000    2405R     LDA =D5
21767  42000    3214R     JSM P332  WAIT
21770  42000   21233R     JSM P1256 TKSCAN
21771   1474   77474A     LDA V42 KL
21772 170040              TCA
21773  22000   10243R     ADA =D27
21774  42000      60X     JSX .ARAY
21775             15R     DEF V39 BWAMP
21776  70541              PWC B
21777   1677   77677A     LDA V17 REAT
22000  42000       7X     JSM P198  ATNER
22001  70540              PWC A
22002  42000   21167R     JSM P1248 SLVL
22003 170040              TCA
22004  21475   77475A     ADA V43 KM
22005 170040              TCA
22006  42000     116X     JSX SUB4T
22007  42000     170X     JSX .STAC
22010   2000    1457R     LDA =D1
22011  21474   77474A     ADA V42 KL
22012 144016      16A     ISZ C,I
22013  66000   21752R     JMP A1272
22014  54016      16A     DSZ C
22015   1435   77435A     LDA V32541   IF1
22016  62000   22240R     IOR =B740
22017   6000    2172R     LDB =D13
22020  42000      75X     JSX .WS4
22021   2000    2405R     LDA =D5
22022  42000    3214R     JSM P332  WAIT
22023  42000   21233R     JSM P1256 TKSCAN
22024   1677   77677A     LDA V17 REAT
22025  42000       7X     JSM P198  ATNER
22026  70540              PWC A
22027  42000   21167R     JSM P1248 SLVL
22030 170040              TCA
22031  21475   77475A     ADA V43 KM
22032 170040              ICA
22033 170040              TCA
22034  21466   77466A     ADA V1251 A10
22035 170040              TCA
22036  42000     116X     JSX SUB4T
22037  31460   77460A     STA V1253 SG50
22040   2000   22241R     LDA =B102
22041  42000   15546R     JSM P214  KEY
22042   2000    2107R     LDA =D3
22043  42000   21213R     JSM P1249 RFSET
22044  42000   21223R     JSM P1255 STLVL
22045   2000    2405R     LDA =D5
22046  42000    3214R     JSM P332  WAIT
22047  42000   21233R     JSM P1256 TKSCAN
22050   1677   77677A     LDA V17 REAT
22051  42000       7X     JSM P198  ATNER
22052  70540              PWC A
22053  42000   21167R     JSM P1248 SLVL
22054  42000     116X     JSX SUB4T
22055  31475   77475A     STA V43 KM
22056   2000    1301R     LDA =B177775
22057  70540              PWC A
22060   2000    1457R     LDA =D1
22061                   A1274 EQU *
22061  31474   77474A     STA V42 KL
22062  22000    2107R     ADA =D3
22063  42000   21213R     JSM P1249 RFSET
22064   1474   77474A     LDA V42 KL
22065 170602              SAL 3
22066  61435   77435A     IOR V32541   IF1
22067   6000    2172R     LDB =D13
22070  42000      75X     JSX .WS4
22071   2000    2405R     LDA =D5
22072  42000    3214R     JSM P332  WAIT
22073  42000   21233R     JSM P1256 TKSCAN
22074   1474   77474A     LDA V42 KL
22075 170040              TCA
22076  22000    2301R     ADA =D19
22077  42000      60X     JSX .ARAY
22100             15R     DEF V39 BWAMP
22101  70541              PWC B
22102   1677   77677A     LDA V17 REAT
22103  42000       7X     JSM P198  ATNER
22104  70540              PWC A
22105  42000   21167R     JSM P1248 SLVL
22106 170040              TCA
22107  21475   77475A     ADA V43 KM
22110 170040              ICA
22111  42000     116X     JSX SUB4T
22112  42000     170X     JSX .STAC
22113   2000    1457R     LDA =D1
22114  21474   77474A     ADA V42 KL
22115 144016      16A     ISZ C,I
22116  66000   22061R     JMP A1274
22117  54016      16A     DSZ C
22120   2000   22235R     LDA =B161
22121  42000   15546R     JSM P214  KEY
22122   2000   22242R     LDA =B123
22123  42000     555R     JSM P215  SKEY
22124   2000    5115R     LDA =B177771
22125  70540              PWC A
22126   2000    2406R     LDA =D7
```

```
22127                       A1275 EQU *
22127  31573   77573A          STA V32635  I
22130  42000      60X          JSX .ARAY
22131             15R          DEF V39 BWAMP
22132  70541                   PWC B
22133   1573   77573A          LDA V32635  I
22134  42000      60X          JSX .ARAY
22135             15R          DEF V39 BWAMP
22136 170040                   TCA
22137  21465   77465A          ADA V1252 A0
22140 170040                   TCA
22141  42000     170X          JSX .STAC
22142   2000    1457R          LDA =D1
22143  21573   77573A          ADA V32635  I
22144 144016      16A          ISZ C,I
22145  66000   22127R          JMP A1275
22146  54016      16A          DSZ C
22147  70760                   WWC A
22150  31606   77606A          STA V32646  SRCEID
22151  70760                   WWC A
22152  31677   77677A          STA V17 RFAT
22153  70760                   WWC A
22154  31706   77706A          STA V31 ROFSET
22155  70760                   WWC A
22156  31730   77730A          STA V30 KFLAG
22157  42000    3255R          JSM P337  WRFAT
22160   1675   77675A          LDA V15 BLEDS
22161  52000   22243R          AND =B176773
22162  31675   77675A          STA V15 BLEDS
22163   1740   77740A          LDA V32736  EFLAG
22164  52000   22232R          AND =B177703
22165  62000   22244R          IOR =B74
22166  31740   77740A          STA V32736  EFLAG
22167   2000   22222R          LDA =D39
22170  42000    2223R          JSM P274  NBLK
22171   2000    2723R          LDA =B54
22172  42000   15546R          JSM P214  KEY
22173   1730   77730A          LDA V30 KFLAG
22174  42000   15050R          JSM P223  AMPU
22175  42000    1665R          JSM P245  RLAD
22176  42000    3530R          JSM P355  REFLEV
22177   2000    1463R          LDA =D0
22200  42000   14741R          JSM P929  ENTRY
22201  66000   22352R          JMP A1208
22202                       C1276 EQU *
22202   1740   77740A          LDA V32736  EFLAG
22203  62000    2205R          IOR =B40
22204  31740   77740A          STA V32736  EFLAG
22205  42000    2762R          JSM P314  AVGRST
22206   1700   77700A          LDA V22 RLVL
22207  42000    3530R          JSM P355  REFLEV
22210  42000      37X          JSX .LDB1
22211          77665A          DEF V8  CFREQ
22212  42000    6750R          JSM P222  TUNE
22213  42000    7775R          JSM P603  CSCANBW
22214   1740   77740A          LDA V32736  EFLAG
22215 170612                   SAL 11
22216 172027                  SAP A1277
22217   2000   22222R          LDA =D39
22220  42000    2223R          JSM P274  NBLK
22221  66000   22247R          JMP A1278
22222     47
22223    143
22224 174700
22225    410
22226    166
22227    106
22230  37770
22231    104
22232 177703
22233    162
22234    124
22235    161
22236    111
22237    107
22240    740
22241    102
22242    123
22243 176773
22244     74
22222                          LIT
22245                       A1277 EQU *
22245   2000   22222R          LDA =D39
22246  42000    2434R          JSM P285  BLKOF
22247                       A1278 EQU *
22247  66000   22352R          JMP A1208
22250                       C1279 EQU *
22250   2000   22222R          LDA =D39
22251  42000    2434R          JSM P285  BLKOF
22252   1740   77740A          LDA V32736  EFLAG
22253  52000    7731R          AND =B177737
22254  31740   77740A          STA V32736  EFLAG
22255   1700   77700A          LDA V22 RLVL
22256  42000    3530R          JSM P355  REFLEV
22257  42000      37X          JSX .LDBI
22260          77665A          DEF V8  CFREQ
22261  42000    6750R          JSM P222  TUNE
22262  42000    7775R          JSM P603  CSCANBW
22263  66000   22352R          JMP A1208
22264                       C1280 EQU *
```

```
22264   2000  22313R      LDA =B177736
22265  42000  14741R      JSM P929  ENTRY
22266  66000  22352R      JMP A1208
22267                C1281 EQU *
22267   1740  77740A      LDA V32736  EFLAG
22270  70540              PWC A
22271  62000   2205R      IOR =B40
22272  31740  77740A      STA V32736  EFLAG
22273  42000  13045R      JSM P791  OHPB
22274   2000   1704R      LDA =D6
22275  70540              PWC A
22276   2000   2411R      LDA =D4
22277  70540              PWC A
22300  42000   3406R      JSM P348  RFLC
22301  42000    122X      JSX CNV42
22302  42000  13062R      JSM P793  NDUMP
22303  42000  13030R      JSM P789  WCRLF
22304  70760              WWC A
22305  31740  77740A      STA V32736  EFLAG
22306  66000  22352R      JMP A1208
22307                C1282 EQU *
22307   1730  77730A      LDA V30 KFLAG
22310  62000  11310R      IOR =B400
22311  31730  77730A      STA V30 KFLAG
22312  66000  22352R      JMP A1208
22313 177736
22313                      LIT
22314         22307R      DEF C1282
22315         22267R      DEF C1281
22316         22264R      DEF C1280
22317         22250R      DEF C1279
22320         22202R      DEF C1276
22321         21166R      DEF C1246
22322         21163R      DEF C1245
22323         21145R      DEF C1244
22324         21127R      DEF C1243
22325         21116R      DEF C1242
22326         21112R      DEF C1241
22327         21103R      DEF C1240
22330         21100R      DEF C1239
22331         21051R      DEF C1237
22332         21042R      DEF C1236
22333         21025R      DEF C1233
22334         21014R      DEF C1231
22335         21005R      DEF C1230
22336         21000R      DEF C1229
22337         20774R      DEF C1228
22340         20755R      DEF C1226
22341         20705R      DEF C1220
22342         20652R      DEF C1214
22343         20622R      DEF C1212
22344         20616R      DEF C1211
22345         20612R      DEF C1210
22346         20606R      DEF C1209
22347         20602R      DEF C1207
22350                     DEC -29
22351  42000    143X A1206 JSX .CASE
22352                A1208 EQU *
22352                A1204 EQU *
22352  66000  24627R      JMP A1086
22353                C1283 EQU *
22353   1676  77676A      LDA V16 ILEDS
22354 170605              SAL 6
22355 172002              SAP *+2
22356  66000  23432R      JMP A1284
22357   1733  77733A      LDA V20 FSTIM
22360 172005              SAP A1286
22361   1566  77566A      LDA V32630  KEYCODE
22362 170040              TCA
22363  22000  22443R      ADA =B154
22364 172004              SAP A1285
22365                A1286 EQU *
22365   1566  77566A      LDA V32630  KEYCODE
22366  22000  22444R      ADA =B-140
22367  66000  22371R      JMP A1287
22370                A1285 EQU *
22370   2000   1463R      LDA =D0
22371                A1287 EQU *
22371  66000  23430R      JMP A1288
22372                C1289 EQU *
22372  42000  15143R      JSM P949  UNBLANK
22373   1676  77676A      LDA V16 ILEDS
22374  52000  21200R      AND =B177570
22375  62000   2410R      IOR =B200
22376  42000   2163R      JSM P270  ILEDSOUT
22377   1426  77426A      LDA V32534  UFLAG
22400  62000   2276R      IOR =D2
22401  31426  77426A      STA V32534  UFLAG
22402   2000   1463R      LDA =D0
22403  31607  77607A      STA V32647  ACNT
22404   2000   1457R      LDA =D1
22405  42000   3046R      JSM P321  CLEAR
22406   2000   1463R      LDA =D0
22407   6000   2203R      LDB =D8
22410  42000     75X      JSX .WS4
22411   2000   7570R      LDA =B2020
22412  42000     73X      JSX .W6
22413  42000  10747R      JSM P219  MKRDEL
22414   1603  77603A      LDA V32643  PLOCK
22415  52000   7567R      AND =B173777
```

```
22416  31603  77603A     STA V32643  PLOCK
22417  42000   6160R     JSM P502  EOS
22420  42000   4664R     JSM P423  VDCOP
22421  66000  23431R     JMP A1290
22422                  C1291 EQU *
22422  42000  15030R     JSM P936  ALTCK
22423   1676  77676A     LDA V16 TLEDS
22424  52000  21200R     AND =B177570
22425  62000   1457R     IOR =B1
22426  42000   2163R     JSM P270  TLEDSOUT
22427   2000   1463R     LDA =D0
22430   6000   2203R     LDB =D8
22431  42000     75X     JSX .WS4
22432   2000   7570R     LDA =B2020
22433  42000     73X     JSX .W6
22434  42000   4664R     JSM P423  VDCOP
22435   1676  77676A     LDA V16 TLEDS
22436 170613             SAL 12
22437 172006            SAP A1292
22440   2000  21206R     LDA =B153
22441  42000  15546R     JSM P214  KEY
22442  66000  22446R     JMP A1293
22443    154
22444 177640
22443                  L11
22445                  A1292 EQU *
22445  42000  15143R     JSM P949  UNBLANK
22446                  A1293 EQU *
22446   2000  22604R     LDA =B110
22447  42000    555R     JSM P215  SKEY
22450  42000  10747R     JSM P219  MKRDEL
22451   1603  77603A     LDA V32643  PLOCK
22452  52000   7567R     AND =B173777
22453  31603  77603A     STA V32643  PLOCK
22454  42000   6160R     JSM P502  EOS
22455  66000  23431R     JMP A1290
22456                  C1294 EQU *
22456   1676  77676A     LDA V16 TLEDS
22457 170610             SAL 9
22460 172012            SAP A1295
22461   1676  77676A     LDA V16 TLEDS
22462  52000   6512R     AND =B177677
22463  42000   2163R     JSM P270  TLEDSOUT
22464   1426  77426A     LDA V32534  UFLAG
22465  62000   2276R     IOR =D2
22466  31426  77426A     STA V32534  UFLAG
22467   2000   1277R     LDA =B177777
22470  31607  77607A     STA V32647  ACNT
22471  42000   4664R     JSM P423  VDCOP
22472                  A1295 EQU *
22472  66000  23431R     JMP A1290
22473                  C1296 EQU *
22473  42000  15030R     JSM P936  ALTCK
22474  42000  15143R     JSM P949  UNBLANK
22475   1676  77676A     LDA V16 TLEDS
22476  52000  21200R     AND =B177570
22477  62000   2276R     IOR =B2
22500  42000   2163R     JSM P270  TLEDSOUT
22501   2000   1463R     LDA =D0
22502   6000   2203R     LDB =D8
22503  42000     75X     JSX .WS4
22504   2000   7570R     LDA =B2020
22505  42000     73X     JSX .W6
22506  42000   4664R     JSM P423  VDCOP
22507  42000  10747R     JSM P219  MKRDEL
22510  66000  23431R     JMP A1290
22511                  C1297 EQU *
22511  42000  15030R     JSM P936  ALTCK
22512  42000  15143R     JSM P949  UNBLANK
22513   1676  77676A     LDA V16 TLEDS
22514  52000  21200R     AND =B177570
22515  62000   2411R     IOR =B4
22516  42000   2163R     JSM P270  TLEDSOUT
22517   2000   1463R     LDA =D0
22520   6000   2203R     LDB =D8
22521  42000     75X     JSX .WS4
22522   2000   3113R     LDA =B2060
22523  42000     73X     JSX .W6
22524  42000   4664R     JSM P423  VDCOP
22525  42000  10747R     JSM P219  MKRDEL
22526  66000  23431R     JMP A1290
22527                  C1298 EQU *
22527   1676  77676A     LDA V16 TLEDS
22530 170610             SAL 9
22531 172002             SAP *+2
22532  66000  22606R     JMP A1299
22533   2000  20422R     LDA =B176027
22534  70540             PWC A
22535   2000   1457R     LDA =D1
22536                  A1300 EQU *
22536  31573  77573A     STA V32635  I
22537  22000   6703R     ADA =D1024
22540   6000   2203R     LDB =D8
22541  42000     75X     JSX .WS4
22542  42000    162X     JSX .R5
22543  31572  77572A     STA V32634  J
22544   1573  77573A     LDA V32635  I
22545  42000    103X     JSX .W4
22546  42000    162X     JSX .R5
22547  31567  77567A     STA V32631  KEYCOL
```

```
22550   1573  77573A   LDA V32635   I
22551  42000    103X   JSX .W4
22552   1572  77572A   LDA V32634   J
22553 170604           SAL 5
22554  70540           PWC A
22555   1567  77567A   LDA V32631   KEYCOL
22556 170604           SAL 5
22557  42000    116X   JSX SUB41
22560 170404           AAR 5
22561  42000     73X   JSX .W6
22562   2000   1457R   LDA =D1
22563  21573  77573A   ADA V32635   I
22564 144016     16A   ISZ C,I
22565  66000  22536R   JMP A1300
22566  54016     16A   DSZ C
22567   1676  77676A   LDA V16 TLEDS
22570  62000   1364R   IOR =B100
22571  42000   2163R   JSM P270   TLEDSOUT
22572  42000   4664R   JSM P423   VDCOP
22573   1676  77676A   LDA V16 TLEDS
22574  52000  22225R   AND =B410
22575  72410          SZA A1301
22576   1676  77676A   LDA V16 TLEDS
22577  52000  11303R   AND =B177377
22600  31676  77676A   STA V16 TLEDS
22601   2000  21201R   LDA =B152
22602  42000  15546R   JSM P214   KEY
22603  66000  22606R   JMP A1302
22604    110
22604                 LIT
22605                 A1301 EQU *
22605  42000  10747R   JSM P219   MKRDEL
22606                 A1302 EQU *
22606                 A1299 EQU *
22606  66000  23431R   JMP A1290
22607                 C1303 EQU *
22607   1676  77676A   LDA V16 TLEDS
22610  70540           PWC A
22611   2000   1463R   LDA =D0
22612  31607  77607A   STA V32647   ACNT
22613  42000  15143R   JSM P949   UNBLANK
22614   1426  77426A   LDA V32534   UFLAG
22615  62000   3654R   IOR =B20
22616  31426  77426A   STA V32534   UFLAG
22617   1676  77676A   LDA V16 TLEDS
22620  52000  22646R   AND =B177207
22621  62000  11310R   IOR =B400
22622  42000   2163R   JSM P270   TLEDSOUT
22623   2000   2276R   LDA =D2
22624  42000   3046R   JSM P321   CLEAR
22625   2000   6703R   LDA =D1024
22626   6000   2203R   LDB =D8
22627  42000     75X   JSX .WS4
22630   2000   7571R   LDA =B2030
22631  42000     73X   JSX .W6
22632   1603  77603A   LDA V32643   PLOCK
22633  52000   7567R   AND =B173777
22634  31603  77603A   STA V32643   PLOCK
22635  42000   6160R   JSM P502   EOS
22636  42000   4664R   JSM P423   VDCOP
22637  70760           WWC A
22640  31573  77573A   STA V32635   I
22641 170610           SAL 9
22642 172005          SAP A1304
22643   2000  15047R   LDA =B145
22644  42000  15546R   JSM P214   KEY
22645  66000  22650R   JMP A1305
22646 177207
22646                 LIT
22647                 A1304 EQU *
22647  42000  10747R   JSM P219   MKRDEL
22650                 A1305 EQU *
22650  66000  23431R   JMP A1290
22651                 C1306 EQU *
22651  42000  15030R   JSM P936   ALTCK
22652  42000   4664R   JSM P423   VDCOP
22653   1676  77676A   LDA V16 TLEDS
22654  52000  22661R   AND =B101
22655  72405          SZA A1307
22656   2000  15047R   LDA =B145
22657  42000  15546R   JSM P214   KEY
22660  66000  22663R   JMP A1308
22661    101
22661                 LIT
22662                 A1307 EQU *
22662  42000  15143R   JSM P949   UNBLANK
22663                 A1308 EQU *
22663   1676  77676A   LDA V16 TLEDS
22664  52000  22646R   AND =B177207
22665  62000   2203R   IOR =B10
22666  42000   2163R   JSM P270   TLEDSOUT
22667   2000   6703R   LDA =D1024
22670   6000   2203R   LDB =D8
22671  42000     75X   JSX .WS4
22672   2000   7571R   LDA =B2030
22673  42000     73X   JSX .W6
22674   2000  22604R   LDA =B110
22675  42000    555R   JSM P215   SKEY
22676  42000  10747R   JSM P219   MKRDEL
22677   1603  77603A   LDA V32643   PLOCK
```

```
22700  52000    7567R    AND =B173777
22701  31603   77603A    STA V32643  PLOCK
22702  42000    6160R    JSM P502  EOS
22703  66000   23431R    JMP A1290
22704                  C1309 EQU *
22704  42000   15143R    JSM P949  UNBLANK
22705   2000    1457R    LDA =D1
22706   6000    2203R    LDB =D8
22707  42000      75X    JSX .WS4
22710   2000   20422R    LDA =B176027
22711  70540             PWC A
22712   2000    1457R    LDA =D1
22713                  A1310 EQU *
22713  31573   77573A    STA V32635   I
22714  42000     162X    JSX .R5
22715  31572   77572A    STA V32634   J
22716   1573   77573A    LDA V32635   I
22717  22000    6703R    ADA =D1024
22720  42000     103X    JSX .W4
22721  42000     162X    JSX .R5
22722  31567   77567A    STA V32631   KEYCOL
22723   1573   77573A    LDA V32635   I
22724  22000    6703R    ADA =D1024
22725  42000     103X    JSX .W4
22726   1572   77572A    LDA V32634   J
22727  42000      73X    JSX .W6
22730   1573   77573A    LDA V32635   I
22731  42000     103X    JSX .W4
22732   1567   77567A    LDA V32631   KEYCOL
22733  42000      73X    JSX .W6
22734   2000    1457R    LDA =D1
22735  21573   77573A    ADA V32635   I
22736 144016      16A    ISZ C,I
22737  66000   22713R    JMP A1310
22740  54016      16A    DSZ C
22741   1426   77426A    LDA V32534   UFLAG
22742  52000    3654R    AND =B20
22743 170502             SAR 3
22744  70540             PWC A
22745   1426   77426A    LDA V32534   UFLAG
22746  52000    2276R    AND =D2
22747 170602             SAL 3
22750  42000     136X    JSX .URT
22751  42000     104X    JSX .TURN
22752           7565R    DEF =B22
22753          77426A    DEF V32534   UFLAG
22754  31426   77426A    STA V32534   UFLAG
22755   1676   77676A    LDA V16 TLEDS
22756  52000   10360R    AND =B201
22757  72403            SZA A1311
22760   2000    3312R    LDA =B144
22761  42000   15546R    JSM P214   KEY
22762                  A1311 EQU *
22762   1676   77676A    LDA V16 TLEDS
22763  52000   22225R    AND =B410
22764  72404            SZA A1312
22765   2000   21201R    LDA =B152
22766  42000   15546R    JSM P214   KEY
22767  66000   22771R    JMP A1313
22770                  A1312 EQU *
22770  42000   10747R    JSM P219   MKRDEL
22771                  A1313 EQU *
22771  42000    2650R    JSM P304   UNCAL
22772  66000   23431R    JMP A1290
22773                  C1314 EQU *
22773  42000   15030R    JSM P936   ALTCK
22774  42000   15143R    JSM P949   UNBLANK
22775   1676   77676A    LDA V16 TLEDS
22776  52000   23363R    AND =B177307
22777  62000    3654R    IOR =B20
23000  42000    2163R    JSM P270   TLEDSOUT
23001   2000    6703R    LDA =D1024
23002   6000    2203R    LDB =D8
23003  42000      75X    JSX .WS4
23004   2000    7571R    LDA =B2030
23005  42000      73X    JSX .W6
23006  42000    4664R    JSM P423   VDCOP
23007  42000   10747R    JSM P219   MKRDEL
23010  66000   23431R    JMP A1290
23011                  C1315 EQU *
23011  42000   15030R    JSM P936   ALTCK
23012  42000   15143R    JSM P949   UNBLANK
23013   1676   77676A    LDA V16 TLEDS
23014  52000   23363R    AND =B177307
23015  62000    2205R    IOR =B40
23016  42000    2163R    JSM P270   TLEDSOUT
23017   2000    6703R    LDA =D1024
23020   6000    2203R    LDB =D8
23021  42000      75X    JSX .WS4
23022   2000    3113R    LDA =B2060
23023  42000      73X    JSX .W6
23024  42000    4664R    JSM P423   VDCOP
23025  42000   10747R    JSM P219   MKRDEL
23026  66000   23431R    JMP A1290
23027                  C1316 EQU *
23027   2000   16201R    LDA =D1025
23030   6000    2203R    LDB =D8
23031  42000      75X    JSX .WS4
23032   2000   20422R    LDA =B176027
23033  70540             PWC A
```

```
23034    2000   16201R     LDA =D1025
23035                    A1317 EQU *
23035   31573   77573A     STA V32635   I
23036   42000     162X     JSX .R5
23037   31572   77572A     STA V32634   J
23040    1573   77573A     LDA V32635   I
23041   42000     103X     JSX .W4
23042    1704   77704A     LDA V33 LEVLIN
23043  170604              SAL 5
23044   70540              PWC A
23045    1572   77572A     LDA V32634   J
23046  170604              SAL 5
23047   42000     116X     JSX SUB41
23050  170404              AAR 5
23051   42000      73X     JSX .W6
23052    2000    1457R     LDA =D1
23053   21573   77573A     ADA V32635   I
23054  144016      16A     ISZ C,I
23055   66000   23035R     JMP A1317
23056   54016      16A     DSZ C
23057    1675   77675A     LDA V15 BLEDS
23060  170612              SAL 11
23061  172410             SAM A1318
23062    1704   77704A     LDA V33 LEVLIN
23063   42000   11072R     JSM P667   WLVLN
23064    2000    3527R     LDA =D14
23065   42000    2223R     JSM P274   NBLK
23066    1675   77675A     LDA V15 BLEDS
23067   62000    3654R     IOR =B20
23070   31675   77675A     STA V15 BLEDS
23071                    A1318 EQU *
23071    2000   21201R     LDA =B152
23072   42000   15546R     JSM P214   KEY
23073    1676   77676A     LDA V16 TLEDS
23074  170610              SAL 9
23075  172002             SAP A1319
23076   42000    2762R     JSM P314   AVGRST
23077                    A1319 EQU *
23077    1426   77426A     LDA V32534   UFLAG
23100   62000    3654R     IOR =B20
23101   31426   77426A     STA V32534   UFLAG
23102   42000    2650R     JSM P304   UNCAL
23103   66000   23431R     JMP A1290
23104                    C1320 EQU *
23104    2000    2131R     LDA =D15
23105   70540              PWC A
23106    2000    2172R     LDA =D13
23107   42000   10713R     JSM P656   GRAT
23110    1675   77675A     LDA V15 BLEDS
23111   52000    2067R     AND =B177757
23112   31675   77675A     STA V15 BLEDS
23113    2000    3527R     LDA =D14
23114   42000   15133R     JSM P947   TRNOFF
23115    2000    3527R     LDA =D14
23116   42000    2434R     JSM P285   BLKOF
23117   66000   23431R     JMP A1290
23120                    C1321 EQU *
23120    1704   77704A     LDA V33 LEVLIN
23121   42000   11072R     JSM P667   WLVLN
23122    2000    3527R     LDA =D14
23123   42000   14741R     JSM P929   ENTRY
23124    2000    3527R     LDA =D14
23125   42000    2223R     JSM P274   NBLK
23126    1675   77675A     LDA V15 BLEDS
23127   62000    3654R     IOR =B20
23130   31675   77675A     STA V15 BLEDS
23131   66000   23431R     JMP A1290
23132                    C1322 EQU *
23132    2000   11067R     LDA =D2169
23133    6000    2203R     LDB =D8
23134   42000      75X     JSX .WS4
23135    2000   23364R     LDA =B3777
23136   42000      73X     JSX .W6
23137    1675   77675A     LDA V15 BLEDS
23140   52000    7731R     AND =B177737
23141   31675   77675A     STA V15 BLEDS
23142    2000    2131R     LDA =D15
23143   42000   15133R     JSM P947   TRNOFF
23144    2000    2131R     LDA =D15
23145   42000    2434R     JSM P285   BLKOF
23146   66000   23431R     JMP A1290
23147                    C1323 EQU *
23147    1705   77705A     LDA V32 THRESH
23150   42000   11044R     JSM P666   WTHRSH
23151    2000    2131R     LDA =D15
23152   42000   14741R     JSM P929   ENTRY
23153    2000    2131R     LDA =D15
23154   42000    2223R     JSM P274   NBLK
23155    1675   77675A     LDA V15 BLEDS
23156   62000    2205R     IOR =B40
23157   31675   77675A     STA V15 BLEDS
23160   66000   23431R     JMP A1290
23161                    C1324 EQU *
23161    1435   77435A     LDA V32541   IF1
23162  172417             SAM A1325
23163    1730   77730A     LDA V30 KFLAG
23164  170513              SAR 12
23165   42000     104X     JSX .TURN
23166            1456R     DEF =D12
23167           77740A     DEF V32736   EFLAG
```

```
23170  31740   77740A    STA V32736  EFLAG
23171   1435   77435A    LDA V32541  IF1
23172  62000    5517R    IOR =B100000
23173  31435   77435A    STA V32541  IF1
23174   1700   77700A    LDA V22 RLVL
23175  42000    3530R    JSM P355  REFLEV
23176   1740   77740A    LDA V32736  EFLAG
23177  42000   15050R    JSM P223  AMPU
23200  42000    2762R    JSM P314  AVGRST
23201                  A1325 EQU *
23201   2000    1704R    LDA =D6
23202  42000   14741R    JSM P929  ENTRY
23203   2000    1704R    LDA =D6
23204  42000    2223R    JSM P274  NBLK
23205   2000    1704R    LDA =D6
23206  42000    2314R    JSM P279  SBLK
23207  66000   23431R    JMP A1290
23210                  C1326 EQU *
23210   1435   77435A    LDA V32541  IF1
23211 172006             SAP A1327
23212   1730   77730A    LDA V30 KFLAG
23213  42000     104X    JSX .TURN
23214           4533R    DEF =B140000
23215          77740A    DEF V32736  EFLAG
23216  31740   77740A    STA V32736  EFLAG
23217                  A1327 EQU *
23217   1435   77435A    LDA V32541  IF1
23220  52000   23365R    AND =B17777
23221  31435   77435A    STA V32541  IF1
23222   1700   77700A    LDA V22 RLVL
23223  42000    3530R    JSM P355  REFLEV
23224   2000    1704R    LDA =D6
23225  42000   15133R    JSM P947  TRNOFF
23226   2000    3654R    LDA =D16
23227  42000    2223R    JSM P274  NBLK
23230   2000    2420R    LDA =D145
23231  42000      73X    JSX .WO
23232  42000    2762R    JSM P314  AVGRST
23233   1740   77740A    LDA V32736  EFLAG
23234 170613             SAL 12
23235  42000   15050R    JSM P223  AMPU
23236  42000    2551R    JSM P298  ABLK
23237  66000   23431R    JMP A1290
23240                  C1328 EQU *
23240   1676   77676A    LDA V16 TLEDS
23241  62000    1300R    IOR =B1000
23242  42000    2163R    JSM P270  TLEDSOUT
23243  66000   23431R    JMP A1290
23244                  C1329 EQU *
23244   1676   77676A    LDA V16 TLEDS
23245  52000    5521R    AND =B175777
23246  42000    2163R    JSM P270  TLEDSOUT
23247  42000   15224R    JSM P221  TRIGR
23250  66000   23431R    JMP A1290
23251                  C1330 EQU *
23251   1733   77733A    LDA V20 FSTIM
23252 172405             SAM A1331
23253   1676   77676A    LDA V16 TLEDS
23254  62000    6703R    IOR =B2000
23255  42000    2163R    JSM P270  TLEDSOUT
23256  42000   15224R    JSM P221  TRIGR
23257                  A1331 EQU *
23257  66000   23431R    JMP A1290
23260                  C1332 EQU *
23260   2000    1463R    LDA =D0
23261  42000   15274R    JSM P967  TMODE
23262  66000   23431R    JMP A1290
23263                  C1333 EQU *
23263   2000    2277R    LDA =B4000
23264  42000   15274R    JSM P967  TMODE
23265  66000   23431R    JMP A1290
23266                  C1334 EQU *
23266   2000    2644R    LDA =B10000
23267  42000   15274R    JSM P967  TMODE
23270  66000   23431R    JMP A1290
23271                  C1335 EQU *
23271   2000    1770R    LDA =B20000
23272  42000   15274R    JSM P967  TMODE
23273  66000   23431R    JMP A1290
23274                  C1336 EQU *
23274   1676   77676A    LDA V16 TLEDS
23275 170140             CMA
23276  52000    6514R    AND =B77777
23277  42000     104X    JSX .TURN
23300           4533R    DEF =B140000
23301          77676A    DEF V16 TLEDS
23302  42000    2163R    JSM P270  TLEDSOUT
23303   1676   77676A    LDA V16 TLEDS
23304 170600             SAL 1
23305 170403             AAR 4
23306  42000     104X    JSX .TURN
23307          23366R    DEF =B14000
23310          77435A    DEF V32541  IF1
23311  31435   77435A    STA V32541  IF1
23312  42000    3243R    JSM P335  WIF1
23313  66000   23431R    JMP A1290
23314                  C1337 EQU *
23314   1675   77675A    LDA V15 BLEDS
23315 170600             SAL 1
23316 172003             SAP A1338
```

```
        23317    2000   22242R      LDA =B123
        23320   42000   15546R      JSM P214   KEY
        23321                 A1338 EQU *
        23321   66000   23431R      JMP A1290
        23322                 C1339 EQU *
        23322    1676   77676A      LDA V16 TLEDS
        23323  170140               CMA
        23324   52000    2645R      AND =B137777
        23325   42000     104X      JSX .TURN
        23326            4533R      DEF =B140000
        23327           77676A      DEF V16 TLEDS
        23330   42000    2163R      JSM P270  TLEDSOUT
        23331    1676   77676A      LDA V16 TLEDS
        23332  170502               SAR 3
        23333   42000     104X      JSX .TURN
        23334           23366R      DEF =B14000
        23335           77435A      DEF V32541   IF1
        23336   31435   77435A      STA V32541   IF1
        23337   42000    3243R      JSM P335   WIF1
        23340   66000   23431R      JMP A1290
        23341                 C1340 EQU *
        23341    1675   77675A      LDA V15 BLEDS
        23342  170601               SAL 2
        23343  172003               SAP A1341
        23344    2000   23367R      LDA =B75
        23345   42000   15546R      JSM P214   KEY
        23346                 A1341 EQU *
        23346   66000   23431R      JMP A1290
        23347                 C1342 EQU *
        23347    1675   77675A      LDA V15 BLEDS
        23350  170601               SAL 2
        23351  172403               SAM A1343
        23352    2000   23367R      LDA =B75
        23353   42000   15546R      JSM P214   KEY
        23354                 A1343 EQU *
        23354   66000   23431R      JMP A1290
        23355                 C1344 EQU *
        23355    1675   77675A      LDA V15 BLEDS
        23356  170600               SAL 1
        23357  172403               SAM A1345
        23360    2000   22242R      LDA =B123
        23361   42000   15546R      JSM P214   KEY
        23362                 A1345 EQU *
        23362   66000   23431R      JMP A1290
        23363  177307
        23364    3777
        23365   17777
        23366   14000
        23367      75
        23363                       LIT
        23370           23355R      DEF C1344
        23371           23347R      DEF C1342
        23372           23341R      DEF C1340
        23373           23322R      DEF C1339
        23374           23314R      DEF C1337
        23375           23274R      DEF C1336
        23376           23271R      DEF C1335
        23377           23266R      DEF C1334
        23400           23263R      DEF C1333
        23401           23260R      DEF C1332
        23402           23251R      DEF C1330
        23403           23244R      DEF C1329
        23404           23240R      DEF C1328
        23405           23210R      DEF C1326
        23406           23161R      DEF C1324
        23407           23147R      DEF C1323
        23410           23132R      DEF C1322
        23411           23120R      DEF C1321
        23412           23104R      DEF C1320
        23413           23027R      DEF C1316
        23414           23011R      DEF C1315
        23415           22773R      DEF C1314
        23416           22704R      DEF C1309
        23417           22651R      DEF C1306
        23420           22607R      DEF C1303
        23421           22527R      DEF C1298
        23422           22511R      DEF C1297
        23423           22473R      DEF C1296
        23424           22456R      DEF C1294
        23425           22422R      DEF C1291
        23426           22372R      DEF C1289
        23427                       DEC -32
        23430   42000     143X A1288 JSX .CASE
        23431                 A1290 EQU *
        23431   66000   24373R      JMP A1346
        23432                 A1284 EQU *
        23432   42000   15344R      JSM P971   USFT
        23433    1566   77566A      LDA V32630   KEYCODE
        23434   22000   23527R      ADA =B-137
        23435   66000   24372R      JMP A1347
        23436                 C1348 EQU *
        23436    2000    1463R      LDA =D0
        23437   42000   14741R      JSM P929   ENTRY
        23440   66000   24373R      JMP A1349
        23441                 C1350 EQU *
        23441    1702   77702A      LDA V24 VIDCON
        23442   52000   23530R      AND =B177707
        23443   62000    2205R      IOR =B40
        23444   31702   77702A      STA V24 VIDCON
        23445   42000    2772R      JSM P315   DALG
```

```
23446  66000   24373R     JMP A1349
23447                   C1351 EQU *
23447   1702   77702A     LDA V24 VIDCON
23450  52000   23530R     AND =B177707
23451  62000    2203R     IOR =B10
23452  31702   77702A     STA V24 VIDCON
23453  42000    2772R     JSM P315  DALG
23454  66000   24373R     JMP A1349
23455                   C1352 EQU *
23455   2000   20422R     LDA =B176027
23456  70540              PWC A
23457   2000    1457R     LDA =D1
23460                   A1353 EQU *
23460  31573   77573A     STA V32635   I
23461  22000    6703R     ADA =D1024
23462   6000    2203R     LDB =D8
23463  42000      75X     JSX .WS4
23464  42000     162X     JSX .R5
23465  31572   77572A     STA V32634   J
23466   1573   77573A     LDA V32635   I
23467  42000     103X     JSX .W4
23470  42000     162X     JSX .R5
23471  31567   77567A     STA V32631  KEYCOL
23472   1573   77573A     LDA V32635   I
23473  42000     103X     JSX .W4
23474   2000    3166R     LDA =D1023
23475  70540              PWC A
23476   1572   77572A     LDA V32634   J
23477 170604              SAL 5
23500 170404              AAR 5
23501  70540              PWC A
23502   1567   77567A     LDA V32631  KEYCOL
23503 170604              SAL 5
23504 170404              AAR 5
23505  42000      57X     JSX ADD4T
23506  42000    2132R     JSM P265  LIMIT
23507  42000      73X     JSX .W6
23510   2000    1457R     LDA =D1
23511  21573   77573A     ADA V32635   I
23512 144016      16A     ISZ C,I
23513  66000   23460R     JMP A1353
23514  54016      16A     DSZ C
23515   1676   77676A     LDA V16 ILEDS
23516 170610              SAL 9
23517 172012             SAP A1354
23520   1426   77426A     LDA V32534   UFLAG
23521  70540              PWC A
23522   2000   22223R     LDA =B143
23523  42000   15546R     JSM P214   KEY
23524  70760              WWC A
23525  31426   77426A     STA V32534   UFLAG
23526  66000   23534R     JMP A1355
23527 177641
23530 177707
23527                    LIT
23531                   A1354 EQU *
23531   1426   77426A     LDA V32534   UFLAG
23532  62000    2276R     IOR =D2
23533  31426   77426A     STA V32534   UFLAG
23534                   A1355 EQU *
23534  42000   10747R     JSM P219   MKRDEL
23535  42000    2650R     JSM P304   UNCAL
23536  66000   24373R     JMP A1349
23537                   C1356 EQU *
23537   1702   77702A     LDA V24 VIDCON
23540  52000   23530R     AND =B177707
23541  31702   77702A     STA V24 VIDCON
23542  42000    2772R     JSM P315  DALG
23543  66000   24373R     JMP A1349
23544                   C1357 EQU *
23544   1702   77702A     LDA V24 VIDCON
23545  52000   23530R     AND =B177707
23546  62000    3654R     IOR =B20
23547  31702   77702A     STA V24 VIDCON
23550  42000    2772R     JSM P315  DALG
23551  66000   24373R     JMP A1349
23552                   C1358 EQU *
23552   1730   77730A     LDA V30 KFLAG
23553  62000    1364R     IOR =B100
23554  31730   77730A     STA V30 KFLAG
23555  66000   24373R     JMP A1349
23556                   C1359 EQU *
23556   1435   77435A     LDA V32541   IF1
23557  62000    6703R     IOR =B2000
23560  31435   77435A     STA V32541   IF1
23561  42000    3243R     JSM P335   WIF1
23562  66000   24373R     JMP A1349
23563                   C1360 EQU *
23563   1435   77435A     LDA V32541   IF1
23564  52000    5521R     AND =B175777
23565  31435   77435A     STA V32541   IF1
23566  42000    3243R     JSM P335   WIF1
23567  66000   24373R     JMP A1349
23570                   C1361 EQU *
23570   2000   16201R     LDA =D1025
23571   6000    2203R     LDB =D8
23572  42000      75X     JSX .WS4
23573   2000   20422R     LDA =B176027
23574  70540              PWC A
23575   2000   16201R     LDA =D1025
```

```
23576                        A1362 EQU *
23576   31573   77573A         STA V32635   I
23577   42000     162X         JSX .R5
23600   31572   77572A         STA V32634   J
23601    1573   77573A         LDA V32635   I
23602   22000    2277R         ADA =D2048
23603   42000     103X         JSX .W4
23604   42000     162X         JSX .R5
23605   31567   77567A         STA V32631   KEYCOL
23606    1573   77573A         LDA V32635   I
23607   22000    2277R         ADA =D2048
23610   42000     103X         JSX .W4
23611    1572   77572A         LDA V32634   J
23612   42000      73X         JSX .W6
23613    1573   77573A         LDA V32635   I
23614   42000     103X         JSX .W4
23615    1567   77567A         LDA V32631   KEYCOL
23616   52000   23656R         AND =B7006
23617   22000   23657R         ADA =B175774
23620    4000                  LDB A
23621    2000    3113R         LDA =B2060
23622   76402                 SZB A1363
23623    1567   77567A         LDA V32631   KEYCOL
23624                        A1363 EQU *
23624   42000      73X         JSX .W6
23625    2000    1457R         LDA =D1
23626   21573   77573A         ADA V32635   I
23627  144016      16A         ISZ C,I
23630   66000   23576R         JMP A1362
23631   54016      16A         DSZ C
23632    1426   77426A         LDA V32534   UFLAG
23633   52000    2411R         AND =D4
23634  170601                  SAL 2
23635   62000    2205R         IOR =B40
23636   70540                  PWC A
23637    1426   77426A         LDA V32534   UFLAG
23640   52000    3654R         AND =B20
23641  170501                  SAR 2
23642   42000     136X         JSX .URI
23643   42000     104X         JSX .IURN
23644           10237R         DEF =B64
23645           77426A         DEF V32534   UFLAG
23646   31426   77426A         STA V32534   UFLAG
23647   42000    2650R         JSM P304  UNCAL
23650    1676   77676A         LDA V16 TLEDS
23651   52000   22225R         AND =B410
23652   72406                 SZA A1364
23653    2000   21201R         LDA =B152
23654   42000   15546R         JSM P214   KEY
23655   66000   23661R         JMP A1365
23656    7006
23657  175774
23656                          LIT
23660                        A1364 EQU *
23660   42000   10747R         JSM P219   MKRDEL
23661                        A1365 EQU *
23661   66000   24373R         JMP A1349
23662                        C1366 EQU *
23662    2000    6352R         LDA =D3072
23663    6000    2203R         LDB =D8
23664   42000      75X         JSX .WS4
23665    2000    7571R         LDA =B2030
23666   42000      73X         JSX .W6
23667    1426   77426A         LDA V32534   UFLAG
23670   62000    2203R         IOR =B10
23671   31426   77426A         STA V32534   UFLAG
23672   42000    2650R         JSM P304  UNCAL
23673   66000   24373R         JMP A1349
23674                        C1367 EQU *
23674    2000    6352R         LDA =D3072
23675    6000    2203R         LDB =D8
23676   42000      75X         JSX .WS4
23677    2000    3110R         LDA =B2024
23700   42000      73X         JSX .W6
23701    1426   77426A         LDA V32534   UFLAG
23702   52000    1375R         AND =B177767
23703   31426   77426A         STA V32534   UFLAG
23704   42000    2650R         JSM P304  UNCAL
23705   66000   24373R         JMP A1349
23706                        C1368 EQU *
23706    2000   16201R         LDA =D1025
23707    6000    2203R         LDB =D8
23710   42000      75X         JSX .WS4
23711    2000   20422R         LDA =B176027
23712   70540                  PWC A
23713    2000   16201R         LDA =D1025
23714                        A1369 EQU *
23714   31573   77573A         STA V32635   I
23715   42000     162X         JSX .R5
23716   31572   77572A         STA V32634   J
23717    1573   77573A         LDA V32635   I
23720   22000    2277R         ADA =D2048
23721   42000     103X         JSX .W4
23722    1572   77572A         LDA V32634   J
23723   42000      73X         JSX .W6
23724    1573   77573A         LDA V32635   I
23725   22000    1457R         ADA =D1
23726   42000     103X         JSX .W4
23727    2000    1457R         LDA =D1
23730   21573   77573A         ADA V32635   I
```

```
23731 144016    16A   ISZ C,I
23732  66000 23714R   JMP A1369
23733  54016    16A   DSZ C
23734   1426 77426A   LDA V32534  UFLAG
23735  62000  2205R   IOR =B40
23736  70540          PWC A
23737   1426 77426A   LDA V32534  UFLAG
23740 170501          SAR 2
23741  42000   104X   JSX .TURN
23742         2411R   DEF =D4
23743                 NOP
23744  31426 77426A   STA V32534  UFLAG
23745  42000  2650R   JSM P304  UNCAL
23746  66000 24373R   JMP A1349
23747               C1370 EQU *
23747   2000 24130R   LDA =D2065
23750   6000  2203R   LDB =D8
23751  42000    75X   JSX .WS4
23752   2000 24131R   LDA =D1035
23753  42000    73X   JSX .W6
23754   2000 24132R   LDA =D2168
23755  42000    73X   JSX .W6
23756  66000 24373R   JMP A1349
23757               C1371 EQU *
23757   2000 24133R   LDA =D21
23760  70540          PWC A
23761   2000  2301R   LDA =D19
23762  42000 10713R   JSM P656  GRAI
23763  66000 24373R   JMP A1349
23764               C1372 EQU *
23764   2000 24134R   LDA =D2170
23765   6000  2203R   LDB =D8
23766  42000    75X   JSX .WS4
23767   2000  3113R   LDA =B2060
23770  42000    73X   JSX .W6
23771  66000 24373R   JMP A1349
23772               C1373 EQU *
23772   2000 24134R   LDA =D2170
23773   6000  2203R   LDB =D8
23774  42000    75X   JSX .WS4
23775   2000 24135R   LDA =B2522
23776  42000    73X   JSX .W6
23777  66000 24373R   JMP A1349
24000               C1374 EQU *
24000   1730 77730A   LDA V30 KFLAG
24001  62000  2205R   IOR =B40
24002  31730 77730A   STA V30 KFLAG
24003  42000  3243R   JSM P335  WIFI
24004  66000 24373R   JMP A1349
24005               C1375 EQU *
24005   2000  3654R   LDA =B20
24006   6000  2411R   LDB =D4
24007  42000   112X   JSX .WS7
24010  66000 24373R   JMP A1349
24011               C1376 EQU *
24011   1723 77723A   LDA V26 MKRMODE
24012  72413           SZA A1377
24013  42000 10323R   JSM P626  MRKROK
24014 172011           SAP A1377
24015   2000  4533R   LDA =B140000
24016  31703 77703A   STA V21 STRIG
24017   1601 77601A   LDA V32641  HPBC
24020  52000 16171R   AND =B157777
24021  31601 77601A   STA V32641  HPBC
24022   1740 77740A   LDA V32736  EFLAG
24023  62000  2644R   IOR =B10000
24024  31740 77740A   STA V32736  EFLAG
24025               A1377 EQU *
24025  66000 24373R   JMP A1349
24026               C1378 EQU *
24026   1616 77616A   LDA V32654  XFLAG
24027  62000  1770R   IOR =B20000
24030  31616 77616A   STA V32654  XFLAG
24031   1676 77676A   LDA V16 TLEDS
24032  62000  6703R   IOR =B2000
24033  42000  2163R   JSM P270  TLEDSOUT
24034   2000  7670R   LDA =B164
24035  42000   555R   JSM P215  SKEY
24036  42000 15224R   JSM P221  TRIGR
24037  66000 24373R   JMP A1349
24040               C1379 EQU *
24040   1616 77616A   LDA V32654  XFLAG
24041  62000  2277R   IOR =B4000
24042  31616 77616A   STA V32654  XFLAG
24043   2000  2066R   LDA =B177770
24044  70540          PWC A
24045   2000  5520R   LDA =D24
24046               A1380 EQU *
24046  31572 77572A   STA V32634  J
24047  42000  2501R   JSM P295  BLINK
24050   2000  1457R   LDA =D1
24051  21572 77572A   ADA V32634  J
24052 144016    16A   ISZ C,I
24053  66000 24046R   JMP A1380
24054  54016    16A   DSZ C
24055  66000 24373R   JMP A1349
24056               C1381 EQU *
24056   2000  6352R   LDA =D3072
24057   6000  2203R   LDB =D8
24060  42000    75X   JSX .WS4
```

```
24061    2000  24136R      LDA =B2022
24062   42000     73X      JSX .W6
24063    2000   3654R      LDA =D16
24064   42000     73X      JSX .W6
24065    2000   2646R      LDA =D3008
24066   42000     73X      JSX .W6
24067    2000  16201R      LDA =B2001
24070   42000     73X      JSX .W6
24071    1675  77675A      LDA V15 BLEDS
24072   62000   2411R      IOR =D4
24073   31675  77675A      STA V15 BLEDS
24074                 L1382 EQU * CDUMP
24074    2000  10241R      LDA =B177743
24075   70540              PWC A
24076    2000   1457R      LDA =D1
24077                 A1383 EQU *
24077   31474  77474A      STA V42 KL
24100    1730  77730A      LDA V30 KFLAG
24101   62000   2410R      IOR =B200
24102   31730  77730A      STA V30 KFLAG
24103    2000   1704R      LDA =D6
24104   70540              PWC A
24105    2000   2411R      LDA =D4
24106   70540              PWC A
24107    1474  77474A      LDA V42 KL
24110   42000     60X      JSX .ARAY
24111             15R      DEF V39 BWAMP
24112   42000    122X      JSX CNV42
24113   42000  13062R      JSM P793  NDUMP
24114    1474  77474A      LDA V42 KL
24115  170040              TCA
24116   22000   1457R      ADA =D1
24117  172402              SAM *+2
24120   66000  24156R      JMP A1384
24121    1474  77474A      LDA V42 KL
24122   22000  24137R      ADA =D-14
24123  172033             SAP A1384
24124    1601  77601A      LDA V32641  HPBC
24125  172013             SAP A1385
24126   42000  13030R      JSM P789  WCRLF
24127   66000  24142R      JMP A1386
24130    4021
24131    2013
24132    4170
24133      25
24134    4172
24135    2522
24136    2022
24137  177762
24130                     LIT
24140                 A1385 EQU *
24140   42000   2206R      JSM P272  SPACE
24141   42000   2206R      JSM P272  SPACE
24142                 A1386 EQU *
24142    1730  77730A      LDA V30 KFLAG
24143   62000   2410R      IOR =B200
24144   31730  77730A      STA V30 KFLAG
24145    2000   1457R      LDA =D1
24146   70540              PWC A
24147    2000   1456R      LDA =D12
24150   70540              PWC A
24151    1474  77474A      LDA V42 KL
24152   42000    133X      JSX .LRAY
24153             12R      DEF V37 BWFRQ
24154   42000    134X      JSX .LDBA
24155   42000  13062R      JSM P793  NDUMP
24156                 A1384 EQU *
24156    1601  77601A      LDA V32641  HPBC
24157  172003             SAP A1387
24160   42000  13030R      JSM P789  WCRLF
24161   66000  24163R      JMP A1388
24162                 A1387 EQU *
24162   42000   2173R      JSM P271  CRLF
24163                 A1388 EQU *
24163    2000   1457R      LDA =D1
24164   21474  77474A      ADA V42 KL
24165  144016     16A      ISZ C,I
24166   66000  24077R      JMP A1383
24167   54016     16A      DSZ C
24170    2000   2417R      LDA =B177772
24171   70540              PWC A
24172    2000   2276R      LDA =D2
24173                 A1389 EQU *
24173   31474  77474A      STA V42 KL
24174   22000   5115R      ADA =D-7
24175  172004             SAP A1390
24176    1730  77730A      LDA V30 KFLAG
24177   62000   2410R      IOR =B200
24200   31730  77730A      STA V30 KFLAG
24201                 A1390 EQU *
24201    1474  77474A      LDA V42 KL
24202   42000      7X      JSM P198  ATNER
24203   31572  77572A      STA V32634   J
24204    6000   2203R      LDB =D8
24205   34011     11A      STB PA
24206    2000   1704R      LDA =D6
24207   70540              PWC A
24210    2000   2411R      LDA =D4
24211   70540              PWC A
24212    1572  77572A      LDA V32634   J
```

```
24213  42000     122X    JSX CNV42
24214  42000   13062R    JSM P793   NDUMP
24215   1601   77601A    LDA V32641  HPBC
24216 172003            SAP A1391
24217  42000   13030R    JSM P789   *CRLF
24220  66000   24222R    JMP A1392
24221                   A1391 EQU *
24221  42000    2206R    JSM P272   SPACE
24222                   A1392 EQU *
24222   2000    1457R    LDA =D1
24223  21474   77474A    ADA V42 KL
24224 144016      16A    ISZ C,I
24225  66000   24173R    JMP A1389
24226  54016      16A    DSZ C
24227   1740   77740A    LDA V32736  EFLAG
24230  52000    1770R    AND =B20000
24231  61601   77601A    IOR V32641  HPBC
24232  52000   24237R    AND =B120000
24233  22000    4207R    ADA =B160000
24234  72004            RZA A1393
24235  42000   13045R    JSM P791   OHPB
24236  66000   24074R    JMP L1382 CDUMP
24237 120000
24237                    LIT
24240                   A1393 EQU *
24240   2000    3110R    LDA =B2024
24241   6000    2203R    LDB =D8
24242  42000      72X    JSX .WS6
24243   1675   77675A    LDA V15 BLEDS
24244  52000    2153R    AND =B177773
24245  31675   77675A    STA V15 BLEDS
24246   1730   77730A    LDA V30 KFLAG
24247  52000   13044R    AND =B177577
24250  31730   77730A    STA V30 KFLAG
24251  66000   24373R    JMP A1349
24252                   C1394 EQU *
24252   2000   24327R    LDA =B10010
24253  42000   15274R    JSM P967   TMODE
24254  66000   24373R    JMP A1349
24255                   C1395 EQU *
24255   2000   24330R    LDA =B20010
24256  42000   15274R    JSM P967   TMODE
24257  66000   24373R    JMP A1349
24260                   C1396 EQU *
24260   2000   16710R    LDA =B177730
24261  42000   14741R    JSM P929   ENTRY
24262  66000   24373R    JMP A1349
24263                   C1397 EQU *
24263   1563   77563A    LDA V32627   DSTAD
24264   6000    2203R    LDB =D8
24265  42000      75X    JSX .WS4
24266  22000    3112R    ADA =D1001
24267  52000    6353R    AND =B7777
24270  31563   77563A    STA V32627   DSTAD
24271  42000   13045R    JSM P791   OHPB
24272  42000     166X    JSX .CSHV
24273           4630R    DEF P421   RDBMV
24274   1601   77601A    LDA V32641   HPBC
24275 170507             SAR 8
24276  42000      21X    JSM P208   IDUMP
24277  42000   15334R    JSM P969   CLRDA
24300  66000   24373R    JMP A1349
24301                   C1398 EQU *
24301   2000   20430R    LDA =B32
24302  42000   15546R    JSM P214   KEY
24303  66000   24373R    JMP A1349
24304                   C1399 EQU *
24304  42000   13045R    JSM P791   OHPB
24305   2000    3112R    LDA =D1001
24306  70540             PWC A
24307  42000     166X    JSX .CSHV
24310          77563A    DEF V32627   DSTAD
24311  42000      25X    JSM P212   IHPBI
24312  42000   15334R    JSM P969   CLRDA
24313  66000   24373R    JMP A1349
24314                   C1400 EQU *
24314   2000   10143R    LDA =B177725
24315  42000   14741R    JSM P929   ENTRY
24316  66000   24373R    JMP A1349
24317                   C1401 EQU *
24317  42000   13045R    JSM P791   OHPB
24320   2000    1277R    LDA =B177777
24321  70540             PWC A
24322  42000     166X    JSX .CSHV
24323          77563A    DEF V32627   DSTAD
24324  42000      25X    JSM P212   IHPBI
24325  42000   15334R    JSM P969   CLRDA
24326  66000   24373R    JMP A1349
24327  10010
24330  20010
24327                    LIT
24331          24317R    DEF C1401
24332          24314R    DEF C1400
24333          24304R    DEF C1399
24334          24301R    DEF C1398
24335          24263R    DEF C1397
24336          24260R    DEF C1396
24337          24255R    DEF C1395
24340          24252R    DEF C1394
24341          24056R    DEF C1361
```

```
24342                2404OR    DEF C1379
24343                24026R    DEF C1378
24344                24011R    DEF C1376
24345                24373R    DEF A1349
24346                24005R    DEF C1375
24347                24000R    DEF C1374
24350                23772R    DEF C1373
24351                23764R    DEF C1372
24352                23757R    DEF C1371
24353                23747R    DEF C1370
24354                23706R    DEF C1368
24355                23674R    DEF C1367
24356                23662R    DEF C1366
24357                23570R    DEF C1361
24360                23563R    DEF C1360
24361                23556R    DEF C1359
24362                23552R    DEF C1358
24363                23544R    DEF C1357
24364                23537R    DEF C1356
24365                23455R    DEF C1352
24366                23447R    DEF C1351
24367                23441R    DEF C1350
24370                23436R    DEF C1348
24371                          DEC -33
24372   42000         143X  A1347 JSX .CASE
24373                       A1349 EQU *
24373                       A1346 EQU *
24373   66000       24627R    JMP A1088
24374                       C1402 EQU *
24374    1566       77566A    LDA V32630  KEYCODE
24375  170040                 TCA
24376   22000       24424R    ADA =B177
24377  172027                SAP A1403
24400    1566       77566A    LDA V32630  KEYCODE
24401   22000       24425R    ADA =B-220
24402  172024                SAP A1403
24403    1566       77566A    LDA V32630  KEYCODE
24404   31606       77606A    STA V32646  SRCEID
24405   73003                SLA A1404
24406   62000        4207R    IOR =B160000
24407   31606       77606A    STA V32646  SRCEID
24410                       A1404 EQU *
24410  170615                 SAL 14
24411  172004                SAP A1405
24412    1606       77606A    LDA V32646  SRCEID
24413   62000        2644R    IOR =B10000
24414   31606       77606A    STA V32646  SRCEID
24415                       A1405 EQU *
24415    1606       77606A    LDA V32646  SRCEID
24416   52000        4256R    AND =B170000
24417   72404                SZA A1406
24420    2000        3654R    LDA =B20
24421    6000        2411R    LDB =D4
24422   42000         112X    JSX .#S7
24423                       A1406 EQU *
24423   66000       24617R    JMP A1407
24424     177
24425  177560
24424                         LIT
24426                       A1403 EQU *
24426    1566       77566A    LDA V32630  KEYCODE
24427   12000       24443R    CPA =B220
24430   66000       24432R    JMP *+2
24431   66000       24445R    JMP A1408
24432   42000       15344R    JSM P971  USFT
24433   42000       10312R    JSM P218  MKREL
24434  172004                SAP A1410
24435    1576       77576A    LDA V32638  RPGPTR
24436   12000        7565R    CPA =D18
24437   66000       24442R    JMP A1409
24440                       A1410 EQU *
24440    2000       24444R    LDA =B117
24441   42000       15546R    JSM P214  KEY
24442                       A1409 EQU *
24442   66000       24617R    JMP A1411
24443     220
24444     117
24443                         LIT
24445                       A1408 EQU *
24445   22000       24453R    ADA =B-236
24446  172006                SAP A1412
24447   42000       15344R    JSM P971  USFT
24450    2000       17407R    LDA =B115
24451   42000       15546R    JSM P214  KEY
24452   66000       24617R    JMP A1413
24453  177542
24453                         LIT
24454                       A1412 EQU *
24454    1566       77566A    LDA V32630  KEYCODE
24455   12000       24574R    CPA =B236
24456   66000       24460R    JMP *+2
24457   66000       24615R    JMP A1414
24460    1606       77606A    LDA V32646  SRCEID
24461  172017                SAP A1415
24462   42000         167X    JSX .ADDR
24463               24575R    DEF ="CF"
24464   42000          13X    JSM P202  STHPB
24465   42000          37X    JSX .LDBI
24466               77665A    DEF V8  CFREQ
24467   42000          62X    JSX CNV21
```

```
24470   42000      11X        JSM P200  CNV15
24471    1427   77427A        LDA V32535  AS
24472   42000      13X        JSM P202  STHPB
24473    1606   77606A        LDA V32646  SRCEID
24474   52000    6015R        AND =B70000
24475   72403                SZA A1416
24476    2000    2723R        LDA =B54
24477   42000      17X        JSM P206   *HPIB
24500                   A1416 EQU *
24500                   A1415 EQU *
24500    1606   77606A        LDA V32646  SRCEID
24501  170600                 SAL 1
24502  172017                SAP A1417
24503   42000     167X        JSX .ADDR
24504           24577R        DEF ="SP"
24505   42000      13X        JSM P202  STHPB
24506   42000      37X        JSX .LDBI
24507           77671A        DEF V9  SPAN
24510   42000      62X        JSX CNV21
24511   42000      11X        JSM P200  CNV15
24512    1427   77427A        LDA V32535  AS
24513   42000      13X        JSM P202  STHPB
24514    1606   77606A        LDA V32646  SRCEID
24515   52000   17331R        AND =B30000
24516   72403                SZA A1418
24517    2000    2723R        LDA =B54
24520   42000      17X        JSM P206   *HPIB
24521                   A1418 EQU *
24521                   A1417 EQU *
24521    1606   77606A        LDA V32646  SRCEID
24522  170601                 SAL 2
24523  172027                SAP A1419
24524   42000     167X        JSX .ADDR
24525           24601R        DEF ="ST"
24526   42000      13X        JSM P202  STHPB
24527    1733   77733A        LDA V20 FSTIM
24530  172004                SAP A1420
24531    1731   77731A        LDA V18 SINDEX
24532   42000    4411R        JSM P406  EXP2
24533   66000   24537R        JMP A1421
24534                   A1420 EQU *
24534    1731   77731A        LDA V18 SINDEX
24535   22000    5520R        ADA =D24
24536   42000    4356R        JSM P403  EXPSIX
24537                   A1421 EQU *
24537   42000      62X        JSX CNV21
24540   42000      41X        JSX MPY1
24541           24603R        DEF =F1@-6
24542   42000      11X        JSM P200  CNV15
24543    1427   77427A        LDA V32535  AS
24544   42000      13X        JSM P202  STHPB
24545    1606   77606A        LDA V32646  SRCEID
24546  170602                 SAL 3
24547  172003                SAP A1422
24550    2000    2723R        LDA =B54
24551   42000      17X        JSM P206   *HPIB
24552                   A1422 EQU *
24552                   A1419 EQU *
24552    1606   77606A        LDA V32646  SRCEID
24553  170602                 SAL 3
24554  172013                SAP A1423
24555   42000     167X        JSX .ADDR
24556           24607R        DEF ="RL"
24557   42000      13X        JSM P202  STHPB
24560    1700   77700A        LDA V22 RLVL
24561   42000      45X        JSX CNV41
24562   42000      41X        JSX MPY1
24563           24611R        DEF =F1@-1
24564   42000      11X        JSM P200  CNV15
24565    1427   77427A        LDA V32535  AS
24566   42000      13X        JSM P202  STHPB
24567                   A1423 EQU *
24567    1606   77606A        LDA V32646  SRCEID
24570   52000    6353R        AND =B7777
24571   31606   77606A        STA V32646  SRCEID
24572   42000   13030R        JSM P789  *CRLF
24573   66000   24617R        JMP A1424
24574     236
24575 CF
24577 SP
24601 ST
24603   1@-6
24607 RL
24611   1@-1
24574                         LIT
24615                   A1414 EQU *
24615    2000    1463R        LDA =D0
24616   42000   14741R        JSM P929  ENTRY
24617                   A1424 EQU *
24617                   A1413 EQU *
24617                   A1411 EQU *
24617                   A1407 EQU *
24617   66000   24627R        JMP A1088
24620           24374R        DEF C1402
24621           22353R        DEF C1283
24622           17510R        DEF C1137
24623           16756R        DEF C1089
24624           15716R        DEF C1000
24625                         DEC -6
24626   42000     143X  A999  JSX .CASE
```

```
24627                      A1088 EQU *
24627   1566    77566A      LDA V32630   KEYCODE
24630 170040                TCA
24631  22000    24424R      ADA =B177
24632 172002               SAP A1425
24633  42000    15344R      JSM P971   USFI
24634                      A1425 EQU *
24634                      L984  EQU * EXI1
24634  66000       31X      JMX .RTNA
24635                      P220  EQU * SAVEM
24635   6000     1277R      LDB =D-1
24636  42000       27X      JSX .ARGA
24637  42000    15351R      JSM P972   SAVPREP
24640   6000     1301R      LDB =D-3   S
24641  42000       30X      JSX .LDAP
24642  52000     2406R      AND =D7
24643  31572    77572A      STA V32634   J
24644   2000    15667R      LDA =B177731
24645  70540                PWC A
24646   2000     1457R      LDA =D1
24647                      A1426 EQU *
24647  31573    77573A      STA V32635   I
24650  70540                PWC A
24651   1572    77572A      LDA V32634   J
24652  42000      174X      JSX .ARRY
24653             213R      DEF V115   ASAVE
24654  70541                PWC B
24655   1573    77573A      LDA V32635   I
24656  42000       60X      JSX .ARAY
24657               7R      DEF V4   MSTATE
24660  42000      170X      JSX .STAC
24661   2000     1457R      LDA =D1
24662  21573    77573A      ADA V32635   I
24663 144016       16A      ISZ C,I
24664  66000    24647R      JMP A1426
24665  54016       16A      DSZ C
24666  42000    15405R      JSM P973   SAVCLR
24667  66000       31X      JMX .RTNA
24670                      P1427 EQU * NUMKEY
24670 174517                CLB
24671  42000       56X      JSX .ARGS
24672  44016       16A      ISZ C
24673   1566    77566A      LDA V32630   KEYCODE
24674  22000     3232R      ADA =B-60
24675 172415               SAM A1428
24676   1566    77566A      LDA V32630   KEYCODE
24677  22000    15671R      ADA =B-72
24700 172012               SAP A1428
24701   1620    77620A      LDA V32656   PREFIX
24702  12000     1456R      CPA =D12
24703  66000    24712R      JMP A1428
24704   1620    77620A      LDA V32656   PREFIX
24705 170500                SAR 1
24706  12000     1456R      CPA =D12
24707  66000    24712R      JMP A1428
24710   2000     1277R      LDA =D-1
24711  66000    24713R      JMP A1429
24712                      A1428 EQU *
24712 170517                CLA
24713                      A1429 EQU *
24713  66000       31X      JMX .RTNA
24714                      A3   EQU *
24714                      L194  EQU * POP
24714   2000     3166R      LDA =D1023
24715   6000     1463R      LDB =D0
24716  42000      112X      JSX .WS7
24717   2000     1704R      LDA =D6
24720  42000     3171R      JSM P327   HLDOF
24721   2000     2203R      LDA =D8
24722   6000     2411R      LDB =D4
24723  42000      112X      JSX .WS7
24724   2000     1770R      LDA =B20000
24725   6000     1456R      LDB =D12
24726  42000       72X      JSX .WS6
24727   2000     2107R      LDA =D3
24730  31736    77736A      STA V32734   ETX
24731   2000    25250R      LDA =B77764
24732  31427    77427A      STA V32535   AS
24733   2000     2406R      LDA =D7
24734  42000    24635R      JSM P220   SAVEM
24735  42000       53X      JSX .LDSI
24736            1463R      DEF =D0
24737  42000       34X      JSX .STRD
24740           77707A      DEF V11 FOFSET
24741   2000     3312R      LDA =D100
24742  31610    77610A      STA V32648   ALIM
24743  31705    77705A      STA V32 THRESH
24744   2000     6352R      LDA =D3072
24745  31563    77563A      STA V32627   DSTAD
24746   2000     3654R      LDA =B20
24747  31426    77426A      STA V32534   UFLAG
24750   1616    77616A      LDA V32654   XFLAG
24751  52000    11310R      AND =B400
24752  31616    77616A      STA V32654   XFLAG
24753   2000     1463R      LDA =D0
24754  31723    77723A      STA V26 MKRMODE
24755  31606    77606A      STA V32646   SRCEID
24756  31706    77706A      STA V31 RCFSET
24757  31434    77434A      STA V32540   IF2
24760  31603    77603A      STA V32643   PLOCK
```

```
24761   31565   77565A      STA V32629   SRQEN
24762    2000    1463R      LDA =D0
24763   31577   77577A      STA V32639   C1BASE
24764   31733   77733A      STA V20 FSTIM
24765   31575   77575A      STA V32637   K
24766   31604   77604A      STA V32644   SAIN
24767   31614   77614A      STA V32652   DAC2
24770   31601   77601A      STA V32641   HPBC
24771   31607   77607A      STA V32647   ACNT
24772    2000    2107R      LDA =D3
24773   31431   77431A      STA V32537   RPGSWP
24774    2000   25251R      LDA =D550
24775   31704   77704A      STA V33 LEVLIN
24776    1740   77740A      LDA V32736   EFLAG
24777   52000    3654R      AND =D16
25000   62000   25252R      IOR =B2014
25001   31740   77740A      STA V32736   EFLAG
25002    2000    5517R      LDA =B100000
25003   31435   77435A      STA V32541   IF1
25004    6000    1704R      LDB =D6
25005   42000     171X      JSX .RS4
25006   31573   77573A      STA V32635   I
25007   42000     162X      JSX .R5
25010   31572   77572A      STA V32634   J
25011  170601               SAL 2
25012  172404              SAM A1431
25013    2000    1463R      LDA =D0
25014   31432   77432A      STA V32538   GIN2
25015   31433   77433A      STA V32539   GIN1
25016                     A1431 EQU *
25016    1573   77573A      LDA V32635   I
25017  170501               SAR 2
25020   52000   17331R      AND =B30000
25021   70540               PWC A
25022    1572   77572A      LDA V32634   J
25023   52000    4533R      AND =B140000
25024   42000     136X      JSX .ORT
25025   70540               PWC A
25026    1730   77730A      LDA V30 KFLAG
25027   52000    1364R      AND =B100
25030   42000     136X      JSX .ORT
25031   31730   77730A      STA V30 KFLAG
25032    2000   25253R      LDA =B174710
25033   31677   77677A      STA V17 RFAT
25034   42000     161X      JSX .MVE4
25035           12167R      DEF =F100000000
25036           77713A      DEF V7   FSTEP
25037    2000    4167R      LDA =B240
25040   42000    2163R      JSM P270   TLEDSOUT
25041    2000    1277R      LDA =B177777
25042   31602   77602A      STA V32642   LKMSK
25043    2000    2205R      LDA =B40
25044   31702   77702A      STA V24 VIDCON
25045      15      15A      LDA V2   DMAMA
25046  170612               SAL 11
25047   31675   77675A      STA V15 BLEDS
25050   72203              SFS A1432
25051   62000    2644R      IOR =B10000
25052   31675   77675A      STA V15 BLEDS
25053                     A1432 EQU *
25053  170140               CMA
25054    6000    2276R      LDB =D2
25055   42000      75X      JSX .WS4
25056    1702   77702A      LDA V24 VIDCON
25057    6000    2221R      LDB =D9
25060   42000      75X      JSX .WS4
25061    2000    1457R      LDA =D1
25062   42000    3046R      JSM P321   CLEAR
25063    2000    2107R      LDA =D3
25064   42000    3046R      JSM P321   CLEAR
25065    2000    2411R      LDA =D4
25066   42000    3046R      JSM P321   CLEAR
25067    2000   10142R      LDA =D31
25070   42000    2223R      JSM P274   NBLK
25071    2000   17114R      LDA =B177742
25072   70540               PWC A
25073    2000    2565R      LDA =D11
25074                     A1433 EQU *
25074   31572   77572A      STA V32634   J
25075   42000    2434R      JSM P285   BLKOF
25076    2000    1457R      LDA =D1
25077   21572   77572A      ADA V32634   J
25100  144016      16A      ISZ C,1
25101   66000   25074R      JMP A1433
25102   54016      16A      DSZ C
25103    2000    1463R      LDA =D0
25104    6000    2203R      LDB =D8
25105   42000      75X      JSX .WS4
25106    2000    7570R      LDA =B2020
25107   42000      73X      JSX .W6
25110    2000   25254R      LDA =D120
25111   70540               PWC A
25112    2000    1457R      LDA =D1
25113   42000   10713R      JSM P656   GRAT
25114    2000    2066R      LDA =B177770
25115   70540               PWC A
25116    2000    1457R      LDA =D1
25117                     A1434 EQU *
25117   31572   77572A      STA V32634   J
25120   42000    2223R      JSM P274   NBLK
```

```
25121   2000   1457R    LDA =D1
25122  21572  77572A    ADA V32634  J
25123 144016     16A    ISZ C,I
25124  66000  25117R    JMP A1434
25125  54016     16A    DSZ C
25126   2000   1463R    LDA =D0
25127  42000  14741R    JSM P929   ENTRY
25130   2000   1457R    LDA =D1
25131   6000   2107R    LDB =D3
25132  42000     75X    JSX .WS4
25133   2000   2276R    LDA =D2
25134  42000    103X    JSX .W4
25135   2000   2107R    LDA =D3
25136  42000    103X    JSX .W4
25137   2000   2411R    LDA =D4
25140  42000    103X    JSX .W4
25141   2000   2405R    LDA =D5
25142  42000    103X    JSX .W4
25143  42000   1665R    JSM P245   READ
25144  42000   3530R    JSM P355   REFLEV
25145   2000   1704R    LDA =D6
25146  42000   2314R    JSM P279   SBLK
25147  76003           SSC A1435
25150   2000  22226R    LDA =B166
25151  42000    555R    JSM P215   SKEY
25152                 A1435 EQU *
25152  42000   3205R    JSM P329   BUSY
25153   2000   2723R    LDA =B54
25154  42000  15546R    JSM P214   KEY
25155   2000   2276R    LDA =D2
25156  42000  15546R    JSM P214   KEY
25157   2000   2406R    LDA =D7
25160  42000  15546R    JSM P214   KEY
25161   6000   2276R    LDB =D2
25162  42000    175X    JSX .RS6
25163  31567  77567A    STA V32631   KEYCOL
25164  42000    176X    JSX .R7
25165  31572  77572A    STA V32634   J
25166   1567  77567A    LDA V32631   KEYCOL
25167 170140            CMA
25170  42000    104X    JSX .TURN
25171          4534R    DEF =B40000
25172         77616A    DEF V32654   XFLAG
25173  31616  77616A    STA V32654   XFLAG
25174 170600            SAL 1
25175 172003           SAP A1436
25176   2000   6514R    LDA =B77777
25177  31565  77565A    STA V32629   SRGEN
25200                 A1436 EQU *
25200   1572  77572A    LDA V32634   J
25201 170613            SAL 12
25202 172003           SAP A1437
25203   2000  25255R    LDA =D28
25204  42000   2223R    JSM P274   NBLK
25205                 A1437 EQU *
25205                 L190  EQU * LOOP
25205  42000   7732R    JSM P599   FPNLON
25206  76702            SHC *+2
25207  66000  25315R    JMP L192   WLOOP
25210   1575  77575A    LDA V32637   K
25211  12000   1457R    CPA =D1
25212  66000  25217R    JMP A1439
25213 170040            TCA
25214  22000   2107R    ADA =D3
25215 172402            SAM *+2
25216  66000  25256R    JMP A1438
25217                 A1439 EQU *
25217   1703  77703A    LDA V21 STRIG
25220  12000   1770R    CPA =B20000
25221  66000  25256R    JMP A1438
25222   1676  77676A    LDA V16 ILEDS
25223  52000  16170R    AND =B611
25224  72432           SZA A1438
25225   6000   2221R    LDB =D9
25226  42000     74X    JSX .RS5
25227  31567  77567A    STA V32631   KEYCOL
25230   6000   2203R    LDB =D8
25231  42000     74X    JSX .RS5
25232  31567  77567A    STA V32631   KEYCOL
25233  52000   6353R    AND =B7777
25234  70540            PWC A
25235   5730  77730A    LDB V30 KFLAG
25236 174614            SBL 13
25237   2000   6352R    LDA =D3072
25240 176402           SBM A1441
25241   2000   1463R    LDA =D0
25242                 A1441 EQU *
25242  22000   3112R    ADA =D1001
25243  42000    116X    JSX SUB4T
25244 172012           SAP A1440
25245   2000   2107R    LDA =D3
25246  31575  77575A    STA V32637   K
25247  66000  25707R    JMP L191   SLOOP
25250  77764
25251   1046
25252   2014
25253 174710
25254    170
25255     34
25250                   LIT
```

```
25256                    A1440 EQU *
25256                    A1438 EQU *
25256   5730    77730A     LDB V30 KFLAG
25257 174614               SBL 13
25260   1702    77702A     LDA V24 VIDCON
25261 176002              SBP A1442
25262  52000     2066R     AND =B177770
25263                    A1442 EQU *
25263   6000     2221R     LDB =D9
25264  42000       75X     JSX .WS4
25265   1676    77676A     LDA V16 ILEDS
25266  52000    16170R     AND =B611
25267  72003              RZA A1444
25270   1733    77733A     LDA V20 FSTIM
25271 172005              SAP A1443
25272                    A1444 EQU *
25272   1703    77703A     LDA V21 STRIG
25273   6000     1456R     LDB =D12
25274  42000       72X     JSX .WS6
25275  66000    25312R     JMP A1445
25276                    A1443 EQU *
25276   6000     2276R     LDB =D2
25277  42000      175X     JSX .RS6
25300  31567    77567A     STA V32631   KEYCOL
25301  42000      176X     JSX .R7
25302  31573    77573A     STA V32635   I
25303 170507               SAR 8
25304  72406              SZA A1446
25305   1573    77573A     LDA V32635   I
25306  52000     2066R     AND =B177770
25307  62000     2107R     IOR =D3
25310  31573    77573A     STA V32635   I
25311  66000    25333R     JMP L1430 RLOOP
25312                    A1446 EQU *
25312                    A1445 EQU *
25312   2000     1704R     LDA =D6
25313   6000     2107R     LDB =D3
25314  42000       75X     JSX .WS4
25315                    L192  EQU * WLOOP
25315   2000     1463R     LDA =D0
25316  31575    77575A     STA V32637   K
25317   2000     1277R     LDA =B177777
25320  31566    77566A     STA V32630   KEYCODE
25321                    A1447 EQU *
25321  76302              SHS A1448
25322  66000    25321R     JMP A1447
25323                    A1448 EQU *
25323   2000     1770R     LDA =B20000
25324   6000     1456R     LDB =D12
25325  42000       72X     JSX .WS6
25326   6000     2276R     LDB =D2
25327  42000      175X     JSX .RS6
25330  31567    77567A     STA V32631   KEYCOL
25331  42000      176X     JSX .R7
25332  31573    77573A     STA V32635   I
25333                    L1430 EQU * RLOOP
25333   2000     2405R     LDA =D5
25334   6000     2107R     LDB =D3
25335  42000       75X     JSX .WS4
25336   1573    77573A     LDA V32635   I
25337  52000     2406R     AND =D7
25340  22000     1457R     ADA =D1
25341  66000    25706R     JMP A1449
25342                    C1450 EQU *
25342   6000     2221R     LDB =D9
25343  42000       74X     JSX .RS5
25344  31567    77567A     STA V32631   KEYCOL
25345   6000     2203R     LDB =D8
25346  42000       74X     JSX .RS5
25347  31567    77567A     STA V32631   KEYCOL
25350  52000     6353R     AND =B7777
25351  31567    77567A     STA V32631   KEYCOL
25352  22000     1277R     ADA =D-1
25353  11721    77721A     CPA V25 MRKR
25354  66000    25356R     JMP *+2
25355  66000    25361R     JMP A1451
25356   2000     2276R     LDA =D2
25357  31575    77575A     STA V32637   K
25360  66000    25414R     JMP A1452
25361                    A1451 EQU *
25361   5730    77730A     LDB V30 KFLAG
25362 174614               SBL 13
25363   2000     6352R     LDA =D3072
25364 176402              SBM A1454
25365   2000     1463R     LDA =D0
25366                    A1454 EQU *
25366  22000     3112R     ADA =D1001
25367 170040               TCA
25370  21567    77567A     ADA V32631   KEYCOL
25371 170040               TCA
25372 172004              SAP A1453
25373   2000     2107R     LDA =D3
25374  31575    77575A     STA V32637   K
25375  66000    25414R     JMP A1455
25376                    A1453 EQU *
25376   1721    77721A     LDA V25 MRKR
25377  12000     3166R     CPA =D1023
25400  66000    25405R     JMP A1457
25401   1567    77567A     LDA V32631   KEYCOL
25402 170040               TCA
```

```
25403   21721  77721A    ADA V25 MRKR
25404  172010            SAP A1456
25405                   A1457 EQU *
25405    5730  77730A    LDB V30 KFLAG
25406  174614            SBL 13
25407    2000   6350R    LDA =D4073
25410  176402            SBM A1458
25411    2000   3112R    LDA =D1001
25412                   A1458 EQU *
25412    6000   2221R    LDB =D9
25413   42000     72X    JSX .WS6
25414                   A1456 EQU *
25414                   A1455 EQU *
25414                   A1452 EQU *
25414   66000  25707R    JMP A1459
25415                   C1460 EQU *
25415    2000   1457R    LDA =D1
25416   42000    103X    JSX .W4
25417    2000   2107R    LDA =D3
25420   31575  77575A    STA V32637  K
25421    1573  77573A    LDA V32635  I
25422  170613            SAL 12
25423  172004            SAP A1461
25424    2000  25255R    LDA =D28
25425   42000   2223R    JSM P274  NBLK
25426   66000  25431R    JMP A1462
25427                   A1461 EQU *
25427    2000  25255R    LDA =D28
25430   42000   2434R    JSM P285  BLKOF
25431                   A1462 EQU *
25431   66000  25707R    JMP A1459
25432                   C1463 EQU *
25432    2000   2276R    LDA =D2
25433   42000    103X    JSX .W4
25434    1567  77567A    LDA V32631   KEYCOL
25435  170140            CMA
25436   42000    104X    JSX .TURN
25437           4534R    DEF =B40000
25440          77616A    DEF V32654   XFLAG
25441   31616  77616A    STA V32654   XFLAG
25442  170600            SAL 1
25443  172014            SAP A1464
25444    1740  77740A    LDA V32736   EFLAG
25445  170606            SAL 7
25446  172405            SAM A1466
25447    1620  77620A    LDA V32656   PREFIX
25450   12000  10243R    CPA =D27
25451   66000  25453R    JMP *+2
25452   66000  25455R    JMP A1465
25453                   A1466 EQU *
25453    2000  15026R    LDA =B7760
25454   66000  25456R    JMP A1467
25455                   A1465 EQU *
25455    2000   6514R    LDA =B77777
25456                   A1467 EQU *
25456   66000  25462R    JMP A1468
25457                   A1464 EQU *
25457    1576  77576A    LDA V32638   RPGPTR
25460  170040            TCA
25461   52000   5517R    AND =B100000
25462                   A1468 EQU *
25462   31565  77565A    STA V32629   SKQEN
25463    2000  15672R    LDA =B140
25464   42000  15546R    JSM P214  KEY
25465   66000  25707R    JMP A1459
25466                   C1469 EQU *
25466    2000   1457R    LDA =D1
25467   31575  77575A    STA V32637   K
25470    1573  77573A    LDA V32635   I
25471  170507            SAR 8
25472   31573  77573A    STA V32635   I
25473    2000   1463R    LDA =D0
25474   31431  77431A    STA V32537   RPGSWP
25475    5567  77567A    LDB V32631   KEYCOL
25476  174606            SBL 7
25477    2000   1457R    LDA =D1
25500  176402            SBM A1470
25501    2000   1277R    LDA =B177777
25502                   A1470 EQU *
25502   31574  77574A    STA V32636   RPG
25503    5573  77573A    LDB V32635   I
25504   75617            MPY
25505   21564  77564A    ADA V32628   RPGCNT
25506   31564  77564A    STA V32628   RPGCNT
25507    2000   2107R    LDA =D3
25510   42000    103X    JSX .W4
25511   66000  25707R    JMP A1459
25512                   C1471 EQU *
25512    2000   1463R    LDA =D0
25513   31474  77474A    STA V42 KL
25514                   A1472 EQU *
25514    2000   3242R    LDA =B377
25515   31567  77567A    STA V32631   KEYCOL
25516    2000   1463R    LDA =D0
25517                   A1474 EQU *
25517   31573  77573A    STA V32635   I
25520   22000   7243R    ADA =D-12
25521  172021            SAP A1473
25522    1567  77567A    LDA V32631   KEYCOL
25523   12000   3242R    CPA =B377
```

```
25524  66000  25526R       JMP *+2
25525  66000  25542R       JMP A1473
25526   2000   2110R       LDA =B177776
25527   5573  77573A       LDB V32635   I
25530  42000    177X       JSX .RLFT
25531   6000   2276R       LDB =D2
25532  42000    107X       JSX .WS5
25533  42000    137X       JSX .R6
25534  31567  77567A       STA V32631   KEYCOL
25535  52000   3242R       AND =B377
25536  31567  77567A       STA V32631   KEYCOL
25537   2000   1457R       LDA =D1
25540  21573  77573A       ADA V32635   I
25541  66000  25517R       JMP A1474
25542                A1473 EQU *
25542   2000  25621R       LDA =B177242
25543  70540               PWC A
25544   2000   1457R       LDA =D1
25545                A1475 EQU *
25545  31572  77572A       STA V32634   J
25546  42000    137X       JSX .R6
25547  31566  77566A       STA V32630   KEYCODE
25550  52000   3242R       AND =B377
25551  11567  77567A       CPA V32631   KEYCOL
25552  66000  25555R       JMP A1476
25553   2000   3242R       LDA =B377
25554  31567  77567A       STA V32631   KEYCOL
25555                A1476 EQU *
25555   2000   1457R       LDA =D1
25556  21572  77572A       ADA V32634   J
25557 144016     16A       ISZ C,I
25560  66000  25545R       JMP A1475
25561  54016     16A       DSZ C
25562  45474  77474A       ISZ V42 KL
25563                      NOP
25564   1474  77474A       LDA V42 KL
25565 170040               TCA
25566  22000   2107R       ADA =D3
25567 172404              SAM A1477
25570   1567  77567A       LDA V32631   KEYCOL
25571  12000   3242R       CPA =B377
25572  66000  25514R       JMP A1472
25573                A1477 EQU *
25573   2000   1277R       LDA =B177777
25574  31566  77566A       STA V32630   KEYCODE
25575   1565  77565A       LDA V32629   SRGEN
25576  42000    105X       JSX .W5
25577   1567  77567A       LDA V32631   KEYCOL
25600  12000   3242R       CPA =B377
25601  66000  25631R       JMP A1478
25602   1730  77730A       LDA V30 KFLAG
25603  52000   6512R       AND =B177677
25604  31730  77730A       STA V30 KFLAG
25605   2000   1463R       LDA =D0
25606  31572  77572A       STA V32634   J
25607                A1479 EQU *
25607   1572  77572A       LDA V32634   J
25610  22000   1375R       ADA =D-9
25611 172011              SAP A1480
25612   1567  77567A       LDA V32631   KEYCOL
25613   5572  77572A       LDB V32634   J
25614  42000    101X       JSX .IBIT
25615 172005              SAP A1480
25616  45572  77572A       ISZ V32634   J
25617                      NOP
25620  66000  25607R       JMP A1479
25621 177242
25621                     LII
25622                A1480 EQU *
25622   1573  77573A       LDA V32635   I
25623  22000   2107R       ADA =D3
25624 170602               SAL 3
25625  61572  77572A       IOR V32634   J
25626  31566  77566A       STA V32630   KEYCODE
25627   2000   2405R       LDA =D5
25630  31575  77575A       STA V32637   K
25631                A1478 EQU *
25631   2000   2411R       LDA =D4
25632  42000   3214R       JSM P332  WAIT
25633   2000   2107R       LDA =D3
25634   6000   2107R       LDB =D3
25635  42000     75X       JSX .WS4
25636   2000   2411R       LDA =D4
25637  42000    103X       JSX .W4
25640  66000  25707R       JMP A1459
25641                C1481 EQU *
25641   2000   2405R       LDA =D5
25642  31575  77575A       STA V32637   K
25643                L1482 EQU * HLOOP
25643   6000   2411R       LDB =D4
25644  42000     74X       JSX .RS5
25645  31566  77566A       STA V32630   KEYCODE
25646  52000   3242R       AND =B377
25647  31566  77566A       STA V32630   KEYCODE
25650  42000  24670R       JSM P1427 NUMKEY
25651 172015              SAP A1483
25652   1601  77601A       LDA V32641   HPBC
25653  42000    106X       JSX .W7
25654  42000  15471R       JSM P976  NUMBER
25655                A1484 EQU *
```

```
25655  76302              SHS A1485
25656  66000   25655R     JMP A1484
25657                   A1485 EQU *
25657   6000    2276R     LDB =D2
25660  42000     110X     JSX .RS7
25661  31573   77573A     STA V32635   I
25662  52000    2406R     AND =D7
25663  12000    1704R     CPA =D6
25664  66000   25643R     JMP L1482 HLOOP
25665  66000   25315R     JMP L192  WLOOP
25666                   A1483 EQU *
25666   1601   77601A     LDA V32641   HPBC
25667  62000    1770R     IOR =B20000
25670  31601   77601A     STA V32641   HPBC
25671  66000   25707R     JMP A1459
25672                   C1486 EQU *
25672   2000    2411R     LDA =D4
25673  31575   77575A     STA V32637   K
25674  66000   25707R     JMP A1459
25675          25672R     DEF C1486
25676          25641R     DEF C1481
25677          25707R     DEF A1459
25700          25512R     DEF C1471
25701          25466R     DEF C1469
25702          25432R     DEF C1463
25703          25415R     DEF C1460
25704          25342R     DEF C1450
25705                     DEC -9
25706  42000     143X   A1449 JSX .CASE
25707                   A1459 EQU *
25707                   L191  EQU * SLOOP
25707   1575   77575A     LDA V32637   K
25710  66000   32431R     JMP A1487
25711                   C1488 EQU *
25711   1564   77564A     LDA V32628   RPGCNT
25712  42000     122X     JSX CNV42
25713  42000      36X     JSX .SAR2
25714   1605   77605A     LDA V32645   SCANSL
25715  72005              RZA A1489
25716  42000    2070R     JSM P261   IFBW
25717  22000    2110R     ADA =D-2
25720  42000    4420R     JSM P407   EXP3
25721  66000   25730R     JMP A1490
25722                   A1489 EQU *
25722  42000      37X     JSX .LDBI
25723          77671A     DEF V9  SPAN
25724  42000      62X     JSX CNV21
25725  42000      41X     JSX MPY1
25726          26246R     DEF =F.005
25727  42000      65X     JSX CNV12
25730                   A1490 EQU *
25730  42000     157X     JSX MPY2T
25731  42000      34X     JSX .STRD
25732          77651A     DEF V32681   LTEMP
25733   1576   77576A     LDA V32638   RPGPTR
25734  66000   26275R     JMP A1491
25735                   C1492 EQU *
25735   1564   77564A     LDA V32628   RPGCNT
25736 172002              SAP *+2
25737 170040              TCA
25740 170040              TCA
25741  22000    2301R     ADA =D19
25742 172013              SAP A1493
25743   2000    2565R     LDA =D11
25744  70540              PWC A
25745  42000    2070R     JSM P261   IFBW
25746  22000    2110R     ADA =D-2
25747  21574   77574A     ADA V32636   RPG
25750  42000    2132R     JSM P265   LIMIT
25751  22000    2276R     ADA =D2
25752  42000    4210R     JSM P392   IFBWOUT
25753  42000    7775R     JSM P603   CSCANBW
25754  42000    6723R     JSM P538   CSBLK
25755                   A1493 EQU *
25755  66000   26276R     JMP A1494
25756                   C1495 EQU *
25756   1564   77564A     LDA V32628   RPGCNT
25757 172002              SAP *+2
25760 170040              TCA
25761 170040              TCA
25762  22000    2301R     ADA =D19
25763 172010              SAP A1496
25764   2000    2172R     LDA =D13
25765  70540              PWC A
25766  42000    2111R     JSM P263   VBW
25767  21574   77574A     ADA V32636   RPG
25770  42000    2132R     JSM P265   LIMIT
25771  42000    4314R     JSM P400   VBWOUT
25772  42000    7775R     JSM P603   CSCANBW
25773                   A1496 EQU *
25773  66000   26276R     JMP A1494
25774                   C1497 EQU *
25774   1564   77564A     LDA V32628   RPGCNT
25775 172002              SAP *+2
25776 170040              TCA
25777 170040              TCA
26000  22000    2301R     ADA =D19
26001 172402              SAM *+2
26002  66000   26041R     JMP A1498
26003   1733   77733A     LDA V20 FSTIM
```

```
26004 172012          SAP A1499
26005   2000   2172R   LDA =D13
26006  70540           PWC A
26007   1731  77731A   LDA V18 SINDEX
26010  22000   1277R   ADA =D-1
26011  21574  77574A   ADA V32636  RPG
26012  42000   2132R   JSM P265  LIMIT
26013  22000   1457R   ADA =D1
26014  42000   4411R   JSM P406  EXP2
26015  66000  26037R   JMP A1500
26016                 A1499 EQU *
26016   1605  77605A   LDA V32645  SCANSL
26017  72010          RZA A1501
26020   2000   2205R   LDA =D32
26021  70540           PWC A
26022   1731  77731A   LDA V18 SINDEX
26023  21574  77574A   ADA V32636  RPG
26024  42000   2132R   JSM P265  LIMIT
26025  22000   5520R   ADA =D24
26026  66000  26036R   JMP A1502
26027                 A1501 EQU *
26027   2000   2416R   LDA =D29
26030  70540           PWC A
26031   1731  77731A   LDA V18 SINDEX
26032  22000   1301R   ADA =D-3
26033  21574  77574A   ADA V32636  RPG
26034  42000   2132R   JSM P265  LIMIT
26035  22000  10243R   ADA =D27
26036                 A1502 EQU *
26036  42000   4356R   JSM P403  EXPSIX
26037                 A1500 EQU *
26037  42000   7345R   JSM P558  SCANT
26040  42000   7775R   JSM P603  CSCANBW
26041                 A1498 EQU *
26041  66000  26276R   JMP A1494
26042                 C1503 EQU *
26042   1564  77564A   LDA V32628  RPGCNT
26043 172002           SAP *+2
26044 170040           TCA
26045 170040           TCA
26046  22000   2301R   ADA =D19
26047 172020          SAP A1504
26050   2000   1704R   LDA =D6
26051  70540           PWC A
26052   1677  77677A   LDA V17 RFAT
26053  52000   2406R   AND =D7
26054  21574  77574A   ADA V32636  RPG
26055  22000   1277R   ADA =D-1
26056  42000   2132R   JSM P265  LIMIT
26057  22000   1457R   ADA =D1
26060  42000    104X   JSX .TURN
26061          2406R   DEF =D7
26062         77677A   DEF V17 RFAT
26063  31677  77677A   STA V17 RFAT
26064   1700  77700A   LDA V22 RLVL
26065  42000   3530R   JSM P355  REFLEV
26066  42000   3255R   JSM P337  WRFAT
26067                 A1504 EQU *
26067  66000  26276R   JMP A1494
26070                 C1505 EQU *
26070  42000   4430R   JSM P408  LGSCL
26071  70540           PWC A
26072   2000   2204R   LDA =D10
26073  42000    200X   JSX DIV4T
26074  70540           PWC A
26075   1564  77564A   LDA V32628  RPGCNT
26076 172002           SAP *+2
26077 170040           TCA
26100  42000    116X   JSX SUB41
26101 172412          SAM A1506
26102  42000   4430R   JSM P408  LGSCL
26103   5564  77564A   LDB V32628  RPGCNT
26104  75617           MPY
26105  42000    113X   JSX DIV4
26106          2204R   DEF =D10
26107  21700  77700A   ADA V22 RLVL
26110  42000   3530R   JSM P355  REFLEV
26111   2000   1463R   LDA =D0
26112  31564  77564A   STA V32628  RPGCNT
26113                 A1506 EQU *
26113  66000  26276R   JMP A1494
26114                 C1507 EQU *
26114   1564  77564A   LDA V32628  RPGCNT
26115 172002           SAP *+2
26116 170040           TCA
26117 170040           TCA
26120  22000   2301R   ADA =D19
26121 172017          SAP A1508
26122   2000   2107R   LDA =D3
26123  70540           PWC A
26124   1435  77435A   LDA V32541  IF1
26125 170514           SAR 13
26126  52000   2107R   AND =D3
26127 170040           TCA
26130  21574  77574A   ADA V32636  RPG
26131 170040           TCA
26132  42000   2132R   JSM P265  LIMIT
26133  62000   2411R   IOR =D4
26134 170614           SAL 13
26135  42000   4171R   JSM P390  LGDB
```

```
26136    1730   77730A      LDA V30 KFLAG
26137   42000   15050R      JSM P223  AMPU
26140                 A1508 EQU *
26140   66000   26276R      JMP A1494
26141                 C1509 EQU *
26141   42000   12250R      JSM P729  STEPF
26142   66000   26276R      JMP A1494
26143                 C1510 EQU *
26143   42000     156X      JSX .CLBI
26144           11304R      DEF =F1699999900
26145   42000     150X      JSX ADD2
26146           77671A      DEF V9  SPAN
26147   42000     201X      JSX SUB3
26150           11310R      DEF =H100
26151   42000    2043R      JSM P256  DLIMIT
26152   42000     163X      JSX ADD3
26153           11310R      DEF =H100
26154   42000   11120R      JSM P668  SPANW
26155   66000   26276R      JMP A1494
26156                 C1511 EQU *
26156   42000   12224R      JSM P728  STEPL
26157   66000   26276R      JMP A1494
26160                 C1512 EQU *
26160   42000   12200R      JSM P727  STEPH
26161   66000   26276R      JMP A1494
26162                 C1513 EQU *
26162   42000      37X      JSX .LDBI
26163           77713A      DEF V7  FSTEP
26164   42000     202X      JSX .DSGN
26165  170416               AAR 15
26166  170600               SAL 1
26167   22000    1457R      ADA =D1
26170   31572   77572A      STA V32634  J
26171   42000     156X      JSX .CLBI
26172           11137R      DEF D674  1700000000
26173    4020      20A      LDB AR2
26174   77202               SLB *+2,C
26175   34020      20A      STB AR2
26176   42000     150X      JSX ADD2
26177           77651A      DEF V32681  LTEMP
26200   42000    2043R      JSM P256  DLIMIT
26201   42000      36X      JSX .SAR2
26202    1572   77572A      LDA V32634  J
26203   42000     122X      JSX CNV42
26204   42000     157X      JSX MPY2I
26205   42000      34X      JSX .STRD
26206           77713A      DEF V7  FSTEP
26207   66000   26276R      JMP A1494
26210                 C1514 EQU *
26210    1615   77615A      LDA V32653  DAC1
26211   21564   77564A      ADA V32628  RPGCNT
26212   42000    3114R      JSM P326  WDACS
26213   66000   26276R      JMP A1494
26214                 C1515 EQU *
26214    1704   77704A      LDA V33 LEVLIN
26215   21564   77564A      ADA V32628  RPGCNT
26216   42000   11072R      JSM P667  WLVLN
26217   66000   26276R      JMP A1494
26220                 C1516 EQU *
26220    1705   77705A      LDA V32 THRESH
26221   21564   77564A      ADA V32628  RPGCNT
26222   42000   11044R      JSM P666  WTHRSH
26223   66000   26276R      JMP A1494
26224                 C1517 EQU *
26224    1564   77564A      LDA V32628  RPGCNT
26225  172002               SAP *+2
26226  170040               TCA
26227  170040               TCA
26230   22000    2204R      ADA =D10
26231  172011             SAP A1518
26232    1564   77564A      LDA V32628  RPGCNT
26233  172002               SAP *+2
26234  170040               TCA
26235    5564   77564A      LDB V32628  RPGCNT
26236   75617               MPY
26237   42000     113X      JSX DIV4
26240            2203R      DEF =D6
26241   31564   77564A      STA V32628  RPGCNT
26242                 A1518 EQU *
26242    1721   77721A      LDA V25 MRKR
26243   21564   77564A      ADA V32628  RPGCNT
26244   42000   11010R      JSM P663  SIMRKR
26245   66000   26276R      JMP A1494
26246    .005
26246                        LIT
26252           26224R       DEF C1517
26253           26276R       DEF A1494
26254           26276R       DEF A1494
26255           26220R       DEF C1516
26256           26214R       DEF C1515
26257           26210R       DEF C1514
26260           26276R       DEF A1494
26261           26162R       DEF C1513
26262           26160R       DEF C1512
26263           26156R       DEF C1511
26264           26143R       DEF C1510
26265           26141R       DEF C1509
26266           26114R       DEF C1507
26267           26070R       DEF C1505
26270           26042R       DEF C1503
```

```
26271          25774R      DEF C1497
26272          25756R      DEF C1495
26273          25735R      DEF C1492
26274                      DEC -19
26275  42000     143X A1491 JSX .CASE
26276               A1494 EQU *
26276   1576   77576A      LDA V32638  RPGPTR
26277  22000   13136R      ADA =D-11
26300 172002               SAP A1519
26301  42000    2762R      JSM P314  AVGRST
26302               A1519 EQU *
26302  42000   12334R      JSM P217  MBLK
26303   1576   77576A      LDA V32638  RPGPTR
26304 170040               TCA
26305  22000    1704R      ADA =D6
26306 172407               SAM A1521
26307   1564   77564A      LDA V32628  RPGCNT
26310 172002               SAP *+2
26311 170040               TCA
26312 170040               TCA
26313  22000    2301R      ADA =D19
26314 172003               SAP A1520
26315               A1521 EQU *
26315   2000    1463R      LDA =D0
26316  31564   77564A      STA V32628  RPGCNT
26317               A1520 EQU *
26317  66000   32432R      JMP A1522
26320               C1523 EQU *
26320   1723   77723A      LDA V26 MKRMODE
26321  72002               RZA *+2
26322  66000   26645R      JMP A1524
26323  42000   10413R      JSM P636  MKRON
26324   1616   77616A      LDA V32654  XFLAG
26325  62000    2203R      IOR =B10
26326  31616   77616A      STA V32654  XFLAG
26327   1675   77675A      LDA V15 BLEDS
26330 170601               SAL 2
26331 172402               SAM *+2
26332  66000   26570R      JMP A1525
26333   2000    2411R      LDA =D4
26334  42000    3214R      JSM P332  WAIT
26335   1571   77571A      LDA V32633  L
26336  70540               PWC A
26337   1570   77570A      LDA V32632  M
26340  70540               PWC A
26341   1746   77746A      LDA V32742  N
26342  70540               PWC A
26343  42000    5033R      JSM P443  CPERIOD
26344 170040               TCA
26345  22000    2276R      ADA =D2
26346 172013               SAP A1526
26347   1576   77576A      LDA V32638  RPGPTR
26350  22000   13136R      ADA =D-11
26351 172010               SAP A1526
26352   1565   77565A      LDA V32629  SRGEN
26353  52000    6514R      AND =B77777
26354   6000    2276R      LDB =D2
26355  42000     107X      JSX .WS5
26356   2000    2107R      LDA =D3
26357   6000    2107R      LDB =D3
26360  42000      75X      JSX .WS4
26361               A1526 EQU *
26361   1616   77616A      LDA V32654  XFLAG
26362 170612               SAL 11
26363 172402               SAM *+2
26364  66000   26435R      JMP A1527
26365   2000    2203R      LDA =D8
26366  70540               PWC A
26367   1721   77721A      LDA V25 MRKR
26370  22000   10523R      ADA =D-501
26371  42000     122X      JSX CNV42
26372  42000     153X      JSX MPY2
26373          77671A      DEF V9  SPAN
26374  42000      26X      JSM P213  ROUND
26375   6000    2107R      LDB =D3
26376  42000      47X      JSX .DRGT
26377  42000     150X      JSX ADD2
26400          77665A      DEF V6  CFREQ
26401  42000    6016R      JSM P500  STONE
26402   2000    2411R      LDA =D4
26403  42000    3214R      JSM P332  WAIT
26404   2000    1457R      LDA =D1
26405  42000    5117R      JSM P450  COUNTIF
26406  42000      34X      JSX .STRD
26407          77661A      DEF V32689  LTEMP1
26410   2000    2276R      LDA =D2
26411  42000    6704R      JSM P537  CPILOT
26412  42000      34X      JSX .STRD
26413          77631A      DEF V32665  FPILOT
26414   2000    1457R      LDA =D1
26415  42000    5117R      JSM P450  COUNTIF
26416  42000     150X      JSX ADD2
26417          77661A      DEF V32689  LTEMP1
26420  42000     146X      JSX DIV3
26421           2276R      DEF =D2
26422  42000      36X      JSX .SAR2
26423   2000    2107R      LDA =D3
26424  42000    5117R      JSM P450  COUNTIF
26425  42000     146X      JSX DIV3
26426           2405R      DEF =D5
```

```
26427   42000     130X     JSX ADD2T
26430   42000     140X     JSX MIN2
26431           77631A     DEF V32665   FPILOT
26432   42000      34X     JSX .STRD
26433           77631A     DEF V32665   FPILOT
26434   66000   26506R     JMP A1528
26435                    A1527 EQU *
26435    1730   77730A     LDA V30 KFLAG
26436  170605              SAL 6
26437  172014             SAP A1529
26440    1577   77577A     LDA V32639   CTBASE
26441   12000    1704R     CPA =D6
26442   66000   26444R     JMP *+2
26443   66000   26453R     JMP A1529
26444    2000    2107R     LDA =D3
26445   42000    5117R     JSM P450   COUNTIF
26446    2000    2107R     LDA =D3
26447   42000    5117R     JSM P450   COUNTIF
26450   42000      34X     JSX .STRD
26451           77631A     DEF V32665   FPILOT
26452   66000   26456R     JMP A1530
26453                    A1529 EQU *
26453   42000    5545R     JSM P480   VTOSLEW
26454   42000      34X     JSX .STRD
26455           77631A     DEF V32665   FPILOT
26456                    A1530 EQU *
26456    2000    1457R     LDA =D1
26457   42000    5117R     JSM P450   COUNTIF
26460   42000      34X     JSX .STRD
26461           77661A     DEF V32689   LTEMP1
26462    1604   77604A     LDA V32644   SATN
26463  170600              SAL 1
26464  172004             SAP A1531
26465   42000      53X     JSX .LDSI
26466            2205R     DEF =H20
26467   66000   26472R     JMP A1532
26470                    A1531 EQU *
26470   42000      53X     JSX .LDSI
26471            3654R     DEF =H10
26472                    A1532 EQU *
26472   42000      36X     JSX .SAR2
26473    2000    2107R     LDA =D3
26474   42000    5117R     JSM P450   COUNTIF
26475   42000     150X     JSX ADD2
26476           77631A     DEF V32665   FPILOT
26477   42000     164X     JSX DIV2T
26500   42000     150X     JSX ADD2
26501           77661A     DEF V32689   LTEMP1
26502   42000     140X     JSX MIN2
26503           11133R     DEF D673   20000000
26504   42000      34X     JSX .STRD
26505           77631A     DEF V32665   FPILOT
26506                    A1528 EQU *
26506    1570   77570A     LDA V32632   M
26507  170040              TCA
26510   22000    2521R     ADA =D17
26511  170603              SAL 4
26512   21571   77571A     ADA V32633   L
26513   42000     122X     JSX CNV42
26514   42000     153X     JSX MPY2
26515            6123R     DEF =F250000
26516   42000      36X     JSX .SAR2
26517   42000      53X     JSX .LDSI
26520           77746A     DEF V32742   N
26521   42000     153X     JSX MPY2
26522           11133R     DEF D673   20000000
26523   42000     124X     JSX SUB2T
26524   42000     150X     JSX ADD2
26525           77631A     DEF V32665   FPILOT
26526   42000     150X     JSX ADD2
26527           77707A     DEF V11 FOFSET
26530   42000      34X     JSX .STRD
26531           77645A     DEF V32677   MFREQ
26532   70760              WWC A
26533   31746   77746A     STA V32742   N
26534   70760              WWC A
26535   31570   77570A     STA V32632   M
26536   70760              WWC A
26537   31571   77571A     STA V32633   L
26540   42000    2154R     JSM P269   WSPIN
26541   42000   10312R     JSM P218   MKREL
26542  172007             SAP A1533
26543   42000      37X     JSX .LDBI
26544           77724A     DEF V10 AMF
26545   42000     140X     JSX MIN2
26546           77645A     DEF V32677   MFREQ
26547   42000      34X     JSX .STRD
26550           77645A     DEF V32677   MFREQ
26551                    A1533 EQU *
26551    1426   77426A     LDA V32534   UFLAG
26552   52000    6512R     AND =B177677
26553   31426   77426A     STA V32534   UFLAG
26554    1723   77723A     LDA V26 MKRMODE
26555   42000    2422R     JSM P284   BLKAD
26556    6000   26644R     LDB =B177160
26557   25722   77722A     ADB V29 MKRLVL
26560    2000    2521R     LDA =B21
26561  176402             SBM A1534
26562    2000    1463R     LDA =D0
26563                    A1534 EQU *
```

```
26563  42000     73X    JSX .W6
26564   2000   7570R    LDA =D1040
26565  70540            PWC A
26566   1723  77723A    LDA V26 MKRMODE
26567  42000   2522R    JSM P297  RJUST
26570                 A1525 EQU *
26570   1740  77740A    LDA V32736  EFLAG
26571  52000   2107R    AND =D3
26572  72417           SZA A1535
26573   1740  77740A    LDA V32736  EFLAG
26574  52000   2107R    AND =D3
26575  42000   5117R    JSM P450  COUNTIF
26576  42000     34X    JSX .STRD
26577         77625A    DEF V32661  CSIGNL
26600   1576  77576A    LDA V32638  RPGPTR
26601  12000   7565R    CPA =D16
26602  66000  26604R    JMP *+2
26603  66000  26611R    JMP A1536
26604   1740  77740A    LDA V32736  EFLAG
26605  52000   2107R    AND =D3
26606  22000  12734R    ADA =D35
26607  31620  77620A    STA V32656  PREFIX
26610  42000  13777R    JSM P865  DSPITEM
26611                 A1536 EQU *
26611                 A1535 EQU *
26611  42000  10301R    JSM P624  MKRACT
26612   1616  77616A    LDA V32654  XFLAG
26613  52000   1375R    AND =B177767
26614  31616  77616A    STA V32654  XFLAG
26615 170601            SAL 2
26616 172006           SAP A1537
26617   1616  77616A    LDA V32654  XFLAG
26620 170605            SAL 6
26621 172403           SAM A1537
26622   2000   1770R    LDA =B20000
26623  31703  77703A    STA V21 STRIG
26624                 A1537 EQU *
26624   1740  77740A    LDA V32736  EFLAG
26625 170602            SAL 3
26626 172007           SAP A1538
26627   1601  77601A    LDA V32641  HPBC
26630  62000   1770R    IOR =B20000
26631  31601  77601A    STA V32641  HPBC
26632   1740  77740A    LDA V32736  EFLAG
26633  52000   6371R    AND =B167777
26634  31740  77740A    STA V32736  EFLAG
26635                 A1538 EQU *
26635   1721  77721A    LDA V25 MRKR
26636  12000   3112R    CPA =D1001
26637  66000  26641R    JMP *+2
26640  66000  26645R    JMP A1539
26641   2000   2107R    LDA =D3
26642  31575  77575A    STA V32637  R
26643  66000  25707R    JMP L191  SLOOP
26644 177160
26644                   LIT
26645                 A1539 EQU *
26645                 A1524 EQU *
26645  66000  32432R    JMP A1522
26646                 C1540 EQU *
26646  66000  26762R    JMP A1541
26647                 P1542 EQU * PEAK
26647   6000   1277R    LDB =D-1
26650  42000     27X    JSX .ARGA
26651  44016     16A    ISZ C
26652  21721  77721A    ADA V25 MRKR
26653 170040            TCA
26654  22000   1457R    ADA =D1
26655 172402            SAM *+2
26656  66000  26757R    JMP A1543
26657   1721  77721A    LDA V25 MRKR
26660   6000   1301R    LDB =D-3  D
26661  42000    115X    JSX ADD4P
26662  22000  26755R    ADA =D-1000
26663 172402            SAM *+2
26664  66000  26757R    JMP A1543
26665   1721  77721A    LDA V25 MRKR
26666   6000   1301R    LDB =D-3  D
26667  42000    115X    JSX ADD4P
26670  22000   1277R    ADA =D-1
26671  70540            PWC A
26672   5730  77730A    LDB V30 KFLAG
26673 174614            SBL 13
26674   2000   6352R    LDA =D3072
26675 176410           SBM A1544
26676   1702  77702A    LDA V24 VIDCON
26677  52000   2406R    AND =D7
26700   4000            LDB A
26701   2000  20430R    LDA =B32
26702  42000    101X    JSX .TBIT
26703 170504            SAR 5
26704  52000   6703R    AND =D1024
26705                 A1544 EQU *
26705  42000     57X    JSX ADD4T
26706   6000   2203R    LDB =D8
26707  42000     75X    JSX .WS4
26710  42000    162X    JSX .R5
26711  31473  77473A    STA V41 KR
26712  42000    162X    JSX .R5
26713  31475  77475A    STA V43 KR
```

```
26714  42000    162X   JSX .R5
26715  31476  77476A   STA V44 KN
26716   1475  77475A   LDA V43 KM
26717 170604           SAL 5
26720 170404           AAR 5
26721  31475  77475A   STA V43 KM
26722   1722  77722A   LDA V29 MKRLVL
26723  22000  26756R   ADA =D-50
26724 170040           TCA
26725  21475  77475A   ADA V43 KM
26726 170040           TCA
26727 172022          SAP A1545
26730   1473  77473A   LDA V41 KK
26731 170604           SAL 5
26732 170404           AAR 5
26733 170040           TCA
26734  21475  77475A   ADA V43 KM
26735 172414          SAM A1545
26736   1476  77476A   LDA V44 KN
26737 170604           SAL 5
26740 170404           AAR 5
26741 170040           TCA
26742  21475  77475A   ADA V43 KM
26743 172406          SAM A1545
26744   1475  77475A   LDA V43 KM
26745 170040           TCA
26746 172003          SAP A1545
26747   2000   1277R   LDA =D-1
26750  66000  26752R   JMP A1546
26751                 A1545 EQU *
26751 170517           CLA
26752                 A1546 EQU *
26752   6000   2107R   LDB =D3 PEAK
26753  42000     67X   JSX .STAP
26754  66000  26761R   JMP A1547
26755 176030
26756 177716
26755                  LIT
26757                 A1543 EQU *
26757 170517           CLA
26760  66000     31X   JMX .RTNA
26761                 A1547 EQU *
26761  66000     70X   JMX .RTNI
26762                 A1541 EQU *
26762   1740  77740A   LDA V32736   EFLAG
26763 170610           SAL 9
26764 172002           SAP *+2
26765  66000  27431R   JMP A1548
26766   1610  77610A   LDA V32648   ALIM
26767  70540           PWC A
26770   1607  77607A   LDA V32647   ACNT
26771  22000   1457R   ADA =D1
26772  42000   2132R   JSM P265   LIMIT
26773  31607  77607A   STA V32647   ACNT
26774   1730  77730A   LDA V30 KFLAG
26775 170614           SAL 13
26776 172402           SAM *+2
26777  66000  27043R   JMP A1549
27000   1676  77676A   LDA V16 ILEDS
27001 170610           SAL 9
27002 172002          SAP A1550
27003  42000      6X   JSM P197   VDSUB
27004                 A1550 EQU *
27004   1676  77676A   LDA V16 ILEDS
27005 170507           SAR 8
27006  52000   1457R   AND =D1
27007  70540           PWC A
27010   1610  77610A   LDA V32648   ALIM
27011  70540           PWC A
27012   1607  77607A   LDA V32647   ACNT
27013  22000   1277R   ADA =D-1
27014  42000   2132R   JSM P265   LIMIT
27015  22000   1457R   ADA =D1
27016  42000      5X   JSM P196   VDAVG
27017   1607  77607A   LDA V32647   ACNT
27020 170040           TCA
27021 172005          SAP A1551
27022   1426  77426A   LDA V32534   UFLAG
27023  52000  16173R   AND =B177733
27024  62000   2205R   IOR =B40
27025  31426  77426A   STA V32534   UFLAG
27026                 A1551 EQU *
27026   2000   2205R   LDA =D32
27027  42000   2223R   JSM P274   NBLK
27030  42000   2173R   JSM P271   CRLF
27031   2000   1463R   LDA =D0
27032  70540           PWC A
27033   2000   2405R   LDA =D5
27034  70540           PWC A
27035   1607  77607A   LDA V32647   ACNT
27036  42000    122X   JSX CNV42
27037  42000  13062R   JSM P793   NDUMP
27040   2000   2421R   LDA =D146
27041  42000     73X   JSX .W6
27042  66000  27045R   JMP A1552
27043                 A1549 EQU *
27043   2000   2205R   LDA =D32
27044  42000   2434R   JSM P285   BLKUF
27045                 A1552 EQU *
27045   1607  77607A   LDA V32647   ACNT
```

```
27046  22000    1277R       ADA =D-1
27047 172011               SAP A1554
27050   1616   77616A       LDA V32654  XFLAG
27051 170605                SAL 6
27052 172002                SAP *+2
27053  66000   27367R       JMP A1553
27054   1675   77675A       LDA V15 BLEDS
27055 170600                SAL 1
27056 172002                SAP *+2
27057  66000   27367R       JMP A1553
27060                     A1554 EQU *
27060   1675   77675A       LDA V15 BLEDS
27061 170600                SAL 1
27062 172402                SAM *+2
27063  66000   27252R       JMP A1555
27064   1702   77702A       LDA V24 VIDCON
27065  52000    2406R       AND =D7
27066   4000                LDB A
27067   2000   27101R       LDA =B253
27070  42000     101X       JSX .IBIT
27071 172402                SAM *+2
27072  66000   27252R       JMP A1555
27073   1721   77721A       LDA V25 MRKR
27074  12000   10522R       CPA =D501
27075  66000   27102R       JMP A1559
27076   2000    1463R       LDA =D0
27077  31607   77607A       STA V32647  ACNT
27100  66000   27206R       JMP L1557 ENDIT
27101    253
27101                      LIT
27102                     A1559 EQU *
27102                     L1556 EQU * SEARCH
27102   2000   20422R       LDA =B176027
27103  70540                PWC A
27104   2000    1463R       LDA =D0
27105                     A1560 EQU *
27105  31573   77573A       STA V32635  I
27106  42000   26647R       JSM P1542 PEAK
27107 172032               SAP A1561
27110   1475   77475A       LDA V43 KM
27111  31572   77572A       STA V32634  J
27112   1573   77573A       LDA V32635  I
27113 170040                TCA
27114  42000   26647R       JSM P1542 PEAK
27115   1475   77475A       LDA V43 KM
27116 170040                TCA
27117  21572   77572A       ADA V32634  J
27120 172410               SAM A1562
27121   1721   77721A       LDA V25 MRKR
27122  21573   77573A       ADA V32635  I
27123  31721   77721A       STA V25 MRKR
27124   6000    1277R       LDB =B177777
27125  24016      16A       ADB C
27126  34016      16A       STB C
27127  66000   27206R       JMP L1557 ENDIT
27130                     A1562 EQU *
27130   1573   77573A       LDA V32635  I
27131 170040                TCA
27132  21721   77721A       ADA V25 MRKR
27133  31721   77721A       STA V25 MRKR
27134   6000    1277R       LDB =B177777
27135  24016      16A       ADB C
27136  34016      16A       STB C
27137  66000   27102R       JMP L1556 SEARCH
27140                     A1563 EQU *
27140  66000   27143R       JMP A1564
27141                     A1561 EQU *
27141   1475   77475A       LDA V43 KM
27142  31572   77572A       STA V32634  J
27143                     A1564 EQU *
27143   1573   77573A       LDA V32635  I
27144 170040                TCA
27145  42000   26647R       JSM P1542 PEAK
27146 172024               SAP A1565
27147   1572   77572A       LDA V32634  J
27150 170040                TCA
27151  21475   77475A       ADA V43 KM
27152 172411               SAM A1566
27153   1573   77573A       LDA V32635  I
27154 170040                TCA
27155  21721   77721A       ADA V25 MRKR
27156  31721   77721A       STA V25 MRKR
27157   6000    1277R       LDB =B177777
27160  24016      16A       ADB C
27161  34016      16A       STB C
27162  66000   27206R       JMP L1557 ENDIT
27163                     A1566 EQU *
27163   1721   77721A       LDA V25 MRKR
27164  21573   77573A       ADA V32635  I
27165  31721   77721A       STA V25 MRKR
27166   6000    1277R       LDB =B177777
27167  24016      16A       ADB C
27170  34016      16A       STB C
27171  66000   27102R       JMP L1556 SEARCH
27172                     A1567 EQU *
27172                     A1565 EQU *
27172   2000    1457R       LDA =D1
27173  21573   77573A       ADA V32635  I
27174 144016      16A       ISZ C,I
27175  66000   27105R       JMP A1560
```

```
27176  54016     16A     DSZ C
27177   1722  77722A     LDA V29 MKRLVL
27200  42000    113X     JSX DIV4
27201          2204R     DEF =D10
27202 170040             TCA
27203  21722  77722A     ADA V29 MKRLVL
27204  31722  77722A     STA V29 MKRLVL
27205  66000  27240R     JMP L1558 NOSIGNL
27206                  L1557 EQU * FNDIT
27206   1675  77675A     LDA V15 BLEDS
27207 170601             SAL 2
27210 172403             SAM A1568
27211  42000  10413R     JSM P636  MKRON
27212  42000  10301R     JSM P624  MKRACT
27213                  A1568 EQU *
27213   2000   1463R     LDA =D0
27214  31575  77575A     STA V32637  K
27215  42000     37X     JSX .LDBI
27216         77665A     DEF V8  CFREQ
27217  42000    140X     JSX MIN2
27220         77645A     DEF V32677  MFREQ
27221  42000     36X     JSX .SAR2
27222  42000  10312R     JSM P218  MKREL
27223 172004             SAP A1569
27224  42000     37X     JSX .LDBI
27225         77724A     DEF V10 AMF
27226  66000  27231R     JMP A1570
27227                  A1569 EQU *
27227  42000     53X     JSX .LDSI
27230          1463R     DEF =D0
27231                  A1570 EQU *
27231  42000    130X     JSX ADD2T
27232  42000  11464R     JSM P701  STEPD
27233   2000   2107R     LDA =D3
27234  31575  77575A     STA V32637  K
27235  42000   6723R     JSM P538  CSBLK
27236   2000  10522R     LDA =D501
27237  31721  77721A     STA V25 MRKR
27240                  L1558 EQU * NOSIGNL
27240   1620  77620A     LDA V32656  PREFIX
27241  22000   1457R     ADA =D1
27242  52000   1363R     AND =B177774
27243  22000   2066R     ADA =B177770
27244  72005             RZA A1571
27245   1616  77616A     LDA V32654  XFLAG
27246 170602             SAL 3
27247 172002             SAP A1571
27250  42000   2551R     JSM P298  ABLK
27251                  A1571 EQU *
27251  66000  27260R     JMP A1572
27252                  A1555 EQU *
27252   1723  77723A     LDA V26 MKRMODE
27253  72405             SZA A1573
27254  42000   6127R     JSM P501  MKIS
27255 172403             SAM A1573
27256  42000  10413R     JSM P636  MKRON
27257  42000  10301R     JSM P624  MKRACT
27260                  A1573 EQU *
27260                  A1572 EQU *
27260   1616  77616A     LDA V32654  XFLAG
27261 170605             SAL 6
27262 172402             SAM *+2
27263  66000  27336R     JMP A1574
27264   2000   1463R     LDA =D0
27265  31575  77575A     STA V32637  K
27266  31607  77607A     STA V32647  ACNT
27267  42000     37X     JSX .LDBI
27270         77671A     DEF V9  SPAN
27271  42000   7327R     JSM P556  LOG2
27272  22000   2110R     ADA =D-2
27273  42000   4411R     JSM P406  EXP2
27274  42000     34X     JSX .STRD
27275         77661A     DEF V32689  LTEMP1
27276  42000     37X     JSX .LDBI
27277         77651A     DEF V32681  LTEMP
27300  42000    140X     JSX MIN2
27301         77671A     DEF V9  SPAN
27302  42000     52X     JSX .DEQL
27303 172014             SAP A1575
27304  42000   2551R     JSM P298  ABLK
27305   1616  77616A     LDA V32654  XFLAG
27306 170600             SAL 1
27307 172403             SAM A1576
27310   2000   5517R     LDA =B100000
27311  31565  77565A     STA V32629  SRQEN
27312                  A1576 EQU *
27312   1616  77616A     LDA V32654  XFLAG
27313  52000  15350R     AND =B176777
27314  31616  77616A     STA V32654  XFLAG
27315  42000   7775R     JSM P603  CSCANBW
27316  66000  27336R     JMP A1577
27317                  A1575 EQU *
27317   2000   1463R     LDA =D0
27320  31575  77575A     STA V32637  K
27321  31607  77607A     STA V32647  ACNT
27322  42000     37X     JSX .LDBI
27323         77661A     DEF V32689  LTEMP1
27324  42000    140X     JSX MIN2
27325         77651A     DEF V32681  LTEMP
27326   4020     20A     LDB AR2
```

```
27327  77004              SLB A1578
27330  42000      37X      JSX .LDBI
27331          77661A      DEF V32689  LTEMP1
27332  66000  27335R      JMP A1579
27333                    A1578 EQU *
27333  42000      37X      JSX .LDBI
27334          77651A      DEF V32681  LTEMP
27335                    A1579 EQU *
27335  42000  11120R      JSM P668  SPANW
27336                    A1577 EQU *
27336                    A1574 EQU *
27336   1616  77616A      LDA V32654   XFLAG
27337 170605              SAL 6
27340 172427              SAM A1580
27341   1610  77610A      LDA V32648   ALIM
27342 170040              TCA
27343  21607  77607A      ADA V32647   ACNT
27344 172004              SAP A1581
27345   1730  77730A      LDA V30 KFLAG
27346 170614              SAL 13
27347 172420              SAM A1580
27350                    A1581 EQU *
27350   1740  77740A      LDA V32736   EFLAG
27351 170605              SAL 6
27352 172004              SAP A1582
27353   2000   2205R      LDA =B40
27354   6000   2411R      LDB =D4
27355  42000    112X      JSX .WS7
27356                    A1582 EQU *
27356   1740  77740A      LDA V32736   EFLAG
27357 170603              SAL 4
27360 172007              SAP A1583
27361   1601  77601A      LDA V32641   HPBC
27362  62000   1770R      IOR =B20000
27363  31601  77601A      STA V32641   HPBC
27364   1740  77740A      LDA V32736   EFLAG
27365  52000   7567R      AND =B177777
27366  31740  77740A      STA V32736   EFLAG
27367                    A1583 EQU *
27367                    A1580 EQU *
27367                    A1553 EQU *
27367   1431  77431A      LDA V32537   RPGSWP
27370  22000   1301R      ADA =D-3
27371 172003              SAP A1584
27372  45431  77431A      ISZ V32537   RPGSWP
27373                     NOP
27374                    A1584 EQU *
27374   1431  77431A      LDA V32537   RPGSWP
27375  12000   1457R      CPA =D1
27376  66000  27400R      JMP *+2
27377  66000  27431R      JMP A1585
27400   1576  77576A      LDA V32638   RPGPTR
27401  72430              SZA A1585
27402   1731  77731A      LDA V18 SINDEX
27403 170040              TCA
27404  22000   2221R      ADA =D9
27405 172005              SAP A1586
27406   2000   2107R      LDA =D3
27407   6000   2107R      LDB =D3
27410  42000     75X      JSX .WS4
27411  66000  27431R      JMP A1587
27412                    A1586 EQU *
27412   6000   2276R      LDB =D2
27413  42000    175X      JSX .RS6
27414  31567  77567A      STA V32631   KEYCOL
27415  42000    176X      JSX .R7
27416  31573  77573A      STA V32635   I
27417 170507              SAR 8
27420  72411              SZA A1588
27421   1616  77616A      LDA V32654   XFLAG
27422  62000   1704R      IOR =D6
27423  31616  77616A      STA V32654   XFLAG
27424   1573  77573A      LDA V32635   I
27425  52000   2066R      AND =B177770
27426  62000   2107R      IOR =B3
27427  31573  77573A      STA V32635   I
27430  66000  25333R      JMP L1430 RLOOP
27431                    A1588 EQU *
27431                    A1587 EQU *
27431                    A1585 EQU *
27431                    A1548 EQU *
27431   1740  77740A      LDA V32736   EFLAG
27432  52000   6512R      AND =B177677
27433  31740  77740A      STA V32736   EFLAG
27434   1607  77607A      LDA V32647   ACNT
27435 170040              TCA
27436 172033              SAP A1589
27437   1676  77676A      LDA V16 TLEDS
27440  52000   6233R      AND =B600
27441  22000   6234R      ADA =B177200
27442  72013              RZA A1590
27443   1702  77702A      LDA V24 VIDCON
27444  52000   2406R      AND =D7
27445   6000   2107R      LDB =D3
27446  75617              MPY
27447  22000   1457R      ADA =D1
27450   4000              LDB A
27451   1426  77426A      LDA V32534   UFLAG
27452  42000    142X      JSX .RBIT
27453  31426  77426A      STA V32534   UFLAG
```

```
27454   66000   27471R    JMP A1591
27455                    A1590 EQU *
27455    1676   77676A    LDA V16 TLEDS
27456   52000    1704R    AND =D6
27457   72004             RZA A1592
27460    1426   77426A    LDA V32534  UFLAG
27461   52000    1301R    AND =B177775
27462   31426   77426A    STA V32534  UFLAG
27463                    A1592 EQU *
27463    1676   77676A    LDA V16 TLEDS
27464   52000    3231R    AND =B60
27465   72004             RZA A1593
27466    1426   77426A    LDA V32534  UFLAG
27467   52000    2067R    AND =B177757
27470   31426   77426A    STA V32534  UFLAG
27471                    A1593 EQU *
27471                    A1591 EQU *
27471                    A1589 EQU *
27471    1600   77600A    LDA V32640  CTIM
27472  170040             TCA
27473   22000    2406R    ADA =D7
27474  172013             SAP A1594
27475    1576   77576A    LDA V32638  RPGPTR
27476   22000   13136R    ADA =D-11
27477  172010             SAP A1594
27500    1565   77565A    LDA V32629  SRQEN
27501   52000    6514R    AND =B77777
27502    6000    2276R    LDB =D2
27503   42000     107X    JSX .WS5
27504    2000    2107R    LDA =D3
27505    6000    2107R    LDB =D3
27506   42000      75X    JSX .WS4
27507                    A1594 EQU *
27507   76705             SHC A1595
27510    1616   77616A    LDA V32654  XFLAG
27511   62000    1704R    IOR =D6
27512   31616   77616A    STA V32654  XFLAG
27513   66000   32476R    JMP L193  RESET
27514                    A1595 EQU *
27514    1616   77616A    LDA V32654  XFLAG
27515  170604             SAL 5
27516  172402             SAM *+2
27517   66000   27736R    JMP A1596
27520    2000   27725R    LDA =D2880
27521    6000    2203R    LDB =D8
27522   42000      75X    JSX .WS4
27523    2000   24136R    LDA =B2022
27524   42000      73X    JSX .W6
27525    2000    3654R    LDA =D16
27526   42000      73X    JSX .W6
27527    2000    2646R    LDA =D3008
27530   42000      73X    JSX .W6
27531    2000   16201R    LDA =B2001
27532   42000      73X    JSX .W6
27533    2000    1463R    LDA =D0
27534   70540             PWC A
27535    2000    2411R    LDA =D4
27536   70540             PWC A
27537    1615   77615A    LDA V32653  DAC1
27540   42000     122X    JSX CNV42
27541   42000   13062R    JSM P793  NDUMP
27542   42000    2173R    JSM P271  CRLF
27543    2000    1463R    LDA =D0
27544   70540             PWC A
27545    2000    2411R    LDA =D4
27546   70540             PWC A
27547    1614   77614A    LDA V32652  DAC2
27550   42000     122X    JSX CNV42
27551   42000   13062R    JSM P793  NDUMP
27552   42000    2173R    JSM P271  CRLF
27553    2000    1463R    LDA =D0
27554   70540             PWC A
27555    2000    2411R    LDA =D4
27556   70540             PWC A
27557    1613   77613A    LDA V32651  DAC4
27560   42000     122X    JSX CNV42
27561   42000   13062R    JSM P793  NDUMP
27562   42000    2206R    JSM P272  SPACE
27563    2000    1463R    LDA =D0
27564   70540             PWC A
27565    2000    2107R    LDA =D3
27566   70540             PWC A
27567   42000    5764R    JSM P495  FRQC
27570   42000     150X    JSX ADD2
27571           77665A    DEF V8  CFREQ
27572   42000      36X    JSX .SAR2
27573    1603   77603A    LDA V32643  PLOCK
27574  170604             SAL 5
27575  172004             SAP A1597
27576   42000      53X    JSX .LDS1
27577            1463R    DEF =D0
27600   66000   27603R    JMP A1598
27601                    A1597 EQU *
27601   42000      37X    JSX .LDB1
27602           27726R    DEF =F5000000
27603                    A1598 EQU *
27603   42000     130X    JSX ADD2T
27604   42000     151X    JSX DIV2
27605            7237R    DEF =F1700000
27606   42000      36X    JSX .SAR2
```

```
27607    1613   77613A     LDA V32651  DAC4
27610   42000     122X     JSX CNV42
27611   42000     124X     JSX SUB2I
27612   42000   13062R     JSM P793   NDUMP
27613   42000    2173R     JSM P271   CRLF
27614    2000    1463R     LDA =D0
27615   70540              PWC A
27616    2000    2411R     LDA =D4
27617   70540              PWC A
27620   42000      53X     JSX .LDSI
27621           77746A     DEF V32742   N
27622   42000   13062R     JSM P793   NDUMP
27623   42000    2206R     JSM P272   SPACE
27624    2000    1463R     LDA =D0
27625   70540              PWC A
27626    2000    2411R     LDA =D4
27627   70540              PWC A
27630    1570   77570A     LDA V32632   M
27631   52000    2406R     AND =D7
27632   42000     122X     JSX CNV42
27633   42000   13062R     JSM P793   NDUMP
27634   42000    2206R     JSM P272   SPACE
27635    2000    1463R     LDA =D0
27636   70540              PWC A
27637    2000    2411R     LDA =D4
27640   70540              PWC A
27641    1571   77571A     LDA V32633   L
27642  170500              SAR 1
27643   42000     122X     JSX CNV42
27644   42000   13062R     JSM P793   NDUMP
27645   42000    2206R     JSM P272   SPACE
27646    1603   77603A     LDA V32643   PLOCK
27647  170511              SAR 10
27650  170140              CMA
27651   52000    1457R     AND =D1
27652   62000    3231R     IOR =B60
27653   42000      73X     JSX .W6
27654   42000    2173R     JSM P271   CRLF
27655    1604   77604A     LDA V32644   SATN
27656  170600              SAL 1
27657  172004             SAP A1599
27660   42000      53X     JSX .LDSI
27661            3654R     DEF =H10
27662   66000   27665R     JMP A1600
27663                     A1599 EQU *
27663   42000      53X     JSX .LDSI
27664            2405R     DEF =D5
27665                     A1600 EQU *
27665   42000      36X     JSX .SAR2
27666   42000      37X     JSX .LDBI
27667           77641A     DEF V32673   V10FREQ
27670   42000     164X     JSX DIV2I
27671   42000      34X     JSX .STRD
27672           77661A     DEF V32689   LTEMP1
27673    2000    1463R     LDA =D0
27674   70540              PWC A
27675    2000    1456R     LDA =D12
27676   70540              PWC A
27677   42000   13062R     JSM P793   NDUMP
27700   42000    2173R     JSM P271   CRLF
27701    2000    1463R     LDA =D0
27702   70540              PWC A
27703    2000    1456R     LDA =D12
27704   70540              PWC A
27705    1570   77570A     LDA V32632   M
27706  170040              TCA
27707   22000    2521R     ADA =D17
27710  170603              SAL 4
27711   21571   77571A     ADA V32633   L
27712   42000     122X     JSX CNV42
27713   42000     153X     JSX MPY2
27714            6123R     DEF =F250000
27715   42000     150X     JSX ADD2
27716           77661A     DEF V32689   LTEMP1
27717   42000     140X     JSX MIN2
27720           27732R     DEF =F280000000
27721   42000   13062R     JSM P793   NDUMP
27722    2000    2500R     LDA =D147
27723   42000      73X     JSX .W6
27724   66000   27743R     JMP A1601
27725    5500
27726 5000000
27732 280000000
27725                      LIT
27736                     A1596 EQU *
27736    2000   27767R     LDA =D2884
27737    6000    2203R     LDB =D8
27740   42000      75X     JSX .WS4
27741    2000    2500R     LDA =D147
27742   42000      73X     JSX .W6
27743                     A1601 EQU *
27743    1676   77676A     LDA V16 TLEDS
27744  170604              SAL 5
27745  172023             SAP A1602
27746    1740   77740A     LDA V32736   EFLAG
27747  170602              SAL 3
27750  172420             SAM A1602
27751    1616   77616A     LDA V32654   XFLAG
27752  170605              SAL 6
27753  172415             SAM A1602
```

```
27754   1730   77730A    LDA V30 KFLAG
27755 170614              SAL 13
27756 172005             SAP A1603
27757   1610   77610A    LDA V32648  ALIM
27760 170040              TCA
27761  21607   77607A    ADA V32647  ACNT
27762 172406             SAM A1602
27763                   A1603 EQU *
27763  42000    2650R    JSM P304  UNCAL
27764   2000    1770R    LDA =B20000
27765  31703   77703A    STA V21 STRIG
27766  66000   27775R    JMP A1604
27767   5504
27767                    LIT
27770                   A1602 EQU *
27770   1616   77616A    LDA V32654  XFLAG
27771 170611              SAL 10
27772 172002             SAP A1605
27773  42000    7671R    JSM P595  YIGSHFT
27774                   A1605 EQU *
27774  42000   15224R    JSM P221  TRIGR
27775                   A1604 EQU *
27775  66000   32432R    JMP A1522
27776                   C1606 EQU *
27776  42000    5357R    JSM P466  NOLOCK
27777  66000   32432R    JMP A1522
30000                   C1607 EQU *
30000   1566   77566A    LDA V32630  KEYCODE
30001  42000   15546R    JSM P214  KEY
30002   1616   77616A    LDA V32654  XFLAG
30003  73402              RLA *+2
30004  66000   30247R    JMP A1608
30005   1601   77601A    LDA V32641  HPBC
30006 170601              SAL 2
30007 172403             SAM A1609
30010   2000    2406R    LDA =D7
30011  42000   24635R    JSM P220  SAVEM
30012                   A1609 EQU *
30012   2000    1457R    LDA =D1
30013  31575   77575A    STA V32637  K
30014   1574   77574A    LDA V32636  RPG
30015   6000    3312R    LDB =D100
30016  75617              MPY
30017  31564   77564A    STA V32628  RPGCNT
30020   1574   77574A    LDA V32636  RPG
30021  42000     122X    JSX CNV42
30022  42000      36X    JSX .SAR2
30023   1605   77605A    LDA V32645  SCANSL
30024  72004             RZA A1610
30025  42000    2070R    JSM P261  IFBW
30026  42000    4420R    JSM P407  EXP3
30027  66000   30034R    JMP A1611
30030                   A1610 EQU *
30030  42000      37X    JSX .LDB1
30031          77671A    DEF V9  SPAN
30032   6000    1457R    LDB =D1
30033  42000      47X    JSX .DRGT
30034                   A1611 EQU *
30034  42000     157X    JSX MPY21
30035  42000      34X    JSX .STRD
30036          77651A    DEF V32681  LTEMP
30037   1576   77576A    LDA V32638  RPGPTR
30040  66000   30236R    JMP A1612
30041                   C1613 EQU *
30041   5435   77435A    LDB V32541  IF1
30042   2000    2204R    LDA =D10
30043 176004             SBP A1614
30044  42000    4430R    JSM P408  LGSCL
30045   6000    2204R    LDB =D10
30046  75617              MPY
30047                   A1614 EQU *
30047   5574   77574A    LDB V32636  RPG
30050  75617              MPY
30051  21700   77700A    ADA V22 RLVL
30052  42000    3530R    JSM P355  REFLEV
30053  66000   30237R    JMP A1615
30054                   C1616 EQU *
30054   1675   77675A    LDA V15 BLEDS
30055 170604              SAL 5
30056 172027             SAP A1617
30057   1574   77574A    LDA V32636  RPG
30060  42000     122X    JSX CNV42
30061  42000     153X    JSX MPY2
30062          77713A    DEF V7  FSTEP
30063  42000     150X    JSX ADD2
30064          77665A    DEF V8  CFREQ
30065  42000     145X    JSX SUB2
30066          77707A    DEF V11 FOFSET
30067  42000      34X    JSX .STRD
30070          77651A    DEF V32681  LTEMP
30071   1651   77651A    LDA V32681  LTEMP
30072  73412             RLA A1618
30073  42000     140X    JSX MIN2
30074           7220R    DEF =F1739100000
30075   4020      20A    LDB AR2
30076  77406             RLB A1618
30077   1574   77574A    LDA V32636  RPG
30100  42000     122X    JSX CNV42
30101  42000     153X    JSX MPY2
30102          77713A    DEF V7  FSTEP
```

```
30103  42000   12250R      JSM P729   STEPF
30104                A1618 EQU *
30104  66000   30106R      JMP A1619
30105                A1617 EQU *
30105  42000   12250R      JSM P729   STEPF
30106                A1619 EQU *
30106  66000   30237R      JMP A1615
30107                C1620 EQU *
30107  42000      37X      JSX .LDBI
30110          77671A      DEF V9  SPAN
30111  42000     163X      JSX ADD3
30112           1457R      DEF =D1
30113  42000    7327R      JSM P556   LOG2
30114  21574   77574A      ADA V32636   RPG
30115  42000    4411R      JSM P406   EXP2
30116  42000   11120R      JSM P668   SPANW
30117  66000   30237R      JMP A1615
30120                C1621 EQU *
30120  42000   12224R      JSM P726   STEPL
30121  66000   30237R      JMP A1615
30122                C1622 EQU *
30122  42000   12200R      JSM P727   STEPH
30123  66000   30237R      JMP A1615
30124                C1623 EQU *
30124  42000      37X      JSX .LDBI
30125          77713A      DEF V7   FSTEP
30126  42000     202X      JSX .DSGN
30127 170416               AAR 15
30130 170600               SAL 1
30131  22000    1457R      ADA =D1
30132  31572   77572A      STA V32634   J
30133   2000    2416R      LDA =D29
30134  70540               PWC A
30135  42000    7327R      JSM P556   LOG2
30136  21574   77574A      ADA V32636   RPG
30137  42000    2132R      JSM P265   LIMIT
30140  42000    4411R      JSM P406   EXP2
30141  42000      36X      JSX .SAR2
30142   1572   77572A      LDA V32634   J
30143  42000     122X      JSX CNV42
30144  42000     157X      JSX MPY2T
30145  42000      34X      JSX .STRD
30146          77713A      DEF V7   FSTEP
30147  66000   30237R      JMP A1615
30150                C1624 EQU *
30150   1574   77574A      LDA V32636   RPG
30151 172004               SAP A1625
30152   1615   77615A      LDA V32653   DAC1
30153 170400               AAR 1
30154  66000   30162R      JMP A1626
30155                A1625 EQU *
30155   5615   77615A      LDB V32653   DAC1
30156   2000    1457R      LDA =D1
30157  76403               SZB A1627
30160   1615   77615A      LDA V32653   DAC1
30161 170600               SAL 1
30162                A1627 EQU *
30162                A1626 EQU *
30162  42000    3114R      JSM P326   WDACS
30163  66000   30237R      JMP A1615
30164                C1628 EQU *
30164   1723   77723A      LDA V26 MKRMODE
30165  42000     121X      JSX MOD4
30166           2107R      DEF =D3
30167  12000    2276R      CPA =D2
30170  66000   30172R      JMP *+2
30171  66000   30207R      JMP A1629
30172  42000      37X      JSX .LDBI
30173          77645A      DEF V32677   MFREQ
30174  42000    6750R      JSM P222   TUNE
30175  42000    2762R      JSM P314   AVGRST
30176   2000   10522R      LDA =D501
30177  42000   11010R      JSM P663   STMKKR
30200  42000      37X      JSX .LDBI
30201          77671A      DEF V9   SPAN
30202  42000    7327R      JSM P556   LOG2
30203  21574   77574A      ADA V32636   RPG
30204  42000    4411R      JSM P406   EXP2
30205  42000   11120R      JSM P668   SPANW
30206  66000   30212R      JMP A1630
30207                A1629 EQU *
30207   1721   77721A      LDA V25 MKKR
30210  21564   77564A      ADA V32628   RPGCNT
30211  42000   11010R      JSM P663   STMKKR
30212                A1630 EQU *
30212  66000   30237R      JMP A1615
30213          30164R      DEF C1628
30214          30237R      DEF A1615
30215          30237R      DEF A1615
30216          25707R      DEF L191    SLOOP
30217          25707R      DEF L191    SLOOP
30220          30150R      DEF C1624
30221          30237R      DEF A1615
30222          30124R      DEF C1623
30223          30122R      DEF C1622
30224          30120R      DEF C1621
30225          30107R      DEF C1620
30226          30054R      DEF C1616
30227          25707R      DEF L191    SLOOP
30230          30041R      DEF C1613
```

```
30231          25707R   DEF L191  SLOOP
30232          25707R   DEF L191  SLOOP
30233          25707R   DEF L191  SLOOP
30234          25707R   DEF L191  SLOOP
30235                   DEC -19
30236  42000     143X  A1612 JSX .CASE
30237                  A1615 EQU *
30237   1576   77576A   LDA V32638  RPGPTR
30240  72404            SZA A1631
30241  22000   13136R   ADA =D-11
30242 172002            SAP A1631
30243  42000    2762R   JSM P314  AVGRST
30244                  A1631 EQU *
30244   2000    1463R   LDA =D0
30245  31564   77564A   STA V32628  RPGCNT
30246  42000   12334R   JSM P217  MBLK
30247                  A1608 EQU *
30247   1616   77616A   LDA V32654  XFLAG
30250 172402            SAM *+2
30251  66000   32420R   JMP A1632
30252  66000   30456R   JMP A1634
30253                  P1635 EQU * LINLVL
30253 174517            CLB
30254  42000      56X   JSX .ARGS
30255  44016      16A   ISZ C
30256   1566   77566A   LDA V32630  KEYCODE
30257  22000   15701R   ADA =B-40
30260  42000     111X   JSX .EQL
30261  70540            PWC A
30262   1566   77566A   LDA V32630  KEYCODE
30263  22000   30302R   ADA =B-46
30264  42000     111X   JSX .EQL
30265  42000     136X   JSX .ORT
30266  70540            PWC A
30267   1730   77730A   LDA V30 KFLAG
30270 170515            SAR 14
30271  22000    1301R   ADA =D-3
30272  42000     111X   JSX .EQL
30273  70540            PWC A
30274   1566   77566A   LDA V32630  KEYCODE
30275  22000    1301R   ADA =D-3
30276  42000     111X   JSX .EQL
30277  42000     154X   JSX .ANDT
30300  42000     136X   JSX .ORT
30301  66000      31X   JMX .RTNA
30302 177732
30302                   LIT
30303                  P1636 EQU * DBLVL
30303 174517            CLB
30304  42000      56X   JSX .ARGS
30305  44016      16A   ISZ C
30306  42000   30253R   JSM P1635 LINLVL
30307 172005            SAP A1637
30310  42000      37X   JSX .LDBI
30311          77651A   DEF V32681  LTEMP
30312  42000    2001R   JSM P251  DBM
30313  66000   30316R   JMP A1638
30314                  A1637 EQU *
30314  42000      37X   JSX .LDBI
30315          77651A   DEF V32681  LTEMP
30316                  A1638 EQU *
30316  42000      50X   JSX CNV24
30317   6000    2107R   LDB =D3 DBLVL
30320  42000      67X   JSX .STAP
30321 172002            SAP *+2
30322 170040            TCA
30323 170040            TCA
30324  22000   30336R   ADA =D20000
30325 172010            SAP A1639
30326   6000    2107R   LDB =D3 DBLVL
30327  42000      30X   JSX .LDAP
30330 172003            SAP A1640
30331   2000   30337R   LDA =B130740
30332  66000   30334R   JMP A1641
30333                  A1640 EQU *
30333   2000   30336R   LDA =D20000
30334                  A1641 EQU *
30334  66000      31X   JMX .RTNA
30335                  A1639 EQU *
30335  66000      70X   JMX .RTN1
30336  47040
30337 130740
30336                   LIT
30340                  P1642 EQU * ADCLVL
30340 174517            CLB
30341  42000      56X   JSX .ARGS
30342  44016      16A   ISZ C
30343   1730   77730A   LDA V30 KFLAG
30344 170606            SAL 7
30345 172007            SAP A1643
30346  42000      37X   JSX .LDBI
30347          77651A   DEF V32681  LTEMP
30350  42000      50X   JSX CNV24
30351   6000    2107R   LDB =D3 ADCLVL
30352  42000      67X   JSX .STAP
30353  66000   30423R   JMP A1644
30354                  A1643 EQU *
30354   1435   77435A   LDA V32541  IF1
30355 172023            SAP A1645
30356   2000    3166R   LDA =D1023
```

```
30357  70540             PWC A
30360  42000     4430R   JSM P408  LGSCL
30361  42000      122X   JSX CNV42
30362  42000       36X   JSX .SAR2
30363  42000    30303P   JSM P1636 DBLVL
30364 170040             TCA
30365  21700    77700A   ADA V22 RLVL
30366  42000      122X   JSX CNV42
30367   2000     1463R   LDA =D0
30370  75541             MLY
30371  42000      164X   JSX DIV2I
30372  42000       50X   JSX CNV24
30373 170040             TCA
30374  22000     4470R   ADA =D1000
30375  42000     2132R   JSM P265  LIMIT
30376  42000       45X   JSX CNV41
30377  66000    30421R   JMP A1646
30400                   A1645 EQU *
30400   1700    77700A   LDA V22 RLVL
30401  42000      122X   JSX CNV42
30402  42000     1736R   JSM P248  NANOV
30403  42000       62X   JSX CNV21
30404  42000       36X   JSX .SAR2
30405  42000    30253R   JSM P1635 LINLVL
30406 172405             SAM A1647
30407  42000       37X   JSX .LDBI
30410           77651A   DEF V32681  LTEMP
30411  42000     1736R   JSM P248  NANOV
30412  66000    30415R   JMP A1648
30413                   A1647 EQU *
30413  42000       37X   JSX .LDBI
30414           77651A   DEF V32681  LTEMP
30415                   A1648 EQU *
30415  42000       62X   JSX CNV21
30416  42000       41X   JSX MPY1
30417           30424R   DEF =F1.0@3
30420  42000       42X   JSX DIV11
30421                   A1646 EQU *
30421  42000      203X   JSX CNV14
30422  66000       31X   JMX .RTNA
30423                   A1644 EQU *
30423  66000       70X   JMX .RTN1
30424  1.0@3
30424                    LIT
30430                   P1649 EQU * RBLK
30430   1706    77706A   LDA V31 ROFSET
30431  72004             RZA A1650
30432   2000     2407R   LDA =D34
30433  42000     2434R   JSM P285  BLKOF
30434  66000    30441R   JMP A1651
30435                   A1650 EQU *
30435   2000     2407R   LDA =D34
30436  42000     2223R   JSM P274  NBLK
30437   2000     2407R   LDA =D34
30440  42000     2314R   JSM P279  SBLK
30441                   A1651 EQU *
30441 170201             RET 1
30442                   P1652 EQU * FBLK
30442  42000       37X   JSX .LDBI
30443           77707A   DEF V11 FOFSET
30444  42000       52X   JSX .DEQL
30445 172004             SAP A1653
30446   2000    12734R   LDA =D35
30447  42000     2434R   JSM P285  BLKOF
30450  66000    30455R   JMP A1654
30451                   A1653 EQU *
30451   2000    12734R   LDA =D35
30452  42000     2223R   JSM P274  NBLK
30453   2000    12734R   LDA =D35
30454  42000     2314R   JSM P279  SBLK
30455                   A1654 EQU *
30455 170201             RET 1
30456                   A1634 EQU *
30456   1620    77620A   LDA V32656  PREFIX
30457 170500             SAR 1
30460  12000     1456R   CPA =D12
30461  66000    30467R   JMP A1655
30462   1601    77601A   LDA V32641  HPBC
30463 170601             SAL 2
30464 172403             SAM A1655
30465   2000     2406R   LDA =D7
30466  42000    24635R   JSM P220  SAVEM
30467                   A1655 EQU *
30467   1620    77620A   LDA V32656  PREFIX
30470  66000    31310R   JMP A1656
30471                   C1657 EQU *
30471   2000     2565R   LDA =D11
30472  70540             PWC A
30473  42000       37X   JSX .LDBI
30474           77651A   DEF V32681  LTEMP
30475  42000     7336R   JSM P557  LOG3
30476  22000     2110R   ADA =D-2
30477  42000     2132R   JSM P265  LIMIT
30500  22000     2276R   ADA =D2
30501  42000     4210R   JSM P392  IFBWOUT
30502  42000     7775R   JSM P603  CSCANBW
30503  42000     6723R   JSM P538  CSBLK
30504  66000    31311R   JMP A1658
30505                   C1659 EQU *
30505   2000     2172R   LDA =D13
```

```
30506  70540          PWC A
30507  42000     37X  JSX .LDBI
30510         77651A  DEF V32681  LTEMP
30511  42000   7336R  JSM P557  LOG3
30512  42000   2132R  JSM P265  LIMIT
30513  42000   4314R  JSM P400  VBWOUT
30514  42000   7775R  JSM P603  CSCANBW
30515  66000  31311R  JMP A1658
30516                C1660 EQU *
30516  42000     37X  JSX .LDBI
30517         77651A  DEF V32681  LTEMP
30520   4020     20A  LDB AR2
30521  77202          SLB *+2,C
30522  34020     20A  STB AR2
30523  42000   7345R  JSM P558  SCANT
30524  42000   7775R  JSM P603  CSCANBW
30525  66000  31311R  JMP A1658
30526                C1661 EQU *
30526   2000   2406R  LDA =D7
30527  70540          PWC A
30530  42000     37X  JSX .LDBI
30531         77651A  DEF V32681  LTEMP
30532   4020     20A  LDB AR2
30533  77202          SLB *+2,C
30534  34020     20A  STB AR2
30535  42000    163X  JSX ADD3
30536          2221R  DEF =D9
30537   6000   2204R  LDB =D10
30540  42000    132X  JSX .FDIG
30541  42000   2132R  JSM P265  LIMIT
30542  42000    104X  JSX .TURN
30543          2406R  DEF =D7
30544         77677A  DEF V17 RFAT
30545  31677  77677A  STA V17 RFAT
30546  42000   3255R  JSM P337  WRFAT
30547   1700  77700A  LDA V22 RLVL
30550  42000   3530R  JSM P355  REFLEV
30551  66000  31311R  JMP A1658
30552                C1662 EQU *
30552  42000  30303R  JSM P1636 DBLVL
30553  42000   3530R  JSM P355  REFLEV
30554  66000  31311R  JMP A1658
30555                C1663 EQU *
30555   2000   2411R  LDA =D4
30556  70540          PWC A
30557  42000     37X  JSX .LDBI
30560         77651A  DEF V32681  LTEMP
30561  42000   7327R  JSM P556  LOG2
30562  42000   2132R  JSM P265  LIMIT
30563 170040          TCA
30564  22000   2411R  ADA =D4
30565  62000   2411R  IOR =D4
30566 170614          SAL 13
30567  42000   4171R  JSM P390  LGDB
30570   1730  77730A  LDA V30 RFLAG
30571  42000  15050R  JSM P223  AMPU
30572  66000  31311R  JMP A1658
30573                C1664 EQU *
30573  42000     37X  JSX .LDBI
30574         77651A  DEF V32681  LTEMP
30575  42000   6750R  JSM P222  TUNE
30576  66000  31311R  JMP A1658
30577                C1665 EQU *
30577   1676  77676A  LDA V16 ILEDS
30600  52000   6233R  AND =B600
30601  72412         SZA A1667
30602   1675  77675A  LDA V15 BLEDS
30603 170600          SAL 1
30604 172007         SAP A1667
30605  42000     37X  JSX .LDBI
30606         77671A  DEF V9  SPAN
30607  42000    140X  JSX MIN2
30610         77651A  DEF V32681  LTEMP
30611   4020     20A  LDB AR2
30612  77405         RLB A1666
30613                A1667 EQU *
30613  42000     37X  JSX .LDBI
30614         77651A  DEF V32681  LTEMP
30615  42000  11120R  JSM P668  SPANW
30616  66000  30675R  JMP A1668
30617                A1666 EQU *
30617   1616  77616A  LDA V32654  XFLAG
30620  52000  30663R  AND =B176771
30621  62000   1300R  IOR =B1000
30622  31616  77616A  STA V32654  XFLAG
30623  42000     53X  JSX .LDSI
30624         11310R  DEF =H100
30625  42000    140X  JSX MIN2
30626         77651A  DEF V32681  LTEMP
30627   4020     20A  LDB AR2
30630  77005         SLB A1669
30631  42000     53X  JSX .LDSI
30632         11310R  DEF =H100
30633  42000     34X  JSX .STRD
30634         77651A  DEF V32681  LTEMP
30635                A1669 EQU *
30635   1616  77616A  LDA V32654  XFLAG
30636 170600          SAL 1
30637 172405         SAM A1670
30640   2000   6514R  LDA =B77777
```

```
30641  31565  77565A     STA V32629  SRQEN
30642   6000   2276R     LDB =D2
30643  42000    107X     JSX .*S5
30644                  A1670 EQU *
30644   1737  77737A     LDA V32735  BLKS
30645  21612  77612A     ADA V32650  NCHR
30646   6000   2203R     LDB =D8
30647  42000     75X     JSX .*S4
30650   6000   1704R     LDB =D6
30651  42000    100X     JSX .*STR
30652         30664R     DEF =" AUTO ZOOM "
30653   2000   2500R     LDA =D147
30654  42000     73X     JSX .*6
30655   1601  77601A     LDA V32641  HPBC
30656 170601             SAL 2
30657 172014            SAP A1671
30660   2000   2276R     LDA =D2
30661  42000  15546R     JSM P214  KEY
30662  66000  30674R     JMP A1672
30663 176771
30664 AUTO ZOOM
30663                    LIT
30673                  A1671 EQU *
30673  42000  15224R     JSM P221  TRIGR
30674                  A1672 EQU *
30674  66000  25205R     JMP L190  LOOP
30675                  A1668 EQU *
30675  66000  31311R     JMP A1658
30676                  C1673 EQU *
30676  42000     37X     JSX .LDBI
30677         77671A     DEF V9  SPAN
30700  42000    146X     JSX DIV3
30701          2276R     DEF =D2
30702  42000     34X     JSX .STRD
30703         77742A     DEF V32738  XL
30704  42000     37X     JSX .LDBI
30705         77651A     DEF V32681  LTEMP
30706  42000    150X     JSX ADD2
30707         77665A     DEF V8  CFREQ
30710  42000    150X     JSX ADD2
30711         77742A     DEF V32738  XL
30712  42000    146X     JSX DIV3
30713          2276R     DEF =D2
30714  42000    145X     JSX SUB2
30715         77707A     DEF V11 FOFSET
30716  42000     34X     JSX .STRD
30717         77655A     DEF V32685  LTEMP2
30720  42000     37X     JSX .LDBI
30721         77742A     DEF V32738  XL
30722  42000    150X     JSX ADD2
30723         77665A     DEF V8  CFREQ
30724  42000    145X     JSX SUB2
30725         77651A     DEF V32681  LTEMP
30726   4020     20A     LDB AR2
30727  77010            SLB A1674
30730  42000     53X     JSX .LDSI
30731          1463R     DEF =D0
30732  42000  11120R     JSM P668  SPAN*
30733  42000     37X     JSX .LDBI
30734         77651A     DEF V32681  LTEMP
30735  42000   6750R     JSM P222  TUNE
30736  66000  31021R     JMP A1675
30737                  A1674 EQU *
30737   1655  77655A     LDA V32685  LTEMP2
30740  73015            SLA A1676
30741  42000     37X     JSX .LDBI
30742         77707A     DEF V11 FOFSET
30743  42000   6750R     JSM P222  TUNE
30744  42000     37X     JSX .LDBI
30745         77651A     DEF V32681  LTEMP
30746   4020     20A     LDB AR2
30747  77202            SLB *+2,C
30750  34020     20A     STB AR2
30751  42000    126X     JSX MPY3
30752          2276R     DEF =D2
30753  42000  11120R     JSM P668  SPAN*
30754  66000  31021R     JMP A1677
30755                  A1676 EQU *
30755  42000     37X     JSX .LDBI
30756         77655A     DEF V32685  LTEMP2
30757  42000    140X     JSX MIN2
30760          7220R     DEF =F1739100000
30761   4020     20A     LDB AR2
30762  77021            SLB A1678
30763  42000     37X     JSX .LDBI
30764         77707A     DEF V11 FOFSET
30765  42000    150X     JSX ADD2
30766          7220R     DEF =F1739100000
30767  42000   6750R     JSM P222  TUNE
30770  42000     37X     JSX .LDBI
30771         77651A     DEF V32681  LTEMP
30772  42000    140X     JSX MIN2
30773         77665A     DEF V8  CFREQ
30774  42000    126X     JSX MPY3
30775          2276R     DEF =D2
30776   4020     20A     LDB AR2
30777  77202            SLB *+2,C
31000  34020     20A     STB AR2
31001  42000  11120R     JSM P668  SPAN*
31002  66000  31021R     JMP A1679
```

```
31003                       A1678 EQU *
31003   42000      37X        JSX .LDBI
31004            77665A       DEF V8  CFREQ
31005   42000     150X        JSX ADD2
31006            77742A       DEF V32738  XL
31007   42000     145X        JSX SUB2
31010            77651A       DEF V32681  LTEMP
31011   42000  11120R         JSM P668  SPANW
31012   42000      37X        JSX .LDBI
31013            77671A       DEF V9  SPAN
31014   42000     146X        JSX DIV3
31015             2276R       DEF =D2
31016   42000     150X        JSX ADD2
31017            77651A       DEF V32681  LTEMP
31020   42000   6750R         JSM P222  TUNE
31021                       A1679 EQU *
31021                       A1677 EQU *
31021                       A1675 EQU *
31021   66000  31311R         JMP A1658
31022                       C1680 EQU *
31022   42000      37X        JSX .LDBI
31023            77671A       DEF V9  SPAN
31024   42000     146X        JSX DIV3
31025             2276R       DEF =D2
31026   42000      34X        JSX .STRD
31027            77742A       DEF V32738  XL
31030   42000      37X        JSX .LDBI
31031            77651A       DEF V32681  LTEMP
31032   42000     150X        JSX ADD2
31033            77665A       DEF V8  CFREQ
31034   42000     145X        JSX SUB2
31035            77742A       DEF V32738  XL
31036   42000     146X        JSX DIV3
31037             2276R       DEF =D2
31040   42000     145X        JSX SUB2
31041            77707A       DEF V11 FOFSET
31042   42000      34X        JSX .STRD
31043            77655A       DEF V32685  LTEMP2
31044   42000      37X        JSX .LDBI
31045            77742A       DEF V32738  XL
31046   42000     140X        JSX MIN2
31047            77665A       DEF V8  CFREQ
31050   42000     140X        JSX MIN2
31051            77651A       DEF V32681  LTEMP
31052    4020      20A        LDB AR2
31053   77010                SLB A1681
31054   42000      53X        JSX .LDSI
31055             1463R       DEF =D0
31056   42000  11120R         JSM P668  SPANW
31057   42000      37X        JSX .LDBI
31060            77651A       DEF V32681  LTEMP
31061   42000   6750R         JSM P222  TUNE
31062   66000  31142R         JMP A1682
31063                       A1681 EQU *
31063   42000      37X        JSX .LDBI
31064            77655A       DEF V32685  LTEMP2
31065   42000     140X        JSX MIN2
31066             7220R       DEF =F1739100000
31067    4020      20A        LDB AR2
31070   77016                SLB A1683
31071   42000      37X        JSX .LDBI
31072            77707A       DEF V11 FOFSET
31073   42000     150X        JSX ADD2
31074             7220R       DEF =F1739100000
31075   42000   6750R         JSM P222  TUNE
31076   42000      37X        JSX .LDBI
31077            77665A       DEF V8  CFREQ
31100   42000     140X        JSX MIN2
31101            77651A       DEF V32681  LTEMP
31102   42000     126X        JSX MPY3
31103             2276R       DEF =D2
31104   42000  11120R         JSM P668  SPANW
31105   66000  31142R         JMP A1684
31106                       A1683 EQU *
31106    1655  77655A         LDA V32685  LTEMP2
31107   73015                SLA A1685
31110   42000      37X        JSX .LDBI
31111            77707A       DEF V11 FOFSET
31112   42000   6750R         JSM P222  TUNE
31113   42000      37X        JSX .LDBI
31114            77651A       DEF V32681  LTEMP
31115   42000     126X        JSX MPY3
31116             2276R       DEF =D2
31117    4020      20A        LDB AR2
31120   77202                 SLB *+2,C
31121   34020      20A        STB AR2
31122   42000  11120R         JSM P668  SPANW
31123   66000  31142R         JMP A1686
31124                       A1685 EQU *
31124   42000      37X        JSX .LDBI
31125            77651A       DEF V32681  LTEMP
31126   42000     150X        JSX ADD2
31127            77742A       DEF V32738  XL
31130   42000     145X        JSX SUB2
31131            77665A       DEF V8  CFREQ
31132   42000  11120R         JSM P668  SPANW
31133   42000      37X        JSX .LDBI
31134            77671A       DEF V9  SPAN
31135   42000     146X        JSX DIV3
31136             2276R       DEF =D2
```

```
31137   42000     140X    JSX MIN2
31140           77651A    DEF V32681  LTEMP
31141   42000    6750R    JSM P222  TUNE
31142                   A1686 EQU *
31142                   A1684 EQU *
31142                   A1682 EQU *
31142   66000   31311R    JMP A1658
31143                   C1687 EQU *
31143   42000      37X    JSX .LDBI
31144           77651A    DEF V32681  LTEMP
31145    4020      20A    LDB AR2
31146   77202             SLB *+2,C
31147   34020      20A    STB AR2
31150   42000     140X    JSX MIN2
31151           11137R    DEF D674   1700000000
31152    4020      20A    LDB AR2
31153   77013            SLB A1688
31154   42000      37X    JSX .LDBI
31155           77651A    DEF V32681  LTEMP
31156   42000     202X    JSX .DSGN
31157  170416             AAR 15
31160  170600             SAL 1
31161   22000    1457R    ADA =D1
31162   42000     122X    JSX CNV42
31163   42000     153X    JSX MPY2
31164           11137R    DEF D674   1700000000
31165   66000   31170R    JMP A1689
31166                   A1688 EQU *
31166   42000      37X    JSX .LDBI
31167           77651A    DEF V32681  LTEMP
31170                   A1689 EQU *
31170   42000      34X    JSX .STRD
31171           77713A    DEF V7  FSTEP
31172   66000   31311R    JMP A1658
31173                   C1690 EQU *
31173    1566   77566A    LDA V32630  KEYCODE
31174   12000    2107R    CPA =D3
31175   66000   31177R    JMP *+2
31176   66000   31204R    JMP A1691
31177   42000      37X    JSX .LDBI
31200           77651A    DEF V32681  LTEMP
31201   42000      50X    JSX CNV24
31202   42000    3114R    JSM P326  WDACS
31203   66000   31261R    JMP A1692
31204                   A1691 EQU *
31204    2000    3166R    LDA =D1023
31205   70540             PWC A
31206   42000      37X    JSX .LDBI
31207           77651A    DEF V32681  LTEMP
31210   42000      50X    JSX CNV24
31211   42000    2132R    JSM P265  LIMIT
31212   31573   77573A    STA V32635  I
31213    1566   77566A    LDA V32630  KEYCODE
31214   22000   10241R    ADA =D-29
31215   42000     113X    JSX DIV4
31216            2107R    DEF =D3
31217   66000   31260R    JMP A1693
31220                   C1694 EQU *
31220    1573   77573A    LDA V32635  I
31221   31615   77615A    STA V32653  DAC1
31222    1573   77573A    LDA V32635  I
31223    6000    1463R    LDB =D0
31224   42000      75X    JSX .WS4
31225   66000   31261R    JMP A1695
31226                   C1696 EQU *
31226    1573   77573A    LDA V32635  I
31227   31613   77613A    STA V32651  DAC4
31230    1573   77573A    LDA V32635  I
31231    6000    1463R    LDB =D0
31232   42000     112X    JSX .WS7
31233   66000   31261R    JMP A1695
31234                   C1697 EQU *
31234    1573   77573A    LDA V32635  I
31235   31614   77614A    STA V32652  DAC2
31236    1573   77573A    LDA V32635  I
31237    6000    1463R    LDB =D0
31240   42000     107X    JSX .WS5
31241   66000   31261R    JMP A1695
31242                   C1698 EQU *
31242    1573   77573A    LDA V32635  I
31243   42000     104X    JSX .TURN
31244            3166R    DEF =B1777
31245           77604A    DEF V32644  SATN
31246    6000    1457R    LDB =D1
31247   42000      75X    JSX .WS4
31250   66000   31261R    JMP A1695
31251           31242R    DEF C1698
31252           31261R    DEF A1695
31253           31261R    DEF A1695
31254           31234R    DEF C1697
31255           31226R    DEF C1696
31256           31220R    DEF C1694
31257                     DEC -7
31260   42000     143X  A1693 JSX .CASE
31261                   A1695 EQU *
31261                   A1692 EQU *
31261   66000   31311R    JMP A1658
31262                   C1699 EQU *
31262   42000   30340R    JSM P1642 ADCLVL
31263   42000   11072R    JSM P667  WLVLN
```

```
31264  66000  31311R     JMP A1658
31265                C1700 EQU *
31265  42000  30340R     JSM P1642  ADCLVL
31266  42000  11044R     JSM P666   WTHRSH
31267  66000  31311R     JMP A1658
31270         31265R     DEF C1700
31271         31262R     DEF C1699
31272         31173R     DEF C1690
31273         31311R     DEF A1658
31274         31143R     DEF C1687
31275         31022R     DEF C1680
31276         30676R     DEF C1673
31277         30577R     DEF C1665
31300         30573R     DEF C1664
31301         30555R     DEF C1663
31302         30552R     DEF C1662
31303         30526R     DEF C1661
31304         30516R     DEF C1660
31305         30505R     DEF C1659
31306         30471R     DEF C1657
31307                    DEC -16
31310  42000    143X A1656 JSX .CASE
31311                A1658 EQU *
31311   1620  77620A     LDA V32656  PREFIX
31312  22000  13136R     ADA =D-11
31313 172002            SAP A1701
31314  42000   2762R     JSM P314   AVGRST
31315                A1701 EQU *
31315   1576  77576A     LDA V32638  RPGPTR
31316  12000   7565R     CPA =D18
31317  66000  31321R     JMP *+2
31320  66000  31421R     JMP A1702
31321   1730  77730A     LDA V30 RFLAG
31322 170606             SAL 7
31323 172012            SAP A1703
31324  42000  10312R     JSM P218   MKREL
31325   5717  77717A     LDB V28 AMKR
31326  75617             MPY
31327  42000    122X     JSX CNV42
31330  42000    140X     JSX MIN2
31331         77651A     DEF V32681  LTEMP
31332  42000     50X     JSX CNV24
31333  42000  11010R     JSM P663   STMRKR
31334  66000  31421R     JMP A1704
31335                A1703 EQU *
31335   1605  77605A     LDA V32645  SCANSL
31336  72032            RZA A1705
31337  42000  10312R     JSM P218   MKREL
31340  70540             PWC A
31341   1717  77717A     LDA V28 AMKR
31342  22000   1277R     ADA =D-1
31343  42000    114X     JSX MPY4T
31344  42000     45X     JSX CNV41
31345  42000     36X     JSX .SAR2
31346   1731  77731A     LDA V18 SINDEX
31347  22000   1704R     ADA =D6
31350  42000   4356R     JSM P403   EXPSIX
31351  42000     62X     JSX CNV21
31352  42000     36X     JSX .SAR2
31353  42000     37X     JSX .LDB1
31354         77651A     DEF V32681  LTEMP
31355  42000     62X     JSX CNV21
31356  42000     42X     JSX DIV1T
31357  42000     36X     JSX .SAR2
31360  42000     53X     JSX .LDS1
31361          1457R     DEF =D1
31362  42000     54X     JSX CNV31
31363  42000     46X     JSX ADD1T
31364  42000    204X     JSX SUB1T
31365  42000    203X     JSX CNV14
31366  42000  11010R     JSM P663   STMRKR
31367  66000  31421R     JMP A1706
31370                A1705 EQU *
31370  42000     37X     JSX .LDB1
31371         77671A     DEF V9  SPAN
31372  42000     62X     JSX CNV21
31373  42000     36X     JSX .SAR2
31374  42000  10312R     JSM P218   MKREL
31375  22000   1457R     ADA =D1
31376  42000    122X     JSX CNV42
31377  42000    153X     JSX MPY2
31400         77665A     DEF V8  CFREQ
31401  42000    140X     JSX MIN2
31402         77651A     DEF V32681  LTEMP
31403  42000     62X     JSX CNV21
31404  42000     41X     JSX MPY1
31405         30424R     DEF =F1.0@3
31406  42000     42X     JSX DIV1T
31407  42000     36X     JSX .SAR2
31410  42000  10312R     JSM P218   MKREL
31411 172003            SAP A1707
31412   1717  77717A     LDA V28 AMKR
31413  66000  31415R     JMP A1708
31414                A1707 EQU *
31414   2000  10522R     LDA =D501
31415                A1708 EQU *
31415  42000     45X     JSX CNV41
31416  42000     46X     JSX ADD1T
31417  42000    203X     JSX CNV14
31420  42000  11010R     JSM P663   STMRKR
```

```
31421                   A1706 EQU *
31421                   A1704 EQU *
31421                   A1702 EQU *
31421    1620   77620A    LDA V32656   PREFIX
31422   22000    6450R    ADA =D-23
31423   66000   32410R    JMP A1709
31424                   C1710 EQU *
31424    1566   77566A    LDA V32630   KEYCODE
31425   22000   31445R    ADA =B-61
31426  172414             SAM A1712
31427    1566   77566A    LDA V32630   KEYCODE
31430  170040             TCA
31431   22000   20441R    ADA =B67
31432  172410             SAM A1712
31433    1566   77566A    LDA V32630   KEYCODE
31434   12000   20441R    CPA =B67
31435   66000   31437R    JMP *+2
31436   66000   31446R    JMP A1711
31437    1616   77616A    LDA V32654   XFLAG
31440  170600             SAL 1
31441  172405             SAM A1711
31442                   A1712 EQU *
31442    2000    1463R    LDA =D0
31443   42000   14741R    JSM P929  ENTRY
31444   66000   31450R    JMP A1713
31445  177717
31445                     LIT
31446                   A1711 EQU *
31446    1566   77566A    LDA V32630  KEYCODE
31447   42000   24635R    JSM P220  SAVEM
31450                   A1713 EQU *
31450   66000   32411R    JMP A1714
31451                   C1715 EQU *
31451    1566   77566A    LDA V32630   KEYCODE
31452  170040             TCA
31453   22000   20441R    ADA =B67
31454  172402             SAM *+2
31455   66000   31557R    JMP A1716
31456    1566   77566A    LDA V32630   KEYCODE
31457   70540             PWC A
31460    2000    4207R    LDA =B160000
31461   42000    4171R    JSM P390  LGDB
31462    2000   15132R    LDA =B141
31463   42000   15546R    JSM P214  KEY
31464    2000   22223R    LDA =B143
31465   42000   15546R    JSM P214  KEY
31466    2000   21206R    LDA =B153
31467   42000   15546R    JSM P214  KEY
31470    2000   21206R    LDA =B153
31471   42000     555R    JSM P215  SKEY
31472    2000   22604R    LDA =B110
31473   42000     555R    JSM P215  SKEY
31474    2000    7670R    LDA =B164
31475   42000   15546R    JSM P214  KEY
31476    1740   77740A    LDA V32736  EFLAG
31477   52000    7731R    AND =B177737
31500   31740   77740A    STA V32736  EFLAG
31501    2000   22222R    LDA =D39
31502   42000    2434R    JSM P285  BLKOF
31503    1675   77675A    LDA V15 BLEDS
31504   52000   31541R    AND =B176077
31505   62000    1364R    IOR =B100
31506   31675   77675A    STA V15 BLEDS
31507   42000    2303R    JSM P277  GOFSET
31510   70540             PWC A
31511   42000    1665R    JSM P245  RLAD
31512   22000   21232R    ADA =D-70
31513   42000     116X    JSX SUB4I
31514   42000    3530R    JSM P355  REFLEV
31515   42000      37X    JSX .LDBI
31516           11133R    DEF D673  20000000
31517   42000     150X    JSX ADD2
31520           77707A    DEF V11 FOFSET
31521   42000    6750R    JSM P222  TUNE
31522   70760             WWC A
31523   31566   77566A    STA V32630  KEYCODE
31524   12000   10244R    CPA =B70
31525   66000   31527R    JMP *+2
31526   66000   31546R    JMP A1717
31527    2000    1456R    LDA =D12
31530   42000    4210R    JSM P392  IFBWOUT
31531   42000      37X    JSX .LDBI
31532           31542R    DEF =F2000000
31533   42000   11120R    JSM P668  SPANW
31534    2000   10411R    LDA =B114
31535   42000   15546R    JSM P214  KEY
31536    2000   17407R    LDA =B115
31537   42000   15546R    JSM P214  KEY
31540   66000   31556R    JMP A1718
31541  176077
31542 2000000
31541                     LIT
31546                   A1717 EQU *
31546    2000    2107R    LDA =D3
31547   42000    4210R    JSM P392  IFBWOUT
31550   42000      53X    JSX .LDSI
31551            1463R    DEF =D0
31552   42000   11120R    JSM P668  SPANW
31553   42000      37X    JSX .LDBI
31554            6717R    DEF =F10000000
```

```
31555  42000   7345R     JSM P558  SCANT
31556                   A1718 EQU *
31556  66000  32033R     JMP A1719
31557                   A1716 EQU *
31557   1566  77566A     LDA V32630  KEYCODE
31560  22000   3232R     ADA =B-60
31561 172004            SAP A1720
31562   2000   1463R     LDA =D0
31563  42000  14741R     JSM P929  ENTRY
31564  66000  32033R     JMP A1721
31565                   A1720 EQU *
31565  42000  15143R     JSM P949  UNBLANK
31566   1566  77566A     LDA V32630  KEYCODE
31567  52000   2406R     AND =D7
31570  31573  77573A     STA V32635  I
31571  72424            SZA A1722
31572   2000  15667R     LDA =B177731
31573  70540             PWC A
31574   2000   1457R     LDA =D1
31575                   A1723 EQU *
31575  31572  77572A     STA V32634  J
31576  42000     60X     JSX .ARAY
31577             7R     DEF V4  MSTATE
31600  70541             PWC B
31601   1572  77572A     LDA V32634  J
31602  70540             PWC A
31603   1573  77573A     LDA V32635  I
31604  42000    174X     JSX .ARRY
31605           213R     DEF V115  ASAVE
31606  42000    170X     JSX .STAC
31607   2000   1457R     LDA =D1
31610  21572  77572A     ADA V32634  J
31611 144016     16A     ISZ C,I
31612  66000  31575R     JMP A1723
31613  54016     16A     DSZ C
31614  42000  15424R     JSM P974  SAVFIX
31615                   A1722 EQU *
31615   1616  77616A     LDA V32654  XFLAG
31616  52000  31651R     AND =B150761
31617  31616  77616A     STA V32654  XFLAG
31620   1730  77730A     LDA V30 KFLAG
31621  52000  31652R     AND =B177137
31622  31730  77730A     STA V30 KFLAG
31623  42000   3255R     JSM P337  WRFAT
31624   1740  77740A     LDA V32736  EFLAG
31625  52000   1363R     AND =B177774
31626  31740  77740A     STA V32736  EFLAG
31627   1676  77676A     LDA V16 TLEDS
31630  52000  15350R     AND =B176777
31631  42000   2163R     JSM P270  TLEDSOUT
31632   1701  77701A     LDA V23 RVBW
31633  31435  77435A     STA V32541  IF1
31634   1701  77701A     LDA V23 RVBW
31635 170607             SAL 8
31636  31434  77434A     STA V32540  IF2
31637   1700  77700A     LDA V22 RLVL
31640  42000   3530R     JSM P355  REFLEV
31641   1675  77675A     LDA V15 BLEDS
31642 170612             SAL 11
31643 172010            SAP A1724
31644   2000   3527R     LDA =D14
31645  42000   2223R     JSM P274  NBLK
31646   1704  77704A     LDA V33 LEVLIN
31647  42000  11072R     JSM P667  WLVLN
31650  66000  31655R     JMP A1725
31651 150761
31652 177137
31651                    LIT
31653                   A1724 EQU *
31653   2000  13753R     LDA =B155
31654  42000  15546R     JSM P214  KEY
31655                   A1725 EQU *
31655   1675  77675A     LDA V15 BLEDS
31656 170611             SAL 10
31657 172006            SAP A1726
31660   2000   2131R     LDA =D15
31661  42000   2223R     JSM P274  NBLK
31662   1705  77705A     LDA V32 THRESH
31663  42000  11044R     JSM P666  WTHRSH
31664  66000  31667R     JMP A1727
31665                   A1726 EQU *
31665   2000   7667R     LDA =B157
31666  42000  15546R     JSM P214  KEY
31667                   A1727 EQU *
31667   1733  77733A     LDA V20 FSTIM
31670 172004            SAP A1728
31671   1731  77731A     LDA V18 SINDEX
31672  42000   4411R     JSM P406  EXP2
31673  66000  31677R     JMP A1729
31674                   A1728 EQU *
31674   1731  77731A     LDA V18 SINDEX
31675  22000   5520R     ADA =D24
31676  42000   4356R     JSM P403  EXPSIX
31677                   A1729 EQU *
31677  42000   7345R     JSM P558  SCANT
31700   1675  77675A     LDA V15 BLEDS
31701  42000  15313R     JSM P968  CFDF
31702  42000     37X     JSX .LDBI
31703         77671A     DEF V9  SPAN
31704  42000  11120R     JSM P668  SPANW
```

```
31705  42000      37X    JSX .LDBI
31706          77665A    DEF V8  CFREQ
31707  42000    6750R    JSM P222  TUNE
31710   2000    1463R    LDA =D0
31711   6000    2203R    LDB =D8
31712  42000      75X    JSX .wS4
31713   1676   77676A    LDA V16 ILEDS
31714 170614             SAL 13
31715 172403            SAM A1731
31716   1733   77733A    LDA V20 FSTIM
31717 172003            SAP A1730
31720                  A1731 EQU *
31720   2000    3113R    LDA =B2060
31721  66000   31723R    JMP A1732
31722                  A1730 EQU *
31722   2000    7570R    LDA =B2020
31723                  A1732 EQU *
31723  42000      73X    JSX .w6
31724   2000    6703R    LDA =D1024
31725  42000     103X    JSX .w4
31726   1676   77676A    LDA V16 ILEDS
31727 170611             SAL 10
31730 172403            SAM A1734
31731   1733   77733A    LDA V20 FSTIM
31732 172003            SAP A1733
31733                  A1734 EQU *
31733   2000    3113R    LDA =B2060
31734  66000   31736R    JMP A1735
31735                  A1733 EQU *
31735   2000    7571R    LDA =B2030
31736                  A1735 EQU *
31736  42000      73X    JSX .w6
31737   1426   77426A    LDA V32534  UFLAG
31740 170502             SAR 3
31741  52000    1457R    AND =D1
31742 170040             TCA
31743  22000   21206R    ADA =B153
31744  42000     555R    JSM P215  SKEY
31745   1730   77730A    LDA V30 KFLAG
31746  42000   15050R    JSM P223  AMPU
31747   2000    2417R    LDA =B177772
31750  70540             PwC A
31751   2000    1457R    LDA =D1
31752                  A1736 EQU *
31752  31567   77567A    STA V32631  KEYCOL
31753  42000    2223R    JSM P274  NBLK
31754   1567   77567A    LDA V32631  KEYCOL
31755  42000    2314R    JSM P279  SBLK
31756   2000    1457R    LDA =D1
31757  21567   77567A    ADA V32631  KEYCOL
31760 144016      16A    ISZ C,I
31761  66000   31752R    JMP A1736
31762  54016      16A    DSZ C
31763  42000    2772R    JSM P315  DALG
31764   1435   77435A    LDA V32541  IF1
31765 172405            SAM A1737
31766   2000    3654R    LDA =D16
31767  42000    2223R    JSM P274  NBLK
31770   2000    2420R    LDA =D145
31771  42000      73X    JSX .w6
31772                  A1737 EQU *
31772   2000    2521R    LDA =D17
31773  42000    2434R    JSM P285  BLKOF
31774   1723   77723A    LDA V26 MKRMODE
31775  72004            RZA A1738
31776   2000   10411R    LDA =B114
31777  42000   15546R    JSM P214  KEY
32000  66000   32002R    JMP A1739
32001                  A1738 EQU *
32001  42000   10747R    JSM P219  MKRDEL
32002                  A1739 EQU *
32002   2000   10141R    LDA =D38
32003  42000    2434R    JSM P285  BLKOF
32004   1730   77730A    LDA V30 KFLAG
32005  52000    2107R    AND =D3
32006  72413            SZA A1740
32007   2000   10141R    LDA =D38
32010  42000    2223R    JSM P274  NBLK
32011   5730   77730A    LDB V30 KFLAG
32012 174615             SBL 14
32013   2000   21211R    LDA =B136
32014 176402            SBM A1741
32015   2000   21210R    LDA =D172
32016                  A1741 EQU *
32016  42000      73X    JSX .w6
32017   2000    2420R    LDA =D145
32020  42000      73X    JSX .w6
32021                  A1740 EQU *
32021   2000   22222R    LDA =D39
32022  42000    2434R    JSM P285  BLKOF
32023  42000    3221R    JSM P333  CORREK
32024 172003            SAP A1742
32025   2000   22222R    LDA =D39
32026  42000    2223R    JSM P274  NBLK
32027                  A1742 EQU *
32027  42000   30430R    JSM P1649 RBLK
32030  42000   30442R    JSM P1652 FBLK
32031  42000    2762R    JSM P314  AVGRST
32032  42000   15224R    JSM P221  TRIGR
32033                  A1721 EQU *
```

```
32033                         A1719 EQU *
32033   66000   32411R          JMP A1714
32034                         C1743 EQU *
32034    2000    5515R          LDA =D30
32035   70540                   PWC A
32036   42000      37X          JSX .LDBI
32037           77651A          DEF V32681   LTEMP
32040   42000      50X          JSX CNV24
32041   42000    2132R          JSM P265   LIMIT
32042   31735   77735A          STA V32733   HPIB
32043  170600                   SAL 1
32044   22000    1457R          ADA =D1
32045    6000    2411R          LDB =D4
32046   42000     112X          JSX .WS7
32047    2000   15343R          LDA =D40
32050   42000    2434R          JSM P285   BLKOF
32051    2000   20440R          LDA =B123456
32052   31734   77734A          STA V32732   CMOS
32053    2000    1463R          LDA =D0
32054   42000   14741R          JSM P929   ENTRY
32055   66000   32411R          JMP A1714
32056                         C1744 EQU *
32056    1737   77737A          LDA V32735   BLKS
32057   21612   77612A          ADA V32650   NCHR
32060    6000    2203R          LDB =D8
32061   42000      75X          JSX .WS4
32062    2000   10243R          LDA =D27
32063   42000   14055R          JSM P216   MESSAGE
32064    2000    2500R          LDA =D147
32065   42000      73X          JSX .W6
32066   66000   32415R          JMP L1633 DONE
32067                         C1745 EQU *
32067    1677   77677A          LDA V17 RFAT
32070  170613                   SAL 12
32071  172006                  SAP A1746
32072   42000      37X          JSX .LDBI
32073           77651A          DEF V32681   LTEMP
32074   42000      50X          JSX CNV24
32075   31432   77432A          STA V32538   GIN2
32076   66000   32103R          JMP A1747
32077                         A1746 EQU *
32077   42000      37X          JSX .LDBI
32100           77651A          DEF V32681   LTEMP
32101   42000      50X          JSX CNV24
32102   31433   77433A          STA V32539   GIN1
32103                         A1747 EQU *
32103   42000    2762R          JSM P314   AVGRST
32104    1700   77700A          LDA V22 RLVL
32105   42000    3530R          JSM P355   REFLEV
32106    2000    2411R          LDA =D4
32107   42000    2314R          JSM P279   SBLK
32110   66000   32411R          JMP A1714
32111                         C1748 EQU *
32111   42000      37X          JSX .LDBI
32112           77651A          DEF V32681   LTEMP
32113   71500                   NRM
32114   35577   77577A          SIB V32639   CIBASE
32115    1577   77577A          LDA V32639   CIBASE
32116   12000    1456R          CPA =D12
32117   66000   32121R          JMP *+2
32120   66000   32125R          JMP A1749
32121    1730   77730A          LDA V30 KFLAG
32122   52000   15350R          AND =B176777
32123   31730   77730A          STA V30 KFLAG
32124   66000   32137R          JMP A1750
32125                         A1749 EQU *
32125    1730   77730A          LDA V30 KFLAG
32126   62000    1300R          IOR =B1000
32127   31730   77730A          STA V30 KFLAG
32130    2000    2405R          LDA =D5
32131   70540                   PWC A
32132    1577   77577A          LDA V32639   CIBASE
32133   22000    2417R          ADA =D-6
32134   42000    2132R          JSM P265   LIMIT
32135   22000    1457R          ADA =D1
32136   31577   77577A          STA V32639   CIBASE
32137                         A1750 EQU *
32137   66000   32411R          JMP A1714
32140                         C1751 EQU *
32140    2000    5516R          LDA =D16383
32141   70540                   PWC A
32142   42000      53X          JSX .LDSI
32143            1457R          DEF =D1
32144   42000     140X          JSX MIN2
32145           77651A          DEF V32681   LTEMP
32146   42000      50X          JSX CNV24
32147   42000    2132R          JSM P265   LIMIT
32150   22000    1457R          ADA =D1
32151   31610   77610A          STA V32648   ALIM
32152   66000   32411R          JMP A1714
32153                         C1752 EQU *
32153    1706   77706A          LDA V31 ROFSET
32154  170040                   TCA
32155   21700   77700A          ADA V22 RLVL
32156   70540                   PWC A
32157   42000   30303R          JSM P1636 DBLVL
32160   42000      57X          JSX ADD4T
32161   31700   77700A          STA V22 RLVL
32162   42000   30303R          JSM P1636 DBLVL
32163   31706   77706A          STA V31 ROFSET
```

```
32164    1730   77730A     LDA V30 KFLAG
32165   42000   15050R     JSM P223  AMPU
32166   42000   30430R     JSM P1649 RBLK
32167   66000   32411R     JMP A1714
32170                     C1753 EQU *
32170   42000      37X     JSX .LDBI
32171           77665A     DEF V8  CFREQ
32172   42000     150X     JSX ADD2
32173           77651A     DEF V32681   LTEMP
32174   42000     145X     JSX SUB2
32175           77707A     DEF V11 FOFSET
32176   42000      34X     JSX .STRD
32177           77665A     DEF V8  CFREQ
32200   42000     161X     JSX .MVE4
32201           77651A     DEF V32681   LTEMP
32202           77707A     DEF V11 FOFSET
32203   42000    6750R     JSM P222  TUNE
32204   42000   30442R     JSM P1652 FBLK
32205   66000   32411R     JMP A1714
32206                     C1754 EQU *
32206   42000      37X     JSX .LDBI
32207           77651A     DEF V32681   LTEMP
32210   42000      50X     JSX CNV24
32211   52000    6353R     AND =B7777
32212   31563   77563A     STA V32627   DSTAD
32213   66000   32411R     JMP A1714
32214                     C1755 EQU *
32214   42000      37X     JSX .LDBI
32215           77651A     DEF V32681   LTEMP
32216   42000      50X     JSX CNV24
32217   31572   77572A     STA V32634   J
32220  172003              SAP A1756
32221   52000    3166R     AND =B1777
32222   66000   32223R     JMP A1757
32223                     A1756 EQU *
32223                     A1757 EQU *
32223   70540              PWC A
32224    1601   77601A     LDA V32641   HPBC
32225   52000   23366R     AND =B14000
32226   22000   32250R     ADA =B164000
32227   72405              SZA A1759
32230    1601   77601A     LDA V32641   HPBC
32231   52000    6352R     AND =B6000
32232   22000    5742R     ADA =B176000
32233   72003              RZA A1758
32234                     A1759 EQU *
32234    2000    2277R     LDA =D2048
32235   66000   32237R     JMP A1760
32236                     A1758 EQU *
32236    2000    1463R     LDA =D0
32237                     A1760 EQU *
32237   42000     136X     JSX .ORT
32240   42000   12265R     JSM P731  DSWR1
32241    1601   77601A     LDA V32641   HPBC
32242  170140              CMA
32243   42000     104X     JSX .TURN
32244            2277R     DEF =B4000
32245           77601A     DEF V32641   HPBC
32246   31601   77601A     STA V32641   HPBC
32247   66000   32415R     JMP L1633 DONE
32250  164000
32250                      LIT
32251                     C1761 EQU *
32251   42000      53X     JSX .LDSI
32252           11310R     DEF =H100
32253   42000     165X     JSX .BMIN
32254   42000     145X     JSX SUB2
32255           77651A     DEF V32681   LTEMP
32256    4020      20A     LDB AR2
32257   77007              SLB A1762
32260   42000      53X     JSX .LDSI
32261           11310R     DEF =H100
32262   42000     165X     JSX .BMIN
32263   42000      34X     JSX .STRD
32264           77651A     DEF V32681   LTEMP
32265   66000   32302R     JMP A1763
32266                     A1762 EQU *
32266   42000      53X     JSX .LDSI
32267            2644R     DEF =H1000
32270   42000     165X     JSX .BMIN
32271   42000     140X     JSX MIN2
32272           77651A     DEF V32681   LTEMP
32273    4020      20A     LDB AR2
32274   77006              SLB A1764
32275   42000      53X     JSX .LDSI
32276            2644R     DEF =H1000
32277   42000     165X     JSX .BMIN
32300   42000      34X     JSX .STRD
32301           77651A     DEF V32681   LTEMP
32302                     A1764 EQU *
32302                     A1763 EQU *
32302    2000    2221R     LDA =D9
32303   70540              PWC A
32304   42000      37X     JSX .LDBI
32305           77651A     DEF V32681   LTEMP
32306   42000      26X     JSM P213  ROUND
32307    6000    2276R     LDB =D2
32310   42000      47X     JSX .DRGT
32311   42000      50X     JSX CNV24
32312    6000   32361R     LDB =D1600
```

```
32313  75617              MPY
32314  42000     104X     JSX .TURN
32315           32362R    DEF =B177760
32316           77677A    DEF V17 REAT
32317  31677    77677A    STA V17 REAT
32320  42000     2762R    JSM P314  AVGRST
32321   1700    77700A    LDA V22 RLVL
32322  42000     3530R    JSM P355  REFLEV
32323  66000    32411R    JMP A1714
32324                   C1765 EQU *
32324  42000    13045R    JSM P791  UHPB
32325   2000     4470R    LDA =D1000
32326  70540              PWC A
32327  42000      37X     JSX .LDB1
32330           77651A    DEF V32681  LTEMP
32331  42000      50X     JSX CNV24
32332  22000     1277R    ADA =D-1
32333  42000     2132R    JSM P265  LIMIT
32334  22000     1457R    ADA =D1
32335  31573    77573A    STA V32635  I
32336   1616    77616A    LDA V32654  XFLAG
32337  62000     2644R    IOR =B10000
32340  52000    15666R    AND =B77776
32341  31616    77616A    STA V32654  XFLAG
32342   1573    77573A    LDA V32635  I
32343  70540              PWC A
32344   1563    77563A    LDA V32627  DSTAD
32345  70540              PWC A
32346   2000     4470R    LDA =D1000
32347  42000     113X     JSX DIV4
32350           77573A    DEF V32635  I
32351  22000     1457R    ADA =D1
32352  70540              PWC A
32353  42000     166X     JSX .CSHV
32354            4630R    DEF P421  RDBMV
32355   1601    77601A    LDA V32641  HPBC
32356 170507              SAR 8
32357  42000      23X     JSM P210  SDUMP
32360  66000    32415R    JMP L1633 DONE
32361   3100
32362 177760
32361                    LIT
32363           32324R    DEF C1765
32364           32251R    DEF C1761
32365           32214R    DEF C1755
32366           32206R    DEF C1754
32367           32411R    DEF A1714
32370           32411R    DEF A1714
32371           32411R    DEF A1714
32372           32411R    DEF A1714
32373           32170R    DEF C1753
32374           32153R    DEF C1752
32375           32411R    DEF A1714
32376           32140R    DEF C1751
32377           32111R    DEF C1748
32400           32411R    DEF A1714
32401           32067R    DEF C1745
32402           32411R    DEF A1714
32403           32056R    DEF C1744
32404           32034R    DEF C1743
32405           31451R    DEF C1715
32406           31424R    DEF C1710
32407                     DEC -21
32410  42000     143X   A1709 JSX .CASE
32411                   A1714 EQU *
32411  42000    12334R    JSM P217  MBLK
32412   1730    77730A    LDA V30 KFLAG
32413  52000    11303R    AND =B177377
32414  31730    77730A    STA V30 KFLAG
32415                   L1633 EQU * DONE
32415   1616    77616A    LDA V32654  XFLAG
32416  62000     2644R    IOR =B10000
32417  31616    77616A    STA V32654  XFLAG
32420                   A1632 EQU *
32420  52000    15666R    AND =B77776
32421  31616    77616A    STA V32654  XFLAG
32422  66000    32432R    JMP A1522
32423           30000R    DEF C1607
32424           27776R    DEF C1606
32425           26646R    DEF C1540
32426           26320R    DEF C1523
32427           25711R    DEF C1488
32430                     DEC -6
32431  42000     143X   A1487 JSX .CASE
32432                   A1522 EQU *
32432   1616    77616A    LDA V32654  XFLAG
32433  52000     1704R    AND =D6
32434  72002              RZA *+2
32435  66000    25205R    JMP L190  LOOP
32436  76702              SHC *+2
32437  66000    25205R    JMP L190  LOOP
32440   1616    77616A    LDA V32654  XFLAG
32441 170500              SAR 1
32442  52000     2107R    AND =D3
32443  31575    77575A    STA V32637  K
32444   1616    77616A    LDA V32654  XFLAG
32445  52000     6232R    AND =B177761
32446  31616    77616A    STA V32654  XFLAG
32447   1575    77575A    LDA V32637  K
32450  12000     2276R    CPA =D2
```

```
32451  66000  32453R    JMP *+2
32452  66000  32462R    JMP A1766
32453   1616  77616A    LDA V32654  XFLAG
32454 170612            SAL 11
32455 172004           SAP A1767
32456  42000     37X    JSX .LDBI
32457         77665A    DEF V8  CFREQ
32460  42000   6016R    JSM P500  STUNE
32461                  A1767 EQU *
32461  66000  32471R    JMP A1768
32462                  A1766 EQU *
32462   1676  77676A    LDA V16 ILEDS
32463  52000  16170R    AND =B611
32464  72002            RZA *+2
32465  66000  25205R    JMP L190  LOOP
32466   1740  77740A    LDA V32736  EFLAG
32467  62000   1364R    IOR =B100
32470  31740  77740A    STA V32736  EFLAG
32471                  A1768 EQU *
32471  42000   7732R    JSM P599  FPNLON
32472  66000  25707R    JMP L191  SLOOP
32473                  L195  EQU * ABORT
32473   1601  77601A    LDA V32641  HPBC
32474  52000  16171R    AND =B157777
32475  31601  77601A    STA V32641  HPBC
32476                  L193  EQU * RESET
32476   2000    566R    LDA =B76000
32477  30003      3A    STA V12 RPTR
32500   2000    567R    LDA =B76100
32501  31763  77763A    STA V14 EPTR
32502  30016     16A    STA V13 CPTR
32503   1616  77616A    LDA V32654  XFLAG
32504  52000   1375R    AND =B177767
32505  31616  77616A    STA V32654  XFLAG
32506   1730  77730A    LDA V30 KFLAG
32507  52000  13044R    AND =B177577
32510  31730  77730A    STA V30 KFLAG
32511   1675  77675A    LDA V15 BLEDS
32512  52000   2153R    AND =B177773
32513  31675  77675A    STA V15 BLEDS
32514   1601  77601A    LDA V32641  HPBC
32515 172007           SAP A1769
32516   1602  77602A    LDA V32642  LKMSK
32517   6000   2107R    LDB =D3
32520  42000    107X    JSX .WS5
32521   1601  77601A    LDA V32641  HPBC
32522  52000   6514R    AND =B77777
32523  31601  77601A    STA V32641  HPBC
32524                  A1769 EQU *
32524  66000  25205R    JMP L190  LOOP
32525  66000      6R   STOP JMP ANFNG
32525             6R    END ANFNG

---------------
MCCP  NCCP  IBCK  ICNT  NCNT  IV   MFLAG  KTX
0     0     0     0     1     12   -1     3
ISTAR=17435 KI=0
INPUT BUFFER NV:
  END ANFNG
RING BUFFER NW,MW:

1
```

APPENDIX B-31

ADDRESS ASSIGNMENTS

| ADDRESS DEC | ADDRESS OCT | FUNCTION | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|
| 0 | 0 | 50 MHz VTO LOW ORDER DAC | | | | | | | MSB ——— | | | | | | | | | LSB |
| 1 | 1 | 50 MHz VTO HIGH ORDER DAC | | | | | | | MSB ——— | | | | | | | | | LSB |
| 2 | 2 | NOT USED | | | | | | | | | | | | | | | | |
| 3 | 3 | YIG DAC | | | | | | | MSB ——— | | | | | | | | | LSB |
| 4 | 4 | SCAN ATTEN & VTO CONTROL | VTO HFLT | VTO HDIV | ÷00 | ÷ 1 | ÷10 | ÷100 | MSB ——— | | | | | | | | | LSB |
| 5 | 5 | SCANTIME (1MSECX) | | | | | | | | | | | $\overline{10}$ | $\overline{1.5}$ | $\overline{2}$ | $\overline{5}$ | $\overline{10}$ | $\overline{100}$ |
| 6 | 6 | YIG ∮ LOCK, SCAN RESET 2nd LO SHIFT | $\overline{HOLD}$ | 100KHz LOOP BW | 10KHz LOOP BW | LOOP GND | $\overline{BCW}$ RESET | 2nd LO SHIFT | | | | | | | | | | |
| 7 | 7 | SCAN MODE | | | | | | | | | | | | | | YIG MAIN | YIG FM | VTO |
| 8 | 10 | 85680 FRONT PANEL LEDS | RBW | YBW | SCAN TIME | SHIFT KEY | | ATTN | LINE TRIG / EXT TRIG | SINGLE TRIG | VIDEO TRIG | RPG ENBLD. | INPUT #2 | INPUT #1 | | | | |
| 9 | 11 | KEY ROWS, RPG ENABLE | RPG ENABLE | | | | ROW #11 ——— | | | | | | | | | | | ROW #0 |
| 10 | 12 | KEY COLUMNS, QUALIFIERS | REMOTE | | | | | UNDB KEY DOWN | | RPG SIGN | COL # 7 ——— | | | | | | | COL #0 |

APPENDIX B-31

ADDRESS ASSIGNMENTS

| DEC | OCT | FUNCTION | BITS 15 14 13 12 11 10 9 8 7 6 5 4 3 2 1 0 |
|---|---|---|---|
| 11 | 13 | RPG COUNT QUALIFIERS<br>SERVICE REQUEST CODE<br>0 0 0 HISCAN<br>0 0 1 EXT.REF<br>0 1 0 LOCAL/REM<br>0 1 1 RPG<br>1 0 0 KEYDOWN DEBOUNCED<br>1 0 1 LTGR<br>1 1 0 REMOTE REQ<br>1 1 1 UNLOCKED | Bits 15–8: RPG COUNT (BINARY), MSB ——— LBS; bit 5: HPIB BUSY; bit 4: CTR BUSY; bit 3: EXT REF; bits 2–0: SERVICE REQUEST (SEE COD |
| 12 | 14 | RESETS<br>RESET CODE<br>0 0 0<br>0 0 1 EXT<br>0 1 0 LOCAL<br>0 1 1 RPG<br>1 0 0 KEYDOWN<br>1 0 1 HISCAN<br>1 1 0 STOP<br>1 1 1 | Bits 2–0: RESETS (SEE CODI |
| 13 | 15 | Ø LOCK FLAG ENABLE | LO DAC; HI DAC; REF NOT LOCKED; Ø3; Ø2; Ø1 |
| 14 | 16 | 245MHz Ø LOCK<br>DIVIDE # =<br>9-M+.125(N)<br>FREQ = 280-VTO REF-[(DIVIDE #)(4)] | M: MSB ——— LSB; N(RATIO): MSB ——— LSB |
| 15 | 17 | INPUT RELAY ATTENUATOR<br>ATTEN CODE<br>0 0 0 70dB<br>0 0 1 60<br>0 1 0 50<br>0 1 1 40<br>1 0 0 30<br>1 0 1 20<br>1 1 0 10<br>1 1 1 0dB | RELAY 0 = IN #1; ATTEN CODE |
| 16 | 20 | NOT USED | |
| 17 | 21 | HPIB TO HYBRID | X X X X X X X X |
| 18 | 22 | HYBRID TO HPIB | X X X X X X X X |
| 19 | 23 | HPIB STATUS | |
| 20 | 24 | COUNTER INPUT, PERIOD SELECT<br>INPUT CODE<br>0 0 TIMER<br>0 1 SIG IF<br>1 0 PILOT IF<br>1 1 VTO | M SECTION MSB ——— LSB; INPUT SELECT (SEE CODE) |
| 21 | 25 | COUNTER OUTPUT 4 MSD BCD | MSB ——— LSB |
| 22 | 26 | COUNTER OUTPUT 4 LSD BCD | MSB ——— LSB |
| 23 | 27 | NOT USED | |
| 24 | 30 | INPUT OPTS, & POST ATTEN GAIN<br>INPUT OPT. CODE<br>0 0 50 Ω<br>0 1 75 Ω<br>1 0 HI Ω<br>1 1 NOT PRESENT | IN #2 OPTS (SEE CODE); IN #1 OPTS (SEE CODE); MSB ——— LSB 20 dB ATTEN ERROR |
| 25 | 31 | READOUT UNITS, POST ATTEN GAIN<br>UNITS CODE<br>0 0 dBm<br>0 1 dBmV<br>1 0 dBμV<br>1 1 LIN | DEFAULT READOUT UNITS (SEE CODE); PRE-AMPS PRESENT; MSB ——— LSB 30 dB ATTEN ERROR |
| 26 | 32 | MSB | MSB 40 dB ATTEN ERROR LSB |
| 27 | 33 | LSB | MSB 50 dB ATTEN ERROR LSB |
| 28 | 34 | MSB | MSB 60 dB ATTEN ERROR LSB |
| 29 | 35 | LSB | MSB 70 dB ATTEN ERROR LSB |
| 30 | 36 | NOT USED | |
| 31 | 37 | NOT USED | |
| 32 | 40 | DIGITAL STORAGE SET ADDRESS | MSB ——— LSB |

APPENDIX B-31

ADDRESS ASSIGNMENTS

| ADDRESS DEC | ADDRESS OCT | FUNCTION | 15 14 13 12 11 10 9 8 7 6 5 4 3 2 1 0 |
|---|---|---|---|
| 33 | 41 | D.S. READ & INC. ADDRESS | MSB ——— LSB |
| 34 | 42 | D.S. WRITE & INC. ADDRESS | MSB ——— LSB |
| 35 | 43 | D.S. LOAD OFFSET | MSB ——— LSB |
| 36 | 44 | D.S. VIDEO CONTROL | MSB ——— LSB |
| 37 | 45 | D.S. READ SCAN ADDRESS | MSB ——— LSB |
| 38 | 46 | D.S. LOAD MARKER | MSB ——— LSB |
| 39 | 47 | D.S. LOAD SCAN ADDRESS | MSB ——— LSB |
| 40 | 50 | NOT USED | |
| 49 | 61 | NOT USED | |
| 50 | 62 | SCAN TRIGGER & SOURCE SEL. | GO ARM STOP SOURCE (SEE CODE) |

SOURCE CODE

| | | |
|---|---|---|
| 0 0 | FREE RUN | |
| 0 1 | EXT | |
| 1 0 | LINE | |
| 1 1 | VIDEO | |

| ADDRESS DEC | ADDRESS OCT | FUNCTION | BITS |
|---|---|---|---|
| 51 | 63 | FAST SCAN GEN 10 MSEC ÷ X | ON X100 X10 X5 X2 (X = MULTIPLY SELECTED VALUES) |
| 52 | 64 | IF SCALE, GAIN | LOG:1 LIN:0 / dB SCALE (SEE CODE) / REC CAL / ZERO OFF / CRT / AZD / AID / SG 20 / SG 20 / SG 10 / LG 20 / LG 10 / OS 20 / OS 20 / OS 10 |

SOURCE CODE

| | |
|---|---|
| 0 0 | 10dB |
| 0 1 | 5 |
| 1 0 | 2 |
| 1 1 | 1 |

| ADDRESS DEC | ADDRESS OCT | FUNCTION | BITS |
|---|---|---|---|
| 53 | 65 | IF BW, FINE GAIN | MSB RES BW (SEE CODE) LSB / MSB VID BW (SEE CODE) LSB / ATTEN 8 / ATTEN 4 / ATTEN 2 / ATTEN 1 / ATTEN .8 / ATTEN .4 / .2 / .1 |

| BANDWIDTH CODE | RES BW | VID BW |
|---|---|---|
| 0 0 0 0 | | 1 Hz |
| 0 0 0 1 | | 3 Hz |
| 0 0 1 0 | 10 Hz | 10 Hz |
| 0 0 1 1 | 30 Hz | 30 Hz |
| 0 1 0 0 | 100 Hz | 100 Hz |
| 0 1 0 1 | 300 Hz | 300 Hz |
| 0 1 1 0 | 1 KHz | 1 KHz |
| 0 1 1 1 | | |
| 1 0 0 0 | | |
| 1 0 0 1 | 3 KHz | 3 KHz |
| 1 0 1 0 | 10 KHz | 10 KHz |
| 1 0 1 1 | 30 KHz | 30 KHz |
| 1 1 0 0 | 100 KHz | 100 KHz |
| 1 1 0 1 | 300 KHz | 300 KHz |
| 1 1 1 0 | 1 MHz | 1 MHz |
| 1 1 1 1 | 3 MHz | 3 MHz |

| ADDRESS DEC | ADDRESS OCT | FUNCTION | BITS |
|---|---|---|---|
| 54 | 66 | LEDS | VIDEO / EXT / LINE / SINGLE SWP / SHIFT / WRITE B / WRITE A / A-B / BLNK B / VIEW B / PEAK B / BLNK A / VIEW A / PEAK A |

APPENDIX C-1

MICRO ASSEMBLER: 16 FEB 78

```
MICRA 23 APRIL 79
*
*       PRODUCTION  SOFTWARE  REVISION #2
*
*      L. BOWER, M. NEERING  4/23/79
*
*
*      REGISTERS:
       DECLARE SC=0,BPCR=0,SCAN=1,SOFR=2,MKR=3
       DECLARE POSPK=4,NEGPK=5,T=5,VDC=6,REF=7
       DECLARE SCR=0,X=1,Y=2,THRESH=3,DC=4,MA=5
       DECLARE SAVEA=6,CHR=7,DELTAY=7,RA=7
*
*      FLAGS:
       DECLARE FLGA=8,FLGB=9,FLGC=10,LROMEN=0
       DECLARE SELA=11,SELB=13,HOLD=15,CE=12
       DECLARE FLGTA=3,FLGTB=4,FLGTC=6
       DECLARE CHAR=1,BLINK=2,FS=3,BRIGHT=4
       DECLARE LLGBLANK=5,DIM=6,FSTPT=7,DOTEN=14
*
*      I/O PORTS:
       DECLARE ADC=0,BPCAD=6,BPCD=7,MDR=3
       DECLARE RAMP=4,BPCO=6,STT=8,HSRS=11
       DECLARE MEM=1,TSTA=4,TSTB=3,MAR=7
```

```
                                               DECLARE RTN=2,LGCHAR=0,LGX=1,LGY=2,LGEXP=5
                                               DECLARE RSTO=9,INCRSA=10,CLRSA=12,DRTIMER=13
                                               DECLARE SRSEN=14,CRSEN=15
                                          *
                                          *    CONSTANTS:
                                               DECLARE 0=0,1=15,2=1,4=2,8=2,15=3,16=4,32=5,97=6
                                               DECLARE 255=7,1023=8,1024=9,2047=10,2048=11
                                               DECLARE 3072=12,4032=13,4095=14,1032=1
                                          *
                                          *    QUALIFIERS:
                                               DECLARE B0=0,B1=1,B2=2,B3=3,B4=4,B5=5,B6=6,B7=7
                                               DECLARE B8=8,B9=9,B10=10,B11=11,ZERO=12,POS=14
                                          *
                                          *
                                          *
                                          *           MAIN PROGRAM
                                          *
                                          *     BPC SERVICE ROUTINE
                                          *
                                               ADRS 0
  0   0   2--1 1  0 3--17 17--0 2 1 6     HK   JCH H DAC=VDC*0
  1   0   1--1 1  0 3--17 17--0 4 1 6     CF   JCH H DAC=VDC
  2   0   1--1 1  0 2--17 17--0 5 0 6     CH   JCJ H SLROMEN DVDC=AC
  3   1   1--0 1  0 3--17 13--0 7 1 0     CJ   JCL OHSRS
  4   1   1--1 1 14 0--17  1--0 5 1 5     CL   JCM DT=B IMEM CCE
  5   0  27--0 1 13 2--17  6--0 4 0 5     CM   JCN H OBPCO DAC=T&B SSELA
  6   0 173--0 1 14 2--17  7--0 4 0 0     CD   JCF H OMAR DAC=BPCR&B SCE
  7   0   1--1 0 17 3--17 17--0 0 1 0     CG   JCI H W DAC=BPCR+1
 10   1   1--1 0  0 3--17 17--0 5 0 0     CI   JCK W DBPCR=AC
 11   0 175--1 0 14 0--17 17--0 7 1 0     CK   JCD H W CCE
 12   0 174--1 1  0 3--17  7--0 5 1 0     BV   JCD H DBPCR=B IBPCD
 13   0 173--1 1  0 3--17 17--0 5 0 0     BW   JCD H DBPCR=AC
 14   0 173--0 0 14 2--17  7--0 4 0 0     BX   JCG H W DAC=BPCR&B OMAR SCE
 15   1   5--1 1  0 3--17  7--0 5 1 2     BY   JCO DSOFR=B IBPCD
 16   1   4--1 1  0 3--17  7--0 5 1 6     BZ   JCO DVDC=B IBPCD
 17   1   3--1 1  0 3--17 17--0 5 0 0     CA   JCO DBPCR=AC
 20   1   2--1 1  0 3--17 17--0 5 0 3     CB   JCO DMKR=AC
 21   1   1--1 1  0 3--17  7--0 5 1 1     CC   JCO DSCAN=B IBPCD
 22   0  12--0 1  0 3--17  6--0 4 0 1     CO   JCN H DAC=SCAN&B OBPCO
 23   1 167--1 1 17 3--17 17--0 0 1 0     BR   JBV DAC=BPCR+1
 24   0 170--0 1  0 3--17  3--0 4 0 5     BS1  JBX H DAC=T&B OMDR
 25   1 171--1 1 17 3--17 17--0 1 1 0     BT   JBZ DAC=BPCR-1
 26   1 172--1 1 17 3--17 17--0 1 1 5     BU   JCB DAC=T-1
 27   1 174--1 1  0 3-- 1  7--0 5 1 5     BP   JBR QB1 DT=B IBPCD
 30   1 175--1 1  0 3-- 1  7--0 5 1 5     BQ   JBT QB1 DT=B IBPCD
 31   1 176--1 1  0 3-- 2  6--0 7 1 0     BO   JBP IBPCAD QB2
 32   0   1--1 1 15 2--17  6--0 7 1 0     BM   JBN H IBPCAD SSELB
 33   0 176--1 1  0 3-- 3  6--0 7 1 0     BN   JBO H IBPCAD QB3
 34   1   2--1 1 17 3--17  3--0 0 1 2     CN   JAC ITSTB DAC=SOFR+1
                                          *
                                          *
                                          *     MAIN LOOP
 35   1   1--1 1 17 3--17  3--0 0 1 2     AB   JAC DAC=SOFR+1 ITSTB
 36   0   2--1 1 14 0--11 17--1 1 1 1     AC   JAD H DAC=SCAN-AC QB9 CCE
 37   0 173--1 1 14 0--17 17--0 7 1 0     BL   JBM H CCE
 40   0   1--0 1 13 2--17  4--0 7 0 0     AD   JAE H DB=AC ORAMP SSELA
 41   0   3--0 1 14 2--17  7--0 4 0 7     AE   JAG H DAC=REF&B OMAR SCE
 42   1   1--1 1 12 3--17 17--0 3 0 6     AJ   JAF DAC=VDC/2047&B
 43   1   3--1 1  0 3--10 17--0 5 0 5     AF   JAH DNEGPK=AC QB8
 44   0   1--1 1 17 3--17  6--0 0 1 7     AG   JAI H DAC=REF+1 IBPCAD
 45   0 170--1 1 17 0-- 0 17--0 5 0 7     AI   JAB H DREF=AC QB0 CHOLD
 46   0   1--1 1  0 3--17 17--0 2 1 5     AH   JAK H  DAC=NEGPK*0
 47   0   1--1 1  0 3--17 17--0 5 0 4     AK   JDI H DPOSPK=AC
 50   0 125--1 1  0 3--17  4--0 7 1 0     DI   JXA H ITSTA
 51   1   1--1 1 12 0--17 17--0 4 0 6     DJ   JAM DAC=VDC&B CFLGC
 52   0 167--1 1  0 3--17 17--0 7 1 0     AM   JAE H
 53   1   1--1 1 17 2--11 17--0 4 1 2     AN   JAO DAC=SOFR QB9 SHOLD
 54   1  44--0 1 12 0--17 17--1 1 1 1     AO   JAQ DAC=SCAN-AC OCRSEN CFLGC
                                          *
                                          *
                                          *     SCAN STOP ROUTINE
 55   0  57--0 1 13 2-- 6 13--0 7 1 0     CQ   JCS H QFLGTC SSELA OHSRS
 56   1 177--1 1 14 0--17  4--0 7 1 0     CP   JCQ ITSTA CCE
                                          *
                                          *
                                          *     DIGITAL PEAK INPUT ROUTINE
 57   1  24--1 1  0 3--17  4--0 7 1 0     EM   JEN ITSTA
 60   0   1--0 1  0 3-- 5 17--0 7 1 0     JT   JJU H QB5 OCRSEN
 61   0   1--1 1 11 0--17  4--0 7 1 0     JU   JJX H ITSTA CFLGB
 62   0  14--1 1 13 2--17 17--0 4 0 6     JX   JJY H DAC=VDC&B SSELA
 63   1  16--1 1 15 0-- 3 17--0 4 1 0     JV   JJW DAC=SC QFLGTA CSELB
 64   1   6--1 1  0 3--17 17--1 1 1 5     EB   JED DAC=NEGPK-AC
 65   1   1--1 1  0 3--17 17--1 1 1 4     EA   JEC DAC=POSPK-AC
 66   1   1--1 1 10 2--16 17--0 7 1 0     EC   JEE QPOS SFLGA
 67   1   1--1 1  0 3--17 17--0 4 1 0     EE   JEH DAC=SC
 70   1  32--1 1  0 3--17 17--0 5 0 4     EH   JEK DPOSPK=AC
 71   1 177--1 1  0 3--17 17--0 4 1 4     EG   JED DAC=POSPK JEH
 72   1   1--1 1 10 0--16 17--0 7 1 0     ED   JEF QPOS CFLGA
 73   1   1--1 1  0 3--17 17--0 4 1 0     EF   JEI DAC=SC
 74   1   1--1 1  0 3--17 17--0 4 1 5     EI   JEJ DAC=NEGPK
 75   1  25--1 1  0 3--17 17--0 5 0 5     EJ   JEK DNEGPK=AC
 76   1   1--1 1 15 0-- 3 17--0 4 0 6     JY   JJZ DAC=VDC&B QB3 CSELB
 77   1   1--1 1  0 3-- 3 17--0 4 1 0     JZ   JEL DAC=SC QB3
100   0  22--1 1 17 2--17 17--0 5 0 4     EL   JEK H DPOSPK=AC SHOLD
101   0 163--1 1 13 2--17 17--0 7 1 0     JW   JEB H SSELA
102   0 133--0 1 15 2-- 0 16--0 7 1 0     AA   JAB H QB0 OSRSEN SSELB
103   1   1--1 1  0 3-- 3 17--0 7 1 0     EN   QFLGTA
104   0   1--1 1  0 3--17 17--0 4 1 0     EO   H DAC=SC
105   1   7--1 1  0 3--17 17--1 1 1 5     ER   JES DAC=NEGPK-AC
106   1   1--1 1  0 3--17 17--1 1 1 4     EP   DAC=POSPK-AC
107   0   1--1 1  0 3--16 17--0 7 1 0     EQ   H QPOS
110   0   1--1 1 15 2--17  3--0 4 1 0     ET   H DAC=SC SSELB ITSTB
111   1   2--1 1 13 0--11 17--0 5 0 4     EX   JEZ DPOSPK=AC CSELA QB9
112   1 177--1 1  0 3--17  3--0 4 1 4     EV   JEX DAC=POSPK ITSTB
113   0  17--1 1 10 0--17 17--0 5 0 0     EZ   JZB H DSC=AC CFLGA
```

```
114   1   1--1 1  0 3--16 17--0 7 1 0   ES    QPOS
115   1   1--1 1  0 3--17 17--0 4 1 0   EU    DAC=SC
116   1   1--1 1  0 3--17 17--0 4 1 5   EW    JEY DAC=NEGPK
117   1   5--1 1  0 3--17 17--0 5 0 5   EY    JFA DNEGPK=AC
120   1  15--0 1 11 2--17  4--0 7 0 0   AQ    JAS DB=AC ORAMP SFLGB
121   0  33--0 1 17 0--17  4--0 7 0 0   AP    JAU H DB=AC ORAMP CHOLD
122   0   1--1 1 17 2--17 17--0 5 0 0   EK    H DSC=AC SHOLD
123   1  62--1 1  0 3--17 17--0 4 0 6   GB    JGD DAC=VDC&B
124   0  30--0 1  0 3--17 10--0 5 0 0   FA    JAU H DSC=AC OSTT
125   1   4--1 1  0 3--17  4--0 7 1 0   JP    JJN ITSTA
126   0 131--1 1 17 0--17 17--0 4 0 6   JS    JEM H DAC=VDC&B CHOLD
127   1   1--1 1 17 2--17  4--0 7 1 0   JQ    JJR ITSTA SHOLD
130   0 176--1 1  0 3-- 4  0--0 5 1 0   JR    JJS H DSC=B IADC QFLGTB
131   0 176--1 1 14 0-- 2 17--0 5 0 7   JN    JJQ H DREF=AC QB2 CCE
132   0 124--1 1  0 3--17 17--0 7 1 0   ZB    JCP H
133   1  67--1 1 15 2--17 17--0 4 0 6   FB    JJF DAC=VDC&B SSELB
134   0  16--1 1 15 2--17 17--0 4 0 6   CS    JCU H DAC=VDC&B SSELB
                                        *
                                        *
                                        *      FAST SCAN LOOP
135   0   3--1 1 17 0--17 17--0 5 0 0   AS    JAY H CHOLD DSC=AC
136   0 120--1 1 10 2--17 17--0 7 1 0   BK    JCP H SFLGA
137   0   1--1 1  0 3-- 0 17--0 7 1 0   AW    H QB0
140   0   1--1 1  0 3--17  6--0 7 1 0   AY    H IBPCAD
141   0   2--0 1 14 2-- 0  7--0 4 0 7   BA    JBC H DAC=REF&B OMAR SCE QB0
142   0  15--1 1 17 0--17  4--0 7 1 0   DP    JDN1 H ITSTA  CHOLD
143   0   1--1 1 17 3--17  3--0 0 1 7   BC    H DAC=REF+1 ITSTB
144   0   2--1 1  0 3--11 17--0 5 0 7   BE    JBG H DREF=AC QB9
145   0 111--1 1 10 2--17 17--0 5 0 7   BJ    JCP H DREF=AC SFLGA
146   1 170--1 1 14 0--17  4--0 7 1 0   BG    JBK ITSTA CCE
                                        *
                                        *
                                        *      DIGITAL PEAK LOOP
147   0  13--1 1 11 0-- 7 17--0 5 0 7   AZ    JBB H DREF=AC QB7 CFLGB
150   0 106--1 1 10 2--17 17--0 5 0 7   BI    JCP H DREF=AC SFLGA
151   0   3--1 1  0 3-- 0 17--0 7 1 0   AT    JAU H QB0
152   0  63--1 1 12 2--11 17--0 7 1 0   CU    JJM H SFLGC QB9
153   1 127--1 1  0 3--17  6--0 7 1 0   CT    JAA IBPCAD
154   0   1--1 1 11 2--17  6--0 7 1 0   AU    IBPCAD H SFLGB
155   0   4--0 1 14 2-- 0  7--0 4 0 7   AV    JAX H QB0 DAC=REF&B OMAR SCE
156   0   1--1 1 17 0--17  4--0 7 1 0   DN    JDN1 H ITSTA CHOLD
157   1   1--1 1  0 3-- 4 17--0 4 0 6   DN1   JDQ DAC=VDC&B QFLGTB
160   0  27--0 1 17 3-- 5 16--0 0 1 1   DQ    JDR H DAC=SCAN+1 QB5 OSRSEN
161   0 160--1 1 17 3--17  4--0 0 1 7   AX    JAZ H ITSTA DAC=REF+1
162   1  51--1 1 14 0--17  3--0 7 1 0   BB    JDE CCE ITSTB
163   1 165--1 1  0 3--17  4--0 7 1 0   BF    JBI ITSTA
                                        *
                                        *
                                        *
                                        *      FAST INPUT ROUTINE
164   0   1--1 1  0 3--17 17--0 4 0 6   FF    JFH H DAC=VDC&B
165   1   2--1 1  0 3-- 5  4--0 7 1 0   FH    JDF ITSTA QB5
166   0  51--1 1 10 2--17 17--0 7 1 0   FG    JIV H SFLGA
167   0   1--1 1  0 3-- 2 17--0 7 1 0   DF    JFI H QB2
170   1   3--1 1 17 2--17  4--0 7 1 0   FI    JXX ITSTA SHOLD
171   1   4--1 1 17 2--17  4--0 7 1 0   FP    JFR ITSTA SHOLD
172   1   6--1 1  0 3--17 17--0 4 1 4   FK    JFT DAC=POSPK
173   1 177--1 1  0 3--17  0--0 5 1 4   XX    JFK DPOSPK=B IADC
174   0 174--1 1  0 3-- 2 17--0 7 1 0   FJ    JFI H QB2
175   0   2--1 1  0 3-- 3  0--0 5 1 0   FR    JFS1 H DSC=B IADC QFLGTA
176   0 173--1 1  0 3-- 2 17--0 7 1 0   FQ    JFP H QB2
177   0   1--1 1 17 0--17  3--0 4 1 0   FS1   JFT H DAC=SC ITSTB CHOLD
200   1 135--1 1  0 3--17 17--0 7 1 0   FT    JAS
201   1 134--1 1 15 0--17 17--0 5 0 4   FW    JAS DPOSPK=AC CSELB
202   0 162--1 1  0 3--11 17--0 7 1 0   FD    JFF H QB9
203   0 161--1 1  0 3--11 17--0 5 0 4   FE    JFF H QB9 DPOSPK=AC
204   0 121--1 1 17 3--17 17--0 0 1 7   JO    JJP H DAC=REF+1
                                        *
                                        *
                                        *      INPUT SET UP ROUTINE
205   0  64--1 1 11 3-- 2 17--0 0 1 1   GD    JGF H DAC=SCAN+1024 QB2
206   1  32--1 1  0 3-- 2 17--0 4 0 6   CE1   JBH DAC=VDC&B QB2
207   0   2--1 1  0 3--17  4--0 7 1 0   DR    JDT H ITSTA
210   0   1--1 1  0 3--17  4--0 4 1 1   DQ1   JDT H DAC=SCAN ITSTA
211   0  12--1 1  0 3--17 17--0 4 0 6   DT    JDW H DAC=VDC&B
212   1   1--1 1  0 3-- 1 17--0 7 0 0   DM    JDS DB=AC QB1
213   0   1--1 1 15 2-- 0 17--0 7 1 0   DS    H QB0 SSELB
214   1   4--1 1 13 2--17 17--0 4 0 6   DU    JJC DAC=VDC&B SSELA
215   0   1--1 1  0 3--17 17--0 7 1 0   DV    H
216   1   4--1 1 13 0--17 17--0 4 0 6   JB    JJF DAC=VDC&B CSELA
217   1   2--1 1 13 2--17 17--0 4 0 6   JA    JJE DAC=VDC&B SSELA
220   0  15--1 1 10 2--11 17--0 7 1 0   JC    JJM H QB9 SFLGA
221   0  14--1 1 10 2--11 17--0 7 1 0   JE    JJM H QB9 SFLGA
222   0  13--1 1 10 0--11 17--0 7 1 0   JF    JJM H QB9 CFLGA
223   0   1--1 1 10 2-- 4 17--0 4 0 6   DW    H DAC=VDC&B QB4 SFLGA
224   0   1--1 1 15 0-- 3 17--0 7 1 0   DZ    H QB3 CSELB
225   0   4--1 1 13 0--17 17--0 7 1 0   JG    JJI H CSELA
226   1   1--1 1 13 0--17 17--0 4 0 6   JH    DAC=VDC&B CSELA
227   0   6--1 1  0 3--11 17--0 7 1 0   JL    JJM H QB9
230   0   5--1 1 10 2--11 17--0 7 1 0   JK    JJM H QB9 SFLGA
231   1 171--1 1 15 2--17 17--0 4 0 6   JI    JJF DAC=VDC&B SSELB
232   1 176--1 1 13 2--17 17--0 4 0 6   JJ    JJK DAC=VDC&B SSELA
233   0 177--1 1 15 0--17 17--0 7 1 0   DE    JJJ H CSELB
234   0 127--1 1  0 3--11 17--0 7 1 0   BD    JBF H QB9
235   0 150--1 1 17 2--17 17--0 4 0 6   JM    JGD DAC=VDC&B H SHOLD
                                        *
                                        *
                                        *      MARKER CHECK ROUTINE
236   0   1--1 1 12 2--17 17--0 7 1 0   ZA    JIV H SFLGC
237   0 145--0 1 14 2--17  7--0 4 0 7   IV    JJO H DAC=REF&B OMAR SCE
240   0   1--1 1 12 0-- 0 17--0 7 1 0   BH    JCV H QB0 CFLGC
241   1   3--1 1  1 3--17 17--0 0 1 1   CV    JCX DAC=SCAN+1032
242   1   1--1 1  0 3--17 17--0 4 0 6   CW    JCZ DAC=VDC&B
243   1   4--1 1  0 3-- 1 17--0 7 1 0   CZ    JDA QB1
244   0   4--1 1  2 3--17 17--0 0 1 1   CX    JDC1 H DAC=SCAN+8
```

```
245   0    3--1 1 12 2--17 17--0 7 1 0    CY     JDC1 H SFLGC
246   0    2--1 1  2 3--17 17--0 0 1 1    DB     JDC1 H DAC=SCAN+8
247   1  176--1 1  1 3--17 17--0 0 1 1    DA     JCY DAC=SCAN+1032
250   0    1--0 1 14 2--17  7--0 7 0 0    DC1    JDD H DB=AC OMAR SCE
251   0    1--1 1  2 3--17 17--0 0 1 1    DD     JDL H DAC=SCAN+8
252   0    1--1 1  0 3--17 17--1 1 1 3    DL     JZD H DAC=MKR-AC
253   1    1--1 1  0 3--16 17--0 7 1 0    ZD     JZE QPOS
254   0    2--1 1 14 0--17  1--0 5 1 0    ZE     JFM1 H DSC=B IMEM CCE
255   0   10--1 0  0 3--17  3--0 7 1 0    FM     JFN H W ITSIB
256   0    7--1 1  0 3--17  3--0 7 1 0    FM1    JFN H ITSIB
257   1    1--1 1 13 3--17  4--0 3 1 0    DO     JDX DAC=SC/2048 ITSTA
260   1    1--0 1  0 3-- 6  3--0 7 0 0    DX     JDY DB=AC OMDR QFLGTC
261   1    1--1 1  0 3--17 17--0 7 1 0    DY     JFU
262   0    2--1 1  2 3--17 17--0 0 1 1    FU     JFL H DAC=SCAN+8
263   0    1--1 1  1 3--17 17--0 0 1 1    FV     JFL H DAC=SCAN+1032
264   0  171--0 0 14 2--17  7--0 7 0 0    FL     JFM H W DB=AC OMAR SCE
265   0    1--1 0 12 0--11 17--0 7 1 0    FN     JFO H W CFLGC QB9
266   0  150--1 0 14 0--17 17--0 7 1 0    FO     JZA H W CCE
                                          *
                                          *
                                          *       WRITE ROUTINE
267   1  113--0 1  0 3--17 13--0 2 0 6    IU     JFD DAC=VDC*0&B OHSRS
270   1  112--1 1  0 3--17 17--0 2 0 6    FC     JFD DAC=VDC*0&B
271   0    1--1 1  0 3--17 17--0 7 1 0    GF     JGG H
272   0    2--0 1 14 2--17  7--0 2 0 1    GG     JGI H DAC=SCAN&B OMAR SCE
273   0    1--0 1 14 2--17  7--0 7 0 0    GH     JGI H DB=AC OMAR SCE
274   0    1--1 1 17 3--17 17--0 1 1 2    GI     JGJ H DAC=SOFR-1
275   0    1--1 1  0 3--17  4--1 1 1 1    GJ     JGK H DAC=SCAN-AC ITSTA
276   1    1--0 1  0 3-- 4  4--0 7 0 0    GK     JGL DB=AC ORAMP QFLGTB
277   0    1--1 1 14 0--17  1--0 5 1 5    GL     JGM H DT=B IMEM CCE
300   0    2--1 1  0 3--17 17--0 4 0 5    GM     JGN H DAC=T&B
301   0  172--1 1 11 0--17 17--0 4 1 1    GE     JIR H DAC=SCAN CFLGB
302   1    1--1 1  0 3--12 17--0 4 0 6    GN     JGO DAC=VDC&B QB10
303   1    1--1 1 10 3-- 2 17--0 2 1 5    GO     JGP DAC=T*1023 QB2
304   1    2--1 1  0 3--17 17--0 7 1 0    GP     JGR
305   1    1--1 1 14 3--17 17--0 3 1 5    GQ     JGR DAC=T/3072
306   0    2--1 1  0 3--17 17--0 5 0 5    GR     JGS H DT=AC
307   0   27--1 1  0 3--17 17--0 5 0 5    HL     JHN H DT=AC
310   1    1--1 1  0 3--17 17--0 4 0 6    GS     JGT DAC=VDC&B
311   0    1--1 1  0 3-- 1 17--0 4 1 5    GT     JGU H DAC=T QB1
312   0    2--1 1  0 3--17 17--1 1 1 4    GU     JGV H DAC=POSPK-AC
313   1   55--1 1 17 3--17 17--0 0 1 1    IP     JIU DAC=SCAN+1
314   1    2--1 1  0 3--17 17--0 4 0 6    GV     JGW DAC=VDC&B
315   1   11--1 1  0 3--16 17--0 7 1 0    HD     JHE QPOS
316   1    1--0 1  0 3-- 0  3--0 4 0 0    GW     JGX DAC=SC&B OMDR QB0
317   0    1--1 1 11 3--17 17--0 0 1 1    GX     JGY H DAC=SCAN+1024
320   0    2--0 0 14 2--17  7--0 4 0 1    GY     JHA H W DAC=SCAN&B OMAR SCE
321   0    1--0 0 14 2--17  7--0 7 0 0    GZ     JHA H W DB=AC OMAR SCE
322   0    1--1 0  0 3--17 17--0 7 1 0    HA     JHB H W
323   1    1--1 0 12 3--17 17--0 3 0 6    HB     JHC W DAC=VDC/2047&B
324   1  167--1 0 14 0--11 17--0 5 0 5    HC     JIP W CCE DNEGPK=AC QB9
325   0  142--1 1  0 3-- 3 17--0 7 1 0    IT     JIU H QFLGTA
326   0    1--0 1  0 3--17  3--0 4 0 5    HE     JHG H DAC=T&B OMDR
327   0    2--0 0 14 2--17  7--0 4 0 1    HG     JHH H W DAC=SCAN&B OMAR SCE
330   0  177--0 1  0 3--17  3--0 4 0 4    HF     JHG H DAC=POSPK&B OMDR
331   0    1--1 0 12 3--17 17--0 3 0 6    HH     JHI H W DAC=VDC/2047&B
332   0    1--1 0  0 3-- 0 17--0 5 0 5    HI     JHJ W DNEGPK=AC QB0 H
333   1    1--1 0 14 0--17 17--0 4 0 6    HJ     JIN W DAC=VDC&B CCE
334   1  157--1 1  0 3--11 17--0 7 1 0    IN     JIP QB9
335   0  157--1 1  0 3--17 17--0 7 1 0    GC     JGV H
336   1    1--1 1  0 3--17 17--0 4 0 6    HN     JHO DAC=VDC&B
337   1    1--1 1  0 3-- 1 17--0 4 1 5    HO     JHP DAC=T QB1
340   0    1--1 1  0 3--17 17--1 1 1 0    HP     JHQ H DAC=SC-AC
341   0    2--1 1  0 3--17 17--0 4 1 5    HQ     JHR H DAC=T
342   0   14--1 1  0 3--17 17--0 5 0 0    IB     JIC H DSC=AC
343   1    1--1 1  0 3--17 17--1 1 1 4    HR     JHS DAC=POSPK-AC
344   1    1--1 1  0 3--16 17--0 7 1 0    HS     JHT QPOS
345   1    1--0 1  0 3--17  3--0 4 0 5    HT     JHV DAC=T&B OMDR
346   0    2--1 1 11 3--17 17--0 0 1 1    HV     JHW H DAC=SCAN+1024
347   1  177--0 1  0 3--17  3--0 4 0 4    HU     JHV DAC=POSPK&B OMDR
350   0    1--0 0 14 2--17  7--0 7 0 0    HW     JHX H W DB=AC OMAR SCE
351   0    1--1 0 12 3--17 17--0 3 0 6    HX     JHY H W DAC=VDC/2047&B
352   0    1--1 0  0 3-- 0 17--0 5 0 5    HY     JHZ H W DNEGPK=AC QB0
353   1    1--1 0 14 0--17 17--0 4 0 6    HZ     JIO W DAC=VDC&B CCE
354   1  137--1 1  0 3--11 17--0 7 1 0    IO     JIP QB9
355   0  143--0 1  0 3--17  3--0 4 0 0    IA     JGY H DAC=SC&B OMDR
356   0    1--0 1 14 2--12  7--0 4 0 1    IC     JID H DAC=SCAN&B OMAR SCE QB10
357   0    1--1 1  0 3--17 17--0 4 0 6    ID     JIE H DAC=VDC&B
360   0    2--1 1 10 3-- 0 17--0 2 1 0    IE     JIF H DAC=SC*1023 QB0
361   0    1--1 1 14 3-- 0 17--0 3 1 0    IE1    JIF H DAC=SC/3072 QB0
362   1    1--1 1  0 3--17 17--0 5 0 4    IF     JIJ DPOSPK=AC
363   0    4--1 1 14 0--17  1--0 5 1 5    IJ     JIM H DT=B IMEM CCE
364   0  134--0 1 14 0--17  3--0 4 0 4    IH     JGY H DAC=POSPK&B OMDR CCE
365   1    1--1 1  0 3--12 17--0 7 1 0    IK     JIL QB10
366   1  116--1 1 10 3--17 17--0 2 1 5    IL     JGP DAC=T*1023
367   1  176--1 1  0 3--17 17--0 4 0 5    IM     JIK DAC=T&B
370   0    3--1 1  0 3--17 17--0 5 0 1    IQ     JIR H DSCAN=AC
371   1    1--1 1  0 3--17 17--0 5 0 1    XB     JXC DSCAN=AC
372   0    1--1 1 17 3--17 17--0 1 1 1    XC     JIR H DAC=SCAN-1
373   0    1--1 1  0 3--17 17--1 1 1 3    IR     JIS H DAC=MKR-AC
374   0  131--1 1  0 3--16  4--0 7 1 0    IS     JIT H ITSTA QPOS
                                          *
375   0   54--1 1  0 3-- 0 17--0 7 1 0    XA     JDJ H QB0
                                          *
                                          *
                                          *
                                          *END OF MAIN PROGRAM**********************************************
                                          *
                                          *
                                          *
                                          *
                                          *START OF  INTERRUPT PROGRAM****************************
                                          *
                                          *
                                          *
```

```
                                          *
                                                 ADRS 256                        \DISPLAY BLOCK
                                          *
400   1    1==1 1 14 0==17 17==0 5 0 6    REFCTL DSAVEA=AC CCE                   \REFRESH CONTROL
401   1    1==1 1  0 3==17  3==0 2 1 0           DAC=SCR*0 ITSTB
402   1    1==1 1  5 0== 2 17==0 5 0 0           DSCR=AC CLLGBLANK QB2
403   1    1==1 1  0 2==17  3==0 6 1 0           DAC=%SCR SLROMEN ITSTB
404   1    2==0 1 16 0== 5 11==0 5 0 5           J+2 DMA=AC CDOTEN QB5 ORSTO     \FS MODE ENABLED
405   1    2==1 1 16 0== 0 17==0 5 0 5           J+2 DMA=AC CDOTEN QB0           \FS MODE OFF
406   1   12==1 1  2 0==17  2==0 7 1 0           JIFS IRTN CBLINK                \INITIATE FAST SCAN
407   1    1==1 1  3 0==17  2==0 7 1 0           IRTN CFS                        \TIMER DONE?
410   0   55==0 1  2 0==17 15==0 4 1 6           JCORT DAC=SAVEA ODRTIMER H CBLINK  \YES START DISP REF
411   0  167==1 1  2 0==17 17==0 4 1 6           JREFCTL DAC=SAVEA H CBLINK      \NO WAIT FOR TIMER
412   1    1==1 1  0 3==17 17==0 5 0 6    FSTSCN DSAVEA=AC
413   1    1==1 1  0 3==17  3==0 5 1 7           ITSTB DCHR=B
414   1    2==1 1  6 3== 2 17==0 2 1 7           J+2 DAC=CHR*97 QB2
415   1    2==1 1  0 3==17  2==0 7 1 0           J+2 IRTN                        \1:FSEN 2,3:AC=0
416   1  177==1 1  0 3==14 17==0 2 1 7           J-1 DAC=CHR*0 QZERO             \1:FS DISB 2,3:AC#0
417   0   46==0 1  3 0==17 15==0 4 1 6           JCORT CFS ODRTIMER DAC=SAVEA H  \AC=0 REF DISPLAY
420   0  172==1 1  3 2==17 17==0 4 1 6    IFS    JFSTSCN H DAC=SAVEA SFS         \GO TO FAST SCAN
421   0  157==1 1  0 3==17 17==0 4 1 6           JREFCTL H DAC=SAVEA             \WAIT FOR RETRACE .
                                          *
422   1    1==1 1  1 0==17 17==0 5 0 6    GRAPH  DSAVEA=AC CCHAR                 \BEGIN GRAPH MODE
423   1    2==1 1 12 3==17 17==0 2 1 0           J+2 DAC=SCR*2047                \POSITIVE DATA
424   1    1==1 1  0 3==17 17==0 4 1 0           DAC=SCR                         \NEGATIVE DATA
425   1    1==1 1  0 3==17 17==1 1 1 3           DAC=THRESH-AC                   \COMPARE DATA
426   1    1==1 1 17 3==16 17==0 0 1 5           DAC=MA+1 QPOS                   \       TO THRESH
427   1    1==0 1  0 3==17  7==0 5 0 5           DMA=AC OMAR
430   1    2==1 1  0 3==17 17==0 4 0 0           J+2 DAC=SCR&B                   \DATA>THRESH
431   1    1==1 1  0 3==17 17==0 4 0 3           DAC=THRESH&B                    \DATA>=THRESH
432   1    1==1 1  0 3==12 17==0 5 0 0           DSCR=AC QB10
433   1    1==1 1 13 3==17  3==0 2 1 0           DAC=SCR*2048 ITSTB
434   1    2==0 1  0 3== 4  2==0 4 0 0           J+2 DAC=SCR&B OLGY QB4          \POS DATA TO Y LG
435   1    1==0 1  0 3== 4  2==0 5 0 0           DSCR=AC OLGY QB4                \ZERO TO Y LINE GEN
436   1    1==1 1 14 2==13 17==0 4 0 7           DAC=DELTAY&B SCE QB11
437   1    2==1 1 10 3==12 17==0 2 1 2           J+2 DAC=Y*1023 QB10
440   1    2==1 1 10 3==17 17==0 2 1 2           J+2 DAC=Y*1023                  \FIRST PT
441   1    5==1 1  5 2==17 17==1 1 1 0           JOLDDY DAC=SCR-AC SLLGBLANK     \BLANK BIT OFF
442   1    2==1 1  5 0==17 17==1 1 1 0           J+2 DAC=SCR-AC CLLGBLANK        \BLANK BIT SET
443   1    1==1 1  5 0==17 17==1 1 1 0           DAC=SCR-AC CLLGBLANK            \BLANK BIT SET
444   1    4==1 1  0 3==17 17==0 5 0 7           J+4 DDELTAY=AC
445   1    3==1 1  0 3==17 17==0 5 0 7           J+3 DDELTAY=AC
446   1    3==1 1  0 3==16 17==0 5 0 7    OLDDY  J+3 DDELTAY=AC QPOS             \OLD DELTAY>=0
447   1    1==1 1  0 3==16 17==0 5 0 7           DDELTAY=AC QPOS                 \OLD DELTAY<0
450   1    3==1 1 17 3==17 17==0 0 1 1           J+3 DAC=X+1
451   1    1==1 1 17 3==17 17==0 0 1 1           DAC=X+1
452   1    3==0 1 16 2==17  1==0 5 0 1           J+3 DX=AC OLGX SDOTEN           \DELTAY SIGN CHANGED
453   1    2==0 1 16 0==17  1==0 5 0 1           J+2 DX=AC OLGX CDOTEN           \DYSGN UNCHGD OR BLNK
454   1    1==0 1 16 2==17  1==0 5 0 1           DX=AC OLGX     SDOTEN           \DELTAY SIGN CHANGED
455   1    1==1 1  0 3==17 17==0 4 1 0           DAC=SCR
456   1    1==1 1 14 0==17  1==0 5 1 0           IMEM DSCR=B CCE                 \READ NEXT MEM WORD
457   1    1==1 1  7 0==13 17==0 5 0 2           DY=AC QB11 CFSTPT               \CLEAR FIRST PT FF
460   1    1==1 1  0 3==17 17==0 4 0 0           DAC=SCR&B
461   1    1==1 1  0 3==12 17==0 7 1 0           QB10
462   1   37==1 1  0 3==17  2==0 4 0 0    TOGRPH JGRLINK IRTN DAC=SCR&B
                                          *
463   0  115==1 1  0 3==17 17==0 4 1 6    RCLINK JREFCTL DAC=SAVEA H             \GO TO REF CONTROL
464   0  114==1 1  0 3==17 17==0 4 1 6           JREFCTL H DAC=SAVEA             \GO TO REF CONTROL
                                          *
465   1    1==1 1  1 0==17 17==0 5 0 6    CORT   DSAVEA=AC CCHAR                 \CONTROL OR THRESH
466   1    1==1 1  5 0==17 17==0 4 0 0           DAC=SCR&B CLLGBLANK
467   1    1==1 1  3 0==11 17==1 0 0 0           DAC=SCR+AC&B QB9 CFS
470   1    1==1 1  0 3== 5 17==1 0 1 0           DAC=SCR+AC QB5
471   1    2==1 1 10 3==17 17==0 3 1 5           J+2 DAC=MA/1023
472   1   14==1 1  0 3==17 17==1 0 1 0           JNEWTH DAC=SCR+AC               \GO TO NEW THRESHOLD
473   1    2==1 1  4 0==17 17==0 4 0 0           J+2 DAC=SCR&B CBRIGHT           \BRIGHT OFF
474   1  177==1 1  0 3==17 17==0 5 0 5           J-1 DMA=AC                      \SKIP PAGE
475   1    1==1 1 17 3== 3 17==0 0 1 5           DAC=MA+1 QB3
476   1    1==0 1 14 2==17  7==0 5 0 5           DMA=AC OMAR SCE
477   1    2==1 1  6 0==17 17==0 4 0 0           J+2 DAC=SCR&B CDIM              \DIM OFF
500   1    1==1 1  6 2==17 17==0 4 0 0           DAC=SCR&B SDIM                  \DIM ON
501   1    1==1 1 16 0== 4 17==0 5 0 4           DDC=AC CDOTEN QB4
502   1    1==0 1  0 3==17  5==0 2 0 4           DAC=DC*0&B OLGEXP               \EXPAND BITS TO LG
503   1    2==1 1  7 2== 7 17==0 7 1 0           J+2 QB7 SFSTPT                  \SET FIRST PT FF
504   1    1==0 1  7 2== 7  1==0 5 0 1           DX=AC OLGX QB7 SFSTPT           \CLEAR X POSITION
505   1   20==1 1 14 0==17  1==0 5 1 0           JDCMODE IMEM DSCR=B CCE         \READ NEXT MEM WORD
506   1    2==1 1  0 3==17 17==0 5 0 3    NEWTH  J+2 DTHRESH=AC                  \NEW THRESHOLD
507   1    1==1 1  0 3==17 17==0 5 0 3           DTHRESH=AC
510   1    1==1 1 17 3==12 17==0 0 1 5           DAC=MA+1 QB10
511   1    1==0 1 14 2==17  7==0 5 0 5           DMA=AC OMAR SCE
512   1    2==1 1 12 3==17 17==0 2 1 3           J+2 DAC=THRESH*2047             \POSITIVE THRESH
513   1    1==1 1  0 3==17 17==0 4 1 3           DAC=THRESH                      \NEGATIVE THRESH
514   1    1==1 1 16 0==17 17==0 5 0 3           DTHRESH=AC CDOTEN               \EXTEND SIGN
515   1    1==1 1  0 3==17 17==0 7 1 0           J+1
516   1    7==1 1 14 0==17  1==0 5 1 0           JDCMODE IMEM DSCR=B CCE         \READ NEXT MEM WORD
517   1    3==1 1  0 3==17  2==0 7 1 0    CLNEXT JCLLINK IRTN
520   1    3==1 1  0 3==17  2==0 4 0 4           J+3 DAC=DC&B IRTN
521   0  101==1 1  0 3==12 17==0 4 1 6    GRLINK JGRAPH H DAC=SAVEA QB10         \NEXT: GRAPH PT
522   0  143==1 1  0 3==17 17==0 4 1 6    CLLINK JCORT H DAC=SAVEA               \NEXT: CNTL WORD
523   0  142==1 1  0 3==17 17==0 4 1 6           JCORT H DAC=SAVEA
524   0   62==1 1  0 3== 3 17==0 4 1 6           JJUMP H DAC=SAVEA QB3           \NEXT: JUMP
525   1    2==0 1  0 3==13 14==0 4 0 4    DCMODE J+2 DAC=DC&B QB11 OCLRSA
526   1    1==0 1  4 2==13 14==0 4 0 4           DAC=DC&B QB11 SBRIGHT OCLRSA    \BRIGHT ON
527   1    1==0 1  0 0== 2  7==0 4 0 0           DAC=SCR&B QB2 OMAR CLROMEN      \NEXT MAY BE A CHAR
530   1    2==1 1  0 3==12 17==0 4 0 4           J+2 DAC=DC&B QB10
531   1    1==1 1  0 3==17 17==0 4 0 4           DAC=DC&B
532   1    2==1 1  0 3== 1 17==0 2 0 4           J+2 DAC=DC*0&B QB1
533   1  130==1 1  0 2==17  2==0 7 1 0           JRCLINK IRTN SLROMEN            \GO TO REF CONT LINK
534   1    2==1 1  0 3== 0 17==0 7 1 0           J+2 QB0
535   1  162==1 1  0 2== 0 17==0 7 1 0           JCLNEXT QB0 SLROMEN             \NEXT: CORT OR JUMP
536   1    4==1 1  0 3==17 17==0 5 0 7           J+4 DDELTAY=AC
537   1    1==1 1  0 2==17  2==0 4 0 4           DAC=DC&B SLROMEN IRTN
540   0   11==1 1  0 3==17 17==0 4 1 6           JVECTOR H DAC=SAVEA             \GO TO VECTOR
541   0   45==1 1  0 3== 3 17==0 4 1 6           JJUMP H DAC=SAVEA QB3           \GO TO JUMP
542   1    2==1 1 17 3==17 17==0 1 1 1           J+2 DAC=X-1
```

```
543  1  36--1 1  0 2--17  1--0 5 1 7         JTOCHR1 IMEM DCHR=B SLROMEN        \READ 1ST STROKE
544  1 116--1 1  0 2--17 17--0 5 0 1         JTOGRPH DX=AC SLROMEN              \NO X INCR ON 1ST PT
                                       *
545  0   4--1 1  0 3--17 17--0 4 1 6  VLINK  JVECTOR H DAC=SAVEA                \GO TO VECTOR
546  0 117--1 1  0 3--17 17--0 4 1 6  FROMSC JCORT H DAC=SAVEA                  \GO TO CORT
547  0  54--1 1  0 3--17 17--0 4 1 6  SCLINK JSTCNTL H DAC=SAVEA                \GO TO: SKIP TO CNTL
550  0  53--1 1  0 3--17 17--0 4 1 6         JSTCNTL H DAC=SAVEA                \GO TO: SKIP TO CNTL
                                       *
551  1   1--1 1  1 0--17 17--0 5 0 6  VECTOR DSAVEA=AC CCHAR                    \VECTOR MODE
552  1   1--1 1 17 3--17 17--0 0 1 5         DAC=MA+1
553  1   1--0 1 14 2--17  7--0 5 0 5         DMA=AC OMAR SCE
554  1   1--1 1  0 3--17 17--0 4 0 0         DAC=SCR&B
555  1   1--1 1 17 3--13 17--0 0 1 5         DAC=MA+1 QB11
556  1   1--0 1  0 3--17  7--0 5 0 5         DMA=AC OMAR
557  1   3--1 1  0 3--17 17--0 4 0 0         J+3 DAC=SCR&B                      \ABSOLUTE VECTOR
560  1   1--1 1  0 3--17 17--0 4 1 1         DAC=X                              \INCREMENTAL VECTOR
561  1   1--1 1  0 3--17 17--1 0 0 0         DAC=SCR+AC&B
562  1   1--0 1 16 0--13  1--0 5 0 1         DX=AC OLGX QB11 CDOTEN             \SEND X TO LG
563  1   1--1 1 14 0--17  1--0 5 1 0         IMEM DSCR=B CCE
564  1   3--1 1 14 2--13 17--0 7 1 0         J+3 SCE QB11                       \ABSOLUTE VECTOR
565  1   1--1 1 14 2--13 17--0 4 1 2         DAC=Y QB11 SCE                     \INCREMENTAL VECTOR
566  1   2--1 1  0 3--17 17--1 0 0 0         J+2 DAC=SCR+AC&B
567  1   1--1 1  0 3--17 17--0 4 0 0         J+1 DAC=SCR&B
570  1   2--0 1  5 2--12  2--0 5 0 2         J+2 DY=AC OLGY SLLGBLANK QB10      \Y TO LG & UNBLANK
571  1   1--0 1  5 0--17  2--0 5 0 2         DY=AC OLGY CLLGBLANK               \Y TO LG & BLANK
572  1   1--1 1 17 3--17 17--0 1 1 5         DAC=MA-1
573  1   2--1 1 14 0--17  1--0 5 1 0         J+2 IMEM DSCR=B CCE
574  1 152--1 1 14 0--17  2--0 5 0 5         JFROMSC DMA=AC IRTN CCE            \NEXT: CONTROL WORD
575  1   1--1 1  0 3--13 17--0 7 1 0         QB11
576  1   1--1 1  0 3--17 17--0 4 0 0         DAC=SCR&B
577  1   1--1 1  0 3--12 17--0 7 1 0         QB10
600  1 145--1 1  0 3--17  2--0 7 1 0         JVLINK IRTN
                                       *
601  1  50--1 1  3 3--17 17--0 2 1 7  TOCHR1 JTOCHR2 DAC=CHR*15                 \GOING TO CHAR MODE
                                       *
602  1   3--1 1 17 3--11 17--0 1 1 5  SCCORT J+3 DAC=MA-1 QB9
603  1   1--1 1  0 3--11 17--0 4 1 5  CTLTST DAC=MA QB9
604  1 143--1 1  0 3--17  2--0 7 1 0         JSCLINK IRTN                       \GO TO: SKIP TO CNTL
605  1 141--1 1  0 3--17  2--0 5 0 5         JFROMSC IRTN DMA=AC
                                       *
606  1   3--1 1  0 3--17 17--0 5 0 6  JUMP   JSTC1 DSAVEA=AC                    \JUMP ROUTINES
607  1  10--1 1  0 3--17 17--0 4 1 5  JSB    JSAVERA DAC=MA
610  1  15--0 1 14 2--17  7--0 5 0 5  STC2   JSTC3 DMA=AC OMAR SCE
611  1 177--1 1  0 3--17 17--0 4 1 5  STC1   J-1 DAC=MA
612  1   1--1 1  0 3--17 17--0 4 0 4         DAC=DC&B
613  1   1--1 1  0 3-- 7 17--0 4 0 4         DAC=DC&B QB7
614  1   1--1 1  0 3-- 6 17--0 7 1 0         QB6
615  1   3--1 1  2 3--17 17--0 1 1 3         JJMP DAC=THRESH-4
616  1 171--1 1 17 3--17 17--0 0 1 7         JJSB DAC=RA+1
617  1   1--1 1  0 3--17 17--0 5 0 7  SAVERA DRA=AC                            \SAVE RTN ADRS
620  1 170--1 1  0 3--17 17--0 4 1 0  JMP    JSTC2 DAC=SCR
621  1   1--1 1  0 3--14 17--0 5 0 3  DSZ    DTHRESH=AC QZERO
622  1 166--1 1  1 3--17 17--0 0 1 5         JSTC2 DAC=MA+2
623  1   1--1 1  0 3--17 17--0 5 0 6  STCNTL DSAVEA=AC
624  1 164--1 1 17 3--17 17--0 0 1 5         JSTC2 DAC=MA+1
625  1   1--1 1  0 3--17 17--0 7 1 0  STC3   J+1
626  1   1--1 1  5 0--17 17--0 7 1 0         CLLGBLANK                          \BLANK
627  1   1--1 1 17 3--17 17--0 0 1 5         DAC=MA+1
630  1   1--1 1 14 0--17  1--0 5 1 0         IMEM DSCR=B CCE                    \READ NEXT WORD
631  1   1--0 1 14 2--13  7--0 5 0 5         DMA=AC OMAR SCE QB11
632  1   1--1 1 16 0--17 17--0 4 0 0         DAC=SCR&B CDOTEN                   \DOT OFF
633  1   2--1 1  0 3--12 17--0 7 1 0         J+2 QB10
634  1   1--1 1  0 3--17 17--0 7 1 0         J+1
635  1   1--1 1 17 3--17 17--0 0 1 5         DAC=MA+1
636  1   2--1 1 14 0--17  1--0 5 1 0         J+2 IMEM DSCR=B CCE                \READ NEXT WORD
637  1 143--1 1 14 0--17 17--0 4 0 0         JSCCORT DAC=SCR&B CCE              \MAY BE A CNTL WORD
640  1   1--0 1 14 2--13  7--0 5 0 5         DMA=AC OMAR SCE QB11
641  1   1--1 1  0 3--17 17--0 4 0 0         DAC=SCR&B
642  1   2--1 1  0 3--12 17--0 7 1 0         J+2 QB10
643  1   1--1 1  0 3--17 17--0 7 1 0         J+1
644  1   1--1 1  0 3--17 17--0 7 1 0         J+1
645  1   2--1 1 14 0--17  1--0 5 1 0         J+2 IMEM DSCR=B CCE                \READ NEXT WORD
646  1 134--1 1 14 0--17 17--0 4 0 0         JSCCORT DAC=SCR&B CCE              \MAY BE A CNTL WORD
647  1   1--1 1  0 3--13 17--0 4 0 0         DAC=SCR&B QB11
650  1 133--1 1  0 3--12 17--0 4 0 0         JCTLTST DAC=SCR&B QB10
                                       *
651  1  45--1 1  0 3--14 17--0 4 1 1  TOCHR2 JTOCHR3 DAC=X QZERO                \GOING TO CHAR MODE
                                       *
652  1   1--0 1  0 3--17 12--0 5 0 6  CHARAC DSAVEA=AC OINCRSA                  \CHARACTER MODE
653  1   1--0 1  0 0--17  7--0 4 0 0         DAC=SCR&B OMAR CLROMEN
654  1   1--1 1  0 3--17 17--0 4 0 7         DAC=CHR&B
655  1   1--1 1  1 0-- 7 17--0 7 1 0         CCHAR QB7
656  1   1--1 1 17 3--17 17--0 0 1 5         DAC=MA+1
657  1   2--1 1  5 2--17 17--0 7 1 0         J+2 SLLGBLANK                      \UNBLANK STROKE
660  1   1--1 1  5 0--17 17--0 7 1 0         CLLGBLANK                          \BLANK STROKE
661  1   1--1 1  0 2--17  1--0 5 1 4         IMEM DDC=B SLROMEN                 \READ NEXT STROKE
662  1   1--0 1 14 2--17  7--0 5 0 5         DMA=AC OMAR SCE
663  1   1--1 1  7 3--17 17--0 2 1 4         DAC=DC*255
664  1   1--0 1  0 3--14  1--0 4 0 1         DAC=X&B OLGX QZERO                 \X POSITION TO LG
665  1   1--0 1  1 2--17  0--0 4 0 7         DAC=CHR&B OLGCHAR SCHAR            \CHAR STROKE TO LG
666  1  14--0 1 16 0--17 14--0 7 1 0         JCHREND OCLRSA CDOTEN              \GO TO END OF CHAR
667  1   1--1 1 17 3--17  3--0 1 1 5         DAC=MA-1 ITST6                     \CONTINUE CHAR
670  1   1--1 1 14 0--13 17--0 5 0 5         DMA=AC CCE QB11                    \RESTORE MEM ADRS
671  1   1--1 1 16 0--17 17--0 4 1 4         DAC=DC CDOTEN                      \DOT OFF
672  1  26--1 1  0 3--17  2--0 5 0 7         JGOCHAR DCHR=AC IRTN               \GO DO NEXT STROKE
673  1   1--0 1  0 3--17  7--0 5 0 0         DSCR=AC OMAR                       \LINK TO NXT STROKE
674  1   1--0 1  0 0--17 14--0 7 1 0         OCLRSA CLROMEN
675  1   1--1 1  0 3--17 17--0 7 1 0         J+1
676  1   1--1 1  0 3--17 17--0 7 1 0         J+1
677  1   1--1 1  0 3--17 17--0 7 1 0         J+1
700  1   1--1 1  0 3--17  2--0 4 1 6         DAC=SAVEA IRTN
701  0 151--1 1  0 2--17  1--0 5 1 7         JCHARAC H IMEM DCHR=B SLROMEN      \GO DO NXT STROKE
702  1   1--1 1 14 0--17  1--0 5 1 0  CHREND IMEM CCE DSCR=B                    \GET NXT CHAR CODE
703  1   1--0 1  0 0--13  7--0 4 0 0         DAC=SCR&B OMAR CLROMEN QB11
704  1   1--1 1 17 3--12 17--0 0 1 4         DAC=DC+1 QB10                      \RESTORE DC REG
```

```
705    1    3--1 1  0 3--17 17--0 5 0 4           J+3 DDC=AC
706    1    1--1 1  0 3--17 17--0 5 0 4           DDC=AC
707    1    3--1 1  0 3--17 17--0 7 1 0           J+3
710    1    2--1 1  0 3--17 17--0 7 1 0           J+2
711    1   66--1 1  0 2--17  2--0 7 1 0           JFROMCH IRTN SLROMEN            \GO TO CORT
712    1    1--1 1  0 3--17 17--0 7 1 0           J+1
713    1    1--1 1  0 2--17  1--0 5 1 7           IMEM DCHR=B SLROMEN             \GET 1ST STROKE
714    1    1--1 1  3 3--17 17--0 2 1 7           DAC=CHR*15
715    1    1--1 1  4 3--14 17--0 0 1 1           DAC=X+16 QZERO                  \X TO NXT CHR POSN
716    1    1--1 1  0 3--17  2--0 5 0 1    TOCHR3 DX=AC IRTN
717    0    2--1 1  0 3--17 17--0 4 1 6    CHLINK JSPCHAR H DAC=SAVEA             \GO TO SPEC CHAR
720    0  132--1 1  0 3--17 17--0 4 1 6    GOCHAR JCHARAC H DAC=SAVEA             \GO TO CHARACTER
                                           *
721    1    1--1 1  1 0--17 17--0 5 0 6    SPCHAR DSAVEA=AC CCHAR                 \SPEC CHAR MODE
722    1    1--1 1 17 3--17 17--0 0 1 5           DAC=MA+1
723    1    1--0 1 14 2--17  7--0 7 0 0           DB=AC SCE OMAR
724    1    1--1 1  0 3--17 17--0 4 0 7           DAC=CHR&B
725    1    1--0 1  0 3-- 7 14--0 4 0 7           DAC=CHR&B OCLRSA QB7
726    1    1--1 1 15 3-- 6 17--0 3 0 7           DAC=CHR/4032&B QB6
727    1   13--1 1  0 3-- 5 17--0 4 0 7           JCHR6A0 DAC=CHR&B QB5           \CHR(7)=0
730    1    1--1 1  0 3--17 17--1 3 1 5           DAC=MA/AC                       \CHR(7)=1
731    1    7--1 1 14 0--17  1--0 5 1 0           JFMFD IMEM DSCR=B CCE
732    1    1--1 1 14 0--17 17--1 1 1 5    SKIP   DAC=MA-AC CCE                   \SKIP 32 OR 64
733    1    1--0 1 14 2--17  7--0 5 0 5           DMA=AC OMAR SCE
734    1    1--1 1 17 3--17 17--0 1 1 5           DAC=MA-1
735    1    1--1 1  0 3--17 17--0 5 0 5           DMA=AC
736    1    1--1 1  0 3--17 17--0 7 1 0           J+1
737    1   16--1 1 14 0--17  1--0 5 1 0           JCHR5A1 IMEM CCE DSCR=B         \READ NEXT WORD
740    1    1--0 1  0 3--17  7--0 2 0 0    FMFD   DAC=SCR*0&B OMAR                \CLEAR X AND Y POSN
741    1   21--0 1  0 0--13  2--0 5 0 2           JSCHARX DY=AC OLGY CLROMEN QB11
742    1   12--1 1 14 0-- 4  1--0 5 1 0    CHR6A0 JCHR5A0 IMEM DSCR=B CCE QB4     \CHR(6)=0
743    1    1--1 1 14 0-- 4  1--0 5 1 0           IMEM DSCR=B CCE QB4             \CHR(6)=1
744    1    5--0 1  0 0--17  7--0 4 0 0           JNBLINK DAC=SCR&B OMAR CLROMEN  \CHR(5)=0
745    1    1--0 1  0 0--17  7--0 4 0 0           DAC=SCR&B OMAR CLROMEN          \CHR(5)=1
746    1    2--1 1  5 3--13 17--0 0 1 2    VTAB   JSCHARY DAC=Y+32 QB11           \VERTICAL TAB
747    1    1--1 1  5 3--13 17--0 1 1 2    LNFD   DAC=Y-32 QB11                   \LINE FEED
750    1   13--0 1  0 3--17  2--0 5 0 2    SCHARY JSCHARD DY=AC OLGY              \Y POSN TO LG
751    1    2--1 1  2 0--13 17--0 7 1 0    NBLINK JSCHARN CBLINK QB11             \BLINK OFF
752    1    1--1 1  2 2--13 17--0 7 1 0           JSCHARN SBLINK QB11             \BLINK ON
753    1   10--1 1  0 3--17 17--0 7 1 0    SCHARN JSCHARD
754    1    4--0 1  0 0--17  7--0 4 0 0    CHR5A0 JSPACE DAC=SCR&B OMAR CLROMEN   \CHR(5)=0
755    1    1--0 1  0 0--17  7--0 4 0 0    CHR5A1 DAC=SCR&B OMAR CLROMEN          \CHR(5)=1
756    1  175--1 1  0 3--13 17--0 7 1 0    NULL   JSCHARN QB11                    \NULL CHARACTER
757    1    3--1 1  0 3--13 17--0 2 1 0    CR     JSCHARX DAC=SCR*0 QB11          \CARRIAGE RETURN
760    1    2--1 1  4 3--13 17--0 0 1 1    SPACE  JSCHARX DAC=X+16 QB11           \SPACE
761    1    1--1 1  4 3--13 17--0 1 1 1    BS     JSCHARX DAC=X-16 QB11           \BACKSPACE
762    1    1--0 1  0 3--17  1--0 5 0 1    SCHARX DX=AC OLGX                      \X POSN TO LG
763    1    3--1 1 16 0--17 17--0 4 0 0    SCHARD J+3 DAC=SCR&B CDOTEN            \DOT OFF
764    1    1--1 1 16 0--17 17--0 7 1 0           CDOTEN                          \DOT OFF
765    1    2--1 1 17 3--17 17--0 0 1 5           J+2 DAC=MA+1
766    1    1--1 1 17 3--12 17--0 0 1 5           DAC=MA+1 QB10
767    1    1--1 1  0 2--17  1--0 5 1 7           IMEM DCHR=B SLROMEN             \GET NXT 1ST STRK
770    1    2--1 1  3 3--17 17--0 2 1 7           J+2 DAC=CHR*15
771    1    6--1 1  5 0--17  2--0 5 0 5           JFROMCH DMA=AC CLLGBLANK IRTN   \GO TO CORT
772    1    1--1 1 17 3--14 17--0 0 1 5           DAC=MA+1 QZERO
773    1  124--1 1  5 0--17  2--0 5 0 5           JCHLINK IRTN DMA=AC CLLGBLANK   \END OF SP CHAR
                                                  ADRS 511
777    0   66--1 1  0 3--17 17--0 4 1 6    FROMCH JCORT H DAC=SAVEA               \GO TO CORT
                                                  END
```

NO ERRORS ???

| | | | | | | | |
|---|---|---|---|---|---|---|---|
| 0 | 0 | 1 | 17 | 1023 | 10 | 1024 | 11 |
| 1032 | 1 | 15 | 3 | 16 | 4 | 2 | 1 |
| 2047 | 12 | 2048 | 13 | 255 | 7 | 3072 | 14 |
| 32 | 5 | 4 | 2 | 4032 | 15 | 4095 | 16 |
| 8 | 2 | 97 | 6 | AA | 102 | AB | 35 |
| AC | 36 | AD | 40 | ADC | 0 | AE | 41 |
| AF | 43 | AG | 44 | AH | 46 | AI | 45 |
| AJ | 42 | AK | 47 | AM | 52 | AN | 53 |
| AO | 54 | AP | 121 | AQ | 120 | AS | 135 |
| AT | 151 | AU | 154 | AV | 155 | AW | 137 |
| AX | 161 | AY | 140 | AZ | 147 | B0 | 0 |
| B1 | 1 | B10 | 12 | B11 | 13 | B2 | 2 |
| B3 | 3 | B4 | 4 | B5 | 5 | B6 | 6 |
| B7 | 7 | B8 | 10 | B9 | 11 | BA | 141 |
| BB | 162 | BC | 143 | BD | 234 | BE | 144 |
| BF | 163 | BG | 146 | BH | 240 | BI | 150 |
| BJ | 145 | BK | 136 | BL | 37 | BLINK | 2 |
| BM | 32 | BN | 33 | BO | 31 | BP | 27 |
| BPCAD | 6 | BPCD | 7 | BPCO | 6 | BPCR | 0 |
| BQ | 30 | BR | 23 | BRIGHT | 4 | BS | 761 |
| BS1 | 24 | BT | 25 | BU | 26 | BV | 12 |
| BW | 13 | BX | 14 | BY | 15 | BZ | 16 |
| CA | 17 | CB | 20 | CC | 21 | CD | 6 |
| CE | 14 | CE1 | 206 | CF | 1 | CG | 7 |
| CH | 2 | CHAR | 1 | CHARAC | 652 | CHLINK | 717 |
| CHR | 7 | CHR5A0 | 754 | CHR5A1 | 755 | CHR6A0 | 742 |
| CHREND | 702 | CI | 10 | CJ | 3 | CK | 11 |
| CL | 4 | CLLINK | 522 | CLNEXT | 517 | CLRSA | 14 |
| CM | 5 | CN | 34 | CO | 22 | CORT | 465 |
| CP | 56 | CQ | 55 | CR | 757 | CRSEN | 17 |
| CS | 134 | CT | 153 | CTLTS1 | 603 | CU | 152 |
| CV | 241 | CW | 242 | CX | 244 | CY | 245 |
| CZ | 243 | DA | 247 | DB | 246 | DC | 4 |
| DC1 | 250 | DCMODE | 525 | DD | 251 | DE | 233 |
| DELTAY | 7 | DF | 167 | DI | 50 | DIM | 6 |
| DJ | 51 | DL | 252 | DM | 212 | DN | 156 |
| DN1 | 157 | DO | 257 | DOTEN | 16 | DP | 142 |
| DQ | 160 | DQ1 | 210 | DR | 207 | DRTIMER | 15 |
| DS | 213 | DS2 | 621 | DT | 211 | DU | 214 |
| DV | 215 | DW | 223 | DX | 260 | DY | 261 |
| DZ | 224 | EA | 65 | EB | 64 | EC | 66 |
| ED | 72 | EE | 67 | EF | 73 | EG | 71 |
| EH | 70 | EI | 74 | EJ | 75 | EK | 122 |

| | | | | | | | |
|---|---|---|---|---|---|---|---|
| EL | 100 | EM | 57 | EN | 103 | EO | 104 |
| EP | 106 | EQ | 107 | ER | 105 | ES | 114 |
| ET | 110 | EU | 115 | EV | 112 | EW | 116 |
| EX | 111 | EY | 117 | EZ | 113 | FA | 124 |
| FB | 133 | FC | 270 | FD | 202 | FE | 203 |
| FF | 164 | FG | 166 | FH | 165 | FI | 170 |
| FJ | 174 | FK | 172 | FL | 264 | FLGA | 10 |
| FLGB | 11 | FLGC | 12 | FLGTA | 3 | FLGTB | 4 |
| FLGTC | 6 | FM | 255 | FM1 | 256 | FMFD | 740 |
| FN | 265 | FO | 266 | FP | 171 | FQ | 176 |
| FR | 175 | FROMCH | 777 | FROMSC | 546 | FS | 3 |
| FS1 | 177 | FSIPT | 7 | FSTSCN | 412 | FT | 200 |
| FU | 262 | FV | 263 | FW | 201 | GB | 123 |
| GC | 335 | GD | 205 | GE | 301 | GF | 271 |
| GG | 272 | GH | 273 | GI | 274 | GJ | 275 |
| GK | 276 | GL | 277 | GM | 300 | GN | 302 |
| GO | 303 | GOCHAR | 720 | GP | 304 | GQ | 305 |
| GR | 306 | GRAPH | 422 | GRLINK | 521 | GS | 310 |
| GT | 311 | GU | 312 | GV | 314 | GW | 316 |
| GX | 317 | GY | 320 | GZ | 321 | HA | 322 |
| HB | 323 | HC | 324 | HD | 315 | HE | 326 |
| HF | 330 | HG | 327 | HH | 331 | HI | 332 |
| HJ | 333 | HK | 0 | HL | 307 | HN | 336 |
| HO | 337 | HOLD | 17 | HP | 340 | HQ | 341 |
| HR | 343 | HS | 344 | HSRS | 13 | HT | 345 |
| HU | 347 | HV | 346 | HW | 350 | HX | 351 |
| HY | 352 | HZ | 353 | IA | 355 | IB | 342 |
| IC | 356 | ID | 357 | IE | 360 | IE1 | 361 |
| IF | 362 | IFS | 420 | IH | 364 | IJ | 363 |
| IK | 365 | IL | 366 | IM | 367 | IN | 334 |
| INCRSA | 12 | IO | 354 | IP | 313 | IQ | 370 |
| IR | 373 | IS | 374 | IT | 325 | IU | 267 |
| IV | 237 | JA | 217 | JB | 216 | JC | 220 |
| JE | 221 | JF | 222 | JG | 225 | JH | 226 |
| JI | 231 | JJ | 232 | JK | 230 | JL | 227 |
| JM | 235 | JMP | 620 | JN | 131 | JO | 204 |
| JP | 125 | JQ | 127 | JR | 130 | JS | 126 |
| JSB | 607 | JT | 60 | JU | 61 | JUMP | 606 |
| JV | 63 | JW | 101 | JX | 62 | JY | 76 |
| JZ | 77 | LGCHAR | 0 | LGEXP | 5 | LGX | 1 |
| LGY | 2 | LLGBLANK | 5 | LNFD | 747 | LROMEN | 0 |
| MA | 5 | MAR | 7 | MDR | 3 | MEM | 1 |
| MRR | 3 | NBLINK | 751 | NEGPK | 5 | NEWTH | 506 |
| NULL | 756 | OLDDY | 446 | POS | 16 | POSPK | 4 |
| RA | 7 | RAMP | 4 | RCLINK | 463 | REF | 7 |
| REFCIL | 400 | RSTO | 11 | RTN | 2 | SAVEA | 6 |
| SAVERA | 617 | SC | 0 | SCAN | 1 | SCCORT | 602 |
| SCHARD | 763 | SCHARN | 753 | SCHARX | 762 | SCHARY | 750 |
| SCLINK | 547 | SCR | 0 | SELA | 13 | SELB | 15 |
| SKIP | 732 | SRSEN | 16 | STC1 | 611 | STC2 | 610 |
| STC3 | 625 | STCNTL | 623 | STT | 10 | T | 5 |
| THRESH | 3 | TOCHR1 | 601 | TOCHR2 | 651 | TOCHR3 | 716 |
| TOGRPH | 462 | TSIA | 4 | TSIB | 3 | VDC | 6 |
| VECTOR | 551 | VLINK | 545 | VTAB | 746 | X | 1 |
| XA | 375 | XB | 371 | XC | 372 | XX | 173 |
| Y | 2 | ZA | 236 | ZB | 132 | ZD | 253 |
| ZE | 254 | ZERO | 14 | | | | |

RSPMAX=7 WSPMAX=42 NSPMAX=45 SSPMAX=1850 ASPMAX=0 BSPMAX=0
DSPMAX=401

FIG. 1

| | | | | | | | | | | | | | | | |
|---|---|---|---|---|---|---|---|---|---|---|---|---|---|---|---|
| 2 | 1 | 1 | 201 | 201 | 27 | 173 | 1 | 201 | 175 | 174 | 173 | 173 | 205 | 204 | 203 |
| 202 | 201 | 12 | 367 | 170 | 371 | 372 | 374 | 375 | 376 | 1 | 176 | 202 | 201 | 2 | 173 |
| 1 | 3 | 201 | 203 | 1 | 170 | 1 | 1 | 125 | 201 | 167 | 201 | 244 | 57 | 377 | 224 |
| 1 | 1 | 14 | 216 | 206 | 201 | 201 | 201 | 232 | 377 | 201 | 201 | 201 | 225 | 201 | 201 |
| 22 | 163 | 133 | 201 | 1 | 207 | 201 | 1 | 1 | 202 | 377 | 17 | 201 | 201 | 201 | 205 |
| 215 | 33 | 1 | 262 | 30 | 204 | 131 | 201 | 176 | 176 | 124 | 267 | 16 | 3 | 120 | 1 |
| 1 | 2 | 15 | 1 | 2 | 111 | 370 | 13 | 106 | 3 | 63 | 327 | 1 | 4 | 1 | 201 |
| 27 | 166 | 251 | 365 | 1 | 202 | 51 | 1 | 203 | 204 | 206 | 377 | 174 | 2 | 173 | 1 |
| 335 | 334 | 162 | 161 | 121 | 64 | 232 | 2 | 1 | 12 | 201 | 1 | 204 | 1 | 204 | 202 |
| 15 | 14 | 13 | 1 | 1 | 4 | 201 | 6 | 5 | 371 | 376 | 177 | 127 | 150 | 1 | 145 |
| 1 | 203 | 201 | 204 | 4 | 3 | 2 | 376 | 1 | 1 | 1 | 201 | 2 | 10 | 7 | 201 |
| 201 | 201 | 2 | 1 | 171 | 1 | 150 | 313 | 312 | 1 | 2 | 1 | 1 | 1 | 201 | 1 |
| 2 | 72 | 201 | 201 | 202 | 201 | 2 | 27 | 201 | 1 | 2 | 255 | 202 | 211 | 201 | 1 |
| 2 | 1 | 1 | 201 | 367 | 142 | 1 | 2 | 177 | 1 | 1 | 201 | 357 | 157 | 201 | 201 |
| 1 | 2 | 14 | 201 | 201 | 201 | 2 | 377 | 1 | 1 | 1 | 201 | 337 | 143 | 1 | 1 |
| 2 | 1 | 201 | 4 | 134 | 201 | 316 | 376 | 3 | 201 | 1 | 1 | 131 | 54 | 377 | 377 |
| 201 | 201 | 201 | 201 | 202 | 202 | 212 | 201 | 55 | 167 | 201 | 201 | 202 | 202 | 377 | 46 |
| 172 | 157 | 201 | 202 | 201 | 201 | 201 | 201 | 202 | 201 | 201 | 201 | 202 | 201 | 201 | 202 |
| 202 | 205 | 202 | 201 | 204 | 203 | 203 | 201 | 203 | 201 | 203 | 202 | 201 | 201 | 201 | 201 |
| 201 | 201 | 237 | 115 | 114 | 201 | 201 | 201 | 201 | 202 | 214 | 202 | 377 | 201 | 201 | 202 |
| 201 | 201 | 201 | 202 | 201 | 220 | 202 | 201 | 201 | 201 | 202 | 201 | 201 | 201 | 207 | 203 |
| 203 | 101 | 143 | 142 | 62 | 202 | 201 | 201 | 202 | 201 | 202 | 330 | 202 | 362 | 204 | 201 |
| 11 | 45 | 202 | 236 | 316 | 4 | 117 | 54 | 53 | 201 | 201 | 201 | 201 | 201 | 201 | 203 |
| 201 | 201 | 201 | 201 | 203 | 201 | 202 | 201 | 202 | 201 | 201 | 202 | 352 | 201 | 201 | 201 |
| 345 | 250 | 203 | 201 | 343 | 341 | 203 | 210 | 215 | 377 | 201 | 201 | 201 | 203 | 371 | 201 |
| 370 | 201 | 366 | 201 | 364 | 201 | 201 | 201 | 201 | 201 | 201 | 202 | 201 | 201 | 202 | 343 |
| 201 | 201 | 202 | 201 | 201 | 202 | 334 | 201 | 333 | 245 | 201 | 201 | 201 | 201 | 201 | 202 |
| 201 | 201 | 201 | 201 | 201 | 201 | 214 | 201 | 201 | 201 | 226 | 201 | 201 | 201 | 201 | 201 |
| 201 | 151 | 201 | 201 | 201 | 203 | 201 | 203 | 202 | 266 | 201 | 201 | 201 | 201 | 201 | 2 |
| 132 | 201 | 201 | 201 | 201 | 201 | 201 | 213 | 201 | 207 | 201 | 201 | 201 | 201 | 201 | 216 |
| 201 | 221 | 212 | 201 | 205 | 201 | 202 | 201 | 213 | 202 | 201 | 210 | 204 | 201 | 375 | 203 |
| 202 | 201 | 201 | 203 | 201 | 202 | 201 | 201 | 202 | 206 | 201 | 324 | 377 | 377 | 377 | 66 |

FIG. 2

| | | | | | | | | | | | | | | | |
|---|---|---|---|---|---|---|---|---|---|---|---|---|---|---|---|
| 303 | 303 | 302 | 103 | 360 | 156 | 162 | 277 | 203 | 260 | 303 | 303 | 62 | 303 | 303 | 303 |
| 303 | 303 | 103 | 377 | 103 | 377 | 377 | 303 | 303 | 303 | 366 | 303 | 377 | 377 | 360 | 360 |
| 156 | 162 | 353 | 303 | 377 | 374 | 303 | 303 | 303 | 350 | 303 | 376 | 150 | 156 | 360 | 303 |

| | | | | | | | | | | | | | | | |
|---|---|---|---|---|---|---|---|---|---|---|---|---|---|---|---|
| 103 | 344 | 356 | 364 | 303 | 303 | 342 | 303 | 303 | 303 | 340 | 303 | 303 | 303 | 364 | 303 |
| 376 | 356 | 166 | 303 | 303 | 303 | 303 | 303 | 366 | 354 | 303 | 340 | 303 | 303 | 303 | 303 |
| 146 | 174 | 376 | 303 | 103 | 303 | 374 | 376 | 303 | 360 | 303 | 366 | 366 | 374 | 342 | 303 |
| 303 | 162 | 374 | 377 | 303 | 342 | 360 | 344 | 342 | 303 | 352 | 303 | 346 | 162 | 374 | 303 |
| 177 | 377 | 360 | 303 | 303 | 303 | 342 | 303 | 376 | 376 | 303 | 303 | 303 | 303 | 303 | 374 |
| 303 | 364 | 303 | 303 | 377 | 347 | 303 | 303 | 303 | 303 | 303 | 366 | 356 | 303 | 354 | 356 |
| 342 | 342 | 340 | 342 | 364 | 354 | 354 | 303 | 342 | 366 | 356 | 364 | 303 | 376 | 352 | 162 |
| 356 | 307 | 303 | 303 | 313 | 352 | 313 | 307 | 162 | 313 | 303 | 303 | 360 | 203 | 303 | 357 |
| 103 | 303 | 313 | 307 | 62 | 250 | 260 | 103 | 303 | 303 | 162 | 162 | 377 | 303 | 103 | 360 |
| 303 | 344 | 303 | 343 | 303 | 363 | 303 | 303 | 303 | 303 | 303 | 377 | 303 | 303 | 103 | 347 |
| 62 | 62 | 203 | 253 | 260 | 303 | 103 | 62 | 103 | 253 | 203 | 260 | 303 | 303 | 303 | 303 |
| 303 | 303 | 303 | 303 | 303 | 103 | 347 | 103 | 62 | 253 | 203 | 260 | 303 | 103 | 162 | 303 |
| 343 | 363 | 303 | 360 | 160 | 303 | 343 | 303 | 303 | 303 | 377 | 303 | 303 | 303 | 377 | 377 |
| 360 | 303 | 324 | 302 | 170 | 370 | 310 | 314 | 110 | 310 | 303 | 303 | 333 | 303 | 303 | 114 |
| 316 | 303 | 304 | 353 | 303 | 303 | 377 | 103 | 303 | 303 | 303 | 357 | 103 | 103 | 362 | 343 |
| 343 | 326 | 324 | 324 | 303 | 303 | 303 | 303 | 377 | 377 | 172 | 170 | 172 | 303 | 360 | 334 |
| 303 | 303 | 303 | 303 | 303 | 304 | 324 | 314 | 303 | 343 | 303 | 320 | 303 | 377 | 162 | 330 |
| 332 | 370 | 103 | 336 | 136 | 360 | 303 | 303 | 377 | 162 | 353 | 303 | 370 | 303 | 360 | 303 |
| 303 | 303 | 303 | 303 | 303 | 103 | 122 | 100 | 303 | 303 | 303 | 302 | 303 | 302 | 303 | 302 |
| 303 | 303 | 377 | 302 | 302 | 303 | 303 | 303 | 303 | 304 | 377 | 162 | 303 | 377 | 103 | 303 |
| 303 | 303 | 170 | 360 | 362 | 362 | 303 | 303 | 126 | 124 | 377 | 360 | 360 | 303 | 303 | 303 |
| 303 | 317 | 377 | 303 | 303 | 303 | 303 | 303 | 162 | 303 | 303 | 303 | 303 | 313 | 377 | 303 |
| 303 | 303 | 307 | 303 | 377 | 303 | 324 | 377 | 360 | 162 | 370 | 303 | 303 | 377 | 360 | 360 |
| 162 | 303 | 303 | 303 | 303 | 360 | 360 | 303 | 303 | 303 | 103 | 100 | 303 | 304 | 377 | 326 |
| 324 | 302 | 162 | 337 | 103 | 106 | 170 | 377 | 360 | 370 | 303 | 103 | 100 | 303 | 303 | 303 |
| 303 | 302 | 360 | 100 | 377 | 303 | 303 | 303 | 303 | 302 | 303 | 302 | 317 | 323 | 303 | 303 |
| 303 | 304 | 377 | 162 | 303 | 103 | 367 | 303 | 303 | 360 | 360 | 162 | 377 | 303 | 303 | 360 |
| 103 | 100 | 360 | 360 | 100 | 100 | 327 | 327 | 103 | 310 | 312 | 303 | 100 | 100 | 303 | 303 |
| 323 | 323 | 103 | 370 | 370 | 377 | 377 | 302 | 317 | 324 | 377 | 324 | 377 | 377 | 377 | 303 |

ROW 3

| | | | | | | | | | | | | | | | |
|---|---|---|---|---|---|---|---|---|---|---|---|---|---|---|---|
| 377 | 377 | 377 | 373 | 361 | 366 | 367 | 377 | 377 | 377 | 367 | 377 | 367 | 367 | 367 | 377 |
| 377 | 367 | 366 | 377 | 363 | 377 | 377 | 21 | 21 | 46 | 366 | 66 | 363 | 363 | 237 | 377 |
| 364 | 367 | 377 | 217 | 366 | 17 | 377 | 377 | 364 | 377 | 377 | 237 | 377 | 153 | 364 | 364 |
| 137 | 364 | 377 | 77 | 377 | 377 | 357 | 377 | 377 | 377 | 357 | 377 | 377 | 377 | 77 | 77 |
| 377 | 377 | 16 | 77 | 377 | 377 | 377 | 357 | 363 | 237 | 363 | 377 | 357 | 377 | 377 | 377 |
| 364 | 364 | 377 | 377 | 370 | 364 | 377 | 364 | 100 | 57 | 377 | 377 | 377 | 377 | 377 | 17 |
| 366 | 7 | 364 | 363 | 237 | 377 | 364 | 177 | 377 | 17 | 237 | 366 | 366 | 7 | 364 | 117 |
| 136 | 364 | 363 | 364 | 377 | 124 | 377 | 57 | 364 | 364 | 377 | 360 | 57 | 60 | 57 | 363 |
| 377 | 377 | 237 | 237 | 377 | 57 | 57 | 364 | 364 | 377 | 37 | 17 | 377 | 377 | 377 | 377 |
| 237 | 237 | 237 | 117 | 77 | 377 | 377 | 237 | 237 | 377 | 377 | 377 | 237 | 377 | 377 | 367 |
| 17 | 377 | 377 | 37 | 377 | 377 | 377 | 377 | 367 | 377 | 377 | 357 | 361 | 363 | 363 | 364 |
| 143 | 377 | 377 | 377 | 367 | 237 | 377 | 373 | 377 | 377 | 367 | 367 | 377 | 364 | 104 | 361 |
| 377 | 377 | 257 | 57 | 377 | 377 | 377 | 377 | 377 | 37 | 377 | 377 | 377 | 357 | 3 | 377 |
| 367 | 367 | 377 | 377 | 237 | 77 | 363 | 367 | 363 | 377 | 17 | 377 | 237 | 377 | 377 | 37 |
| 377 | 377 | 377 | 377 | 357 | 363 | 377 | 363 | 367 | 377 | 17 | 377 | 237 | 363 | 247 | 377 |
| 17 | 17 | 377 | 361 | 363 | 257 | 377 | 377 | 377 | 377 | 377 | 377 | 344 | 17 | 377 | 377 |
| 377 | 363 | 57 | 363 | 131 | 17 | 362 | 362 | 375 | 377 | 377 | 363 | 57 | 362 | 317 | 375 |
| 377 | 377 | 377 | 377 | 377 | 377 | 357 | 367 | 377 | 377 | 257 | 363 | 102 | 102 | 277 | 257 |
| 377 | 377 | 377 | 377 | 377 | 377 | 357 | 357 | 377 | 377 | 361 | 361 | 361 | 377 | 361 | 277 |
| 377 | 257 | 362 | 377 | 377 | 377 | 377 | 237 | 137 | 377 | 377 | 377 | 377 | 77 | 367 | 377 |
| 377 | 117 | 365 | 177 | 161 | 361 | 377 | 377 | 257 | 367 | 377 | 377 | 377 | 377 | 361 | 362 |
| 362 | 257 | 377 | 377 | 77 | 274 | 274 | 47 | 257 | 377 | 37 | 362 | 17 | 17 | 377 | 362 |
| 377 | 77 | 377 | 361 | 377 | 377 | 377 | 377 | 377 | 377 | 377 | 367 | 377 | 277 | 367 | 377 |
| 377 | 377 | 261 | 361 | 277 | 277 | 377 | 377 | 242 | 362 | 377 | 361 | 362 | 277 | 377 | 257 |
| 362 | 377 | 237 | 237 | 362 | 362 | 377 | 377 | 367 | 377 | 377 | 177 | 157 | 377 | 377 | 377 |
| 377 | 317 | 377 | 377 | 377 | 377 | 377 | 377 | 361 | 267 | 377 | 257 | 377 | 377 | 361 | 377 |
| 267 | 377 | 257 | 377 | 377 | 361 | 377 | 277 | 257 | 317 | 372 | 367 | 377 | 177 | 377 | 377 |
| 377 | 361 | 367 | 377 | 301 | 360 | 374 | 363 | 277 | 377 | 362 | 367 | 374 | 377 | 377 | 377 |
| 362 | 361 | 361 | 267 | 257 | 377 | 377 | 377 | 377 | 362 | 377 | 361 | 377 | 317 | 362 | 377 |
| 377 | 377 | 377 | 367 | 377 | 174 | 157 | 137 | 377 | 361 | 377 | 367 | 377 | 377 | 377 | 361 |
| 367 | 262 | 101 | 101 | 367 | 367 | 277 | 277 | 362 | 277 | 277 | 377 | 367 | 367 | 277 | 277 |
| 277 | 277 | 361 | 377 | 377 | 377 | 257 | 361 | 377 | 362 | 317 | 362 | 377 | 377 | 377 | 377 |

ROW 4

| | | | | | | | | | | | | | | | |
|---|---|---|---|---|---|---|---|---|---|---|---|---|---|---|---|
| 56 | 116 | 126 | 170 | 135 | 105 | 100 | 10 | 120 | 170 | 130 | 120 | 100 | 132 | 136 | 120 |
| 123 | 131 | 101 | 10 | 105 | 30 | 35 | 135 | 135 | 170 | 170 | 170 | 12 | 12 | 231 | 170 |
| 160 | 107 | 66 | 125 | 17 | 127 | 55 | 124 | 170 | 106 | 170 | 112 | 231 | 170 | 170 | 170 |
| 170 | 170 | 106 | 110 | 235 | 234 | 170 | 110 | 124 | 114 | 170 | 110 | 115 | 125 | 106 | 110 |
| 124 | 170 | 170 | 170 | 110 | 235 | 234 | 170 | 110 | 124 | 114 | 120 | 170 | 110 | 115 | 125 |
| 160 | 160 | 120 | 106 | 120 | 170 | 106 | 170 | 130 | 127 | 170 | 106 | 106 | 120 | 170 | 170 |
| 170 | 107 | 170 | 17 | 127 | 127 | 170 | 127 | 127 | 170 | 170 | 170 | 170 | 107 | 170 | 106 |
| 11 | 17 | 170 | 170 | 106 | 170 | 170 | 170 | 170 | 170 | 114 | 134 | 170 | 130 | 170 | 110 |
| 170 | 124 | 170 | 124 | 17 | 11 | 106 | 170 | 111 | 106 | 160 | 170 | 106 | 170 | 106 | 106 |
| 170 | 170 | 170 | 106 | 170 | 170 | 106 | 170 | 170 | 106 | 106 | 170 | 170 | 106 | 170 | 107 |
| 170 | 11 | 106 | 170 | 11 | 170 | 11 | 11 | 160 | 11 | 233 | 170 | 130 | 170 | 170 | 70 |
| 160 | 170 | 11 | 11 | 160 | 170 | 170 | 46 | 46 | 170 | 101 | 160 | 32 | 231 | 160 | 135 |
| 105 | 111 | 106 | 55 | 170 | 75 | 125 | 125 | 106 | 115 | 234 | 11 | 106 | 170 | 100 | 11 |
| 101 | 160 | 170 | 66 | 125 | 170 | 105 | 101 | 104 | 66 | 125 | 106 | 170 | 170 | 106 | 115 |
| 230 | 115 | 120 | 234 | 170 | 105 | 11 | 104 | 160 | 66 | 125 | 106 | 170 | 100 | 101 | 106 |
| 50 | 70 | 124 | 135 | 104 | 170 | 55 | 105 | 121 | 121 | 31 | 233 | 170 | 170 | 377 | 377 |
| 126 | 50 | 120 | 150 | 125 | 125 | 170 | 170 | 116 | 116 | 126 | 137 | 57 | 170 | 57 | 116 |
| 116 | 116 | 126 | 50 | 110 | 233 | 15 | 125 | 100 | 103 | 120 | 50 | 100 | 120 | 107 | 52 |
| 52 | 230 | 230 | 230 | 127 | 127 | 127 | 127 | 11 | 11 | 121 | 121 | 121 | 110 | 130 | 122 |
| 100 | 170 | 100 | 116 | 116 | 126 | 100 | 200 | 210 | 75 | 210 | 100 | 125 | 15 | 125 | 100 |
| 100 | 124 | 44 | 170 | 121 | 130 | 123 | 123 | 15 | 125 | 53 | 113 | 123 | 170 | 130 | 170 |
| 104 | 116 | 116 | 116 | 116 | 104 | 104 | 100 | 104 | 104 | 44 | 170 | 170 | 170 | 127 | 104 |
| 116 | 116 | 31 | 137 | 121 | 116 | 116 | 116 | 116 | 126 | 15 | 125 | 100 | 15 | 125 | 100 |
| 111 | 200 | 121 | 130 | 170 | 112 | 200 | 100 | 122 | 122 | 35 | 130 | 125 | 170 | 100 | 170 |
| 170 | 57 | 35 | 115 | 170 | 125 | 126 | 115 | 125 | 115 | 104 | 104 | 170 | 33 | 17 | 127 |
| 110 | 123 | 15 | 126 | 15 | 170 | 170 | 15 | 130 | 125 | 100 | 170 | 170 | 15 | 130 | 100 |
| 125 | 100 | 170 | 170 | 170 | 130 | 100 | 100 | 100 | 111 | 126 | 100 | 107 | 170 | 15 | 170 |
| 170 | 134 | 125 | 54 | 101 | 107 | 170 | 35 | 125 | 114 | 127 | 120 | 170 | 170 | 170 | 170 |
| 116 | 137 | 130 | 100 | 14 | 124 | 124 | 170 | 170 | 170 | 170 | 137 | 57 | 11 | 121 | 116 |
| 116 | 126 | 15 | 160 | 107 | 107 | 67 | 107 | 275 | 130 | 235 | 125 | 35 | 125 | 170 | 130 |
| 40 | 122 | 130 | 130 | 100 | 100 | 12 | 32 | 122 | 170 | 170 | 170 | 100 | 100 | 170 | 50 |
| 11 | 31 | 121 | 100 | 170 | 15 | 15 | 137 | 57 | 125 | 15 | 125 | 377 | 377 | 377 | 116 |

APPENDIX C-2

```
                                                      MICRA 2/4/77
                                                      *     DIGITAL STORAGE TEST PROGRAM
                                                      *
                                                      *     REGISTERS
                                                            DECLARE R0=0,R1=1,R2=2,R3=3,R4=4,R5=5,R6=6,R7=7
                                                            DECLARE A0=0,A1=1,A2=2,A3=3,A4=4,A5=5,A6=6,A7=7
                                                            DECLARE SCR=0,X=1,Y=2,THRESH=3,DC=4,MA=5
                                                            DECLARE SAVEA=6,CHR=7,DELTAY=7,RA=7
                                                      *
                                                      *
                                                      *     FLAGS
                                                            DECLARE LROMEN=0,CHAR=1,BLINK=2,FS=3,BRIGHT=4
                                                            DECLARE LLGBLANK=5,DIM=6,FSTPT=7,FLGA=8,FLGB=9
                                                            DECLARE FLGC=10,SELA=11,CE=12,SELB=13,DOTEN=14
                                                            DECLARE HOLD=15
                                                            DECLARE FLGTA=3,FLGTB=4,FLGTC=6
                                                      *
                                                      *
                                                      *     I/O PORTS
                                                            DECLARE ADC=0,MEM=1,RTN=2,TSTB=3,TSTA=4
                                                            DECLARE BPCAD=6,BPCD=7
                                                            DECLARE LGCHAR=0,LGX=1,LGY=2,MDR=3,RAMP=4
                                                            DECLARE LGEXP=5,BPCO=6,MAR=7,STT=8,RSTO=9
                                                            DECLARE INCRSA=10,HSRS=11,CLRSA=12,DRTIMER=13
                                                            DECLARE SRSEN=14,CRSEN=15
                                                      *
                                                      *
                                                      *     CONSTANTS
                                                            DECLARE 0=0,1=15,8=2,15=3,16=4,32=7,97=6,100=3
                                                            DECLARE 255=7,1023=8,1024=9,2047=10,2048=11
                                                            DECLARE 3072=12,4032=13,4095=14,1032=1,2140=4
                                                            DECLARE 2730=5,1365=6,500=13
                                                            DECLARE 2=1,4=2
                                                      *
                                                      *
                                                      *     QUALIFIERS
                                                            DECLARE B0=0,B1=1,B2=2,B3=3,B4=4,B5=5,B6=6
                                                            DECLARE B7=7,B8=8,B9=9,B10=10,B11=11,ZERO=12
                                                            DECLARE POS=14,TEST=13
                                                      *
                                                      *     STIMULUS SOFTWARE
                                                      *
                                                      *
                                                            ADRS 0
 0   0   5--1 1  0 3--17 17--0 2 0 4   AC    JAD H DAC=A4*0&B                \0000 0110 0011
 1   1 113--0 1  0 3--17  6--0 2 1 1   FA    JRTN7 DAC=R1*0 OBPCO
 2   0 176--1 1 10 2--14 17--0 5 0 4   AB    JAC H DA4=AC QZERO SFLGA        \0000 0000 0010\C
 3   0 177--1 1 17 3--15 17--0 3 0 0   AA    JAB H DAC=A0/1&B QTEST
 4   0  41--1 1  1 3--17 17--0 0 0 0   BH    JBI H DAC=A0+1032&B
 5   0   2--1 1 10 2--14 17--0 5 0 0   AD    JAE H DA0=AC QZERO SFLGA        \0000 0110 0011
 6   0  24--0 1  2 0--17  5--0 5 0 2   BA    JBB H DA2=AC OLGEXP CBLINK
 7   0  10--1 1 17 3--10 17--0 1 0 0   AE    JAF H DAC=A0-1&B QB8            \0000 0000 0000\C
10   0   2--1 1  5 3--13 17--0 3 0 2   AO    JAP H DAC=A2/2730&B QB11        \0001 0101 0101\C
11   0  24--1 1  5 3--12 17--0 2 0 5   AQ    JAR H DAC=A5*2730&B QB10        \1011 1111 1111\C
12   0 177--1 1  2 0-- 5 17--0 5 0 5   AP    JAQ H DA5=AC QB5 CBLINK         \0001 0101 0101\C
13   0  21--1 1  0 3-- 1 17--0 4 0 0   AS    JAT H DAC=A0&B QB1              \1010 1010 1010
14   0  17--1 1  6 3-- 3 17--0 3 0 3   AW    JAX H DAC=A3/1365&B QB3         \0000 0000 0111\C
15   0   3--1 1  0 3--15 17--0 6 0 0   AY    JAZ H DAC=%A0&B QTEST           \1111 1111 1111
16   0 172--1 1  5 2--17 17--0 5 0 2   AN    JAO H DA2=AC SLLGBLANK          \0101 0101 0101
17   0  20--1 1 14 0--16 17--0 5 0 4   AF    JAG H DA4=AC QPOS CCE           \0000 0000 0000
20   0   3--1 1  2 2-- 5 17--0 5 0 0   AZ    JZA H DA0=AC QB5 SBLINK         \1010 1010 1010
21   0   3--1 1  6 3-- 2 17--0 1 0 0   ZC    JZD H DAC=A0-1365&B QB2         \0101 0101 0101
22   0 172--1 1 16 0--13 17--0 5 0 2   AV    JAW H DA2=AC QB11 CDOTEN        \1011 1111 1111
23   0   3--1 1  0 3--11 17--0 4 0 0   ZA    JZB H DAC=A0&B QB9              \0101 0101 0101\C
24   0   1--1 1  0 2-- 0 17--0 5 0 4   ZD    JZE H DA4=AC QB0 SLROMEN        \0101 0101 0101
25   0   4--1 1 12 3-- 0 17--0 2 0 4   ZE    JZF H DAC=A4*2047&B QB0         \0000 0000 0000\C
26   0 173--1 1  4 0-- 6 17--0 7 0 0   ZB    JZC H DB=AC QB6 CBRIGHT         \0101 0101 0101
27   0 173--1 1  1 3-- 4 17--0 0 0 5   AU    JAY H DAC=A5+1032&B QB4         \1010 1010 1010\C
30   0 152--1 1  5 3-- 1 17--0 2 0 2   ZG    JAB H DAC=A2*2730&B QB1         \0000 0000 0000\C
31   1 177--1 1 10 0-- 2 17--0 7 0 0   ZF    JZG   DB=AC QB2 CFLGA           \0000 0000 0000\C
32   0   6--1 1  3 2--17 17--0 6 0 2   BB    JBC H DAC=%A2&B SFS
33   0 162--1 1  5 0-- 6 17--0 5 0 1   AX    JAY H DA1=AC QB6 CLLGBLANK      \1010 1010 1010\C
34   0 173--1 1  0 3-- 3 17--0 5 0 7   AT    JAU H DA7=AC QB3                \1010 1010 1010
35   0 156--1 1 16 2-- 4 17--0 5 0 3   AR    JAS H DA3=AC QB4 SDOTEN         \1011 1111 1111
36   0 160--1 1 10 3--11 17--0 2 0 6   AM    JAN H DAC=A6*1023&B QB9         \1010 1010 1010
37   0  41--1 1  5 3-- 7 17--0 1 0 4   AG    JAH H DAC=A4-2730&B QB7         \1111 1111 1111
40   0   1--1 1  0 2--17 17--0 5 0 2   BC        H DA2=AC SLROMEN
41   0   1--1 1 17 3--17 17--0 1 0 2   BD        H DAC=A2-1&B
42   0   1--1 1  5 0--17 17--0 7 0 0   BE        H DB=AC CLLGBLANK
43   0   1--1 1  0 3--15 17--0 2 0 4   BF        H DAC=A4*0&B QTEST
44   0  27--1 1  4 2--17 17--0 5 0 0   BG    JCA H DA0=AC SBRIGHT
45   0   1--0 1  0 2--17  3--0 5 0 7   BI        H DA7=AC SLROMEN OMDR
46   0   1--0 1  2 3--17  4--0 1 0 0   BJ        H DAC=A0-8&B ORAMP          \UPDATE RAMP
47   0   1--0 1 14 2--17  7--0 5 0 1   BK        H DA1=AC SCE   OMAR
50   0   1--0 0 10 3--17  3--0 1 0 7   BL        H DAC=A7-1023&B W OMDR      \WRITE TO MEMORY
51   0   1--0 0  7 0--17  6--0 5 0 6   BM        H DA6=AC W OBPCO CFSTPT     \UPDATE BPCO
52   0   1--1 0 14 0--17 17--0 4 0 0   BN        H DAC=A0&B CCE W
53   1   0--1 1  0 3--13 17--0 7 0 0   BO    JBO   DB=AC QB11                \INTERRUPT SYNCHRONIZE
54   0   0--0 1 13 3--17  5--0 0 0 6   BP    JBP H DAC=A6+2048&B OLGEXP
55   0   1--1 1  1 2--17 17--0 5 0 5   BQ        H DA5=AC SCHAR
56   0   1--0 1 11 3--17  0--0 1 0 3   BR        H DAC=A3-1024&B OLGCHAR     \UPDATE LGCHAR
57   0   1--1 1  1 0--17 17--0 5 0 4   BS1       H DA4=AC CCHAR
60   0   1--1 1  6 0--17 17--0 6 0 5   BT        H DAC=%A5&B CDIM
61   0   1--1 1  2 2--17 17--0 7 0 0   BU        H DB=AC SBLINK
62   0   1--1 1 17 3--17 17--0 0 0 1   BV        H DAC=A1+1&B
63   0  13--1 1  3 0--17 17--0 5 0 3   BW    JYC H DA3=AC CFS
64   0   1--1 1 12 3--17 17--0 3 1 3   BX        H DAC=A3/2047
65   0   1--1 1  4 0--17 17--0 7 0 0   BY        H DB=AC CBRIGHT
66   0   1--1 1 17 3--15 17--0 0 0 0   BZ        H DAC=A0+1&B QTEST
67   0   1--1 1  0 3--16 17--0 5 0 0   YA        H DA0=AC QPOS
70   0 113--1 1 10 2--17 17--0 4 0 4   YB    JAA H DAC=A4&B SFLGA            \CYCLE BACK(DM CHECK)
71   0  10--0 1 14 2--17  7--0 4 0 3   DA    JDB H DAC=A3&B OMAR SCE
```

```
 72   0 114--1 1 17 0--17  3--0 4 1 0   XJ   JBA H DAC=A0 ITSTB CHOLD       \READ TEST B
 73   0 111--1 1 10 0--17 17--0 7 0 0   CA   JBH H DB=AC CFLGA
 74   0  45--1 1  3 0-- 3 17--1 3 0 3   CB   JCC H DAC=A3/AC&B QB3  CFS
 75   0 107--1 1 10 2--17  7--0 4 1 0   XD   JBH H DAC=A0 IBPCD SFLGA       \READ BPC DATA
 76   0 166--1 1  0 3--17 17--0 6 0 2   YC   JBX H DAC=%A2&B
                                             ADRS 63
 77   0 137--1 1  4 2--10 17--0 5 0 0   AL   JAM H DA0=AC QB8 SBRIGHT       \0101 0101 0101
100   0  77--1 1  0 3--12 17--0 5 0 1   AH   JAI H DA1=AC QB10              \1111 1111 1111
101   0   2--1 1 12 0--17 17--1 0 0 3   DB   JDD H DAC=A3+AC&B CFLGC
102   0   1--1 1 11 0--17 17--1 1 0 3   DC1      H DAC=A3-AC&B CFLGB
103   0   1--1 1  6 2--17 17--0 7 0 0   DD       H DB=AC SDIM
104   0   1--1 1  2 3--17 17--0 2 0 2   DE       H DAC=A2+8&B
105   0   1--1 1 14 0--17  1--1 2 1 2   DF       H DAC=A2+AC CCE IMEM       \READ MEMORY
106   0   1--0 1  0 3--17 14--0 5 0 4   DG       H DA4=AC OCLRSA
107   0   1--0 1  0 0--17  7--0 4 0 5   DH       H DAC=A5&B OMAR CLROMEN
110   0   1--0 1  0 3--17 17--0 4 0 4   DI       H DAC=A4&B OCRSEN
111   0   1--1 1 13 0--17 17--1 0 0 4   DJ       H DAC=A4+AC&B CSELA
112   0   1--1 1 15 2--17 17--0 5 0 4   DK       H DA4=AC SSELB
113   0   1--1 1  0 3--13 17--0 6 0 2   DL       H DAC=%A2&B QB11
114   0   1--1 1  0 3--17  1--0 4 1 0   DM       H DAC=A0 IMEM              \READ CHAR ROM
115   0 172--0 1  0 3--17 12--0 4 0 6   DO   JDH H DAC=A6&B OINCRSA
116   0   1--1 1  0 2--17  6--0 4 1 0   DN       H DAC=A0 IBPCAD SLROMEN    \READ BPC ADDRESS
117   0   1--0 1  0 3--14  6--0 4 0 6   DP       H DAC=A6&B OBPCO QZERO
120   0   1--1 1  0 3--17 17--0 4 0 2   DQ       H DAC=A2&B
121   0   2--1 1  0 3--17  3--0 6 1 2        JDR H DAC=%A2 ITSTB            \READ TEST B
122   0 153--0 1  0 3--17  6--0 4 0 6        JXD H DAC=A6&B OBPCO
123   0   1--0 1  6 0--17 15--0 4 0 2   DR       H DAC=A2&B ODRTIMER CDIM
124   0   1--1 1  7 2--17  4--0 4 1 2            H DAC=A2 ITSTA SFSTPT      \READ TEST A
125   0   2--0 1 17 2--17 10--0 4 0 2        JDS H DAC=A2&B OSTT SHOLD
126   0  11--0 1  0 3--17 12--0 4 0 2   XA   JXB H DAC=A2&B OINCRSA
127   0   1--0 1 12 2--17  4--0 5 0 4   DS       H DA4=AC   SFLGC ORAMP
130   0   1--1 1 11 2--17 17--0 4 0 2   DT       H DAC=A2&B SFLGB
131   0   1--1 1  0 3--17  0--0 4 1 2   DU       H DAC=A2 IADC              \READ ADC
132   0   1--0 1  0 3--17 13--0 4 0 2   DV       H DAC=A2&B OHSRS
133   0   1--1 1  0 3--17  7--0 4 1 2   DW       H DAC=A2  IBPCD
134   0   1--1 1  0 3--17 17--0 4 0 4   DX       H DAC=A4&B
135   0   1--1 1  0 3--14 17--1 0 0 4   DY       H DAC=A4+AC&B QZERO
136   0 170--1 1 10 0--17 17--0 5 0 4   DZ   JXA H DA4=AC CFLGA
137   0   1--1 1  0 3--17  4--0 4 1 0   XB       H DAC=A0 ITSTA             \READ TEST A
140   0 132--0 1  0 3--17 11--0 4 0 2   XI   JXJ H DAC=A2&B ORSTO
141   0   1--1 1 17 3-- 2 17--0 0 0 3   CC       H DAC=A3+1&B QB2
142   0   2--1 1 15 0-- 1 17--0 5 0 3   CD   JCF H DA3=AC CSELB QB1
143   0   1--1 1 15 2-- 1 17--0 5 0 3            H DA3=AC SSELB QB1
144   0   2--1 1 13 0-- 4 17--0 4 0 3   CF   JCH H DAC=A3&B CSELA QB4
145   0   1--1 1 13 2-- 4 17--0 4 0 3   CG       H DAC=A3&B SSELA QB4
146   0   2--0 1  0 3--14 16--0 4 0 2   CH   JCJ H DAC=A2&B QZERO OSRSEN
147   0   1--0 1  0 3--14 17--0 4 0 2   CI       H DAC=A2&B QZERO OCRSEN
150   0   2--1 1 12 3--15 17--0 2 0 3   CJ   JCL H DAC=A3+2047&B QTEST
151   0   1--1 1 10 0--15 17--0 4 0 2   CK       H DAC=A2&B QTEST CFLGA
152   0   2--1 1 10 2--17 17--0 7 0 0   CL   JCN H DB=AC SFLGA
153   0   1--1 1 12 3--17 17--0 2 0 3   CM       H DAC=A3+2047&B
154   0   2--1 1 17 2--17 17--0 7 0 0   CN   JCP H DB=AC SHOLD
155   0   3--1 1 17 2--17 17--0 7 0 0   CO   JCQ H DB=AC SHOLD
156   1   0--1 1  2 2--13 17--0 7 0 0   CP   JCP   DB=AC QB11 SBLINK        \INTERRUPT SYNCHRONIZE
157   0 114--1 1  0 3--17 17--0 6 0 3   CR1  JCA H DAC=%A3&B
160   1   0--1 1  4 0--13 17--0 7 0 0   CQ   JCQ   DB=AC QB11 CBRIGHT
161   0 112--1 1 17 0--17 17--0 4 0 3   CS   JCA H DAC=A3&B CHOLD
                                             ADRS 126
176   0 101--1 1  0 3-- 7 17--0 6 0 1   AK   JAL H DAC=%A1&B QB7            \0101 0101 0101\C
177   0  77--1 1  6 3-- 5 17--0 0 0 0   AI   JAJ H DAC=A0+1365&B QB5        \0101 0101 0101\C
                                             ADRS 190
276   0 100--1 1  3 0--16 17--0 5 0 6   AJ   JAK H DA6=AC QPOS CFS          \0000 0000 0000\C
                                        *
                                        *
                                        *
                                        *
                                        *
                                        * SELF BOOT SOFTWARE
                                        *
                                              ADRS 114
162   1   6--1 1 11 3--17 17--0 0 1 1   LB2   JLB4 DAC=R1+1024              \MEMORY CLEAR
163   0   1--1 1  0 3--17 17--0 5 0 0   LB3   DR0=AC H
164   0   1--0 0 14 2--17  7--0 4 0 0         DAC=R0&B OMAR  SCE H W
165   0   1--1 0 17 3--17 17--0 1 0 0         DAC=R0-1&B  W H
166   1   1--1 0  0 3--14 17--0 7 1 0         QZERO  W
167   1 173--1 0 14 0--17 17--0 7 1 0         JLB2 CCE W
                                        *
                                        *
170   1   1--1 1 10 0--17 17--0 5 0 6   LB4   DR6=AC        CFLGA           \REGISTER SET UPS
171   1   1--1 1 17 3--17 17--0 0 1 0         DAC=R0+1
172   1   1--1 1 11 0--17 17--1 0 1 6         DAC=R6+AC     CFLGB
173   1   1--1 1 12 0--17 17--0 5 0 2         DR2=AC        CFLGC
174   1   1--1 1  1 3--17 17--0 0 1 1         DAC=R1+1032
175   1   3--1 1 13 0--17 17--0 5 0 4         JZ1 DR4=AC    CSELA
                                              ADRS 128
200   1   1--1 1  2 3--17 17--0 0 1 4   Z1    DAC=R4+8
201   1   1--1 1 15 0--17 17--0 5 0 4         DR4=AC        CSELB
202   1   1--1 1 17 3--17 17--0 0 1 0         DAC=R0+1
203   1   1--1 1 17 0--17 17--1 0 1 2         DAC=R2+AC     CHOLD
204   1   1--1 1  0 3--17 17--0 5 0 3         DR3=AC
205   1   1--1 1  7 3--17 17--0 0 1 6         DAC=R6+32
206   1   1--0 1  0 3--17 16--0 5 0 5         DR5=AC        OSRSEN
207   1   1--1 1  7 3--17 17--0 0 1 5         DAC=R5+32
210   1   1--1 1  2 0--17 17--0 5 0 6         DR6=AC        CBLINK
211   1   1--1 1 17 3--17 17--0 0 1 6         DAC=R6+1
212   1   1--1 1  0 3--17 17--0 5 0 6         DR6=AC
                                        *
                                        *
213   0   1--0 1  0 3--17  3--0 4 0 4         DAC=R4&B OMDR H                \ DIAGNAL GRAPH SET UP
214   0   2--0 0 14 2--17  7--0 4 0 1   LB5   JLB6 DAC=R1&B OMAR SCE H W
215   1   5--1 1  0 3--17 17--0 2 1 0         JLB7 DAC=R0+0
216   0   1--1 0  0 3--17 17--0 7 1 0   LB6   W H
217   0   1--1 0 17 3--17 17--0 0 0 1         DAC=R1+1&B H W
220   1   1--1 0 14 0--12 17--0 5 0 1         DR1=AC QB10  W CCE
221   0 173--0 0  0 3--17  3--0 4 0 1         JLB5 DAC=R1&B OMDR H W
```

```
                                                   *
222   1    1--1 1   0 3--17 17--0 5 0 1     LB7    DR1=AC                          \GRATICLE GENERATION
223   1    1--1 1   0 3--17 17--0 5 0 4            DR4=AC
224   1    1--1 1   1 3--17 17--0 0 1 4            DAC=R4+1032
225   1    1--1 1   0 3--17 17--0 5 0 0            DR0=AC
226   1    1--1 1   7 3--17 17--0 1 1 0            DAC=R0-32
227   1    1--1 1   0 3--17 17--0 5 0 0            DR0=AC
230   0    1--0 1   0 3--17  3--0 4 0 2            DAC=R2&B OMDR H
231   0    1--0 0  14 2--17  7--0 4 0 0            DAC=R0&B OMAR SCE H W
232   0    1--1 0   0 3--17 17--0 5 0 2            DR2=AC H W
233   0    1--1 0  17 3--17 17--0 0 1 0            DAC=R0+1 H W
234   0    1--1 0  10 2--17 17--0 5 0 0            DR0=AC H W  SFLGA
235   0    1--1 0  13 3--17 17--0 0 1 4            DAC=R4+2048 H W
236   1   26--1 0  14 0--17 17--0 5 0 5            JSUB1 DR5=AC W CCE
                                            *
                                            *
237   1   25--1 1  10 2--17 17--0 5 0 5     LNK0   JSUB1 DR5=AC SFLGA   \HORZ GRATICULE LOOP
240   1    1--1 1  11 2--17 17--0 5 0 5     LNK1   DR5=AC SFLGB
241   1    1--1 1   0 3--17 17--0 4 1 2            DAC=R2
242   1   22--1 1   0 3--17 17--0 5 0 4            JSUB1 DR4=AC
243   1    1--1 1  12 2--17 17--1 1 1 5     LNK3   DAC=R5-AC SFLGC
244   1    1--1 1  10 0--16 17--0 7 1 0            QPOS CFLGA
245   1    1--1 1   4 3--17 17--0 0 1 5            DAC=R5+2148
246   1   16--1 1  12 0--17 17--0 5 0 5            JSUB1 DR5=AC CFLGC
247   1    1--1 1  13 3--17 17--0 0 1 5     Z2     DAC=R5+2048
250   1   14--1 1   0 3--17 17--0 5 0 5            JSUB1 DR5=AC
251   1    1--1 1   0 3--17 17--0 5 0 5     LNK2   DR5=AC
252   1    1--1 1  11 0--17 17--0 4 1 1            DAC=R1 CFLGB
253   1   11--1 1   0 3--17 17--0 5 0 4            JSUB1 DR4=AC
                                            *
                                            *
254   1  107--0 1   0 2--17  3--0 4 0 1     Z4     JLB3 DAC=R1&B OMDR SLROMEN
                                            *
255   1    7--1 1   0 3--17 17--0 5 0 5     LNK6   JSUB1 DR5=AC         \VERT GRATICULE LOOP
256   1    1--1 1  11 0--16 17--0 5 0 4     LNK7   DR4=AC QPOS CFLGB
257   1    1--1 1  13 3--17 17--0 0 1 1            DAC=R1+2048
260   0   36--0 1   0 3--17  3--0 4 0 6            JLB8 DAC=R6&B OMDR H
261   1    3--1 1   0 3--17 17--0 5 0 5            JSUB1 DR5=AC
262   1    2--1 1  10 0--17 17--0 5 0 5     LNK5   JSUB1 DR5=AC CFLGA
263   1  164--1 1  11 2--17 17--0 5 0 4     LNK4   JZ2  DR4=AC SFLGB
                                            *
                                            *
264   0    1--0 1   0 3--17  3--0 4 0 4     SUB1   DAC=R4&B OMDR H
265   0    1--0 0  14 2--17  7--0 4 0 0            DAC=R0&B OMAR W H SCE
266   0    1--1 0  17 3--17 17--0 0 1 0            DAC=R0+1 W H
267   1    1--1 0   0 3--17 17--0 5 0 0            DR0=AC W
270   1    1--1 0  14 0--17 17--0 7 1 0            W CCE
271   0    1--0 0   0 3--17  3--0 4 0 5            DAC=R5&B OMDR W H
272   0    1--0 0  14 2--17  7--0 4 0 0            DAC=R0&B OMAR W H SCE
273   0    4--1 0  17 3--17  4--0 0 1 0            JZ3 DAC=R0+1 ITSTA W H
                                            *
274   1  143--1 1   4 3--17 17--0 0 1 5     RTN0   JLNK0 DAC=R5+2148
275   1  143--1 1  13 3--17 17--0 1 1 5     RTN1   JLNK1 DAC=R5-2048
                                            *
                                                   ADRS 191
277   0    1--1 0   0 3-- 6  4--0 7 1 0     Z3     ITSTA QFLGTC  W H
300   0    1--1 0  14 0-- 4  4--0 7 1 0            QFLGTB ITSTA W H CCE
301   1    2--1 1   0 3-- 3 17--0 5 0 0            JPRTN1 QFLGTA DR0=AC
302   1    3--1 1   0 3-- 3 17--0 5 0 0            JPRTN3 QFLGTA DR0=AC
                                            *
303   1  171--1 1   0 3--17 17--0 7 1 0     PRTN1  JRTN0
304   1    3--1 1   0 3--17 17--0 7 1 0     PRTN2  JRTN2
305   1    4--1 1   0 3--17 17--0 7 1 0     PRTN3  JRTN4
306   1    5--1 1   0 3--17 17--0 7 1 0     PRTN4  JRTN6
                                            *
307   1  142--1 1  13 3--17 17--0 1 1 5     RTN2   JLNK2 DAC=R5-2048
310   0  133--1 1   2 3--17 17--0 1 1 2     RTN3   JLNK3 DAC=R2-8 H
311   1  152--1 1   3 3--17 17--0 1 1 4     RTN4   JLNK4 DAC=R4-100
312   1  150--1 1   0 3--17 17--0 4 1 2     RTN5   JLNK5 DAC=R2
313   1  142--1 1  10 2--17 17--0 4 1 1     RTN6   JLNK6 DAC=R1 SFLGA
314   1  142--1 1   3 3--17 17--0 1 1 4     RTN7   JLNK7 DAC=R4-100
                                            *
                                            *
315   1  137--0 1  14 0--17 13--0 5 0 1     LB1    JZ4 DR1=AC OHSRS CCE
                                            *
                                            *
316   0    1--0 0  14 2--17  7--0 4 0 0     LB8    DAC=R0&B OMAR W H SCE  \CONTROL ASCII
317   0    1--1 0  17 3--17 17--0 0 1 0            DAC=R0+1 W H
320   1    1--1 0   0 3--17 17--0 5 0 0            DR0=AC W
321   1    1--1 0   7 3--17 17--0 0 1 1            DAC=R1+32 W
                                            *
                                            *
322   1    1--1 0  14 0--17 17--0 5 0 4            DR4=AC W CCE    \ASCII CHARACTER LOOP
323   1    1--1 1   7 3--17 17--0 0 1 4            DAC=R4+32
324   1    1--1 1   0 3--17 17--0 5 0 6            DR6=AC
325   1    1--1 1   0 3--17 17--0 5 0 5            DR5=AC
326   0    2--0 1   0 3--17  3--0 4 0 5     LB9    JLB10 DAC=R5&B H OMDR
327   0    6--1 1  12 3--17 17--0 0 1 1            JLB11 DAC=R1+2047 H
330   0    1--0 0  14 2--17  7--0 4 0 0     LB10   DAC=R0&B OMAR W H SCE
331   0    1--1 0  17 3--17 17--0 0 1 5            DAC=R5+1 W H
332   0    1--1 0   0 3--17 17--0 5 0 5            DR5=AC W H
333   0    1--1 0  17 3-- 7 17--0 0 1 0            DAC=R0+1 QB7 W H
334   1  172--1 0  14 0--17 17--0 5 0 0            JLB9 DR0=AC W CCE
                                            *
335   0    1--0 1   0 3--17  3--0 7 0 0     LB11   DB=AC OMDR H
336   0    1--0 0  14 2--17  7--0 4 0 0            DAC=R0&B OMAR W H SCE
337   0    1--1 0  17 3--17 17--0 0 1 0            DAC=R0+1 W H
340   1    1--1 0  13 0--17 17--0 5 0 0            DR0=AC W CSELA
341   0    1--0 1  14 0--17  3--0 4 0 3            DAC=R3&B OMDR H CCE
342   0    1--0 0  14 2--17  7--0 4 0 0            DAC=R0&B OMAR W H SCE
343   0    1--1 0   0 3--17 17--0 4 1 1            DAC=R1 W H
344   0    1--1 0   0 3--17 17--0 5 0 0            DR0=AC W H
                                            *
                                            *
345   0    1--1 0  15 3--17 17--0 0 1 1     LB12   DAC=R1+500 W H
```

```
346   1    1--1 0 14 0--17 17--0 5 0 5          DR5=AC W CCE
347   1    1--1 1  7 3--17 17--0 1 1 5          DAC=R5-32
350   1    1--1 1 15 2--17 17--0 5 0 4          DR4=AC SSELB
351   1    1--1 1  7 3--17 17--0 0 1 5          DAC=R5+32
352   1    1--1 1 10 0--17 17--0 5 0 6          DR6=AC CFLGA
353   0    1--0 1  0 3--17  3--0 4 0 0          DAC=R0&B OMDR H
354   0    3--0 0 11 0--17  7--0 4 0 6          JSUB2 DAC=R6&B OMAR W H CFLGB
355   0    2--0 0 10 2--17  7--0 4 0 4   LN0    JSUB2 DAC=R4&B OMAR W H SFLGA
356   0    1--0 0 11 2--17  7--0 4 0 5   LN1    JSUB2 DAC=R5&B OMAR W H SFLGB
                                         *
                                         *
357   0    1--1 0 14 2--17 17--0 7 1 0   SUB2   SCE W H
360   0    1--1 0 12 2--17 17--0 7 1 0          W H SFLGC
361   1    1--1 0 17 3--17 17--0 0 1 7          DAC=R7+1 W
362   0    1--1 0 14 0--17 17--0 5 0 7          DR7=AC H W CCE
363   0    1--0 1  0 3--17  7--0 4 0 7          DAC=R7&B OMAR H
364   0    1--1 1 14 2--17 17--0 7 1 0          H SCE
365   0    1--1 1  0 3--17  4--0 7 1 0          ITSTA H
366   0    1--1 1  0 3-- 6 17--0 7 1 0          QFLGTC H
367   1    1--1 1 17 2--17  4--0 7 1 0   LB13   ITSTA SHOLD
370   0    2--1 1 14 0-- 4  0--0 5 1 0          JLB14 DR0=B IADC QFLGTB H CCE
371   0  176--1 1 14 0-- 2 17--0 7 1 0          JLB13 QB2 H CCE
372   1    1--1 1 17 0--17  4--0 7 1 0   LB14   ITSTA CHOLD
373   1    2--1 1  0 3-- 3 17--0 7 1 0          JLB15 QFLGTA
374   0  151--0 1 13 0--17  3--0 4 0 0   RT3    JLB12 DAC=R0&B OMDR H CSELA
375   0    1--1 1  0 3--17 17--0 7 1 0   LB15   H
376   0  157--0 1 15 0--17  3--0 4 0 0   RT0    JLN0 DAC=R0&B OMDR H CSELB
377   0  157--0 1 13 2--17  3--0 4 0 0   RT1    JLN1 DAC=R0&B OMDR H SSELA
                                         *
                                         *
                                                ADRS          256             \BEGIN INTERRUPT
400   0    2--1 1  0 3--17 17--0 2 0 0   MA1    JMB H DAC=A0*0&B              \TURN ON LOCATION
401   0    3--1 1  0 3--15  2--0 5 0 1   ME     JMF H DA1=AC QTEST IRTN
402   0   31--1 1  0 3--14  2--0 5 0 0   MB     JMC H DA0=AC QZERO IRTN       \0000 0000 0111
403   0  176--1 1 10 0--17 17--0 5 0 0   MD     JME H DA0=AC CFLGA
404   0   30--1 1  0 3--17 17--0 5 0 7   MF     JNA H DA7=AC
405   0   27--1 1  5 2--17 17--0 7 0 0   NW     JNA H DB=AC SLLGBLANK
406   0  177--1 1 13 3--17  2--0 3 0 0   NV     JNW H DAC=A0/2048&B IRTN
407   0    1--1 1 15 3--17 17--0 0 0 0   NB         H DAC=A0+4032&B
410   0    1--0 1 14 2--17  7--0 5 0 1              H DA1=AC OMAR SCE
411   0    1--1 1 12 3--17 17--0 1 0 1              H DAC=A1-2047&B
412   0    1--1 1 16 2--17 17--0 5 0 2              H DA2=AC SDOTEN
413   0    1--1 1 10 3--17 17--0 0 0 2              H DAC=A2+1023&B
414   0    1--1 1 14 0--17 17--0 5 0 3              H DA3=AC CCE
415   0    1--1 1  0 3--17 17--0 1 0 3              H DAC=A3-0&B
416   0    1--0 1 16 0--17  1--0 5 0 5              H DA5=AC OLGX CDOTEN
417   0    1--0 1  7 3--17  3--0 0 0 5              H DAC=A5+255&B OMDR
420   0    1--0 1 14 2--17  7--0 5 0 4              H DA4=AC OMAR SCE
421   0    1--0 1  6 3--17  2--0 0 0 4              H DAC=A4+97&B OLGY
422   0    1--1 1  5 0--17 17--0 5 0 6              H DA6=AC CLLGBLANK
423   0    1--1 1  7 3--17 17--0 0 0 6              H DAC=A6+32&B
424   0    1--1 1 14 0--17 17--0 5 0 7              H DA7=AC CCE
425   0    1--1 1  4 3--17 17--0 3 0 7              H DAC=A7/16&B
426   0    1--1 1 14 2--17 17--0 7 0 0              H DB=AC SCE
427   0    1--1 1  3 3--17 17--0 1 0 6              H DAC=A6-15&B
430   0    1--1 1  1 0--17 17--0 5 0 5              H DA5=AC CCHAR
431   0    1--1 1 17 3--17 17--0 1 0 5              H DAC=A5-1&B
432   0  154--1 1 14 0--17 17--0 5 0 4   NU     JNV H DA4=AC CCE
433   0  147--1 1  6 3--15 17--0 3 0 0   MC     JMB H DAC=A0/97&B QTEST       \000 000 0010
434   0  153--1 1 16 2--17 17--0 5 0 0   NA     JNB H DA0=AC CDOTEN SDOTEN
435   1    1--1 1  0 3--17 17--0 7 1 0   TA     \BEGIN NORMAL INTERRUPT ROUTINE
                                         *
                                         *
436   0   66--1 1  0 3--17 17--0 7 1 0   GOCORT JCORT H
                                         *
437   1    1--1 1 14 0--17 17--0 5 0 6   REFCTL DSAVEA=AC CCE                        \REFRESH CONTROL
440   1    1--1 1  0 3--17  3--0 2 1 0          DAC=SCR*0 ITSTB
441   1    1--1 1  5 0-- 2 17--0 5 0 0          DSCR=AC CLLGBLANK QB2
442   1    1--1 1  0 2--17  3--0 6 1 0          DAC=%SCR SLROMEN ITSTB
443   1    3--1 1 16 0-- 0 17--0 5 0 5          J+3 DMA=AC CDOTEN QB0               \FS MODE NOT ALLOWED
444   1    2--1 1 16 0-- 0 17--0 5 0 5          J+2 DMA=AC CDOTEN QB0               \FS MODE OFF
445   1   12--1 1  2 0--17  2--0 7 1 0          JIFS IRTN CBLINK                    \INITIATE FAST SCAN
446   1    1--1 1  3 0--17  2--0 7 1 0          IRTN CFS                            \TIMER DONE?
447   0   55--0 1  2 0--17 15--0 4 1 6          JCORT DAC=SAVEA ODRTIMER H CBLINK   \YES START DISP REF
450   0  167--1 1  2 0--17 17--0 4 1 6          JREFCTL DAC=SAVEA H CBLINK          \NO WAIT FOR TIMER
451   1    1--1 1  0 3--17 17--0 5 0 6   FSTSCN DSAVEA=AC
452   1    1--1 1  0 3--17  3--0 5 1 7          ITSTB DCHR=B
453   1    2--1 1  6 3-- 2 17--0 2 1 7          J+2 DAC=CHR*97 QB2
454   1    2--1 1  0 3--17  2--0 7 1 0          J+2 IRTN                            \1:FSEN 2,3:AC=0
455   1  177--1 1  0 3--14 17--0 2 1 7          J-1 DAC=CHR*0 QZERO                 \1:FS DISB 2,3:AC#0
456   0   46--0 1  3 0--17 15--0 4 1 6          JCORT CFS ODRTIMER DAC=SAVEA H      \AC=0 REF DISPLAY
457   0  172--1 1  3 2--17 17--0 4 1 6   IFS    JFSTSCN H DAC=SAVEA SFS             \GO TO FAST SCAN
460   0  157--1 1  0 3--17 17--0 4 1 6          JREFCTL H DAC=SAVEA                 \WAIT FOR RETRACE
                                         *
461   1    1--1 1  1 0--17 17--0 5 0 6   GRAPH  DSAVEA=AC CCHAR                     \BEGIN GRAPH MODE
462   1    2--1 1 12 3--17 17--0 2 1 0          J+2 DAC=SCR*2047                    \POSITIVE DATA
463   1    1--1 1  0 3--17 17--0 4 1 0          DAC=SCR                             \NEGATIVE DATA
464   1    1--1 1  0 3--17 17--1 1 1 3          DAC=THRESH-AC                       \COMPARE DATA
465   1    1--1 1 17 3--16 17--0 0 1 5          DAC=MA+1 QPOS                       \        TO THRESH
466   1    1--0 1  0 3--17  7--0 5 0 5          DMA=AC OMAR
467   1    2--1 1  0 3--17 17--0 4 0 0          J+2 DAC=SCR&B                       \DATA>THRESH
470   1    1--1 1  0 3--17 17--0 4 0 3          DAC=THRESH&B                        \DATA>=THRESH
471   1    1--1 1  0 3--12 17--0 5 0 0          DSCR=AC QB10
472   1    1--1 1 13 3--17  3--0 2 1 0          DAC=SCR*2048 ITSTB
473   1    2--0 1  0 3-- 4  2--0 4 0 0          J+2 DAC=SCR&B OLGY QB4              \POS DATA TO Y LG
474   1    1--0 1  0 3-- 4  2--0 5 0 0          DSCR=AC OLGY QB4                    \ZERO TO Y LINE GEN
475   1    1--1 1 14 2--13 17--0 4 0 7          DAC=DELTAY&B SCE QB11
476   1    2--1 1 10 3--12 17--0 2 1 2          J+2 DAC=Y*1023 QB10
477   1    2--1 1 10 3--17 17--0 2 1 2          J+2 DAC=Y*1023                      \FIRST PT
500   1    5--1 1  5 2--17 17--1 1 1 0          JOLDDY DAC=SCR-AC SLLGBLANK         \BLANK BIT OFF
501   1    2--1 1  5 0--17 17--1 1 1 0          J+2 DAC=SCR-AC CLLGBLANK            \BLANK BIT SET
502   1    1--1 1  5 0--17 17--1 1 1 0          DAC=SCR-AC CLLGBLANK                \BLANK BIT SET
503   1    4--1 1  0 3--17 17--0 5 0 7          J+4 DDELTAY=AC
504   1    3--1 1  0 3--17 17--0 5 0 7          J+3 DDELTAY=AC
505   1    3--1 1  0 3--16 17--0 5 0 7   OLDDY  J+3 DDELTAY=AC QPOS                 \OLD DELTAY>=0
```

```
506   1   1--1 1  0 3--16 17--0 5 0 7         DDELTAY=AC QPOS                  \OLD DELTAY<0
507   1   3--1 1 17 3--17 17--0 0 1 1         J+3 DAC=X+1
510   1   1--1 1 17 3--17 17--0 0 1 1         DAC=X+1
511   1   3--0 1 16 2--17  1--0 5 0 1         J+3 DX=AC OLGX SDOTEN            \DELTAY SIGN CHANGED
512   1   2--0 1 16 0--17  1--0 5 0 1         J+2 DX=AC OLGX CDOTEN            \DYSGN UNCHGD OR BLNK
513   1   1--0 1 16 2--17  1--0 5 0 1         DX=AC OLGX     SDOTEN            \DELTAY SIGN CHANGED
514   1   1--1 1  0 3--17 17--0 4 1 0         DAC=SCR
515   1   1--1 1 14 0--17  1--0 5 1 0         IMEM DSCR=B CCE                  \READ NEXT MEM WORD
516   1   1--1 1  7 0--13 17--0 5 0 2         DY=AC QB11 CFSTPT                \CLEAR FIRST PT FF
517   1   1--1 1  0 3--17 17--0 4 0 0         DAC=SCR&B
520   1   1--1 1  0 3--12 17--0 7 1 0         QB10
521   1  37--1 1  0 3--17  2--0 4 0 0  TOGRPH JGRLINK IRTN DAC=SCR&B
                                       *
522   0 115--1 1  0 3--17 17--0 4 1 6  RCLINK JREFCTL DAC=SAVEA H          \GO TO REF CONTROL
523   0 114--1 1  0 3--17 17--0 4 1 6         JREFCTL H DAC=SAVEA          \GO TO REF CONTROL
                                       *
524   1   1--1 1  1 0--17 17--0 5 0 6  CORT   DSAVEA=AC CCHAR              \CONTROL OR THRESH
525   1   1--1 1  5 0--17 17--0 4 0 0         DAC=SCR&B CLLGBLANK
526   1   1--1 1  3 0--11 17--1 0 0 0         DAC=SCR+AC&B QB9 CFS
527   1   1--1 1  0 3-- 5 17--1 0 1 0         DAC=SCR+AC QB5
530   1   2--1 1 10 3--17 17--0 3 1 5         J+2 DAC=MA/1023
531   1  14--1 1  0 3--17 17--1 0 1 0         JNEWTH DAC=SCR+AC            \GO TO NEW THRESHOLD
532   1   2--1 1  4 0--17 17--0 4 0 0         J+2 DAC=SCR&B CBRIGHT        \BRIGHT OFF
533   1 177--1 1  0 3--17 17--0 5 0 5         J-1 DMA=AC                   \SKIP PAGE
534   1   1--1 1 17 3-- 3 17--0 0 1 5         DAC=MA+1 QB3
535   1   1--0 1 14 2--17  7--0 5 0 5         DMA=AC OMAR SCE
536   1   2--1 1  6 0--17 17--0 4 0 0         J+2 DAC=SCR&B CDIM           \DIM OFF
537   1   1--1 1  6 2--17 17--0 4 0 0         DAC=SCR&B SDIM               \DIM ON
540   1   1--1 1 16 0-- 4 17--0 5 0 4         DDC=AC CDOTEN QB4
541   1   1--0 1  0 3--17  5--0 2 0 4         DAC=DC+0&B OLGEXP            \EXPAND BITS TO LG
542   1   2--1 1  7 2-- 7 17--0 7 1 0         J+2 QB7 SFSTPT               \SET FIRST PT FF
543   1   1--0 1  7 2-- 7  1--0 5 0 1         DX=AC OLGX QB7 SFSTPT        \CLEAR X POSITION
544   1  20--1 1 14 0--17  1--0 5 1 0         JDCMODE IMEM DSCR=B CCE      \READ NEXT MEM WORD
545   1   2--1 1  0 3--17 17--0 5 0 3  NEWTH  J+2 DTHRESH=AC               \NEW THRESHOLD
546   1   1--1 1  0 3--17 17--0 5 0 3         DTHRESH=AC
547   1   1--1 1 17 3--12 17--0 0 1 5         DAC=MA+1 QB10
550   1   1--0 1 14 2--17  7--0 5 0 5         DMA=AC OMAR SCE
551   1   2--1 1 12 3--17 17--0 2 1 3         J+2 DAC=THRESH*2047          \POSITIVE THRESH
552   1   1--1 1  0 3--17 17--0 4 1 3         DAC=THRESH                   \NEGATIVE THRESH
553   1   1--1 1 16 0--17 17--0 5 0 3         DTHRESH=AC CDOTEN            \EXTEND SIGN
554   1   1--1 1  0 3--17 17--0 7 1 0         J+1
555   1   7--1 1 14 0--17  1--0 5 1 0         JDCMODE IMEM DSCR=B CCE      \READ NEXT MEM WORD
556   1   3--1 1  0 3--17  2--0 7 1 0  CLNEXT JCLLINK IRTN
557   1   3--1 1  0 3--17  2--0 4 0 4         J+3 DAC=DC&B IRTN
560   0 101--1 1  0 3--12 17--0 4 1 6  GRLINK JGRAPH H DAC=SAVEA QB10      \NEXT: GRAPH PT
561   0 143--1 1  0 3--17 17--0 4 1 6  CLLINK JCORT H DAC=SAVEA            \NEXT: CNTL WORD
562   0 142--1 1  0 3--17 17--0 4 1 6         JCORT H DAC=SAVEA
563   0  23--1 1  0 3-- 3 17--0 4 1 6         JVECTOR H DAC=SAVEA QB3      \NEXT: DEFAULT TO VEC
564   1   2--0 1  0 3--13 14--0 4 0 4  DCMODE J+2 DAC=DC&B QB11 OCLRSA
565   1   1--0 1  4 2--13 14--0 4 0 4         DAC=DC&B QB11 SBRIGHT OCLRSA \BRIGHT ON
566   1   1--0 1  0 0-- 2  7--0 4 0 0         DAC=SCR&B QB2 OMAR CLROMEN   \NEXT MAY BE A CHAR
567   1   2--1 1  0 3--12 17--0 4 0 4         J+2 DAC=DC&B QB10
570   1   1--1 1  0 3--17 17--0 4 0 4         DAC=DC&B
571   1   2--1 1  0 3-- 1 17--0 2 0 4         J+2 DAC=DC+0&B QB1
572   1 130--1 1  0 2--17  2--0 7 1 0         JRCLINK IRTN SLROMEN         \GO TO REF CONT LINK
573   1   2--1 1  0 3-- 0 17--0 7 1 0         J+2 QB0
574   1 162--1 1  0 2-- 0 17--0 7 1 0         JCLNEXT QB0 SLROMEN          \NEXT: CORT OR JUMP
575   1   4--1 1  0 3--17 17--0 5 0 7         J+4 DDELTAY=AC
576   1   1--1 1  0 2--17  2--0 4 0 4         DAC=DC&B SLROMEN IRTN
577   0   7--1 1  0 3--17 17--0 4 1 6         JVECTOR H DAC=SAVEA          \GO TO VECTOR
600   0   6--1 1  0 3-- 3 17--0 4 1 6         JVECTOR H DAC=SAVEA QB3      \DEFAULT TO VECTOR
601   1   2--1 1 17 3--17 17--0 1 1 1         J+2 DAC=X-1
602   1  34--1 1  0 2--17  1--0 5 1 7         JTOCHR1 IMEM DCHR=B SLROMEN  \READ 1ST STROKE
603   1 116--1 1  0 2--17 17--0 5 0 1         JTOGRPH DX=AC SLROMEN        \NO X INCR ON 1ST PT
                                       *
604   0   2--1 1  0 3--17 17--0 4 1 6  VLINK  JVECTOR H DAC=SAVEA          \GO TO VECTOR
605   0 117--1 1  0 3--17 17--0 4 1 6  FROMSC JCORT H DAC=SAVEA            \GO TO CORT
                                       *
606   1   1--1 1  1 0--17 17--0 5 0 6  VECTOR DSAVEA=AC CCHAR              \VECTOR MODE
607   1   1--1 1 17 3--17 17--0 0 1 5         DAC=MA+1
610   1   1--0 1 14 2--17  7--0 5 0 5         DMA=AC OMAR SCE
611   1   1--1 1  0 3--17 17--0 4 0 0         DAC=SCR&B
612   1   1--1 1 17 3--13 17--0 0 1 5         DAC=MA+1 QB11
613   1   1--0 1  0 3--17  7--0 5 0 5         DMA=AC OMAR
614   1   3--1 1  0 3--17 17--0 4 0 0         J+3 DAC=SCR&B                \ABSOLUTE VECTOR
615   1   1--1 1  0 3--17 17--0 4 1 1         DAC=X                        \INCREMENTAL VECTOR
616   1   1--1 1  0 3--17 17--1 0 0 0         DAC=SCR+AC&B
617   1   1--0 1  0 3--13  1--0 5 0 1         DX=AC OLGX QB11              \SEND X TO LG
620   1   1--1 1 14 0--17  1--0 5 1 0         IMEM DSCR=B CCE
621   1   3--1 1 14 2--13 17--0 7 1 0         J+3 SCE QB11                 \ABSOLUTE VECTOR
622   1   1--1 1 14 2--13 17--0 4 1 2         DAC=Y QB11 SCE               \INCREMENTAL VECTOR
623   1   2--1 1  0 3--17 17--1 0 0 0         J+2 DAC=SCR+AC&B
624   1   1--1 1  0 3--17 17--0 4 0 0         J+1 DAC=SCR&B
625   1   2--0 1  5 2--12  2--0 5 0 2         J+2 DY=AC OLGY SLLGBLANK QB10 \Y TO LG & UNBLANK
626   1   1--0 1  5 0--17  2--0 5 0 2         DY=AC OLGY CLLGBLANK         \Y TO LG & BLANK
627   1   1--1 1 16 0--17 17--0 1 1 5         DAC=MA-1 CDOTEN              \THIS STATE NOT USED
630   1   2--1 1 14 0--17  1--0 5 1 0         J+2 IMEM DSCR=B CCE          \       BY TEST PROG
631   1 154--1 1 14 0--17  2--0 5 0 5         JFROMSC DMA=AC IRTN CCE      \NEXT: CONTROL WORD
632   1   1--1 1  0 3--13 17--0 7 1 0         QB11
633   1   1--1 1  0 3--17 17--0 4 0 0         DAC=SCR&B
634   1   1--1 1  0 3--12 17--0 7 1 0         QB10
635   1 147--1 1  0 3--17  2--0 7 1 0         JVLINK IRTN
                                       *
636   1   1--1 1  3 3--17 17--0 2 1 7  TOCHR1 JTOCHR2 DAC=CHR*15           \GOING TO CHAR MODE
                                       *
                                       *
637   1  45--1 1  0 3--14 17--0 4 1 1  TOCHR2 JTOCHR3 DAC=X QZERO          \GOING TO CHAR MODE
                                       *
640   1   1--0 1  0 3--17 12--0 5 0 6  CHARAC DSAVEA=AC OINCRSA            \CHARACTER MODE
641   1   1--0 1  0 0--17  7--0 4 0 0         DAC=SCR&B OMAR CLROMEN
642   1   1--1 1  0 3--17 17--0 4 0 7         DAC=CHR&B
643   1   1--1 1  1 0-- 7 17--0 7 1 0         CCHAR QB7
644   1   1--1 1 17 3--17 17--0 0 1 5         DAC=MA+1
645   1   2--1 1  5 2--17 17--0 7 1 0         J+2 SLLGBLANK                \UNBLANK STROKE
646   1   1--1 1  5 0--17 17--0 7 1 0         CLLGBLANK                    \BLANK STROKE
```

```
647   1    1--1 1  0 2--17  1--0 5 1 4          IMEM DDC=B SLROMEN                 \READ NEXT STROKE
650   1    1--0 1 14 2--17  7--0 5 0 5          DMA=AC OMAR SCE
651   1    1--1 1  7 3--17 17--0 2 1 4          DAC=DC+255
652   1    1--0 1  0 3--14  1--0 4 0 1          DAC=X&B OLGX QZERO                 \X POSITION TO LG
653   1    1--0 1  1 2--17  0--0 4 0 7          DAC=CHR&B OLGCHAR SCHAR            \CHAR STROKE TO LG
654   1   14--0 1 16 0--17 14--0 7 1 0          JCHREND OCLRSA CDOTEN              \GO TO END OF CHAR
655   1    1--1 1 17 3--17  3--0 1 1 5          DAC=MA-1 ITSTB                     \CONTINUE CHAR
656   1    1--1 1 14 0--13 17--0 5 0 5          DMA=AC CCE QB11                    \RESTORE MEM ADRS
657   1    1--1 1 16 0--17 17--0 4 1 4          DAC=DC CDOTEN                      \DOT OFF
660   1   26--1 1  0 3--17  2--0 5 0 7          JGOCHAR DCHR=AC IRTN               \GO DO NEXT STROKE
661   1    1--0 1  0 3--17  7--0 5 0 0          DSCR=AC OMAR                       \LINK TO NXT STROKE
662   1    1--0 1  0 0--17 14--0 7 1 0          OCLRSA CLROMEN
663   1    1--1 1  0 3--17 17--0 7 1 0          J+1
664   1    1--1 1  0 3--17 17--0 7 1 0          J+1
665   1    1--1 1  0 3--17 17--0 7 1 0          J+1
666   1    1--1 1  0 3--17  2--0 4 1 6          DAC=SAVEA IRTN
667   0  151--1 1  0 2--17  1--0 5 1 7          JCHARAC H IMEM DCHR=B SLROMEN      \GO DO NXT STROKE
670   1    1--1 1 14 0--17  1--0 5 1 0   CHREND IMEM CCE DSCR=B                    \GET NXT CHAR CODE
671   1    1--0 1  0 0--13  7--0 4 0 0          DAC=SCR&B OMAR CLROMEN QB11
672   1    1--1 1 17 3--12 17--0 0 1 4          DAC=DC+1 QB10                      \RESTORE DC REG
673   1    3--1 1  0 3--17 17--0 5 0 4          J+3 DDC=AC
674   1    1--1 1  0 3--17 17--0 5 0 4          DDC=AC
675   1    3--1 1  0 3--17 17--0 7 1 0          J+3
676   1    2--1 1  0 3--17 17--0 7 1 0          J+2
677   1   63--1 1  0 2--17 17--0 7 1 0          JFROMCH      SLROMEN               \GO TO CORT
700   1    1--1 1  0 3--17 17--0 7 1 0          J+1
701   1    1--1 1  0 2--17  1--0 5 1 7          IMEM DCHR=B SLROMEN                \GET 1ST STROKE
702   1    1--1 1  3 3--17 17--0 2 1 7          DAC=CHR+15
703   1    1--1 1  4 3--14 17--0 0 1 1          DAC=X+16 QZERO                     \X TO NXT CHR POSN
704   1    1--1 1  0 3--17  2--0 5 0 1   TOCHR3 DX=AC IRTN
705   0    2--1 1  0 3--17 17--0 4 1 6   CHLINK JSPCHAR H DAC=SAVEA                \GO TO SPEC CHAR
706   0  132--1 1  0 3--17 17--0 4 1 6   GOCHAR JCHARAC H DAC=SAVEA                \GO TO CHARACTER

                                         *
707   1    1--1 1  1 0--17 17--0 5 0 6   SPCHAR DSAVEA=AC CCHAR                    \SPEC CHAR MODE
710   1    1--1 1 17 3--17 17--0 0 1 5          DAC=MA+1
711   1    1--0 1 14 2--17  7--0 7 0 0          DB=AC SCE OMAR
712   1    1--1 1  0 3--17 17--0 4 0 7          DAC=CHR&B
713   1    1--0 1  0 3-- 7 14--0 4 0 7          DAC=CHR&B OCLRSA QB7
714   1    1--1 1 15 3-- 6 17--0 3 0 7          DAC=CHR/4032&B QB6
715   1   13--1 1  0 3-- 5 17--0 4 0 7          JCHR6A0 DAC=CHR&B QB5
716   1    1--1 1  0 3--17 17--1 3 1 5          DAC=MA/AC                          \CHR(7)=0
717   1    7--1 1 14 0--17  1--0 5 1 0          JFMFD IMEM DSCR=B CCE              \CHR(7)=1
720   1    1--1 1 14 0--17 17--1 1 1 5   SKIP   DAC=MA-AC CCE                      \SKIP 32 OR 64
721   1    1--0 1 14 2--17  7--0 5 0 5          DMA=AC OMAR SCE
722   1    1--1 1 17 3--17 17--0 1 1 5          DAC=MA-1
723   1    1--1 1  0 3--17 17--0 5 0 5          DMA=AC
724   1    1--1 1  0 3--17 17--0 7 1 0          J+1
725   1   16--1 1 14 0--17  1--0 5 1 0          JCHR5A1 IMEM CCE DSCR=B            \READ NEXT WORD
726   1    1--0 1  0 3--17  7--0 2 0 0   FMFD   DAC=SCR*0&B OMAR                   \CLEAR X AND Y POSN
727   1   21--0 1  0 0--13  2--0 5 0 2          JSCHARX DY=AC OLGY CLROMEN QB11
730   1   12--1 1 14 0-- 4  1--0 5 1 0   CHR6A0 JCHR5A0 IMEM DSCR=B CCE QB4        \CHR(6)=0
731   1    1--1 1 14 0-- 4  1--0 5 1 0          IMEM DSCR=B CCE QB4                \CHR(6)=1
732   1    5--0 1  0 0--17  7--0 4 0 0          JNBLINK DAC=SCR&B OMAR CLROMEN     \CHR(5)=0
733   1    1--0 1  0 0--17  7--0 4 0 0          DAC=SCR&B OMAR CLROMEN             \CHR(5)=1
734   1    2--1 1  7 3--13 17--0 0 1 2   VTAB   JSCHARY DAC=Y+32 QB11              \VERTICAL TAB
735   1    1--1 1  7 3--13 17--0 1 1 2   LNFD   DAC=Y-32 QB11                      \LINE FEED
736   1   13--0 1  0 3--17  2--0 5 0 2   SCHARY JSCHARD DY=AC OLGY                 \Y POSN TO LG
737   1    2--1 1  2 0--13 17--0 7 1 0   NBLINK JSCHARN CBLINK QB11                \BLINK OFF
740   1    1--1 1  2 2--13 17--0 7 1 0          JSCHARN SBLINK QB11                \BLINK ON
741   1   10--1 1  0 3--17 17--0 7 1 0   SCHARN JSCHARD
742   1    4--0 1  0 0--17  7--0 4 0 0   CHR5A0 JSPACE DAC=SCR&B OMAR CLROMEN      \CHR(5)=0
743   1    1--0 1  0 0--17  7--0 4 0 0   CHR5A1 DAC=SCR&B OMAR CLROMEN             \CHR(5)=1
744   1  175--1 1  0 3--13 17--0 7 1 0   NULL   JSCHARN QB11                       \NULL CHARACTER
745   1    3--1 1  0 3--13 17--0 2 1 0   CR     JSCHARX DAC=SCR*0 QB11             \CARRIAGE RETURN
746   1    2--1 1  4 3--13 17--0 0 1 1   SPACE  JSCHARX DAC=X+16 QB11              \SPACE
747   1    1--1 1  4 3--13 17--0 1 1 1   BS     JSCHARX DAC=X-16 QB11              \BACKSPACE
750   1    1--0 1  0 3--17  1--0 5 0 1   SCHARX DX=AC OLGX                         \X POSN TO LG
751   1    3--1 1 16 0--17 17--0 4 0 0   SCHARD J+3 DAC=SCR&B CDOTEN               \DOT OFF
752   1    1--1 1 16 0--17 17--0 7 1 0          CDOTEN                             \DOT OFF
753   1    2--1 1 17 3--17 17--0 0 1 5          J+2 DAC=MA+1
754   1    1--1 1 17 3--12 17--0 0 1 5          DAC=MA+1 QB10
755   1    1--1 1  0 2--17  1--0 5 1 7          IMEM DCHR=B SLROMEN                \GET NXT 1ST STRK
756   1    2--1 1  3 3--17 17--0 2 1 7          J+2 DAC=CHR*15
757   1    3--1 1  5 0--17 17--0 5 0 5          JFROMCH DMA=AC CLLGBLANK           \GO TO CORT
760   1    1--1 1 17 3--14 17--0 0 1 5          DAC=MA+1 QZERO
761   1  124--1 1  5 0--17  2--0 5 0 5          JCHLINK IRTN DMA=AC CLLGBLANK      \END OF SP CHAR
762   1   54--1 1  0 3--17  2--0 4 1 6   FROMCH JGOCORT  DAC=SAVEA  IRTN           \GO TO CORT
                                                END

 NO ERRORS ???
```

| | | | | | | | |
|---|---|---|---|---|---|---|---|
| 0 | 0 | 1 | 17 | 100 | 3 | 1023 | 10 |
| 1024 | 11 | 1032 | 1 | 1365 | 6 | 15 | 3 |
| 16 | 4 | 2 | 1 | 2047 | 12 | 2048 | 13 |
| 2148 | 4 | 255 | 7 | 2730 | 5 | 3072 | 14 |
| 32 | 7 | 4 | 2 | 4032 | 15 | 4095 | 16 |
| 500 | 15 | 8 | 2 | 97 | 6 | A0 | 0 |
| A1 | 1 | A2 | 2 | A3 | 3 | A4 | 4 |
| A5 | 5 | A6 | 6 | A7 | 7 | AA | 3 |
| AB | 2 | AC | 0 | AD | 5 | ADC | 0 |
| AE | 7 | AF | 17 | AG | 37 | AH | 100 |
| AI | 177 | AJ | 276 | AK | 176 | AL | 77 |
| AM | 36 | AN | 16 | AO | 10 | AP | 12 |
| AQ | 11 | AR | 35 | AS | 13 | AT | 34 |
| AU | 27 | AV | 22 | AW | 14 | AX | 33 |
| AY | 15 | AZ | 20 | B0 | 0 | B1 | 1 |
| B10 | 12 | B11 | 13 | B2 | 2 | B3 | 3 |
| B4 | 4 | B5 | 5 | B6 | 6 | B7 | 7 |
| B8 | 10 | B9 | 11 | BA | 6 | BB | 32 |
| BC | 40 | BD | 41 | BE | 42 | BF | 43 |
| BG | 44 | BH | 4 | BI | 45 | BJ | 46 |
| BK | 47 | BL | 50 | BLINK | 2 | BM | 51 |
| BN | 52 | BO | 53 | BP | 54 | BPCAD | 6 |
| BPCD | 7 | BPCO | 6 | BQ | 55 | BR | 56 |
| BRIGHT | 4 | BS | 747 | BS1 | 57 | BT | 60 |

| | | | | | | | |
|---|---|---|---|---|---|---|---|
| BU | 61 | BV | 62 | BW | 63 | BX | 64 |
| BY | 65 | BZ | 66 | CA | 73 | CB | 74 |
| CC | 141 | CD | 142 | CE | 14 | CF | 144 |
| CG | 145 | CH | 146 | CHAR | 1 | CHARAC | 640 |
| CHLINK | 705 | CHR | 7 | CHR5A0 | 742 | CHR5A1 | 743 |
| CHR6A0 | 730 | CHREND | 670 | CI | 147 | CJ | 150 |
| CK | 151 | CL | 152 | CLLINK | 561 | CLNEXT | 556 |
| CLRSA | 14 | CM | 153 | CN | 154 | CO | 155 |
| CORT | 524 | CP | 156 | CQ | 160 | CR | 745 |
| CR1 | 157 | CRSEN | 17 | CS | 161 | DO | 115 |
| DA | 71 | DB | 101 | DC | 4 | DC1 | 102 |
| DCMODE | 564 | DD | 103 | DE | 104 | DELTAY | 7 |
| DF | 105 | DG | 106 | DH | 107 | DI | 110 |
| DIM | 6 | DJ | 111 | DK | 112 | DL | 113 |
| DM | 114 | DN | 116 | DOTEN | 16 | DP | 117 |
| DQ | 120 | DR | 123 | DRTIMER | 15 | DS | 127 |
| DT | 130 | DU | 131 | DV | 132 | DW | 133 |
| DX | 134 | DY | 135 | DZ | 136 | FA | 1 |
| FLGA | 10 | FLGB | 11 | FLGC | 12 | FLGTA | 3 |
| FLGTB | 4 | FLGTC | 6 | FMFD | 726 | FROMCH | 762 |
| FROMSC | 605 | FS | 3 | FSTPT | 7 | FSTSCH | 451 |
| GOCHAR | 706 | GOCORT | 436 | GRAPH | 461 | GRLINK | 560 |
| HOLD | 17 | HSRS | 13 | IFS | 457 | INCRSA | 12 |
| LB1 | 315 | LB10 | 330 | LB11 | 335 | LB12 | 345 |
| LB13 | 367 | LB14 | 372 | LB15 | 375 | LB2 | 162 |
| LB3 | 163 | LB4 | 170 | LB5 | 214 | LB6 | 216 |
| LB7 | 222 | LB8 | 316 | LB9 | 326 | LGCHAR | 0 |
| LGEXP | 5 | LGX | 1 | LGY | 2 | LLGBLANK | 5 |
| LNO | 355 | LN1 | 356 | LNFD | 735 | LNKO | 237 |
| LNK1 | 240 | LNK2 | 251 | LNK3 | 243 | LNK4 | 263 |
| LNK5 | 262 | LNK6 | 255 | LNK7 | 256 | LROMEN | 0 |
| MA | 5 | MA1 | 400 | MAR | 7 | MB | 402 |
| MC | 433 | MD | 403 | MDR | 3 | ME | 401 |
| MEM | 1 | MF | 404 | NA | 434 | NB | 407 |
| NBLINK | 737 | NEWTH | 545 | NU | 432 | NULL | 744 |
| NV | 406 | NW | 405 | OLDDY | 505 | POS | 16 |
| PRTN1 | 303 | PRTN2 | 304 | PRTN3 | 305 | PRTN4 | 306 |
| RO | 0 | R1 | 1 | R2 | 2 | R3 | 3 |
| R4 | 4 | R5 | 5 | R6 | 6 | R7 | 7 |
| RA | 7 | RAMP | 4 | RCLINK | 522 | REFCTL | 437 |
| RSTO | 11 | RTO | 376 | RT1 | 377 | RT3 | 374 |
| RTN | 2 | RTNO | 274 | RTN1 | 275 | RTN2 | 307 |
| RTN3 | 310 | RTN4 | 311 | RTN5 | 312 | RTN6 | 313 |
| RTN7 | 314 | SAVEA | 6 | SCHARD | 751 | SCHARN | 741 |
| SCHARX | 750 | SCHARY | 736 | SCR | 0 | SELA | 13 |
| SELB | 15 | SKIP | 720 | SPACE | 746 | SPCHAR | 707 |
| SKSEN | 16 | STT | 10 | SUB1 | 264 | SUB2 | 357 |
| TA | 435 | TEST | 15 | THRESH | 3 | TOCHR1 | 636 |
| TOCHR2 | 637 | TOCHR3 | 704 | TOGRPH | 521 | TSTA | 4 |
| TSTB | 3 | VECTOR | 606 | VLINK | 604 | VTAB | 734 |
| X | 1 | XA | 126 | XB | 137 | XD | 75 |
| XI | 140 | XJ | 72 | Y | 2 | YA | 67 |
| YB | 70 | YC | 76 | Z1 | 200 | Z2 | 247 |
| Z3 | 277 | Z4 | 254 | ZA | 23 | ZB | 26 |
| ZC | 21 | ZD | 24 | ZE | 25 | ZERO | 14 |
| ZF | 31 | ZG | 30 | | | | |

KSPMAX=0 MSPMAX=47 NSPMAX=44 SSPMAX=1559 ASPMAX=0 BSPMAX=0
DSPMAX=318

ROM 1

| | | | | | | | | | | | | | | | |
|---|---|---|---|---|---|---|---|---|---|---|---|---|---|---|---|
| 5 | 313 | 176 | 177 | 41 | 2 | 24 | 10 | 2 | 24 | 177 | 21 | 17 | 3 | 172 | 20 |
| 3 | 3 | 172 | 3 | 1 | 4 | 173 | 173 | 152 | 377 | 6 | 162 | 173 | 156 | 160 | 41 |
| 1 | 1 | 1 | 1 | 27 | 1 | 1 | 1 | 1 | 1 | 1 | 200 | 0 | 1 | 1 | 1 |
| 1 | 1 | 1 | 13 | 1 | 1 | 1 | 1 | 113 | 10 | 114 | 111 | 45 | 107 | 166 | 137 |
| 77 | 2 | 1 | 1 | 1 | 1 | 1 | 1 | 1 | 1 | 1 | 1 | 1 | 172 | 1 | 1 |
| 1 | 2 | 153 | 1 | 1 | 2 | 11 | 1 | 1 | 1 | 1 | 1 | 1 | 1 | 170 | 1 |
| 132 | 1 | 2 | 1 | 2 | 1 | 2 | 1 | 2 | 1 | 2 | 1 | 2 | 3 | 200 | 114 |
| 200 | 112 | 206 | 1 | 1 | 1 | 201 | 373 | 201 | 201 | 201 | 201 | 201 | 203 | 101 | 77 |
| 201 | 201 | 201 | 201 | 201 | 201 | 201 | 201 | 201 | 201 | 201 | 1 | 2 | 205 | 1 | 1 |
| 201 | 173 | 201 | 201 | 201 | 201 | 201 | 201 | 1 | 1 | 1 | 1 | 1 | 1 | 226 | 225 |
| 201 | 201 | 222 | 201 | 201 | 201 | 216 | 201 | 214 | 201 | 201 | 211 | 307 | 207 | 201 | 201 |
| 36 | 203 | 202 | 364 | 1 | 1 | 1 | 201 | 201 | 1 | 1 | 4 | 343 | 343 | 100 | 1 |
| 1 | 202 | 203 | 371 | 203 | 204 | 205 | 342 | 133 | 352 | 350 | 342 | 342 | 337 | 1 | 1 |
| 201 | 201 | 201 | 201 | 201 | 201 | 2 | 6 | 1 | 1 | 1 | 1 | 372 | 1 | 1 | 1 |
| 201 | 1 | 1 | 1 | 1 | 1 | 201 | 201 | 201 | 201 | 201 | 1 | 3 | 2 | 1 | 1 |
| 1 | 201 | 1 | 1 | 1 | 1 | 1 | 201 | 2 | 176 | 201 | 202 | 151 | 1 | 157 | 157 |
| 2 | 3 | 31 | 176 | 30 | 27 | 177 | 1 | 1 | 1 | 1 | 1 | 1 | 1 | 1 | 1 |
| 1 | 1 | 1 | 1 | 1 | 1 | 1 | 1 | 1 | 1 | 154 | 147 | 153 | 201 | 66 | 201 |
| 201 | 201 | 201 | 203 | 202 | 212 | 201 | 55 | 167 | 201 | 201 | 202 | 202 | 377 | 46 | 172 |
| 157 | 201 | 202 | 201 | 201 | 201 | 201 | 202 | 201 | 201 | 201 | 202 | 201 | 201 | 202 | 202 |
| 205 | 202 | 201 | 204 | 203 | 203 | 201 | 203 | 201 | 203 | 202 | 201 | 201 | 201 | 201 | 201 |
| 201 | 237 | 115 | 114 | 201 | 201 | 201 | 201 | 202 | 214 | 202 | 377 | 201 | 201 | 202 | 201 |
| 201 | 201 | 202 | 201 | 220 | 202 | 201 | 201 | 201 | 202 | 201 | 201 | 201 | 207 | 203 | 203 |
| 101 | 143 | 142 | 23 | 202 | 201 | 201 | 202 | 201 | 202 | 330 | 202 | 362 | 204 | 201 | 7 |
| 6 | 202 | 234 | 316 | 2 | 117 | 201 | 201 | 201 | 201 | 201 | 201 | 203 | 201 | 201 | 201 |
| 201 | 203 | 201 | 202 | 201 | 202 | 201 | 201 | 202 | 354 | 201 | 201 | 201 | 347 | 201 | 245 |
| 201 | 201 | 201 | 201 | 201 | 202 | 201 | 201 | 201 | 201 | 201 | 201 | 214 | 201 | 201 | 201 |
| 226 | 201 | 201 | 201 | 201 | 201 | 201 | 151 | 201 | 201 | 201 | 203 | 201 | 203 | 202 | 263 |
| 201 | 201 | 201 | 201 | 201 | 2 | 132 | 201 | 201 | 201 | 201 | 201 | 201 | 213 | 201 | 207 |
| 201 | 201 | 201 | 201 | 201 | 216 | 201 | 221 | 212 | 201 | 205 | 201 | 202 | 201 | 213 | 202 |
| 201 | 210 | 204 | 201 | 375 | 203 | 202 | 201 | 201 | 203 | 201 | 202 | 201 | 201 | 202 | 203 |
| 201 | 324 | 254 | 377 | 377 | 377 | 377 | 377 | 377 | 377 | 377 | 377 | 377 | 377 | 377 | 377 |

ROM 2

| | | | | | | | | | | | | | | | |
|---|---|---|---|---|---|---|---|---|---|---|---|---|---|---|---|
| 303 | 103 | 342 | 377 | 307 | 342 | 110 | 377 | 327 | 327 | 310 | 303 | 333 | 303 | 326 | 360 |
| 312 | 333 | 370 | 303 | 302 | 353 | 320 | 307 | 327 | 340 | 316 | 324 | 303 | 372 | 343 | 327 |
| 302 | 377 | 324 | 303 | 322 | 102 | 113 | 162 | 43 | 34 | 260 | 303 | 157 | 306 | 147 | 304 |
| 330 | 312 | 377 | 314 | 353 | 320 | 377 | 303 | 342 | 162 | 374 | 340 | 314 | 342 | 303 | 322 |
| 303 | 350 | 344 | 332 | 313 | 360 | 103 | 100 | 103 | 354 | 366 | 303 | 303 | 103 | 302 | 103 |

| | | | | | | | | | | | | | | | |
|---|---|---|---|---|---|---|---|---|---|---|---|---|---|---|---|
| 303 | 303 | 103 | 130 | 336 | 176 | 103 | 152 | 346 | 303 | 103 | 303 | 303 | 303 | 340 | 303 |
| 103 | 377 | 364 | 366 | 354 | 356 | 103 | 103 | 353 | 340 | 342 | 353 | 376 | 376 | 312 | 303 |
| 320 | 374 | 347 | 303 | 62 | 277 | 203 | 260 | 340 | 377 | 344 | 350 | 307 | 354 | 303 | 333 |
| 313 | 364 | 377 | 374 | 303 | 337 | 103 | 337 | 310 | 377 | 303 | 103 | 62 | 303 | 203 | 277 |
| 260 | 3 | 303 | 303 | 307 | 303 | 337 | 303 | 103 | 62 | 203 | 277 | 242 | 257 | 260 | 342 |
| 346 | 303 | 303 | 352 | 340 | 323 | 350 | 357 | 303 | 303 | 344 | 303 | 102 | 303 | 344 | 357 |
| 103 | 303 | 340 | 346 | 103 | 62 | 277 | 203 | 260 | 3 | 62 | 277 | 323 | 357 | 314 | 203 |
| 260 | 303 | 303 | 303 | 303 | 303 | 303 | 357 | 313 | 317 | 303 | 342 | 317 | 160 | 62 | 277 |
| 203 | 237 | 260 | 337 | 303 | 303 | 103 | 353 | 62 | 277 | 203 | 277 | 260 | 103 | 62 | 277 |
| 254 | 160 | 62 | 203 | 203 | 267 | 260 | 337 | 366 | 337 | 340 | 103 | 44 | 42 | 46 | 262 |
| 252 | 277 | 260 | 103 | 362 | 303 | 303 | 376 | 360 | 360 | 374 | 303 | 154 | 303 | 164 | 156 |
| 303 | 303 | 303 | 340 | 303 | 326 | 357 | 367 | 162 | 353 | 372 | 343 | 360 | 303 | 170 | 137 |
| 162 | 133 | 324 | 337 | 360 | 323 | 362 | 317 | 304 | 377 | 360 | 333 | 372 | 303 | 303 | 360 |
| 303 | 324 | 302 | 370 | 370 | 310 | 314 | 110 | 310 | 303 | 303 | 333 | 303 | 303 | 114 | 316 |
| 303 | 304 | 353 | 303 | 303 | 377 | 103 | 303 | 303 | 303 | 357 | 103 | 103 | 362 | 343 | 343 |
| 326 | 324 | 324 | 303 | 303 | 303 | 303 | 377 | 377 | 172 | 170 | 172 | 303 | 360 | 334 | 303 |
| 303 | 303 | 303 | 303 | 304 | 324 | 314 | 303 | 343 | 303 | 320 | 303 | 377 | 162 | 330 | 332 |
| 370 | 103 | 336 | 136 | 360 | 303 | 303 | 377 | 162 | 353 | 303 | 370 | 303 | 360 | 303 | 303 |
| 303 | 303 | 363 | 303 | 103 | 122 | 100 | 303 | 303 | 303 | 302 | 303 | 302 | 303 | 302 | 303 |
| 303 | 377 | 302 | 302 | 303 | 303 | 304 | 377 | 162 | 303 | 377 | 103 | 303 | 303 | 303 | 103 |
| 360 | 362 | 362 | 303 | 303 | 126 | 124 | 370 | 360 | 360 | 303 | 303 | 303 | 303 | 317 | 303 |
| 103 | 100 | 303 | 304 | 377 | 326 | 324 | 302 | 162 | 337 | 103 | 106 | 170 | 377 | 360 | 370 |
| 303 | 103 | 100 | 303 | 303 | 303 | 303 | 302 | 360 | 100 | 377 | 303 | 303 | 303 | 303 | 302 |
| 303 | 302 | 317 | 323 | 303 | 303 | 303 | 304 | 377 | 162 | 303 | 103 | 367 | 303 | 303 | 360 |
| 360 | 162 | 377 | 303 | 303 | 360 | 103 | 100 | 360 | 360 | 100 | 100 | 337 | 337 | 103 | 310 |
| 312 | 303 | 100 | 100 | 303 | 303 | 323 | 323 | 103 | 370 | 370 | 377 | 377 | 302 | 317 | 324 |
| 377 | 324 | 303 | 377 | 377 | 377 | 377 | 377 | 377 | 377 | 377 | 377 | 377 | 377 | 377 | 377 |

ROM 3

| | | | | | | | | | | | | | | | |
|---|---|---|---|---|---|---|---|---|---|---|---|---|---|---|---|
| 377 | 366 | 317 | 337 | 377 | 317 | 365 | 217 | 277 | 257 | 137 | 37 | 77 | 337 | 377 | 357 |
| 137 | 57 | 277 | 237 | 17 | 17 | 157 | 117 | 37 | 57 | 377 | 157 | 77 | 117 | 237 | 177 |
| 377 | 377 | 377 | 337 | 377 | 363 | 364 | 367 | 363 | 366 | 377 | 277 | 365 | 377 | 360 | 377 |
| 377 | 377 | 377 | 377 | 377 | 377 | 337 | 357 | 377 | 367 | 363 | 377 | 77 | 367 | 377 | 217 |
| 257 | 377 | 377 | 377 | 377 | 361 | 374 | 367 | 377 | 377 | 377 | 277 | 361 | 372 | 366 | 306 |
| 377 | 363 | 366 | 375 | 364 | 370 | 372 | 364 | 377 | 360 | 373 | 367 | 377 | 317 | 377 | 364 |
| 371 | 57 | 37 | 37 | 117 | 117 | 316 | 317 | 337 | 337 | 377 | 377 | 377 | 377 | 277 | 377 |
| 277 | 377 | 377 | 377 | 367 | 377 | 317 | 377 | 377 | 377 | 377 | 377 | 377 | 377 | 177 | 137 |
| 377 | 377 | 377 | 377 | 377 | 377 | 376 | 377 | 377 | 377 | 377 | 363 | 367 | 377 | 377 | 377 |
| 257 | 363 | 377 | 377 | 377 | 377 | 377 | 377 | 363 | 367 | 377 | 377 | 377 | 377 | 377 | 377 |
| 377 | 377 | 377 | 377 | 357 | 377 | 377 | 377 | 377 | 377 | 377 | 377 | 363 | 377 | 357 | 377 |
| 363 | 377 | 377 | 377 | 363 | 367 | 377 | 377 | 377 | 363 | 367 | 364 | 377 | 377 | 357 | 144 |
| 104 | 77 | 77 | 377 | 377 | 377 | 377 | 377 | 377 | 377 | 377 | 377 | 377 | 373 | 367 | 377 |
| 377 | 377 | 377 | 377 | 377 | 377 | 363 | 377 | 367 | 377 | 377 | 177 | 377 | 363 | 367 | 377 |
| 377 | 363 | 367 | 377 | 377 | 377 | 377 | 377 | 377 | 377 | 377 | 363 | 367 | 367 | 367 | 377 |
| 377 | 377 | 377 | 367 | 377 | 364 | 157 | 364 | 100 | 57 | 364 | 77 | 363 | 377 | 363 | 363 |
| 377 | 322 | 302 | 377 | 377 | 377 | 362 | 377 | 367 | 377 | 377 | 377 | 377 | 377 | 361 | 363 |
| 367 | 362 | 377 | 377 | 377 | 377 | 377 | 377 | 377 | 377 | 377 | 337 | 377 | 377 | 377 | 377 |
| 363 | 57 | 363 | 17 | 17 | 362 | 362 | 375 | 377 | 377 | 363 | 57 | 362 | 317 | 375 | 377 |
| 377 | 377 | 377 | 377 | 377 | 357 | 367 | 377 | 377 | 257 | 363 | 102 | 102 | 277 | 257 | 377 |
| 377 | 377 | 377 | 377 | 377 | 357 | 357 | 377 | 377 | 361 | 361 | 361 | 377 | 361 | 277 | 377 |
| 257 | 362 | 377 | 377 | 377 | 377 | 237 | 137 | 377 | 377 | 377 | 377 | 77 | 367 | 377 | 377 |
| 117 | 365 | 177 | 161 | 361 | 377 | 377 | 257 | 367 | 377 | 377 | 377 | 377 | 361 | 362 | 362 |
| 257 | 377 | 377 | 77 | 274 | 274 | 47 | 257 | 377 | 37 | 362 | 17 | 17 | 377 | 362 | 377 |
| 77 | 377 | 361 | 377 | 377 | 377 | 377 | 377 | 367 | 377 | 277 | 367 | 377 | 377 | 377 | 261 |
| 361 | 277 | 277 | 377 | 377 | 242 | 362 | 377 | 361 | 362 | 277 | 377 | 257 | 362 | 377 | 317 |
| 372 | 367 | 377 | 177 | 377 | 377 | 377 | 361 | 367 | 377 | 301 | 360 | 374 | 363 | 277 | 377 |
| 362 | 367 | 374 | 377 | 377 | 377 | 362 | 361 | 361 | 267 | 257 | 377 | 377 | 377 | 377 | 377 |
| 377 | 361 | 377 | 317 | 362 | 377 | 377 | 377 | 377 | 367 | 377 | 174 | 157 | 137 | 377 | 361 |
| 377 | 367 | 377 | 377 | 377 | 361 | 367 | 262 | 101 | 101 | 367 | 367 | 277 | 277 | 362 | 277 |
| 277 | 377 | 367 | 367 | 277 | 277 | 277 | 277 | 361 | 377 | 377 | 377 | 257 | 361 | 377 | 377 |
| 317 | 362 | 362 | 377 | 377 | 377 | 377 | 377 | 377 | 377 | 377 | 377 | 377 | 377 | 377 | 377 |

ROM 4

| | | | | | | | | | | | | | | | |
|---|---|---|---|---|---|---|---|---|---|---|---|---|---|---|---|
| 44 | 51 | 124 | 60 | 0 | 120 | 122 | 20 | 62 | 45 | 125 | 100 | 63 | 140 | 122 | 124 |
| 120 | 20 | 122 | 100 | 124 | 44 | 160 | 5 | 42 | 160 | 145 | 121 | 127 | 125 | 46 | 24 |
| 122 | 22 | 160 | 44 | 120 | 127 | 20 | 121 | 27 | 126 | 100 | 160 | 6 | 125 | 23 | 124 |
| 145 | 100 | 1 | 123 | 73 | 160 | 0 | 120 | 104 | 103 | 110 | 160 | 203 | 110 | 142 | 120 |
| 121 | 203 | 223 | 160 | 42 | 252 | 124 | 105 | 104 | 204 | 124 | 142 | 110 | 106 | 110 | 106 |
| 102 | 152 | 106 | 102 | 112 | 102 | 102 | 124 | 102 | 112 | 102 | 112 | 104 | 204 | 124 | 110 |
| 102 | 3 | 123 | 123 | 103 | 103 | 102 | 102 | 43 | 102 | 160 | 45 | 160 | 160 | 160 | 143 |
| 160 | 103 | 11 | 120 | 100 | 20 | 170 | 170 | 126 | 10 | 216 | 122 | 11 | 124 | 141 | 0 |
| 14 | 124 | 10 | 212 | 123 | 16 | 125 | 15 | 126 | 16 | 126 | 104 | 101 | 50 | 170 | 1 |
| 121 | 101 | 121 | 124 | 14 | 120 | 30 | 120 | 102 | 100 | 122 | 10 | 120 | 14 | 125 | 125 |
| 125 | 112 | 124 | 235 | 170 | 15 | 125 | 15 | 125 | 125 | 111 | 124 | 101 | 125 | 124 | 11 |
| 106 | 125 | 125 | 124 | 104 | 100 | 10 | 120 | 170 | 105 | 100 | 10 | 15 | 35 | 126 | 170 |
| 170 | 120 | 120 | 170 | 170 | 170 | 170 | 35 | 32 | 34 | 112 | 111 | 34 | 121 | 100 | 10 |
| 120 | 11 | 124 | 14 | 126 | 125 | 105 | 11 | 100 | 15 | 125 | 10 | 120 | 160 | 100 | 10 |
| 120 | 103 | 100 | 111 | 120 | 11 | 125 | 35 | 124 | 15 | 126 | 100 | 106 | 104 | 105 | 170 |
| 170 | 17 | 127 | 107 | 170 | 170 | 170 | 170 | 130 | 170 | 170 | 170 | 100 | 170 | 100 | 100 |
| 40 | 121 | 120 | 120 | 127 | 160 | 60 | 0 | 121 | 21 | 122 | 2 | 123 | 23 | 125 | 5 |
| 124 | 4 | 126 | 6 | 127 | 67 | 160 | 26 | 125 | 25 | 124 | 60 | 120 | 170 | 170 | 126 |
| 50 | 120 | 150 | 125 | 125 | 170 | 170 | 116 | 116 | 126 | 137 | 57 | 170 | 57 | 116 | 116 |
| 116 | 126 | 50 | 110 | 233 | 15 | 125 | 100 | 103 | 120 | 50 | 100 | 120 | 107 | 52 | 52 |
| 230 | 230 | 230 | 127 | 127 | 127 | 127 | 11 | 11 | 121 | 121 | 121 | 110 | 130 | 122 | 100 |
| 170 | 100 | 116 | 116 | 126 | 100 | 200 | 210 | 75 | 210 | 100 | 125 | 15 | 125 | 100 | 100 |
| 124 | 44 | 170 | 121 | 130 | 123 | 123 | 15 | 125 | 53 | 113 | 123 | 170 | 130 | 170 | 104 |
| 116 | 116 | 116 | 116 | 104 | 104 | 100 | 104 | 104 | 44 | 170 | 170 | 170 | 127 | 104 | 116 |
| 116 | 31 | 137 | 121 | 116 | 116 | 126 | 15 | 125 | 100 | 15 | 125 | 100 | 111 | 200 | 121 |
| 130 | 170 | 112 | 200 | 100 | 122 | 122 | 35 | 130 | 125 | 170 | 100 | 170 | 170 | 57 | 111 |
| 126 | 100 | 107 | 170 | 15 | 170 | 170 | 134 | 125 | 54 | 101 | 107 | 170 | 35 | 125 | 114 |
| 127 | 120 | 170 | 170 | 170 | 170 | 116 | 137 | 130 | 100 | 14 | 124 | 124 | 170 | 170 | 170 |
| 170 | 137 | 57 | 11 | 121 | 116 | 116 | 126 | 15 | 160 | 107 | 107 | 67 | 107 | 275 | 130 |
| 235 | 125 | 35 | 125 | 170 | 130 | 40 | 122 | 130 | 130 | 100 | 100 | 12 | 32 | 122 | 170 |
| 170 | 170 | 100 | 100 | 170 | 50 | 11 | 31 | 121 | 100 | 170 | 15 | 15 | 137 | 57 | 125 |
| 15 | 125 | 116 | 377 | 377 | 377 | 377 | 377 | 377 | 377 | 377 | 377 | 377 | 377 | 377 | 377 |

APPENDIX C-3

MICRO-INSTRUCTION SET DESCRIPTION

FORMAT: Optional label followed by a free field combination of any instructions.

Comments begin at the back slash character " ".

Comment lines begin with *.

All instruction fields are delimited by spaces.

LABELS: A label may be any character string starting in Column 1. The first character must be alphabetic and must not begin with the combination "END".

OPERAND NAMES: A name may be any alpha numeric string. Examples are MAR, B7, 255.

All names must appear in a DECLARE statement.

DECLARATIONS: Declarations equate operand names to machine hardware locations. The format is:

```
DECLARE NAME1=m, NAME2=n, . . .
m,n . . . are integers
```

Example: DECLARE MAR=7, 255=13

PROGRAM LOCATION: The program is located in program memory by use of an ADRS statement.

The format is:

```
ADRS n
n is an integer such as 0≤n≤511
```

The program lines following the ADRS statement will be located starting at program memory address n.

ASSEMBLER CONTROL: The beginning of a program file must begin with a MICRA statement.

The format is:

```
MICRA comment
```

The end of a program file must end with an END statement.

The format is:

```
END comment
```

INSTRUCTIONS: Instructions may occur in any free field combination. All instruction types are listed below by mnemonic.

J "Jump instruction" format is:

```
J label or J+n or J-m
where 0<n<63   1<m<64
```

After execution of the present program line, execution will continue at line specified by label or at present address +n-m. If no "J" instruction appears within a line, the default will be J + 1.

Special Cases: Let p = present address,
If p<256 then p±i implies {(p±i) mod 256}
If p<256 then p±i implies {(p±i) mod 256} + 256

S or C "Set or clear instruction" format is:
S name or C name

Flipflop called "name" will be set or cleared.

I or O "Input or output instruction" format is:
I name or O name (1) A control signal will be generated causing "name" to be input or to output from the digital storage bus.
or (2) A control signal will be generated causing implementation of the function designated by "name". An example is OINCRSA which implements an increment stroke address.

Q "Qualifier select instruction" format is:
Q name

After execution of both the present and next program line, execution will continue normally if "name" is a 0. If "name" is a 1, execution will continue at the specified line + 1.

W "Write instruction" format is:
W

Digital storage memory will be set to the write state. The default is the read state.

H "Hold-off instruction" format is:
H

An interrupt will not be allowed immediately following the next program line. The default allows interrupts.

D "Data manipulator instruction" has several formats:

(1) DB = AC

The contents of the accumulator are output to the digital storage bus.

(2) D name = AC or D name = B

The contents of the accumulator or the digital storage bus are transferred to the register "name."

(3) DAC = name {&B} or DAC = % name {&B}
{&B} indicates &B is optional

The contents of the register "name" are transferred to the accumulator. If "name" is preceded by %, the accumulator will receive the complement of the contents of "name". If followed by &B, "name" will be output to the digital storage bus.

(4) DAC = name1 op name2 {&B}
or DAC = name1 op AC {&B}
op is any operand from the set: +, -, * (logical and), / (logical or).

The operation indicated will be made on "name 1" and "name 2" or "name 1" and accumulator. The result will be transferred to the accumulator. If followed by &B, "name 1" will be output to the digital storage bus.

NOTES AND EXCEPTIONS:

```
(1) Only one I/O instruction per line is allowed.
        Example:  J + 1  I MEM OLGX
        This is not allowed.

(2) A " constant" is a data manipulator instruction operand.
    It may only appear as the second operand of the instruction.
        Example:  DAC=MA + 1024 is allowed.
                  DAC=1024 is not allowed.

(3) A constant may not appear in the same line with a set or
    clear instruction.
        Example:  DAC=MA + 1  SCE
        This is not allowed.

(4) In order to clarify the effect of a qualifier select
    instruction, the following example is provided.

         JAA        QB4
          .
          .
          .
    AA   JBB
          .
          .
          .
    BB   JDD

    CC   JEE
          .
          .
          .
    DD  DAC = X
          .
          .
          .
    EE  DAC = Y
          .
          .
          .

If qualifier B4 = 0 the sequence of execution will be
AA, BB, DD.

If qualifier B4 = 1 the sequence of execution will be
AA, CC, EE.
```

I claim:

1. Apparatus for use in the spectrum analysis of a signal, said apparatus comprising:

input means having inputs for receiving an input signal and a sampling signal for providing an intermediate frequency signal in response to said input signal and said sampling signal;

signal processing means coupled to said input means for providing a first digital signal in response to said intermediate frequency signal;

memory means coupled to said signal processing means for storing electrical representations of said digital signal in response to a memory control signal;

memory control means coupled to said memory means for providing said memory control signal;

display means coupled to said memory means for providing a waveform display in response to display control signals and said electrical representations, said waveform display representing amplitude levels at frequencies between a frequency span between a first frequency and a second frequency, said frequency in the middle of between said first frequency and said second frequency being the center frequency;

display control means coupled to said display means for providing said display control signals in response to operator control signals, said display control means including means for causing said display means to include a first visual indication at a first predetermined position on said waveform display in response to a first marker control signal;

logic means for causing the waveform display to be altered in response to the position of said first visual indication and a first logic control signal; and operator controls coupled to said display control means for providing said operator control signals and including means for providing said first marker control signal in response to first operator manifestations indicating it is desired to include a first visual indication with said waveform display; means for changing the position of said first visual indication in response to operator manifestations indicating a desired position for said visual indication; and means for providing a first logic signal in response to operator manifestations indicating that it is desired to use the position of said visual indication to alter the waveform display.

2. The apparatus as in claim 1 wherein said logic means includes means for causing the frequency at the position of said marker to become the center frequency for said display waveform.

3. The apparatus as in claim 1 wherein said operator controls further include means for providing a second marker control signal in response to operator manifestations indicating that a second marker is to be placed at a second predetermined position on said waveform display; and said display control means includes means for causing said display means to include a second visual indication at a second predetermined position on said waveform display.

4. The apparatus as in claim 3 wherein said display control means further includes means for determining the difference in frequency values between the position of said first visual indication and the position of said second visual indication.

5. The apparatus as in claim 4 wherein said logic means includes means for causing said display waveform to be altered in response to the difference in frequency values between the positions of said first and second visual indications.

* * * * *